US006246774B1

(12) United States Patent
Norris et al.

(10) Patent No.: US 6,246,774 B1
(45) Date of Patent: Jun. 12, 2001

(54) WAVETABLE AUDIO SYNTHESIZER WITH MULTIPLE VOLUME COMPONENTS AND TWO MODES OF STEREO POSITIONING

(75) Inventors: David Norris; David N. Suggs, both of Austin, TX (US)

(73) Assignee: Advanced Micro Devices, Inc., DE (US)

( * ) Notice: Subject to any disclaimer, the term of this patent is extended or adjusted under 35 U.S.C. 154(b) by 0 days.

(21) Appl. No.: 08/890,133

(22) Filed: Jul. 9, 1997

Related U.S. Application Data

(63) Continuation of application No. 08/333,389, filed on Nov. 2, 1994, now abandoned.

(51) Int. Cl.[7] .......... H03G 3/00

(52) U.S. Cl. .......... 381/104; 381/107

(58) Field of Search .......... 381/1, 61, 63, 381/104, 106, 109, 119; 84/621, 630, 633, 665, 711, DIG. 27

(56) References Cited

U.S. PATENT DOCUMENTS

| | | | |
|---|---|---|---|
| 3,515,792 | 6/1970 | Deutsch | 84/1.03 |
| 4,133,242 | 1/1979 | Nagai et al. | 84/1.13 |

(List continued on next page.)

FOREIGN PATENT DOCUMENTS

| | | | |
|---|---|---|---|
| 0 126 962 | 12/1984 | (EP) . | |
| 0 463 411 | 1/1992 | (EP) . | |
| 0 474 177 A2 | 11/1992 | (EP) . | |
| 0535839 * | 7/1993 | (EP) | 381/104 |
| WO 92/15087 | 3/1992 | (WO) . | |

OTHER PUBLICATIONS

OmniWave™ Multimedia Audio, by Samsung Semiconductor, Advance Information, KS0161, pp. 1–8 (Rev. A, Nov. 1994).

Digital Oscillator Chip, Integrated Circuit Systems, Inc., ICS 1261 (DOC1), pp. 1–12 (Date not available).

Integrated Circuit Systems, Inc., Digital Sound Generator (DOC II), ICS1399, Package of Technical Information (Date not available).

Digital Sound Generator (DOC II), ICS1399, Integrated Circuit Systems, Inc., pp. 1–10, 21–42 (Date not available).

ES 5506 "OTTO", Ensoniq Soundscape™ WaveTable Synthesizer, Rev. 2.1, pp. 1–48 (Date not available).

(List continued on next page.)

*Primary Examiner*—Forester W. Isen
*Assistant Examiner*—Xu Mei
(74) *Attorney, Agent, or Firm*—Skjerven, Morrill, MacPherson, Franklin & Friel, L.L.P.; Michael P. Adams; Sam G. Campbell III

(57) ABSTRACT

A digital wavetable audio synthesizer including a synthesizer volume generator. The volume generator causing a data sample to be multiplied by volume components that add right offset, left offset, and effects volume to the data. The left and right offsets provide stereo field positioning, and the effects volume is used in generating an echo effect. The data sample can be placed in one of sixteen fixed stereo pan positions, or alternatively the left and right offset values can be programmed to place the data anywhere in the stereo field. The synthesizer includes a register array programmed with right and left offset values for providing wavetable data with right and left offset volume components. The synthesizer also includes a first storage device for storing the right offset value, a second storage device for storing the left offset value, and multiplication circuitry connected to both storage devices for providing wavetable data with right and left offset volume components based on values stored in the first and second storage devices.

7 Claims, 158 Drawing Sheets

U.S. PATENT DOCUMENTS

| | | | | |
|---|---|---|---|---|
| 4,201,105 | | 5/1980 | Alles | 84/1.01 |
| 4,201,109 | | 5/1980 | Kitagawa | 84/1.26 |
| 4,344,347 | | 8/1982 | Faulkner | 84/1.26 |
| 4,471,681 | * | 9/1984 | Nishimoto | 84/1.23 |
| 4,472,993 | | 9/1984 | Futamase et al. | 84/1.24 |
| 4,506,579 | | 3/1985 | Rossum | 84/1.01 |
| 4,508,001 | | 4/1985 | Suzuki | 84/1.01 |
| 4,524,668 | | 6/1985 | Tomisawa et al. | 84/1.24 |
| 4,539,885 | | 9/1985 | Ezawa | 84/1.25 |
| 4,569,268 | | 2/1986 | Futamase et al. | 84/1.24 |
| 4,573,389 | | 3/1986 | Suzuki | 84/1.26 |
| 4,622,877 | | 11/1986 | Strong | 84/1.01 |
| 4,644,840 | | 2/1987 | Franz et al. | 84/1.01 |
| 4,649,783 | | 3/1987 | Strong et al. | 84/1.01 |
| 4,719,833 | | 1/1988 | Katoh et al. | 84/1.01 |
| 4,731,851 | * | 3/1988 | Christopher | 381/104 |
| 4,843,938 | | 7/1989 | Hideo | 84/1.19 |
| 4,864,625 | | 9/1989 | Hanzawa et al. | 381/61 |
| 4,916,996 | | 4/1990 | Suzuki et al. | 84/603 |
| 4,947,723 | | 8/1990 | Kawashima et al. | 84/603 |
| 4,953,437 | | 9/1990 | Starkey | 84/603 |
| 4,998,281 | | 3/1991 | Sakata | 381/63 |
| 5,111,530 | | 5/1992 | Kutaragi et al. | 395/20 |
| 5,111,727 | | 5/1992 | Rossum | 84/608 |
| 5,144,676 | * | 9/1992 | Rossum | 84/621 |
| 5,166,464 | * | 11/1992 | Sakata et al. | 381/63 |
| 5,187,314 | * | 2/1993 | Kunimoto et al. | 84/630 |
| 5,194,681 | | 3/1993 | Kudo | 84/603 |
| 5,218,710 | | 6/1993 | Yamaki et al. | 395/800 |
| 5,243,124 | | 9/1993 | Kondratiuk et al. | 84/624 |
| 5,300,724 | | 4/1994 | Medovich | 84/604 |
| 5,342,990 | | 8/1994 | Rossum | 84/608 |
| 5,393,926 | | 2/1995 | Johnson | 84/610 |
| 5,406,022 | * | 4/1995 | Kobayashi | 84/DIG. 27 |
| 5,418,321 | | 5/1995 | Keller et al. | 84/606 |
| 5,440,740 | | 8/1995 | Chen et al. | 395/650 |
| 5,442,127 | | 8/1995 | Wachi et al. | 84/603 |
| 5,530,762 | | 6/1996 | Jones, Jr. et al. | 381/63 |
| 5,613,147 | | 3/1997 | Okamura et al. | 395/800 |

OTHER PUBLICATIONS

Preliminary specification, "Stereo continuous calibration DAC, TDA1545A," Phillips Semiconductors, pp. 4–212 to 4–229 (Mar. 1993).

Preliminary Product Information,"Advanced Music Synthesizer, CS9203," Crystal Semiconductor Corp., DS117PP1, pp. 1–18 (Aug. 1993).

Preliminary Product Information, "Programmable Music Processor, CS8905," Crystal Semiconductor Corp., DS116PP1, pp. 1–19 (Aug. 1993).

Preliminary Product Information, "CDBGMR4 Music Synthesis Eval. Board," Crystal Semiconductor Corp., DS127PP1, pp. 1–24 and schematics (Aug. 1993).

Application Note, "Wave Table MIDI Synthesizer Solutions, CS8905 and CS9203," by Jim Heckroth, Crystal Semiconductor Corp., AN26REV1, pp. 1–7 (Aug. 1993).

Application Note, "A Tutorial on MIDI and Music Synthesis, Music Synthesis," by Jim Heckroth, Crystal Semiconductor Corp., AN27REV1, pp. 1–6 (Aug. 1993).

"JAZZ16™ CHIPSET," Media Vision, Inc., pp. 1–52, 1–22, 1–14, schematics, bill of materials, and p. 23 (Date not available).

Documentation regarding AVS Group NXPR016 Chipset (Date not available) (9 sheets).

"OPL3, YMF262, FM Operator Type L3," Yamaha LSI, YMF262 Application Manual, Catalog No. LSI–6MF2622, pp. 1–31 (1992.4).

"YMZ263, Multimedia Audio & Game Interface Controller (MMA)," Yamaha LSI, Rev. Jul. 1, 1992, pp. 1–33.

"YMF262, FM Operator Type L3 (OPL3)," Yamaha LSI, Catalog No. LSI–4MF2622, pp. 1–19 (1991.10).

Preliminary, "YMF278–F (OPL4), 4 Operator FM and Wave Synthesis Chip," Yamaha LSI, Yamaha Corp., Catalog No. LS1278F, Version 1.01 (Feb. 1, 1993), pp. 1–31.

"SC18000/SC18005 Multimedia System Controller," Sierra Semiconductor, Rev. 0.92, pp. 1–23 (Date not available).

"SC18025 ARIA™ Sound Processor," Sierra Semiconductor, Rev. 1.0, pp. 1–15 (Date not available).

"SC18050 Aria Basic Sound ROM," Sierra Semiconductor, Rev 0.91, pp. 1–3 (Date not available).

"SC18051 1/2 Megabyte Sound ROM," Sierra Semiconductor, Rev 1.0, pp. 1–3 (Date not available).

"SC18052 1 Megabyte Sound ROM," Sierra Semiconductor, Rev 1.0, pp. 1–3 (Date not available).

IBANEZ Model No. DM1000 Block Diagram (Date not available).

Article in "The Music Machine," Ed. Roads, *The Mit Press,* pp. 436–437 (1989).

"Designing Multi–Channel Reverberators," by John Stautner and Miller Puckette, pp. 569–582 (1989).

"Build a Chorus–Delay,"Chorus, Analog Delay, ADT, Flanger, Vibrato, *Guitar Player,* Jan. 1982, pp. 26–34.

Handbook for Sound Engineers (The new audio cyclopedia) Glen Ballow, editor, Howard W. Sams & Company, pp. 37–38, 158–159 and pp. 626–627, First Edition Third Printing 1988.

"Proposal for Standardized Audio Interchange Formats," IMA Compatibility Project, Version 2.12 (Apr. 24, 1992), pp. 1–23.

"Musical Applications of Microprocessors,"by Hal Chamberlin, Hayden Book Company, Second Edition (1985), Chapters 1, 2, 4, 13, 14, 17 and 19–21.

U.S. Patent Application Serial No. 072,838, entitled "Wave Table Synthesizer," by Travers, et al.

John Snell, "Design of a Digital Oscillator Which Will Generate Up to 256 Low Distortion Sine Waves in Real Time," April 1977, pp. 4–25.

"SC18024 ARIA™ Sound Processor," Sierra Semiconductor, Rev. 1.0, pp. 1–15 (Date not available).

* cited by examiner

| Pin | Signal Name | Pin | Signal Name |
|---|---|---|---|
| 1 | MA[9] | 41 | RA[21] |
| 2 | VSS | 42 | RA[20] |
| 3 | CD_IRQ | 43 | SD[0] |
| 4 | MA[8] | 44 | SD[15] |
| 5 | MA[7] | 45 | VSS |
| 6 | MA[6] | 46 | DRQ[0] |
| 7 | CD_DRQ | 47 | SD[1] |
| 8 | VSS | 48 | SD[14] |
| 9 | MA[5] | 49 | VCC |
| 10 | MA[4] | 50 | DAK[0]# |
| 11 | CD_DAK# | 51 | SD[2] |
| 12 | MA[3] | 52 | SD[13] |
| 13 | MA[2] | 53 | VSS |
| 14 | VCC | 54 | IRQ[3] |
| 15 | CD_CS# | 55 | SD[3] |
| 16 | MA[1] | 56 | SD[12] |
| 17 | MA[0] | 57 | VCC |
| 18 | BKSEL[3]# | 58 | IRQ[5] |
| 19 | BKSEL[2]# | 59 | SD[4] |
| 20 | VSS | 60 | SD[11] |
| 21 | BKSEL[1]# | 61 | VSS |
| 22 | BKSEL[0]# | 62 | SD[5] |
| 23 | DRQ[7] | 63 | SD[10] |
| 24 | DAK[7]# | 64 | TC |
| 25 | ROMCS# | 65 | VSS |
| 26 | RAHLD# | 66 | SD[6] |
| 27 | RAS# | 67 | SD[9] |
| 28 | MWE# | 68 | IOR# |
| 29 | IVCC | 69 | VCC |
| 30 | IVSS | 70 | SD[7] |
| 31 | DRQ[6] | 71 | SD[8] |
| 32 | DAK[6]# | 72 | IOW# |
| 33 | VSS | 73 | AEN |
| 34 | XTAL2I | 74 | IOCHRDY |
| 35 | XTAL2O | 75 | IOCS16# |
| 36 | XTAL1I | 76 | IOCHK# |
| 37 | XTAL1O | 77 | VSS |
| 38 | VCC | 78 | IRQ[7] |
| 39 | DAK[5]# | 79 | IRQ[2] |
| 40 | DRQ[5]# | 80 | DRQ[1] |

FIG. 3A

| Pin | Signal Name | Pin | Signal Name |
|---|---|---|---|
| 81 | DAK[1]# | 121 | GAMIN[0] |
| 82 | SA[8] | 122 | SA[7] |
| 83 | SA[9] | 123 | SA[6] |
| 84 | SA[10] | 124 | SA[5] |
| 85 | SA[11] | 125 | SA[4] |
| 86 | GPOUT[1] | 126 | SA[3] |
| 87 | AVSS | 127 | SA[2] |
| 88 | AVCC | 128 | SA[1] |
| 89 | AVSS | 129 | SA[0] |
| 90 | IREF | 130 | SBHE# |
| 91 | PNPCS | 131 | GAMIN[3] |
| 92 | CFILT | 132 | GAMIN[2] |
| 93 | AVSS | 133 | MIDIRX |
| 94 | AVCC | 134 | MIDITX |
| 95 | AREF | 135 | DAK[3]# |
| 96 | AUX1[L] | 136 | DRQ[3] |
| 97 | MIC[L] | 137 | IVSS |
| 98 | AVSS | 138 | IVCC |
| 99 | AVCC | 139 | SUSPEND# |
| 100 | MIC[R] | 140 | C32KHZ |
| 101 | AUX1[R] | 141 | GAMIO[0] |
| 102 | AUX2[L] | 142 | VSS |
| 103 | LINEIN[L] | 143 | GAMIO[1] |
| 104 | LINEIN[R] | 144 | GAMIO[2] |
| 105 | AUX2R | 145 | VCC |
| 106 | AVSS | 146 | MD[7] |
| 107 | AVSS | 147 | MD[6] |
| 108 | AVCC | 148 | MD[5] |
| 109 | LINEOUT[L] | 149 | GAMIO[3] |
| 110 | LINEOUT[R] | 150 | VSS |
| 111 | AVSS | 151 | MD[4] |
| 112 | MONOOUT | 152 | IRQ[11] |
| 113 | MONOIN | 153 | IRQ[12] |
| 114 | AVSS | 154 | MD[3] |
| 115 | 'AVCC | 155 | VCC |
| 116 | AVCC | 156 | MD[2] |
| 117 | AVSS | 157 | MD[1] |
| 118 | GPOUT[0] | 158 | MD[0] |
| 119 | RESET | 159 | IRQ[15] |
| 120 | GAMIN[1] | 160 | MA[10] |

FIG. 3B

| Pin | Signal Name | Pin | Signal Name |
|---|---|---|---|
| 1 | SA[7] | 41 | EX_DRQ |
| 2 | SA[8] | 42 | GAMIN[3] |
| 3 | GPOUT[0] | 43 | GAMIN[2] |
| 4 | RESET | 44 | GAMIN[1] |
| 5 | GPOUT[1] | 45 | GAMIN[0] |
| 6 | VCC | 46 | GAMIO[3] |
| 7 | AVSS | 47 | GAMIO[2] |
| 8 | AVSS | 48 | GAMIO[1] |
| 9 | IREF | 49 | GAMIO[0] |
| 10 | CFILT | 50 | IVSS |
| 11 | AVSS | 51 | VSS |
| 12 | AVCC | 52 | MA[0] |
| 13 | AREF | 53 | MA[1] |
| 14 | AUX1[L] | 54 | EX_DAK# |
| 15 | MIC[L] | 55 | VCC |
| 16 | AVSS | 56 | MA[2] |
| 17 | AVCC | 57 | MA[3] |
| 18 | AVSS | 58 | MA[4] |
| 19 | AUX1[R] | 59 | MA[5] |
| 20 | MIC[R] | 60 | EX_IRQ |
| 21 | AUX2[R] | 61 | EX_CS# |
| 22 | LINEIN[R] | 62 | VSS |
| 23 | AVSS | 63 | MA[6] |
| 24 | LINEIN1[L] | 64 | MA[7] |
| 25 | AUX2[L] | 65 | MA[8] |
| 26 | AVCC | 66 | MA[9] |
| 27 | LINEOUT[R] | 67 | MA[10] |
| 28 | AVSS | 68 | DAK[5]# |
| 29 | LINOUT[L] | 69 | MD[0] |
| 30 | MONOOUT | 70 | MD[1] |
| 31 | MONOIN | 71 | MD[2] |
| 32 | AVSS | 72 | MD[3] |
| 33 | AVCC | 73 | VSS |
| 34 | AVSS | 74 | DRQ[5] |
| 35 | PNPCS | 75 | VCC |
| 36 | SA[9] | 76 | DAK[6]# |
| 37 | SA[10] | 77 | DRQ[6] |
| 38 | SA[11] | 78 | MD[4] |
| 39 | VCC | 79 | MD[5] |
| 40 | VSS | 80 | MD[6] |

FIG. 4A

| Pin | Signal Name | Pin | Signal Name |
|---|---|---|---|
| 81 | MD[7] | 121 | SD[11] |
| 82 | IVCC | 122 | SD[10] |
| 83 | DRQ[7] | 123 | SD[9] |
| 84 | DAK[7]# | 124 | SD[8] |
| 85 | ROMCS# | 125 | TC |
| 86 | RAHLD# | 126 | DRQ[1] |
| 87 | RAS# | 127 | DAK[1]# |
| 88 | MWE# | 128 | AEN |
| 89 | RA[20] | 129 | IOCHRDY |
| 90 | RA[21] | 130 | IRQ[2] |
| 91 | VCC | 131 | IRQ[3] |
| 92 | IRQ[15] | 132 | IOR# |
| 93 | IRQ[12] | 133 | VSS |
| 94 | BKSEL[0]# | 134 | VCC |
| 95 | BKSEL[1]# | 135 | IOW# |
| 96 | VSS | 136 | IOCS16# |
| 97 | BKSEL[2]# | 137 | SD[0] |
| 98 | BKSEL[3]# | 138 | SD[1] |
| 99 | IRQ[11] | 139 | SD[2] |
| 100 | XTAL1I | 140 | SD[3] |
| 101 | XTAL1O | 141 | VSS |
| 102 | VSS | 142 | SD[4] |
| 103 | XTAL2O | 143 | SD[5] |
| 104 | XTAL2I | 144 | SD[6] |
| 105 | VCC | 145 | SD[7] |
| 106 | MIDIRX | 146 | VCC |
| 107 | MIDITX | 147 | IVSS |
| 108 | C32KHZ | 148 | IRQ[5] |
| 109 | SUSPEND# | 149 | IRQ[7] |
| 110 | VSS | 150 | IOCHK# |
| 111 | SBHE# | 151 | SA[0] |
| 112 | DRQ[0] | 152 | SA[1] |
| 113 | DAK[0]# | 153 | SA[2] |
| 114 | IVCC | 154 | SA[3] |
| 115 | VCC | 155 | SA[4] |
| 116 | SD[15] | 156 | SA[5] |
| 117 | SD[14] | 157 | VSS |
| 118 | SD[13] | 158 | DRQ[3] |
| 119 | SD[12] | 159 | DAK[3]# |
| 120 | VSS | 160 | SA[6] |

FIG. 4B

| System Control | | | | Codec | | Local Memory | | Ports, Misc. | | |
|---|---|---|---|---|---|---|---|---|---|---|
| | | pwr & gnd | 10 | pwr & gnd | 15 | pwr & gnd | 6 | pwr & gnd | 6 | |
| SD[15:0] | 16 | IOCS16# | 1 | MIC[L,R] | 2 | MA[10:0] | 11 | XTAL1I | 1 | |
| SA[11:0] | 12 | IOCHRDY | 1 | AUX1[L,R] | 2 | MD[7:0] | 8 | XTAL1O | 1 | |
| SBHE# | 1 | AEN | 1 | AUX2[L,R] | 2 | BKSEL[3:0]# | 4 | XTAL2I | 1 | |
| DRQ[7:5,3,1:0] | 6 | CD_IRQ | 1 | LINEIN[L,R] | 2 | ROMCS# | 1 | XTAL2O | 1 | |
| DAK[7:5,3,1:0]# | 6 | CD_DRQ | 1 | LINEOUT[L,R] | 2 | RAHLD# | 1 | MIDIRX | 1 | |
| TC | 1 | CD_DAK# | 1 | MONOIN | 1 | RA[21:20] | 2 | MIDITX | 1 | |
| IRQ[15,12,11] | 3 | CD_CS# | 1 | MONOOUT | 1 | MWE# | 1 | GAMIN[3:0] | 4 | |
| IRQ[7,5,3,2] | 4 | RESET | 1 | IREF | 1 | RAS# | 1 | GAMIO[3:0] | 4 | |
| IOCHK# | 1 | SUSPEND# | 1 | CFILT | 1 | *EFFECT# | | | | |
| IOR# | 1 | C32KHZ | 1 | AREF | 1 | *FRSYNC# | | | | TOTAL |
| IOW# | 1 | PNPCS | 1 | GPOUT[1:0] | 2 | | | | | |
| | 52 | | 21 | | 32 | | 35 | | 20 | 160 |

FIG. 5

| Name | Qty | Type | Description |
|---|---|---|---|
| BKSEL[3:0]# | 4 | output | Bank Selects. Used in to control the CAS inputs to each of the DRAM banks or the Output Enable inputs to each of the ROM banks. |
| C32KHZ / EFFECT# | 1 | input / output | Based on the power-up state of RA[21], this pin is either a clock input or an output to an external DSP. C32KHZ (RA[21] high) is a 32 KHz clock used in suspend mode to operate the refresh circuitry. EFFECT# (RA[21] low) becomes active during the writes to DRAM that are for the delay-based effects from the synthesizer. |
| SUSPEND# / FRSYNC# | 1 | input / output | Based on the power-up state of RA[21], this pin is either an input to cause suspend mode or an output to an external DSP. SUSPEND# (RA[21] high) is a system control signal. FRSYNC# (RA[21] low) becomes active at the beginning of each new frame. |
| MA[10:3] | 8 | bi-dir | Memory Address. Are the multiplexed row-column address bits for DRAM cycles. Are the multiplexed RLA[10:3] outputs and D[15:8] inputs for ROM cycles. |
| MA[2:0] | 3 | output | Memory Address. Are the multiplexed row-column address bits for DRAM cycles. Are the RLA[2,1,19] outputs for ROM cycles. |

FIG. 7A

| Name | Qty | Type | Description |
|---|---|---|---|
| MD[7:0] | 8 | bi-dir | Data Bus. Are the data-bus bits for DRAM cycles. Are the multiplexed RLA[18:11] outputs and D[7:0] inputs for ROM cycles. For serial EPROM accessed, MD[2] is the clock, SK. MD[1] is DI (serial EEPROM data input). MD[0] is DO (serial EEPROM data output). |
| MWE# | 1 | output | Write Enable. Goes to the WE# pin of all the DRAM banks; is high during refresh cycles. During reset, MWE# becomes an input that is used to select between pin options (see PIN SUMMARY in the general description part of this document). |
| RA[21:20] | 2 | bi-dir | ROM Address. These outputs provide the ROM address during ROM accesses. During reset, these become inputs that are used to select between pin options; see the PIN SUMMARY section of the general description for details). |
| RAHLD# | 1 | output | ROM Address Hold. Used to latch the state of MD[7:0] (RLA[18:11]) and MA[10:3] (RLA[10:3]) in external latches during ROM accesses. |
| RAS# | 1 | output | Goes to the RAS# pin of all the DRAM banks. |
| ROMCS# | 1 | output | ROM Chip Select. Goes to the CS# input to all the ROM banks. |

FIG. 7B

| Mnemonic | Description | I/O Addr. | Index | Rd-Wr | Module |
|---|---|---|---|---|---|
| UMCR | Mix Control Register | P2XR+0 | - | rd-wr | sys con |
| UISR | IRQ Status Register | P2XR+6 | - | read | sys con |
| U2X6R | Sould Blaster 2x6 Register | P2XR+6 | - | write | sys con |
| UACWR | AdLib Command Write Register | P2XR+8, 388 | - | write | sys con |
| UASRR | AdLib Status Read Register | P2XR+8, 388 | - | read | sys con |
| UADR | AdLib Data Register | P2XR+9, 389 | - | rd-wr | sys con |
| UACRR | AdLib Command Read Register | P2XR+0Ah | - | read | sys con |
| UASWR | Adlib Status Write Register | P2XR+0Ah | - | write | sys con |
| UHRDP | GUS Hidden Register Data Port | P2XR+0Bh | - | rd-wr | sys con |
| UI2XCR | Sound Blaster IRQ 2xC Register | P2XR+0Ch | - | rd-wr | sys con |
| U2XCR | Sound Blaster 2xC Reg. (no IRQ) | P2XR+0Dh | - | write | sys con |
| U2XER | Sound Blaster 2xE Register | P2XR+0Eh | - | rd-wr | sys con |
| URCR | Register Control Register | P2XR+0Fh | - | write | sys con |
| USRR | Status Read Register | P2XR+0Fh | - | read | sys con |
| UDCI | DMA Channel Control Register | P2XR+0Bh | UMCR[6]=0, | rd-wr | sys con |
| | | | | | |
| UICI | Interrupt Control Register | P2XR+0Bh | UMCR[6]=1, | rd-wr | sys con |
| | | | | | |
| UGP1I | General Purpose Reg. 1 (Back Door) | P2XR+0Bh | URCR[2:0]=1 | rd-wr | sys con |
| UGP2I | General Purpose Reg. 2 (Back Door) | P2XR+0Bh | URCR[2:0]=2 | rd-wr | sys con |
| UGPA1I | General Purpose Reg. 1 Address | P2XR+0Bh | URCR[2:0]=3 | rd-wr | sys con |

FIG. 8A

| Mnemonic | Description | I/O Addr. | Index | Rd-Wr | Module |
|---|---|---|---|---|---|
| UGPA2I | General Purpose Reg. 2 Address | P2XR+0Bh | URCR[2:0]=4 | rd-wr | sys con |
| UCLRII | Clear Interrupt Register | P2XR+0Bh | URCR[2:0]=5 | write | sys con |
| UJMPI | Jumper Register | P2XR+0Bh | URCR[2:0]=6 | rd-wr | sys con |
| UGP1I | Gen. Purp. Reg. 1 (Emulation Addr) | UGPA1I | - | rd-wr | sys con |
| UGP2I | Gan Purp. Reg. 2 (Emulation Addr) | UGPA2I | - | rd-wr | sys con |
| GGCR | Game Control Register | 201 | - | rd-wr | ports |
| GMCR | MIDI Control Register | P3XR+0 | - | write | ports |
| GMSR | MIDI Status Register | P3XR+0 | - | read | ports |
| GMTDR | MIDI Transmit Data Register | P3XR+1 | - | write | ports |
| GMRDR | MIDI Receive Data Register | P3XR+1 | - | read | ports |
| SVSR | Synth Voice Select Register | P3XR+2 | - | rd-wr | synth |
| IGIDXR | General Index Register | P3XR+3 | - | rd-wr | sys con |
| I16DP | General 16-bit I/O Data Port | P3XR+(4-5) | - | rd-wr | sys con |
| I8DP | General 8-bit I/O Data Port | P3XR+5 | - | rd-wr | sys con |
| SACI | Synth Address Control (1 per voice) | P3XR+5 | IGIDXR=0,80 | wr,rd | synth |
| SFCI | Synth Frequency Control (1 per voice) | P3XR+(4-5) | IGIDXR=1,81 | wr,rd | synth |
| | | | IGIDXR=2,82 | wr,rd | synth |
| SASHI | Synth Addr. Start High (1 per voice) | P3XR+(4-5) | IGIDXR=3,83 | wr,rd | synth |
| SASLI | Synth Addr. Start Low (1 per voice) | P3XR+(4-5) | IGIDXR=4,84 | wr,rd | synth |
| SAEHI | Synth Addr. End High (1 per voice) | P3XR+(4-5) | IGIDXR=5,85 | wr,rd | synth |
| SAELI | Synth Addr. End Low (1 per voice) | P3XR+(4-5) | IGIDXR=6,86 | wr,rd | synth |

FIG. 8B

| Mnemonic | Description | I/O Addr. | Index | Rd-Wr | Module |
|---|---|---|---|---|---|
| SVRI | Synth Volume Rate (1 per voice) | P3XR+5 | IGIDXR=6,86 | wr,rd | synth |
| SVSI | Synth Volume Start(1 per voice) | P3XR+5 | IGIDXR=7,87 | wr,rd | synth |
| SVEI | Synth Volume End(1 per voice) | P3XR+5 | IGIDXR=8,88 | wr,rd | synth |
| SVLI | Synth Volume Level(1 per voice) | P3XR+(4-5) | IGIDXR=9,89 | wr,rd | synth |
| SAHI | Synth Address High (1 per voice) | P3XR+(4-5) | IGIDXR=A,8A | wr,rd | synth |
| SALI | Synth Address Low (1 per voice) | P3XR+(4-5) | IGIDXR=B,8B | wr,rd | synth |
| SROI | Synth Right Offset (1 per voice) | P3XR+(4-5) | IGIDXR=C,8C | wr,rd | synth |
| SVCI | Synth Volume Control(1 per voice) | P3XR+5 | IGIDXR=D,8D | wr,rd | synth |
| SAVI | Synth Active Voices | P3XR+5 | IGIDXR=E,8E | wr,rd | synth |
| SVII | Synth Voice IRQ | P3XR+5 | IGIDXR=8F | read | synth |
| SUAI | Synth Upper Address (1 per voice) | P3XR+5 | IGIDXR=10,90 | wr,rd | synth |
| SEAHI | Synth Effect Addr High (1 per voice) | P3XR+(4-5) | IGIDXR=11,91 | wr,rd | synth |
| SEALI | Synth Effect Addr Low (1 per voice) | P3XR+(4-5) | IGIDXR=12,92 | wr,rd | synth |
| SLOI | Synth Left Offset (1 per voice) | P3XR+(4-5) | IGIDXR=13,93 | wr,rd | synth |

FIG. 8C

| Mnemonic | Description | I/O Addr. | Index | Rd-Wr | Module |
|---|---|---|---|---|---|
| SEASI | Synth Effect Accum Sel (1 per voice) | P3XR+5 | IGIDXR=14,94 | wr, rd | synth |
| SMSI | Synth Mode Select (1 per voice) | P3XR+5 | IGIDXR=15,95 | wr, rd | synth |
| SEVI | Synth Effect Volume (1 per voice) | P3XR+(4-5) | IGIDXR=16,96 | wr, rd | synth |
| SFLFOI | Synth Frequency LFO (1 per voice) | P3XR+5 | IGIDXR=17,97 | wr, rd | synth |
| SVLFOI | Synth Volume LFO (1 per voice) | P3XR+5 | IGIDXR=18,98 | wr, rd | synth |
| SGMI | Synth Global Mode | P3XR+5 | IGIDXR=19,99 | wr, rd | synth |
| SLFOBI | Synth LFO Base Address | P3XR+(4-5) | IGIDXR=1A,9A | wr, rd | synth |
| SROFI | Synth Right Offset Final (1 per voice) | P3XR+(4-5) | IGIDXR=1B,9B | wr, rd | synth |
| SLOFI | Synth Left Offset Final (1 per voice) | P3XR+(4-5) | IGIDXR=1C,9C | wr, rd | synth |
| SEVFI | Synth Effect Vol. Final (1 per voice) | P3XR+(4-5) | IGIDXR=1D,9D | wr, rd | synth |
| SVIRI | Synth Voice Read IRQ | P3XR+5 | IGIDXR=9F | read | synth |
| LDMACI | LMC DMA Control | P3XR+5 | IGIDXR=41 | rd-wr | lmc |
| LDSALI | LMC DMA Start Address[19:4] | P3XR+(4-5) | IGIDXR=42 | rd-wr | lmc |
| LMALI | LMC I/O Address Low[15:0] | P3XR+(4-5) | IGIDXR=43 | rd-wr | lmc |
| LMAGI | LMC I/O Address High[23:16] | P3XR+5 | IGIDXR=44 | rd-wr | lmc |
| UASBCI | AdLib-Sound Blaster Control | P3XR+5 | IGIDXR=45 | rd-wr | sys con |
| UAT1I | AdLib Timer1 Count | P3XR+5 | IGIDXR=46 | rd-wr | sys con |
| UAT2I | AdLib Timer2 Count | P3XR+5 | IGIDXR=47 | rd-wr | sys con |
| XXXX | ADC sample rate--no longer used | P3XR+5 | IGIDXR=48 | write | synth |
| XXXX | ADC control reg--no longer used | P3XR+5 | IGIDXR=49 | rd-wr | synth |
| GJTDI | Joystick Trim DAC | P3XR+5 | IGIDXR=4B | rd-wr | port |

FIG. 9A

| Mnemonic | Description | I/O Addr. | Index | Rd-Wr | Module |
|---|---|---|---|---|---|
| URSTI | Reset Register | P3XR+5 | IGIDXR=4C | rd-wr | sys con |
| LDSAHI | LMC DMA Start Addr[23:20], [3:0] | P3XR+5 | IGIDXR=50 | rd-wr | lmc |
| LMSBAI | LMC 16-Bit Access Register | P3XR+(4-5) | IGIDXR=51 | rd-wr | lmc |
| LMCFI | LMC Configuration Register | P3XR+(4-5) | IGIDXR=52 | rd-wr | lmc |
| LMCI | LMC Control Register | P3XR+5 | IGIDXR=53 | rd-wr | lmc |
| LMRFAI | LMC Record FIFO Base Addr[23:8] | P3XR+(4-5) | IGIDXR=54 | rd-wr | lmc |
| LMPFAI | LMC Play FIFO Base Addr[23:8] | P3XR+(4-5) | IGIDXR=55 | rd-wr | lmc |
| LMFSI | LMC FIFO Size | P3XR+(4-5) | IGIDXR=56 | rd-wr | lmc |
| LDICI | LMC DMA Interleave Control | P3XR+(4-5) | IGIDXR=57 | rd-wr | lmc |
| LDIBI | LMC DMA Interleave Base A[23:8] | P3XR+(4-5) | IGIDXR=58 | rd-wr | lmc |
| ICMPTI | Compatibility Register | P3XR+5 | IGIDXR=59 | rd-wr | sys con |
| IDECI | Decode Control Register | P3XR+5 | IGIDXR=5A | rd-wr | sys con |
| IVERI | Version Number Register | P3XR+5 | IGIDXR=5B | rd-wr | sys con |
| IEMUAI | Emulation Register A | P3XR+5 | IGIDXR=5C | rd-wr | sys con |
| IEMUBI | Emulation Register B | P3XR+5 | IGIDXR=5D | rd-wr | sys con |
| GMRFAI | MIDI Receive FIFO Access Reg. | P3XR+5 | IGIDXR=5E | rd-wr | sys con |
| ITCI | Test Control Register | P3XR+5 | IGIDXR=5F | rd-wr | sys con |
| UCCDR | Codec/CD-ROM--no longer used | P3XR+6 | - | write | sys con |
| LMBDR | LMC Byte Data | P3XR+7 | - | rd-wr | lmc |
| CIDXR | Codec Index Address Register | PCODAR+0 | - | rd-wr | codec |
| CDATAP | Codec Indexed Data Port | PCODAR+1 | - | rd-wr | codec |

FIG. 9B

| Mnemonic | Description | I/O Addr. | Index | Rd-Wr | Module |
|---|---|---|---|---|---|
| CSR1R | Codec Status Register 1 | PCODAR+2 | - | read | codec |
| CPDR | Playback Data Register | PCODAR+3 | - | write | codec |
| CRDR | Record Data Register | PCODAR+3 | - | read | codec |
| CLICI | Left A/D Input Control | PCODAR+1 | CIDXR[4:0]=0 | rd-wr | codec |
| CRICI | Right A/D Input Control | PCODAR+1 | CIDXR[4:0]=1 | rd-wr | codec |
| CLAX1I | Left Aux 1/Synth Input Control | PCODAR+1 | CIDXR[4:0]=2 | rd-wr | codec |
| CRAX1I | Right Aux 1/Synth Input Control | PCODAR+1 | CIDXR[4:0]=3 | rd-wr | codec |
| CLAX2I | Left Auxiliary 2 Input Control | PCODAR+1 | CIDXR[4:0]=4 | rd-wr | codec |
| CRAX2I | Right Auxiliary 2 Input Control | PCODAR+1 | CIDXR[4:0]=5 | rd-wr | codec |
| CLDACI | Left DAC Control | PCODAR+1 | CIDXR[4:0]=6 | rd-wr | codec |
| CRDACI | Right DAC Control | PCODAR+1 | CIDXR[4:0]=7 | rd-wr | codec |
| CPDFI | Playback Data Format | PCODAR+1 | CIDXR[4:0]=8 | rd-wr | codec |
| CFIG1I | Configuration Register 1 | PCODAR+1 | CIDXR[4:0]=9 | rd-wr | codec |
| CEXTI | External Control | PCODAR+1 | CIDXR[4:0]=A | rd-wr | codec |
| CSR2I | Status Register 2 | PCODAR+1 | CIDXR[4:0]=B | read | codec |
| CMODEI | Mode Select, ID | PCODAR+1 | CIDXR[4:0]=C | rd-wr | codec |
| CLCI | Loopback Control | PCODAR+1 | CIDXR[4:0]=D | rd-wr | codec |

FIG. 9C

| Mnemonic | Description | I/O Addr. | Index | Rd-Wr | Module |
|---|---|---|---|---|---|
| CUPCTI | Upper Playback Count | PCODAR+1 | CIDXR[4:0]=E | rd-wr | codec |
| CLPCTI | Lower Playback Count | PCODAR+1 | CIDXR[4:0]=F | rd-wr | codec |
| CFIG2I | Configuration Register 2 | PCODAR+1 | CIDXR[4:0]=10 | rd-wr | codec |
| CFIG3I | Configuration Register 3 | PCODAR+1 | CIDXR[4:0]=11 | rd-wr | codec |
| CLLICI | Left Line Input Control | PCODAR+1 | CIDXR[4:0]=12 | rd-wr | codec |
| CRLICI | Right Line Input Control | PCODAR+1 | CIDXR[4:0]=13 | rd-wr | codec |
| CUTIMI | Upper Timer | PCODAR+1 | CIDXR[4:0]=14 | rd-wr | codec |
| CLTIMI | Lower Timer | PCODAR+1 | CIDXR[4:0]=15 | rd-wr | codec |
| CLMICI | Left Microphone Input Control | PCODAR+1 | CIDXR[4:0]=16 | rd-wr | codec |
| CRMICI | Right Microphone Input Control | PCODAR+1 | CIDXR[4:0]=17 | rd-wr | codec |
| CSR3I | Status Register 3 | PCODAR+1 | CIDXR[4:0]=18 | rd-wr | codec |
| CLOAI | Left Output Attenuation | PCODAR+1 | CIDXR[4:0]=19 | rd-wr | codec |
| CMONOI | Mono Input And Output Control | PCODAR+1 | CIDXR[4:0]=1A | rd-wr | codec |
| CROAI | Right Output Attenuation | PCODAR+1 | CIDXR[4:0]=1B | rd-wr | codec |
| CRDFI | Record Data Format | PCODAR+1 | CIDXR[4:0]=1C | rd-wr | codec |
| CPVFI | Playback Variable Frequency | PCODAR+1 | CIDXR[4:0]=1D | rd-wr | codec |
| CURCTI | Upper Record Count | PCODAR+1 | CIDXR[4:0]=1E | rd-wr | codec |
| CLRCTI | Lower Record Count | PCODAR+1 | CIDXR[4:0]=1F | rd-wr | codec |
| PCSNBR | Card Select Number Back Door | 201 | - | rd-wr | sys con |
| PIDXR | Plug And Play Index Addr. Register | 279 | - | write | sys con |
| PNPWRP | Plug And Play Write Port | A79 | - | write | sys con |

FIG. 10A

| Mnemonic | Description | I/O Addr. | Index | Rd-Wr | Module |
|---|---|---|---|---|---|
| PNPRDP | Plug And Play Read Data Port | PNPRDP | - | read | sys con |
| PSRPAI | PNP Set PNPRDP Address | A79 | 279=00 | write | sys con |
| PISOCI | PNP Isolate Command | PNPRDP | 279=01 | read | sys con |
| PCCCI | PNP Configuration Control Cmd. | A79 | 279=02 | write | sys con |
| PWAKEI | PNP Wake[CSN] Command | A79 | 279=03 | write | sys con |
| PRESDI | PNP Resource Data Register | PNPRDP | 279=04 | read | sys con |
| PRESSI | PNP Resource Data Status | PNPRDP | 279=05 | read | sys con |
| PCSNI | PCP Card Select Number | PNPRDP, A79 | 279=06 | rd-wr | sys con |
| PLDNI | PNP Logical Device Number (LDN) | PNPRDP, A79 | 279=07 | rd-wr | sys con |
| PUACTI | PNP Audio Activate Register | PNPRDP, A79 | LDN=0,279=30 | rd-wr | sys con |
| PURCI | PNP Audio I/O Range Check | PNPRDP, A79 | LDN=0,279=31 | rd-wr | sys con |
| P2XOHI | PNP set P2xr[9:8] | PNPRDP, A79 | LDN=0,279=60 | rd-wr | sys con |
| P2XOLI | PNP set P2xr[7:4] | PNPRDP, A79 | LDN=0,279=61 | rd-wr | sys con |
| P2X6HI | PNP set P2xr[9:8] | PNPRDP, A79 | LDN=0,279=62 | rd-wr | sys con |
| P2X6LI | PNP set P2xr[7:4] | PNPRDP, A79 | LDN=0,279=63 | rd-wr | sys con |
| P2X8HI | PNP set P2xr[9:8] | PNPRDP, A79 | LDN=0,279=64 | rd-wr | sys con |
| P2X8LI | PNP set P2xr[7:4] | PNPRDP, A79 | LDN=0,279=65 | rd-wr | sys con |
| P3XOHI | PNP set P2xr[9:8] | PNPRDP, A79 | LDN=0,279=66 | rd-wr | sys con |
| P3XOLI | PNP set P2xr[7:4] | PNPRDP, A79 | LDN=0,279=67 | rd-wr | sys con |
| PHCAI | PNP set PCODAR[9:8] | PNPRDP, A79 | LDN=0,279=68 | rd-wr | sys con |
| PLCAI | PNP set PCODAR[7:2] | PNPRDP, A79 | LDN=0,279=69 | rd-wr | sys con |

FIG. 10B

| Mnemonic | Description | I/O Addr. | Index | Rd-Wr | Module |
|---|---|---|---|---|---|
| PUI1SI | PNP Audio IRQ Channel 1 Select | PNPRDP, A79 | LDN=0,279=70 | rd-wr | sys con |
| PUI1TI | PNP Audio IRQ Channel 1 Type | PNPRDP | LDN=0,279=71 | read | sys con |
| PUI2SI | PNP Audio IRQ Channel 2 Select | PNPRDP, A79 | LDN=0,279=72 | rd-wr | sys con |
| PUI2TI | PNP Audio IRQ Channel 2 Type | PNPRDP | LDN=0,279=73 | read | sys con |
| PUD1SI | PNP Audio DMA Channel 1 Select | PNPRDP, A79 | LDN=0,279=74 | rd-wr | sys con |
| PUD2SI | PNP Audio DMA Channel 2 Select | PNPRDP, A79 | LDN=0,279=75 | rd-wr | sys con |
| PSEENI | PNP Serial EEPROM Enable | PNPRDP, A79 | LDN=0,279=F0 | rd-wr | sys con |
| PSECI | PNP Serial EEPROM Control | PNPRDP, A79 | LDN=0,279=F1 | rd-wr | sys con |
| PPWRI | PNP Power Mode | PNPRDP, A79 | LDN=0,279=F2 | rd-wr | sys con |
| PRACTI | PNP CD-ROM Activate Register | PNPRDP, A79 | LDN=0,279=30 | rd-wr | sys con |
| PRRCI | PNP CD-ROM I/O Rang Check Reg. | PNPRDP, A79 | LDN=0,279=31 | rd-wr | sys con |
| PRAHI | PNP set PCDRAR[9:8] | PNPRDP, A79 | LDN=0,279=60 | rd-wr | sys con |
| PRALI | PNP set PCDRAR[7:4] | PNPRDP, A79 | LDN=0,279=61 | rd-wr | sys con |
| PRISI | PNP CD-ROM IRQ Select | PNPRDP, A79 | LDN=0,279=70 | rd-wr | sys con |
| PRITI | PNP CD-ROM IRQ Type | PNPRDP | LDN=0,279=71 | read | sys con |
| PRDSI | PNP CD-ROM DMA Select | PNPRDP, A79 | LDN=0,279=74 | rd-wr | sys con |

FIG. 10C

| Bytes | Description |
|---|---|
| 9 | header |
| 3 | plug and play version number |
| 33 | ANSI identifier string |
| 6 | AUDIO logical device |
| 3 | channel 1 IRQ allocation |
| 3 | channel 2 IRQ allocation |
| 3 | channel 1 DMA allocation |
| 3 | channel 2 DMA allocation |
| 2 | start dependent function priority 0 |
| 8 | - I/O addr (min 220, max 220, length 1) |
| 8 | - I/O addr (min 226, max 226, length 1) |
| 8 | - I/O addr (min 228, max 228, length 8) |
| 8 | - I/O addr (min 320, max 320, length 8) |
| 238 | (repeat above dependent function 7 more times) |
| 1 | end dependent function |
| 8 | codec I/O address allocation (min 200, max 3FF, |
| | length 4, align 4) |
| 4 | joystick fixed I/O location (201, length 1) |
| 4 | AdLib fixed I/O location (388, length 2) |
| 6 | CD-ROM logical device |
| 8 | CD-ROM I/O address allocation (min 200, max 3FF, |
| | length 16, align 16) |
| 3 | CD-ROM IRQ allocation |
| 3 | CD-ROM DMA allocation |
| 2 | end tag |
| 374 | TOTAL |

FIG. 22

| Group | Event Descripton | IRQ Enables | Reporting Mechanism | Clear Mechanism |
|---|---|---|---|---|
| iasynth | synth voice reaches end of volume ramp | SVCI[5] & URSTI[2] | UISR[6], SVII[6], SVCI[7] | Set IGIDXR=8Fh |
| iasynth | synth voice finishes loop | SACI[5] & URSTI[2] | UISR[5], SVII[7], SVCI[7] | Set IGIDXR=8Fh |
| CIRQ | codec record sample counter rolls past zero | CFIG1I[1], mode 2 or 3 | CSR3I[5], CSR1R[0] | IOW to CSR1R or CSR3I[5]=0 |
| CIRQ | codec playback sample counter rolls past zero | CFIG1I[0] | CSR3I[4], CSR1R[0] | IOW to CSR1R or CSR3I[4]=0 |
| CIRQ | codec record FIFO reaches threshold | CFIG3I[7], mode 3 | CSR3I[5], CSR1R[0] | IOW to CSR1R or CSR3I[5]=0 |
| CIRQ | codec playback FIFO reaches threshold | CFIG3I[6], mode 3 | CSR3I[4], CSR1R[0] | IOW to CSR1R or CSR3I[4]=0 |
| CIRQ | codec timer reaches zero | CFIG2I[6] | CSR3I[6], CSR1R[0] | IOW to CSR1R or CSR3I[6]=0 |
| - | extra IRQ: set enables | UDCI[7], UICI[6] | not reported | IOW to UDCI[7]=0 |
| iaalsb | IOR of general port 1 | URCR[6], URCR[3], IEMUBI[0] | USRR[4] | IOW to UCLRII |
| iaalsb | IOW to general port 1 | URCR[6], URCR[3], IEMUBI[2] | USRR[3] | IOW to UCLRII |

FIG. 23A

| Group | Event Descripton | IRQ Enables | Reporting Mechanism | Clear Mechanism |
|---|---|---|---|---|
| iaalsb | IOR of general port 2 | URCR[6], URCR[4], IEMUBI[1] | USRR[6] | IOW to UCLRII |
| iaalsb | IOW to general port 2 | URCR[6], URCR[4], IEMUBI[3] | USRR[5] | IOW to UCLRII |
| iaalsb | IOR of 2xE | URCR[7] | USRR[7] | IOW to UCLRII |
| iasynth | TC (ISA bus) is reached for DMA to/from local memory (not the codec) | LDMACI[5] | UISR[7] & LDMACI[6] | IOR of LDMACI |
| iaalsb | IOW to AdLib data register (UADR)** | UASBCI[1] | UISR[4] & UASRR[0] | IOW of UASBCI[1]=0 |
| iaalsb | IOW to SB U2x6R | UASBCI[5] | UISR[4] & UASRR[3] | IOW of UASBCI[5]=0 |
| iaalsb | IOW to SB UI2XCR | UASBCI[5] | UISR[4] & UASRR[4] | IOW of UASBCI[5]=0 |
| iaalsb | AdLib timer 1 rolls past FF | UASBCI[2] | UISR[2], UASRR[2] | IOW to UASBCI[2]=0 |
| iaalsb | AdLib Timer 2 rolls past FF | UASBCI[3] | UISR[3], UASRR[1] | IOW to UASBCI[3]=0 |
| iamidi | MIDI transmit ready | GMCR[6:5] | UISR[0] | IOW to GMTDR |
| iamidi | MIDI data received | GMCR[7] | UISR[1] | IOR of GMRDR |
| iacdrom | external function interrupt | PRACTI[0] | none | none |

FIG. 23B

| |
|---|
| *PWR24, the 24.576 MHz. Oscillator from High to Low.* I2C24SUSPRQ becomes active immediately and ICLK24M to the codec module is allowed to clock for at least 100 microseconds then turned off. It is stopped such that no glitches are possible; after a trailing edge, it stays low. After the clock is disabled the oscillator is disabled by grounding XTAL1O. |
| *PWR24, the 24.576 MHz. Oscillator from Low to High.* The oscillator is enabled and a 16-bit counter is allowed clock through 64K states to insure that the oscillator has stabilized. Then ICLK24M is allowed to start toggling without the possibility of glitching. At least 100 microseconds after that I2COSUSPRQ is disabled. |
| *PWRL, Local Memory Control Enable from High to Low.* I2LSUSPRQ becomes active immediately. ICLK16ML is allowed to toggle for at least 100 microseconds and then disabled without the possibility of glitching. After ICLK16ML stops toggling, I2LSUSPIP becomes active. |
| *PWRL, Local Memory Control Enable from Low to High.* I2LSUSPIP goes inactive immediately and ICLK16ML is allowed to start toggling without the possibility of glitching. At least 100 microseconds after that, I2LSUSPRQ goes inactive. |

FIG. 26A

| |
|---|
| *<u>PWRS, Synth Enable from High to Low.</u> I2SSUSPRQ becomes active immediately. ICLK16MS is allowed to toggle for at least 100 microseconds and then disabled without the possibility of glitching.* |
| *<u>PWRS, Synth Enable from Low to High.</u> ICLK16ML is immediately allowed to start toggling without the possibility of glitching. At least 100 microseconds after that, I2SSUSPRQ goes inactive.* |
| *<u>PPWRI[3:0].</u> The state of these latches is driven off to their respective modules (bit[3] to the ports module and bits[2:0] to the codec module) to disable clocks and place circuitry in low-power mode.* |
| *<u>Enter Shut-Down Mode</u>. When PPWRI[6:1] are all cleared with a single I/O write, then, besides the activity to the individual modules described above, the 16.9 MHz. oscillator will be disabled. This is accomplished by waiting for at least 100 microseconds and then turning aff all clocks without possibility of glitching. Then the oscillator is disabled by grounding XTAL2O.* |
| *<u>Exit Shut-Down Mode</u>. When any of the PPWRI[6:1] bits are set, then, besides the activity of the individual bits described above, the 16.9 MHz. oscillator will be re-enabled. First, the oscillator is re-enabled. XTAL1I is run into a 16-bit counter to count our 64K states before it is assumed to be stable. At this point, the 16.9 MHz. clocks to various modules are allowed to start tolggling without possibility of glitching. After the clocks start toggling, the bits that have been re-enabled start their routine, as described above.* |

*FIG. 26B*

| Name | Qty | Type | Description |
|---|---|---|---|
| AEN | 1 | input | Address enable from the ISA bus, used to distinguish between DMA and I/O cycles. |
| C32KHZ | 1 | input | 32KHZ Clock. Suspend-mode refresh clock for local DRAM. This pin can also be used as an output for the LMC's EFFECT# (see PIN SUMMARY in the general description part of this document). |
| CD_CS | 1 | output | Chip select to the CD-ROM controller. This can also be used for the external serial port (see PIN SUMMARY in the general description). |
| CD_DAK# | 1 | output | DMA acknowlege to the CD-ROM controller. This can also be used for the external serial port (see PIN SUMMARY in the general description). |
| CD_DRQ | 1 | input | DMA request from CD-ROM controller. This can also be used for the external serial port (see PIN SUMMARY in the general description). |
| CD_IRQ | 1 | input | Interrupt request from CD-ROM controller. This can also be used for the external serial port (see PIN SUMMARY in the general description). |

FIG. 28A

| Name | Qty | Type | Description |
|---|---|---|---|
| DAK[7,6,5, 3,1,0]# | 6 | input | The selectable DMA acknowledge lines from the ISA bus. DAK 0, 1, and 3 are used for 8-bit DMA transfers and DAK 5, 6, and 7 are used for 16-bit DMA. |
| DRQ[7,6,5, 3,1,0]# | 6 | oc output | The selectable DMA request lines to the ISA bus. DRQ 0, 1, and 3 are used for 8-bit DMA transfers and DRQ 5, 6, and 7 are used for 16-bit DMA. |
| IOCHRDY | 1 | oc output | I/O channel ready to the ISA bus, used to generate wait states. |
| IOCS16# | 1 | oc output | 16-bit capability indication to the ISA bus. |
| IOR# | 1 | input | I/O read command from the ISA bus. |
| IOW# | 1 | input | I/O write command from the ISA bus. |
| IRQ[15,12,11, 7,5,3,2] | 7 | oc output | The selectable interrupt requests to the ISA bus. |
| IOCHK# | 1 | oc output | I/O channel check on the ISA bus; used to generate an NMI. |
| PNPCS | 1 | bi-dir | Active high output used as chip select for the Plug and Play serial EPROM. This is an input during reset; its state is latched by the trailing edge of RESET to determine if the IC is in PNP-compliant mode (low) or PNP-system mode (high). |

FIG. 28B

| Name | Qty | Type | Description |
|---|---|---|---|
| RESET | 1 | input | Reset from the ISA bus. |
| SA[11:0] | 12 | input | The 12 lower bits of the ISA address bus. |
| SBHE# | 1 | input | Byte high enable from the ISA address bus. When interfacing to an 8-bit ISA bus, this pin must be disconnected. |
| SD[15:0] | 16 | bi-dir | ISA data bus. |
| SUSPEND# | 1 | input | Low-power suspend mode. When active, all chip activity becomes frozen, the oscillators are turned off, C32KHZ is used to refresh DRAM, and most of the ISA-bus inputs and outputs are isolated from the IC. This pin can also be used as an output for the LMC's FRSYNC# (see PIN SUMMARY in the general description part of this document). |
| TC | 1 | input | Terminal Count indicates the end of a DMA group from the ISA bus. |
| XTAL1I | 1 | input | Crystal 1 input. Input from the 24.576 MHz. crystal. |
| XTAL1O | 1 | output | Crystal 1 ouput. Output to the 24.576 MHz. crystal. |
| XTAL2I | 1 | input | Crystal 2 input. Input from the 16.9344 MHz. crystal. |
| XTAL2O | 1 | output | Crystal 2 output. Output to the 16.9344 MHz. crystal. |

FIG. 28C

| DAM Chan | Sample Size | Description |
|---|---|---|
| 8-bit | 8-bit | Each DMA request-acknowledge cycle transfers one byte that is placed in the current track number; the track number increments with each byte transferred. |
| 8-bit | 16-bit | Each DMA request acknowledge cycle transfers two bytes that are placed at the current track number; the track number increments with each 16-bit value transferred. |
| 16-bit | 8-bit | Each DMA request-acknowledge cycle transfers two bytes; the lower byte is placed in the current track number, the track number is incremented and the upper byte is placed in that track; the track number is then incremented again. |
| 16-bit | 16-bit | Each DMA request-acknowledge cycle transfers one 16-bit value that is placed in the current track number; the track number increments with each 16-bit value transferred. |

FIG. 38

System Configuration

| 0 to +22.5dB (4-bit) gain table | | | | | | | |
|---|---|---|---|---|---|---|---|
| Value | dB | Value | dB | Value | dB | Value | dB |
| 00h | 00.0 | 04h | +06.0 | 08h | +12.0 | 0Ch | +18.0 |
| 01h | +01.5 | 05h | +07.5 | 09h | +13.5 | 0Dh | +19.5 |
| 02h | +03.0 | 06h | +09.0 | 0Ah | +15.0 | 0Eh | +21.0 |
| 03h | +04.5 | 07h | +10.5 | 0Bh | +16.5 | 0Fh | +22.5 |

| 0 to -45.0dB (4-bit) attenuation table | | | | | | | |
|---|---|---|---|---|---|---|---|
| Value | dB | Value | dB | Value | dB | Value | dB |
| 00h | 00.0 | 04h | -12.0 | 08h | -24.0 | 0Ch | -36.0 |
| 01h | -03.0 | 05h | -15.0 | 09h | -27.0 | 0Dh | -39.0 |
| 02h | -06.0 | 06h | -18.0 | 0Ah | -30.0 | 0Eh | -42.0 |
| 03h | -09.0 | 07h | -21.0 | 0Bh | -33.0 | 0Fh | -45.0 |

| 12 to -34.5dB (5-bit) gain attenuation table | | | | | | | |
|---|---|---|---|---|---|---|---|
| Value | dB | Value | dB | Value | dB | Value | dB |
| 00h | +12.0 | 08h | 00.0 | 10h | -12.0 | 18h | -24.0 |
| 01h | +10.5 | 09h | -01.5 | 11h | -13.5 | 19h | -25.5 |
| 02h | +09.0 | 0Ah | -03.0 | 12h | -15.0 | 1Ah | -27.0 |
| 03h | +07.5 | 0Bh | -04.5 | 13h | -16.5 | 1Bh | -28.5 |
| 04h | +06.0 | 0Ch | -06.0 | 14h | -18.0 | 1Ch | -30.0 |
| 05h | +04.5 | 0Dh | -07.5 | 15h | -19.5 | 1Dh | -31.5 |
| 06h | +03.0 | 0Eh | -09.0 | 16h | -21.0 | 1Eh | -33.0 |
| 07h | +01.5 | 0Fh | -10.5 | 17h | -22.5 | 1Fh | -34.5 |

*FIG. 45B-1*

| 0 to -46.5dB (5-bit) attenuation table for CLOAI and CROAI | | | | | | | |
|---|---|---|---|---|---|---|---|
| Value | dB | Value | dB | Value | dB | Value | dB |
| 00h | 00.0 | 08h | -12.0 | 10h | -24.0 | 18h | -36.0 |
| 01h | -01.5 | 09h | -13.5 | 11h | -25.5 | 19h | -37.5 |
| 02h | -03.0 | 0Ah | -15.0 | 12h | -27.0 | 1Ah | -39.0 |
| 03h | -04.5 | 0Bh | -16.5 | 13h | -28.5 | 1Bh | -40.5 |
| 04h | -06.0 | 0Ch | -18.0 | 14h | -30.0 | 1Ch | -42.0 |
| 05h | -07.5 | 0Dh | -19.5 | 15h | -31.5 | 1Dh | -43.5 |
| 06h | -09.0 | 0Eh | -21.0 | 16h | -33.0 | 1Eh | -45.0 |
| 07h | -10.5 | 0Fh | -22.5 | 17h | -34.5 | 1Fh | -46.5 |

| 0 to -94.5dB (6-bit) attenuation table | | | | | | | |
|---|---|---|---|---|---|---|---|
| Value | dB | Value | dB | Value | dB | Value | dB |
| 00h | 00.0 | 10h | -24.0 | 20h | -48.0 | 30h | -72.0 |
| 01h | -01.5 | 11h | -25.5 | 21h | -49.5 | 31h | -73.5 |
| 02h | -03.0 | 12h | -27.0 | 22h | -51.0 | 32h | -75.0 |
| 03h | -04.5 | 13h | -28.5 | 23h | -52.5 | 33h | -76.5 |
| 04h | -06.0 | 14h | -30.0 | 24h | -54.0 | 34h | -78.0 |
| 05h | -07.5 | 15h | -31.5 | 25h | -55.5 | 35h | -79.5 |
| 06h | -09.0 | 16h | -33.0 | 26h | -57.0 | 36h | -81.0 |
| 07h | -10.5 | 17h | -34.5 | 27h | -58.5 | 37h | -82.5 |
| 08h | -12.0 | 18h | -36.0 | 28h | -60.0 | 38h | -84.0 |
| 09h | -13.5 | 19h | -37.5 | 29h | -61.5 | 39h | -85.5 |
| 0Ah | -15.0 | 1Ah | -39.0 | 2Ah | -63.0 | 3Ah | -87.0 |
| 0Bh | -16.5 | 1Bh | -40.5 | 2Bh | -64.5 | 3Bh | -88.5 |
| 0Ch | -18.0 | 1Ch | -42.0 | 2Ch | -66.0 | 3Ch | -90.0 |
| 0Dh | -19.5 | 1Dh | -43.5 | 2Dh | -67.5 | 3Dh | -91.5 |
| 0Eh | -21.0 | 1Eh | -45.0 | 2Eh | -69.0 | 3Eh | -93.0 |
| 0Fh | -22.5 | 1Fh | -46.5 | 2Fh | -70.5 | 3Fh | -94.5 |

FIG. 45B-2

Response of sinc ^ 5 Interpolator

Noise Shaper Signal Flow Graph (SFG)

FRONT END OF ADC 516

Block diagram of Half-band Filter - Direct Form

Block diagram of Half-band Filter - Transposed form

* indicates self-modifying
** indicates program modification

* indicates self-modifying

For normal modes

| Clock # | Result bus | op | Reg. array bus | equation | comments |
|---|---|---|---|---|---|
| 1 | | | FLFO | | • load register array with next value from LFO generator if LFO and voice match |
| 2 | sign extended FLFO | + 18s | FC | FC(LFO)= FC+FLFO | |
| 3 | [+,-] result | + 34s | ADD | NADD= ADD±FC(LFO) | • invert result based on DIR<br>• load ADD into register to drive LMC<br>• load ADDfr into register to drive Signal Path |
| 4 | [+,-] (result => temp2) | + 34s | [+END, -START] | [-NADD+END, NADD-START] | • choose [+END, -START] based on LPE, BLEN, DIR<br>• latch sign of operation<br>• sign=1 indicates NADD>END or NADD<START |
| 5 | result | | | | |
| 6 | result | | | | |

FIG. 108A-1

For normal modes

| Clock # | Result bus | op | Reg. array bus | equation | comments |
|---|---|---|---|---|---|
| 7 | [+,-] result | + 34s | [START, END] | [START, END] ±[±NADD ±[START, END] | • choose [+,-] and [END, START] based on LPE, BLEN and DIR<br>• load ADD+1 into register to drive LMC |
| 8 | result | | [result, temp2] | | • choose [result, temp2] based on latched sign values above<br>• upper bits truncate to get 32 bit unsigned result |
| 9 | | | | | |
| 10 | | | | | |
| 11 | | | | | |
| 12 | | | | | |

FIG. 108A-2

For Boundary mirror mode (ENH=1, ENPCM=1, LPE1)

| Clock # | Result bus | op | Reg. array bus | equation | comments |
|---|---|---|---|---|---|
| 1 | | | FLFO | | • load register array with next value from LFO generator if LFO and voice match |
| 2 | sign extended FLFO | + 18s | FC | FC(LFO)= FC+FLFO | |
| 3 | (result=> temp1) | + 34s | ADD | NADD= ADD±FC(LFO) | • load ADD into register to drive LMC<br>• load ADDfr into register to drive Signal Path |
| 4 | (result=> temp2) | + 34s | -END | NADD-END | |
| 5 | (result=> temp3) | + 34s | -temp1 | ADD-END | • latch sign of operation<br>• sign=0 indicates ADD≥END |
| 6 | temp3 | + 34s | -1 | NADD-END-1 | • latch sign of operation<br>• sign=0 indicates ADD≥END+1 |

FIG. 108B-1

For Boundary mirror mode (ENH=1, ENPCM=1, LPE1)

| Clock # | Result bus | op | Reg. array bus | equation | comments |
|---|---|---|---|---|---|
| 7 | result | + 34s | START=> temp4 | START +(NADD-END-1) | • load ADD+1 into register if sign=1 in operation 5 or START if sign=0, register will drive LMC<br>• load START into temp4 for operation 1 |
| 8 | result | | [result, temp2] | | • choose [result, temp2] based on latched sign value of operation 6 above<br>• upper bits truncate to get 32 bit unsigned result |
| 9 | 0 | + 33s | EADD | | • load EADD into Effects buffer based on SMSI[0] |

FIG. 108B-2

For Boundary mirror mode (ENH=1, ENPCM=1, LPE1)

| Clock # | Result bus | op | Reg. array bus | equation | comments |
|---|---|---|---|---|---|
| 10 | result=EADD, EADD=> temp2 | + 33s | -END | EADD-END | • latch sign of operation<br>• sign=0 indicates if EADD ≥ END<br>• load EADD into temp2 for operation 11 |
| 11 | 1 | + 34s | temp2=EADD | NEADD +EADD+1 | |
| 12 | | | [temp4=START, result] | | • choose [START, result] based on latched sign above<br>• upper bits truncate to get 32 bit unsigned result |

FIG. 108B-3

| Clock # | Result bus | op | Reg. array bus | equation | comments |
|---|---|---|---|---|---|
| 1 | | | ROFF(PAN) | | • start decoding PAN based on OFFEN |
| 2 | | | VLFO | | • load register array with next value from LFO generator if LFO voices match |
| 3 | sign extended VLFO | + 17s | VOL | VOL(L)+VLFO | • add volume LFO variation to VOL |
| 4 | result=> temp1 | + 15u | -ROFF | VOL(L)+VLFO-ROFF | • ROFF output from ROM or register array based on OFFEN<br>• result can not be grater than 32767 or negative |
| 5 | temp1 | + 15u | -LOFF | VOL(L)+VLFO-ROFF | • LOFF output from ROM or registrer array based on OFFEN<br>• result can not be greater than 32767 or negative |
| 6 | temp1<br>0 | + 15u | [+,-] EVOL | VOL(L)+VLFO-EVOL<br>EVOL | • offset by EVOL or just output EVOL based on SMSI[AEP]<br>• result can not be greater than 32767 or negative |

FIG. 110A

| Clock # | Result bus | op | Reg. array bus | equation | comments |
|---|---|---|---|---|---|
| 7 | | | VOLINC | | |
| 8 | [+,-] shifted VOLINC | + 17s | VOL | VOL± VOLINC | • enable update of VOL based on FR8 or FR64<br>• shift VOLINC bit field based on rate bits<br>• invert result bus input based on DIR |
| 9 | [+,-] (result=> temp1) | + 17s | [+END, -START] | ±(VOL±VOLINC) ±[START,END] | • choose [+END,-START] based on LPE, BLEN,DIR<br>• latch sign of operation |
| 10 | [+,-] result | + 17s | [END, START] | [START,END] ±(±(VOL VOLINC) ±[START,END]) | • choose [+,-] and [END, START] based on LPE, BLEN and DIR |
| 11 | [result, temp1] | | NEXT VOL= result bus | | • choose [result, temp1] on the result bus based on latch sign value above<br>• upper bits truncate to get 15 bit unsigned result |
| 12 | | | | | |

FIG. 110B

| Clock # | MULT bus | X op | MULT op | A bus | + op |
|---|---|---|---|---|---|
| 1 | | | | S2 | + 17s |
| 2 | ADD/SUB result | * 17s | ADDFR | ADD/SUB result | |
| 3 | | | | | |
| 4 | | | | | |
| 5 | MULT results | | | MULT result | + 16s |
| 6 | ADD/SUB result=> temp1 | * 16s | RVOL | ADD/SUB result | |
| 7 | temp1 | * 16s | LVOL | [S1 new=> S reg, S1] | + 16s |

FIG. 117A

| + op | B bus | MULT equation | ADD/SUB equation |
|---|---|---|---|
| + 17s | -S1 | | S2-S1 |
| | | (S2-S1) •(ADDfr/1024) | |
| | | | |
| | | | |
| + 16s | S1 | | S=S1+ ((S2-S1) •(ADDfr/1024)) |
| | | $S \bullet 2^{(RVOL/256)-16}$ | |
| + 16s | 0 | $S \bullet 2^{(LVOL/256)-16}$ | S1 new => S1 reg |

| | | | | | |
|---|---|---|---|---|---|
| 8 | temp1 | * 16s | EVOL | [2 • $(\overline{S(z)})$, nop] | + 16s |
| 9 | MULT result=> ROUT | | | [[+,-] ADD/SUB result => S1 reg, nop] | + 16s |
| 10 | MULT result=> LOUT | | | [S2 new => S reg, S2] | + 16s |
| 11 | MULT result=> EOUT | | | [2 • $(\overline{S(z)})$, nop] | + 16s |
| 12 | | | | [[+,-] ADD/SUB result => ADD LAT reg, nop] | + 16s |

| B bus | MULT equation | ADD/SUB equation |
|---|---|---|
| [33, nop] | $S \bullet 2^{(EVOL/256)-16}$ | $\left(33+2\left(\overline{S(z)}\right)\right) \bullet 2^{\overline{S(y)}}$ |
| [[+,-] 33, nop] | | $4 \bullet \left(\pm 33 \mp \left(\left(33+2\left(\overline{S(z)}\right)\right) \bullet 2^{\overline{S(y)}}\right)\right)$ |
| 0 | | S2 new => ADD LAT reg |
| [33, nop] | | $\left(33+2\left(\overline{S(z)}\right)\right) \bullet 2^{\overline{S(y)}}$ |
| [[+,-] 33, nop] | | $4 \bullet \left(\pm 33 \mp \left(\left(33+2\left(\overline{S(z)}\right)\right) \bullet 2^{\overline{S(y)}}\right)\right)$ |

| Clock # | | op | | equation | comments |
|---|---|---|---|---|---|
| 1 | R.ACC | + | ROUT | R.ACC. = R.ACC.+ROUT | |
| 2 | L.ACC | + | LOUT | L.ACC. = L.ACC.+LOUT | |
| 3 | E.ACC.0 | + | [EOUT,0] | E.ACC.0 = E.ACC.0+[EOUT,0] | • EOUT or 0 is added based on SEASI[0] |
| 4 | E.ACC.1 | + | [EOUT,0] | E.ACC.1 = E.ACC.1+[EOUT,0] | • EOUT or 0 is added based on SEASI[1] |
| 5 | E.ACC.2 | + | [EOUT,0] | E.ACC.2 = E.ACC.2+[EOUT,0] | • EOUT or 0 is added based on SEASI[2] |
| 6 | E.ACC.3 | + | [EOUT,0] | E.ACC.3 = E.ACC.3+[EOUT,0] | • EOUT or 0 is added based on SEASI[3] |
| 7 | E.ACC.4 | + | [EOUT,0] | E.ACC.4 = E.ACC.4+[EOUT,0] | • EOUT or 0 is added based on SEASI[4] |
| 8 | E.ACC.5 | + | [EOUT,0] | E.ACC.5 = E.ACC.5+[EOUT,0] | • EOUT or 0 is added based on SEASI[5] |
| 9 | E.ACC.6 | + | [EOUT,0] | E.ACC.6 = E.ACC.6+[EOUT,0] | • EOUT or 0 is added based on SEASI[6] |
| 10 | E.ACC.7 | + | [EOUT,0] | E.ACC.7 = E.ACC.7+[EOUT,0] | • EOUT or 0 is added based on SEASI[7] |
| 11 | | | | | • if voice is an effects voice output appropriate effects accumulator based on lower 3 bits of voice number<br>• on 32nd voice output R and L accummulators |
| 12 | | | | | |

FIG. 119

| SSG | SRG | SAG | SVG |
|---|---|---|---|
| LFSYNC | | | |
| 0.12. FSYNC | | | |
| 1. AV(in) | | | |
| 2 | 0,12 | | |
| 3 | 1. RD0 | | |
| 4 | 2. RD0 | | |
| 5 | 3 | 0.12 | 0.12 |
| 6 | 4 | 1. NFLFO(in) | 1 |
| 7 | 5. WR31* | 2 | 2. NVLFO(in) |
| 8 | 6. WR31* | 3. ADD(out) ADDfr(out)0 | 3 |
| 9 | 7 | 4 | 4 |
| 10 | 8 | 5 | 5. RVOL(out)0 |
| 11 | 9 | 6 | 6. LVOL(out)0 |
| 0,12. VN(out) | 10 | 7. START(out) | 7. EVOL(out)0 |
| 1. AV(in) | 11 | 8 | 8 |
| 2 | 0.12 | 9. EADD(out)0 | 9 |
| 3 | 1. RD1 | 10 | 10 |
| 4 | 2. RD1 | 11 | 11 |
| 5 | 3 | 0.12 | 0.12 |
| 6 | 4 | 1. NFLFO(in) | 1 |
| 7 | 5 | 2 | 2. NVLFO(in) |
| 8 | 6 | 3. ADD(out) ADDfr(out)1 | 3 |
| 9 | 7 | 4 | 4 |
| 10 | 8 | 5 | 5. RVOL(out)1 |
| 11 | 9 | 6 | 6. LVOL(out)1 |
| 0.12. VN(out) | 10 | 7. START(out) | 7. EVOL(out)1 |

*FIG. 120A*

*NOT DONE AFTER RESET

| | | | |
|---|---|---|---|
| 1. AV(in) | 11 | 8 | 8 |
| 2 | 0.12 | 9. EADD(out)1 | 9 |
| 3 | 1. RD2 | 10 | 10 |
| 4 | 2. RD2 | 11 | 11 |
| 5 | 3 | 0.12 | 0.12 |
| 6 | 4 | 1. NFLFO(in) | 1 |
| 7 | 5. WR1 | 2 | 2. NVLFO(in) |
| 8 | 6. WR1 | 3. ADD(out) ADDfr(out)2 | 3 |
| 9 | 7 | 4 | 4 |
| 10 | 8 | 5 | 5. RVOL(out)2 |
| 11 | 9 | 6 | 6. LVOL(out)2 |
| 0.12. VN(out) | 10 | 7. START(out) | 7. EVOL(out)2 |
| 1. AV(in) | 11 | 8 | 8 |
| 2 | 0.12 | 9. EADD(out)2 | 9 |
| 3 | 1. RD3 | 10 | 10 |
| 4 | 2. RD3 | 11 | 11 |
| 5 | 3 | 0.12 | 0.12 |
| 6 | 4 | 1. NFLFO(in) | 1 |
| 7 | 5. WR2 | 2 | 2. NVLFO(in) |
| 8 | 6. WR2 | 3. ADD(out) ADDfr(out)3 | 3 |
| 9 | 7 | 4 | 4 |
| 10 | 8 | 5 | 5. RVOL(out)3 |
| 11 | 9 | 6 | 6. LVOL(out)3 |
| 0.12. VN(out) | 10 | 7. START(out) | 7. EVOL(out)3 |
| 1. AV(in) | 11 | 8 | 8 |

*FIG. 120B*

| SSP | SAC | LMC |
|---|---|---|
| | | syn1 |
| | | 2 |
| | | 3 |
| | | 4 |
| | | o,e1 |
| | | 2 |
| | | 3 |
| | | 4 |
| | | syn1 |
| | | 2 |
| | | 3. ADD(in) |
| | | 4 |
| 0.12 | | syn1 |
| 1 | | 2 |
| 2. ADDfr(in)31* | | 3. [ADD+1(in). START(in)] |
| 3 | | 4 |
| 4 | | o,e1 |
| 5 | | 2. S1(out) |
| 6. RVOL(in)31* | | 3 |
| 7. LVOL(in)31* S1(in) | B | 4 |
| 8. EVOL(out)31* | | syn1 |
| 9. ROUT(out)31* | 0.12 | 2. S2(out) |
| 10. LOUT(out)31* S2(in) | 1. ROUT(in)31 | 3. ADD (in) |
| 11. EOUT(out)31* | 2. LOUT(in)31 | 4 |
| 0,12 | 3. EOUT(in)31 | syn1 |
| 1 | 4 | 2 |

*FIG. 120C*

| | | |
|---|---|---|
| 2. ADDfr(in)0 | 5 | 3. [ADD+1(in), START(in)] |
| 3 | 6 | 4 |
| 4 | 7 | o,e1 |
| 5 | 8 | 2. S1(out) |
| 6. RVOL(in)0 | 9 | 3 |
| 7. LVOL(in)0 S1(in) | 10 A | 4 |
| 8. EVOL(in)0 | 11. R&Lacc(out) EACC(out)31 | syn1 |
| 9. ROUT(out)0 | 0.12 | 2. S2(out) |
| 10. LOUT(out)0 S2(in) | 1. ROUT(in)0 | 3. ADD(in) |
| 11. EOUT(out)0 | 2. LOUT(in)0 | 4 |
| 0.12 | 3. EOUT(in)0 | syn1 |
| 1 | 4 | 2 |
| 2. ADDfr(in)1 | 5 | 3. [ADD+1(in), START(in)] |
| 3 | 6 | 4 |
| 4 | 7 | o,e1 |
| 5 | 8 | 2. S1(out) |
| 6. RVOL(in)1 | 9 | 3 |
| 7. LVOL(in)1 S1(in) | 10 | 4 |
| 8. EVOL(in)1 | 11. EACC(out)0 | syn1 |
| 9. ROUT(out)1 | 0.12 | 2. S2(out) |
| 10. LOUT(out)1 S2(in) | 1. ROUT(in)1 | 3. ADD(in) |
| 11. EOUT(out)1 | 2. LOUT(in)1 | 4 |
| 0,12 | 3. EOUT(in)1 | syn1 |
| 1 | 4 | 2 |
| 2. ADDfr(in)2 | 5 | 3. [ADD+1(in), START(in)] |

*FIG. 120D*

WAVETABLE AUDIO SYNTHESIZER WITH MULTIPLE VOLUME COMPONENTS AND TWO MODES OF STEREO POSITIONING

This application is a continuation of application Ser. No. 08/333,389, filed Nov. 2, 1994, now abandoned.

CROSS REFERENCE TO RELATED APPLICATIONS

The present application is related to the following patent applications filed on the same date herewith, all of which are assigned to the same assignee as the present invention, and all of which are hereby incorporated by referenced thereto and made a part hereof as if fully set forth herein:

Hazard-Free Divider Circuit, application Ser. No. 08/333,410; Monolithic PC Audio Circuit, application Ser. No. 08/333,451; Modular Integrated Circuit Power Control, application Ser. No. 08/333,537; Audio Processing Chip with External Serial Port, application Ser. No. 08/333,387; Wavetable Audio Synthesizer with Delay-Based Effects Processing, application Ser. No. 08/334,462; Wavetable Audio Synthesizer with Low Frequency Oscillators for Tremolo and Vibrato Effects, application Ser. No. 08/333,564; Wavetable Audio Synthesizer with an Interpolation Technique for Improving Audio Quality, application Ser. No. 08/333,398; Monolithic PC Audio Circuit with Enhanced Digital Wavetable Audio Synthesizer, Ser. No. 08/333,536; Wavetable Audio Synthesizer with Waveform Volume Control for Eliminating Zipper Noise, application Ser. No. 08/333,562; Digital Signal Processor Architecture for Wavetable Audio Synthesizer, application Ser. No. 08/334,461; Wavetable Audio Synthesizer with Enhanced Register Array, application Ser. No. 08/334,463; A Digital Decimation and Compensation Filter System, application Ser. No. 08/333,403; Digital Interpolation Circuit for Digital-to-Analog Converter Circuit, application Ser. No. 08/333,399; Analog-to-Digital Converter Circuit, application Ser. No. 08/333,535; Stereo Audio Codec, application Ser. No. 08/333,467; Digital Noise Shaper Circuit, application Ser. No. 08/333,386; and Digital-to-Analog Converter Circuit, application Ser. No. 08/333,460.

BACKGROUND OF THE INVENTION

1. Field of the Invention

This invention relates to a digital wavetable audio synthesizer with multiple volume components and two modes of stereo positioning. More particularly, this invention relates to a digital wavetable audio synthesizer with multiple volume components and two modes of stereo positioning for use in system boards and add-in cards for desktop and portable computers. As an example, the wavetable audio synthesizer of this invention may be used in a PC-based sound card.

2. Brief Description of the Invention

Digital audio has become a viable alternative to analog audio. In general, in digital audio, sound waves are represented as a series of number values which can be stored as data in a variety of media including hard disks, compact disks, digital audio tape, and computer RAM and ROM. Digital audio uses such data to provide unique and beneficial editing and signal processing capabilities.

In digital audio, quantization and sampling processes are used to generate the data representing the amplitude (level) element of sound and the frequency (events over time) element of sound. An analog-to-digital converter (ADC) measures the amplitude of a sound signal—in the form of an analog voltage signal—at particular instances or samples. The rate at which the ADC takes these measurements is referred to as the sampling rate. Quantization is a process in which the ADC generates a series of binary or digital numbers representing the amplitude measurements. A digital-to-analog converter (DAC) transforms digital data representing sound into analog voltage signals. These analog voltage signals may then be applied to an audio amplifier and speakers for playing sound.

Several types of digital "synthesizers," i.e. devices that generate sound through audio digital-signal-processing, are now available. One modern type of digital synthesizer is a wavetable synthesizer. Wavetable synthesizers generate sounds through digital processing of entire digitized sound waveforms or portions of digitized sound waveforms stored in wavetable memory.

Wavetable synthesizers generate sounds by "playing back" from wavetable memory, to a DAC, a particular digitized waveform. The addressing rate of the wavetable data controls the frequency or pitch of the analog output. The bit width of the wavetable data affects the resolution of the sound being generated. For example, better resolution can be achieved with 16-bit wide data versus 8-bit wide data. 16-bit digital audio is becoming the standard in the industry.

The digitized waveform data may comprise a complete sound, sampled in its entirety, or only a selected portion of the sound. If the waveform is complex, it may be necessary to store the entire digitized waveform. For uniform, repetitive sounds, a fundamental cycle of the waveform may be stored in a smaller block of wavetable memory. Then, the synthesizer can loop through this block of wavetable memory to generate continuous uniform, repetitive sound. Alternatively, a complex segment of waveform may be stored in its entirety in a larger block of the wavetable memory while only a fundamental cycle of a repetitive segment of the waveform is stored in a smaller block of memory. Then, during playback, the synthesizer will first address or scan through the larger block of memory to playback the complex segment of the waveform and then loop through the smaller block of memory to playback the repetitive segment of the sound.

Wavetable synthesizers typically use wavetable data interpolation to reduce the amount of data required to generate quality sound, to reduce distortion, and to increase the signal-to-noise ratio of the generated sounds. In wavetable data interpolation, at the beginning of each sound's or voice's processing, two data samples, S1 and S2, are read from wavetable data. See FIG. 121. The wavetable address contains an integer and a fractional portion. The integer portion addresses S1 data and is incremented by 1 to address S2 data. The fractional portion indicates the distance from S1 towards S2 to interpolate and generate an interpolated sample, S. The address for S is designated by the complete (integer and fractional portions) and current wavetable address. The equation for obtaining the interpolated sample S is:

$$S=S1+(S2-S1).T_{I}$$

where $T_{I}$ is the distance from S1, towards S2, to S. Through each interpolation, an additional data sample (S) can be created from two data samples (S1 and S2) stored in wavetable memory. Thus, a particular generated sound can be made up of both wavetable data and interpolated data, and thus, the sound will comprise more data than is stored in wavetable memory for this sound. Wavetable synthesizers generate a certain number of voices or sounds at a particular sample rate. The sample rate affects the audio quality of the generated sounds, with slower sample rates degrading audio quality. Since the highest frequency that can be perceived by normal human hearing is 20 KHz, a sampling rate of 44.1 KHz is adequate. 44.1 KHz is the sample rate used by modern CD players. A prior art wavetable synthesizer in a sound card offered by Ultrasound, which is discussed in more detail below, requires a trade off between the number of voices that can be generated at a particular sample rate and the maximum available sample rate. For example, the prior art Ultrasound synthesizer can only generate up to 14 active voices at a 44.1 KHz sample rate but can generate a maximum of 32 voices at a less desirable 19.4 KHz sample rate.

Notes generated by music instruments have a characteristic "envelope" that generally contains attack, decay, sustain, and release segments. FIG. 122 illustrates an example of an envelope with these segments. The data representing the envelope of sound to be generated can be stored in digitized format in a wavetable. Thus, wavetable synthesizers can generate the envelope along with the sound waveform. However, since the additional envelope data may put a strain on memory resources, wavetable synthesizers have been developed with separate envelope generation capabilities. A wavetable synthesizer can generate an envelope by multiplying volume components with the generated sound waveform. As an example, the volume component can be a volume ramp-up or ramp-down until a particular boundary is reached. The particular segment of the envelope being generated dictates the rate of volume ramping and the direction of the ramping (up or down).

Wavetable synthesizers can also be designed to produce stereo sound. After generating a voice having envelope, wavetable synthesizers with stereo capability multiply left and right volume components with the generated voice signal to provide stereo left and right output signals. These wavetable synthesizers are typically provided with panning capability which will place the generated sound in any one of a discrete number of evenly spaced stereo field or pan positions.

Wavetable synthesizers have application in personal computers. Typically, personal computers are manufactured with only limited audio capabilities. These limited capabilities provide monophonic tone generation to provide audible signals to the user concerning various simple functions, such as alarms or other user alert signals. The typical personal computer system has no capability of providing stereo, high-quality audio which is a desired enhancement for multimedia and video game applications, nor do they have built-in capability to generate or synthesize music or other complex sounds. Musical synthesis capability is necessary when the user desires to use a musical composition application to produce or record sounds through the computer to be played on an external instrument, or through analog speakers and in multimedia (CD-ROM) applications as well.

Additionally, users at times desire the capability of using external analog sound sources, such as stereo equipment, microphones, and non-MIDI electrical instruments, to be recorded digitally and/or mixed with digital sources before recording or playback through their computer. To satisfy these demands, a number of add-on products have been developed. One such line of products is referred to in the industry as a sound card. These sound cards are circuit boards carrying a number of integrated circuits, many times including a wavetable synthesizer, and other associated circuitry which the user installs in expansion slots provided by the computer manufacturer. The expansion slots provide an ISA interface to the system bus thereby enabling the host processor to access sound generation and control functions on the board under the control of application software. Typical sound cards also provide MIDI interfaces and game ports to accept inputs from MIDI instruments such as keyboard and joysticks for games.

One prior art sound card is that offered by Advanced Gravis and Forte under the name Ultrasound. This sound card is an expansion slot embodiment which incorporates into one chip (the "GF-1") a wavetable synthesizer, MIDI and game interfaces, DMA control and Adlib Sound Blaster compatibility logic. In addition to this ASIC, the Ultrasound card includes on-board DRAM (1 megabyte) for wavetable data; an address decoding chip; separate analog circuitry for interfacing with analog inputs and outputs; a separate programmable ISA bus interface chip; an interrupt PAL chip; and a separate digital-to-analog/analog-to-digital converter chip. See U.S. patent application Ser. No. 072,838, entitled "Wave Table Synthesizer," by Travers, et al., which is incorporated herein by reference.

The synthesizer of the Ultrasound card is a state of the art wavetable synthesizer. It has stereo capability and can generate 32 independent voices, allowing for multi-timbrel (i.e., several different instrument sounds/voices at one time), polyphonic (i.e., chords), and high fidelity sounds to be simultaneously generated. The Ultrasound's wavetable synthesizer generates envelopes of sound waveforms through the use of volume control.

However, the prior art Ultrasound wavetable synthesizer has several limitations and areas that can be improved. For example, it can generate only up to 14 voices at the desirable 44.1 KHz sample rate, and can generate 15–32 voices only at lower audio degrading sample rates. The Ultrasound synthesizer also does not have hardware for automatically adding tremolo and vibrato to any of the possible 32 voices. Furthermore, it does not have hardware for delay-based effects processing. The Ultrasound synthesizer requires complex system software to be programmed to add tremolo and vibrato effects to any voice, or to generate delay-based effects, such as echo, reverb, chorus, and flange to any voice. Any effects that can be generated are likely crude. Alternatively, the audio signals generated by the Ultrasound synthesizer can be sent to an off-chip digital signal processor for generating delay-based effects to these signals. However, this obviously requires additional hardware and wiring. Furthermore, because these digital signal processors operate on the synthesizer's output audio signal, which is a compilation of the voices generated in a given time, they cannot generate delay-based effects to select voices in this compilation of voices.

An additional limitation of the Ultrasound wavetable synthesizer is that it only has 16 stereo pan positions. A need exists for the ability to place generated voices anywhere in the stereo field.

Another example of an area for improvement in the Ultrasound synthesizer is the potential problem of zipper noise created during particular volume changes. Zipper noise occurs in the Ultrasound synthesizer when it is incrementing the volume of a generated voice at a slow rate, but the volume increment is large.

The wavetable synthesizer of the present invention overcomes each of the above-mentioned limitations and problems in a number of unique and efficient ways. Furthermore, the wavetable synthesizer of the present invention also provides enhanced capabilities heretofore unavailable.

SUMMARY OF THE INVENTION

The synthesizer module of the present invention is a wavetable synthesizer which can generate up to 32 high-quality audio digital signals or voices, including up to eight delay-based effects. The synthesizer module can also add tremolo and vibrato effects to any voice. These voices and delay-based effects can be sent to a CODEC for conversion into analog signals and for possible mixing functions. These analog signals can then be applied to an audio amplifier and speakers for playing the generated sound.

During each frame, which is a period of approximately 22.7 microseconds, the synthesizer module produces one left and one right digital output and sends these outputs to a DAC in a CODEC module. In each frame, there are 32 slots, in which a data sample (S) of each of a possible 32 voices is individually processed by the synthesizer module.

The synthesizer module includes an address generator. For each voice generated during a frame, the address generator generates an address of the next data sample (S) to be read from wavetable data. The wavetable address for data sample S contains an integer and a fractional portion. The integer portion is the address for data sample, S1, and is incremented by 1 to address data sample, S2. The fractional portion indicates the distance from S1 towards S2 needed for interpolating data sample, S. Based on the address of data sample S, the synthesizer module reads data samples, S1 and S2, from wavetable data. Data sample S is then interpolated from the data samples, S1 and S2, and the fractional portion of the address. The synthesizer module has a signal path which performs the operations required for the interpolation. The wavetable data is stored in local dynamic random access memory (DRAM) and/or read only memory (ROM).

The next address generated by the address generator depends on its addressing mode. For example, the address generator can address through a block of wavetable data and then stop, it can loop through a block of data, and it can address through the data in a forward or reverse direction. When the address generator loops through a block of data, the synthesizer module can be programmed to interpolate between the data at the end and start of the block of data to prevent discontinuities in the generated signal.

The rate at which the wavetable data is addressed controls the pitch or frequency of the generated voice's output signal. The address controller controls this rate. The synthesizer module includes a low frequency oscillator (LFO) generator which can add an LFO variation to this rate for adding vibrato to a voice.

The synthesizer module also includes a volume generator. Under the control of the volume generator and the synthesizer module's signal path, three volume multiplying paths are used to add envelope, LFO variation, right offset, left offset and effects volume to each voice. The three paths are left, right, and effects. In each path, three volume components are multiplied to each voice. After each component is calculated, they are summed and used to control the volume of the three signal paths.

For the volume component which adds envelope to a voice, the volume generator can forward, reverse, or bi-directionally loop the volume between volume boundaries, or just ramp the volume up or down to a volume boundary. An LFO generator generates LFO variation which can be used to continuously modify a voice's volume. Continuously modifying a voice's volume creates a tremolo effect.

The volume generator prevents zipper noise by preventing volume increment steps of greater than seven at slower rates of volume increment.

The volume generator controls stereo positioning of a generated voice in two ways: (i) a voice can be placed in one of sixteen pan positions; or (ii) left and right offsets can be programmed to place the voice anywhere in the stereo field. The left and right offsets can also be used to control the overall volume. Left and right offset volume increment control circuitry is available. This control circuitry can be used to prevent zipper noise.

The volume generator can also add an effects volume component to a voice. Effects volume increment control circuitry is also available. As is discussed in more detail below, the effects volume can be used to attenuate the volume of a voice after delay-based effect processing. This volume attenuation is used to create an echo effect.

After the synthesizer module generates the left and right outputs for a data sample of a voice, accumulation logic in the synthesizer module sums the left and right outputs with any other left and right outputs already generated during the same frame. The left and right outputs are accumulated in left and right accumulators. The accumulation logic continues this process until it has summed all the outputs of voices processed during the frame. The final sums in the left and right accumulators are then sent serially to a DAC in a CODEC module for conversion into right and left analog signals, and for possible mixing functions. The analog signals may then be applied to an audio amplifier and speaker for playing the generated sound.

After a data sample of a voice has been generated and then multiplied by the volume components that provide envelope and tremolo, but before the data sample is multiplied by left and right offsets and accumulated in the left and right accumulators, it can be directed to the effects signal path for delay-based effects processing. In the effects signal path, the data sample can be multiplied by an effects volume component and then it is stored in one of eight effects accumulators. If more than one data sample is to have the same delay-based effect, each of these data samples can be summed together into one of eight effects accumulators. The synthesizer module then writes the data stored in each of the effects accumulators to wavetable data. The difference between the write and read address of this data provides a delay for echo and reverb effects. The write address will always increment by one. The read address will increment by an average of one, but can have LFO variations added by the LFO generator. These LFO variations create chorus and flange effects.

After this effects processing, the data sample is multiplied by left and right offset volume components which determine how much of the effect is heard and the stereo position of the output. After the synthesizer module writes the data from the effects accumulators to wavetable data and then later reads the data, the data may then be fed back to the effects accumulators. When data is fed back to the effects accumulator, its volume may be attenuated only by the effects volume component. The effects volume component can be used to provide decay in the data's volume to create an echo effect.

The synthesizer module includes an LFO generator which assigns two triangular-wave LFOs to each of the 32 possible voices. One LFO is dedicated to vibrato (frequency modulation) effects and the other to tremolo (amplitude modulation) effects. It is possible to ramp the depth of each LFO into and out of a programmable maximum. The parameters for each LFO are stored in local memory.

When in its enhanced mode, the synthesizer module can generate any number of voices up to 32 at a constant 44.1 KHz sample rate. When not in the enhanced mode, a 44.1 KHz sample rate will only be maintained for up to fourteen active voices. If a fifteenth voice is added, approximately 1.6 microseconds will be added to the sample period resulting in a sample rate of 41.2 KHz. This same process continues as each voice is added, up to a maximum of 32 voices at a sample rate of 19.4 KHz. This latter mode enables the synthesizer module to be backwards compatible with Ultrasound's wavetable synthesizer.

The synthesizer module contains various registers which are programmed with parameters governing voice generation and delay-based effects processing. The synthesizer module has one direct register and several indirect registers. The direct register is used to select voice-specific indirect registers where data is to be read or written. There are two types of indirect registers: global and voice-specific. The global registers affect the operation of all voices, while the voice-specific registers affect the operation of only one voice. The indirect register data is contained in a register array.

The wavetable synthesizer module of the present invention can be formed on a monolithic PC audio integrated circuit also containing a system control module, a CODEC module, a local memory control module, and a MIDI and game port module. This PC audio integrated circuit can be used in a PC-based sound card.

Alternatively, the wavetable synthesizer module can be formed on a monolithic integrated circuit together with just a system control module, synthesizer DAC, and a local memory control module. In another alternative embodiment, the wavetable synthesizer can be formed on a monolithic circuit together with just a system control module and a local memory control module. The resulting alternative monolithic integrated circuits can be used in various applications. For example, either of these integrated circuits can be incorporated on an add-in card with other integrated circuits which support its operation, such as a commercially available CODEC, memory and/or DAC, to form a sound card used in a personal computer.

BRIEF DESCRIPTION OF THE DRAWINGS

A better understanding of the present invention can be obtained when the following detailed description of the preferred embodiment is considered in conjunction with the following drawings, in which:

FIGS. 3*a* and 3*b*, generally referred to herein as FIG. 3, illustrate a table summarizing pin assignments for the circuit C;

FIGS. 4*a* and 4*b*, generally referred to herein as FIG. 4, illustrate an alternative layout diagram for the circuit C; noise and a primary clock signal employed by the circuit C;

FIG. 5 is a table summarizing pin assignments for the circuit C grouped by module;

FIGS. 7*a* and 7*b*, generally referred to herein as FIG. 7, illustrate table summarizing pin assignments and functions that relate to local memory control;

FIGS. 8*a*, 8*b*, 8*c*, 9A, 9*b*, 9*c*, 10*a*, 10*b*, and 10*c*, generally referred to herein as FIGS. 8, 9 and 10, comprise a table of register mnemonics with indexes and module assignments where appropriate;

FIG. 22 is a table summarizing resources required for programming the Plug-n-Play serial EEPROM;

FIGS. 23*a* and 23*b*, generally referred to herein as FIG. 23, illustrate a table providing data on all interrupt-causing events in the circuit C;

FIGS. 24*b*–1 and 24*b*–2, generally referred to herein as FIG. 24*b*, illustrate a schematic illustration of logic and counter circuits associated with various low power modes of the circuit C;

FIGS. 24*d*–1, 24*d*–2, 24*d*–3 and 24*d*–4, generally referred to herein as FIG. 24*d*, illustrate is a flow chart illustrating the various register-controlled low power modes of the circuit C;

FIGS. 26*a* and 26*b*, generally reffered to herein as FIG. 28, illustrate is a table describing events which occur in response to various power conservation modes enabled via the status of bits in register PPWRI contained within the circuit C;

FIGS. 28*a*, 28*b*, and 28*c* generally referred to herein as FIG. 28, illustrate is a table summarizing pins associated with the system bus interface included in the circuit C;

FIG. 38 is a table describing data transfer formats for 8 and 16-bit sample sizes under DMA control;

FIGS. 41A and 41B 1, generally referred to herein as FIG. 41, illustrate is a schematic block illustration of a single bit implementation for the game input/output port of the circuit C;

FIG. 41*b* is a diagram illustrating input signal detection via the game port of the circuit C;

FIG. 45*b* is a table of gain and attenuation values.

FIGS. 108*a*–1, 108*a*–2, 108*b*–2, and 108*b*–3, generally referred to herein as FIGS. 108*a* and 108*b* are timing diagrams of the operations performed by the address controller of FIG. 107;

FIGS. 110*a* and 110*b*, generally referred to herein as FIG. 110, illustrate is a timing diagram of the operations performed by the volume controller of FIG. 109;

FIG. 112 is a timing chart of the operations of the register array in FIG. 111;

FIG. 113 is an architectural drawing of the overall volume control circuitry of the synthesizer module of the preset invention;

Figure 1:
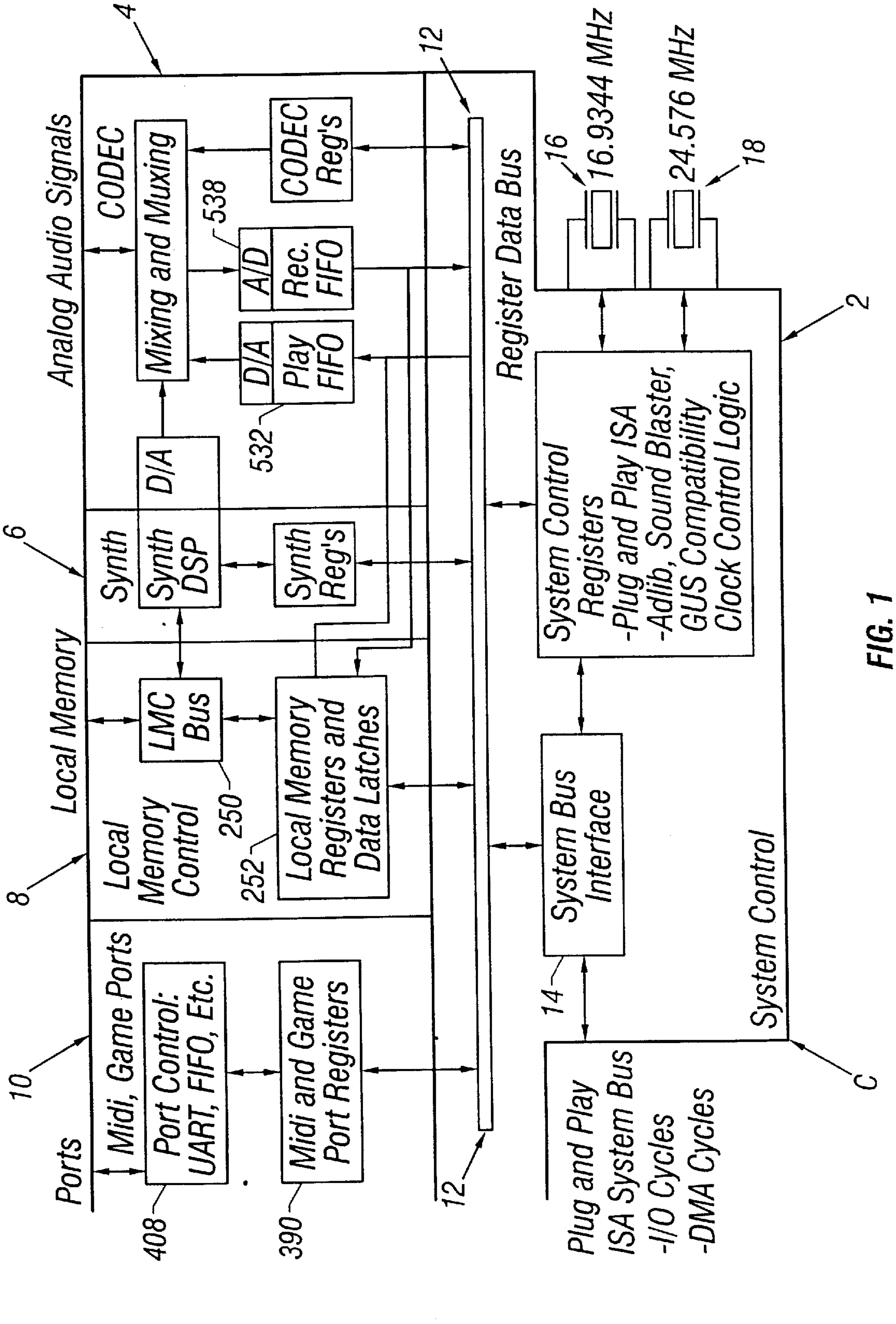
FIG. 1 is a schematic architectural overview of the basic modules of the circuit C.
Figure 2:
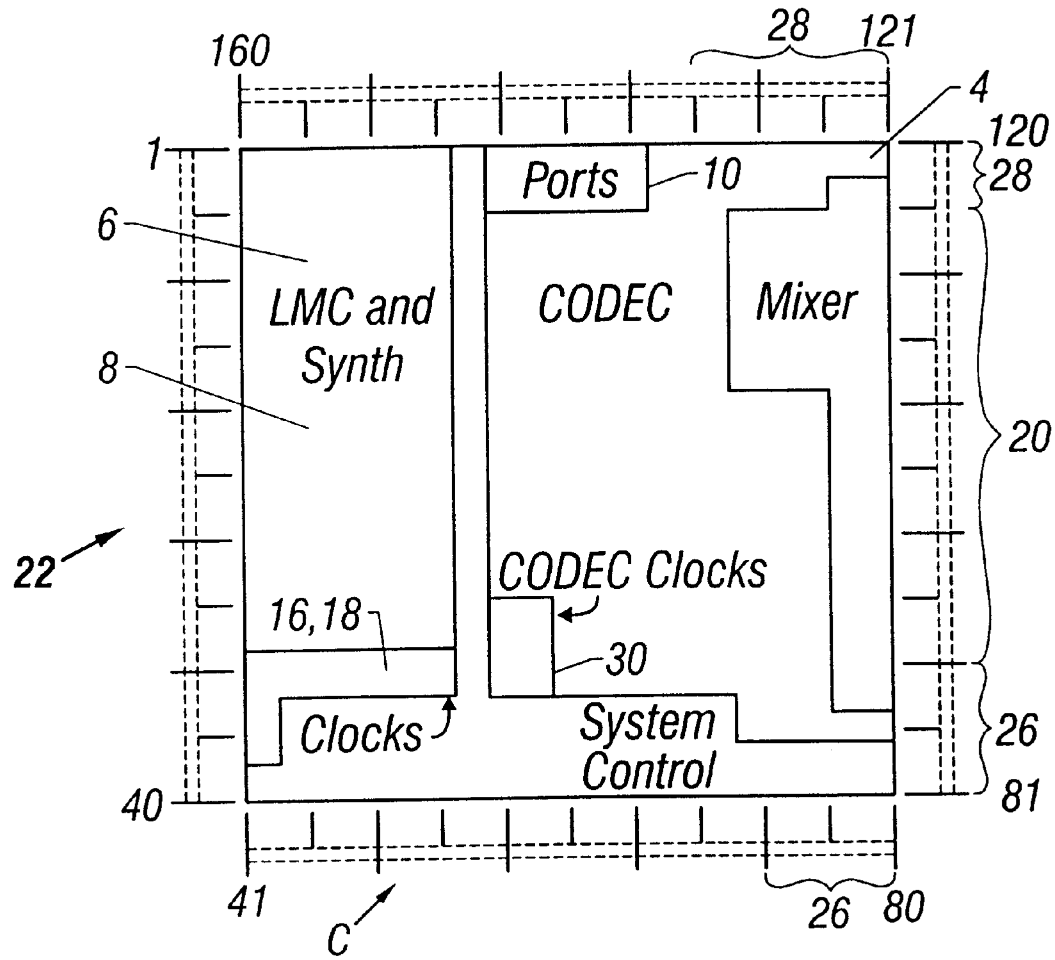
FIG. 2 is a schematic illustration of the physical layout of circuit C.
Figure 113:
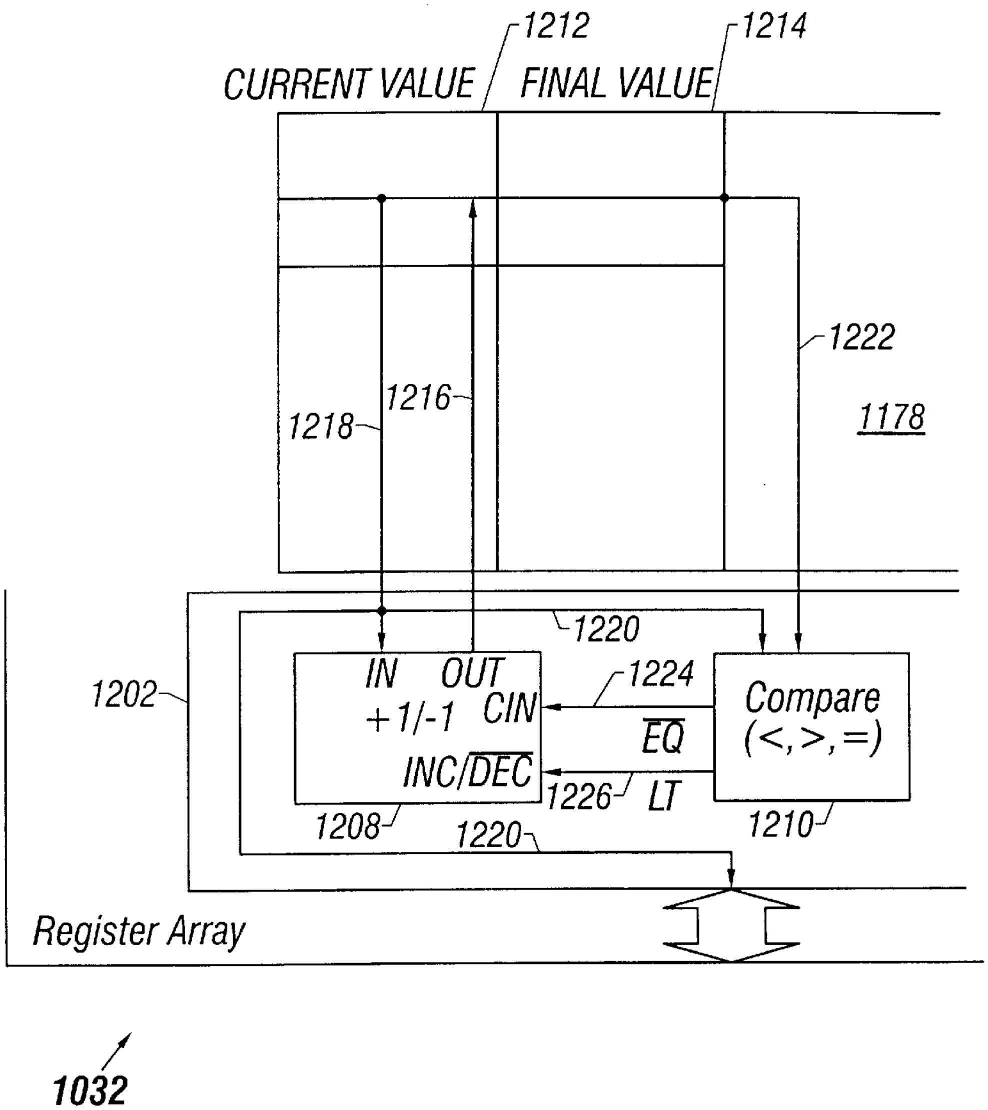
Figures 1, 114A:
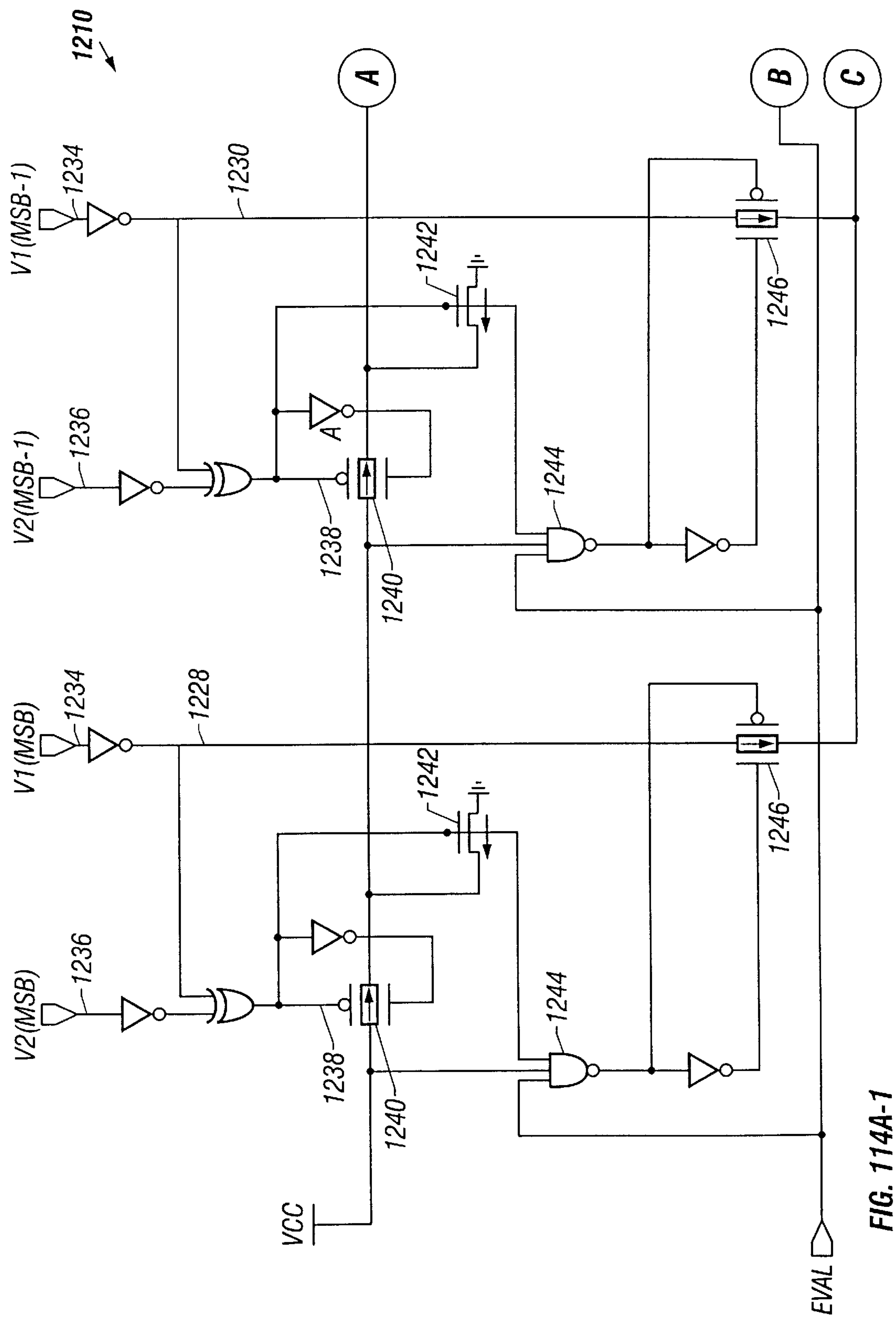
Figure 114B:
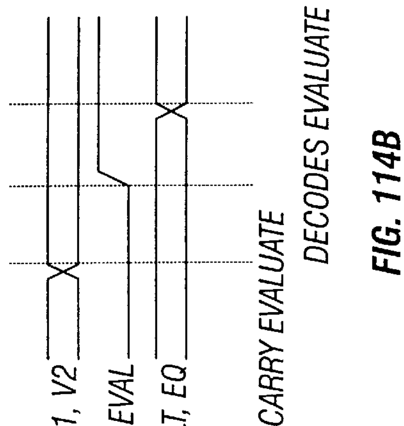
Figures 2, 114A:
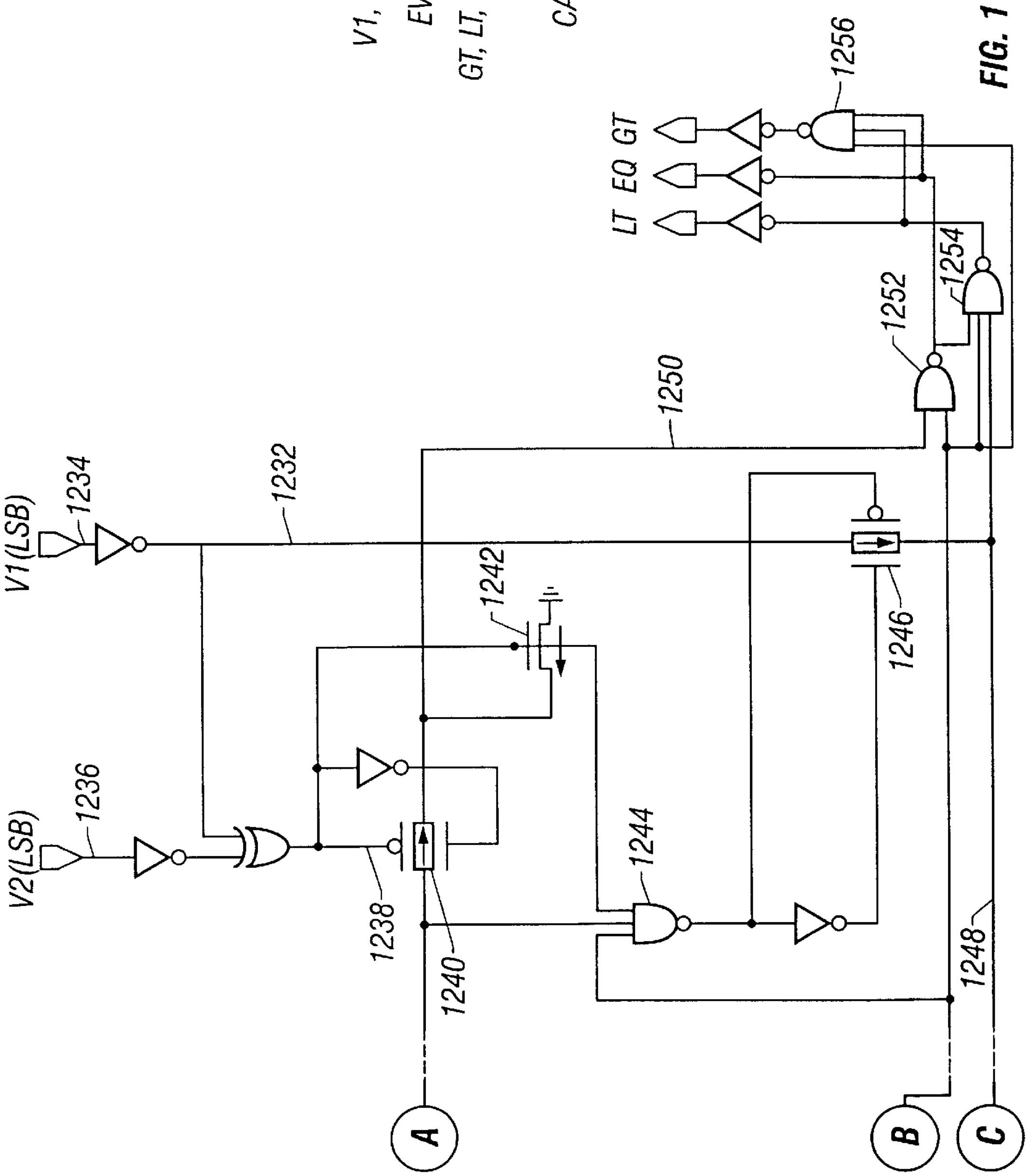

FIGS. 114*a*–1 and 114*a*–2, generally referred to herein as FIG. 114*a*, illustrate is a logic diagram of a comparator illustrated in FIG. 113;

FIG. 114*b* is a timing chart of the operations of the comparator in FIG. 114*a;*

Figure 115:
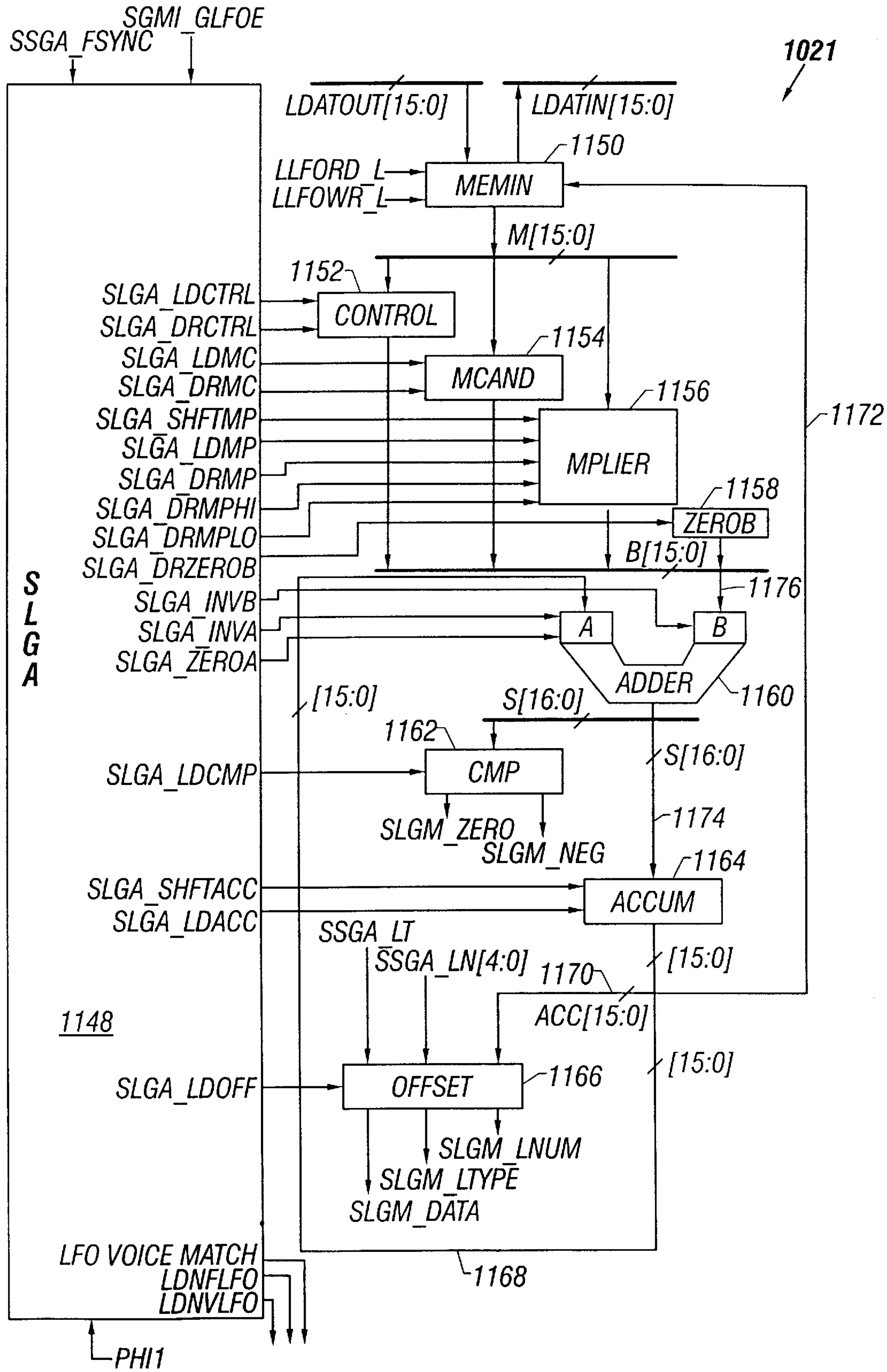
Figure 116A:
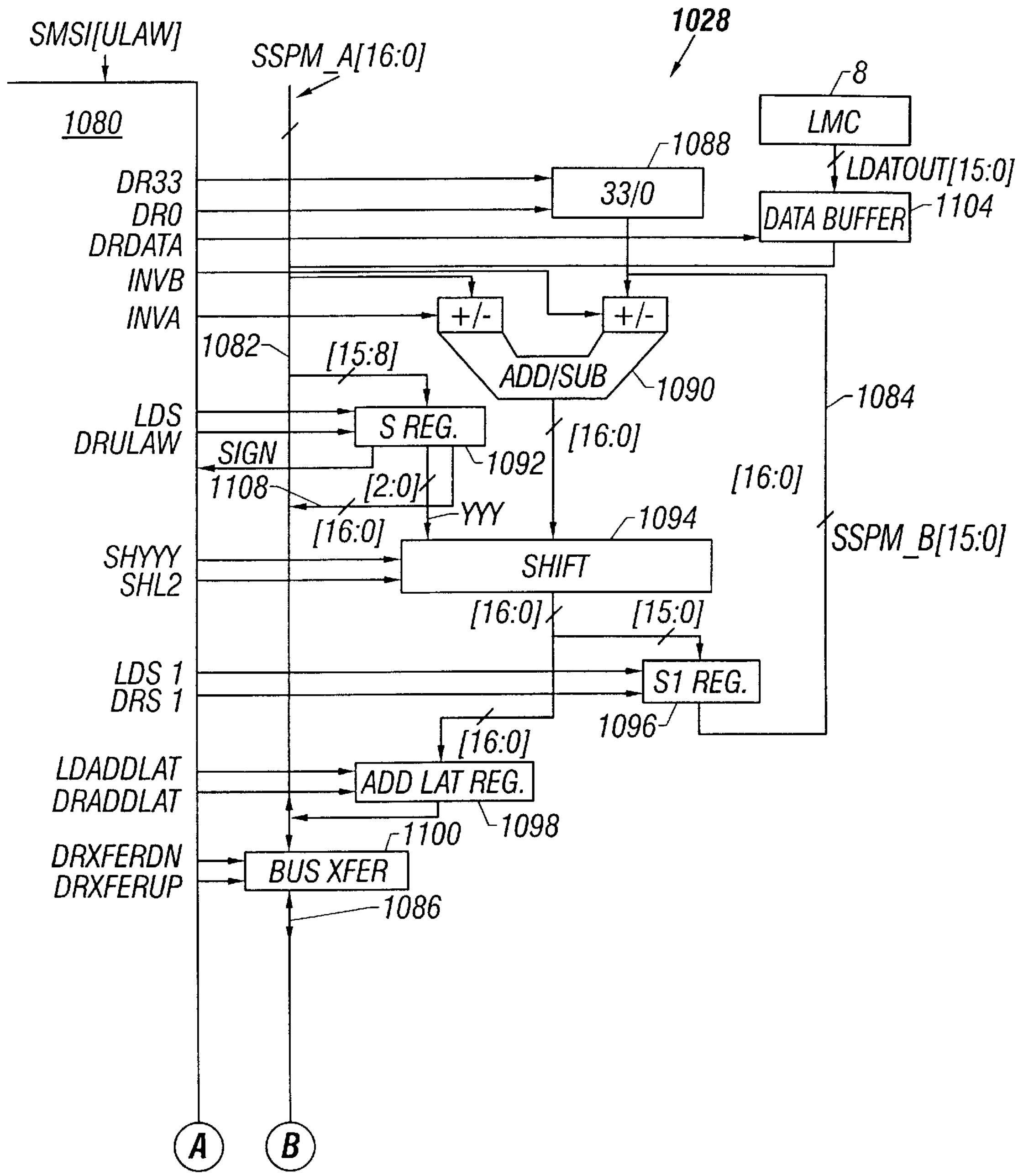
Figure 116B:
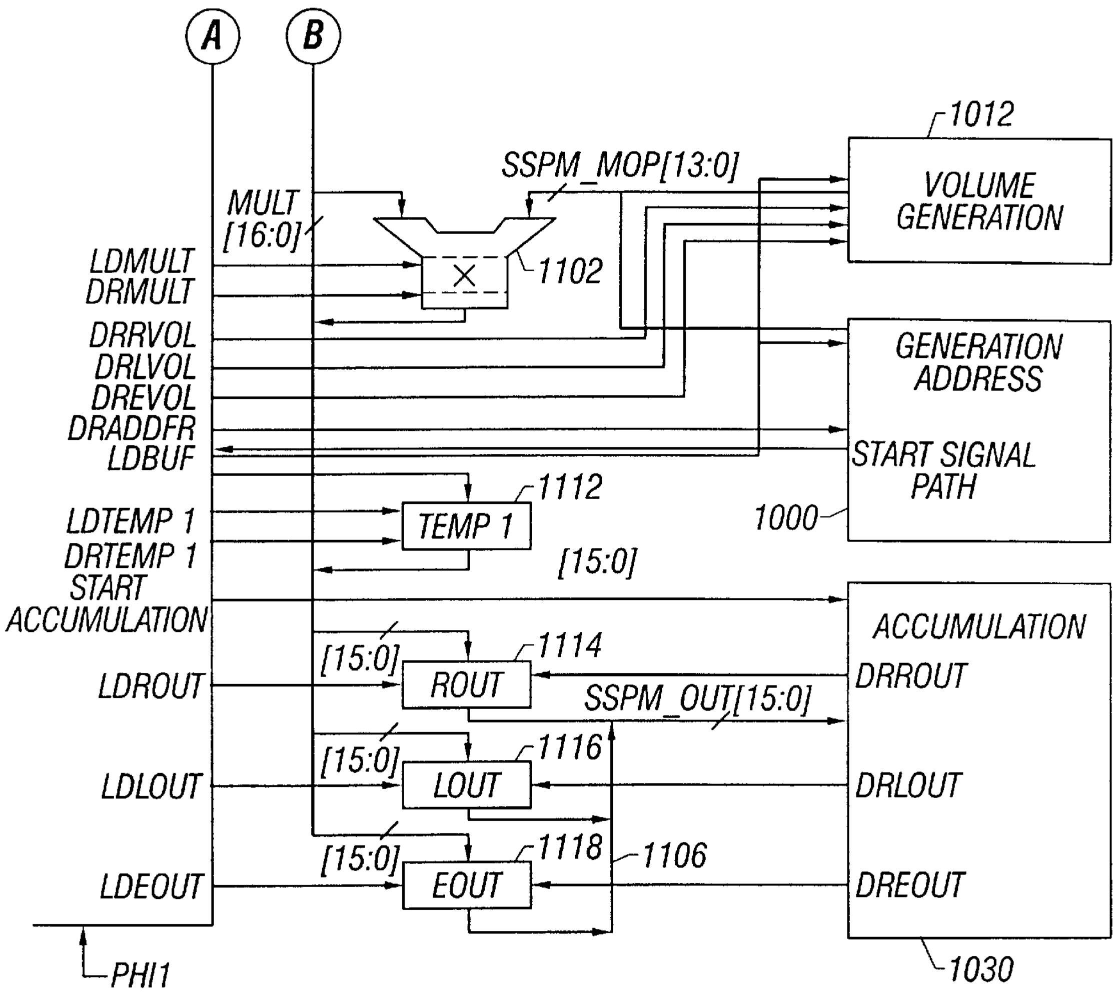
Figure 118:
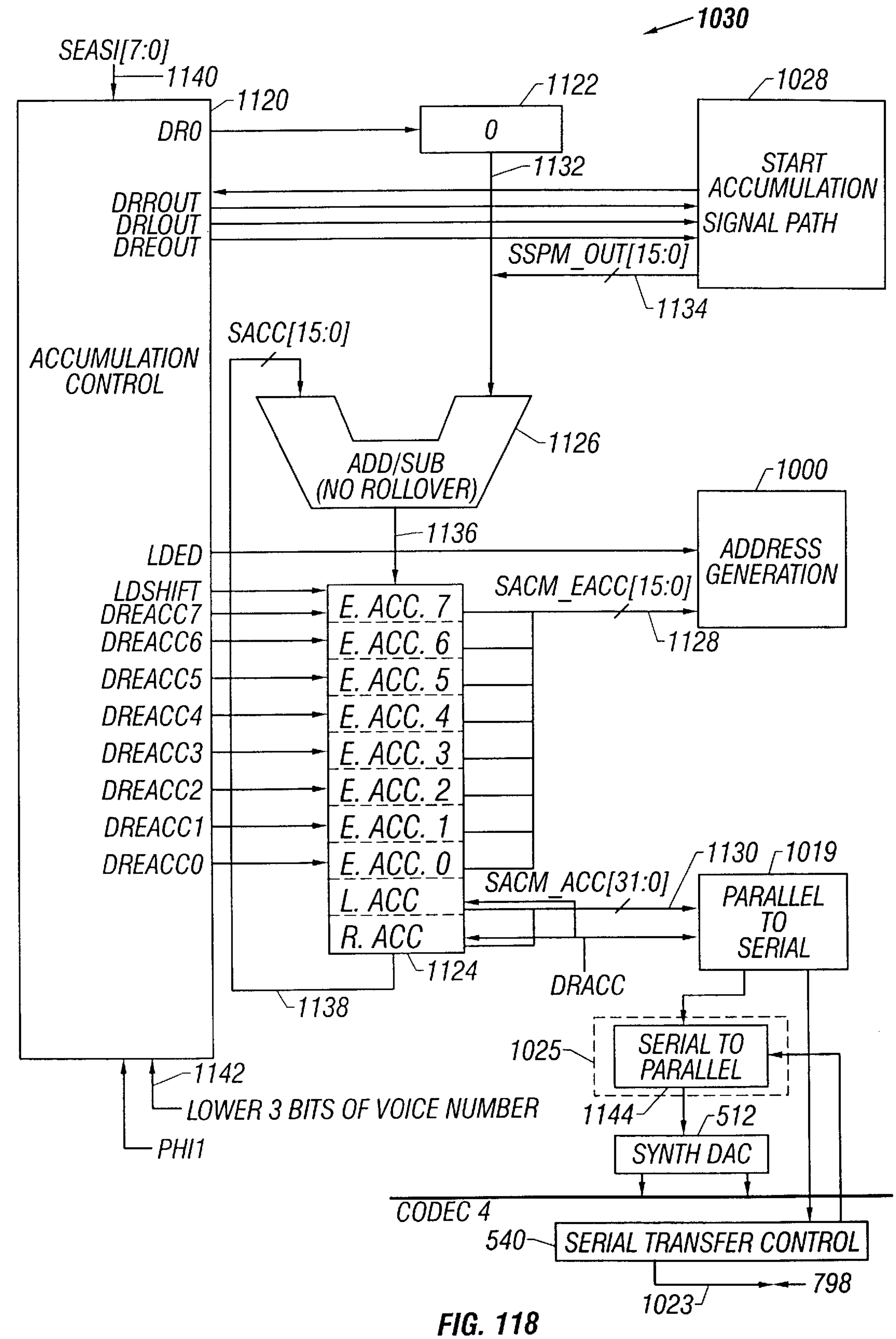
Figure 121:
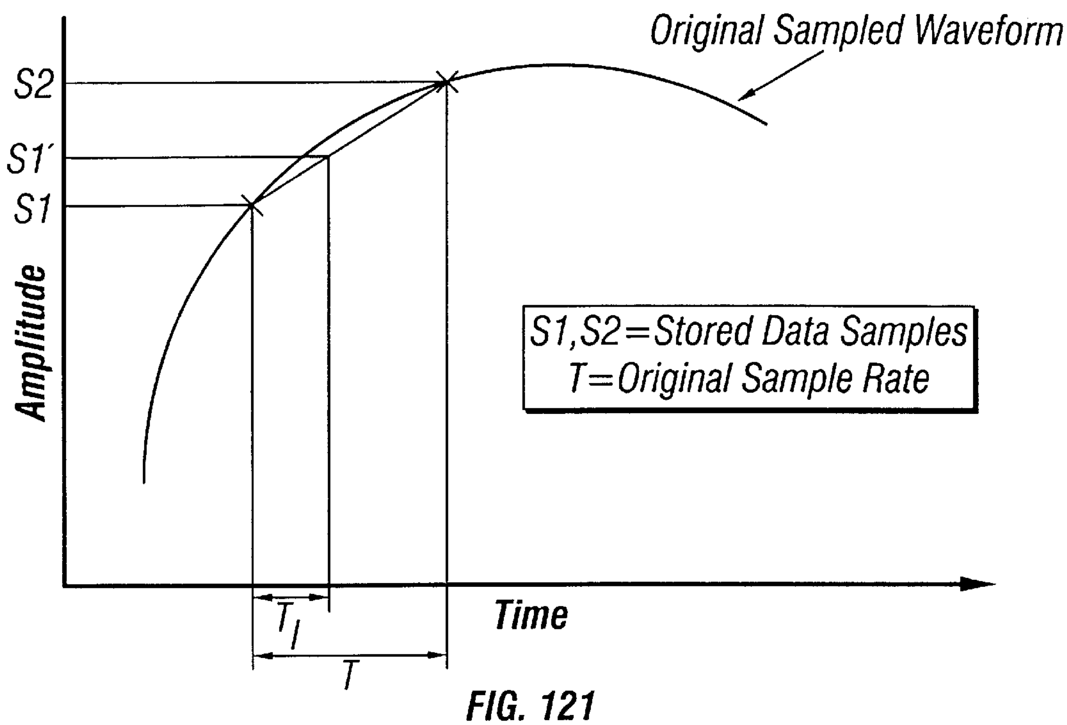
Figure 122:
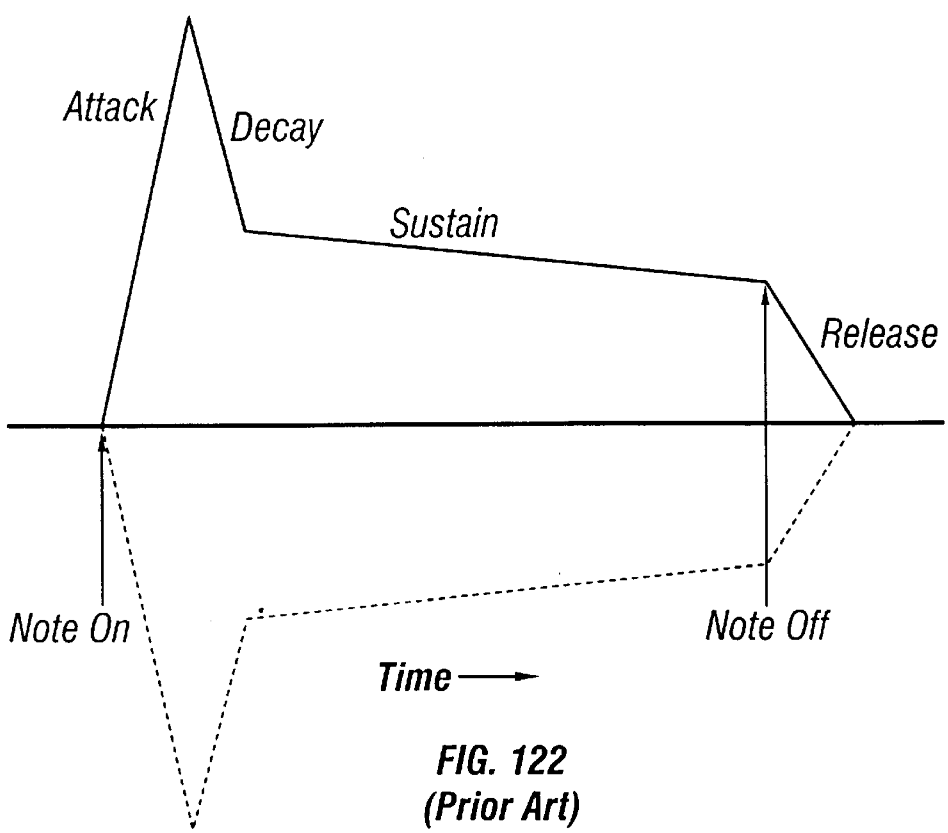

FIG. 115 is an architectural drawing of the LFO generator of the synthesizer module of the present invention;

FIGS. 116*a* and 116B, generally referred to herein as FIG. 117, illustrate is an architectural diagram of the signal path of the synthesizer module of the present invention;

FIG. 117 is a timing diagram of the operations performed by the signal path of FIG. 116;

FIG. 118 is an architectural diagram of accumulation logic of the synthesizer module of the present invention;

FIG. 119 is a timing diagram of the operations performed by the accumulation logic of FIG. 118;

FIGS. 120*a*, 120*b*, 120*c*, and 120*d*, generally referred to herein as FIG. 120, illustrate is a timing diagram of the overall operations performed by the synthesizer module of the present invention; and FIG. 121 is an amplitude versus time graph illustrating data interpolation; and FIG. 122 is an amplitude versus time graph illustrating the envelope segments of a musical note.

DETAILED DESCRIPTION OF THE PREFERRED EMBODIMENTS

The following description sets forth the preferred embodiment of a monolithic PC audio circuit, including system architecture, packaging, power management, system control, timing and memory interfacing, as well as significant implementation details. Various options for circuits suitable for use with the present invention are disclosed in the following United States patent applications, the contents of which each are incorporated herein by reference. An alternative technique for reducing power consumed by clock driven circuits is described in U.S. patent application Ser. No. 07/918,622, entitled "Clock Generation Capable of Shut Down Mode and Clock Generation Method," assigned to the common assignee of the present invention. Throughout the specification where it is required to affect the status of single bits within a register or field, the preferred method and apparatus for performing such single-bit manipulations are set forth in U.S. patent application Ser. No. 08/171,313, filed Dec. 21, 1993, and entitled "Method and Apparatus for Modifying the Contents of a Register Via a Command Bit," assigned to the common assignee of the present invention.

Throughout this specification where reference is made to various timers, gating and other control logic, unless otherwise specified, the precise logic circuit implementation details may not be provided. In such instances the implementation details are considered trivial given the state of the art in computer-assisted logic design and layout techniques available for VLSI logic circuit design.

Under the current state of the art, such details are implemented from selectable, programmable logic arrays or blocks of standardized logic circuits made available for such purposes on VLSI circuits. Timers, for example, can be readily implemented by providing a clock signal derived from external oscillator signals to an appropriate logic circuit. An 80 microsecond clock signal can be provided by dividing the 16.9 MHz oscillator signal by 1344 for example. The generation of control signals which respond to the status of various bits of data held in registers throughout the circuit C is a simple matter of providing control inputs to blocks or arrays of gate circuits to satisfy the required input/output or truth table requirements. Consequently, these details, where not considered significant to the claimed invention, need not and have not been provided since such matters are clearly within the level or ordinary skill in the art.

I. Architectural Overview

Referring now to FIG. 1, an architectural overview of the basic modules of the circuit C is provided. The circuit C includes five basic modules: a system control module 2; a coder-decoder (CODEC) module 4; a synthesizer module 6; a local memory control module 8; and MIDI and game port module 10. These modules are formed on a monolithic integrated circuit. A register data bus 12 provides communication of data between modules and between circuit C and a system bus interface 14. Timing and control for circuit C is provided by logic circuits within system control module 2 operating in response to clock signals provided by one or both oscillators 16 and 18 depending upon the particular system requirement. Control of circuit C is generally determined by logic circuits included within module 2 which are in turn controlled by the state of various registers and ports provided throughout the circuit C.

FIG. 1 is a functional block diagram and does not correspond directly to a physical layout for the integrated circuit embodiment. Various circuits, interconnects, registers etc. which provide or facilitate the functions specified in FIG. 1 may be formed in several locations spread throughout the integrated circuit as needed or as dictated by manufacturing processes, convenience or other reasons known to those of ordinary skill in the art. The circuit of the present invention may be fully integrated using conventional integration processes such as are well known in the industry. The circuit of the present invention is packaged in a 160 pin plastic quad flat pack (PQFP), as will be described in more detail below.

A. Physical Layout Features and Noise Reduction

It is a feature of the present invention that the physical layout of the various modules and the pin-out arrangement have been designed to isolate analog circuits and inputs/outputs from the noisier digital circuitry and pins. Referring now to FIG. 2, an example of the desired physical layout relationship among various portions or modules of the circuit C is schematically illustrated. To minimize digitally induced noise in analog circuits, the most noise sensitive elements of circuit C, e.g., those associated with the analog aspects of the CODEC, specifically the mixer block, are located near the circuit edge opposite the largely digital local memory control and synthesizer modules.

To further isolate digitally induced noise in the analog circuitry, the pin-out arrangement of the package isolates analog mixer input and output pins in a group 20 as far removed as possible from the noisiest digital output pins and clock inputs, which are located on the opposite side 22. Furthermore, the most sensitive pin group 20 is flanked by less noisy inputs in regions 26 and 28. Representative pin assignments are given in FIG. 3, where pin names correspond to industry standard designations, such as the ISA Plug-n-Play specification, version 1.0, May 28, 1993, available from Microsoft Corporation and the industry standard ISA bus specification as set forth in AT Bus Design by Edward Solari, published by Annabooks, San Diego, Calif.; ISBM 0-929392-08-6, the contents of which are incorporated by reference herein. An alternative pin assignment is provided in FIG. 3*a*, which likewise maintains the desired physical relationship among the various modules.

Since it is a feature of the present invention to provide compatibility with existing standard or popular hardware and software such as the ISA Plug-n-Play specification, AdLib, Sound Blaster and Graves Forte Ultrasound applications, references throughout this application to certain signal and register mnemonics such as ISA, PNP, AdLib, GUS, generally refer to compatible configurations for the circuit of the present invention. It also should be noted that a # sign following mnemonics for signals, or bit status flags and the like, indicates such are active low.

Figure 24A:
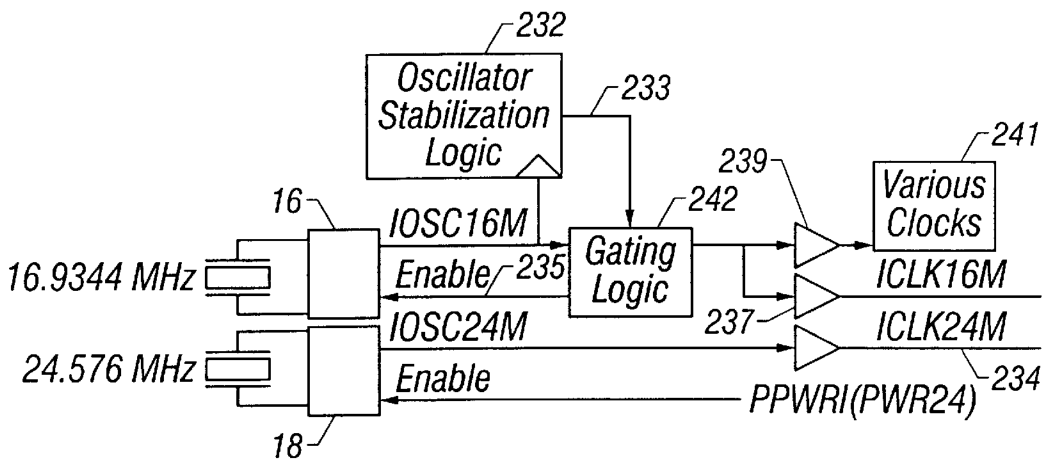
FIG. 24*a* is a schematic illustration of external oscillators and stabilizing logic associated therewith utilized by the circuit C.
Figures 1, 24B:
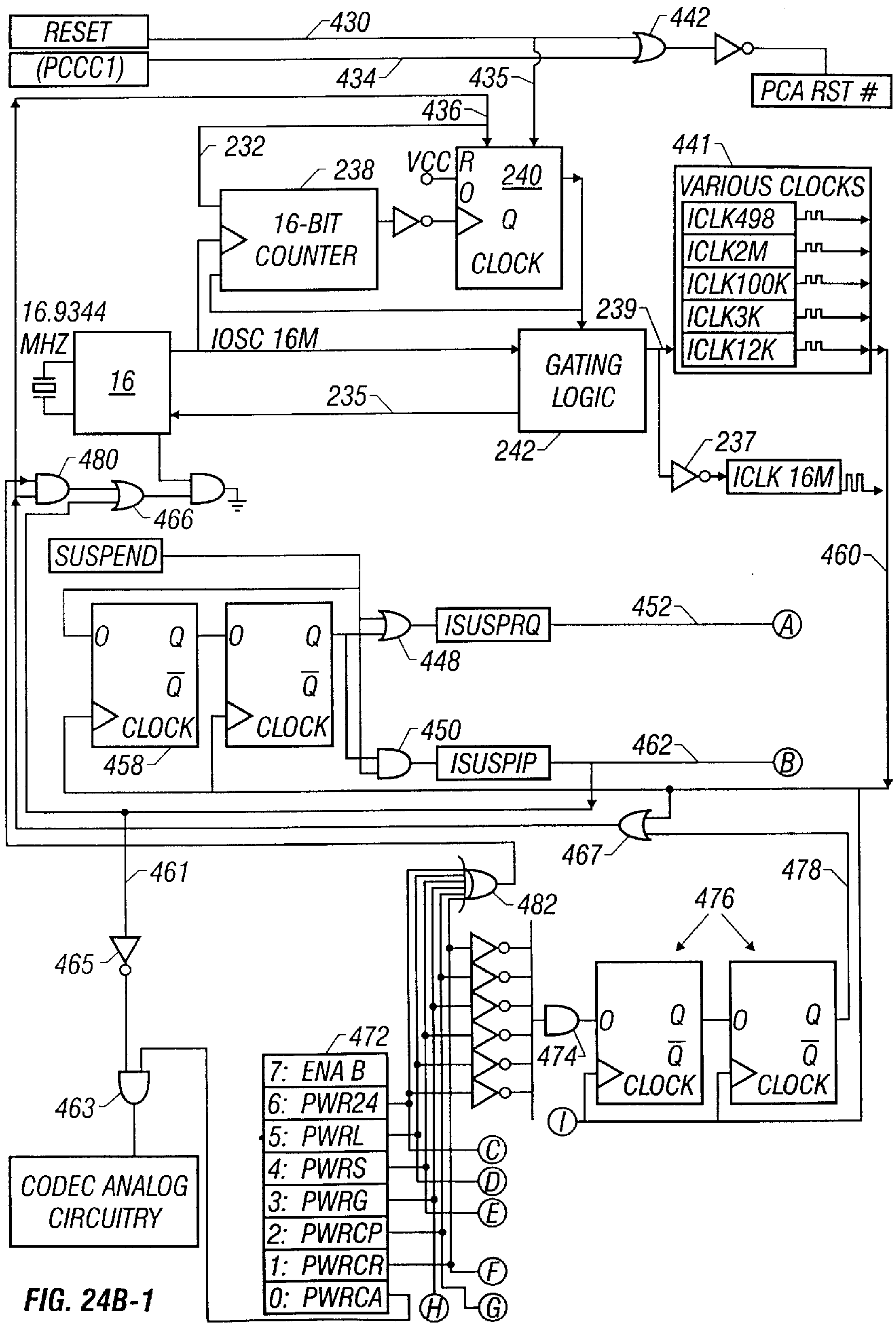
Figures 2, 24B:
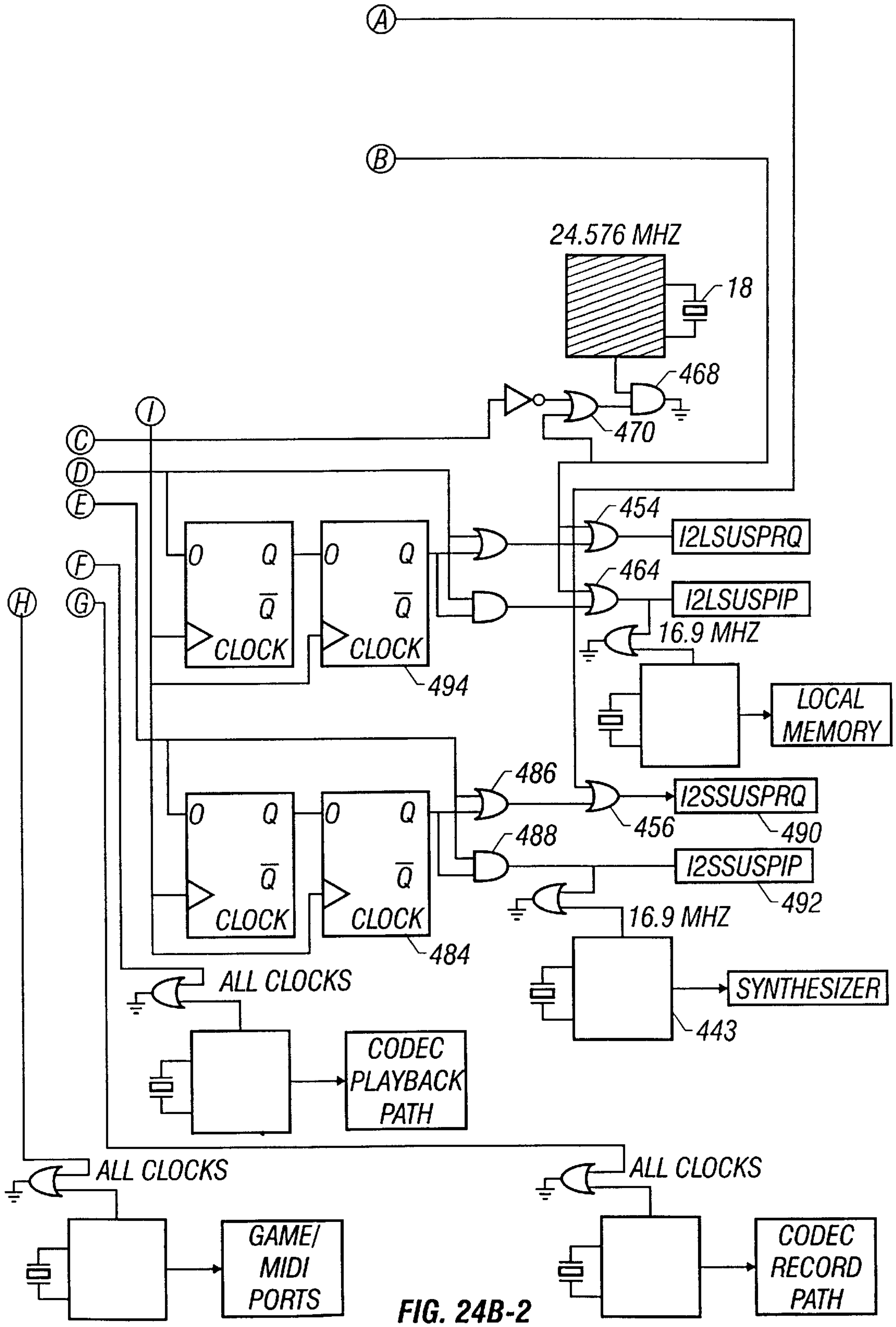
Figures 1, 24C:
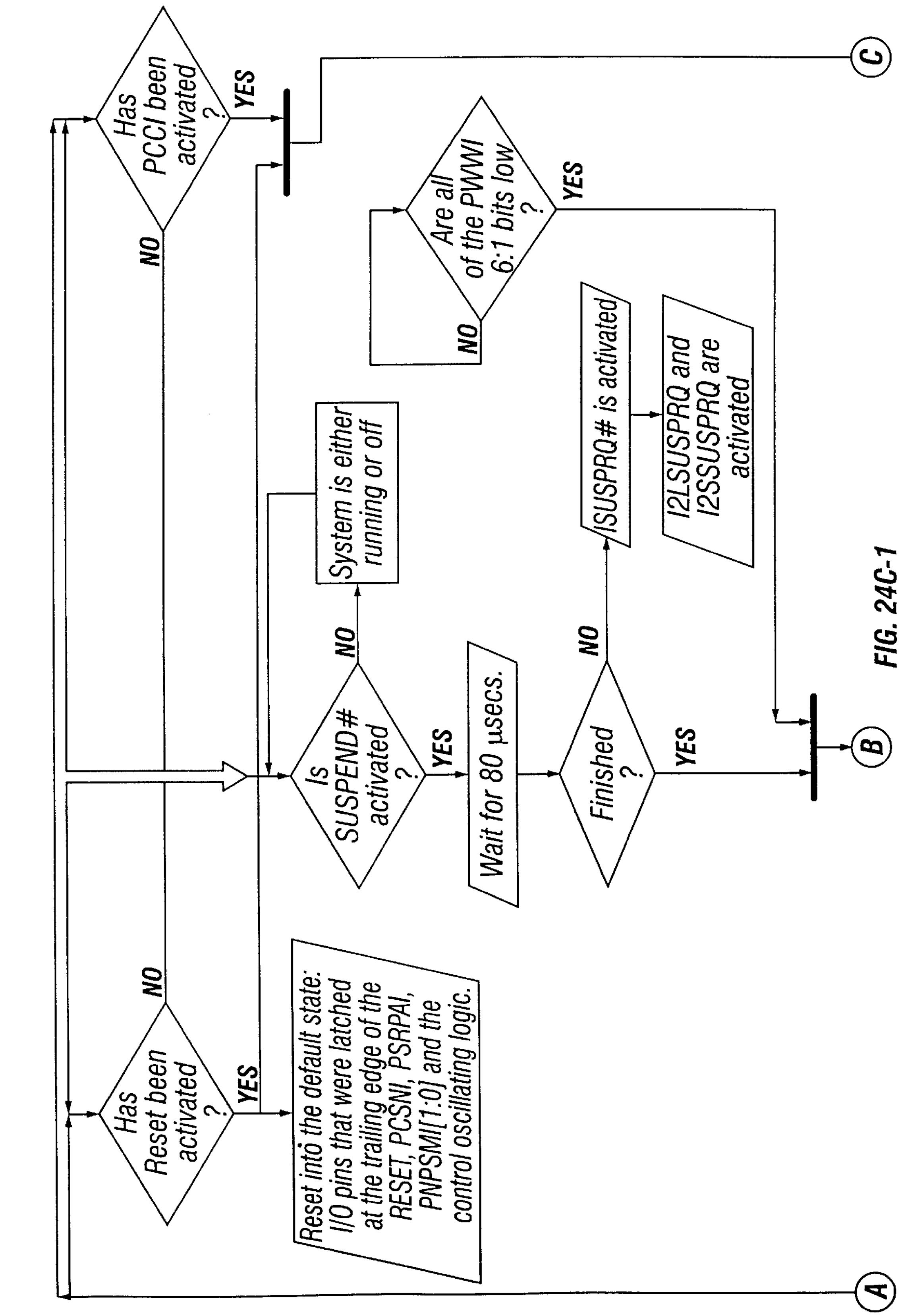
FIG. 24*c* is a flow chart illustrating the response of circuit C to suspend mode operation.
Figures 2, 24C:
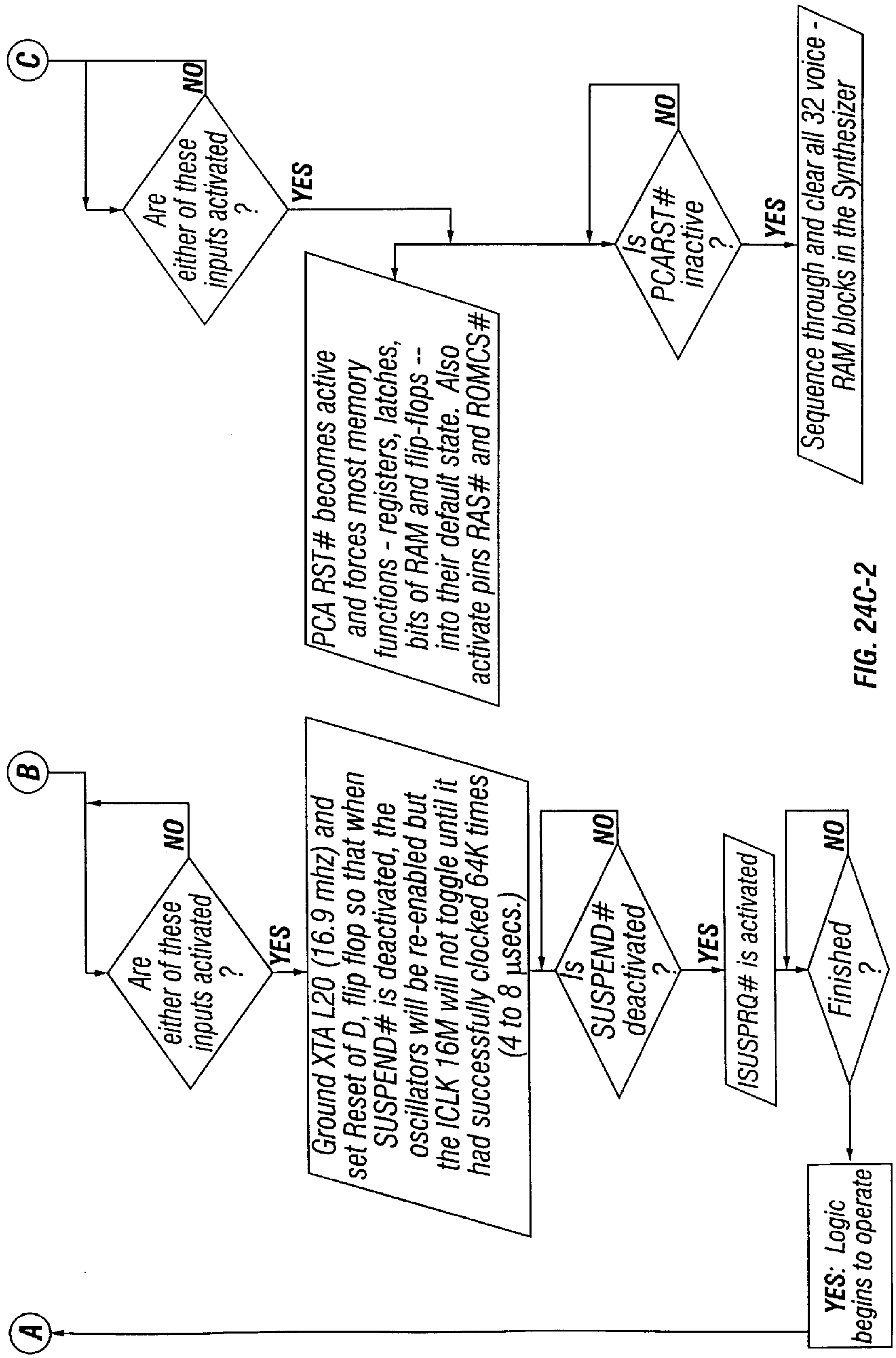
Figures 1, 24D:
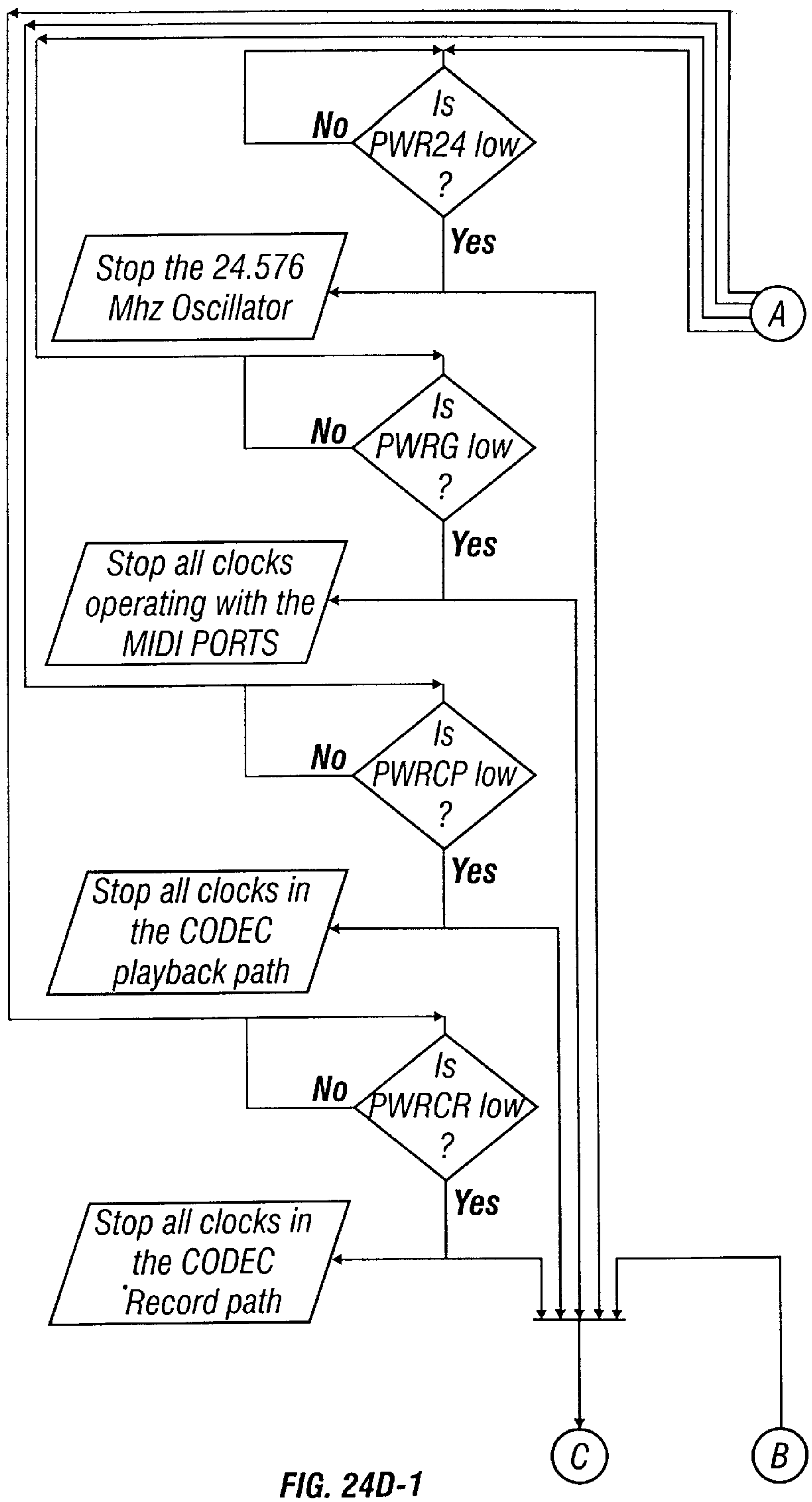
Figures 2, 24D:
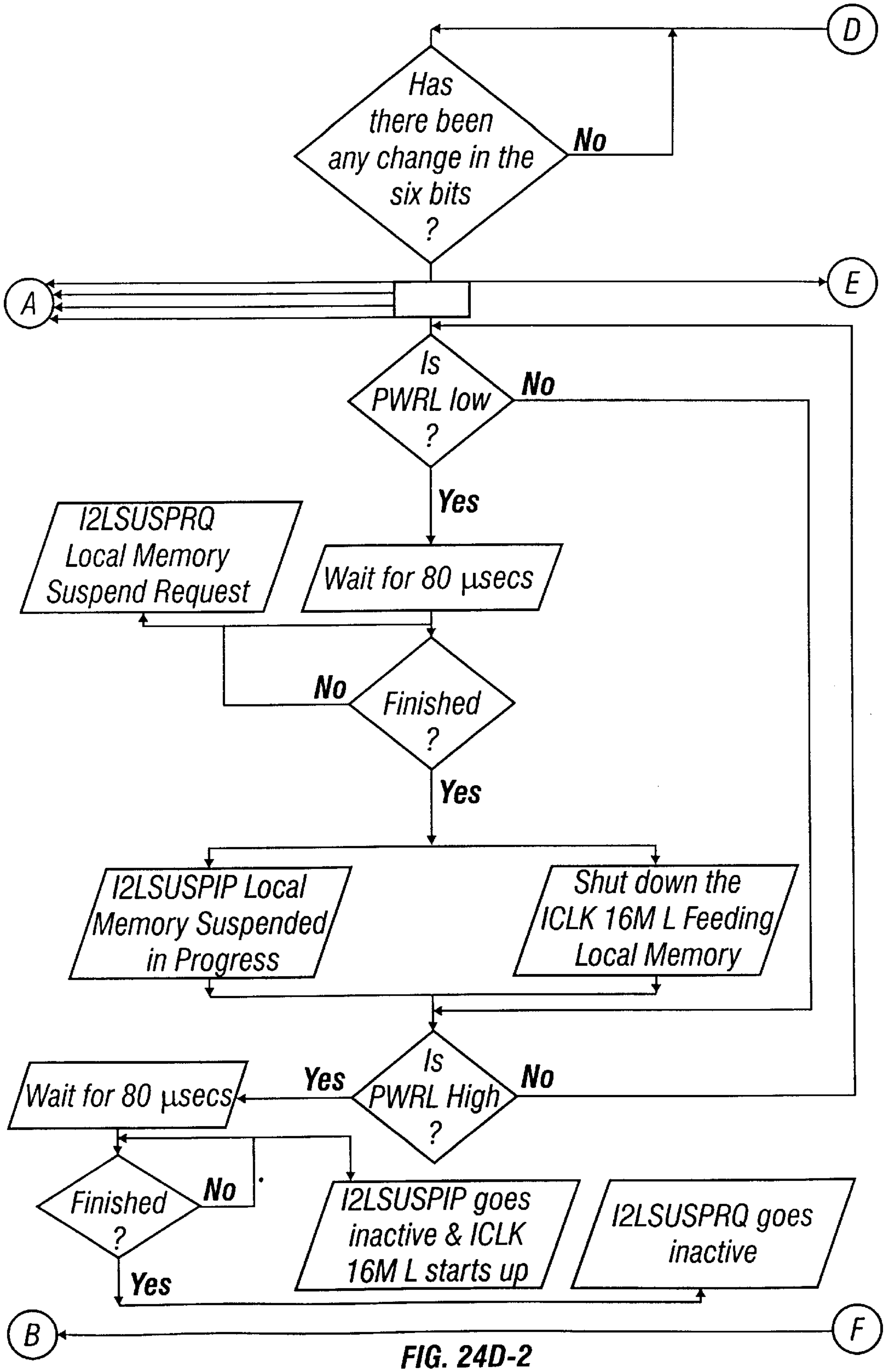
Figures 3, 24D:
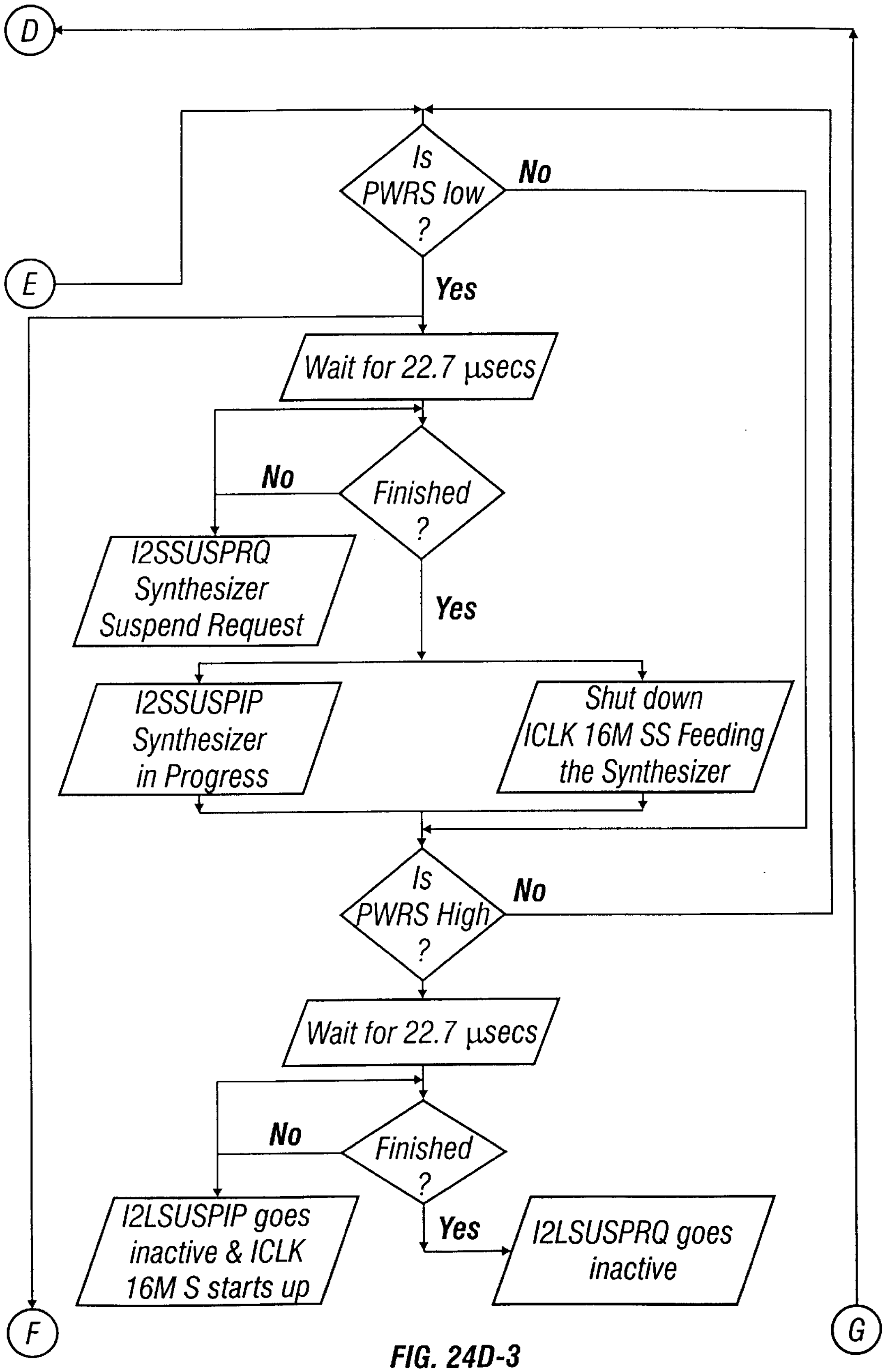
Figures 4, 24D:
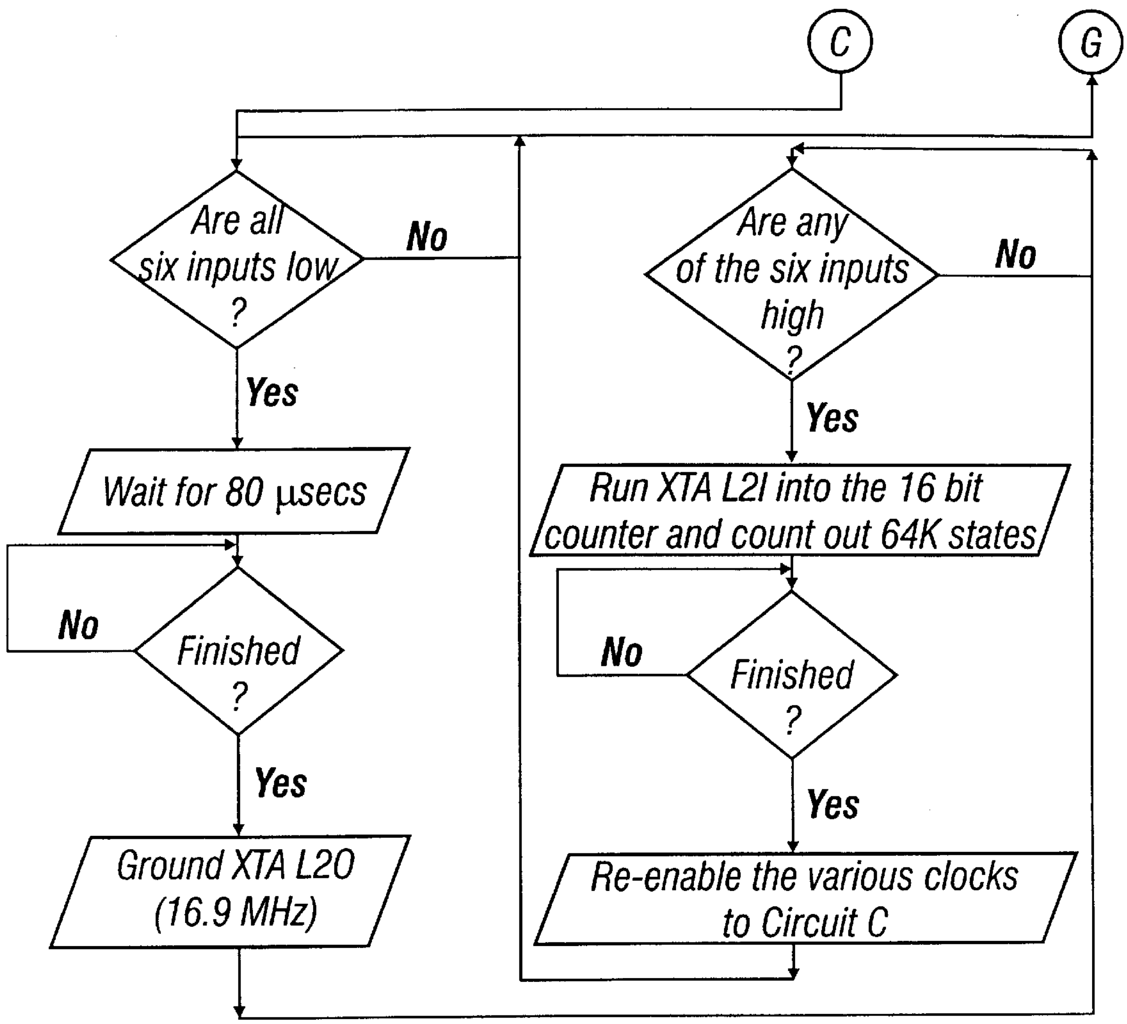

Referring now to FIG. 3, analog pins generally include those in the range of 96 through 113, including a plurality of analog power (AVCC) and ground (AVSS) pins. It is a noise reduction feature of the present invention to provide individual VSS and VCC pins for the majority of individual analog pins. Pins 82–95 and 114 are less noisy inputs. Other layout features include placing the external oscillator pins XTAL1[I,O] and XTAL2[I,O] near the clock block of the system control module. This system control module clock block should also be placed near the CODEC clock block 30. It is also important that all 16.9 MHz clocks used throughout the circuit C are implemented to minimize the skew between them. Minimizing internal clock skew is important for timing purposes as well as noise reduction in the present circuit.

It is a feature of the present invention to minimize noise in the analog signals ensuring that analog sampling and digital circuit activity be clocked independently. In the preferred embodiment, separate analog and digital clock signals with different frequencies are provided from a common oscillator. The analog clock signal is not derived from the digital or vice versa, so there is no defined phase relationship between the two. Furthermore, an analog clock skewing circuit is provided to reduce the possibility that digital and analog clock driven events overlap.

Referring now to FIG. 5, further explanation of the pin assignments according to a general functional group is given. Those pins associated with System Control Module 2 are listed under that heading with a mnemonic and number of pins provided. Likewise, those pins associated with the CODEC, local memory and ports and miscellaneous function appear under those headings respectively. Note here, as well as elsewhere in this specification, reference to "CD" pins or functions, such as CD_DRQ, should be considered equivalent to "EX," such as EX_DRQ which generically designates a pin of function associated with an external device.

B. Typical System Implementation

Figure 6A:
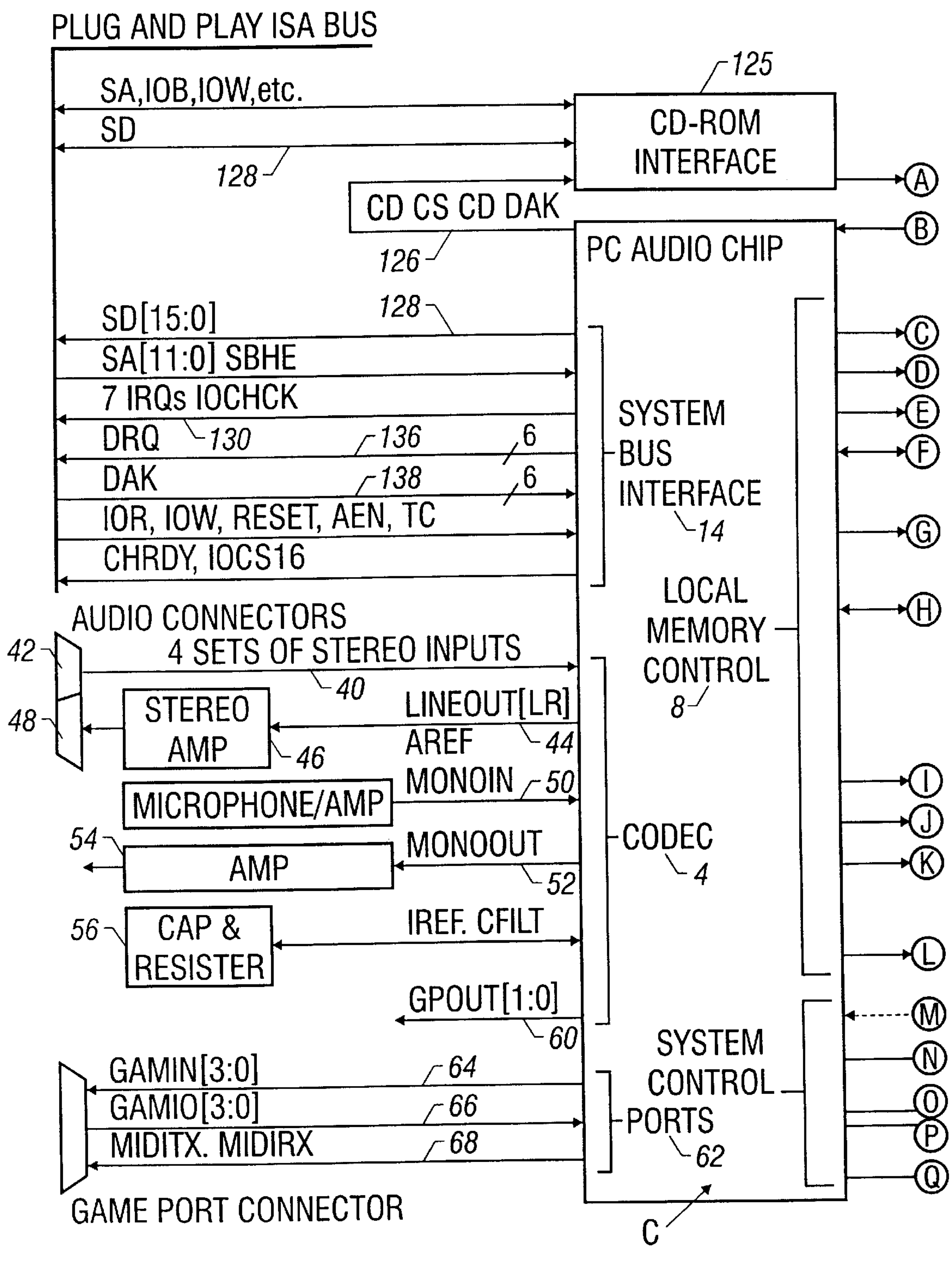
FIGS. 6*a* and 6*b*, generally referred to herein as FIG. 6, illustrate a schematic illustration of a typical full-featured implementation of a PC audio circuit C with associated circuits, buses and interconnections.
Figure 6B:
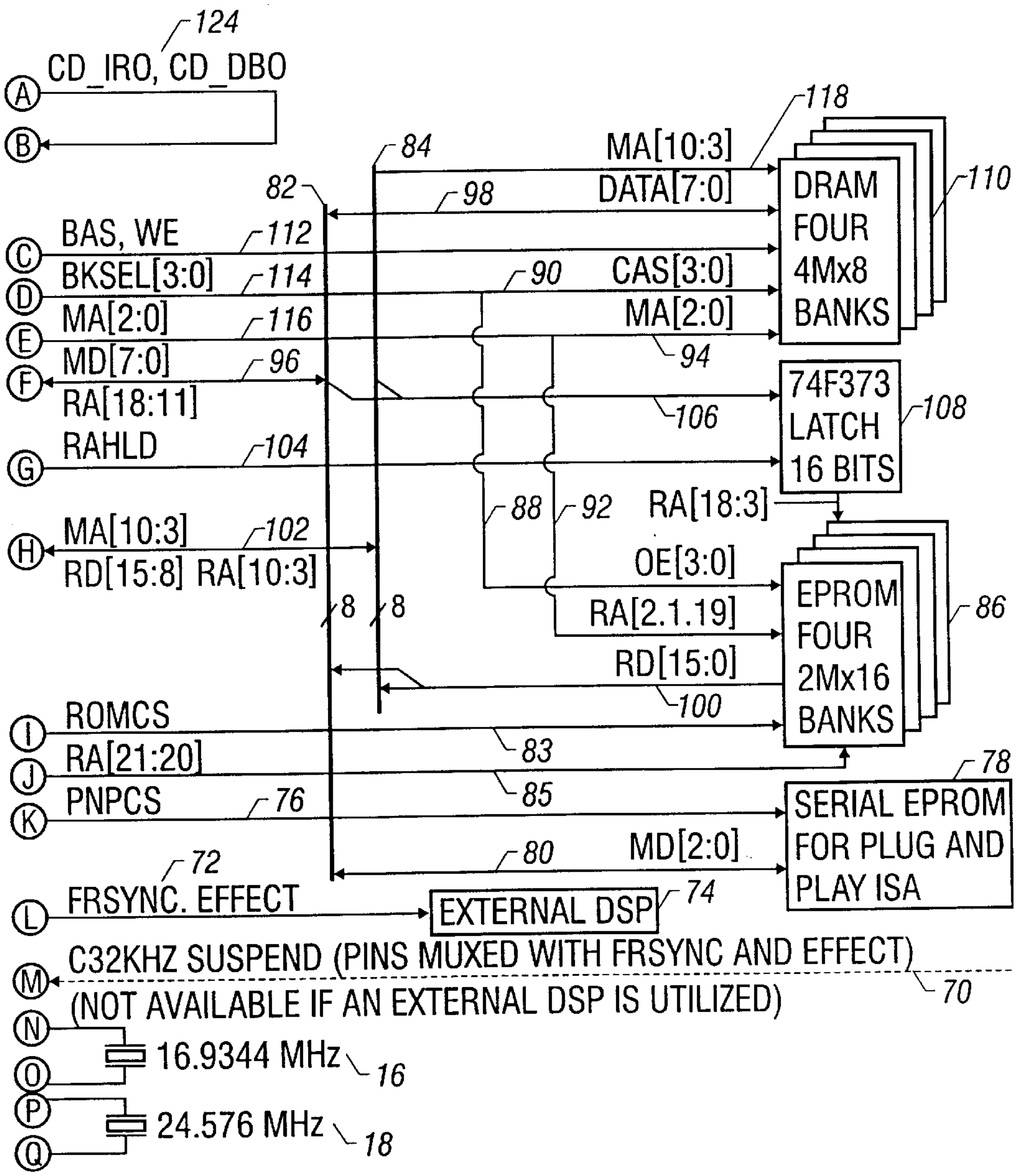

Referring now to FIG. 6, a typical full-featured implementation of a PC audio circuit C with associated circuits, buses and interconnections is described. The configuration of FIG. 6 is exemplary of how the circuit C would be utilized in a PC audio card, taking advantage of all available RAM and EPROM resources and being fully compatible with the ISA Plug-n-Play specification.

In FIG. 6, the circuit C is interfaced to host computer system (not shown ) via system bus interface module 14 and the industry standard AT/ISA system control, address and data connections. These include: system data (SD); system address (SA); system byte high enable (SBHE); interrupt request (IRQs); input/output channel check (IOCHCK); direct memory access request (DRQ) and acknowledge (DAK); input/output read (IOR); input/output write (IOW); reset; address enabled (AEN); terminal count (TC); input/output channel ready (CHRDY); and input/output chip select 16 (IOCS16). These connections provide standard communication and control functions between the circuit C and the host computer system.

In a typical embodiment, the following input/output lines and associated circuitry and/or devices are interfaced to the CODEC module 4. Provision is made for four sets of stereo inputs via standard jacks, 42, and a stereo analog output (line out L, R) 44 with external stereo amplifier 46 and jacks 48. A monophonic microphone/amp input 50 and monophonic output 52 via external amplifier 54 are provided. An external capacitance, resistance circuit 56 is provided for deriving reference bias current for various internal circuits and for providing isolation capacitance as required. A general purpose, digital two-bit flag output 60, controlled by a programmable register, is provided for use as desired in some applications. Game/MIDI ports 62 include 4-bit game input 65, 4-bit game output 66 and MIDI transmit and receive bi-directional interface 68.

The system control external connections include the 16.9344 MHz and 24.576 MHz clocks 16 and 18 and a 32 KHz clock or suspend input 70. Input 70 is used for memory refreshing and power conservation and is multiplexed with other signals as described in detail elsewhere in this application.

The interface for local memory control module 8 includes frame synchronize (FRSYNC) and effect output 72 which is used to provide a synchronizing clock pulse at the beginning of each frame for voice generation cycles and to provide access to an optional external digital signal processor 74 which may be used to provide additional special effects or other DSP functions.

Plug-n-Play chip select 76 enables an external EPROM 78 for providing configuration data over a 3-bit data bus 80 during system initialization sequences. For data and address communication between local memory control module 8 and external memory devices an external 8-bit data bus 82 and an 8-bit address bus 84 is provided.

ROM chip select 83 and 2-bit ROM address output 85 are used to address one-of-four, two-megabyte by sixteen bit EPROMs 86 which are provided for external data and command sequence storage, as described in more detail elsewhere in this specification. EPROMs 86 interface with circuit C via 4-bit output enable 88 which is a one-of-four select signal multiplexed with ram column address strobe 90 to conserve resources. One aspect of addressing for EPROMs 86 is provided by a 3-bit real address input 92. The address signals on line 92 are multiplexed with multiplexed row-column address bits for DRAM cycles provided on DRAM input 94. Pin 96 of circuit C (MD[7:0]) is an 8-bit bidirectional data bus which provides data bits for DRAM cycles via data [7:0] lines 98. Pin 96 is multiplexed in ROM cycles as real address bits 18:11 to EPROMs 86 and input data bits 7:0 (half of RD 15:0) to circuit C. Data communication from EPROMs 86 is via 16-bit data output 100 (RD[15:0]) which is split and multiplexed into circuit C via 8-bit buses 82 and 84 during ROM cycles. EPROM data input is carried over bidirectional line 96 and bidirectional line 102 (RD[15:8]) during ROM cycles. Line 102 also provides 8-bit ROM addressing (RLA[10:3]) during multiplexed ROM address and data transfer cycles. Line 102 also is multiplexed to provide row-column address bits (MA [10:3]) for DRAM cycles.

Output 104 is a ROM-address hold signal used to latch the state of 16-bit ROM addresses provided via outputs 96 and 102, buses 82 and 84 and 16-bit address input line 106 during ROM accesses by the circuit C. A 16-bit latch 108 is provided to latch ROM addresses in response to the ROM-address hold signal.

The circuit C supports up to four, 4-megabyte by 8-bit DRAMS 110 used for local data storage. Circuit C interfaces with DRAMS 110 via various address, data and control lines carried over two 8-bit buses 84 and 86, as described above. Row address strobing is provided via RAS output pin 112. Output 112 is provided directly to the RAS inputs of each DRAM circuit 110. For clarity, in FIG. 6, output 112 is also shown as providing the write enable (WE) output control signal which is provided to the write enable input of each DRAM circuit 110. In the preferred embodiment, the write enable output is provided on a separate output pin (see FIG. 3) from circuit C. DRAM column address strobe (CAS[3:0]) is provided via BKSEL[3:0] output pin 114 during DRAM cycles. 3-bits of DRAM row and column addressing are provided via output 116, and an additional eight address bits are multiplexed via bidirectional pin 102, bus 84 and DRAM input 118 during DRAM cycles. A summary of all local memory interface terminals is provided in FIG. 7.

Referring again to FIG. 6, the circuit C provides seven interrupt channels 130 from which up to three interrupts can be selected. In the preferred embodiment, two interrupts are used for audio functions and the third is used for the CD-ROM or other external device. Also shown at line 130 (a group of eight lines) is the ISA standard IOCHCK output, which is used by the circuit C to generate non-maskable interrupts to the host CPU.

The circuit of the present invention provides general compatibility with Sound Blaster and AdLib applications. When running under MS-DOS a terminate and stay resident (TSR) driver sequence must be active with the host CPU to provide compatibility. One such driver sequence is that provided by Ultrasound and called Sound Board Operation System (SBOS). When application software, typically a game, sends a command to a register in circuit C designated as a Sound Blaster or AdLib register, the circuit C captures it and interrupts the processor with the IOCHK pin. The non-maskable interrupt portion of the SBOS driver then reads the access and performs a software emulation of the Sound Blaster or AdLib function.

The circuit C also provides six DMA channels 136 and DMA acknowledge lines 138 from which three DMA functions can be selected. The three DMA functions include: wave-file record transfers and system-memory transfers; wave-file playback transfer; and a DMA channel required by the external CD-ROM interface. The availability of local memory DRAMs 110 and the provision of large first-in/first-out data registers in the DRAMs, as is described herein below, reduces the requirement for wave-file DMA functions, and in some instances can eliminate the need for wave-file DMA channels altogether.

Referring to FIG. 6, for use in those systems which include a compact disc drive, the circuit C provides necessary signals or hooks to facilitate the use of an external PNP compatible device driver such as external CD interface 125.

The circuit C provides separate interrupt request and direct memory address request pins for external interface 125, which are schematically shown as a single line 124. In the preferred embodiment, a separate input pin is provided for each (see FIG. 3). External device chip select and DMA acknowledge outputs are provided by circuit C via separate output pins (FIG. 3) shown collectively as line 126 in FIG. 6. Data exchange between circuit C and the external device drive is provided via the ISA standard 16-bit bidirectional data bus 128.

II. Registers and Address Allocation

Circuit C is, in general, a register controlled circuit wherein various logic operations and alternative modes of operation are controlled by the status of various bits or bit groups held in various registers. Complete descriptions and definitions of registers and their related functions are set forth in the charts and written description included elsewhere herein. Circuit C also includes several blocks of input/output address space, specifically, five fixed addresses and seven relocatable blocks of addresses. In the register description given herein, register mnemonics are assigned based on the following rules:

1. The first character is assigned a code that specifies the area or module to which the register belongs;

I (for interface)=System control;

G (for games)=MIDI and joystick;

S=Synthesizer;

L=Local memory control;

C=CODEC;

R=CD-ROM;

U (Ultrasound)=Gus, Sound Blaster, AdLib compatibility;

P=Plug-n-Play ISA.

2. The middle two to four characters describe the function of the register.

3. The final character is either R for a direct register, P for a port (to access an array of indexed registers), or I for an indirect register.

A. Relocatable Address Blocks

The seven relocatable address blocks included in the circuit C are referenced herein according to the mnemonics set forth in Table I below, wherein PNP refers to industry standard Plug-n-Play specifications:

TABLE I

| Mnemonic | Description |
|---|---|
| P2XR | GUS-Compatible. A block of 10 addreeses within 16 spaces used primarily for compatibility with existing sound cards. SA[9:4] are set by standard PNP software. |
| P3XR | MIDI and Synthesizer. A block of 8 consecutive addresses used primarily to address the synthesizer and MIDI functions. SA[9:3] are set by standard PNP software. |
| PCODAR | Codec. A block of 4 consecutive addresses used to address the codec function. SA[9:2] are set by standard PNP software. |
| PCDRAR | CD-ROM. A block of 16 consecutive addresses used for accesses to the external CD-ROM interface. SA[9:4] are set by standard PNP software. |
| PNPRDP | Plug and Play Read Data Port. This location and utilization of this single-byte port is controlled by standard PNP software. SA[9:2] are configurable via PNP software and SA[1:0] are both assumed to be high. |
| UGPA1I | General Purpose Register 1. The general purpose registers are single-byte registers used for compatibility with existing sound cards. SA[7:0] of their addresses are programmed by compatibility software; SA[9:8] are also programmable. |
| UGPA2I | General Purpose Register 2. See UGPA1I above. |

B. Direct Address Summary

There are eight groups of functions in circuit C that utilize programmable registers. The status of programmable registers are subject to control in response to instructions executed by the host CPU system. The eight groups of functions and their associated direct addresses are listed in Table II below. Two of the addresses for Plug-n-Play registers are decoded from all twelve bits of the ISA address bus (SA[11:0]). The remaining addresses are decoded from the first ten bits (SA[9:0]).

TABLE II

| Code | Function | Direct Addresses |
|---|---|---|
| C | codec | PCODAR+0 through PCODAR+3. |
| G | Game, MIDI port | 201h (fixed), P3XR+0, P3XR+1. |
| I | system control | P3XR+3, P3XR+4, P3XR+5. |
| L | local memory control | P3XR+7. |
| P | Plug and play ISA | 279h (12-bit, fixed), A79 (12-bit, fixed), PNPRDP |
| R | CD-ROM | PCDRAR+0 through PCDRAR+0Fh. |
| S | synthesizer | P3XR+2. |
| U | GUS, AdLib, Sound Blaster compatibility | P2XR+0, P2XR+6, P2XR+8 through P2XR+0Fh, 388h (fixed), 389h (fixed), UGPA1I, UGPA2I. |

A complete listing of all input/output programmable registers and ports is given in FIGS. 8–10 wherein all address numbers are in hexadecimal format. Index values provide alternative function addresses using a common basic address.

C. External-Decoding Mode

In addition to the ten and twelve-bit address spaces used for internal input/output mapping, the circuit C also provides an optional external-decoding mode wherein four system address bits (SA[3:0], FIGS. 3,6) and two chip-select signals, implemented as SA[5,4], address registers within circuit C. This mode is selected by the status of address pin RA [20] at the trailing edge of the system reset signal.

If RA [20] is low at the trailing edge of the reset signal, then normal input/output address decoding is implemented, where system address inputs SA[11:0] address all the registers in the circuit C. If RA[20] is high at the trailing edge of system reset, then external decoding mode is implemented:

| Normal Decoding Mode: | SA[11:6] | SA[5] | SA[4] | SA[3:0] |
|---|---|---|---|---|
| External Decoding Mode | Not used | S Chip Select [1] | S Chip Select [0] | SA [3:0] |

This multiplexing can be provided in the manner discussed below with regard to other multiplexed pins and functions.

The following table shows how direct addressed registers and ports are accessed in external decode mode. Indexed registers are accessed the same way as in internal decoding mode (see preceding register table), except that the direct addresses change to the ones shown in Table III below.

TABLE III

| SCS[1]# | SCS[0]# | SA[3:0] | Register | Equivalent Internal-Decoding-Mode Address |
|---|---|---|---|---|
| 1 | 0 | 0 | UMCR | P2XR + 0h |
| 1 | 0 | 1 | GGCR, PCSNBR | 201h (fixed) |
| 1 | 0 | 2 | PIDXR | 279h (12-bit fixed) |
| 1 | 0 | 3 | PNPWRP, PNPRDP | A79h (12-bit fixed), PNPRDP |
| 1 | 0 | 4 | ITCI | P3XR + 5h, |

TABLE III-continued

| SCS[1]# | SCS[0]# | SA[3:0] | Register | Equivalent Internal-Decoding-Mode Address |
|---|---|---|---|---|
| | | | | with IGIDXR = 5Fh (indexed) |
| 1 | 0 | 5 | — | |
| 1 | 0 | 6 | UISR, U2X6R | P2XR + 6h |
| 1 | 0 | 7 | — | |
| 1 | 0 | 8 | UACWR, UASRR | P2XR + 8h, 388h (fixed) |
| 1 | 0 | 9 | UADR | P2XR + 9h, 389h (fixed) |
| 1 | 0 | A | UACRR, UASWR | P2XR + Ah |
| 1 | 0 | B | UHRDP | P2XR + Bh |
| 1 | 0 | C | UI2XCR | P2XR + Ch |
| 1 | 0 | D | U2XCR | P2XR + Dh |
| 1 | 0 | E | U2XER | P2XR + Eh |
| 1 | 0 | F | URCR, USRR | P2XR + Fh |
| 0 | 1 | 0 | GMCR, GMSR | P3XR + 0h |
| 0 | 1 | 1 | GMTDR, GMRDR | P3XR + 1h |
| 0 | 1 | 2 | SVSR | P3XR + 2h |
| 0 | 1 | 3 | IGIDXR | P3XR + 3h |
| 0 | 1 | 4 | I16DP (low byte) | P3XR + 4h |
| 0 | 1 | 5 | I16DP (high), I8DP | P3XR + (4–5)h, P3XR + 5h |
| 0 | 1 | 6 | — | |
| 0 | 1 | 7 | LMBDR | P3XR +7h |
| 0 | 1 | 8 | — | |
| 0 | 1 | 9 | — | |
| 0 | 1 | A | — | |
| 0 | 1 | B | — | |
| 0 | 1 | C | CIDXR | PCODAR + 0h |
| 0 | 1 | D | CDATAP | PCODAR + 1h |
| 0 | 1 | E | CSR1R | PCODAR + 2h |
| 0 | 1 | F | CPDR, CRDR | PCODAR + 3h |

Note: It is not legal to assert both SCS[0]# and SCS[1]# at the same time.

D. DMA Accesses

A number of registers and defined first-in/first-out address spaces within circuit C are accessible via DMA read and write cycles. These are listed in the following tables, where LMC and CODEC refer to the module within circuit C where such registers and FIFOs reside:

TABLE IV

| Name | Description | DMA Group | Rd-Wr | Section |
|---|---|---|---|---|
| LM DMA | Local memory DMA transfers | 1 | rd wr | lmc |
| CODEC REC FIFO | Codec record FIFO | 1 | read | codec |
| CODEC PLAY FIFO | Codec play FIFO | 2 | write | codec |

Note that in the table above, DMA Group is a register defined term and does not refer to ISA standard DMA channels or request acknowledge numbers.

External decoding mode is utilized in those systems which are non-PNP compliant to provide access to internal registers and ports via external decoding logic circuits.

E. Multiplexed Terminals

To conserve resources, several groups of external terminals or pins, in addition to the ROM/DRAM multiplexed address and data transfer pins described above, are multiplexed between alternate functions. Four of the groups are multiplexed based upon the status of external pins upon the trailing edge of the reset signal, which occurs upon power up or other system resets.

Figure 11:
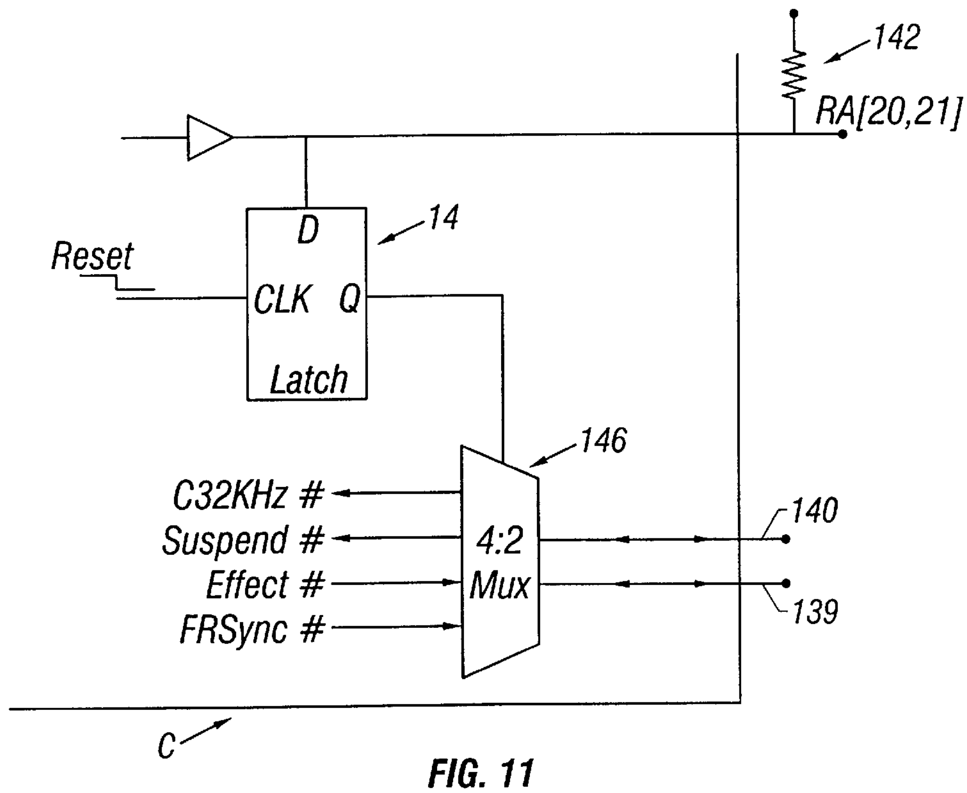
FIG. 11 is a schematic diagram illustrating an example of multiplexing circuitry.

Referring now to FIG. 11, it is desired to multiplex pins 139 and 140 which correspond to the suspend # and C32 KHZ inputs in one state, with the FRSYNC# and EFFECT# outputs in the alternate state. The functions served by these signals are discussed elsewhere herein. In the circuit C, multiplexing is provided for these pair of pins by sensing the state of terminal RA[21] (see FIG. 6) at the trailing edge of the reset signal. By providing a pull-up resistor 142 on the RA[21] pin or not providing such a resistor, the D-input to latch 144 can be set to a low or high value. Latch 144, upon being clocked by the trailing edge of the reset signal will provide at the Q output a corresponding low or high output. This latch output is provided to a 4:2 multiplex circuit 146. Multiplexor 146 assigns pins 139 and 140 to the SUSPEND# and C32 KHZ function if the Q output is high, and alternatively, assigns pins 139 and 140 to the EFFECT# and FRSYNC# output function of the Q output is low.

Multiplexing or selecting between Plug-n-Play compatible expansion card mode and system board mode is provided in the same manner, by latching the state of input pin PNPCS on the trailing edge of the reset signal. Plug-n-Play mode is selected by a low value, and system board mode selected by a high value. The selection is made depending on whether the circuit C is being used in a Plug-n-Play compatible system, or a system board, non Plug-n-Play compatible system.

A summary of the pins that are multiplexed based on modes selected at reset is provided in Table V below.

TABLE V

| Signal | Low at RESET | High at RESET | Internal Signal |
|---|---|---|---|
| RA[21] | EFFECT# and FRSYNC# | C32KHZ and SUSPEND# | LPSUS32 |
| RA[20] | normal decoding mode | external decoding mode | LPEXDEC |
| PNPCS | PNP card mode | PNP system board mode | IPPNPSYS |
| MWE# | ITCI[TE]=1 | ITCI[TE]=0 | ITC[TE] |
| MIDITX | Access to ITCI enabled | Access to ITCI disabled | GPITCIEN L |

To further conserve resources, the circuit C includes multiplexing between external pins relating to compact disk drive control and serial port synchronization, clock and data transfer used when an external digital signal processing circuit or other external, serial format circuits are utilized. This is more fully discussed in the CODEC module description below.

Referring to FIG. 6, control of an external device, such as a CD drive, is provided within the system control module via the EX_IRQ (interrupt request), EX_DRQ (DMA request), EX_DAK# (acknowledge) and CD_CS# (chip select) pins. These four pins are illustrated schematically as lines 124 and 126 in FIG. 6. When circuit C is functioning in a serial transfer mode (as discussed more fully in the CODEC description below), multiplexing of these four external device control pins is controlled by the status of bit seven of register ICMPTI. External serial transfer mode is enabled when ICMPTI[7] is high. In that case, the external device control pins are multiplexed as follows:

| | | | | |
|---|---|---|---|---|
| ICMPTI[7] LOW | EX_DAK# | EX_IRQ | EX_DRQ | EX_CS# |
| ICMPTI[7] HIGH | ESPSYNC | ESPCLK | ESPDIN | ESPDOUT |

The ESPSYNC, ESPCLK, ESPDIN and ESPDOUT functions correspond to synchronization pulse, clock, data in and data out, respectively.

The following is a table of all the pins in the circuit C, sorted by I/O pin type:

| Pin Name | Type | Resistor | Notes |
|---|---|---|---|
| SA{5:0], DAK{1:0]#, TC, IOR#, IOW#, AEN, RESET, XTAL1I, XTAL2I, MIDIRX | Input | | |
| GAMIN[3:0] | Input | 6K pull-up | |
| SA[11:6], SBHE#, DAK[7:5,3]# EX DRQ | Input | 200K pull-up | 3 |
| GPOUT[1:0], RAS#, BKSEL[3:0]#, ROMCS#, RAHLD#, XTAL10, XTAL20, MA[2:0] | Output | | |
| IRQ[2], DRQ[1:0], DAK#, CS# | 3-State Output | | 4 |
| IRQ[15,12,11,7,5], DRQ[7:5,3] | 3-State Output | 200K pull-up | |
| IOCHK#, IOCHRDY | Open Drain | | |
| IOCS16# | Open Drain | 200K pull-up | |
| SD[7:0], SUSPEND#, C32KHZ, MA[10:3], MD[7:0] | Bi-Directional | | |
| SD[15:8], IRQ, RA[21:20], MWE#, PNPCS, MIDITX | Bi-Directional | 200K pull-up | 1,2,3 |
| MIC[L,R], AUX1[L,R], AUX2[L,RR], LINEIN[L,R], MONOIN, CFILT, IREF | Analog Input | | |
| LINEOUT[L,R], MONOOUT, AREF | Analog Output | | |
| GAMIO[3:0] | Analog L/O | | |
| AVDD, DVDD, AVSS, DVSS | Power and Gnd | | |

Note 1:
SUSPEND#, C32KHZ, GAMIN[2], and IRQ have multiplexed functions that may be inputs or outputs.
Note 2:
MIDITX, RA[21:20], MWE#, and PNPCS are only inputs while RESET is active so that the state of various configuration bits can be latched.
Note 3:
The pull-up resistor on the signals IOCS16#, RQ[15,12,11,7,5] A[11:6], SHBE#, DRQ[7:5,3], DAK[7:5,3]#, and SD[15:8] can be disabled via IVERI[PUPWR] so that these signals will not drive voltage onto the ISA bus signals during suspend.
Note 4:
EX DAK#, EX CS#, and MIDITX are high-impedance suspend.

III. System Control Module

A. System Control Functions

Referring now to FIG. 1, the system control module 2 includes numerous registers, compatibility logic, Plug-n-Play ISA implementation logic, interrupt and DMA channel selection logic, and miscellaneous control functions such as clocks, resets, test logic, etc. System control module 2 is shown in greater detail in FIG. 12.

Figure 12:
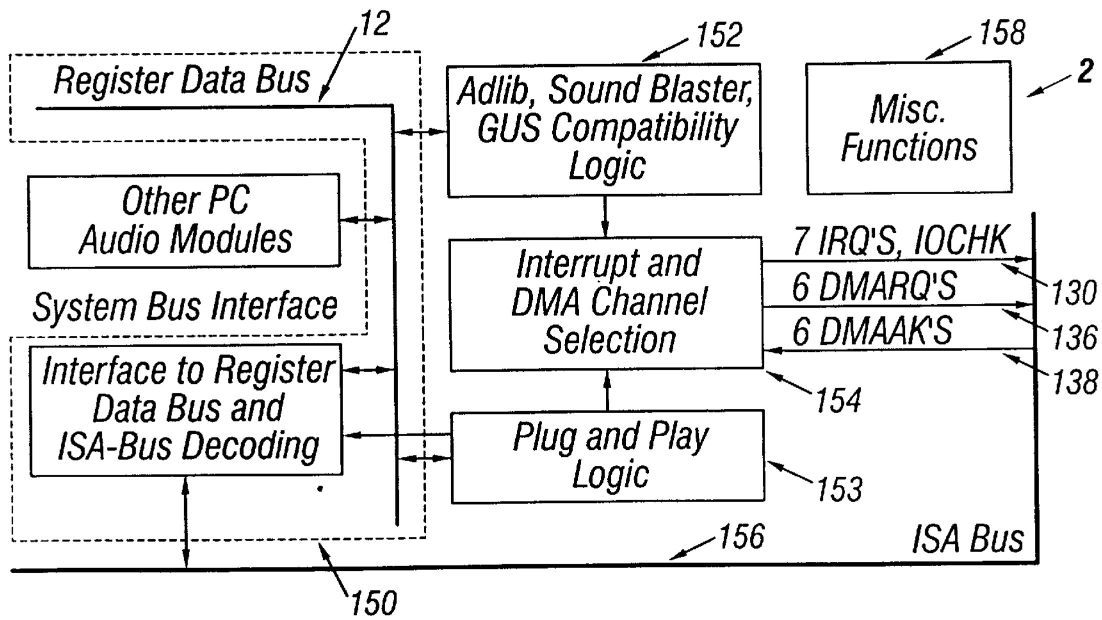
FIG. 12 is a block diagram schematic illustration of the system control module of the circuit C.

Referring now to FIG. 12, system control module 2 includes a system bus interface block 150, industry software compatibility logic block 152, interrupt and DMA channel selection logic block 154, a Plug-n-Play logic block 153, a register data bus 12, and a miscellaneous logic and timing block 158. The system control module in general controls the functioning of the circuit C in response to various timing, and control signals as well as enables responses to control functions held in various registers which serve to change the modes of operation, power consumption levels, and other control features.

1. System Bus Interface

System bus interface 150 provides the hardware links between the processor-controlled system bus 156 and the various modules and portions of circuit C. Circuit C is designed to be fully compatible with the Plug-n-Play ISA system bus specification. One aspect of the Plug-n-Play ISA specification is a requirement for an interface to a serial EEPROM where the system configuration data is stored and available during system initialization to provide configuration data to the host CPU. The system bus interface also has to comply with the ISA portion of the EISA bus specification. These two specifications are industry standards and commonly available.

The ISA bus interface 150 provides interface compatibility with a 16-bit data bus, which when in 5 volt mode has a drive capability selectable to be either 24, 12 or 3.2 miliamps. The power up default is 24 miliamps. In output mode, the data bus is edge-rate controlled and the delay between lines is mutually skewed to reduce the effects of ground bounce.

ISA bus interface 150 also provides interface for a 12-bit address bus and support for two audio interrupts and one CD-ROM or external device interrupt chosen from seven interrupt request lines 130. Support is also provided for use of the IOCHK signal to generate non-maskable interrupts to the host CPU.

The interface 150 also provides support for three DMA channels chosen from six sets of DMA lines 136 and a corresponding set of DMA acknowledge lines 138. In accordance with the ISA DMA specification, the six channels available are 0, 1, 3, 5, 6 and 7 (channel 0, 1 and 3 are 8-bit DMA channels and channels 5, 6 and 7 are 16-bit DMA channels). The three DMA functions supported are: wave-file record transfers and system-memory transfers; wave-file play transfers; and DMA channel required by the CD-ROM or external device interface. A mode is provided whereby both record and play functions can be mapped to the same DMA channel, although only one can be enabled at a time.

2. The Register Data Bus

Figure 13:
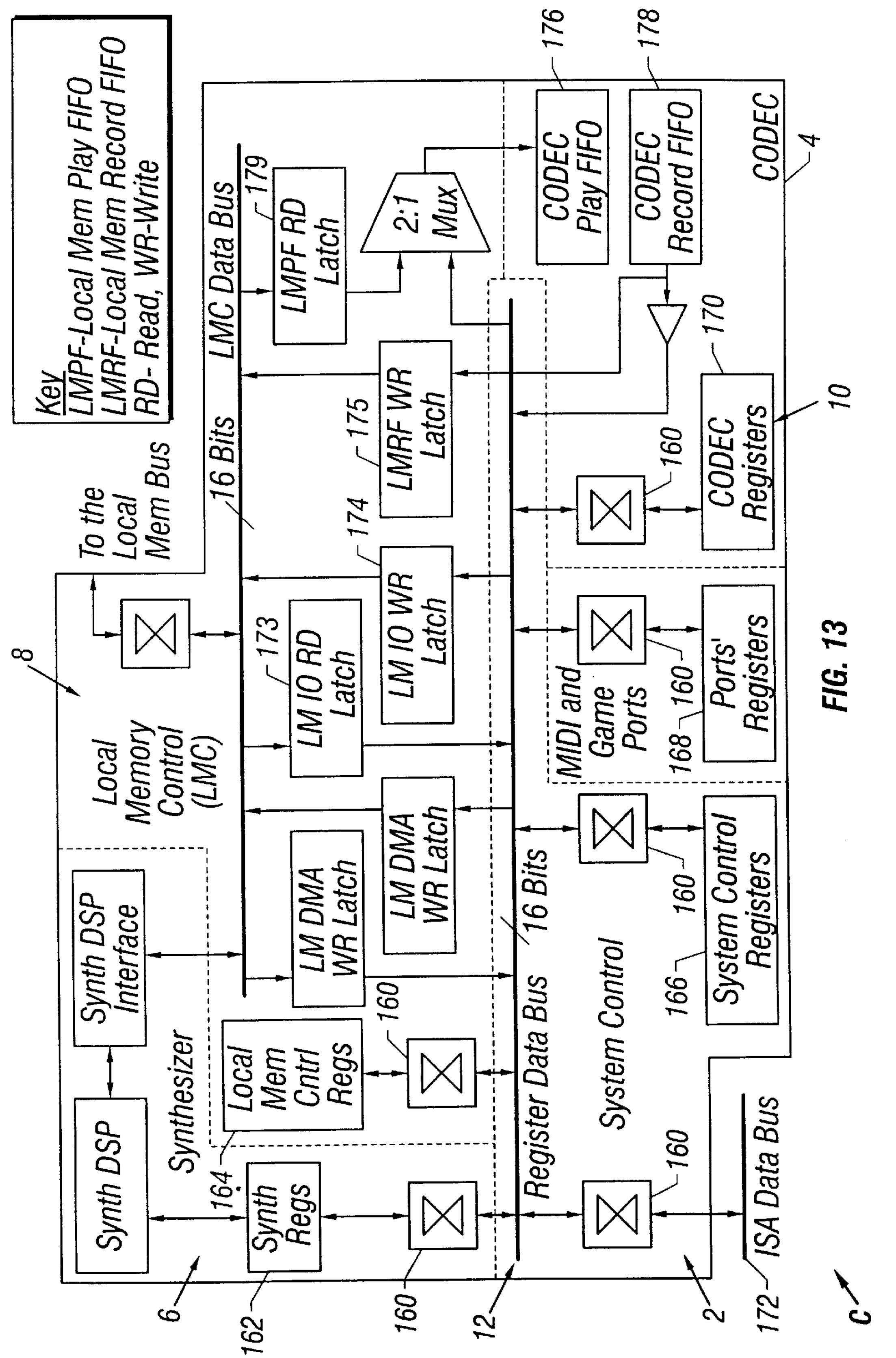
FIG. 13 is a schematic block diagram of the circuit C including modular interfaces to the register data bus.

Data distribution between the ISA bus and the circuit C is provided via register data bus 12. Register data bus 12 facilitates system bus input and output and DMA accesses to registers provided throughout the circuit C. Referring now to FIG. 13, register data bus interfaces via a plurality of bi-directional data bus transceivers 160 to synthesizer registers 162, local memory control registers 164, system control registers 166, MIDI and game ports and registers 168 and CODEC registers 170. The purpose and function of these registers is described more fully elsewhere in this specification. A bi-directional data bus transceiver 160 is also provided between register data bus 12 and ISA data bus 172, which is the data portion of ISA system bus 156 shown in FIG. 12. Register data bus 12 also interfaces with various local memory latches 173, 174 and 175 and CODEC FIFOs 176 and 178, as will be described in detail elsewhere in this specification.

Circuit C supports either eight or 16-bit data transfer to or from the system data bus. In the case of input/output accesses from the ISA data bus, the alignment of the data to and from the register data bus is defined by the least significant bits of the ISA address bus. These are designated SA[0] and SBHE#, as shown in FIG. 6. These two bits are decoded as shown in the following Table VI for accesses to other than the general input/output data ports (I8/16DP):

TABLE VI

| SAO | SBHE# | Non-I8/16DP Description | Translation |
|---|---|---|---|
| 0 | 0 | 16-bit I/O access | SD[15:0] ←→ RDB[15:0] |
| 0 | 1 | 8-bit I/O access to the even byte | SD[7:0] ←→ RDB[7:0] |
| 1 | 0 | 8-bit I/O access to the odd byte | SD[15:8] ←→ RDB[7:0] |
| 1 | 1 | odd byte 8-bit I/O access from an 8-bit card | SD[7:0] ←→ RDB[7:0] |

Note that all 8-bit quantities are passed over the lower half of the register data bus 12. The condition of both SA[0] and SBHE# high, which is not allowed by the ISA bus specification, is used to specify a high-byte access from an 8-bit card. For an 8-bit card, the card designer would pull the SBHE# bit high.

Figure 14A:
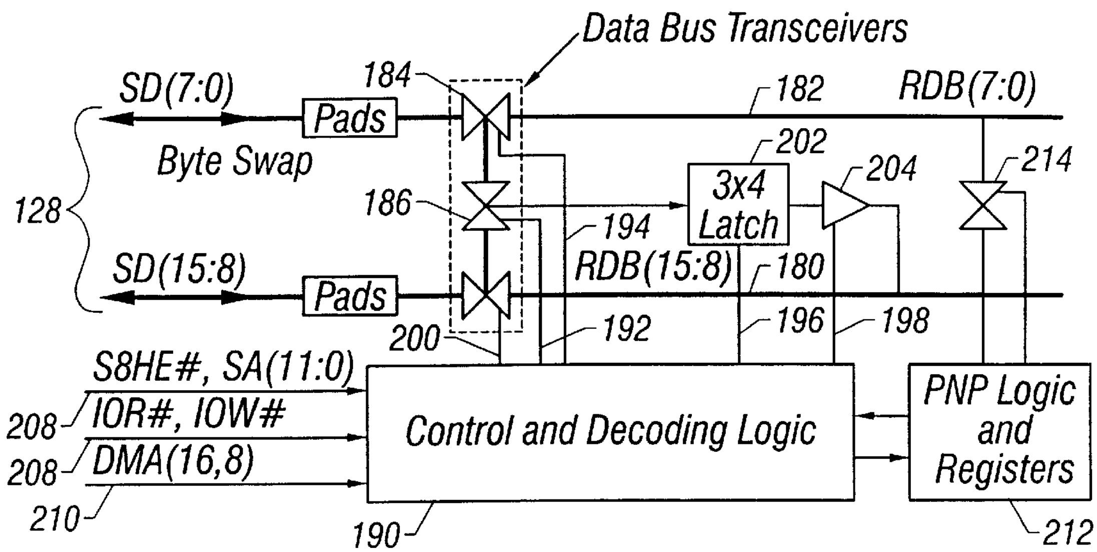
FIG. 14*a* is a schematic diagram of implementation detailed for the register data bus.

Referring now to FIG. 14*a* details of register data bus control are illustrated. Register data bus 12 is formed of two 8-bit busses 180 and 182. Low byte bus 182 interfaces via data bus transceiver 184 to the low byte of system data bus 128 (see FIG. 6). High byte bus 180 interfaces to high byte of system data bus 128. Controlled bus driver 186 transfers data between buses 182 and 180 to effect data translation set forth in the table above, in response to control and decoding logic 190. Control logic 190 responds to input SBHE#, and SA[0] to generate control signals via lines 192, 194, 196, 198 and 200 to implement the data translation set forth in the table above.

An 8-bit latch 202 is provided to latch the low byte data until the high byte is active to provide 16-bit input/output accesses. Controlled driver 204 responds to control signals from control and decoding logic 190 to effect simultaneous low and high byte input/output accesses.

Control logic 190 also receives ISA bus signals IOR# and IOW# which enable read or write accesses respectively. While these inputs are shown as a single line 206 they are provided on individual pins to circuit C, as are the input signals illustrated on lines 208 and 210. PNP data transfers under the control of logic circuits 190 and 212 are provided via bus 182 and controlled bi-directional transceiver 214. PNP logic functions and registers are described in detail elsewhere in this specification. Control and decoding logic 190 may be implemented in any suitable conventional method to provide industry standard ISA system bus interface control and address decoding and to implement the data handling protocol set forth herein. Likewise, PNP logic circuit 212 may be implemented with conventional circuits to provide an industry standard PNP complaint interface.

Control and decode logic 190 provides conventional handshake, decoding and bus interface circuitry to interface with industry standard ISA system bus.

Accesses to all PNP registers use odd, 8-bit addresses. Since IOCS16# is not asserted for these accesses, the lower 8 bits of the ISA data bus are used. These are passed from/to the lower 8 bits of the register data bus. IOCS16# is an industry standard interface signal asserted via an external pinout (see FIG. 6).

I8DP located at P3XR+5 and I16DP located at P3XR+(4-5) are used to access 8 and 16-bit, indexed registers included in the circuit C. I16DP is the only port on the circuit C that is capable of 16-bit I/O accesses. IOCS16# is asserted for all accesses to these general data ports. The general I/O data port accesses are translated is a follows:

TABLE VII

| SAO | SBHE# | I8/16DP Description | I/O Read Translation | I/O Write Translation |
|---|---|---|---|---|
| 0 | 0 | 16-bit I/O access | SD[15:8] ← RDB[7:0]<br>SD[7:0] ← RDB[15:8] | SD[15:8] → RDB[7:0]<br>SD[7:0] → RDB[15:8] |
| 0 | 1 | 8-bit I/O access to even byte | SD[7:0] ← RDB[15:8] | SD[7:0] → latch[7:0] |
| 1 | 0 | 8-bit I/O access to odd byte | SD[15:8] ← RDB[7:0] | SD[15:8] → RDB[7:0],<br>latch[7:0] → RDB[15:8] |
| 1 | 1 | odd byte 8-bit I/O access from an 8-bit card | SD[7:0] ← RDB[7:0] | SD[7:0] → RDB[7:0],<br>latch[7:0] → RDB[15:8] |

System bus interface 150 is responsible for translating 16-bit I/O writes that are broken up by software into two 8-bit writes (even byte first, then odd byte). For this, the even-byte write is latched in the latch 202 and provided over the low half of the register data bus during the subsequent odd-byte write. The register data bus will provide whatever was last latched in an even-8-bit-I/O write during odd-8-bit-I/O writes.

For DMA accesses, the data width is determined by the DMA channel used as follows:

TABLE VIII

| Channel | Description | Translation |
|---|---|---|
| 0, 1, 3 | 8-bit DMA transfer | SD[7:0] ←→ RDB[7:0] |
| 5, 6, 7 | 16-bit DMA transfer | SD[15:0] ←→ RDB[15:0] |

During 8-bit DMA and I/O reads, the appropriate byte is driven on the ISA data bus 128. The other byte is not driven; it will remain in the high-impedance state.

It should be noted that to make sure the register data bus' voltage does not drift into the transition region when it is not being driven, weak feedback inverters ("keeper" or "sticky-bit" circuits) are provided in accordance with conventional, well known methods. Such circuits provide a weak feedback path that drives the node voltage back on itself to keep it from floating.

ISA Data Bus Drive Considerations

Figure 14B:
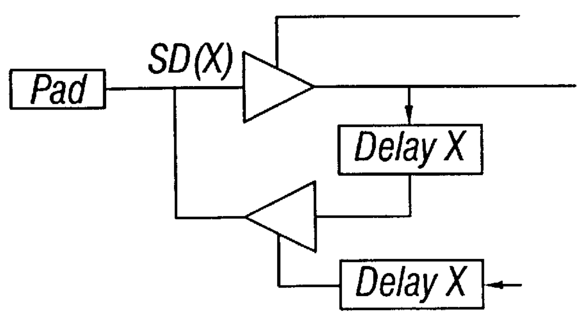
FIG. 14*b* is a schematic diagram of a portion of the ISA bus interface circuitry.

There are three special ISA-data-bus design facets built into the IC for the purpose of reducing the peak return current required when the data bus is driving out. The first is that the output drive capacity is selectable, via a programmable register, to be either 24, 12 or 3.2 milliamps (when VCC is at 5 volts). The second is that there is a special current restriction circuit built into the output buffers that slows the edge rates; this circuit is implemented in the same way as that used by the PC Net ISA chip, 79C960/1. The third design aspect is that the data bus is broken up into a few groups, each of which is skewed from the others, as shown in the FIG. 14*b*.

3. Register Data Bus I/O Decoding

There are seven relocatable and four non-relocatable blocks of address space decoded. They are:

TABLE IX

| Desription | Signal name | Comparison | Enables |
|---|---|---|---|
| PNP index address | IDEC279 | SA[11:0]=279h | The ability to access all these |
| PNP write data | IDECA79 | SA[11:0]=A79h | registers varies based on the |
| PNP read data | IDECPNPRD | SA[9:0]=(PSRPAI, 1, 1) | state of PNPSM[1:0] |
| game port | IDEC201 | SA[9:0]=201h | UJMPI[2] PUACTI[0], |
| AdLib | IDEC3889 | SA[9:1]=388h–389h | IDECI[2] PPWRI[SD] |
| 2XX registers | - see below - | SA[9:4]=P2XR | |
| 3XX registers | - see below - | SA[9:4]=P3XR | |
| General Purpose 1 | IDECGP1 | SA[9:0]=(ICMPTI[1:0], UGPA1I[7:0]) | URCR[6] |
| General Purpose 2 | IDECGP2 | SA[9:0]=(ICMPTI[3:2], UGPA2I[7:0]) | URCR[6] |
| codec | IDECCODEC | SA[9:2]=PCODAR | IDECI[3] |
| external device | IDECCDROM | SA[9:4]=PCDRAR | PRACTI[0] PPWRI[SD] |

The notation "PPWRI[SD]" in the above table indicates the circuit C is in shut-down mode, initiated by a specific I/O write to PPWRI.

The 2XX and 3XX decodes are further broken down as follows:

TABLE X

| SA[3:0] | 2XX signal name | Enables |
|---|---|---|
| 0h | IDEC2X0 | |
| 6h | IDEC2X6 | |
| 8h | IDEC2X8 | IDECI[0] |
| 9h | IDEC2X9 | IDECI[0] |
| Ah | IDEC2XA | IDECI[0] |
| Bh | IDEC2XB | |
| Ch | IDEC2XC | IDECI[1] |
| Dh | IDEC2XD | IDECI[1] |
| Eh | IDEC2XE | IDECI[1] |
| Fh | IDEC2XF | |
| SA[3:0] | 3XX signal name | Enables |
| 0–1h | IDEC3X01 | UJMPI[1] |
| 2h | IDEC3X2 | |
| 3h | IDEC3X3 | |
| 4–5h | IDEC3X45 | |
| 7h | IDEC3X7 | |

AEN

The decodes above are only enabled when AEN is low.

IOR and IOW

Figure 15:
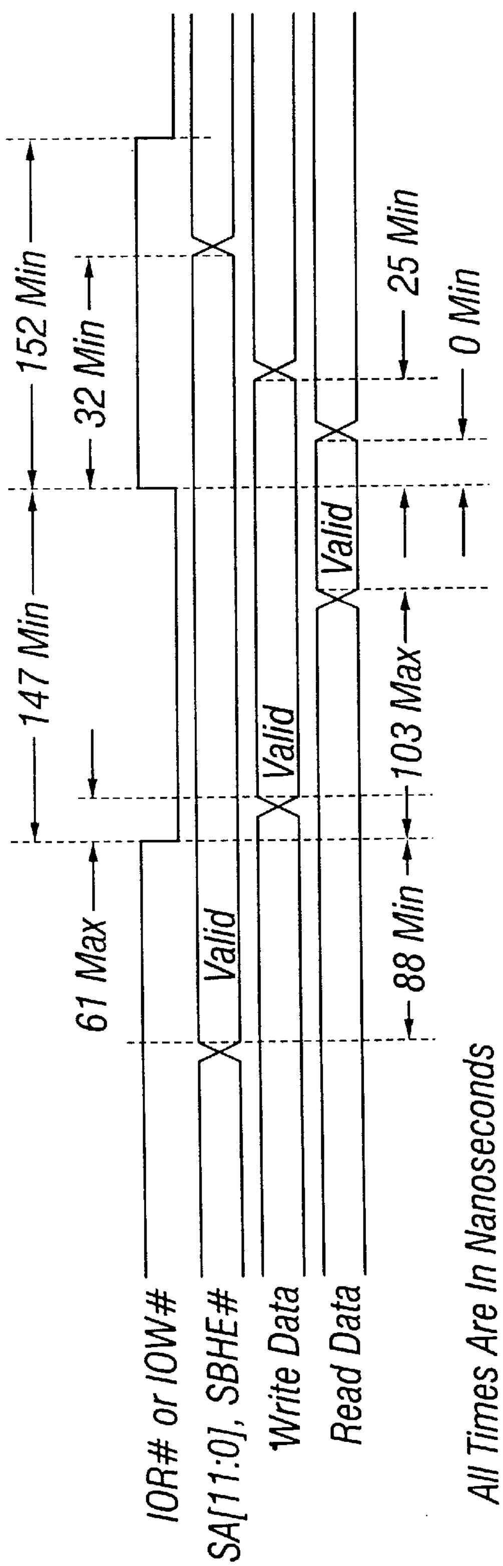
FIG. 15 is a timing diagram illustrating worse case ISA-bus timing for the circuit C.

Along with the above decodes, the SBI 150 provides IOR and IOW from the ISA data bus. The worst case ISA-bus timing that must be assumed when interfacing to these signals is illustrated in FIG. 15. Note that this diagram shows the fastest I/O cycle possible which will only occur during accesses to the single 16-bit port that is addressable in the IC, P3XR=(4-5). All other ports will follow 8-bit timing (IOCS16# is not driven active), which is much slower, IOR# and IOW# stay active for about 530 nanoseconds for 8-bit I/O cycles.

IOCHRDY Control

Only accesses to P3XR+2 through P3XR+7 are capable of extending the ISA-bus I/O cycle by causing IOCHRDY to become inactive; accesses to all the P2XR, ports, CODEC, and Plug-n-Play ISA registers never extend the cycle. For the registers that can extend the cycle (including the 46 registers indexed by IGIDXR), the following categories exist:

TABLE XI

| | |
|---|---|
| 1 | I/O reads that may require extra time to complete. |
| 2 | I/O writes that require extra time to complete, but the data and address are latched so that the cycle is not extended (buffered I/O writes). |
| 3 | I/O reads that must first wait for the previous buffered I/O write to complete. |
| 4 | I/O writes that must first wait for the previous buffered I/O write to complete. |

Figure 16A:
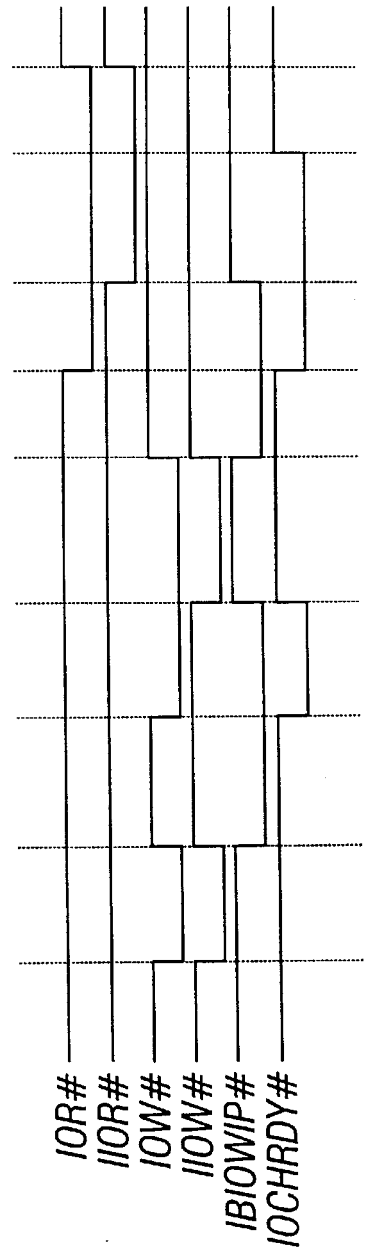
FIG. 16*a* is a timing diagram relating to buffered input and outputs for the circuit C.
Figure 16B:
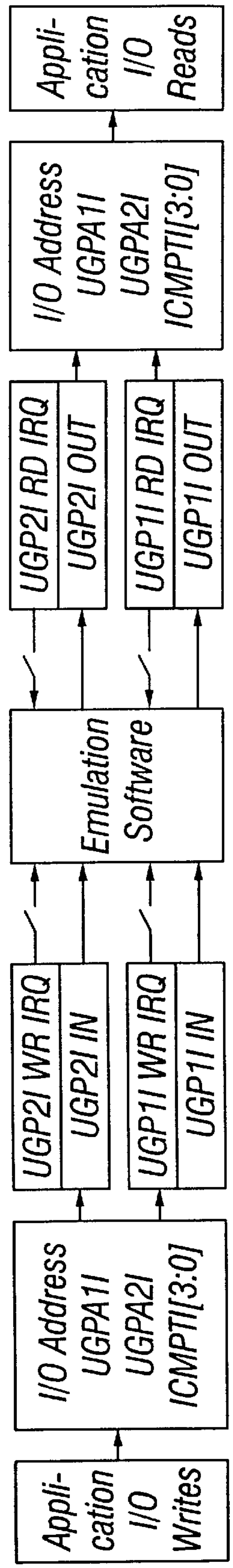
FIG. 16*b* is a schematic diagram of a portion of the emulation logic for the circuit C.

Buffered I/O writes are important because they allow the CPU to continue without having to wait. However, if not handled properly, they can be the source of problems resulting from mixing up the order in which the I/O cycles are handled. For example, if there were a buffered I/O write to local memory immediately followed by a write to the local memory I/O address registers, then the write to local memory may be sent to the wrong address. This kind of problem is handled by forcing any subsequent accesses to the circuit C to be extended while there is a buffered I/O write in progress. Referring now to FIG. 16*b*, IIOR#, IIOW#, and IBIOWIP# are internal signals. IIOR# and IIOW# become active after the previous buffered write has completed, signaled by IBIOWIP# (buffered I/O Write) becoming inactive. Note that IIOR# and IIOW# are not gated by IBIOWIP# during DMA cycles.

The registers that allow buffered I/O writes—called buffered registers—are the synthesizer voice-specific registers, IGIDXR=00h-0Dh and 10h-18h, the Local Memory Control (LMC) 16-bit access register, IGIDXR=51h, and the LMC Byte Data Register, LMBDR. An I/O write to any of these registers automatically causes IBIOWIP# to become active so that IOCHRDY will become inactive during the next I/O access to the circuit C. An I/O read to any of the buffered registers causes the logic to (1) force IOCHRDY inactive (regardless as to whether IBIOWIP# is active), (2) if IBIOWIP# is active, wait until it becomes inactive and keep IOCHRDY inactive, (3) wait for the read-data to become available to the ISA bus, and (4) allow IOCHRDY to become active; at this point the cycle is finished off like a zero-wait-state cycle.

Control IGIDXR

If IGIDXR is in auto-increment mode (SVSR), then it will increment on the trailing edge of either an 8-bit I/O write to P3XR+5 or a 16-bit write to P3XR+(4-5); if the write was to a buffered port, then IGIDXR is incremented after the trailing edge of IBIOWIP#.

4. Existing Game Card Compatibility

The system control module 2 includes logic and registers needed for compatibility with existing game-card software. The circuit C is compatible with software written for native mode Ultrasound, MPU-401, Sound Blaster and AdLib. Logic circuits and timers for compatibility are designated generally as block 152 in FIG. 12. These include the following functions: (i) registers described in the register description part of this document; and (ii) two 8-bit timers, one having an 80 microsecond resolution and the other a 320 microsecond resolution; (iii) two general purpose registers; (iv) MPU-401 status emulation flags and control registers.

a. AdLib Timer 1 and Adlib Timer 2

AdLib Timer 1 is an 8-bit preloadable counter that increments to 0FFh before generating an interrupt. It is clocked by an 80 microsecond clock. AdLib Timer 2 is the same, except that it is clocked by a 320 microsecond clock. On the next clock after they reach OFFh, the interrupt becomes active and they are re-loaded with their programmed value (UAT1I and UAT2I). The interrupts are cleared and enabled by UASBCI[3:2]. Both timers can be changed to run off the 1 MHz clock by UASBCI[4]. These timers are also enabled by UADR[STRT1] and UADR[STRT2].

b. Auto-Timer Mode

It is possible to place the circuit C into auto-timer mode by writing to UASBCI[0]. This mode is used to emulate AdLib hardware. When in auto-timer mode, reads of UASRR provide the state of various flags instead of UASWR. When in auto-timer mode and UACWR has been set to 04h, the following changes take place: (1) write to UADR no longer cause interrupts; (2) writes to UADR are no longer latched in the simple register that is readable from that same address; and (3) writes to UADR are instead latched in a register that drives out various flags related to the control of the AdLib timers.

c. General Purpose Registers

Logic block 152 also includes two 8-bit general purpose registers that are used for MPU-401 emulation and to support other emulation software. The general purpose registers, referred to as UGP1I and UGP2I, can be located anywhere in the ISA 10-bit I/O address space via UGPA1I, UGPA2I, and ICMPTI[3:0]. Each register actually represents two registers: one that is read out to the application and one that is written in by the application. When the registers are written (by the application) at the emulation address, they may be enabled to generate an interrupt; they are subsequently read (by the emulation software that received the interrupt) via a back-door access location in the GUS Hidden Register Data Port (UHRDP). Writing to those same back-door locations, updates the general purpose registers associated with the read operation. This emulation protocol is schematically illustrated in FIG. 16*b*.

d. MPU-401 Emulation

Several controls have been added to the general purpose registers in support of MPU-401 emulation; the assumption is that there is an MPU-401 emulation TSR running concurrently with the application (typically game software). To match the MPU-401 card, the emulation address (UGPA1I, UGPA2I, and ICMPTI[3:0]) may be set to match the MIDI UART address. The two UART addresses can be swapped so that the receive/transmit data is accessed via P3X0R+0 and the control/status data is accessed via IVERI[M401]. Application writes to the general purpose registers cause interrupts (potentially NMIs). Emulation software captures the interrupts, reads the data in the emulation registers via the back door (UHRDP), and uses it to determine how to control the synthesizer. The MIDI commands may also be sent to the UART so that the application can be driven by the same interrupts and observe the same status as the MPU-401 card.

Figure 16C:
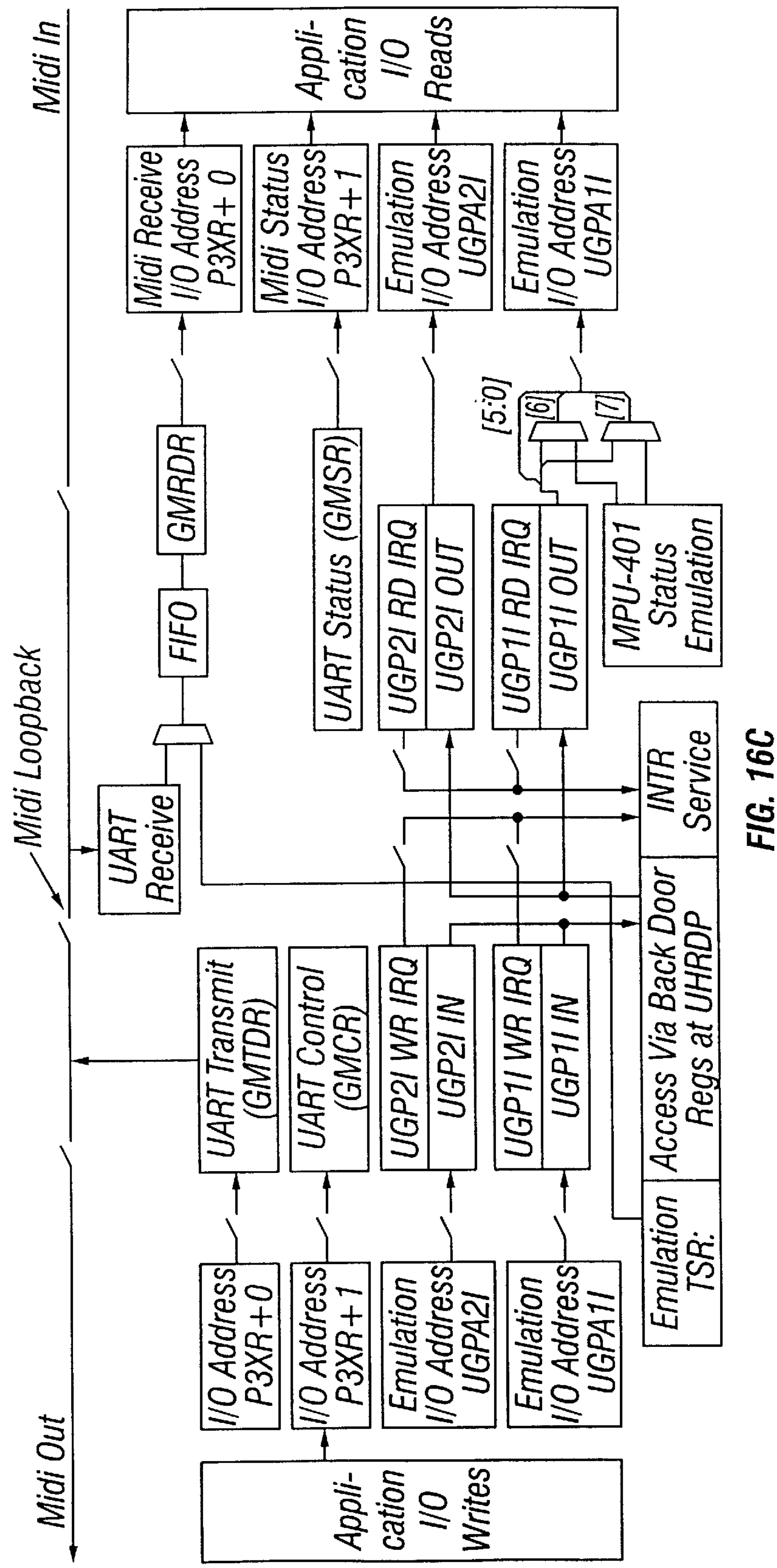
FIG. 16*c* is a schematic block diagram of circuit access possibilities for application software and emulation TSR programs.

FIG. 16*c* is a schematic block diagram showing the access possibilities for the application and the emulation TSR. The switch symbols are enables that are controlled by the IEMUAI and IEMUBI emulation control registers.

MPU-401 Status Emulation

Two MPU-401 status bits are generated, DRR# (Data Receive Ready, bit 6) and DSR# (Data Send Ready, bit 7), which are readable via UBPA1I. The intended meaning of these bits is as follows: DRR# becomes active (low) when the host (CPU) is free to send a new command or data byte to the UART; DSR# becomes active (low) when there is data available in the UART's receive data register. Note that the names of these bits are derived from the perspective of the MPU-401 hardware rather than the CPU. Selection between reading these bits and the actual data written to the emulation register comes from IEMUBI[5:4].

DRR# is set inactive (high) by the hardware whenever there is a write to either of the emulation registers via the emulation address (ICMPTI[3:0], UGPA1I, UGPA2I), if a write to that register is enabled. Writes to UGP1I[6] via the back door (UHRDP) also updates the state of this flag. This bit defaults to high at reset.

DSR# is set inactive (high) by the hardware when there is a read of UGP2I via the emulation address (ICMPTI[3:2], UGPA2I). Writes to UGP1I[7] via the back door (UHRDP) also update the state of this flag. This bit defaults to low at reset.

5. Plug-n-Play Logic

The system control module 2 includes registers and logic needed to implement the Plug and Play ISA (PNP) specification from Microsoft. There are several state machines within the PNP block of the circuit C (see discussion below); some of these utilize a clock that is derived from the 16.9 MHz. oscillator (C59N).

The circuit C includes two PNP-compliant logical devices. The AUDIO-functions logical device consists of most of the circuit C including the synthesizer, the codec, the ports, etc. The external function or CD-ROM logical device is associated with only the external functions.

a. PNP I/O Ports and Registers

In support of PNP, the circuit C provides a number of specialized registers. These are indexed via PIDXR and accessed via the read and write ports PNPRDP and PNPWRP.

b. Power-Up PNP Mode Selection

The reset signal latches the state of the output pin 76 (PNPCS, FIG. 6) at power-up to determine the PNP mode. If it is latched low, then the circuit C is assumed to be on a PNP-compliant card that contains a serial EEPROM 78

(PNP card mode). If it is latched high, then the circuit C is assumed to be on a system board that does not contain a serial EEPROM 78 (PNP-system mode).

In PNP-system mode, the Card Select Number (CSN) is assigned via a different method than that of the PNP standard (see PCSNBR). This is so the system board implementation can exist without the external serial EEPROM. If external decoding is selected (see the PIN SUMMARY section of the general description), then all PNP registers are accessible regardless of the PNP mode. Thus, in this mode, it is not necessary to assign a CSN or incorporate any of the PNP protocol into the software to obtain access to the PNP registers.

c. PNP State Machine

Figure 17:
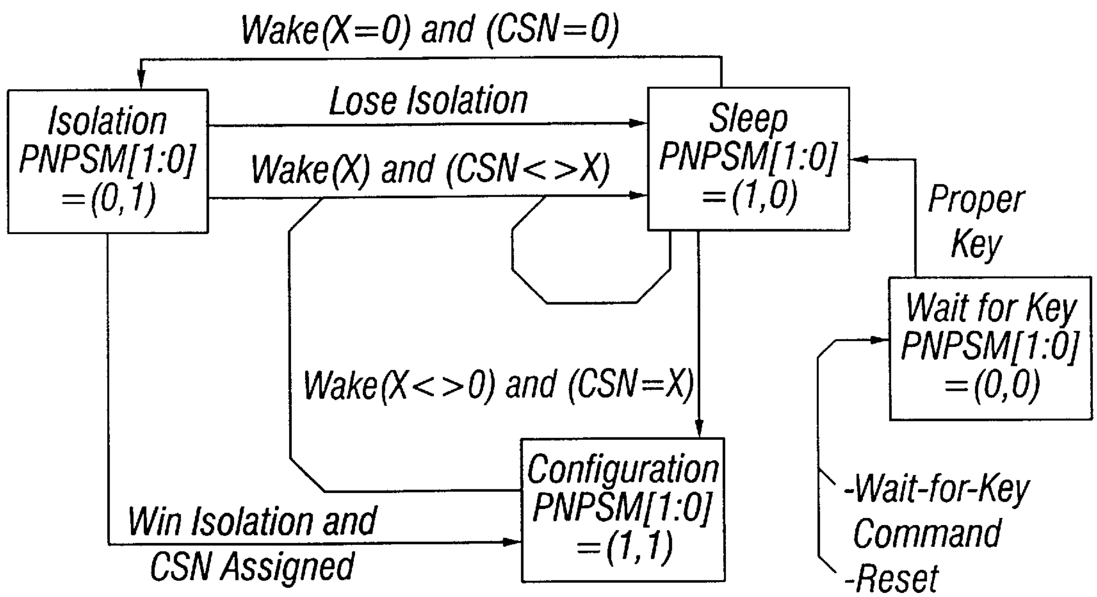
FIG. 17 is a schematic illustration of the Plug-n-Play state machine included within the circuit C.

Referring now to FIG. 17, PNP interface can be in one of four possible states: wait-for-key, isolation, configuration, and sleep. In FIG. 17, wake is the wake command, X is the data value associated with the command, and CSN is the current card select number, all as explained in the Plug And Play ISA specification. The output of the PNP state machine is PNPSM[1:0], as shown in the diagram.

Wait For Key

In this state, the PNP logic waits for a key of 32 specific bytes to be written to PIDXR. No PNP registers are available when in this state (except PIDXR for the key).

Isolation

In this state, PNP software executes a specific algorithm of IOR cycles to PISOCI to isolate each PNP card and assign it a distinct CSN. If the circuit C is in PNP-system mode, then reads of PISOCI always cause the part to "lose" the isolation and go into sleep mode.

Configuration

From this state PNP software can read all resource data from the PNP EEPROM 78, assigns the resources (I/O address space, IRQ numbers, and DMA numbers), and send specific PNP commands (such as "activate").

Sleep

In this mode, the PNP hardware is dormant.

d. Interface to the Serial EEPROM

When the audio logical devices is not activated (PUACTI [0]), then it is possible to access the PNP serial EEPROM 78. There are two modes of access—PNP-initialization and PNP-control—selected by PSEENI[0]. In PNP-initialization mode, data is automatically read out of the EEPROM based on the state of PNPSM[1:0] as follows:

TABLE XII

| PNPSM[1,0] | Description |
|---|---|
| 0,0 | Wait for key. No action required. |
| 0,1 | Isolation. The PNP serial identifier is read out of the serial EEPROM, one bit at a time, starting at address 000 of the PNP serial EEPROM. After each bit is read, the logic waits for two reads of PISOCI, before accessing the next bit (per the PNP isolation process). |
| 1,0 | Sleep. No action required. |
| 1,1 | Configuration. The serial EEPROM is read out one byte at a time starting at address 000. PRESSI is updated to indicate when each byte is ready to be read via PRESDI. |

Figure 18:
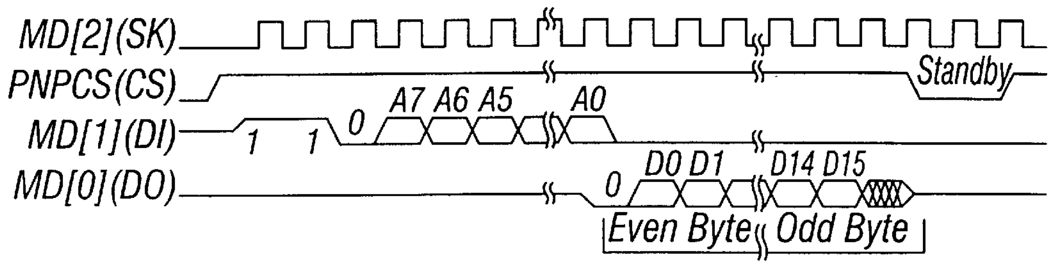
FIG. 18 is a timing diagram relating to reading serial EEPROM data from external circuitry relating to Plug-n-Play compatibility.
Figure 19:
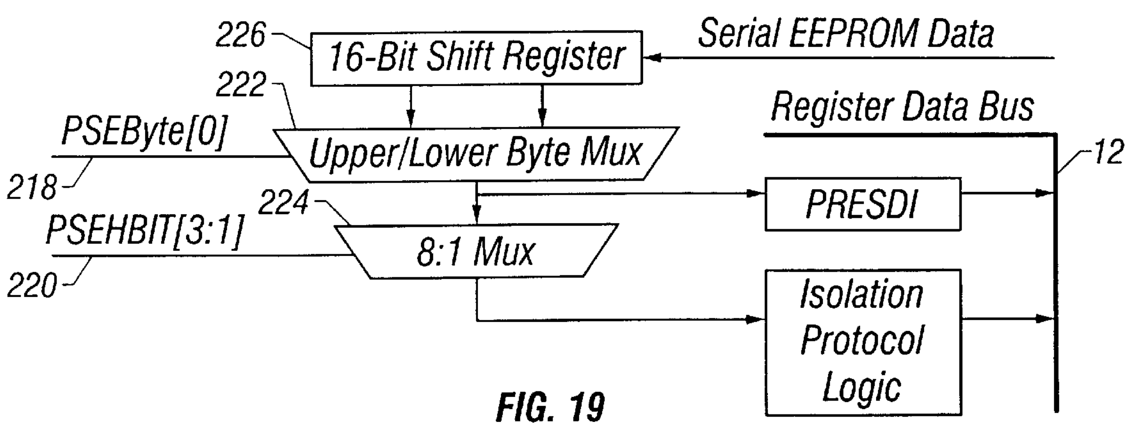
FIG. 19 is a schematic illustration of a circuit for facilitating PNP data transfer from external circuitry to the circuit C via the register data bus.

Referring now to FIG. 18, timing for reading the serial-EEPROM data is provided. Note that the data is required to enter the circuit C in the reverse order from what is standard for a serial EEPROM. Also, bits[7:0] represent the even byte (the first byte read via PRESDI) and bits[15:8] represent the odd byte. SK, the serial clock, is ICLK1M (see the CLOCKS description below), which is a frequency of 996 KHz.

In PNP-control mode the EEPROM pins are controlled directly via bits in PSECI.

e. Initiation Key and Linear Feedback Shift Register

Figure 20:
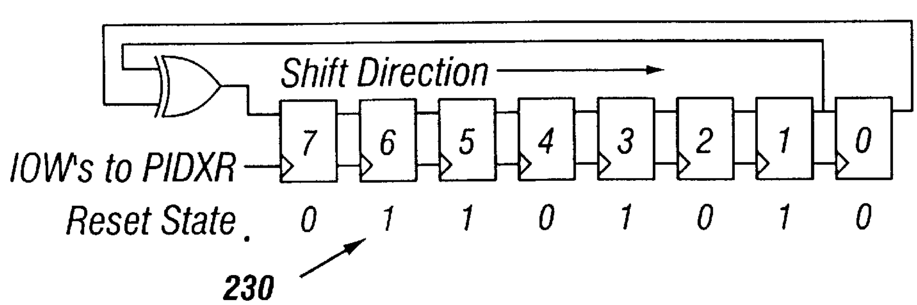
FIG. 20 is a schematic illustration of a linear feed back shift register necessary to implement an initiation key for access to Plug-n-Play registers.

Access to PNP registers is preceded by a hardware/software unlock mechanism that requires the implementation of a linear feedback shift register (LFSR). Implementation of the LFSR 230 is illustrated in FIG. 20. The unlock is complete after the software writes the following 32 values to PIDXR: 6A, B5, DA, ED, F6, FB, 7D, BE, DF, 6F, 37, 1B, 0D, 86, C3, 61, B0, 58, 2C, 16, 8B, 45, A2, D1, E8, 74, 3A, 9D, CE, E7, 73, 39. These values are internally calculated with LFSR 230. LFSR 230 is reset to 6Ah anytime the value written to PIDXR does not match the LFSR. If all 32 proper bytes are written to PIDXR, then the PNP state machine changes from Wait-For-Key mode to Sleep mode (See FIG. 17).

f. Isolation Mode

Figure 21:
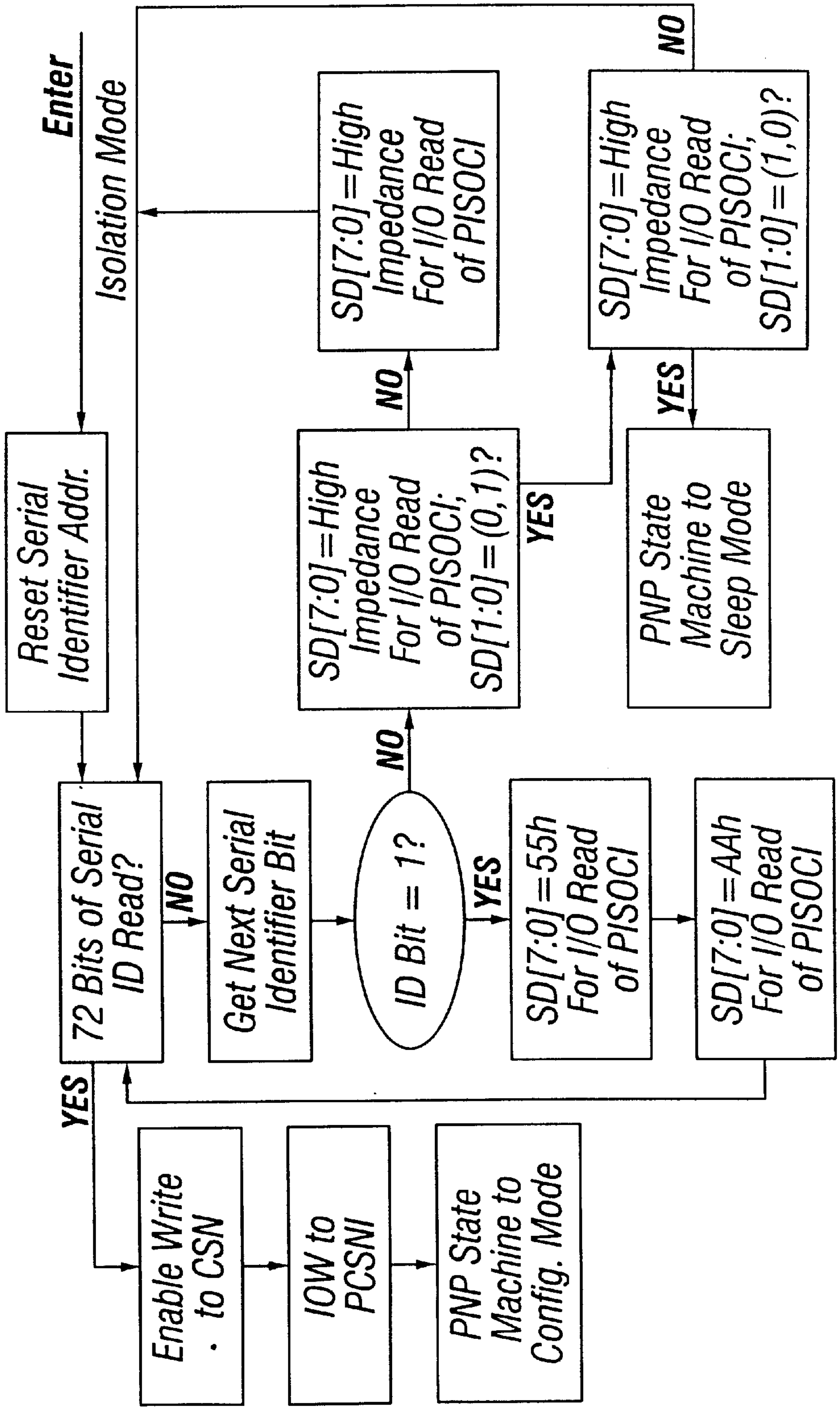
FIG. 21 is a flow chart illustrating the manner in which the Plug-n-Play circuitry associated with the circuit C transitions from isolation mode to either configuration mode or sleep mode.

When in Isolation mode, the data contained at the beginning of the serial EEPROM 78 is shifted in, one bit at a time, and used in the algorithm shown in FIG. 21.

The PNP specification allows for the last eight bits of the serial identifier, the checksum, to either be calculated or simply transferred from the serial EEPROM 78. These values are not calculated by the circuit C; they are transferred directly from the serial EEPROM 78. The algorithm of FIG. 21 enables transition from isolation mode to either configuration mode or sleep mode.

g. Card Select Number Register

The Plug-n-Play specification requires that a card select number (CSN) be assigned to all devices on the system bus, and that such number be accessible. In the circuit C, there is an 8-bit register, designated card select number back door (PCSNBR) where the card select number (CSN) is stored. The CSN is writeable when the PNP state machine is in Isolation mode. It can be read when the PNP state machine is in Configuration mode.

It is possible to write to the CSN without going through the normal PNP protocol by using the following procedure:

1. Place a pull-up resistor on PNPCS to place the card in PNP system mode at power-up.

2. While the AUDIO logical device is not active (PUACTI [0]=0), place the PNP state machine into Isolation mode.

3. Write the CSN to the Game Control Register, 201h.

h. Plug-n-Play Resource Requirement Map

An example of resources required for programming the PNP serial EEPROM 78 is provided in FIG. 22.

6. Interrupts and IRQ Channel Selection

There are several groups of signals associated with interrupts. They are:

TABLE XIII

| | |
|---|---|
| IAALSB | Interrupts associated with AdLib-Sound Blaster compatibility. |

TABLE XIII-continued

| | |
|---|---|
| IASYNTH | Interrupts associated with synthesizer functions. |
| IAMIDI | Interrupts associated with the MIDI transmit-receive port. |
| CIRQ | Interrupts associated with codec operation. |
| IACDROM | Interrupts associated with the external CD-ROM interface. |

These are combined into the three IRQ channel selection possibilities for the circuit C as follows:

```
Channel_1_IRQ = PUACTI[0]*UMCR[3]*IDECI[6]*
    ( ((/IDECI[7]*IACODEC) + IASYNTH)*/UMCR[4]
    + IAALSB*/UICI[7] + IAMIDI*UICI[6]);
Channe1_2_IRQ = PUACTI[0]*UMCR[3]*IDECI[5]*
    ( ((/IDECI[7]*IACIRQ) + IASYNTH)*UMCR[4] + IDECI[7]*CIRQ
    + UDCI[7]*UICI[6] + IAMIDI*/UICI[6]);
CD_ROM_IRQ = IACDROM * PRACTI[0] * IDECI[4];
```

The following equation shows how the above three equations are mapped to the IRQ pins (see FIG. 3), where "x" in IRQx specifies the IRQ number. The notation "(UICI[2:0]==IRQx)" should read "UICI[2:0] specifies IRQx".

```
IRQx = ((Channel_1_IRQ)*(UICI[2:0]==IRQx))
     + ((Channel_2_IRQ)*(UICI[5:3]==IRQx))
     + ((CD_ROM_IRQ)*(PRISI[3:0]==IRQx));
IRQx Enable = /ISUSPIP*PUACTI[0]*UMCR[3]*
     ( (IDECI[6]*(UICI[2:0]==IRQx)) +
(IDECI[5]*(UICI[5:3]==IRQx)) )
     + /ISUSPIP*PRACTI[0]*(PRISI[3:0]==IRQx) ;
```

The Non-Maskable Interrupt (NMI) function is controlled as follows (between being driven low and being high-impedance):

```
IOCHK# = 0;
IOCHK Enable = /ISUSPIP*PUACTI[0]*UMCR[3]*IDECI[4]*
    ( (UICI[2:0]=0) * ( ((/IDECI[7]*CIRQ) + IASYNTH)*/UMCR[4]
      + IAALSB*/UICI[7] + IAMIDI*UICI[6] )
    + (IAALSB*UICI[7]) ) ;
```

In the above equations and those that follow, note that a "/" preceding a variable or signal signifies logic not. The * signifies the AND function, + signifies the OR function and the "/", "*", and "+" are prioritized as first, second and third, respectively. The programmable bit fields and signals associated with the above equations are:

TABLE XIV

| Bit Field | Description |
|---|---|
| ISUSPIP | Suspend In Progress, as described in the POWER CONSUMPTION MODES section. |
| IDECI[7] | Send codec interrupts to interrupt channel 2 (and remove them from channel 1). |
| IDECI[6:4] | IRQ channel enables for channel 1 (bit 6), channel 2 (bit 5), and NMI (bit 4). |
| UMCR[4] | Send synth volume and loop interrupts to interrupt channel 2 (and remove them from channel 1). |
| UMCR[3] | Enables all IRQ and DRQ lines from the high-impedance state. |
| UICI[2:0] | Selects the IRQ number for interrupt channel 1. |
| UICI[5:3] | Selects the IRQ number for interrupt channel 2. |

TABLE XIV-continued

| Bit Field | Description |
|---|---|
| UICI[6] | Combines MIDI interrupts to interrupt channel 1 (and removes them from channel 2). |
| UICI[7] | Disables AdLib-Sound Blaster interrupts from channel 1 and generates NMIs instead. |
| UDCI[7] | Extra interrupt; used to force the channel 2 IRQ line active. |
| PUACTI[0] | AUDIO functions activate bit. |
| PRACTI[0] | External functions (e.g., CD-ROM) activate bit. |

Interrupt Events

The table in FIG. 23 provides data on all interrupt-causing events in the circuit C. Note that when the circuit C is in auto-timer mode and the UACWR has been written to a 04h, then the write to the UADR does not generate an interrupt.

7. DMA Channel Selection

The following are the signals used in the circuit C which are associated with DMA data transfer requests:

TABLE XV

| | |
|---|---|
| DRQMEM | DMA request for system memory to-from local memory transfers. |
| DRQPLY | DMA request for system memory to codec playback FIFO transfers. |
| DRQREC | DMA request for codec record FIFO to system memory transfers. |
| DRQCDR | DMA request from the external function (e.g., CD-ROM) interface. |

These are combined into the three DRQ channel selection possibilities for the circuit C as follows:

```
Channel_1_DRQ = PUACTI[0]*(DRQMEM + DRQREC +
        (UDCI[6]*DRQPLY) );
Channel_2_DRQ = PUACTI[0]*/UDCI[6]*DRQPLY;
CD_ROM_DRQ = PRACTI[0] * DRQCDR;
```

The following equation shows how the above three equations are mapped to the DRQ pins (see FIG. 3), where "x" in DRQx specifies the DRQ number. The notation "(UDCI[2:0]==DRQx)" should read "UDCI[2:0] specifies DRQx".

```
DRQx = ((Channel_1_DRQ)*(UDCI[2:0]==DRQx))
     + ((Channel_2_DRQ)*(UDCI[5:3]==DRQx))
     + ((CD_ROM_DRQ)*(PRDSI[2:0]==DRQx));
```

Enabling DRQs from High-Impedance

Here are the equations for the signals that enable the DRQ lines from high-impedance:

```
DRQx Enable = /ISUSPIP*PUACTI[0]*UMCR[3]*
      ( (UDCI[2:0]==DRQx)
      + (UDCI[5:3]==DRQx)*(/UDCI[6]) )
    + /ISUSPIP*PRACTI[0]*(PRDSI[2:0]==DRQx);
```

Driving the Data Bus During DMA

DMA reads of the circuit C will cause the system data bus to be driven only if the circuit C has set the DMA request signal; also, the circuit C will ignore all DMA writes if the acknowledge occurred without a DMA request.

DMA Rates

For DMA transfers between local and system memory, the rate of transfer is controlled by LDMACI[4:3]. The fastest rate for all DMA transfers allows about one-half to 1 microseconds from the end of the last DAK signal to the beginning of the next DRQ signal. This is incorporated by counting two edges of the ICLK2M, the 2 MHz clock.

8. Clocks

The circuit C has numerous internal clock requirements. This section of the description refers to all internal clocks which are generated from external crystals 16 and 18 (FIG. 1). Referring now to FIG. 24*a*, all of the clocks that are generated by this block off of crystal 16 are guaranteed to be steady (held high) when either oscillator is not valid and to start toggling again after the oscillator is stable. The logic is designed such that there is no possibility of glitching on these clocks while the oscillators are stabilizing. This is the purpose of the oscillator stabilization logic 232 in FIG. 24*a*. It is used: (1) to exit suspend mode; (2) to exit shut-down mode; and (3) to stabilize the oscillators following a software reset (PCCCI) in which the IC is in the shut-down mode. It is bypassed when the RESET pin becomes active.

In FIG. 24*a*, the IOSC16M signal is the input clock signal from the 16.9344 MHz clock 16. This clock signal is provided as an input clock signal to oscillator stabilization logic 232 via a control or gate signal on line 233. Gating logic 242 also generates an enable signal on line 235 to control the on/off state of clock 16.

As explained below, gating logic 242 provides an output ICLK16M signal via a buffer 237 which is used as the basic system clock for the circuit C, and a 16.9344 MHz output via buffer 239 which is utilized by logic block 241 to generate various clock signals of different frequencies for specific subcircuits or functions. Note that similar stabilization logic could be provided for crystal 18 if desired. In the present embodiment, crystal 18 provides a buffered 24 MHz output on line 234 in response to activation signal PPWRI (PWR24).

Oscillator Stabilization Logic

Figure 25:
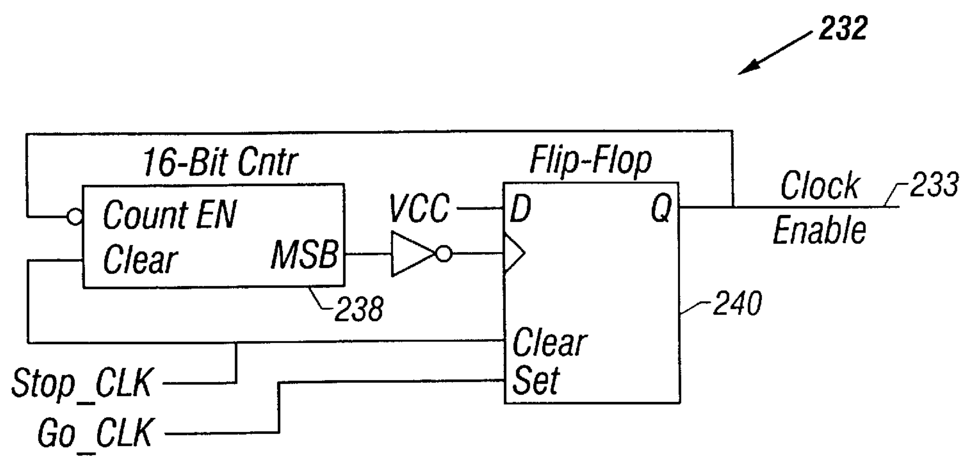
FIG. 25 is a schematic illustration of details of the clock oscillator stabilization logic of FIG. 24*a;*

Referring now to FIG. 25, the oscillator stabilization logic 232 consists of a 16-bit counter 238 that is clocked by oscillator 16, and a flip-flop 240 that controls the counter 238. The result is a gate to the gating logic 242 (FIG. 24*a*) that either allows the clock to pass or disables it glitch-free. The signal STOP_CLK for the 16.9 MHz. clock 16 clears counter 238 during suspend and shut-down modes. In the preferred embodiment, a software reset (PCCCI) requires that system reset PCARST# be held active for either 256 states or 64K states of clock 16 depending on whether the circuit C is in a shut-down mode (see discussion below). Logic counters within the stabilization logic 232 also provide control signals to implement the required delay. The signal GO_CLK sets control flip-flop 240 while the RESET pin is active. Once the circuit C exits suspend and shut-down mode, STOP_CLK becomes inactive, counter 238 clocks out 64K states, and the CLOCK_ENABLE output of the circuit 238 becomes active. STOP_CLK, GO_CLK signals are internally generated from logic circuits responsive to the status of power control registers and reset signals as described elsewhere herein.

Referring now to FIG. 24*b*, further details of the clock generation, control and stabilization circuitry are described. It should be noted that the logic and counters shown in FIG. 24*b* are intended to be an example of how the logic described could be implemented. Those of ordinary skill in the art will realize there are numerous variations which might be used without deviating from the functional specification.

System reset signal 430 is an external ISA bus signal. System reset 430 is asserted for at least ten milliseconds (thereby enabling PCARST#) to allow enough time for oscillators 16 and 18 to stabilize before signal PCARST# on line 431 goes inactive (high). Signal PCARST# forces most memory functions (registers, latches, flip-flops, bits in RAM) into the default state, causes all ISA-bus activity to be ignored and halts local memory cycles. System reset is provided as a GO-CLK asynchronous set signal 435 to flip-flop 240, which forces the Q-output high on line 233 to immediately enable gating logic 242, thereby enabling the 16 MHz clock signal. The 24 MHz clock is also enabled by reset since it is controlled by the PWR24 bit of register PPWRI which in turn is set high as its default state in response to the PCARST# signal.

Still referring to FIG. 24*b*, the PCCCI signal is an I/O mapped command from the PNP logic (software reset) controlled by the status of the PCCCI register. Assertion of PCCCI is provided on line 434 as an alternative source of signal PCARST#.

Still referring to FIG. 24*b*, suspend mode is entered in response to an active input from the Suspend# pin. For ease of reference, the suspend mode logic is shown in active-positive mode in FIG. 24*b*. An active input suspend signal is provided on line 446 and input to ORGATE 448 and ANDGATE 450. In response, ISUSPRQ becomes active at line 452 which activates modular signals I2LSUSPRQ and I2SSUSPRQ via gates 454 and 456, respectively. The suspend input on line 446 is also provided to a 2-bit delay counter 458 which provides an 80 μsecond delayed output to ORGATE 448 and ANDGATE 450. Delay circuit 458 is clocked by the ICLK12K internally generated clock signal provided on line 460. Consequently, after 80 μseconds ANDGATE 450 is enabled and generates suspend-in-progress signal ISUSPIP on line 462. This signal is provided to generate modular suspend-in-progress signals, as desired. For example, ISUSPIP is provided as an input to ORGATE 464 to generate a modular I2LSUSPIP signal for the local memory module of the circuit C, which is used to disable the 16.9 MHz clock signal used by the local memory module during normal operations.

ISUSPIP is also provided via ORGATE 467 and ORGATE 466 to ground oscillator 16 approximately 80 μseconds after ISUSPRQ has been asserted, and as a STOP_CLK input on line 436 to clear counter 238. Clearing counter 238 requires the oscillator 16 to stabilize after being enabled when the suspend signal is deactivated. Similarly, ISUSPIP is provided as an input to ANDGATE 468 via ORGATE 470 to disable the 24 MHz oscillator 18.

Various Clocks

The clock circuit of the system control module 2 provides various clocks for functions throughout the circuit C. Here is a summary:

TABLE XVI

| Signal Name | Frequency | Description | Divide |
|---|---|---|---|
| ICLK24M | 24.576 MHz. | One of the oscillators used by the codec | XTAL1 input |
| ICLK16M | 16.9344 MHz. | The main clock used throughout the circuit C | XTAL2 input |
| ICLK2M | 2.1168 MHz. | The serial transfer clock | ICLK16M ÷ 8 |
| ICLK100K | 100.8 KHz. | The codec timer clock | ICLK2M ÷ 21 |
| ICLK12K | 12.6 KHz. | AdLib timer 1 clock | ICLK100K ÷ 8 |
| ICLK3K | 3.15 KHz. | AdLib timer 2 clock, codec zero-crossing time-out clock | ICLK12K ÷ 4 |

TABLE XVI-continued

| Signal Name | Frequency | Description | Divide |
|---|---|---|---|
| ICLK1M | 996.14 KHz. | PNP serial EEPROM clock, AdLib timer test clock, DMA rate circuit | ICLK16M ÷ 17 |
| ICLK498K | 498.07 KHz. | MIDI UART clock (31.25 KHz. × 16) | ICLK1M ÷ 2 |

ICLK1M is implemented with a duty cycle of 9 clocks high and 8 clocks low to comply with the requirements of PNP serial EEPROM 78. All other clocks are implemented such that their duty cycle is a close to 50—50 as possible.

Test-Mode Requirements

When the chip is in test mode, the circuit for many of these clocks is bypassed (see register description below). Additionally, the 16.9 and 24.5 MHz clocks are directly controlled without the intervening logic or 64K state counters.

9. Power Consumption Modes

The circuit C has the ability to disable various blocks of logic from consuming very much current. It also can be in shut-down mode, wherein both oscillators are disabled, and in suspend mode, wherein both oscillators are disabled and most of the pins become inaccessible. Control for disabling various blocks and placing the circuit C in shut-down mode comes from programmable register PPWRI; suspend mode is controlled by the SUSPEND# pin (see FIG. 6). Suspend mode causes the I/O pins to change behavior as shown in the table:

TABLE XVII

| | |
|---|---|
| High-impedance such that no current is consumed | SD[15:0],IRQ[15,12,11,7,5,3,2], DRQ[7:5,3,1:0], IOCHK#, IOCS16#, IOCHRDY, EX_IRQ, EX_DAK#, EX_CS#, MIDITX, GAMIN[2], GAMIO[3:0], XTAL1I, XTAL2I |
| Inputs | SA[11:0], SBHE#, DAK[7:5,3,1:0]#, TC, IOR#, IOW#, AEN, EX_DRQ, MIDIRX, GAMIN[3,1:0] |
| Functional | RESET, SUSPEND#, C32KHZ, RAS#, BKSEL[3:0]#, GPOUT[1:0] |
| Forced high | ROMCS#, MWE#, XTAL1O, XTAL2O |
| Forced low | MA[10:0], MD[7:0], RA[21:20], RAHLD#, PNPCS |
| Analog high-impedance | MIC[L,R], AUX1[L,R], AUX2[L,R], LINEIN[L,R], MONOIN, LINEOUT[L,R], MONOOUT, CFILT, IREF |

The pins SA[11:6], SBHE#, DAK[7:5,3], and SD[15:8] have weak internal pull-up resistors; however, the power to these resistors can be disabled via IVERI[PUPWR] so that they do not drive voltage onlo the ISA bus during suspend mode. For those pins forced to a high-impedance state to prevent current consumption, a controlled buffer is provided internal to the pin. In suspend mode, this buffer is disabled and its output (the input to the circuit C) is grounded.

a. Register Controlled Low-Power Modes

Register PPWRI is a 7-bit register used to reduce the power being consumed by various blocks of logic within the circuit C and place it into shut-down mode. The table set forth in FIG. 26 describes what happens when various bits in register PPWRI are cleared or set. Each of the bits in PPWRI are defined such that they are low when in low-power mode.

The 100 microsecond timers referenced in FIG. 26 consist of two conventional timer circuits within logic block 158 (FIG. 12), each driven by ICLK100K (divide by 10). One of the timers is used to count out the going- to-low-power-state time and the other is used to count out the coming-out-of-low-power-state time. These same timers may be used for suspend mode as well.

Referring now to FIG. 24*b*, register PPWRI is schematically illustrated as register 472. Shut-down mode is activated in response to each bit of register 472 being cleared to a logic low state. The status of each of the bits from register 472 is provided as an inverted input to ANDGATE 474, which provides an output to timer 476 when all bits are low. After the appropriate 100 μsecond delay an output is provided at line 478 which disables (grounds) oscillator 16 via ANDGATE 480, provided that none of the bits from register 472 have changed state to a logic high in the interim delay. This status check is provided via ORGATE 482 which provides a second, enabling input to ANDGATE 480. The output of timer 476 is also provided as a STOP_CLK input to clear counter 238 of stabilization circuit 232 to provide an appropriate delay when exiting shut-down mode.

As noted elsewhere, the status of the PWR24 bit controls power to oscillator 18 via gate 468. Modular power modes are implemented in response to the status of individual bits within register 472 (PPWRI). For example, the status of bit 4 (PWRS) is provided as an input to counter circuit 484, ORGATE 486 and ANDGATE 488. These circuit elements provide a synthesizer suspend request signal 490 followed by a delayed synthesizer suspend in progress signal 492 which is also used to disable the synthesizer clock signals via gate 493. A similar delay and logic circuit 494 is provided for the local memory module. The remaining bits of register 472 control the status of various modules and portions of modules within the circuit C, as described elsewhere in this specification. Logic implementation of these functions is schematically illustrated in FIG. 24*b*.

FIG. 24*c* is a flow chart schematically representing the response of circuit C to suspend mode activation and deactivation. FIG. 24*d* is a flow chart illustrating the register-controlled low-power modes.

b. Suspend Mode

Figure 27:
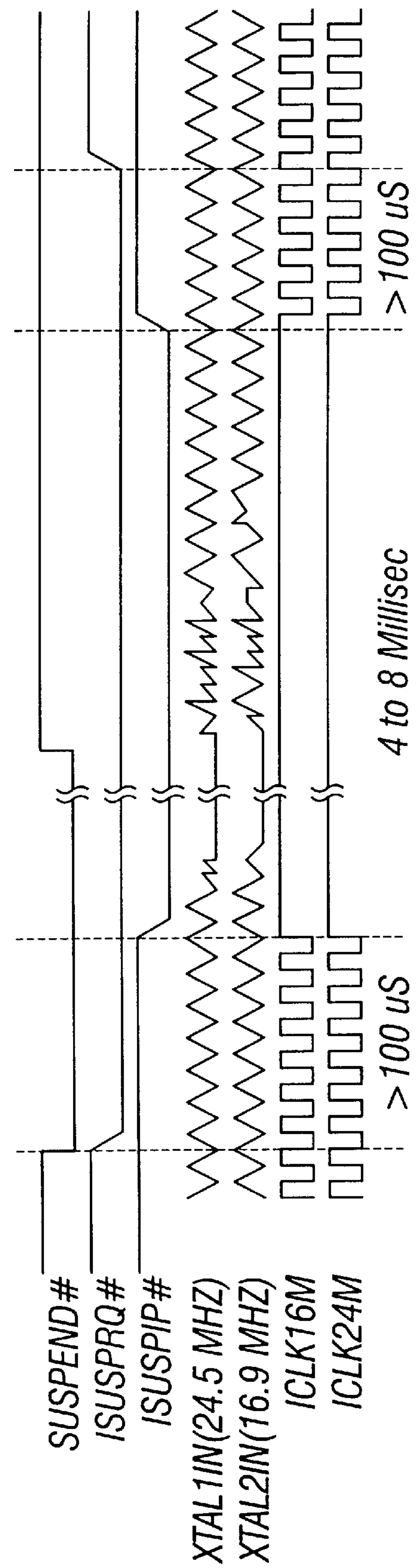
FIG. 27 is a timing diagram showing the relationship between various power conservation modes and signals and clock signals utilized by the circuit C.

When the SUSPEND# pin becomes active, the circuit C behaves similarly to when it is placed into shut-down mode. The timing diagram in FIG. 27 shows how the oscillators, clocks, and signals respond to the SUSPEND# pin. Note that in FIG. 27 the ICLK24M signal is illustrated as being stabilized, which is optional but not required. ISUSPRQ is logically ORed into I2LSUSPRQ and I2SSUSPRQ from the shut-down logic. ISUSPIP is logically ORed into I2LSUSPIP (see FIG. 26) If the circuit C is already in shut-down mode when SUSPEND# is asserted, then: (i) the I/O pins are changed to match the requirements of suspend mode shown above; and (ii) the codec analog circuitry is placed into low-power mode if it is not already in that mode. The CODEC analog circuitry is placed in low-power mode whenever SUSPEND# is active by providing the ISUSPIP signal on line 461 to ANDGATE via invertor 465.

After the ISUSPRQ# is asserted, the logic waits for greater than 80 microseconds before stopping the clocks to the rest of the circuit C and disabling the oscillators. Clock signals ICLK16M and ICLK24M from oscillators 16 and 18, respectively, are disabled (as well as re-enabled) such that there are no distortions or glitches; after they go into one of their high phases, they never go back low. After SUSPEND# is deactivated, the oscillators are re-enabled, but clock signal ICLK16M does not toggle again until oscillator 16 has stabilized, 4 to 8 milliseconds later; this occurs after the oscillator 16 has successfully clocked 64K times. After ICLK16 has been toggling for at least 80 microseconds, the ISUSPRQ# signal is de-asserted to allow the logic in the rest of the circuit C to operate. All of the ISA bus pins, and many of the other pins, are disabled while ISUSPRQ# is active. It is not possible to access the circuit C via the ISA bus while ISUSPRQ# is active; therefore, software must delay for about 10 milliseconds after SUSPEND# is released before attempting to access the circuit C. ISUSPIP (suspend in progress) is active during the time when the internal clocks are not valid; it is used to change the behavior of the I/O pins in the Local Memory Control module per the suspend requirements (suspend-mode refresh).

10. Reset

There are two main sources of reset: (1) assertion of the RESET pin and (2) the I/O mapped command for reset from the PNP logic (PCCCI). Both generate long pulses over the PCARST# signal. There is also a reset of the synthesizer module 6 and Gravis Ultrasound functions, caused by a write to Reset Register (URSTI). There is also a reset for the MIDI interface controlled by bits in GMCR.

PCARST#

PCARST# is an internally generated signal which forces most memory functions in the circuit C—registers, latches, flip-flops, bits of RAM—into their default state. While it is active, all ISA-bus activity is ignored and no local memory cycles take place. PCARST# is generated as a logical OR of the reset from the RESET pin and the software reset (PCCCI) described below. The RESET pin is required to be asserted for at least 10 milliseconds, which provides enough time for the oscillators to stabilize before PCARST# becomes inactive. If the software reset occurs when the IC is in shut-down mode, PCARST# becomes active and the oscillator stabilization logic counts through 64K states before releasing PCARST#. If the software reset occurs when the IC is not in shut-down mode, then PCARST# becomes active for 256 16.9 MHz clocks (about 15 microseconds). While PCARST# is active, all the 16.9 MHz and 24.5 MHz clocks are passed onto the other blocks in the IC; however, the various divide-down clocks shown in the CLOCKS section above do not toggle because the divide-down circuitry used to generate them is also reset.

RESET-Pin-Only Functions

The following items are affected by the RESET pin, but not by PCARST#: the state of the I/O pins that are latched at the trailing edge of reset, the PCSNI, PSRPAI, and PNPSM[1:0] registers and state machine which have there own specific reset requirements, the test control register (ITCI), and control for the oscillator stabilization logic (which is used to count out software resets). All other functions are reset into their default state.

The Software Reset, PCCCI

The software reset holds PCARST# active while the 16.9 MHz oscillator is forced to clock through either 256 states (if not shut-down is in progress or if ITCI[BPOSC] is active) or 64K states.

Synthesizer RAM block

After PCARST# becomes inactive, the synthesizer logic (see discussion below) will sequence through all 32 voice-RAM blocks to clear them out. This will take about 22 microseconds.

External Function Interface

When PCARST# is active, the pins RAS# and ROMCS# both become active (RAS#=ROMCS#=0). This is the only way that this situation can occur. When it does occur, it can be decoded by the external function (e.g., CD-ROM) to determine that reset is active.

B. System Control PIN Summary

The pins set forth in FIG. 28 are associated with the system bus interface.

C. System Control Register Overview

In the following register definitions, RES or RESERVED specifies reserved bits. All such fields must be written with zeros; reads return indeterminate values; a read-modify-write operation can write back the value read.

1. P2XR Direct Registers a. Mix Control Register (UMCR)

Address: P2XR+0 read, write

Default: 03h

See IVERI[HRLEN#] for a description of how this register controls access to the hidden registers.

| 7 | 6 | 5 | 4 | 3 | 2 | 1 | 0 |
|---|---|---|---|---|---|---|---|
| RES | CRS | MLOOP | GF122 | IQDMA | ENMIC | ELOUT | ENLIN |

| | |
|---|---|
| CRS | Control Register Select. If URCR[2:0] is set to 0, then this bit selects between indexing the Interrupt Control Register (UICI) and the DMA Control Register (UDCI). 1=UICI; 0=UDCI. |
| MLOOP | MIDI Loop Back. A logical 1 causes MIDITX to loop into MIDIRX. This does not block the transfer of data out of the MIDITX line; it does, however, block data reception via MIDIRX. |
| GF122 | Channel Synthesizer Interrupts. A logical 1 causes (1) the ORing of all the synthesizer and CODEC interrupts into the selected channel 2 IRQ pin and (2) the masking of synthesizer interrupts to the selected channel 1 IRQ pin. |
| IQDMA | IRQ and DMA Enable. A logical 1 enables the IRQ and DRQ pins (for audio functions only; does not affect the selected IRQ and DRQ lines for the external device controlled by the EX_IRQ and EX_DRQ pins. A logical 0 forces all IRQ and DRQ pins into the high-impedance mode (for audio functions only). |
| ENMIC | Enable Mono and Stereo Microphone Input. A logical 0 causes both the mono and stereo microphone inputs to the part the be disabled (no sound). |
| ELOUT | Enable Line Out. A logical 1 causes the stereo line-out outputs to be disabled (no sound). This switch is after all enables and attenuators in the codec module. |
| ENLIN | Enable Line In. A logical 1 causes the stereo line-in inputs to be disabled (no sound). This switch is before all enables and attenuators in the codec module. |

b. Sound Blaster 2X6 Register (U2X6R)

Address: P2XR+6 write

A write to this address sets the 2X6IRQ bit in the AdLib Status Register (UASRR). No data is transferred or latched at this address.

c. IRQ Status Register (UISR)

Address: P2XR+6 read

Default: 00h (after initialization)

This register specifies the cause of various interrupts.

| 7 | 6 | 5 | 4 | 3 | 2 | 1 | 0 |
|---|---|---|---|---|---|---|---|
| DMATC | VOLIRQ | LOOIRQ | ADIRQ | ADT2 | ADT1 | MIDIRX | MIDITX |

| | |
|---|---|
| DMATC | DMA Terminal Count IRQ. A high indicates that the ISA-bus terminal count signal, TC, has become active as a result of DMA activity between system and local memory. The flip-flop that drives this bit is cleared by a read of LDMACI. It is ORed into the interrupt associated with the synthesizer. If TC interrupt is not enabled (LDMACI[5]), then this will be read as inactive, even if the interrupt's flip-flop has been set. |
| VOLIRQ | Volume Loop IRQ. A logical 1 indicates that the volume ramp for one of the voices reached an end point. This bit will be cleared after the General Index Register (IGIDXR) is written with 8Fh, the value to access the synthesizer voice interrupt request register, SVII. |
| LOOIRQ | Address Loop IRQ. A logical 1 indicates that the local memory address of one of the voices has reached an end point. This bit will be cleared after the General Index Register (IGIDXR) is written with 8Fh, the value to access SVII. This bit is enabled (but not cleared) by URSTI[2]. |
| ADIRQ | AdLib-Sound Blaster Register IRQ. This is the OR of the write-to-UADR interrupt bit (set high by a write to UADR), the write-to-U2X6R interrupt bit (set by a write to U2X6R), and the write-to-UI2XCR interrupt bit (set by a write to UI2XCR). The flip-flop that drives the UADR interrupt is enabled when UASBCI[1] is high and asynchronously cleared when UASBCI[1] is low; the other two bits are enabled when UASBCI[5] is high and asynchronously cleared when UASBCI[5] is low. ADIRQ is ORed into the IRQ associated with AdLib-Sound Blaster. |
| ADT2 | AdLib Timer 2. This bit is set high when AdLib Timer 2 rolls from FF to the preload value, UAT2I. It is cleared and disabled by UASBCI[3]. The flip-flop that drives this bit is ORed into the interrupt associated with AdLib-Sound Blaster and is also readable in UASRR[1]. |
| ADT1 | AdLib Timer 1. This bit is set high when Adliv Timer 1 rolls from FF to the preload value, UAT1I. It is cleared and disabled by UASBCI[2]. The flip-flop that drives this bit is ORed into the interrupt associated with AdLib-Sound Blaster and is also readable in UASRR[2]. |
| MIDIRX | MIDI Receive IRQ. A logical 1 indicates the MIDI Receive DATA Register contains data. It is cleared by reading GMRDR. |
| MIDITX | MIDI Transmit IRQ. A logical 1 indicates the MIDI Transmit Data Register is empty. It is cleared by writing to GMTDR. |

d. AdLib Command Read and Write Register (UACRR, UACWR)

Address: P2XR+0Ah read (UACRR); P2XR+08h and 388h write (UACWR)

Default: 00h

This register is used to emulate AdLib operation. This register is written by AdLib application software and is read by AdLib emulation software in order to program the internal synthesizer to duplicate the AdLib sound.

e. AdLib Status Read and Write Register (UASRR, UASWR)

Address: P2XR+08h and 388h read (UASRR); P2XR+0Ah write (UASWR)

Default: 00h

When not in auto-timer mode, this is a read-write register with different values for the read and write addresses. In auto-timer mode (UASBCI[0]=0), writes to this register are latched but not readable; reads provide the following status information:

| 7 | 6 | 5 | 4 | 3 | 2 | 1 | 0 |
|---|---|---|---|---|---|---|---|
| OR56 | T1M | T2M | 2XCIRQ | 2X6IRQ | T1NM | T2NM | DIRQ |

| | |
|---|---|
| OR56 | OR of bits 5 and 6. This bit represents the logical OR of bits 5 and 6 of this register. |
| T1M | Timer 1, Maskable. This bit is set high when AdLib Timer 1 rolls from FF to the preload value, UAT1I. This bit is cleared by writing to UADR[AIRST]. This bit will not become active if the AdLib Timer 1 Mask is set (UADR[MT1]). |
| T2M | Timer 2, Maskable. This bit is set high when AdLib Timer 2 rolls from FF to the preload value, UAT2I. This bit is cleared |

-continued

| | |
|---|---|
| | by writing to UADR[AIRST]. This bit will not become active if the AdLib Timer 2 Mask is set (UADR[MT2]). |
| 2XCIRQ | Write to 2xC Interrupt. This is the write to UI2XCR interrupt bit, set high by a write to UI2XCR. The flip-flop driving this bit is enabled when UASBCI[5] is high and asynchronously cleared when UASBCI[5] is low. |
| 2X6IRQ | Write to 2x6 Interrupt. This is the write to U2X6R interrupt bit, set high by a write to UI2XCR. The flip-flop driving this bit is enabled when UASBCI[5] is high and asynchronously cleared when UASBCI[5] is low. |
| T1NM | Timer 1, Non-Maskable. This bit is set high when AdLib Timer 1 rolls from FF to the preload value, UAT1I. It is cleared and disabled by UASBCI[2]. The flip-flop that drives this bit is ORed into the interrupt associated with AdLib-Sound Blaster and is also readable in UISR[2]. |
| T2NM | Timer 2, Non-Maskable. This bit is set high when AdLib Timer 2 rolls from FF to the preload value, UAT2I. It is cleared and disabled by UASBCI[3]. The flip-flop that drives this bit is ORed into the interrupt associated with AdLib-Sound Blaster and is also readable in UISR[3]. |
| DIRQ | Data IRQ. This is the write-to-UADR interrupt bit, set high by a write to UADR. The flip-flop that drives this bit is enabled when UASBCI[1] is high and asynchronously cleared when UASBCI[1] is low. It is ORed into the interrupt associated with AdLib-Sound Blaster and is also readable in UISR[4]. |

f. AdLib Data Register (UADR)

Address: P2XR+9 and 389h read, write

Default: 00h

This register performs AdLib-compatibility functions based on the state of various bits as follows:

| Case | Condition | Result |
|---|---|---|
| 1 | /((UASBCI[0]=0)* (UACWR=04h)) | UADR behaves like a simple read-write register that is accessible via two different I/O addresses. Writes cause interrupts (see UISR[ADIRQ]). |
| 2 | (UASBCI[0]=0)* (UACWR=04h) | Writes to UADR are disabled and no interrupt is generated; AdLib timer emulation functions are written instead of UADR. Reads provide whatever data was last latched in case 1. |

For case 2, the following AdLib timer emulation bits are written. All of these bits also default to low after reset. Note that when the MSB is set high, the other bits do not change. When IVERI[RRMD] is active, the following bits are readable from this address, regardless of the state of UASBCI[0] or UACWR.

| 7 | 6 | 5 | 4 | 3 | 2 | 1 | 0 |
|---|---|---|---|---|---|---|---|
| AIRST | MT1 | MT2 | RES | RES | RES | STRT2 | STRT1 |

| | |
|---|---|
| AIRST | AdLib IRQ reset. When set to a logical 1, the flip-flops driving UASRR[T1M] and UASRR[T2M] will be cleared; this bit is automatically cleared after UASRR[T1M] and UASRR[T2M] are cleared. Also, when this bit is written high, the other four bits of this register are not altered; when this bit is written as low, the other bits of this register are latched. |
| MT1 | Mask Timer 1. When high, the flip-flop that drives UASRR[T1M] is disabled from becoming active. |
| MT2 | Mask Timer 2. When high, the flip-flop that drives UASRR[T2M] is disabled from becoming active. |
| STRT2 | Start Timer 2. When low, value found in UAT2I is loaded into AdLib timer 2 with every 320 microsecond rising clock edge. When high, the timer increments with every 320 microsecond rising clock edge; on the next clock edge after the timer reaches FFh, UAT2I is again loaded into the timer. |
| STRT1 | Start Timer 1. When low, value found in UAT1I is loaded into AdLib timer 1 with every 80 microsecond rising clock edge. When high, the timer increments with every 80 microsecond rising clock edge; on the next clock edge after the timer reaches FFh, UAT1I is again loaded into the timer. |

g. GUS Hidden Register Data Port (UHRDP)

Address: P2XR+0Bh write;

This is the port through which the hidden registers are accessed. Note: see IVERI[HRLEN#] for a description of how access to the hidden registers may be restricted.

h. Sound Blaster Interrupt 2XC Register (UI2XCR)

Address: P2XR+0Ch read, write

Default: 00h

Writes to this simple read-write register cause an interrupt. This register can also be written to via U2XCR, through which no interrupt is generated. The interrupt is cleared by writing UASBCI[5]=0.

i. Sound Blaster 2XC Register (U2XCR)

Address: P2XR+0Dh write

Default: 00h (after initialization)

This provides access to the Sound Blaster Interrupt 2xC Register (UI2XCR) without generating an interrupt.

j. Sound Blaster Register 2XE (U2XER)

Address: P2XR+0Eh read, write

Default: 00h

This is a simple read-write register used for Sound Blaster emulation. I/O reads of this register cause interrupts (if enabled).

k. Register Control Register (URCR)

Address: P2XR+0Fh write, read (if IVERI[RRMD] is active)

Default: 0000 0000

Note: When IVERI[RRMD] is active, this register becomes readable; if IVERI[RRMD] is not active, then reads from this address provide the data in USRR.

| 7 | 6 | 5 | 4 | 3 | 2 1 0 |
|---|---|---|---|---|---|
| IQ2XE | EGPRA | TG2XC | GP2IRQ | GP1IRQ | RS[2:0] |

| | |
|---|---|
| IQ2XE | Enable interrupts caused by reads of U2XER. A logical 1 causes interrupts to be generated by reads of U2XER. These are logically ORed with the Sound Blaster-AdLib interrupts. |
| EGPRA | Enable General Purpose Register Access. A logical 1 enables accesses to the general purpose registers through the addresses specified by ICMPTI[3:0], UGPA1I, and UGPA2I. |
| TG2XC | Toggle bit 7 of 2xC. A logical 1 causes UI2XCR[7] to toggle with each I/O read of that register. |
| GP2IRQ | General-purpose register 2 interrupt. A logical 1 enables the interrupt caused by either a read or write to General-purpose register 2 via the address specified by ICMPTI[3:2] and UGPA2I. The interrupt is logically ORed with the Sound Blaster/AdLib interrupt. Accesses to this register via UHRDP, the back door, do not cause an interrupt. |
| GP1IRQ | General-purpose register 1 interrupt. A logical 1 enables the interrupt caused by either a read or write to General-purpose |

-continued

| | |
|---|---|
| | register 1 via the address specified by ICMPTI[1:0] and UGPA1I. The interrupt is logically ORed with the Sound Blaster/AdLib interrupt. Accesses to this register via UHRDP, the back door, do not cause an interrupt. |
| RS[2:0] | Register selector. This field selects which register will be accessed via writes to the Hidden Register Data Port (UHRDP).<br>0 = DMA and Interrupt Control Registers (UDCI and UICI).<br>1 = General Purpose Register 1 Back Door (UGP1I).<br>2 = General Purpose Register 2 Back Door (UGP2I).<br>3 = General Purpose Register 1 Address [7:0] (UGPA1I).<br>4 = General Purpose Register 2 Address [7:0] (UGPA1I).<br>5 = Clear IRQs (UCLR2I).<br>6 = Jumper register (UJMPI). |

l. Status Read Register (USRR)

Address: P2XR+0Fh read

Default: 01h

This register provides the state of various interrupts. These are all cleared by a write to the UCLRII even if multiple bits are active at the same time. Note: When IVERI[RRMD] is active, the data in this register is not accessible.

| 7 | 6 | 5 | 4 | 3 | 2 | 1 | 0 |
|---|---|---|---|---|---|---|---|
| IQ2XE | IQGP2R | IQGP2W | IQGP1R | IQGP1W | PURES | IQDMA | ENJMP |

| | |
|---|---|
| IQ2XE | 2xE Interrupt. A logical 1 indicates that a read of the U2XER caused an interrupt. |
| IQGP2R | General Purpose Register 2 Read Interrupt. A logical 1 indicates that a read of General Purpose Register 2 via the address specified by UCMPTI[3:2] and UGPA2I caused an interrupt. |
| IQGP2W | General Purpose Register 2 Write Interrupt. A logical 1 indicates that a write of General Purpose Register 2 via the address specified by UCMPTI[3:2] and UGPA21 caused an interrupt. |
| IQGP1R | General Purpose Register 1 Read Interrupt. A logical 1 indicates that a read of General Purpose Register 1 via the address specified by UCMPTI[1:0] and UGPA1I caused an interrupt. |
| IQGP1W | General Purpose Register 1 Write Interrupt. A logical 1 indicates that a write of General Purpose Register 1 via the address specified by UCMPTI[1:0] and UGPA1I caused an interrupt. |
| PURES | Always reads as low. Is not writeable. |
| IQDMA | Contains the status of the IRQ/DMA enable bit, UMCR[3]. |
| ENJMP | Always reads as high. Is not writeable. |

2. URCR[2:0], UHRDP Indexed Registers a. DMA Channel Control Register (UDCI)

Address: P2XR+0Bh read, write; indexes UMCR[6]=0 and URCR[2:0]=0; also writes to PUD1SI modify the DMA1 [2:0] field and writes to PUD2SI modify the DMA2[2:0] field. The ability to alter bits [5:0] through this register can be disabled via ICMPTI[4]. Note: see IVERI[HRLEN#] for a description of how access to this register is restricted.

Default: 00h

| 7 | 6 | 5 | 4 | 3 | 2 | 1 | 0 |
|---|---|---|---|---|---|---|---|
| EXINT | CMBN | DMA2[2:0] | | | DMA1[2:0] | | |

-continued

| | | |
|---|---|---|
| EXINT | Extra Interrupt. When both interrupt sources are combined via UICI[6], setting this bit high drives the IRQ line selected by the channel 2 interrupt selection bits UICI[5:3]. | |
| CMBN | Combine DMA channels. A logical 1 combines both DMA channels using the channel selected DMA1[2:0]. | |
| DMA2[2:0] | DMA select channel 2 (codec play): | |
| | 0=no DMA | 4=DRQ/DAK6 |
| | 1=DRQ/DAK1 | 5=DRQ/DAK7 |
| | 2=DRQ/DAK3 | 6=DRQ/DAK0 |
| | 3=DRQ/DAK5 | |
| DMA1[2:0] | DMA select channel 1 (system memory to local memory and codec record): | |
| | 0=no DMA | 4=DRQ/DAK6 (16-bit) |
| | 1=DRQ/DAK1 (8-bit) | 5=DRQ/DAK7 (16-bit) |
| | 2=DRQ/DAK3 (8-bit) | 6=DRQ/DAK0 (8-bit) |
| | 3=DRQ/DAK5 (16-bit) | |

b. Interrupt Control Register (UICI)

Address: P2XR+0Bh read, write; indexes UMCR[6]=1 and URCR[2:0]=0; also writes to PUI1SI modify the IRQ1[2:0] field and writes to PUI2SI modify the IRQ2[2:0] field. The ability to alter bits [5:0] through this register can be disabled via ICMPTI[4].

Default: 07h

Note: see IVERI[HRLEN#] for a description of how access to this register is restricted.

| 7 | 6 | 5 | 4 | 3 | 2 | 1 | 0 |
|---|---|---|---|---|---|---|---|
| ALSB | CMBN | IRQ2[2:0] | | | IRQ1[2:0] | | |

| | |
|---|---|
| ALSB | AdLib/Sound Blaster to NMI. A logical 1 causes IOCHK# (NMI) to be selected for Sound Blaster and AdLib "iaalsb" from the disables iaalsb from going to the IRQ selected by the Channel 1 selection bits (UICI[2:0]). |

-continued

| | |
|---|---|
| CMBN | Combine interrrupt channels. A logical 1 combines both interrupt sources to the IRQ selected by IRQ1[2:0] |
| IRQ2[2:0] | Channel 2 (MIDI) IRQ selection:<br>0=No Interrupt 4=IRQ7<br>1=IRQ2 5=IRQ11<br>2=IRQ5 6=IRQ12<br>3=IRQ3 7=IRQ15 |
| IRQ1[2:0] | Channel 1 (codec, synthesizer, Sound Blaster, and AdLib) IRQ selection:<br>0=IOCHK# 4=IRQ7<br>1=IRQ2 5=IRQ11<br>2=IRQ5 6=IRQ12<br>3=IRQ3 7=IRQ15 |

c. General Purpose Register 1 (UGP1I)

Address: P2XR+0Bh read/write; index URCR[2:0]=1

Default: 00h

General purpose register 1 consists of two 8-bit registers, UGP1I IN and UGP1I OUT, used for AdLib, Sound Blaster, and MPU-401 compatibility; it does not control any signals of the circuit C. They are accessed by a combination of this address (UHRDP) and the address specified by UCMPTI [1:0] and UGPA1I (the emulation address). UGP1I IN is written via the emulation address and read via UHRDP. UGP1I OUT is read via the emulation address and written via UHRDP. Accesses to these registers via the emulation address result in interrupts (if enabled). Note: see IVERI [HRLEN#] for a description of how access to this register is restricted.

d. General Purpose Register 2 (UGP2I)

Address: P2XR+0Bh read/write; index URCR[2:0]=2

Default: 00h

General purpose register 2 consists of two 8-bit registers, UGP2I IN and UGP2I OUT, used for AdLib, Sound Blaster, and MPU-401 compatibility; it does not control any signals of the circuit C. They are accessed by a combination of this address (UHRDP) and the address specified by UCMPTI [3:2] and UGPA2I (the emulation address). UGP2I IN is written via the emulation address and read via UHRDP. UGP2I OUT is read via the emulation address and written via UHRDP. Accesses to these registers via the emulation address result in interrupts (if enabled). Note: see IVERI [HRLEN#] for a description of how access to this register is restricted.

e. General Purpose Register 1 Address (UGPA1I)

Address: P2XR+0Bh write; index URCR[2:0]=3

Default: 00h

This register controls the address through which general-purpose register 1 is accessed. The 8 bits written become bits [7:0] of the emulation address for UGP1I; emulation address bits [9:8] are specified by ICMPTI[1:0]. Note: see IVERI [HRLEN#] for a description of how access to this register is restricted.

f. General Purpose Register 2 Address (UGPA2I)

Address: P2XR+0Bh read, write; index URCR[2:0]=4

Default: 00h

This register controls the emulation address through which general-purpose register 2 is accessed. The 8 bits written become bits [7:0] of the emulation address for UGP2I; emulation address bits [9:8] are specified by ICMPTI[3:2]. Note: see IVERI[HRLEN#] for a description of how access to this register is restricted.

g. Clear Interrupt Register (UCLRII)

Address: P2XR+0Bh write; index URCR[2:0]=5

Writing to this register causes all the interrupts described in the USRR to be cleared. Note:see IVERI[HRLEN#] for a description of how access to this register is restricted.

h. Jumper Register (UJMPI)

Address: P2XR+0Bh read, write; index URCR[2:0]=6

Default: 06h

Note: see IVERI[HRLEN#] for a description of how access to this register is restricted.

| 7 | 6 | 5 | 4 | 3 | 2 | 1 | 0 |
|---|---|---|---|---|---|---|---|
| RES | RES | RES | RES | RES | ENJOY | ENMID | RES |

| | |
|---|---|
| ENJOY | Enable joystick. A logical 1 enables the game port address decode located at 201h. |
| ENMID | Enable MIDI. A logical 1 enables the MIDI address decodes located at P3XR+0 and P3XR+1. |

3. P3XR Direct Registers a. General Index Register (IGIDXR)

Address: P3XR+3 read, write

Default: 00h

This register specifies the indexed address to a variety of registers within the circuit C. The data ports associated with this index are I8DP and I16DP. When in auto-increment mode (SVSR[7]), the value in this register is incremented by one after every I/O write to either I8DP or I16DP (but not 8-bit writes to the low byte of I16DP).

b. General 8/16-Bit Data Port (I8DP, I16DP)

Address: P3XR+5 for I8DP, P3XR+4-5h for I16DP, read, write

These are the data ports that are used to access a variety of registers within the circuit C. 8-bit I/O accesses to P3XR+5 are used to transfer 8-bit data. 16-bit I/O accesses to P3XR+4 are used to transfer 16-bit data. It is also possible to transfer 16-bit data by using an 8-bit I/O access to P3XR+4 followed by an 8-bit access to P3XR+5. The index associated with these ports is IGIDXR. When in auto-increment mode (SVSR[7]), the value in IGIDXR is incremented by one after every I/O write to either I8DP or I16DP (but not 8-bit writes to the low byte of I16DP, P3XR+4).

4. IGIXR, I8DP-I16DP Indexed Registers a. AdLib, Sound Blaster Control (UASBCI)

Address: P3XR+5 read, write; index IGIDXR=45h

Default: 00h

This register is used to control the AdLib and Sound Blaster compatibility hardware.

| 7 | 6 | 5 | 4 | 3 | 2 | 1 | 0 |
|---|---|---|---|---|---|---|---|
| RES | RES | SBIEN | ETTST | EIRQT2 | EIRQT1 | EDIRQ | AT-OFF |

| | |
|---|---|
| SBIEN | Sound Blaster Interrupts Enable. Enables interrupts for writes to U2X6R and UI2XCR. When set to logical 1, the interrupts are enabled. When set to logical 0 the interrupts are disabled and asynchronously cleared. |
| ETTST | Enable Timer Test. A logical 1 enables a high-speed clock to operate AdLib Timer 1 and 2. A logical 0 allows normal |

-continued

| | |
|---|---|
| | clocks to operate these timers. The high-speed clock is 16.9344 MHz divided by 17, or 0.99614 MHz. |
| EIRQT2 | Enable Interrupt For Timer 2. A logical 1 enables the interrupt associated with AdLib Timer 2. A logical 0 disables and asynchronously clears the interrupt. |
| EIRQT1 | Enable Interrupt For Timer 1. A logical 1 enables the interrupt associated with AdLib Timer 1. A logical 0 disables and asynchronously clears the interrupt. |
| EDIRQ | Enable Data Interrupt. A logical 1 enables the interrupt that results from a write to the AdLib Data Register (UADR). A logical 0 disables and asynchronously clears the interrupt. |
| ATOFF | Disable Auto-Timer Mode. This bit low places the circuit C into auto-timer mode. This bit high disables auto-timer mode. See AUTO-TIMER MODE in the system control module and the register descriptions for UASRR, UASWR, and UADR for an explanation of auto-timer mode. |

b. AdLib Timer 1 (UAT1I)

Address: P3XR+5 read, write; index IGIDXR=46h

Default: 00h

Timer 1 Load Value

This is the value that will be loaded into AdLib timer 1 whenever: (1) UADR[STRT1] is high and this timer increments past 0FFh; or (2) UADR[STRT1] is low and there is a rising clock edge of this timer's 80 microsecond clock (16.9344 MHz divided by 1344). Reads of this register provide the preload values, not the actual state of the timer.

c. AdLib Timer 2 (UAT2I)

Address: P3XR+5 read, write; index IGIDXR=47h

Default: 00h

Timer 2 Load Value

This is the value that will be loaded into AdLib timer 2 whenever: (1) UADR[STRT2] is high and this timer increments past 0FFh; or (2) UADR[STRT2] is low and there is a rising clock edge of this timer's 320 microsecond clock (timer 1's clock divided by 4). Reads of this register provide the preload values, not the actual state of the timer.

d. GF-1 Reset Register (URSTI)

Address: P3XR+5 read, write; index IGIDXR=4Ch

Default: XXXX X000

| 7 | 6 | 5 | 4 | 3 | 2 | 1 | 0 |
|---|---|---|---|---|---|---|---|
| RES | RES | RES | RES | RES | DMIE | DACEN | RGF1 |

| | |
|---|---|
| DMIE | Synthesizer Interrupt Enable. This bit high enables the synthesizer's loop and volume interrupts (UISR[6:5]). Disabling these interrupts with this bit does not clear the interrupts. |
| DACEN | Digital to Analog Converter Enable. This bit high enables the synthesizer DAC. This bit low mutes the output of the synthesizer DAC. |
| RGF1 | Reset GF-1. This bit low resets several of the MIDI, synthesizer, and GUS-compatibility registers. These items are reset by this bit: interrupt associated with write to U2X6R, interrupt associated with write to UI2XCR, any DMA or I/O read-write activity to local memory (including IOCHRDY), LDMACI, LMCI[1:0], LMFSI, LDICI, SGMI[ENH], the TC interrupt flip-flop (IDMATC), URSTI[2:1], UASBCI, interrupt associated with write to UADR, UADR[AIRST, MT1, MT2, STRT2, STRT1], the flip-flops that drive UASRR[T1M, T2M, 2XCIRQ, 2X6IRQ, T1NM, T2NM, DIRQ], and all the memory elements in the MIDI UART and its associated logic. Also, while this bit is low, the synthesizer IRQs are all cleared away and the synthesizer's state machines are all prevented from operating; they stay frozen and no sound is generated. This bit is fully controlled by software. Note: this bit must remain low for at least 22 microseconds after hardware and software resets have completed in order for the synthesizer register array to be properly initialized. |

e. Compatibility Register (ICMPTI)

Address: P3XR+5 read, write; index IGIDXR=59h

Default: 0001 1111

| 7 | 6 | 5 | 4 | 3 | 2 | 1 | 0 |
|---|---|---|---|---|---|---|---|
| STM[2:0] | | | CPEN | GPR2A[9:8] | | GPR1A[9:8] | |

STM[2:0] Serial Transfer Mode. These specify the mode of the serial transfer block of the codec module. This block is fully specified in the codec module. When STM[2] is high, the four external function (CD-ROM) pins are switched to become the external serial port pins. The possible modes are:

| Bits 2 1 0 | Description |
|---|---|
| 0 0 0 | Disabled |
| 0 0 1 | Synth DSP data to codec record FIFO input |
| 0 1 0 | Synth DSP data to codec play FIFO input |
| 0 1 1 | Codec record FIFO output to codec play |
| 1 0 0 | FIFO input |
| 1 0 1 | Synth DSP data to external serial port pins |
| | Codec record FIFO to external serial port |
| 1 1 0 and | output and external serial port input to codec |
| 1 1 1 | playback FIFO |
| | not valid |

| | |
|---|---|
| CPEN | Compatibility Enable. When high, this specifies that writes to UDCI[5:0] and UICI[5:0] are allowed. When low they are not allowed. Those bits can also be altered by writes to PUD1SI, PUD2SI, PUI1SI, and PUI2SI, regardless of the state of CPEN. |
| GPR2A[9:8] | General Purpose Register 2 Address[9:8]. This specifies ISA-address bits[9:8] of the relocateable register UGPA2I. |
| GPR1A[9:8] | General Purpose Register 1 Address[9:8]. This specifies ISA-address bits[9:8] of the relocateable register UGPA1I. |

f. Decode Control Register (IDECI)

Address: P3XR+5 read, write; index IGIDXR=5Ah

Default: 7Fh

This register enables and disables the docodes for various address spaces.

| 7 | 6 | 5 | 4 | 3 | 2 | 1 | 0 |
|---|---|---|---|---|---|---|---|
| IAC22 | EICH1 | EICH2 | EINMI | ECOD | E3889 | EEDC | EA98 |

| | |
|---|---|
| IAC22 | Interrupt Associated With Codec To Channel 2. When high, the interrupt associated with the codec comes out on the channel 2 IRQ pin and not on the channel 1 IRQ pin. When low, this interrupt comes out on channel 1. |
| EICH1 | Enable Interrupts on Channel 1. When high, channel 1 interrupts are enabled. When low, the selected channel 1 IRQ output becomes high-impedance. |
| EICH2 | Enable Interrupts on Channel 2. When high, channel 2 interrupts are enabled. When low, the selected channel 2 IRQ; output becomes high-impedance. |
| EINMI | Enable NMI Interrupts. When high, IOCHK# interrupts are enabled. When low, IOCHK# becomes high-impedance. |
| ECOD | Enable Decode of Codec. When high, I/O reads and writes to the codec address space, the four bytes of |

-continued

| | |
|---|---|
| | PCODAR, are enabled. When low, the decodes of these addresses are disabled. |
| E3889 | Enable Decodes of 388h and 389h. When high, decodes of the AdLib Command-Status and Data registers--fixed addresses 388 and 389--are enabled. When low, the decodes of these addresses are disabled. |
| EEDC | Enable Decodes of 2xE, 2xD, and 2xC. When high, reads and writes to P2XR+Eh, P2XR+Dh, and P2XR+Ch are enabled. When low, the decodes of these addresses are disabled. |
| EA98 | Enable Decodes of 2xA, 2x9, and 2x8. When high, reads and writes to P2XR+Ah, P2XR+9h, and P2XR+8h are enabled. When low, the decodes of these addresses are disabled. |

g. Version Number Register (IVERI)

Address: P3XR+5 read, write; index IGIDXR=5Bh

Default: 0000 0100

| 7 | 6 | 5 | 4 | 3 | 2 | 1 | 0 |
|---|---|---|---|---|---|---|---|
| | VER | | | RRMD | PUPWR | M40I | HRLEN# |

| | |
|---|---|
| VER | Version Number. This contains the version number of the die. Here are the possibilities: Oh=rev A silicon. This field is read only. |
| RRMD | Register Read Mode. When high, this bit specifies that reads of three of the circuit Cs normally-unreadable registers will return the data written to those registers. Reads of UADR (P2Xr+9, 389h) will return the bits [AIRST, MT1, MT2, 0, 0, 0, STRT2, STRT1], regardless of the state of UASBCI[0] or UACWR; reads of URCR (P2XR+Fh) return the data last written to that address instead of USRR, and reads of GMCR (P3XR+0) return the data last written to that address instead of GMSR. |
| PUPWR | Pull-Up Power. This bit low disables the power to the internal pull-up resistors on the signals IOCS16#, IRQ[15, 12, 11, 7, 5], SA[11:6], SBHE#, DRQ[7:5, 3], DAK[7:5,3]#, and SD[15:8] so that these signals do not drive voltages onto the ISA bus during suspend mode, or, in general, add current load. This bit high enables the pull-up resistors on those signals. Normally, this bit will be left high for 120-pin parts and set low for 160-pin parts. |
| M401 | MPU-401 Emulation mode. This bit high enables the following: (1) the MIDI transmit-receive registers (GMTDR, GMRDR) are moved from P3XR+1 to P3XR+0 and (2) the MIDI control-status registers. (GMCR, GMSR) are moved from P3XR+0 to P3XR+1. |
| HRLEN# | Hidden Register Lock Enable. When high (inactive), accesses to the registers located at UHRDP are always enabled. When low (active), access to the registers located at UHRDP must conform to a protocol. The protocol is initiated by a write to UMCR which enables the next subsequent I/O access to the hidden registers at UHRDP. An I/O read or write (while AEN is low) to any address except P2XR+0 (UMCR) or P2XR+0Bh (UHRDP) will lockout further I/O accesses to the hidden registers. |

h. MPU-401 Emulation Control A (IEMUAI)

Address: P3XR+5 read, write; index IGIDXR=5Ch

Default: 00h

The emulation address described in the following bit definitions is the address specified by UGPA1I, UGPA2I, and ICMPTI[3:0].

| 7 | 6 | 5 | 4 | 3 | 2 | 1 | 0 |
|---|---|---|---|---|---|---|---|
| URRE# | USRE# | E2RE# | EIRE# | UTWE# | UCWE# | E2WE# | E1WE# |

| | |
|---|---|
| URRE# | UART Receive Buffer Read Enable. When low, reads of the UART's receive data buffer, GMRDR, are allowed. When high, reads of that buffer are ignored internally (although, the ISA data bus will still be driven). |
| USRE# | UART Status Read Enable. When low, reads of the UART's status register, GMSR, allowed. When high, reads of that register are ignored internally (although, the ISA data bus will still be driven). |
| E2RE# | Emulation Register 2 Read Enable. When low, reads of emulation register 2, UGP2I, via the emulation address are allowed. When high, reads of UGP2I via the emulation address are ignored internally (although, the ISA data bus will still be driven). |
| E1RE# | Emulation Register 1 Read Enable. When low, reads of emulation register 1, UGP1I, via the emulation address are allowed. When high, reads of UGP1I via the emulation address are ignored internally (although, the ISA data bus will still be driven). |
| UTWE# | UART Transmit Buffer Write Enable. When low, writes to the MIDI UART's transmit buffer, GMTDR, are allowed. When high, writes to that buffer are ignored by the UART. |
| UCWE# | UART Command Buffer Write Enable. When low, writes to the MIDI UART's command register, GMCR, are allowed. When high, writes to that register are ignored by the UART. |
| E2WE# | Emulation Register 2 Write Enable. When low, writes to emulation register 2, UGP2I, via the emulation address are allowed. When high, UGP2I does not change during writes to the emulation address. |
| E1WE# | Emulation Register 1 Write Enable. When low, writes to emulation register 1, UGP1I via the emulation address are allowed. When high, UGP1I does not change during writes to the emulation address. |

i. MPU-401 Emulation Control B (IEMUBI)
Address: P3XR+5 read, write; index IGIDXR=5Dh
Default: 30h

| 7 | 6 | 5 | 4 | 3 | 2 | 1 | 0 |
|---|---|---|---|---|---|---|---|
| MRXE# | MTXE# | SLSE7 | SLSE6 | E2WIE# | E1WIE# | E2RIE# | E1RIE# |

| | |
|---|---|
| MRXE# | MIDI Receive Data Enable. When low, MIDI receive data from the MIDIRX pin is allowed to pass into the UART. When high, the data is disabled from coming into the UART. |
| MTXE# | MIDI Transmit Data Enable. When low, MIDI transmit data from the UART is allowed to pass to the MIDITX pin. When high, the data is disabled from coming out of the pin. |
| SLSE7 | Select Status Emulation Register 1, Bit[7] for I/O Reads. This bit high causes the circuit C to enable UGP1IOUT[7] onto the data bus during reads of UGP1IOUT via the emulation address (ICMPTI[1:0] and UGPA1I[7:0]. This bit low causes the circuit C to enable the DSR# onto bit[7] of the data bus during those reads; DSR# is set inactive (high) by the hard-ware when there is a read of UGP2IOUT via the emulation address (ICMPTI[3:2], UGPA2I), if reads of UGP2IOUT are enabled (IEMUAI[5]); this flag is also controlled by writes to UGP1IOUT[7] via the back door (UHRDP). |
| SLSE6 | Select Status Emulation Register 1, Bit[6] for I/O Reads. This bit high causes the circuit C to enable UGP1IOUT[6] onto the data bus during reads of UGP1IOUT via the emulation address (ICMPTI[1:0] and UGPA1I[7:0]). This bit low causes the circuit C to enable DRR# onto bit[6] of the data bus during those reads; DRR# is set inactive (high) by the hard-ware whenever there is a write to either of UGP1IIN or UGP2IIN via the emulation address (ICMPTI[3:0), UGPA1I, UGPA2I), if a write to that register is enabled (IEMUAI[1:0]); it is also controlled by writes to UGP1IOUT[6] via the back door (UHRDP). |
| E2WIE# | Emulation Register 2 Write Interrupt Enable. When low, writes to the address selected by ICMPTI[3:2] and |

-continued

| 7 | 6 | 5 | 4 | 3 | 2 | 1 | 0 |
|---|---|---|---|---|---|---|---|
| MRXE# | MTXE# | SLSE7 | SLSE6 | E2WIE# | E1WIE# | E2RIE# | E1RIE# |

| | |
|---|---|
| | UGPA2I[7:0] for UGP2I cause interrupts. When high, writes to UGP2I do not cause interrupts. |
| E1WIE# | Emulation Register 1 Write Interrupt Enable. When low, writes to the address selected by ICMPTI[1:0] and UGPA1I[7:0] for UGP1I cause interrupts. When high, writes to UGP1I do not cause interrupts. |
| E2RIE# | Emulation Register 2 Read Interrupt Enable. When low, reads of the address selected by ICMPTI[3:2] and UGPA2I[7:0] for UGP2I cause interrupts. When high, reads of UGP2I do not cause interrupts. |
| E1RIE# | Emulation Register 1 Read Interrupt Enable. When low, reads of the address selected by ICMPTI[1:0] and UGPA1I[7:0] for UGP1I cause interrupts. When high, reads of UGP1I do not cause interrupts. |

j. Test Control Register (ITCI)

Address: P3XR+5 read, write; index IGIDXR=5Fh; also, in external decoding mode, this register is directly readable (see REGISTER SUMMARY for a discussion of external decoding mode).

Default: 000 0000b; see TE below for the default description of bit[7].

Access to this register can be disabled by the state of MIDITX at the trailing edge of reset. See the PIN SUMMARY section for details. Also, none of the bits in this register are reset by the software reset, PCCCI; they are only reset by activation of the RESET pin.

| 7 | 6 | 5 | 4 | 3 | 2 | 1 | 0 |
|---|---|---|---|---|---|---|---|
| TE | BPOSC | TMS[5:0] | | | | | |

| | |
|---|---|
| TE | Test Enable. This bit high indicates that the device is in test mode. When it is low, the device is in normal or functional mode. The default state of this bit is latched at the trailing edge of reset by the state of the MWE# pin. If MWE# is low, TE will be high; if MWE# is high, TE will be low. This bit is not reset by the software reset (PCCCI). |
| BPOSC | Bypass Oscillator Stabilization Circuit. When high, the oscillator stabilization circuit -which is responsible for counting out oscillator clocks to guarantee that the 16.9 MHz oscillator is stable- only counts 256 states. When it is low, the oscillator stabilization logic counts out 64K states. This bit is reset by the RESET pin, but only by the software reset (PCCCI). |
| TMS[5:0] | Test Mode Select. These bits are available to provide selection of various circuit test modes. These are reset by the RESET pin, but not by the software reset (PCCCI). |

5. PNP Direct Registers a. Card Select Number Back Door (PCSNBR)

Address: 0201h write

Default: 00h

If the circuit C is in PNP system mode (latched by the state of the PNPCS pin at the end of reset), the AUDIO logical device has not been activated (PUACTI[0]=0), and the PNP state machine is in isolation mode, then it is possible to write a card select number (CSN) to the circuit C via this I/O port.

b. PNP Index Address Register (PIDXR)

Address: 0279h write

Default: 00h

This is the 8-bit index address register which points to standard Plug and Play registers.

c. PNP Data Write Port (PNPWRP)

Address: 0A79h write

This is the port used to write to Plug and Play ISA registers, indexed by PIDXR.

d. PNP Data Read Port (PNPRDP)

Address: Address is relocatable between 003h and 3FFh, read only. Address is set by (1) setting the PIDXR register to 00h, and (2) writing the byte that represents bits 9 through 2 to PNPWRP; bits 0 and 1 are both always assumed to be high (1 1).

This is the port used to read from Plug and Play ISA registers, indexed by PIDXR.

6. PIDXR, PNPWRP-PNPRDP PNP Indexed Registers

These PNP registers are indexed with PIDXR and accessed via PNPRDP and PNWRP. Many of the registers—PIDXR=30h and greater—are further indexed by the Logical Device Number Register (PLDNI); all such registers can only be accessed when the PNP state machine is in the configuration state.

a. PNP Set Read Data Port Address Register (PSRPAI)

Address: 0A79h write; index PIDXR=0

Default: 00h

Writes to this register set up SA[9:2] of the address of the PNP Read Data Port (PNPRDP). SA[1:0] are both assumed to be high. Writes to this register are only allowed when the PNP state machine is in the isolation state.

b. PNP Isolate Command Register (PISOCI)

Address: PNPRDP read; index PIDXR=1

Reading this register will cause the circuit C to drive a specific value—based on data read out of the PNP serial EEPROM 78—onto the ISA bus 156 and observe the data back into the circuit C to see if there is a difference. This can result in a “lose-isolation” condition and cause the PNP state machine to go into sleep mode. If the circuit C is in PNP-system mode (see the POWER-UP PNP MODE SELECTION section), then it is assumed that there is no serial EEPROM 78 and no data will ever be driven on the bus for reads from this register; in PNP-system mode, reads of PISOCI always cause the circuit C to “lose” the isolation and go into sleep mode. Reads from this register are only allowed when the PNP state machine is in the isolation state.

c. PNP Configuration Control Command Register (PCCCI)

Address: 0A79h write; index PIDXR=2

| 7 | 6 | 5 | 4 | 3 | 2 | 1 | 0 |
|---|---|---|---|---|---|---|---|
| RESERVED | | | | | RCSN | WFK | RESET |

| | |
|---|---|
| RCSN | Reset CSN. If the PNP state machine is in either sleep, isolate or configuration mode, then a high on this bit causes the CSN to be set to zero. This command is ignored if the PNP state machine is in the wait-for-key mode, but it is valid for the other three modes. |
| WFK | Wait For Key. A high on this bit causes the PNP state machine to enter the wait-for-key mode. This command is ignored if the |

-continued

| 7 | 6 | 5 | 4 | 3 | 2 | 1 | 0 |
|---|---|---|---|---|---|---|---|
| RESERVED | | | | | RCSN | WFK | RESET |

| | |
|---|---|
| | PNP state machine is in the wait-for-key mode, but it is valid for the other three modes. |
| RESET | A high on this pin causes the circuit C to be reset. This will result in 3 to 10 millisecond pulse over the general reset line to the entire circuit C. The only devices that will not be reset by this command are PSRPAI (PNP Set Read Data Port), PCSNI (PNP Card Select Number), and the PNP state machine. This command is ignored if the PNP state machine is in the wait-for-key mode, but it is valid for the other three modes. |

d. PNP WAKE[CSN] Command Register (PWAKEI)

Address: 0A79h write; index PIDXR=3

Writes to this register affect the PNP state machine based on the state of the CSN register and the data written. If the data is 00h and the CSN is 00h, then the PNP state machine will enter the isolation state. If the data is not 00h and the CSN matches the data, then the PNP state machine will enter the configuration state. If the data does not match the CSN, then the PNP state machine will enter the sleep state. This command also resets the serial EEPROM 78 control logic that contains the address to that part. This command is ignored if the PNP state machine is in the wait-for-key mode, but it is valid for the other three modes.

e. PNP Resource Data Register (PRESDI)

Address: PNPRDP read; index PIDXR=4

Default: 00h

This register provides the data from the local memory control module 8 (LMC) that has been read out of the PNP serial EPROM 78. Note: if the serial EEPROM 78 has been placed into direct control mode (PSEENI[0]), then the wake command must be executed before access via PRESDI is possible. This command is only valid when the PNP state machine is in the configuration state.

f. PNP Resource Status Register (PRESSI)

Address: PNPRDP read; index PIDXR=5

Default: 00h

A high on bit 0 of this register indicates that the next byte of PNP resource data is available to be read; all other bits are reserved. After the PRESDI is read, this bit becomes cleared until the next byte is available. This command is only valid when the PNP state machine is in the configuration state.

g. PNP Card Select Number Register (PCSNI)

Address: 0A79h write, PNPRDP read; index PIDXR=6

Default: 00h

Writes to this register while the PNP state machine is in the isolation state set up the CSN for the circuit C and send the PNP state machine into configuration mode. When the PNP state machine is in configuration mode, this register is readable, but not writeable.

h. PNP Logical Device Number Register (PLDNI)

Address: 0A79h write, PNPRDP read; index PIDXR=7

Default: 00h

This register further indexes the PNP address space into logical devices. The circuit C has two logical device numbers (LDN): 00h=all AUDIO functions, synthesizer, codec, and ports; 01h=the external (CD-ROM) interface. This register can only be accessed when the PNP state machine is in the configuration state.

i. PNP Audio Activate Register (PUACTI)

Address: 0A79h write, PNPRDP read; indexes PIDXR=30h and PLDNI=0

Default: 00h

A high on bit 0 of this register activates all the AUDIO functions; all other bits are reserved. When low, none of the AUDIO-function address spaces are decoded and the interrupt and DMA channels are not enabled.

j. PNP Audio I/O Range Check Register (PURCI)

Address: 0A79h write, PNPRDP read; indexes PIDXR=31h and PLDNI=0

Default: 00Oh

| 7 | 6 | 5 | 4 | 3 | 2 | 1 | 0 |
|---|---|---|---|---|---|---|---|
| RESERVED | | | | | | RCEN | H5LA |

| | |
|---|---|
| RCEN | Range Check Enable. This bit high causes reads of all AUDIO logical device address spaces to drive either 55 or AA based on the state of H5LA. This only functions when the PUACTI[0] is not set (the Audio device is not activated). |
| H5LA | High 55-Low AA. When RCEN is active, this bit selects the data value that is driven back onto the ISA data bus 156 during a read. A high specifies that 55h be driven and a low specifies AAh. Note: this register is not available when in external decoding mode. |

k. PNP Address Control Registers

The following table shows all the various PNP registers that control the address of blocks of I/O space within the circuit C.

| Mnemonic | Index | LDN | Default | Description |
|---|---|---|---|---|
| P2X0HI | 60h | 0 | 00h | P2X0HI[1:0] specifies P2XR[9:8] |
| P2X0LI | 61h | 0 | 00h | P2X0LI[7:4] specifies P2XR[7:4] |
| P2X6HI | 62h | 0 | 00h | P2X6HI[1:0] specifies P2XR[9:8] |
| P2X6LI | 63h | 0 | 00h | P2X6LI[7:4] specifies P2XR[7:4] |
| P2X8HI | 64h | 0 | 00h | P2X8HI[1:0] specifies P2XR[9:8] |
| P2X8LI | 65h | 0 | 00h | P2X8LI[7:4] specifies P2XR[7:4] |
| P3X0HI | 66h | 0 | 00h | P3X0HI[1:0] specifies P3XR[9:8] |
| P3X0LI | 67h | 0 | 00h | P3X0LI[7:4] specifies P3XR[7:4] |
| PHCAI | 68h | 0 | 00h | PHCAI[1:0] specifies PCODAR[9:8] |
| PLCAI | 69h | 0 | 00h | PLCAI[7:2] specifies PCODAR[7:2] |
| PRAHI | 60h | 1 | 00h | PRAHI[1:0] specifies PCDRAR[9:8] |
| PRALI | 61h | 1 | 00h | PRALI[7:4] specifies PCDRAR[7:4] |

Notes: There are three indexes that identically control P2XR. This is in support of the non-contiguous addresses in the P2XR block. Only the first of these, P2X0[H,L]I, are used for P2XR.

All unused bits in the above PNP address control registers are reserved. All of the above PNP address control registers are written via 0A79h and read via PNPRDP. The unspecified LSBs of P2XR, P3XR, PCODAR, and PCDRAR are all assumed to be zero. See the General Description section for a description of the functions controlled by the various address blocks.

l. PNP Audio IRQ Channel 1 Select Register (PUI1SI)

Address: 0A79h write, PNPRDP read; indexes PIDXR=70h and PLDNI=0

Default: 00h

Bits[3:0] select the IRQ number for channel 1 interrupts as follows:

| [3:0] | Description |
|---|---|
| 0h | No IRQ |
| 1h | No IRQ |
| 2h | IRQ2 |
| 3h | IRQ3 |
| 4h | No IRQ |
| 5h | 12IRQ5 |
| 6h | No IRQ |
| 7h | IRQ7 |
| 8h | No IRQ |
| 9h | No IRQ |
| 0Ah | No IRQ |
| 0Bh | IRQ11 |
| 0Ch | IRQ12 |
| 0Dh | No IRQ |
| 0Eh | No IRQ |
| 0Fh | IRQ15 |

Bits[7:4] are reserved. Writes to this register appropriately affect UICI[2:0].

m. PNP Audio IRQ Channel 1 Type Register (PUI1TI)

Address: PNPRDP read; indexes PIDXR=71h and PLDNI=0

Default: 02h

The registers provides data back to standard PNP software concerning the type of interrupts supported by the circuit C. It will always be read back as 02h to indicate edge-triggered, active-high interrupts.

n. PNP Audio IRQ Channel 2 Select Register (PUI2SI)

Address: 0A79h write, PNPRDP read; indexes PIDXR=72h and PLDNI=0

Default: 00h

Bits[3:0] select the IRQ number for channel 2 interrupts as follows:

| [3:0] | Description |
|---|---|
| 0h | No IRQ |
| 1h | No IRQ |
| 2h | IRQ2 |
| 3h | IRQ3 |
| 4h | No IRQ |
| 5h | IRQ5 |
| 6h | No IRQ |
| 7h | IRQ7 |
| 8h | No IRQ |
| 9h | No IRQ |
| 0Ah | No IRQ |
| 0Bh | IRQ11 |
| 0Ch | IRQ12 |
| 0Dh | No IRQ |
| 0Eh | No IRQ |
| 0Fh | IRQ15 |

Bits[7:4] are reserved. Writes to this register appropriately affect UICI[5:3].

o. PNP Audio IRQ Channel 2 Type Register (PUI2TI)

Address: PNPRDP read; indexes PIDXR=73h and PLDNI=0

Default: 02h

The registers provides data back to standard PNP software concerning the type of interrupts supported by the circuit C. It will always be read back as 02h to indicate edge-triggered, active-high interrupts.

p. PNP Audio DMA Channel Select Registers (PUD1SI, PUD2SI)

Address: 0A79h write, PNPRDP read; indexes PIDXR=74h (PUD1SI), PIDXR=75h (PUD2SI), and PLDNI=0

Default: 04h

Bits[2:0] of these registers select the DMA request number for channels 1 and 2 as follows:

| [2:0] | Description | [2:0] | Description |
|---|---|---|---|
| 0h | DRQ/AK0 | 4h | No DMA |
| 1h | DRQ/AK1 | 5h | DRQ/AK5 |
| 2h | No DMA | 6h | DRQ/AK6 |
| 3h | DRQ/AK3 | 7h | DRQ/AK7 |

Bits[7:3] are reserved. Writes to these registers appropriately affect UDCI[5:0]

q. PNP Serial EEPROM Enable (PSEENI)

Address: 0A79h write, PNPRDP read; index PIDXR=F0h and PLDNI=0

Default: 00h

This register is only accessible when the PNP state machine is in the configuration state.

| 7 | 6 | 5 | 4 | 3 | 2 | 1 | 0 |
|---|---|---|---|---|---|---|---|
| RESERVED | | | | | ISADR | | SEM |

| | |
|---|---|
| ISADR | ISA-Data-Bus Drive. This specifies the output-low drive capability, Iol, of the ISA data bus, SD[15:0], IOCHROY, IOCS16# AND IOCHK#. At 5 volts: 00 = 24 mA, 01 = 12 mA, 10 = 3 mA, 11 = reserved. At 3.3 volts, the drive is at least 3 mA for ISADR = 00, 01, and 10. |
| SEM | Serial EEPROM Mode. A low specifies that the serial EEPROM interface circuitry is in initialization mode whereby the data transfer is controlled by the PNP state machine. A high specifies the control mode whereby the serial EEPROM 78 is controlled directly by PSECI. |

r. PNP Serial EEPROM Control (PSECI)

Address: 0A79h write, PNPRDP read; index PIDXR=F1h and PLDNI=0

Default: XXXX 000X

When in control mode (PSEENI[0]), if PUACTI is inactive, then bits[3:0] are used to directly control the serial EEPROM 78. Bits[7:4] are read-only status bits that show the state of various control signals that are latched at the trailing edge of RESET (see the PIN SUMMARY section in the general description above for details). This register is only accessible when the PNP state machine is in the configuration state.

| 7 | 6 | 5 | 4 | 3 | 2 | 1 | 0 |
|---|---|---|---|---|---|---|---|
| SUS32 | XDEC | PSYS | VCC5 | SECS | SESK | SEDI | SEDO |

| | |
|---|---|
| SUS32 | SUSPEND - C32KHZ Select. Provides the state of the internal signal IPSUS32 which is latched off the RA[21] pin at the trailing edge of RESET. |
| XDEC | External Decode Select. Provides the state of the internal signal IPEXDEC which is latched off the RA[20] pin at the trailing edge of RESET. |

-continued

| 7 | 6 | 5 | 4 | 3 | 2 | 1 | 0 |
|---|---|---|---|---|---|---|---|
| SUS32 | XDEC | PSYS | VCC5 | SECS | SESK | SEDI | SEDO |

| | |
|---|---|
| PSYS | PNP System Board Select. Provides the state of the internal signal IPPNPSYS which is latched off the PNPCS pin at the trailing edge of RESET. |
| VCC | VCC is 5 Volts. Provides the state of the internal 5-volt-3.3-volt detect circuitry. It is high for 5 volts and Low for 3.3 volts. |
| SECS | Serial EEPROM Chip Select. Writes to this bit are reflected on the PNPCS pin. Reads provide the latched value. |
| SESK | Serial EEPROM Serial Clock. Writes to this bit are reflected on the MD[2] pin. Reads provide the latched value. |
| SEDI | Serial EEPROM Data In. Writes to this bit are reflected on the MD[1] pin. Reads provide the latched value. |
| SEDO | Serial EEPROM Data Out. Writes to this bit are ignored; reads provide the state of the MD[0] pin. |

s. PNP Power Mode (PPWRI)

Address: 0A79h write, PNPRDP read; index PIDXR=F2h and PLDNI=0

Default: X111 1111

This register is used to disable clocks and enable low-power modes for major sections of the circuit C. Writes to this register are accomplished differently than most. The MSB of the data, ENAB, is used to specify whether ones or zeros are to be written; for bits[6:0], a high indicates that ENAB is to be written into the bit and a low indicates that the bit is to be left unmodified. Thus, when there is a need to modify a subset of bits[6:0], it is not necessary for software to read the register ahead of time to determine the state of bits that are not to change. Examples are: to set bit[0] high, a write of 81h is needed; to clear bit[4] to a low, a write of 10h is needed.

If a single command comes to clear bits[6:1] to the low state (I/O write of 0111 111X, binary), then the circuit C enters shut-down mode and the 16.9 MHz. oscillator 16 becomes disabled. When, subsequently, one or more of bits[6:1] are set high, the 16.9 MHz oscillator 16 is re-enabled. After being re-enabled, the 16.9 MHz clock will require 4 to 8 milliseconds before becoming stable.

This register is only accessible when the PNP state machine is in the configuration state.

| 7 | 6 | 5 | 4 | 3 | 2 | 1 | 0 |
|---|---|---|---|---|---|---|---|
| ENAB | PWR24 | PWRL | PWRS | PWRG | PWRCP | PWRCR | PWRCA |

| | |
|---|---|
| ENAB | Enable. Used to specify the value that is to be written to bits [6:0] of the register (see above). In all seven cases, a high specifies that the block is functional and a low indicates that it is in low-power mode. |
| PWR24 | 24.576 MHz. Oscillator Enable. This bit low causes the 24.576 MHz. oscillator 18 to stop. It is not recommended that this oscillator be disabled if either CPDFI[0] or CRDFI[0] are low. However, it is legal to set this bit low as part of the shut-down command, despite the state of CPDFI[0] and CRDFI[0]. |
| PWRL | Local Memory Control Enable. This bit low disables the 16.9 MHz. clock to the local memory control module 8 and allows slow refresh cycles to local DRAM 110 using C32KHZ input 72. |
| PWRS | Synthesizer Enable. This bit low disables the 16.9 MHz. clock to the synthesizer module 6 and the clocks to the synthesizer DAC input to the codec mixer (see discussion in synthesizer and CODEC section of this application). |
| PWRG | Game-MIDI Ports Enable. This bit low disables all clocks to the ports module 10 and disables internal and external resistors from consuming current. |

-continued

| | |
|---|---|
| PWRCP | Codec Playback Path Enable. This bit low disables clocks to the codec playback path including the playback FIFO, format conversion, filtering, and DAC. |
| PWRCR | Codec Record Path Enable. This bit low disables clocks to the codec record path including the record FIFO, format conversion, filtering, and ADC. |
| PWRCA | Codec Analog Circuitry Enable. This bit low disables all the codec analog circuitry and places it in a low-power mode. When low, all the analog pins -MIC[L,R], AUX1[L,R], AUX2[L,R], LINEIN[L,R], MONOIN, LINEOUT[L,R], MONOOUT, CFILT, IREF- are placed into the high-impedance state. |

t. PNP CD-ROM Activate Register (PRACTI)

Address: 0A79h write, PNPRDP read; indexes PIDXR=30h and PLDNI=1

Default: 00h

A high on bit 0 of this register activates the external interface (e.g., CD-ROM) function; all other bits are reserved. When low, the external function (CD-ROM) address space is not decoded; the external function (e.g., CD-ROM) interrupt and DMA channels are not enabled.

u. PNP CD-ROM I/O Range Check Register (PRRCI)

Address: 0A79h write, PNPRDP read; indexes PIDXR=31h and PLDNI=1

Default: 00h

| 7 | 6 | 5 | 4 | 3 | 2 | 1 | 0 |
|---|---|---|---|---|---|---|---|
| RESERVED | | | | | | RCEN | H5LA |

| | |
|---|---|
| RCEN | Range Check Enable. This bit high causes reads of all external function address space to drive either 55 or AA based on the state of H5LA. This only functions when the PRACTI[0] is not set (the external device is not activated). |
| H5LA | High 55-Low AA. When RCEN is active, this bit selects the data value that is read back. A high specifies that 55h be driven and a low specifies AAh. |

v. PNP CD-ROM High, Low Address Register (PRAHI, PRALI)

See the PNP address control registers above.

w. PNP CD-ROM IRQ Select Register (PRISI)

Address: 0A79h write, PNPRDP read; indexes PIDXR=70h and PLDNI=1

Default: 00h

Bits[3:0] select the IRQ number for external function (CD-ROM) interrupts as follows:

| [3:0] | Description |
|---|---|
| 0h | No IRQ |
| 1h | No IRQ |
| 2h | IRQ2 |
| 3h | IRQ3 |
| 4h | No IRQ |
| 5h | IRQ5 |
| 6h | No IRQ |
| 7h | IRQ7 |
| 8h | No IRQ |
| 9h | No IRQ |
| 0Ah | No IRQ |

-continued

| [3:0] | Description |
|---|---|
| 0Bh | IRQ11 |
| 0Ch | IRQ12 |
| 0Dh | No IRQ |
| 0Eh | No IRQ |
| 0Fh | IRQ15 |

Bits[7:4] are reserved.

x. PNP CD-ROM IRQ Type Register (PRITI)
Address: PNPRDP read; indexes PIDXR=71h and PLDNI=1
Default: 02h The registers provides data back to standard PNP software concerning the type of interrupts supported by the circuit C. It will always be read back as 02h to indicate edge-triggered, active-high interrupts.

y. PNP CD-ROM DMA Select Register (PRDSI)
Address: 0A79h write, PNPRDP read; indexes PIDXR=74h and PLDNI=1
Default: 04h Bits[2:0] of these registers select the DMA request number for the external function (CD-ROM) as follows:

| [2:0] | Description | [2:0] | Description |
|---|---|---|---|
| 0h | DRQ/AK0 | 4h | No DMA |
| 1h | DRQ/AK1 | 5h | DRQ/AK5 |
| 2h | No DMA | 6h | DRQ/AK6 |
| 3h | DRQ/AK3 | 7h | DRQ/AK7 |

Bits[7:3] are reserved.

IV. CODEC Module

Figure 44:
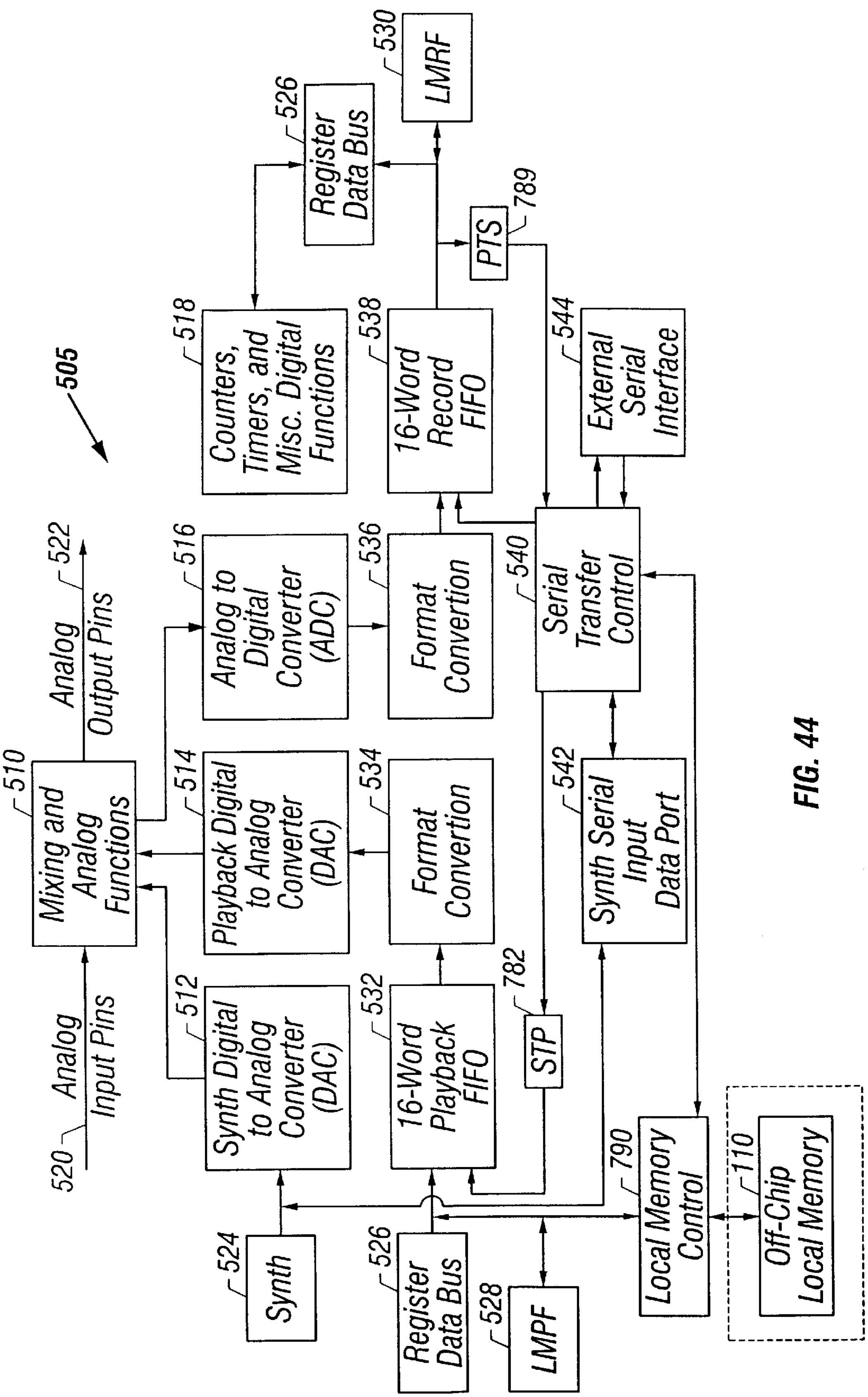
FIG. 44 is a block diagram of the various functional blocks of the CODEC module of the present invention.

FIG. 44 depicts, in block diagram format, the various features and functions included within the CODEC module device 505. The CODEC device 505 includes on-chip memory, which is preferably configured as 16-sample, 32-bit wide, record and playback FIFOs, 538, 532, with selectable thresholds capable of generating DMA and I/O interrupts for data read and write operations. The Mixing and Analog Functions block 510 includes left and right channel analog mixing, muxing and loopback functions. Left channel and right channel stereo, and single channel mono, analog audio signals are summed in Mixing and Analog Functions block 510. These mono and stereo audio signals are output from the CODEC 505 for external use, on analog output pins 522. Inputs to the Mixing and Analog Functions block 510 are provided from: external Analog Input Pins 520, analog output from a Synthesizer Digital-to-Analog Converter block 512, which is external to CODEC 505 or may be a processing block within CODEC 505, and from the Playback Digital-to-Analog Converter block 514. Analog audio output from Mixing Analog Functions block 510 is provided to record Analog-to-Digital Converter 516 block. Synthesizer Digital-to-Analog Converter block 512 receives Digital data from a synthesizer 524. Throughout this description, it should be understood that synthesizer 524 is an external device, or may be integrated onto the same monolithic integrated circuit as the CODEC device 505.

The record path for the CODEC 505 is illustrated in FIG. 44, with analog audio data being output from Mixing and Analog Functions block 510 and provided to record Analog-to-Digital Converter (ADC) 516 block to be converted to 16-bit signed data. The selected sample rate for record ADC 516 affects the sound quality such that the higher the sample rate for record ADC 516, the better the recorded digital audio signal approaches the original audio signal in quality. The function and operation of a fourth order cascaded delta-sigma modulator, preferably implemented in record ADC 516 block, is described in application Ser. No. 08/071,091, filed Dec. 21, 1993, entitled "Fourth Order Cascaded Sigma-Delta Modulator," assigned to the common assignee of the present invention. The converted digital audio data is then sent to format conversion block 536 which converts the 16-bit digital audio data to a preselected data format. The formatted digital data is then sent to 32-bit wide record FIFO 538 as 16-bit left and 16-bit right channel data for further submission to register data bus 526 for output to external system memory (not shown) or to off-chip local memory record FIFO 530 (LMRF).

The playback path for CODEC 505 includes digital data, in a preselected data format, being sent to 32-bit wide playback FIFO 532 from the off-chip local memory playback FIFO (LMPF) 528 or from external system memory (not shown), via the register data bus 526. It should be understood throughout this application that LMRF 530 and LMPF 528 may be discreet off-chip FIFOs, or may be dedicated address space within off-chip local memory 110 configured as FIFOs. The formatted data is then input to format conversion clock 534, where it is converted to 16-bit signed data. The data is then sent to the CODEC playback DAC 514, where it is converted to an analog audio signal and output to the input of Mixing and Analog functions block 510.

A Serial Transfer Control block 540 provides serial-to-parallel and parallel-to-serial conversion functions, and loop back capability between the output of 32-bit wide record FIFO 538 and the input of 32-bit wide playback FIFO 532. Also, synthesizer serial input data port 542 (FIG. 44), which receives serial data from synthesizer 524, communicates with serial Transfer Control block 540. Serial Transfer Control block 540 is connected to record FIFO 538, playback FIFO 532, off-chip local memory 110 (or, LMRF 530 and LMPF 528) via local memory control 790, synth serial input data port 542, and to External Serial Interface. Bi-directional serial data communication over External Serial Interface 544, which includes an external serial port, is provided to Serial Transfer Control block 540 (also see FIG. 49). External serial interface 544 may be a UART, or other device that provides either synchronous or asynchronous controlled serial data transfers. External Serial Interface 544 (FIG. 44) can be connected to communicate serially with an external digital signal processor (DSP) for off-chip generation of special audio effects, or with any other device capable of bi-directional serial data communication. External serial interface 544 can also connect to and provide a serial data path from external synthesizer serial input port 542. Bi-directional data transfer is also accomplished via data path 550 between serial transfer control 540 and local memory control 790.

Figure 49A:
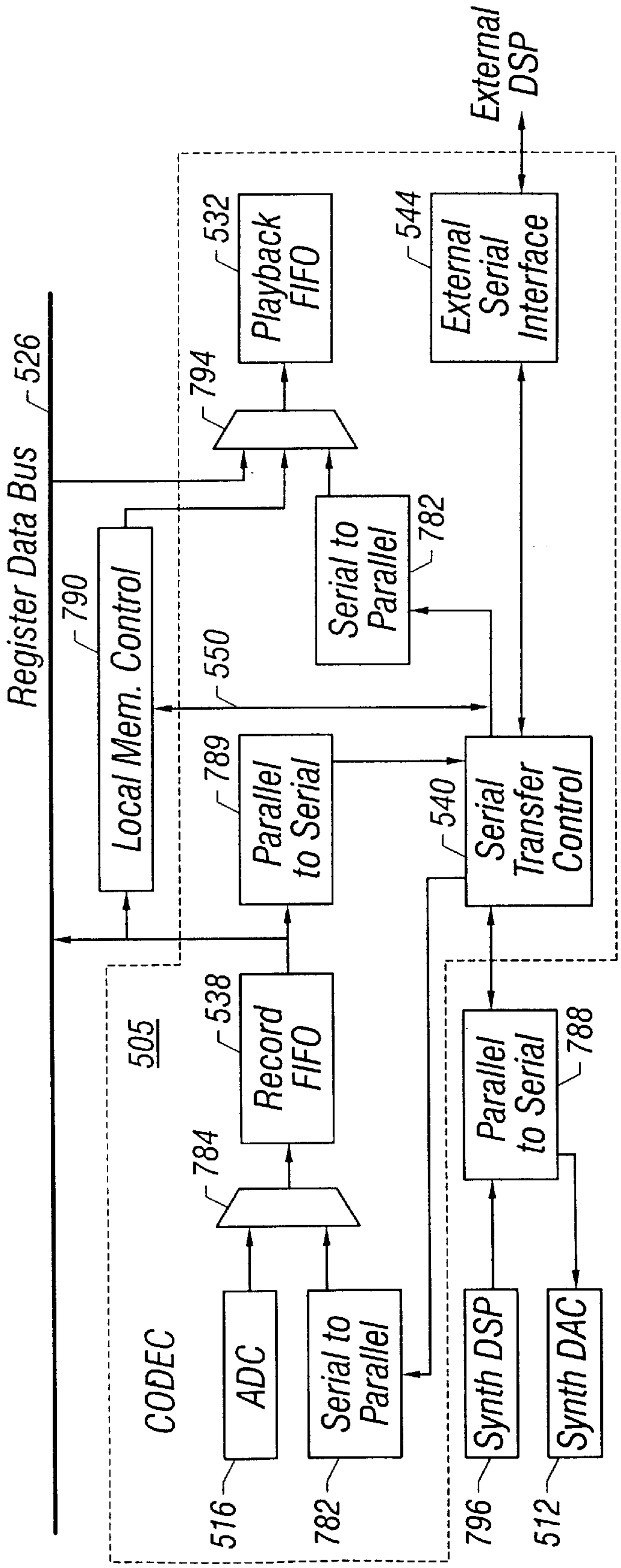
FIG. 49*a* is a block diagram of serial data transfer functions of the present invention.

The various loop back and data conversion functions associated with Serial Transfer Control block 540 are shown in more detail in FIGS. 49 and 49*a*.

The CODEC 505 includes AID conversion functions in the record path and D/A conversion functions in the playback path. These conversion functions are capable of operating independently of each other at different sample rates so A/D and D/A operations may be performed simultaneously, each having a different sample rate and data format. Loop access circuitry (in mixing block 606) provides a capability to sample an audio signal and perform an A/D operation at one rate, digitize the signal, and then playback the digitized sample back through the playback D/A at a different sample rate.

The block designated Counters, Timers and Miscellaneous digital functions 518 includes circuitry which controls: the A/D and D/A conversions in CODEC 505, format conversion blocks 532, 536, and data transfer functions. CODEC 505 operation allows the following data formats: 8-bit unsigned linear; 8-bit $\mu$-law; 8-bit A-law; 16-bit signed little endian; 16-bit signed big endian; or 4-bit 4:1 IMA ADPCM format.

Figure 45A:
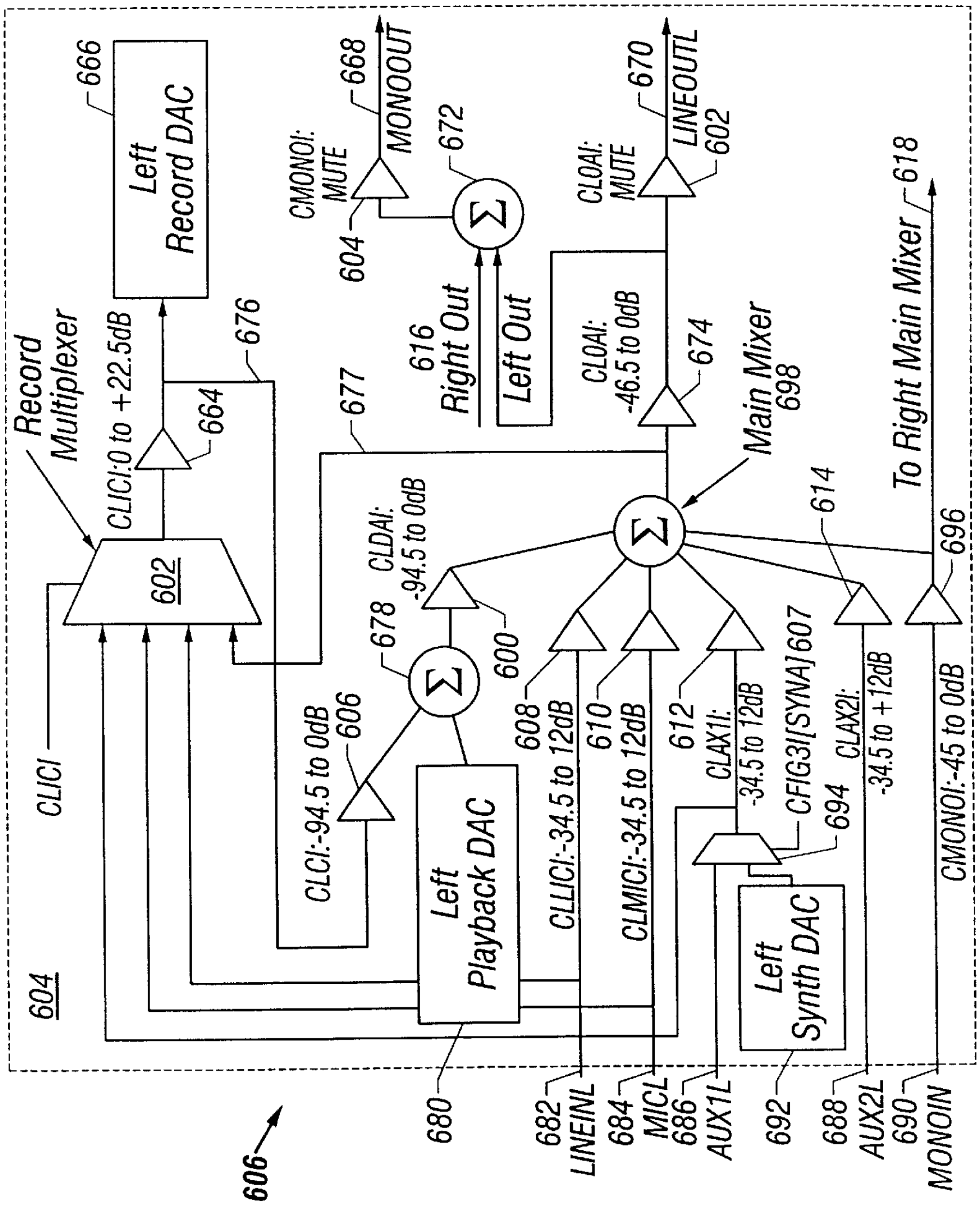
FIG. 45*a* is a schematic of the preferred embodiment of the left channel stereo mixer of the present invention.

Referring to FIG. 45*a*, the left channel of CODEC analog mixer 606 of Mixing and Analog functions block 510 is depicted. The layout of the right channel of mixer 606 is identical to the left channel, but is not shown in FIG. 45*a*. Except for minor signal name modifications, all descriptions of left channel signals and functions are applicable to the right channel.

The CODEC analog mixer 606 has more programmable features and more functions than prior CODEC audio devices. Each of the five input lines to the analog mixer 606 in FIG. 45*a* (LINEINL 682, MICL 684, AUXIL 686, AUX2 688 and MONOIN 690) includes a programmable attenuation/gain control circuit 608, 610, 612, 614 and 696, respectively. All inputs and outputs to and from analog mixer 606, are stereo signals, except for input MONOIN 690 and output MONOOUT 668, which are mono signals. The choice of mono or stereo audio signal inputs or outputs is also selectable.

Each of the triangle blocks depicted in FIG. 45*a* represents a programmable attenuation/gain control circuit. The registers that control the respective attenuation/gain control circuits and the attenuation/gain range for that circuit are identified in FIG. 45*a* next to the respective triangle block, and are located in the Registers block 566 in FIG. 50. The description and address of each of these registers is described below. Individual bits in these registers are capable of being modified as described in application Ser. No. 08/171,313, entitled Method and Apparatus for Modifying the Contents of a Register via a Command Bit, which describes a single-bit manipulation technique that obviates the need to address an entire register, and is assigned to the common assignee of the present invention and incorporated herein for all purposes.

The range of attenuation values for these registers are shown in FIG. 45*b*. The value stored in each attenuation/gain control register is used to provide the selected gain or attenuation value to CODEC control logic in the Counters, Timers and Misc. Digital Functions block 518, and Gain/attenuation Block 734 (FIG. 47) explained below. The amplitude of the analog audio signal input to the respective attenuation/gain circuit is controlled by the value stored in the respective attenuation/gain control register.

The overview of the registers used in CODEC 505 Registers block 566, including their preferred functions, are as follows:

The CODEC 505 is designed to be generally register-compatible with the CS4231 (Modes 1 and 2), with the AD1848 and other prior art. An indirect addressing mechanism is used for accessing most of the CODEC registers. In Mode 1 (discussed below), there are 16 indirect registers; in Mode 2 (discussed below), there are 28 indirect registers; and in Mode 3 (discussed below), there are 32 indirect registers.

In the following register definitions, RES or RESERVED specifies reserved bits. All such fields must be written with zeros; reads return indeterminate values; a read-modify-write operation can write back the value read.

CODEC Direct Registers

CODEC Index Address Register (CIDXR)

Address: PCODAR+0 read, write

Default: 0100 0000

Modes: bits[7:5,3:0] modes 1, 2, and 3; bit[4] modes 2 and 3

| 7 | 6 | 5 | 4 | 3 | 2 | 1 | 0 |
|---|---|---|---|---|---|---|---|
| INIT | MCE | DTD | IA[4:0] | | | | |

INIT Initialization. This read-only bit will be read as high if the CODEC is in an initialization phase and unable to respond to I/O activity. This bit is set only by software resets and cleared once the 16 MHz oscillator is stable and the CODEC 505 has initialized.

MCE Mode Change Enable. This bit protects the CPDFI, CRDFI, and CFIG1I from being written (except CFIG1I[1:0]; these can be changed at any time). When high, the protected registers can be modified; also, the DAC outputs (CLDACI and CRDACI) are forced to mute. When low, the protected registers cannot be modified.

DTD DMA Transfer Disable. This bit high causes DMA transfers to be suspended when either of the sample counter interrupts of CSR3R becomes active.
Mode 1: DMA is suspended (whether it be playback or record) and the sample counter stops after the sample counter causes an interrupt; also, the active FIFO is disabled from transferring more data to CODEC 505. DMA transfers, FIFO transfers and the sample counter resume when GINT is cleared or DTD is cleared.
Modes 2 and 3: Record DMA, the record FIFO and the record sample counter stop when the record sample counter causes an interrupt; playback DMA, the playback FIFO and the playback sample counter stop when the playback sample counter causes an interrupt. The pertinent DMA transfers and sample counter resume when the appropriate interrupt bit in CSR3I is cleared or DTD is cleared.
In mode 3, this bit also works to discontinue the transfer of data between the CODEC FIFOs and the LMRF and the LMPF.

IA[4:0] Indirect Address Pointer. These bits are used to point to registers in the indirect address space. In mode 1, a 16-register space is defined; IA[4] is reserved. In modes 2 and 3, a 32-register space is defined.

CODEC Indexed Data Port (CDATAP)

Address: PCODAR+1 read, write

Modes: 1, 2, and 3

This is the access port through which all CODEC indexed registers—pointed to by the CODEC Indexed Address Register (CIDXR[4:0])—are written or read.

CODEC Status 1 Register (CSR1R)

Address: PCODAR+2 read, (also, a write to this address clears GINT)

Default: 11001110

Modes: 1, 2, and 3

This register reports the interrupt status and various playback and record FIFO conditions. Reading this register also clears CSR2I[7:6] and CSR3I[3:0], if any are set. Writing to this register will clear all CODEC interrupts.

| 7 | 6 | 5 | 4 | 3 | 2 | 1 | 0 |
|---|---|---|---|---|---|---|---|
| RULB | RLR | RDA | SE | PULB | PLR | PBA | GINT |

RULB Record Channel Upper/Lower Byte Indication. When high, this bit indicates that a read of the record FIFO will return the upper byte of a 16-bit sample (bits[15:8]) or that the record data is 8-or-less bits wide. When low, this bit indicates that a read of the record FIFO will return the lower byte of a 16-bit sample (bits[7:0]). After the last byte of the last received sample has -continued

| | |
|---|---|
| | been read from the record FIFO, this bit does not change from its state during that byte until the next sample is received. |
| RLR | Record Channel Left/Right Sample Indication. When high, this bit indicates that a read of the record FIFO will return the left sample or that the record path is in either mono or ADPCM mode (or both). When low, a read will return the right sample. After the last byte of the last received sample has been read from the record FIFO, this bit does not change from is state during that byte until the next sample is received. |
| RDA | Record Channel Data Available. When high, there is valid data to be read from the record FIFO. When low, the FIFO is empty. |
| SE | Sample Error. This bit is high whenever data has been lost because of either a record FIFO overrun or a playback FIFO underrun (it is a logical OR of CSR2I[7:6]). If both record and playback channels are enabled, the specific channel that set this bit can be determined by reading CSR2I or CSR3I. |
| PULB | Playback Channel Upper/Lower Byte Indication. When high, this bit indicates that the next write to the playback FIFO should be the upper byte of a 16-bit sample (bits[15:8]) or that playback data is 8-or-less bits wide. When low, this bit indicates that next write to the playback FIFO should be the lower byte (bits[7:0]) of a 16-bit sample. After the playback FIFO becomes full, this stays in the state of the last byte written until a space becomes available in the FIFO. |
| PLR | Playback Channel Left/Right Sample Indication. When high, this bit indicates that the next write to the playback FIFO should be the left sample or that the playback path is in either mono or ADPCM mode. When low, the right sample is expected. After the playback FIFO becomes full, this stays in the state of the last byte written until a space becomes available in the FIFO. |
| PBA | Playback Channel Buffer Available. When high, there is room in the playback FIFO for additional data. When low, the FIFO is full. |
| GINT | Global Interrupt Status. This bit is high whenever there is an active condition that can request an interrupt. It is implemented by ORing together all the sources of interrupts in the CODEC: CSR3I[6:4]. |

Playback and Record Data Registers (CPDR, CRDR)
Address: PCODAR+3 read (record FIFO), write (playback FIFO)
Modes: 1, 2, and 3

Data written to this address is loaded into the playback FIFO. Data read from this address is removed from the record FIFO. Bits in Status Register 1 indicate whether the data is the left or right channel, and, for 16-bit samples, the upper or lower portion of the sample. Writes to this address when either the playback FIFO is in DMA mode or the playback path is not enabled (CFIG1I) are ignored; reads from this address when either the record FIFO is in DMA mode or the record path is not enabled (CFIG1I) are ignored.

CODEC CIDXR, CDATAP Indexed Registers Left, Right A/D Input Control (CLICI, CRICI)
Address: PCODAR+1 read, write; left index CIDXR[4:0]=0, right index CIDXR[4:0]=1
Default: 000X 0000 (for both)
Modes: 1, 2, and 3

This pair of registers is used to select the input source to the A/D converters, and to specify the amount of gain to be applied to each signal path. The registers are identical, one controls the left channel and the other controls the right channel.

| 7 | 6 | 5 | 4 | 3 | 2 | 1 | 0 |
|---|---|---|---|---|---|---|---|
| LSS[1:0], RSS[1:0] | | RWB | RES | LADIG[3:0], RADIG[3:0] | | | |

| | |
|---|---|
| LSS[1:0] | Left, Right ADC Source Select. These bits select which input source will |

-continued

| | |
|---|---|
| RSS[1:0] | be fed to the analog to digital converter. |

| BIT 1 0 | SOURCE |
|---|---|
| 0 0 | Line |
| 0 1 | Aux 1 |
| 1 0 | Stereo Microphone |
| 1 1 | Mixer Output |

| | |
|---|---|
| RWB | Read/Write Bit. This bit does not control anything. Whatever is written to it will be read back. |
| LADIG[3:0] | Left, Right A/D Input Gain Select. The selected input source is fed to the |
| RADIG[3:0] | A/D converter via a gain stage. These four bits specify the amount of gain applied to the signal. The values vary from 0h = 0 dB to 0Fh = +22.5 dB with 1.5 dB per step (see FIG. 45b). |

Left, Right AUX 1/Synth Input Control (CLAX1I, CRAX1I)
Address: PCODAR+1 read, write; left index CIDXR[4:0]=2, right index CIDXR[4:0]=3
Default: 1XX0 1000 (for both)
Modes: 1, 2, and 3

This register pair controls the left and right AUX1 or Synth (multiplexed by CFIG3I) inputs to the mixer. The registers are identical, one controls the left channel and the other controls the right channel.

| 7 | 6 | 5 | 4 | 3 | 2 | 1 | 0 |
|---|---|---|---|---|---|---|---|
| LA1ME, RA1ME | RES | RES | LA1G[4:0], RA1G[4:0] | | | | |

| | |
|---|---|
| LA1ME, | Left, Right AUX1/Synth Mute Enable. When high, the selected input is |
| RA1ME | muted. When low the input operates normally. |
| LA1G[4:0], | Left, Right AUX1/Synth Gain Select. This specifies the amount of gain. |
| RA1G[4:0] | applied to the selected -AUX1 or synth- input signal. The values vary from 00h = +12 dB to 1Fh = −34.5 dB with 1.5 dB per step (see FIG. 45b). |

Left, Right Auxiliary 2 Input Control (CLAX2I, CRAX2I)
Address: PCODAR+1 read, write; left index CIDXR[4:0]=4, right index CIDXR[4:0]=5
Default: 1XX0 1000 (for both)
Modes: 1, 2, and 3

This register pair controls the left and right AUX2 inputs to the mixer. The registers are identical, one controls the left channel and the other controls the right channel.

| 7 | 6 | 5 | 4 | 3 | 2 | 1 | 0 |
|---|---|---|---|---|---|---|---|
| LA2ME, RA2ME | RES | RES | LA2G[4:0], RA2G[4:0] | | | | |

| | |
|---|---|
| LA2ME, | Left, Right AUX2 Mute Enable; When high, the AUX2 input is muted. |
| RA2ME | When low, the input operates normally. |
| LA2G[4:0], | Left, Right AUX2 Gain Select. This specifies the amount of gain applied. |
| RA2G[4:0] | to the AUX2 input signal. The values vary from 00h = +12 dB to 1Fh = −34.5 dB with 1.5 dB per step (see FIG. 45b). |

Left, Right Playback DAC Control (CLDACI, CRDACI)
Address: PCODAR+1 read, write; left index CIDXR[4:0]=6, right index CIDXR[4:0]=7

Default: 1X00 0000 (for both)

Modes: 1, 2, and 3

This register pair controls the left and right DAC analog outputs as they are input to the mixer. The registers are identical, one controls the left channel and the other controls the right channel.

| 7 | 6 | 5 | 4 | 3 | 2 | 1 | 0 |
|---|---|---|---|---|---|---|---|
| LDME, RDME | RES | LA[5:0], RA[5:0] | | | | | |

| | |
|---|---|
| LDME, RDME | Left, Right Mute Enable. When high, the DAC input to the mixer is muted. When low, the input operates normally. |
| LA[5:0], RA[5:0] | Left, Right D/A Attenuation Select. This specifies the amount of attenuation applied to the DAC input signal. The values vary from 00h = 0 dB to 3Fh = −94.5 dB with 1.5 dB per step (see FIG. 45b). |

Playback Data Format Register (CPDFI)

Address: PCODAR+1 read, write; index CIDXR[4:0]=8

Default: 0000 0000

Modes: The definition of this register varies based on the mode

This register specifies the sample rate (selects which of the two oscillator is to be used and the divide factor for that oscillator), stereo or mono operation, linear or companded data, and 8 or 16 bit data. It can only be changed when the mode change enable bit (CIDXR[6]) is active.

In mode 1, this register controls both the playback and record paths.

In mode 2, bits[3:0] of this register controls both the record and playback sample rate (i.e., they must be the same) and bits[7:4] specify the state of the playback-path data format.

In mode 3, this register controls only the playback path; the record sample rate is controlled by CRDFI.

| 7 | 6 | 5 | 4 | 3 | 2 | 1 | 0 |
|---|---|---|---|---|---|---|---|
| PDF[2:0] | | | PSM | PCD[2:0] | | | PCS |

PDF[2:0] Playback Data Format Selection. These three bits specify the play-back data format for the CODEC. * Modes 2 and 3 only. In Mode 1, PDF[2] is treated as a low regardless of the value written by the user.

| BIT 2 1 0 | Format |
|---|---|
| 0 0 0 | 8-bit unsigned |
| 0 0 1 | μ-Law |
| 0 1 0 | 16-bit signed, little endian |
| 0 1 1 | A-Law |
| 1 0 0 | Reserved, default to 8-bit unsigned* |
| 1 0 1 | IMA-compliant ADPCM* |
| 1 1 0 | 16-Bit signed, big endian* |
| 1 1 1 | Reserved, default to 8-bit unsigned* |

PSM Playback Stereo/Mono Select. When high, stereo operation is selected; samples will alternate left then right. When low, mono mode is selected; playback samples are fed to both left and right FIFOs. Record samples (in mode 1) come only from the left ADC.

PCD[2:0] Playback Clock Divider Select. These three bits specify the playback clock rate in mode 3, and the record and playback rate in modes 1 and 2. *These divide-downs are provided, to function when XTAL1, is less than 18.5 MHz.

-continued

| 7 | 6 | 5 | 4 | 3 | 2 | 1 | 0 |
|---|---|---|---|---|---|---|---|
| PDF[2:0] | | | PSM | PCD[2:0] | | | PCS |

| Bits 3 2 1 | Sampling Rate (kilohertz) 24.5 MHz XTAL | 16.9 MHz XTAL |
|---|---|---|
| 0 0 0 | 8.0 | 5.51 |
| 0 0 1 | 16.0 | 11.025 |
| 0 1 0 | 27.42 | 18.9 |
| 0 1 1 | 32.0 | 22.05 |
| 1 0 0 | +448 * | 37.8 |
| 1 0 1 | +384 * | 44.1 |
| 1 1 0 | 48.0 | 33.075 |
| 1 1 1 | 9.6 | 6.62 |

PCS Playback Crystal Select. When high, the 16.9344 MHz crystal oscillator (XTAL2) is used for the playback sample frequency. When low, the 24.576 MHz crystal oscillator (XTAL1) is used.

Configuration Register 1 (CFIG1I)

Address: PCODAR+1 read, write; index CIDXR[4:0]=9

Default: 00XX 1000

Modes: 1, 2, and 3

This register specifies whether I/O cycles or DMA are used to service the CODEC FIFOs, one or two channel DMA operation, and enables/disables the record and playback paths. Bits[7:2] are protected; to write to protected bits, CIDXR[MCE] must be set.

| 7 | 6 | 5 | 4 | 3 | 2 | 1 | 0 |
|---|---|---|---|---|---|---|---|
| RFIOS | PFIOS | RES | RES | CALEM | DS1/2 | RE | PE |

| | |
|---|---|
| RFIOS | Record FIFO I/O Select. When high, the record FIFO can only be serviced via I/O cycles. When low, DMA operation is supported. |
| PFIOS | Playback FIFO I/O Select. When high, the playback FIFO can only be serviced via I/O cycles. When low, DMA operation is supported. |
| CALEM | Calibration Emulation. This is a readable-writable bit. When high, it affects CSR2I[5]. |
| DS1/2 | 1 or 2 Channel DMA Operation Select. When high, single channel DMA operation is selected; only record or playback operation is allowed, not both; when both record and playback DMA are enabled in this mode, only the playback transfers will be serviced. When low, two-channel DMA operation is allowed. |
| RE | Record Enable. When high, the record CODEC path is enabled. When low, the record path is turned off and the record data available status bit (Status Register 1) is held inactive (low). |
| PE | Playback Enable. When high, the playback CODEC path is enabled. When low, the playback path is turned off and the playback buffer available status bit (Status Register 1) is held inactive (low). |

External Control Register (CEXTI)

Address: PCODAR+1 read, write; index CIDXR[4:0]=Ah

Default: 00XX 0X0X

Modes: 1, 2, and 3

This register contains the global interrupt enable control as well as control bits for the two general purpose external output pins.

| 7 | 6 | 5 | 4 | 3 | 2 | 1 | 0 |
|---|---|---|---|---|---|---|---|
| GPOUT[1:0] | | RES | RES | RWB | RES | GIE | RES |

| | |
|---|---|
| GPOUT[1:0] | General Purpose Output Flags. The state of these bits are reflected on the GPOUT[1:0] pins. |
| RWB | Read Write Bit. This bit is writable and readable; it does not control anything within the Device. |
| GIE | Global Interrupt Enable. When high, CODEC interrupts are enabled. When low, CODEC interrupts will not be passed on to the selected IRQ pin. The status bits are not affected by the state of this bit. |

Status Register 2 (CSR2I)
Address: PCODAR+1 read; index CIDXR[4:0]=Bh
Default: 0000 0000
Modes: 1, 2, and 3

This register reports certain FIFO errors, the state of the record and playback data request bits, and allows testing the A/D paths for clipping.

| 7 | 6 | 5 | 4 | 3 | 2 | 1 | 0 |
|---|---|---|---|---|---|---|---|
| RFO | PFU | CACT | DRPS | RADO[1:0] | | LADO[1:0] | |

| | |
|---|---|
| RFO | Record FIFO Overrun. This bit is set high whenever the record FIFO is full and the CODEC needs to load another sample (the sample is discarded). This bit is cleared to low by either a read of CSR1R or when CIDXR[MCE] goes from 1 to 0. |
| PFU | Playback FIFO Underrun. This bit is set high whenever the playback FIFO is empty and the CODEC needs another sample. This bit is cleared to low by either a read of CSR1R or when CIDXR[MCE] goes from 1 to 0. (In mode 1, the previous sample is reused. In modes 2 and 3, either the previous sample is reused or the data is forced to all zeros depending on the programming of CFIG2I[0].) |
| CACT | Calibration Active Emulation. If CFIG1I[3] is high, this bit goes high as a result of the mode change enable bit (CIDXR[6]) going inactive; it goes back low after the trailing edge of the first subsequent read of CSR2I. |
| DRPS | DMA Request Pin Status. This bit is high anytime that either the record or playback DMA request pins are active. |
| RADO[1:0], LADO[1:0] | Right and Left Overrange Detect. These two pairs of bits are updated on a sample by sample basis to reflect whether the signal into the DAC is causing clipping. |

| BIT 1 0 | CONDITION OF SIGNAL |
|---|---|
| 0 0 | Less than 1.5 dB underrange |
| 0 1 | Between 1.5 dB and 0 dB underrange |
| 1 0 | Between 0 dB and 1.5 dB overrange |
| 1 1 | More than 1.5 dB overrange |

Mode Select, ID Register (CMODEI)
Address: PCODAR+1 read, write; index CIDXR[4:0]=Ch
Default: 100X 1010
Modes: 1, 2, and 3

| 7 | 6 | 5 | 4 | 3 | 2 | 1 | 0 |
|---|---|---|---|---|---|---|---|
| ID[4] | MODE[1:0] | | RES | ID[3:0] | | | |

This register specifies the operating mode of the CODEC and reports the revision number of the circuit C.

| | |
|---|---|
| ID[4], ID[3:0] | Revision ID Number. These five bits specify the revision number of the present invention CODEC circuit C, which is initially 1,1010. These bits are read-only and cannot be changed. |
| MODE[1:0] | Mode Select. (0,0) = mode 1; (1,0) = mode 2; (0,1) = reserved; (1,1) = mode 3. In order to enter mode 3, a write of 6Ch must be made to this port; i.e., bit[5] will be forced low for writes of any other value. |

Loopback Control Register (CLCI)
Address: PCODAR+1 read, write; index CIDXR[4:0]=Dh
Default: 0000 00X0
Modes: 1, 2, and 3

This register enables and specifies the attenuation of the analog path between the output of the ADC path gain stage (at the input to the ADC) and the input of the DAC-loopback sum. This register affects both the left and right channels.

| 7 | 6 | 5 | 4 | 3 | 2 | 1 | 0 |
|---|---|---|---|---|---|---|---|
| LBA[5:0] | | | | | | RES | LBE |

| | |
|---|---|
| LBA[5:0] | Loopback Attenuation. This specifies the amount of attenuation applied to the loopback signals before being summed with the DAC outputs. The values vary from 00h = 0 dB to 3Fh = −94.5 dB with 1.5 dB per step (see FIG. 45b). |
| LBE | Loopback Enable. When high, the loopback path is enabled to be mixed with the DAC outputs. When cleared, the path is disabled and the signal is muted. |

Upper, Lower Playback Count Registers (CUPCTI, CLPCTI)
Address: PCODAR+1 read, write; upper index CIDXR[4:0]=Eh, lower index CIDXR[4:0]=Fh
Default: 0000 0000 (for both)
Modes: definition of these registers vary based on the mode These registers collectively provide the 16-bit preload value used by the playback sample counters. CUPCTI provides the upper preload bits [15:8] and CLPCTI provides the lower preload bits [7:0]. All 16 bits are loaded into the counter during the write of the upper byte; therefore, the lower byte should be written first; however, if only the low byte is written and the counter underflows, the new value will be placed into the timer. Reads of these registers return the value written into them, not the current state of the counter. In mode 1, this register is used for both playback and capture; in modes 2 and 3 it is used for playback only.

Configuration Register 2 (CFIG2I)
Address: PCODAR+1 read, write; index CIDXR[4:0]=10h
Default: 0000 XXX0
Modes: 2 and 3

| 7 | 6 | 5 | 4 | 3 | 2 | 1 | 0 |
|---|---|---|---|---|---|---|---|
| OFVS | TE | RSCD | PSCD | RES | RES | RES | DAOF |

| | |
|---|---|
| OFVS | Output Full Scale Voltage Select. When high, the full scale output is 2.9V for Vcc = 5V and 1.34 for Vcc = 3.3V. When low, the full scale output is 2.0V for Vcc = 5V and 1.00 for Vcc = 3.3V. This bit affects the left and right signals that exit the mixers, prior to entering CLOAI and CROAI; so it also changes the input to the record multiplexer. |

-continued

| 7 | 6 | 5 | 4 | 3 | 2 | 1 | 0 |
|---|---|---|---|---|---|---|---|
| OFVS | TE | RSCD | PSCD | RES | RES | RES | DAOF |

TE Timer Enable. When high, the timer and its associated interrupt are enabled. When low, the timer is disabled. The timer count is specified in CLTIMI and CUTIMI.
RSCD Record Sample Counter Disable. When high, this bit disables the record sample counter from counting. This bit is mode 3 accessible only and only affect the sample counter in mode 3.
PSCD Playback Sample Counter Disable. When high, this bit disables the playback sample counter from counting. This bit is mode 3 accessible only and only affect the sample counter in mode 3.
DAOF D/A Output Force Enable. When high, the output of the D/A converters are forced to the center of the scale whenever a playback FIFO underrun error occurs. When cleared, the last valid sample will be output in the event of an underrun.

Configuration Register 3 (CFIG3I)
Address: PCODAR+1 read, write; index CIDXR[4:0]=11h
Default: 0000 X000
Modes: bits[7:1] mode 3; bit[0] modes 2 and 3

In mode 3 this register provides for the programming of FIFO thresholds and the generation of I/O-mode FIFO service interrupts.

| 7 | 6 | 5 | 4 | 3 | 2 | 1 | 0 |
|---|---|---|---|---|---|---|---|
| RPIE | PPIE | FT[1:0] | | RES | PVFM | SYNA | RWB |

RPIE Record FIFO Service Request Interrupt Enable. When the record path is enabled and I/O operation is selected (CFIG1I), setting this bit high enables the generation of an interrupt request whenever the record FIFO/DMA interrupt bit in Status Register 3 becomes set. This bit is mode 3 accessible only.
PPIE Playback FIFO Service Request Interrupt Enable. When the playback path is enabled and I/O operation is selected (CFIG1I), setting this bit high enables the generation of an interrupt request whenever the playback FIFO/DMA interrupt bit in Status Register 3 becomes set. This bit is mode 3 accessible only.
FT[1:0] FIFO Threshold Select. These two bits specify the record and playback FIFO thresholds for when DMA or interrupt requests become active. These bits are mode 3 accessible only and do not have an effect in modes 1 and 2.

| FT 1 0 | Point At Which Request Becomes Active |
|---|---|
| 0 0 | Minimum: Record FIFO not empty; playback FIFO not full |
| 0 1 | Middle: Record FIFO half full; playback FIFO half empty |
| 1 0 | Maximum: Record FIFO full; playback FIFO empty |
| 1 1 | Reserved: (behaves the same as the minimum mode) |

PVFM Playback Variable Frequency Mode. This bit high selects playback-variable-frequency mode. In this mode, the sample rate is selected by a combination of CPDFI[0] and CPVFI to allow variable frequencies between 3.5 KHz and 32 KHz. The sound quality may be reduced when in this mode. This bit is mode 3 accessible only.
SYNA AUX1/Synth Signal Select. This bit selects the source of the signals that enter the CLAX1I and CRAX1I attenuators before entering the left and right mixers. This bit low selects the AUX1[L,R] input pins. This bit high selects the output of the synth DACs. This bit is mode 3 accessible only.
RWB Read Write Bit. This bit is writable and readable; it does not control anything within the device. This is mode 2 and mode 3 accessible Left, Right Line Input Control Registers (CLLICI, CRLICI)
Address: PCODAR+1 read, write; left index CIDXR[4:0]=12h, right index CIDXR[4:0]=13h
Default: 1XX0 1000 (for both)
Modes: 2 and 3

This register pair controls the gain/attenuation applied to the LINEIN inputs to the mixer. The registers are identical, one controls the left channel and the other controls the right channel.

| 7 | 6 | 5 | 4 | 3 | 2 | 1 | 0 |
|---|---|---|---|---|---|---|---|
| LLIME, RLIME | RES | RES | LLIG[4:0], RLIG[4:0] | | | | |

LLIME, RLIME Left, Right LINE Input Mute Enable. When high, the LINEIN input is muted. When low, the input operates normally.
LLIG[4:0], RLIG[4:0] Left, Right LINE Input Gain Select. This specifies the amount of gain applied to the LINEIN[L,R] input signals. The values vary from 0 = +12 dB to 1Fh = −34.5 dB with 1.5 dB per step (see FIG. 45b).

Lower, Upper Timer Registers (CLTIMI, CUTIMI)
Address: PCODAR+1 read, write; low index CIDXR[4:0]=14h, upper index CIDXR[4:0]=15h
Default: 0000 0000 (for both)
Modes: 2 and 3

These registers collectively provide the 16-bit preload value used by the general purpose timer. Each count represents 10 microseconds (total of 650 milliseconds). CUTIMII provides the upper preload bits [15:8] and CLTIMI provides the lower preload bits [7:0]. Writing to CLTIMI causes all 16 bits to be loaded into the general purpose timer. Reads of these registers return the value written into them, not the current state of the counter.

Left, Right MIC Input Control Registers (CLMICI, CRMICI)
Address: PCODAR+1 read, write; left index CIDXR[4:0]=16h, right index CIDXR[4:0]=17h
Default: 1XX0 1000 (for both)
Modes: 3

This register pair controls the left and right MIC inputs to the mixer. The registers are identical, one controls the left channel and the other controls the right channel.

| 7 | 6 | 5 | 4 | 3 | 2 | 1 | 0 |
|---|---|---|---|---|---|---|---|
| LMME, RMME | RES | RES | LMG[4:0], RMG[4:0] | | | | |

LMME, RMME Left, Right MIC Mute Enable. When high, the MIC input is muted. When low, the input operates normally.
LMG[4:0], RMG[4:0] Left, Right MIC Gain Select. This specifies the amount of gain applied to the MIC [L,R] input signals. The values vary from 0 = +12 dB to 1Fh = −34.5 dB with 1.5 dB per step (see FIG. 45b).

Status Register 3 (CSR3I)
Address: PCODAR+1 read, write (to clear specific bits); index CIDXR[4:0]=18h
Default: X000 0000
Modes: 2 and 3; definition of bits[5:4] vary based on the mode This register provides additional status information on the FIFOs as well as reporting the cause of various interrupt requests. Each of the TIR, RFDI, and PFDI bits are cleared by writing a 0 to the active bit; writing a 1 to a bit is ignored; these bits can also be cleared by a write of any value to CSR1R. Bits[3:0], the overrun-underrun bits, are cleared to a low by reading CSR1R; these bits are also cleared when the mode change enable bit in CIDXR goes from high to low.

| 7 | 6 | 5 | 4 | 3 | 2 | 1 | 0 |
|---|---|---|---|---|---|---|---|
| RES | TIR | RFDI | PFDI | RFU | RFO | PFO | PFU |

| | |
|---|---|
| TIR | Timer Interrupt Request. This bit high indicates an interrupt request from the timer. It is cleared by a writing a zero to this bit or by writing any value to CSR1R. |
| RFDI | Record FIFO Interrupt Request. This bit high indicates a record path interrupt. It is cleared by a writing a zero to this bit or by writing any value to CSR1R. Mode 2: this bit indicates an interrupt request from the record sample counter. Mode 3 and CFIG1I[7] = (DMA): this bit indicates an interrupt request from the record sample counter. Mode 3 and CFIG1I[7] = 1 (I/O): this bit indicates that the record FIFO threshold (CFIG3I) has been reached. |
| PFDI | Playback FIFO Interrupt Request. This bit high indicates a playback path interrupt. It is cleared by a writing a zero to this bit or by writing any value to CSR1R. Mode 2: this bit indicates an interrupt request from the playback sample counter. Mode 3 and CFIG1I[6] = 0 (DMA): this bit indicates an interrupt request from the playback sample counter. Mode 3 and CFIG1I[6] = 1 (I/O): this bit indicates that the playback FIFO threshold (CFIG3I) has been reached. |
| RFU | Record FIFO Underrun (Modes 2, 3). This bit is set high if there is an attempt to read from an empty record FIFO. |
| RFO | Record FIFO Overrun (Modes 2, 3). This bit is set high if the ADC needs to load a sample into a full record FIFO. It is identical to CSR2I[RFO]. |
| PFO | Playback FIFO Overrun (Modes 2, 3). This bit is set high if there is an attempt to write to a full playback FIFO. |
| PFU | Playback FIFO Underrun (Modes 2, 3). This bit is set high if the DAC needs a sample from an empty playback FIFO. It is identical to CSR2I[PFU]. |

Left, Right Output Attenuation Register (CLOAI, CROAI)

Address: PCODAR+1 read, write; left index CIDXR[4:0]=19h, right index CIDXR[4:0]=1Bh Default: 1XX0 0000 (for both);

Modes: 3 only; in mode 2 CLOAI is a read-only register that drives an 80h when read.

This register pair controls the left and right MONO and LINE output levels. The Line output mute control bit is also located in this register pair.

| 7 | 6 | 5 | 4 | 3 | 2 | 1 | 0 |
|---|---|---|---|---|---|---|---|
| LLOME, RLOME | RES | RES | LLOA[4:0], RLOA[4:0] | | | | |

| | |
|---|---|
| LLOME, RLOME | Line Output Mute Enable. When high, the LINE output is muted. When low, the output operates normally. |
| LLOA[4:0], RLOA[4:0] | Line Output Attenuation Select. This specifies the amount of attenuation applied to the both the MONO and LINE output signals. The values vary from 00h = 0 dB to 1Fh = −46.5 dB with 1.5 dB per step (see FIG. 45b). |

Mono I/O Control Register (CMONOI)

Address: PCODAR+1 read, write; index CIDXR[4:0]=1Ah

Default: 110X 0000

Modes: bits [7:6,4:0] modes 2 and 3; bit [5] mode 3

This register specifies the amount of attenuation applied to the mono input path. The mute controls for the mono input and output are also located here.

| 7 | 6 | 5 | 4 | 3 | 2 | 1 | 0 |
|---|---|---|---|---|---|---|---|
| MIME | MOME | AR3S | RES | MIA[3:0] | | | |

| | |
|---|---|
| MIME | Mono Input Mute Enable. When high, the mono input is muted. When low, the input is active. |
| MOME | Mono Output Mute Enable. When high, the mono output is muted. When low, the output operates normally. |
| AR3S | AREF to high impedance. When high, the AREF pin is placed into high impedance mode. When low, AREF operates normally. this bit is mode 3 accessible only. |
| MIA[3:0] | Mono Input Attenuation. This specifies the amount of attenuation to be applied to the mono input path. The values vary from 0 = 0 dB to 0Fh = −45 dB with 3.0 dB per step (see FIG. 45b). |

Record Data Format Register (CRDFI)

Address: PCODAR+1 read, write; index CIDXR[4:0]=1Ch

Default: 0000 0000

Modes: 2 and 3; definition of register varies based on the mode

This register specifies the sample rate (selects which of the two oscillator is to be used and the divide factor for that oscillator), stereo or mono operation, linear or companded data, and 8 or 16 bit data. It can only be changed when the mode change enable bit (CIDXR[6]) is active.

In mode 2, bits[3:0] are not used (the record-path sample rate is specified in CPDFI) and bits[7:4] specify the record-path data format.

In mode 3, all of this register controls record path attributes; the playback attributes are controlled by CPDFI.

| 7 | 6 | 5 | 4 | 3 | 2 | 1 | 0 |
|---|---|---|---|---|---|---|---|
| RDF[2:0] | | | RSM | RCD[2:0] | | | RCS |

RDF[2:0] Record Data Format Selection. These three bits specify the record data format for the CODEC. These bits are accessible in Modes 2 and 3 only.

| BIT 2 1 0 | Format |
|---|---|
| 0 0 0 | 8-bit unsigned |
| 0 0 1 | μ-Law |
| 0 1 0 | 16-bit signed, little endian |
| 0 1 1 | A-Law |
| 1 0 0 | Reserved, default to 8-bit unsigned |
| 1 0 1 | IMA-compliant ADPCM |
| 1 1 0 | 16-Bit signed, big endian |
| 1 1 1 | Reserved, default to 8-bit unsigned |

RSM Record Stereo/Mono Select. When high, stereo operation is selected; samples will alternate left then right. When low, mono mode is selected; record samples come only from the left ADC. This bit is accessible in modes 2 and 3 only.

RCD[2:0] Record Clock Divider Select. These three bits specify the record clock rate. These bits are accessible from mode 3 only; in mode 2, these bits are reserved. *These divide-downs are provided to function when XTAL1 is less than 18.5 MHz.

| | Sampling Rate (kilohertz) | |
|---|---|---|
| Bits 3 2 1 | 24.5 MHz XTAL | 16.9 MHz XTAL |
| 0 0 0 | 8.0 | 5.51 |
| 0 0 1 | 16.0 | 11.025 |
| 0 1 0 | 27.42 | 18.9 |
| 0 1 1 | 32.0 | 22.05 |
| 1 0 0 | ÷448 * | 37.8 |
| 1 0 1 | ÷384 * | 44.1 |
| 1 1 0 | 48.0 | 33.075 |
| 1 1 1 | 9.6 | 6.62 |

-continued

| | |
|---|---|
| RCS | Record Crystal Select. When high, the 16.9344 MHz crystal oscillator is used. When low, the 24.576 MHz crystal oscillator is used. This bit is accessible from mode 3 only; in mode 2, this bit is reserved. |

Upper, Lower Record Count Registers (CURCTI, CLRCTI)
Address: PCODAR+1 rd, wr; upper index CIDXR[4:0]=1Eh, lower index CIDXR[4:0]=1Fh
Default: 0000 0000 (for both)
Modes: 2 and 3; in mode 1, function is moved to CUPCTI and CLPCTI These registers collectively provide the 16-bit preload value used by the record sample counters. CURCTI provides the upper preload bits [15:8] and CLRCTI provides the lower preload bits [7:0]. All 16 bits are loaded into the counter during the write of the upper byte; therefore, the lower byte should be written first; however, if only the low byte is written and the counter underflows, the new value will be placed in the timer. Reads of these registers return the value written into them, not the current state of the counter.

Playback Variable Frequency Register (CPVFI)
Address: PCODAR+1 read, write; index CIDXR[4:0]=1Dh
Default: 0000 0000
Modes: 3 only This 8-bit register specifies the playback frequency when variable-frequency-playback mode has been enabled via CFIG3I. The playback frequency will be PCS/(16*(48+CPVFI)), where PCS is the frequency of the oscillator selected by CPDFI[0]. The 16.9 MHz oscillator provides a range from about 3.5 KHz to 22.05 KHz; the 24.5 MHz oscillator provides a range from about 5.0 KHz to 32 KHz. It is not necessary to set CIDXR[MCE] when altering the value of this register.

Referring to FIG. 45*a*, in mixer 606, for the record path of CODEC 505, the status of control register CLICI 604 controls multiplexer (MUX) 602 such that only one of four analog audio signals pass through MUX 602 and attenuation/gain control circuit 664. If not muted by attenuation/gain control circuit 664, the selected signal is then provided to either left record ADC 666, or looped back through attenuation/gain control circuit 606 to be summed in playback mixer 678 with the output of left playback DAC 680. This loop back is accomplished over loop back path 676, which provides a loop back path for system test and dub-over capability so that in playback mode, MICL 684, LINEINL 682, AUX1L 686, or left synthesizer DAC 692 output signals may be superimposed over audio signals coming from the output of left playback DAC 680. This provides a Karioke-type capability with stored audio signals coming from left playback DAC 680.

The contents of control register CFIG3I[SYNA] 607 is used to control left synth DAC MUX 694 to select between analog inputs AUX1L 686 and left synthesizer DAC 692. The selected analog audio signal then passes to the input of MUX 602 and to attenuation/gain control circuit 612. The output of attenuation/gain control circuit 612 is then input to main mixer 698 to be summed with all other non-muted analog audio input signals available at the input to main mixer 698.

Main mixer loopback path 677 provides the output of main mixer 698 to the input of MUX 602. Main mixer 698 output is also provided to attenuation/gain control circuit 674 for further submission to mono mixer 672, as LEFTOUT, where it is summed with analog output RIGHTOUT 616 from the right channel mixer (not shown). Signals LEFTOUT and RIGHTOUT are summed in mono mixer 672 and then sent through mute control 604 to be available as analog output signal MONOOUT 668. Signal LEFTOUT is also input to attenuation/gain control circuit 602. If not muted, LEFTOUT is available as an analog output left channel stereos signal LINEOUTL 670.

The analog audio input signal MONOIN 690 passes through attenuation/gain control circuit 696 and is available to main mixer 698 as an input signal, and as an analog mono input signal 618 to the right channel main mixer (not shown).

Figure 46:
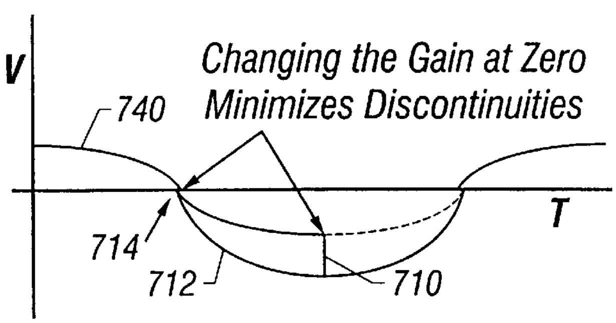
FIG. 46 is a diagram of a partial wave form indicating signal discontinuities for attenuation/gain changes.
Figure 47:
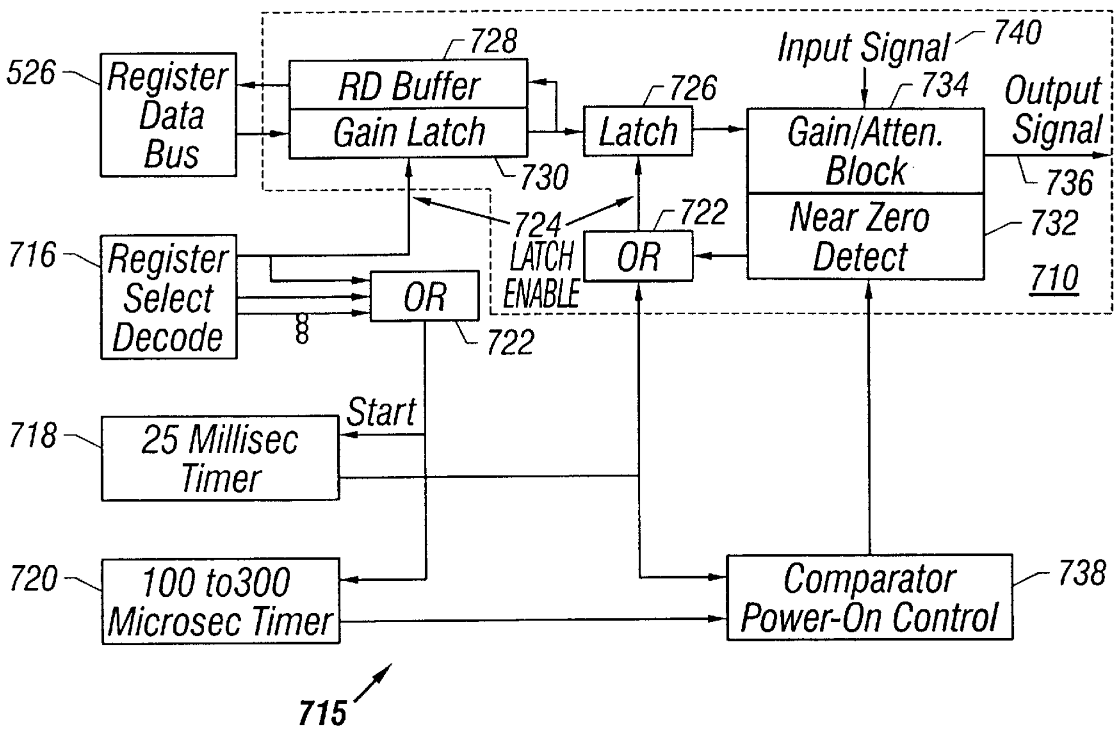
FIG. 47 is a block diagram showing zero detect circuits for eliminating "zipper" noise.

As shown in FIG. 47, the CODEC 505 includes circuitry to ensure that the amplitude of each respective analog audio signal in analog mixer 606 is maintained until the signal attains a nominal value. This is accomplished by zero detect circuit 715. Updated attenuation/gain control information is not loaded into the respective attenuation/gain control register until the analog audio signal that is to be acted on with the new attenuation/gain control value either crosses zero volts 714 (FIG. 46) with respect to a reference voltage, or until a time-out count is reached by 25 millisecond timer 718 which will result in a default condition causing the respective attenuation/gain control register in Registers block 566 (FIG. 50) to be loaded with the new gain/attenuation control value.

The attenuation/gain control circuit 710, shown within dotted line in FIG. 47, is provided for each attenuation/gain control register in Registers block 566 of FIG. 44. In the preferred embodiment, there are sixteen attenuation/gain control registers (CLCI, CLICI, CRICI, CLAX1I, CRAX1I, CLAX2I, CRAX2I, CLDACI, CRDACI, CLLICI, CRLICI, CLMICI, CRMICI, CLOAI, CROAI and CMONOI) which may be written to change the gain or attenuation control values stored therein, which value is in turn is used to change the amplitude of the analog audio signal being processed by the particular attenuation/gain control register being written to. In other applications, more or less attenuation/gain control registers may be implemented.

In operation, whenever one of the attenuation/gain control registers is written to, Register Select Decode block 716 latches the new attenuation/gain control value into gain latch 730. After decoding the write to one of the attenuation/gain control registers, Register Select Record block 716 sends an enable to 25 millisecond timer block 718 and 100 To 300 Microsecond block 720 to initiate a power-up. Power is then provided for 100 to 300 microseconds to each of the Near Zero Detect blocks 732, by Comparator Power-On Control block 738, enabled by 100 to 300 microsecond block 720.

The 25 millisecond timer block 718 utilizes ICLK3K, the 3.15 KHz clock, to count to 80. The timing in 100 to 300 Microsecond timer block 720 is accomplished by the logic therein waiting for two edges of 3.15 KHz clock, ICLK3K. Once powered, the Near Zero detect block 732 generates a strobe when the audio input signal 740 approaches nominal voltage. The zero detect logic in each Near Zero Detect block 732 may be implemented with comparators, or other circuits capable of providing an output signal whenever the input audio signal 740 is equal to a predetermined reference voltage. The zero detect strobe is used to latch the new attenuation/gain value into latch 726. The zero detect circuitry 732 will remain powered until the fixed 25 millisecond timer 718 completes its count.

An analog reference voltage (AREF) is used such that when VCC is 5 volts, the value of AREF is 0.376 times VCC, nominal. When VCC is 3.3 volts, the value of AREF is 0.303 times VCC, nominal. AREF is capable of driving up to 250 microamps without degradation and can be placed into high-impedance mode, controlled by CMONOI[AR3S].

If input signal 740 has not reached nominal voltage before the 25 millisecond timer 718 completes its count, the new attenuation/gain control value is nevertheless loaded into the respective attenuation/gain control register, as a default condition. If a write to any of the attenuation/gain control registers in Register block 566 (FIG. 50) occurs before the 25 millisecond timeout is reached, the 25 millisecond timer 718 is reset, regardless of its count status.

The zero detect circuit 715 minimizes "zipper" noise or other audible discontinuities when input signal 740 is to be increased or decreased in amplitude. By powering up the near zero detect circuits 732 only when an attenuation/gain register is written to, unnecessary noise, from comparators or other voltage detect circuits in Near Zero Detect block 732 switching every time a zero crossing is sensed is eliminated.

Referring to FIG. 46, by increasing the gain at input signal zero crossing 714, signal discontinuity 710 is eliminated. By using zero detect block 732, input signal 740 changes amplitude at zero crossing 714 is output from zero detect circuit 715 as output signal 736 (FIG. 47), and continues with its new amplitude along curve 712 (FIG. 46).

Figure 50:
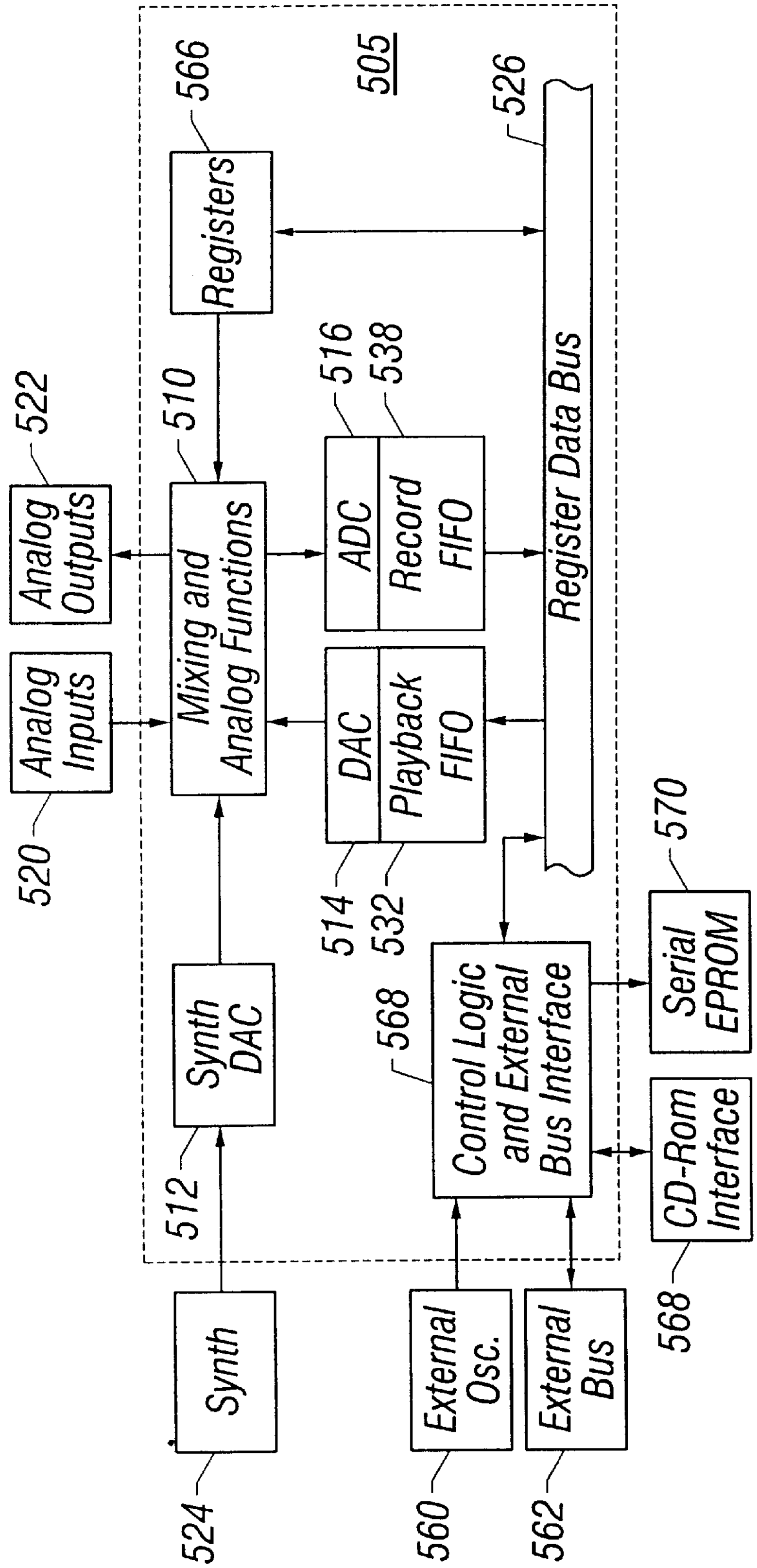
FIG. 50 is a block diagram showing internal and external data paths and interfacing with external devices, supported by the present invention.

All programmable attenuation/gain control circuits in CODEC 505 (triangles in analog mixer 606) include zero crossing detect circuitry 715. Zero crossing circuit 715 performs identically for each attenuation/gain control register in Registers block 566 (FIG. 50).

An additional noise management feature of CODEC 505 is used to suppress noise on power-up. Audible glitches from audio outputs LINEOUT 670 and MONOOUT 668 (FIG. 45*a*) are suppressed when power is being applied or removed from CODEC 505, or when low-power mode is entered or exited. During all power-up and power-down phases, CODEC 505 output amplifiers in mute circuits 602 and 604 (FIG. 45*a*) are muted.

To enhance the performance of the CODEC, digital operations occur on the rising edge of the 16.9 MHz system clock, and analog operations are performed on the falling edge of the system clock, or at some other time prior to the next rising edge of the system clock. Generally, digital operations inherently produce noise which must be attenuated as much as possible before analog operations are performed. Using different edges of the system clock, in addition to delaying the clocks generated from the system clock that are used by the analog circuitry with respect to the clocks used by the digital circuitry, will produce the desired result. Inherently noisy digital operations include, RAM reads, precharging a bus and performing an addition. Analog functions require a quiet supply and ground. For example, a comparator requires a low level noise background to be able to detect a one millivolt level to achieve a proper compare.

The record and playback paths of CODEC 505 are independently programmable to provide a different sample rate for playback and record. A continuously variable rate playback mode is provided for playback DAC 514 (FIG. 44), which includes a choice of two ranges of sample clock rates ranging from 3.5 to 22.05 KHz or from 5.0 to 32.00 KHz. Each sample rate range contains 256 incremental clock rates. By enabling this variable playback mode by modifying the status of control register CFIG3I, the playback frequency for playback DAC 514 can be continuously varied over 256 steps, resulting in smooth transitions between audio sample rates which produces high quality sounds. Previously, with only fourteen different sample rates being used, the data sample rate had to be increased and interpolated, then the rate increased again and the signal interpolated again to achieve the desired sound and transition between sample rates. This required excessive processor intervention.

Utilizing the feedback loops within CODEC analog mixer 606 (FIG. 45*a*), and the independent programmability of the sample rates of record ADC 516 and playback DAC 514, an analog audio signal may be sampled and converted to digital by record ADC 516 at one rate, then played back through playback DAC 514 at another rate. This feature provides a translator capability between an audio signal recorded and played at different sample rates. For example, the direct recording of compact disc (CD) audio, or digital audio tape data (DAT) onto formatted tapes without significant degradation of signal quality is implemented by CD audio data being converted to analog through playback DAC 514 at 44.1 KHz, then being processed through record ADC 516 circuitry and made available as serial or parallel digital audio data that can be recorded by external audio equipment on DAT at 48 KHz.

In the present invention, the continuously variable playback frequency mode can be selected to incrementally increase the playback sample rate in CODEC 505 without external processor intervention for up-sampling and interpolation. The frequency range is preferably selected by control register CPDFI[0] in the Registers block 566 (FIG. 50), which is programmable to be able to select, at any time, the playback frequency to be used, and thus, which clock is to be used. See FIG. 48. This requires some external processor intervention to load the frequency select instruction, but not as much overhead as previous audio systems. For software compatibility with existing systems, however, the playback-variable frequency mode is different than the 14 sample rate mode operation of playback DAC 514 and record ADC 516.

Oscillators with external crystals 560 (FIG. 50) are used to generate the range of frequencies for the playback variable frequency mode. Preferably, two external crystals in conjunction with on-chip circuitry are used to produce two clocks, one being at 24.576 MHz and one being at 16.9344 MHz. Selecting the 16.9 MHz clock with select logic circuit 762 will provide a 256 step frequency range from between 3.5 KHz to 22.05 KHz. Selecting the 24.5 MHz crystal will provide a 256 step frequency range of 5.0 to 32.00 KHz.

Figure 48:
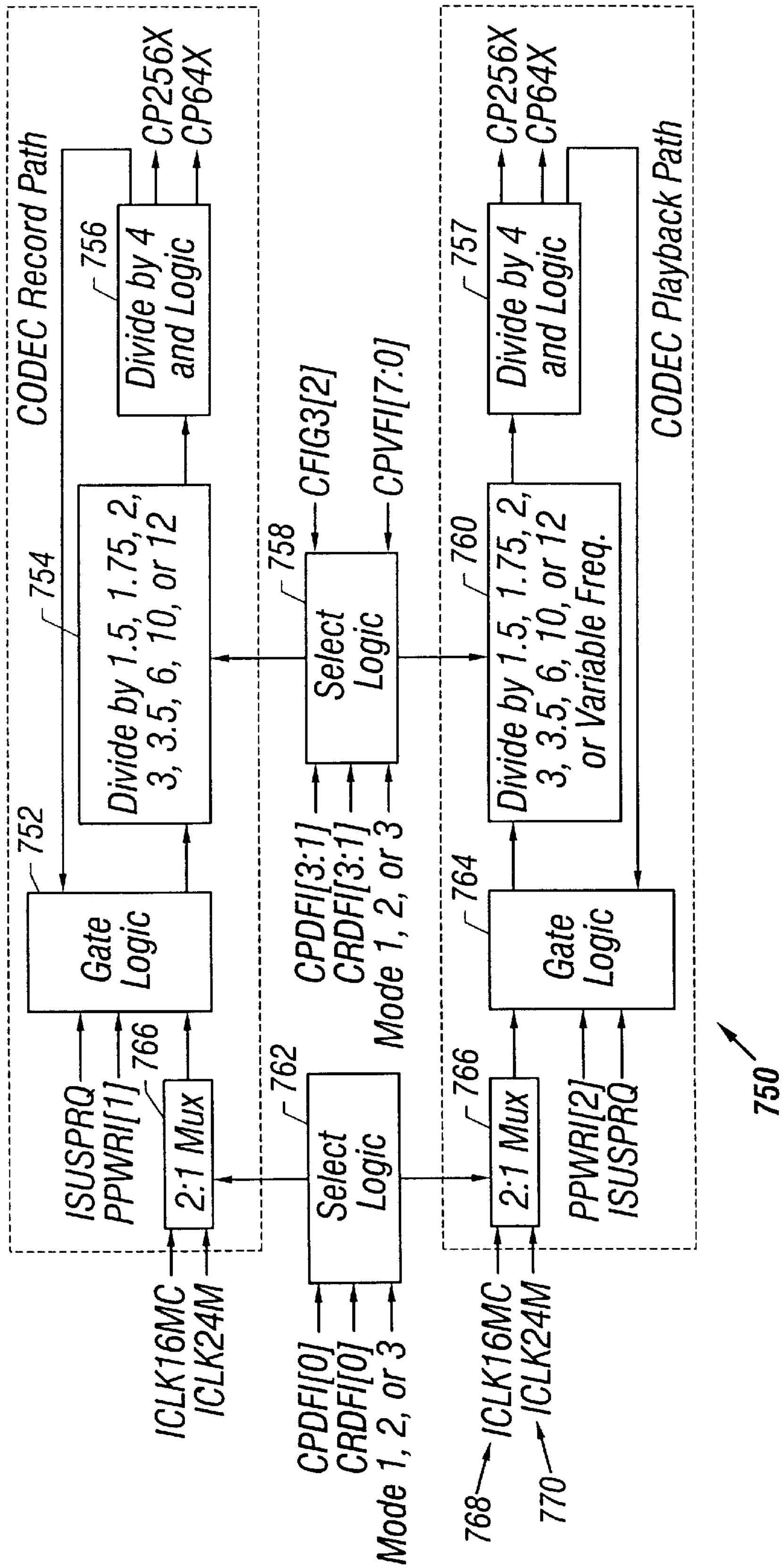
FIG. 48 is a block diagram showing clock generation functions in the present invention.

To provide each of the 256 steps over a selected frequency range, the chosen crystal oscillator is divided by three or more to create an X256 clock (sample rate times 256). The X256 clock is then divided by four to create the X64 clock (sample rate times 64). The X64 clock repeats an 8-cycle, aperiodic pattern which produces the frequencies within the selected range. The various clocks, generated by the divide-down logic in FIG. 48, are used to change the sample rate (pitch) during playback through the playback DAC 514 (FIG. 44), such that the higher the sample rate, the higher the pitch and the lower the sample rate, the lower the pitch. This capability of continuously variable playback sample rates can be used with any DAC, and is not limited to the Σ-Δ playback DAC 514 described herein.

Table C1 describes the formulas preferably used to select the sample frequency for each range.

TABLE C1

| Oscillator | Formula For Frequency | Range |
|---|---|---|
| 16.9344 MHz | 16,934,400/ (16*(48 + CPVFI)) | 3.5 KHz to 22.05 KHz. |

TABLE C1-continued

| Oscillator | Formula For Frequency | Range |
|---|---|---|
| 24.576 MHz | 24,576,000/ (16*(48 + CPVFI)) | 5.0 KHz to 32.00 KHz. |

Table C2 illustrates how the first ten clock frequencies in one range are generated using the 16.9 MHz external crystal oscillator.

TABLE C2

| | Number of oscillator clocks per X64 cycle based on SMX64[4:2] | | | | | | | | Frequency for |
|---|---|---|---|---|---|---|---|---|---|
| CPVFI | 0 | 1 | 2 | 3 | 4 | 5 | 6 | 7 | 16.9 MHz. osc. |
| 00h | 12 | 12 | 12 | 12 | 12 | 12 | 12 | 12 | 22.050 KHz. |
| 01h | 14 | 12 | 12 | 12 | 12 | 12 | 12 | 12 | 21.600 KHz. |
| 02h | 14 | 14 | 12 | 12 | 12 | 12 | 12 | 12 | 21.168 KHz. |
| 03h | 14 | 14 | 14 | 12 | 12 | 12 | 12 | 12 | 20.753 KHz. |
| 04h | 14 | 14 | 14 | 14 | 12 | 12 | 12 | 12 | 20.353 KHz. |
| 05h | 14 | 14 | 14 | 14 | 14 | 12 | 12 | 12 | 19.970 KHz. |
| 06h | 14 | 14 | 14 | 14 | 14 | 14 | 12 | 12 | 19.600 KHz. |
| 07h | 14 | 14 | 14 | 14 | 14 | 14 | 14 | 12 | 19.244 KHz. |
| 08h | 14 | 14 | 14 | 14 | 14 | 14 | 14 | 14 | 18.900 KHz. |
| 09h | 16 | 14 | 14 | 14 | 14 | 14 | 14 | 14 | 18.568 KHz. |

Table C3 illustrates the preferred way of using the X256 clock to create the wave forms illustrated Table C2. The 4-cycle pattern illustrated in Table C3, given by the status of register SMX64[1:0], is used to ensure that the X64 clock maintains a 50 percent duty cycle, which is preferred.

TABLE C3

| SMX64[1:0] | Number of oscillator clocks per X256 cycle |
|---|---|
| 0 | 3 + CPVFI[7:4] + (1 if ( (SMX64[4:2] < CPVFI[2:0]) AND (CPVFI[3] = 0) ) ) + (1 if (CPVFI[3] = 1) ) |
| 1 | 3 + CPVFI[7:4] + (1 if ( (SMX64[4:2] < CPVFI[2:0]) AND (CPVFI[3] = 1) ) ) |
| 2 | 3 + CPVFI[7:4] + (1 if ( (SMX64[4:2] < CPVFI[2:0]) AND (CPVFI[3] = 0) ) ) + (1 if (CPVFI[3] = 1) ) |
| 3 | 3 + CPVFI[7:4] + (1 if ( (SMX64[4:2] < CPVFI[2:0]) AND (CPVFI[3] = 1) ) ) |

FIG. 48 illustrates the clock select circuitry which provides the independently selectable sample rates for the record and playback paths of CODEC 505, and the continuously variable playback sample rates for playback DAC 514. Playback DAC 514 and record ADC 516 (FIG. 44) are each capable of operating at one of 14 different sample rates ranging from 5.5 to 48.0 KHz. These sample rates are preferably derived from the two external crystal oscillators 560 (FIG. 50). Select logic circuitry 762 in CODEC 505 controls each 2:1 MUX 766 to select the output of either the 16 MHz or 24 MHz oscillator, depending on which sample rate is selected.

Figure 51:
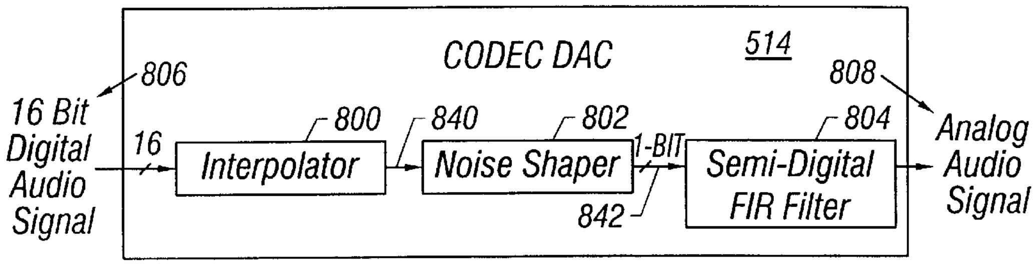
FIG. 51 is a block diagram of the digital to analog converter block of the present invention.

Gate logic block 752 in the record path, and 764 in the playback path, provide the selected clock signal to divide-down logic blocks 754, 756, and blocks 760, 757, respectively, to provide a selected slower clock. As shown in FIG. 48, the status of control registers CPDFI[0], CPDFI [3:1], CRDFI[0], CRDFI[3:10], CFIG3I and CPVFI[7:0] controls the divide-down logic to be used to generate a selected clock signal. Clock CP256X is used to control operations in the playback DAC 514. Clock CP64X is used to control operations in the semi-digital filter 804 (FIG. 51).

Figure 49B:
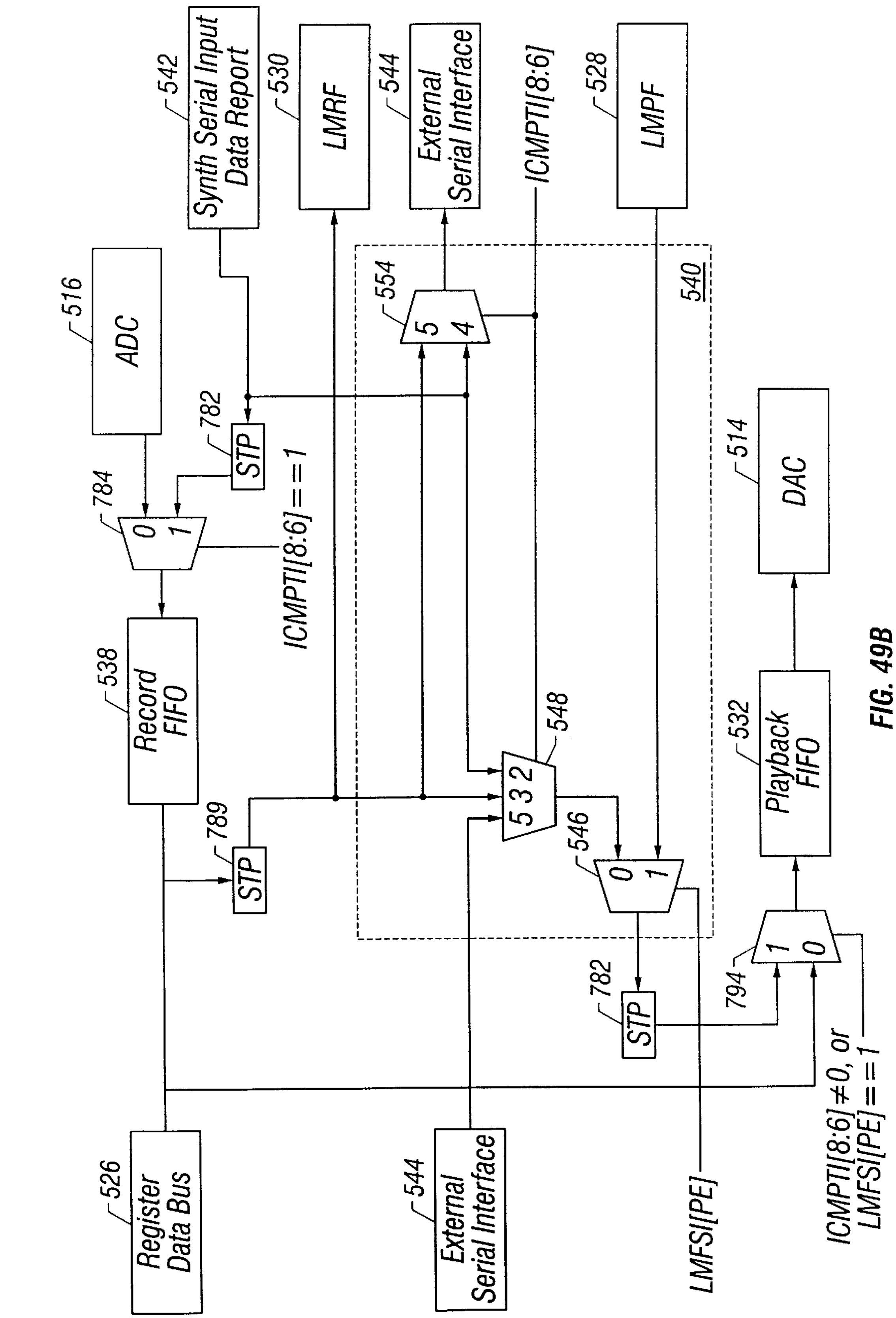
FIG. 49*b* is a block diagram of the serial transfer control block.

Referring to FIGS. 49*a* and 49*b*, CODEC 505 includes logic and control for transfers of serial digital audio data, including parallel-to-serial (PTS) conversion blocks 788, 789 and serial-to-parallel (STP) conversion logic 782. A record multiplexer (MUX) 784 is controlled by control register ICMPTI[8:6]. If bits [8:6] equal zero, MUX 784 selects parallel digital audio data from record ADC 516. If equal to one, MUX 784 selects the output of STP conversion logic 782. In the record path, the output of record MUX 784 is provided to the CODEC record FIFO 538. Referring to FIG. 44, the output of record FIFO 538 is available on register data bus 526; at local memory control 790 (which may transfer the data to off-chip local memory 110, FIG. 44, for storage as a record FIFO) via parallel to serial converter 789, serial transfer control 540 and data path 550; and at the input of PTS block 789 whereby the data is then provided, via Serial Transfer Control block 540, to: record FIFO 538, playback FIFO 532 (via serial to parallel converter 782), or to External Serial Interface 544.

As shown in FIG. 49*b*, in the CODEC playback path, a playback MUX 794 is controlled by control registers ICMPTI[8:6] and LMFSI[PE]. If ICMPTI[8:6] is not equal to one, or if LMFSI[PE] equals one, then audio data from STP block 782 is available at the input to playback FIFO 532. Otherwise, data from register data bus 526 is available at playback FIFO 532. As shown if FIG. 49*a*, data from local memory control 790 (which may obtain data from local memory 110, FIG. 44) is provided to playback FIFO 532 via playback MUX 794. Audio data from synth DSP 796 or record FIFO 538 may also be available at the input of playback MUX 794. As illustrated in FIG. 49*b*, the value of ICMPTI[8:6] determines the operation of serial transfer control MUXES 554 and 548. Serial transfer control MUX 546 operation is controlled by the status of LMFSI[PE].

As shown in FIG. 44, audio data from synthesizer DSP 796 is also available at the input of synthesizer DAC 512. The output of synth DAC 512 is provided as an analog input to left synth DAC MUX 649 (and right synth DAC MUX, not shown) in CODEC analog mixer 606 (FIG. 45*a*). Synthesizer DSP 796 may be an external device, or may be included in a synthesizer module on the same monolithic integrated circuit as the CODEC device 505 to increase the flexibility and speed of operation between the CODEC 505 and the synthesizer.

With the arrangement of STP and PTS converter logic blocks 782 and 789, respectively, and Serial Transfer Control block 540, a digital loop back capability between record and playback paths of CODEC 505 exists. This provides greater flexibility for testing and for data transfer of audio data from external sources to or from record FIFO 538 or playback FIFO 532, or to off-chip local memory 110, FIG. 44, via local memory control 790, or to external system memory (not shown). A digital data path (FIGS. 44, 49*a*), via PTS and STP blocks 789 and 782 is depicted between the record FIFO 538 output and the playback FIFO 532 input. The loop between the playback DAC 514 output and the record ADC 516 input is analog and resides in Mixer 606, FIG. 45*a*, and is illustrated with left playback DAC 680 looping to left record ADC 666.

External serial interface 544 may be connected to a synthesizer DSP having a serial input and output (not shown) whereby that synthesizer DSP could receive serial data from, via Serial Transfer Control block 540, record FIFO 538, and could send serial data to, via Serial Transfer Control block 540, playback FIFO 532.

The record and playback MUXES 784 and 794, in the serial data transfer logic of CODEC 505 are preferably bit-stream multiplexers. Preferably, state machines are used to generate and/or operate on the control signals and clocks necessary to accomplish the transfers. See the description of control signals during serial data transfers, above. Most transfers in Serial Transfer Control block 540, operate off a 2.1 MHz, 50 percent duty cycle clock, derived by dividing the 16.9344 MHz crystal oscillator by eight. Transfers from the synth DSP 796 to an external device utilize 32 clocks per frame, based on the synth DSP frame rate. The STP logic blocks 782 are 16-bit slaves to the bit streams that drive them. A pulse, STSYNC, generated by serial transfer control block 540, is followed by 16 bits of data, MSB first. As with the PTS blocks 788, 789 the data configuration and order is the same as for 16-bit DMA transfers. STSYNC toggles after the LSB of each 16-bit left or right data sample is transferred.

Each PTS converter blocks 788, 789 transfer operation brings in 16-bits of data to be shifted out serially. The number of transfers, the data configuration, and the order of the data varies based on the transfer mode selected, discussed below. The PTS blocks 788, 789 behave the same as that of 16-bit DMA transfers to the FIFOs, described below and depicted in Table C4 (e.g., if in 8-bit mono mode, there is one serial transfer for every two data samples, with the first sample being the LSBs and the second being the MSBs or, if in 16-bit stereo mode, there are two transfers for every sample received.)

TABLE C4

| | 8-bit DMA | | 16-bit DMA | |
|---|---|---|---|---|
| Sample Mode | Samples per DRQ | Cycles per DRQ | Samples per DRQ | Cycles per DRQ |
| 4-bit ADPCM mono | 2 | 1 | 4 | 1 |
| 4-bit ADPCM stereo | 1 | 1 | 2 | 1 |
| 8-bit mono (linear, $\mu$-law, A-law) | 1 | 1 | 2 | 1 |
| 8-bit stereo (linear, $\mu$-law, A-law) | 1 | 2 | 1 | 1 |
| 16-bit mono | 1 | 2 | 1 | 1 |
| 16-bit stereo | 1 | 4 | 1 | 2 |

The PTS blocks 788, 789 indicates that there is data ready to be transferred out by setting a flag. The serial transfer control block 540 responds by generating a pulse, STSYNC (serial transfer sync) that is intended to initiate the flow of serial data, MSB first. After 16 bits are transferred, a clear pulse is sent to PTS blocks 788, 789 from the serial transfer control block 540 so new data can be loaded into the respective PTS block 788 or 789.

Preferably, there are three sources and three destinations for all digital audio data multiplexed through the serial transfer control block 540. Various operating modes can be selected by modifying the contents of a control register, ICPMTI in Registers block 566 (FIG. 50), to the selected mode of operation shown in Table C5.

TABLE C5

| ICMPTI[STM] | Source | Destination | Format | Sample Rate |
|---|---|---|---|---|
| 0 | Serial transfer mode not enabled | | | |
| 1 | Synth DSP | Record FIFO input | 16-bit stereo | 44.1 KHz. |
| 2 | Synth DSP | Playback FIFO input | 16-bit stereo | 44.1 KHz. |
| 3 | Record FIFO output | Playback FIFO input | CRDFI[3:0] | CRDFI[7.4] |
| 4 | Synth DSP | External serial interface (port) out | 16-bit stereo | 44.1 KHz. or less |
| 5 | Record FIFO output | External serial interface (port) out | CRDFI[3:0] | CRDI[7.4] |
| | External serial interface (port) in | Playback FIFO input | | |

In general, if record or playback FIFO 538, 532 is the data destination, the format and sample rate of that path must conform to that shown in Table C5, otherwise, indeterminate data transfers will result. For example, with STM=2, the playback path sample rate and format must be the same as the synth DSP 796 (16-bit stereo, 44.1 KHz). With STM=3, the playback path sample rate and format must match the record path. In mode 4, the sample rate is 44.1 KHz or less. The modes where synth DSP 796 specifies that the sample rate can be lower than 44.1 KHz is where the value in synthesizer global mode register SGMI[ENH] is low and the register indicating the number of active synthesizer voices, SAVI[AV], is set to greater than 14. That is, if more than 14 audio voices, or signals, are being processed, the sample rate in these modes can be lower than 44.1 KHz. Otherwise, the first fourteen signals are processed at 44.1 KHz. For modes STM=1 and STM=2, CODEC 505 only supports a sample rate of 44.1 KHz. In these two modes, if synth DSP 796 operates at other than 44.1 KHz, proper operation will not occur.

As shown in FIG. 50, during playback mode, digital audio data, from external system memory (not shown), which may be formatted in one of several selectable formats, is provided, via DMA or I/O transfers, to external bus 562, through control logic and external bus interface block 568, and on to register data bus 526 as left and right channel 16-bit stereo data, for ultimate submission to 32-bit wide playback FIFO 532, or LMPF 528 (FIG. 44). The LMPF 528 (FIG. 44) may down-load prerecorded left and right channel 16-bit wide digital stereo audio data signals directly over register data bus 526 to the playback FIFO 532, whereby prior I/O or DMA transfers would have been made between the external system memory and the LMPF 528, which reduces the number of DMA transfers necessary between external system memory and CODEC playback FIFO 532. During playback, the most common mode of data transfer is DMA transfers between the external system memory and the CODEC playback FIFO 532.

In either case, the audio data is then output from playback FIFO 532, formatted (decompressed) to 16-bit signed data, as described in discussion of Format Conversion block 534 in FIG. 44, and then input to the playback DAC 514 as 16-bit signed data. The data is then sent to the Mixing Analog Functions block 510, which contains left and right analog mixers, discussed previously regarding description of FIG. 45*a*.

In the record path, external analog audio signals that are input through the CODEC analog input pins 520 are sent through Mixing and Analog Functions block 510, and are provided as left and right channel stereo 16-bit signed digital signals to record ADC 516. The 16-bit left and right channel stereo data from record ADC 516 is then formatted to a pre-selected format and sent to 32-bit wide record FIFO 538 for further submission to register data bus 526, then to external bus 562, then to external system memory (not shown) via DMA or I/O data transfers or to LMRF 530 (FIG. 44). In record mode, DMA data transfers occur between either the LMRF 530 (where LMRF 530 has been loaded with audio data from on-chip record FIFO 538) and the external system memory via external bus 562 or, directly between the on-chip record FIFO 538 and the external system memory.

CODEC 505 is capable of performing I/O between the external system memory and the CODEC on-chip record and playback FIFOs 538, 532, and also between the system memory and the off-chip LMPF 528 and LMRF 530, for improved system flexibility.

Referring to FIG. 50, when the playback path of CODEC 505 is in mono mode, with control register CPDFI[4] being active low, both the left and right channel stereo DACs in playback DAC 514 block are provided with the same audio data from playback FIFO 532. When the record path is in mono mode, with control register CRDFI[4] being active low, preferably only data from the left stereo ADC in record ADC 516 block (data from right stereo ADC ignored) is processed and provided to the record FIFO 538. In an alternative embodiment in mono mode, only data from the right stereo ADC is provided to record FIFO 538.

Aliasing problems arise in the record ADC 516 when audio signal frequencies are processed at greater than the Nyquist rate, i.e. greater than 0.5 $f_s$ (one-half the sample rate). Stop band and reject circuitry is used to eliminate signal reflections at multiples of $f_s$, plus and minus the signal frequency. The stop band rejection at 0.6 $F_s$ for 22 KHz is preferably greater than 75 dB. Stop band rejection is used in combination with analog filtering to eliminate high frequency images (reflections) during D/A conversions in playback DAC 514.

Oversampling in record ADC 516 is performed at 64 times the sample rate at a lower bit resolution. The signal is then down-sampled and filtered in record ADC 516 until the desired resolution and sample rate, for instance, 44.1 KHz at 16 bits, is achieved. The detailed description of the functions and operation of record ADC 516 circuitry is discussed below.

Table C4, above, provides information regarding the number of audio data samples transformed per DMA transfer, and the number of cycles per DMA transfer for each 8-bit or 16-bit DMA transfer, depending on the type of DMA transfer selected. For example, in 8-bit DMA transfer mode, audio data formatted as 4-bit ADPCM mono audio data will transfer two 4-bit samples during one DMA cycle. In 16-bit DMA transfer mode, four 4-bit ADPCM mono samples will be transferred during one DMA cycle. During 16-bit DMA cycles, the first byte to playback FIFO 532 is assigned to bits [7:0] and the second byte bits [15:8]. Simultaneous record and playback (read and write) operation is provided.

During I/O operations, the external system processor (not shown) reads the CODEC 505 status registers to determine if an I/O operation is needed and addresses CODEC 505 via Control Logic and External Bus Interface 568 to determine which area within CODEC 505 has requested data. The external system control (not shown) can perform an I/O operation for data transfer to the playback or record FIFOs (532, 538), asynchronously. Error conditions for record FIFO 538 and playback FIFO 532 are shown in Table C6.

TABLE C6

| Error Condition | FIFO State | Action | Result |
|---|---|---|---|
| Playback FIFO Underrun | Playback FIFO empty | DAC needs another sample | In mode 1, the last sample in the FIFO will be reused; in modes 2 and 3, either the last sample will be reused or zeros will be used based on the state of configuration register CFIG2I[0]. The condition is reported in status registers CSR1R[4], CSR2I[6], and CSR3I[0]. |
| Playback FIFO Overrun | Playback FIFO full | SBI writes another sample | The samples is thrown out and CSR1R[3:2] are not updated. The condition is reported in CSR3I[1]. |
| Record FIFO Underrun | Record FIFO empty | SBI reads another sample | The data is not valid and CSR1R[7:6] are not updated. The condition is reported in CSR3I[3]. |
| Record FIFO Overrun | Record FIFO full | ACD gets another sample | The new sample is thrown out; condition is reported in CSR1R[4], CSR2I[7], and CSR3R[2]. |

With the 16-sample, 32-bit record and playback FIFOs, 538, 532, preferably configured with 16-bits dedicated to left channel data and 16-bits to the right channel data, thresholds, or taps, on the record and playback FIFOs 538, 532 at the 0, 7, and 15 sample address, correspond to "empty," "half-full" and "full." These addresses are monitored by control logic block 568 so a I/O interrupt request (IRQ) or DMA request (DRQ) can be generated (Mode 3 only, explained below) depending on the state of CODEC 505's record or playback FIFOs 538, 532. This operation is explained in greater detail, below.

Separate DRQ signals are capable of being generated for the record and playback FIFOs 538, 532. In external systems that can spare only a single DMA channel for CODEC 505, a mode is provided that allows the playback DRQ to be shared so it can function as either the record or playback DMA request channel. Systems lacking DMA capability may use I/O transfers instead. The DMA transfer mode is specified in configuration control register CFIG1I of Registers block 566 (FIG. 50). If the record or playback paths are disabled (via CFIG1I [1:0]), after the associated DRQ request signal has become active, the audio data sample will continue to be transferred, while waiting for the acknowledge, as if the path were still enabled. After the final audio sample is transferred, no other DMA requests will be serviced.

When the record path is disabled, via CFIG1I, or when the record and playback paths both are being enabled for DMA transfers but single channel DMA operation is selected with CFIG1I[2:0]=[1,1,1], then all data remaining in record FIFO 538 is cleared so that when record FIFO 538 is re-activated, no old data will be available for processing. Before being disabled, however, the record path prior to record FIFO 538, including format conversion block 536 (FIG. 44), and filtering functions in record ADC 516, is not cleared for four sample periods.

When the playback path is disabled, via CFIG1I, the playback audio is immediately muted and all samples remaining in playback FIFO 532 are allowed to shift out of FIFO 532 at the sample rate. Four sample periods after playback FIFO 532 is empty, with zeros driven through the post-FIFO playback path, the playback path is disabled to minimize power consumption.

Off-chip local memory 110 (FIG. 44) is preferably used in conjunction with the on-chip playback and record FIFOs 532, 538. Preferably, local memory 110 is figured as a large record and a large playback FIFO, each with approximately 16-megabits of 8-bit addresses. A 19-bit counter in CODEC Counters, Timers block 518 is programmed to select the size of the area in DRAM to form the respective LMPF 528 and LMRF 530, which can be configured to hold up to 512K samples. More or less audio sample memory for the LMPF 528 and LMRF 530, or local memory 110, may be configured depending on design and/or application requirements. It is preferable to use DRAM instead of SRAM due to lower cost and power requirements.

CODEC 505 includes a mode for performing interleaved DMA transfers of data between external system memory and the LMPF 528, and vice versa. In interleaved data mode, external digital audio data samples, which are stored sequentially in external system memory as L1, R1, L2, R2, . . . are transferred over external bus 562, to local memory control 790 (FIG. 49*a*), in Control Logic block 568 (FIG. 50), which reformats the data prior to storing it in the LMPF 528 such that the left channel data samples are stored in one area of off-chip local memory 110 as L1, L2, L3, . . . block and the right channel data samples are stored in another area of local memory 110 data as R1, R2, R3, . . . block. In mono mode, the same data is stored in both blocks of local memory 110. For record mode in CODEC 505, the samples would be sent from LMRF 530 to external system memory, using the same method in reverse.

Two 16-sample counters in Counters, Etc. block 518 (FIG. 44) are provided, one for playback FIFO 532 and one for record FIFO 538. The sample counters count the number of samples that go into or come out of each respective FIFO. Each counter decrements by one every sample period, except in ADPCM mode. After the counter reaches zero, an interrupt is generated, if not masked, and the counter is reloaded with the next value the counter is to decrement from. The count value of the counters are programmed by way of record and playback count registers (CURCTI, CORCTI, CUPCTI and CLPCTI) in Registers block 566 (FIG. 50). Status of the counters is reported via control register CSR3I in Registers block 566. In mode 3, explained below, the CODEC playback counter can be made to decrement when a DMA transfer is made from external system memory to off-chip local memory 110, as well as when DMA transfers are made from external system memory to the on-chip record or playback FIFOs 538, 532.

Table C7 shows the relationship between the data format and the events causing the sample counters to decrement.

TABLE C7

| Sample Mode | Event that causes the counter to decrement (sample event) |
|---|---|
| 4-bit ADPCM mono | every 4 bytes (8 mono samples) transferred into the record FIFO or out of playback FIFO |
| 4-bit ADPCM stereo | every 4 bytes (4 stereo samples) transferred into the record FIFO or out of playback FIFO |
| 8-bit mono | every byte (1 mono sample) transferred into the record FIFO or out of playback FIFO |
| 8-bit stereo | every 2 bytes (1 stereo sample) transferred into the record FIFO or out of playback FIFO |
| 16-bit mono | every 2 bytes (1 mono sample) transferred into the record FIFO or out of playback FIFO |
| 16-bit stereo | every 4 bytes (1 stereo sample) transferred into the record FIFO or out of playback FIFO |

Table C8 identifies the events causing the sample counters to decrement, and the variables used in the preferable Boolean equations, below, which are used to generate the count enable inputs to the counters.

```
CPLYSCEN = (MODE==1)*/(CIDXR[DTD]*CSR1R[GINT])*
     (  CFIG1I[PE]*(PLAYBACK SAMPLE EVENT)
     + /CFIG1I[PE]*CFIG1I[RE]*(RECORD SAMPLE EVENT)  )
+ CFIG1I[PE]*/(CIDXR[DTD]*CSR3I[PFDI])*(PLAYBACK SAMPLE EVENT)*
     (  (MODE==2) + ((MODE==3)*/CFIG2I[PSCD]*/CFIG1I[PFIOS])  );
CRECSCEN = CFIG1I[RE]*/(CIDXR[DTD]*CSR3I[RFDI])*(RECORD SAMPLE EVENT)*
          / (CFIGI[PE] * CFIG1I[DS1/2] *
            (  (MODE==2) + (MODE==3)*/CFIG2I[RCSD]*/CFIG1I[RFIOS])  );
```

TABLE C8

| Sample Event | The event that causes the counter to decrement as defined in the table above the equations |
|---|---|
| CPLYSCEN | Codec playback path sample counter count enable |
| CRECSCEN | Codec record path sample counter count enable |
| CIDXR[DTD] | DMA transfer disable on the sample counter's interrupt |
| CSR1R[GINT] | Global interrupt status bit set |
| CSR3I[PFDI,RFDI] | Playback, record path interrupt status bits |
| CFIG1I[PE,RE] | Playback, record path enables |
| CFIG1I[PFIOS,RFIOS] | Playback, record path I/O (high) or DMA (low) selects |
| CFIG1I[DS1/2] | Selects single-channel DMA operation |
| CFIG2I[PCSD,RCSD] | Playback, record sample counter disable |

Table C9 shows the format by which audio data is provided to and received from the record and playback FIFOs 538, 532 of CODEC 505 from the prospective of an external system or microprocessor (not shown). The letter "S" in Table C6 refers to "sample" and the number following the letter "S" refers to the sample number. The letter "R" or "L" after the sample number refers to right or left channel stereo audio data.

TABLE C9

| Sample Mode | Order (first byte, second byte, . . .) |
|---|---|
| 4-bit ADPCM mono | (S2 in bits [7:4]; S1 in bits [3:0]), (S4 in bits [7:4]; S3 in bits [3:0]), . . . |
| 4-bit ADPCM stereo | (S1R in bits [7:4]; S1L in bits [3:0]), (S2R in bits [7:4]; S2L in bits [3:0]), . . . |
| 8-bit mono (linear, $\mu$-law, A-law) | S1, S2, S3 . . . |
| 8 bit stereo (linear, $\mu$-law, A-law) | S1L, S1R, S2L . . . |
| 16-bit mono little endian | S1[7:0], S1[15:8], S2[7:0] . . . |
| 16-bit mono big endian | S1[15:8], S1[7:0], S2[15:8] . . . |
| 16-bit stereo little endian | S1L[7:0], S1L[15:8], S1R[7:0], S1R[15:8], S2L[7:0] . . . |
| 16-bit stereo bit endian | S1L[15:8], S1L[7:0], S1R[15:8], S1R[7:0], S2L[15:8] . . . |

The CODEC timers, located in Counters and Timers block 518 (FIG. 44), are used to time certain external system functions, such as length of time to play an audio signal, etc. An interrupt is generated when the timer count is complete. CODEC 505 preferably does not utilize a timer in this block for its functions, but having this capability for industry compatibility and expandability purposes is necessary.

The CODEC 505 can operate in one of three modes during playback or record. The CODEC 505 is generally register compatible with present audio systems, by operating in modes 1 and 2. An indirect addressing mechanism is used for accessing most of the CODEC registers, contained in Registers block 566 FIG. 50. In mode 1, there are preferably 16 indirect registers. In mode 2, there are preferably 28 indirect registers. In mode 3, which is unique to CODEC 505, there are preferably 32 indirect registers. These modes operate as follows:

MODE 1. The playback sample counter in Counters, etc. block 518, FIG. 44, decrements when the playback path is enabled (CFIG1I) or the record path is enabled (CFIG1I). When both paths are enabled, only the playback path affects the counter and the record sample counter is not available. If register CODEC index address register, CIDXR [DTD], is set and the active path generates an interrupt (CSR1R[GINT]), then the sample counter stops counting. The counter starts counting again once the interrupt or CIDXR[DTD] is cleared. The DMA or I/O cycle control bits, CFIG1I[7:6], do not affect the sample counter's behavior.

MODE 2. The playback sample counter decrements when the playback path is enabled (CFIG1I). The record sample counter decrements when the record path is enabled (CFIG1I), unless CFIG1I and CFIG1I are also enabled. If CODEC index address register, CIDXR[DTD], is set and the active path generates an interrupt (CSR3R[5:4]), then the respective path that requested the interrupt stops operating. That data path begins operation and the counter starts counting again once the interrupt or CIDXR[DTD] is cleared. The DMA or I/O cycle control bits, CFIG1I[7:6], do not affect the sample counter's behavior.

MODE 3. Same as mode 2 operation, except the sample counters do not count when in I/O mode (CFIG1I[7:6]). Also, an enable is provided for each sample counter from configuration register, CFIG2I[5:4]. This is an enhanced mode, with independent record and playback path sample rates, record and playback programmable FIFO thresholds, additional analog mixer input enabled for synthesizer DAC audio signals, attenuation/gain controls for mixer 606 (FIG. 45*a*) LINE/MONO outputs, and continuously variable programmable sample frequency mode (256 steps) in playback path.

A programmable 16-bit timer is provided in modes 2 and 3. This timer has approximately a 10 microsecond resolution and uses a 100 KHz clock, CLK100K. The timer is enabled by CFIG2I.

A programmable register pair in CODEC 505 specifies the 16-bit counter preset (CUTIMI and CLTIMI). The counter decrements every 10 microseconds until it reaches zero. At this point, the timer interrupt bit in Status Register 3 is set, the interrupt bit in Status Register 1 is set, and an interrupt is generated, if enabled via CEXTI[1]. The counter is reloaded with CUTIMI and CLTIMI values on the next timer clock.

The record and playback FIFOs 538, 532 include programmable thresholds, or taps, for signaling an IRQ or DRQ from or to the respective FIFO from external system memory. Threshold operation is as follows: a pointer tree at record and playback FIFOs, 538, 532, indicates, if equal to zero, that the address is empty of data, and if equal to one, that data is present. The transition of the index pointer tree from a one (full) to a zero (empty) for a particular address in either FIFO will trigger an IRQ or DRQ interrupt for an external system to fill the playback FIFO 532 above the preselected threshold level (playback), or to empty the record FIFO 538 to an external system so it is below the preselected level (record).

The CODEC Logic Control block 568 (FIG. 50) is connected to each tap on either FIFO. The threshold select in configuration register CFIG3I[4, 5]) in Registers block 566 (FIG. 50) determines whether the empty, full, or mid-level threshold is selected. The Logic Control block 568 continuously monitors the taps and automatically generates and performs whatever functions it is designed to perform (e.g., DMA or I/O interrupt generation). When the tap signals that the threshold address is empty (playback) or full (record), depending on whether the tap is located at the position of full, empty or mid-range in the FIFO, an interrupt request is generated. DMA counters in Counters, Timers, Etc. block 518 (FIG. 44) are set for a certain number of data samples to be transferred to or from CODEC 505. Whenever a counter has completed its count, an interrupt request is generated.

The value in the index pointer of the record and playback FIFO 538, 532 is provided to the CODEC control block 568. When the index pointer has reached the FIFO threshold, a bit will be changed in a status register, in Registers block 566. This status bit can be read by the external system processing to perform a write and read operation to or from that FIFO. The status register in Registers block 566 is changed in real-time based on the threshold (taps) in the FIFOs changing from a one to a zero. When that occurs, a bit toggles in a status register, and when the status register is checked by the external system processor, the processor will determine which device is requesting the interrupt. The CODEC registers in Register block 566 are addressed with a direct address over Register Data Bus 526, or via indirect addressing by way of an index register in Registers block 566.

In the CODEC 505, the following interrupts can be generated: (1) playback and record FIFO I/O threshold reached; (2) playback and record sample counters have decremented to zero; and (3) CODEC timer has decremented to zero. The result of the CODEC interrupt logic located in Control Logic block 568 (FIG. 50) is combined into one interrupt signal, IACODEC, which is passed to interrupt selection logic in Control Logic block 568. The interrupt may be masked by a global enable, CEXTI[1]. The state of the interrupts are displayed in the global status register, CSR1R[0] located in Registers block 566 (FIG. 50).

The following interrupt equations describe the states required to set (CSET) and clear (CCLR) the logic in Control Logic block 568 associated with CODEC 505 interrupts. There is one latch in Control Logic block 568 to drive each of the three interrupt status bits in CSR2I. Referring now to Table C10, the definitions of the variables in the following interrupt equations are given.

See Table C11, which describes the state of the I/O pins in suspend mode. A technique for reducing power consumed by clock driven circuits is described in application Ser. No. 07/918,622, entitled "Clock Generator Capable of Shut-Down Mode and Clock Generation Method," assigned to the common assignee of the present invention and incorporated herein for all purposes.

```
CSET_CSR3I[4] = "playback FIFO interrupt
    (   ((MODE==1)+(MODE==2)) * (PLAYBACK SAMPLE COUNTER ROLLOVER)
    + (MODE==3) * CFIG3I[6] * /CFIG1I[6] * (PLAYBACK SAMPLE COUNTER ROLLOVER)
    + (MODE==3) * CFIG3I[6] * CFIG1I[6] * (PLAYBACK FIFO THRESHOLD
REACHED));
CCLR_CSR3I[4] = ((IOW to CDATAP) * (/RDB[4] * (CIDXR[4:0]==18h)) + (IOW to
CSR1R);
CSET_CSR3I[5] = "record FIFO interrupt
    (   (MODE==2) * (RECORD SAMPLE COUNTER ROLLOVER)
    + (MODE==3) * CFIG3I[7]/CFIG1I[7] * (RECORD SAMPLE COUNTER ROLLOVER)
    + (MODE==3) * CFIG3I[7] * CFIG1I[7] * (RECORD FIFO THRESHOLD REACHED)   );
CCLR_CSR3I[5] = ((IOW to CDATAP) * (/RDB[5] * (CIDXR[4:0]==18h)) + (IOW to
CSR1R);
CSET_CSR3I[6] = "timer interrupt
    (   (MODE==2)+(MODE==3)) * (TIMER REACHES ZERO)   );
CCLR_CSR3I[6] = ((IOW to CDATAP) * (/RDB[6] * (CIDXR[4:0]==18h)) + (IOW to
CSR1R);
CSR1R[0] = (CSR3I[4] + CSR3I[5] + CSR3I[6]) * (MODE==2 + MODE==3)
        + (CSR3I[5] * (MODE==1));
CIRQ = (CSR1R[0]) *CEXTI[1];
```

TABLE C10

| | |
|---|---|
| CSR3I[6, 5, 4] | The timer, record path, and playback path interrupt status bits of the Codec Status Register 3 |
| CFIG3I[7:6] | The record and playback path interrupt enables |
| CFIG1I[7:6] | The record and playback path DMA-I/O cycle selection bits |
| CDATAP | The codec indexed register data port |
| CIDXR[4:0]==18h | The codec indexed register index field is set to the Codec Status Register 3 |
| RDB[15:0] | The register data bus |
| CSR1R | The Codec Status Register 1 |
| CEXTI[1] | The global codec interrupt enable |

Two general purpose control signals are provided from Control Logic block 568, referenced, GPOUT [1:0]. The state of these digital outputs reflects the state of the corresponding control bit located in the External Control Register (CEXTI) in Registers block 566 (FIG. 50).

The CODEC includes a low-power mode. Three programmable bits, selecting the low-power shut-down status of CODEC 505, power control register, PPWRI[2:0], located in Registers block 566 (FIG. 50) can disable the record path, the playback path or the analog circuitry of CODEC 505. In other embodiments, more or less bits may be used. In the shut-down mode, both external crystal oscillators 560 (FIG. 50) are disabled but all registers in Registers block 566 FIG. 44 are readable. In suspend mode, selected by the external computer system or processor, CODEC 505 performs as if all 3-bits in the power control register, PPWRI, are selecting low-power states, both oscillators 560 are disabled and most of the CODEC I/O pins (not shown) become inaccessible. A dedicated suspend mode control pin, SUSPEND# (active low), causes the CODEC I/O pins to be forced high, forced low, or be set into a digital or analog high-impedance mode.

TABLE C11

| State of Pins | Pins and Registers Affected |
|---|---|
| High-impedance such that no current is consumed | SD[15:0], SA[11:0], SBHE#, IRQ[15,22,11,7,5,3,2], DRQ[7:5,3,1:0], DAK[7:5,3,1:0]#, TC, IOCHK#, IOR#, IOW#, IOCS16#, IOCHRDY, AEN, MD[7:0], CD_IRQ, CD_DRQ, CD_DAK#, CD_CS#, MIDIRX, MIDITX, GAMIN[3:0], GAMIO[3:0], XTAL1I, XTAL2I |
| Functional | RESET, SUSPEND#, C32KHZ, RAS#, BKSEL[3:0]#, GPOUT[1:0] |
| Forced high | ROMCS#, MWE# |
| Forced low | MA[10:0], RA[21:20], RAHLD#, PNPCS, XTAL1O, XTAL2O |
| Analog high-impedance | MIC[L,R], AUX1[L,R], AUX2[L,R], LINEIN[L,R], MONOIN, LINEOUT[L,R], MONOOUT, CFILT, IREF |

Table C12 describes what the PPWRI[2:0] bits cause to happen to CODEC 505 circuitry in power shut-down mode.

TABLE C12

PPWRI[0], Codec Analog Circuitry Enable. When this signal is low the codec analog circuitry is placed into a low-power state, and all the analog pins are placed into high-impedance mode. The codec outputs, LINEOUT[L,R] and MONOOUT (FIG. 450), will stay at their nominal voltage during the power suspend mode because of a weak resistor-divider networks connected at these outputs.

PPWRI[1], Codec Record Path Enable from High to Low. The record ACD 516 is immediately disabled. The record divide-down logic waits until the record path is in a state in which it is safe to stop the clocks and then disables the gate to the selected oscillator frequency. This gating is accomplished without possibility of glitching on the output of the gate.

PPWRI[1], Codec Record Path Enable from Low to High. The gated clock is re-enabled without the possibility of glitching and the ADC is re-enabled.

PPWRI[2], Codec Playback Path Enable from High to Low. The playback DAC 514 is immediately disabled. The playback divide-down logic waits until the playback path is in a state in which it is safe to stop the clocks and then disables the gate to the selected oscillator frequency. This gating is accomplished without possibility of glitching on the output of the gate.

TABLE C12-continued

| |
|---|
| PPWRI[2], Codec Playback Path Enable from Low to High. The gated clock is re-enabled without the possibility of glitching and the DAC is re-enabled. |

When the SUSPEND# pin becomes active (goes low), the CODEC behaves similarly to when it is placed into shut-down mode. Signal ISUSPRQ is logically ORed into I2LSUSPRQ and I2SSUSPRQ from the shut-down logic. ISUSPIP is logically ORed into I2LSUSPIP. If CODEC 505 is already in shut-down mode when SUSPEND# is asserted, then: (1) the I/O pins are changed to match the requirements of suspend mode described above; and (2) CODEC 505 analog circuitry in playback DAC 514, record ADC 516 and synth DAC 512 (if synth DAC 512 is embodied as a processing block within CODEC 505) is placed into low-power mode, if it is not already in that mode.

After the ISUSPRQ# is asserted, the logic in Control Logic block 568 waits for more than 100 microseconds before stopping the clocks of CODEC 505 and before disabling the oscillators. The 16 MHz clock ICLK16M and the 24 MHz clock ICLK24M are disabled (and later re-enabled) such that there are no distortions or glitches. After the clocks go into one of their high phases, they are held there until suspend mode is deactivated.

After SUSPEND# is deactivated, the external oscillators 560 are re-enabled, but ICLK16M and ICLK24M do not toggle again until the oscillators 560 have stabilized, 4 to 8 milliseconds later. This occurs after both oscillators 560 have successfully clocked 64K times. After the output clocks have been toggling for at least 100 microseconds, the ISUSPRQ# signal is de-asserted to allow the logic in the rest of CODEC 505 to operate. Signal ISUSPIP (suspend in progress) is active while the clocks are not valid. It is used to change the status of the I/O pins per the suspend requirements in Table C11.

The CODEC 505 can operate at either VCC=+3.3 or 5 volts. A voltage detect circuit in Control Logic block 568 (FIG. 50) determines whether the CODEC is in the 5 volt or 3.3 volt operating mode. The operating status is determined by the output of the voltage detect circuit register AVCCIS5. The operating voltage detect circuitry is utilized so the external computer system, or processor, can be informed that a signal cannot be generated greater than the operating VCC. For example, during 3.3 volt operation, a 4 volt signal cannot be generated. It also is used to set the analog full scale reference voltage and the range of drive capability of the digital I/O pins.

The CODEC 505 is capable of interacting with an external CD-ROM interface 568 (FIG. 50). Signals including chip select, DMA request, DMA acknowledge and interrupt request from the CD-ROM interface are supported by the CODEC 505.

An external serial EPROM or EEPROM 570 (FIG. 50) may be utilized by CODEC 505 to make the CODEC 505 Plug-n-Play (PNP) compatible with ISA, EISA or other industry standard buses or devices. Commercially available PNP software may be used to control the serial EPROM or EEPROM to configure the CODEC 505 for an external computer system or microprocessor. Where an external serial EPROM or EEPROM for PNP capability is not available, the external CD-ROM interface is not accessed by the CODEC.

A. Digital Signal Processing Portion of CODEC Playback Path

The CODEC playback DAC 514 (FIG. 44), and synth DAC 512 if synth DAC 512 is embodied within CODEC 505, each include an interpolation block 800 (FIG. 51), a noise shaper 802 and a semi-digital FIR filter 804 for left and right channel stereo audio data. Only the left channel is shown in FIG. 51 and described herein. Operation of the right channel is identical. The operation of CODEC playback DAC 514 will be described herein. The operation of synth DAC 512 is identical if embodied within CODEC 505, otherwise the operation of the synth DAC may deviate.

A 16-bit digital audio signal 806 is output from Format Conversion block 534 (FIG. 44), and is input as a signed data signal to interpolator block 800 (FIG. 51) of playback DAC 514 where the signal is up-sampled. After the first three stages of interpolation, the multi-bit up-sampled digital audio signal 840 is output to the input of noise shaper 802, where it is quantized and converted to a 1-bit digital output signal 842. The 1-bit signal 842 is then input to semi-digital FIR filter 804 which filters out undesired out of band frequencies and converts the signal to an analog audio signal 808, which is available at the output of playback DAC 514. The left channel analog audio signal 808 is available as an input to left channel CODEC playback mixer 678 (FIG. 45*a*).

Figure 52:
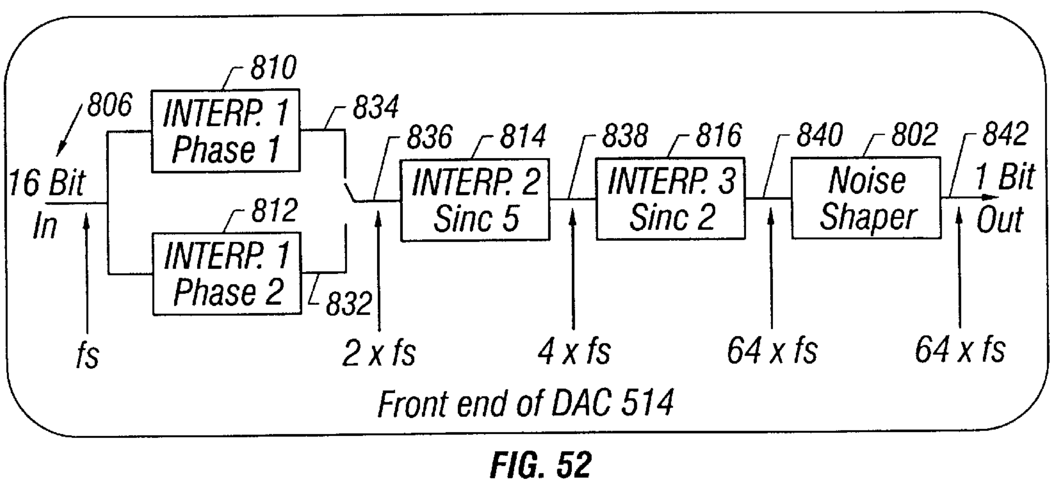
FIG. 52 is a block diagram of the front end of the digital to analog converter block of the present invention.

Referring to the front end of playback DAC 514 in FIG. 52, the 16-bit digital audio signal 806 is first interpolated, then quantized and noise-shaped. The playback DAC 514 receives as input, the 16-bit digital signal 806 at a sampling rate $f_s$ and produces at the output of interpolator block 800 (FIG. 51) a 1-bit signal 840 up-sampled to 64 times the sample rate for the 16-bit input signal 806 (64 times oversampling). Interpolation is performed in three stages in interpolator block 800, since one stage would require too complex a filter. The complexity of the circuitry is minimized by performing the 64×up-sampling interpolation in three stages, with interpolation up-sampling factors of 2 in Interp.1 blocks 810 and 812, 2 in Interp. 2 block 814, and 16 in Interp. 3 block 816. The noise shaper 802 is operated at the rate of $64\times f_s$.

Figure 53A:
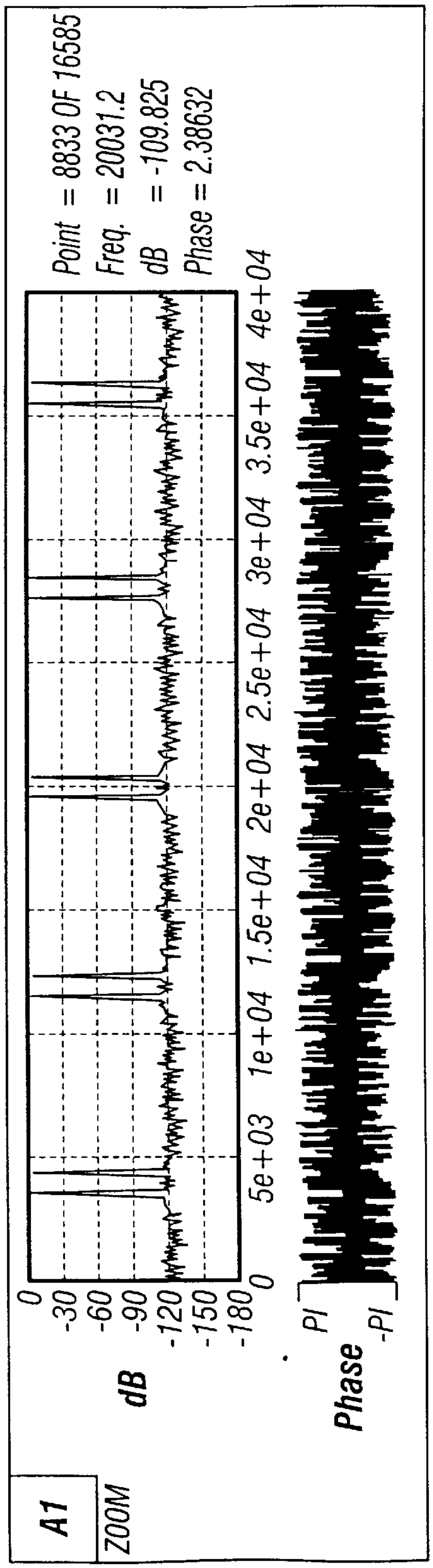
FIGS. 53*a*–53*f* are graphs showing outputs of various stages of the DAC block, including frequency response.
Figure 53B:
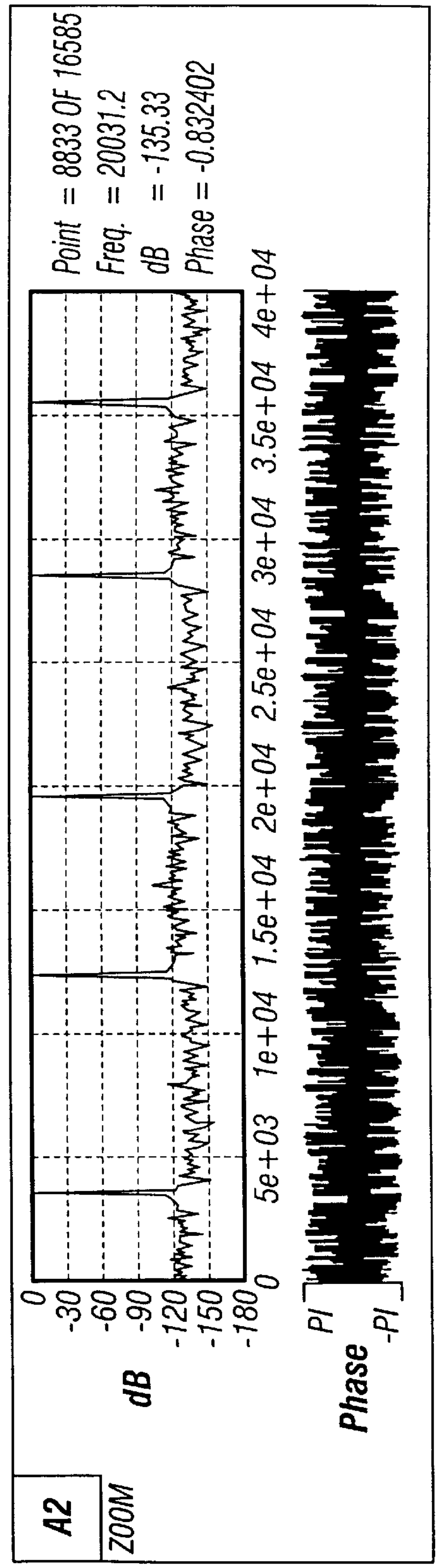

A typical input spectrum to Interp.1 block 810, 812 contains components of frequencies up to $f_s/2$, and their undesired images centered about integer multiples of $f_s$. See FIG. 53*a* for a typical input spectrum. To carry out the first interpolation in Interp. 1 block 810, to $f_s=2\times f_s$, an FIR filter is preferably employed which has a passband extending to about 0.40 $f_s$ and has a stopband beginning at about 0.60 $f_s$. Preferably, the passband extends to about 0.45 $f_s$ and the stopband begins at about 0.55 $f_s$. The stopband attenuation of the filter is preferably greater than 100 dB, and the passband ripple is about ±0.1 dB. This ensures that images of frequencies lower than 0.45 $f_s$, will be attenuated by at least 100 dB. Higher frequencies, however, will fall inside the filter's transition band together with their image, which will be attenuated less. The useful bandwidth is therefore about 3.6 KHz at $f_s$=8 KHz, or 19.8 KHz at $f_s$=44.1 KHz. The spectrum of the output of Interp. 1 blocks 810, 812, for the input shown in FIG. 53*a*, is shown in FIG. 53*b*. The impulse response coefficients used in Interp. 1 blocks 810, 812 are given in Table C13. The quantity of, and values associated with, these coefficients will be different if the passband or the stopband changes.

TABLE C13

| 79 = no. of coefficients | | | |
|---|---|---|---|
| −1.750595981443146E-004 | −7.216534818457747E-003 | 1.955957938423135E-001 | 4.549103547838218E-003 |
| −5.739375461292618E-004 | 1.087676639535953E-003 | −6.226688012834663E-002 | 8.001874012051711E-003 |
| −5.153327657662000E-004 | 1.07997987748563E-002 | −1.91491393082353E-001 | —2.543307395855730E-003 |
| 8.215425148181775E-004 | −1.215334421265815E-002 | 9.780230912060471E-003 | −6.569909029193999E-003 |
| 2.422337249812696E-003 | −1.523525338456651E-002 | 7.790085682315272E-002 | 1.100983711228035E-003 |
| 1.735941907565683E-003 | 1.315138172619167E-002 | 5.627230811495017E-003 | 5.257362295505428E-003 |
| −1.142240053456121E-003 | 2.111058181205655E-002 | −5.441745673466367E-002 | −5.730365042081015E-005 |
| −1.986208128696001E-003 | −1.365370199884487E-002 | −1.125437480414670E-002 | −4.016836900623256E-003 |
| 1.151106002853597E-003 | −2.884850034250726E-002 | 3.935790420884279E-002 | −5.479374575604021E-004 |
| 3.901899813486715E-003 | 1.328095684947460E-002 | 1.328095684947460R-002 | 3.091899813486715E-003 |
| −5.479374575604021E-004 | 3.935790420884279E-002 | −2.884850034250726E-002 | 1.151106002853597E-003 |
| −4.016836900623256E-003 | −1.125437480414670E-002 | −1.365370199884487E-002 | −1.98620812696001E-003 |
| −5.73036504208105E-005 | −5.441745672466367E-002 | 2.111058181205655E-002 | −1.142240053456121E-003 |
| 5.257362295505428E-003 | 5.627230811495017E-003 | 1.315138172619167E-002 | 1.735941907565683E-003 |
| 1.100983711228035E-03 | 7.790085682315272E-002 | −1.523525338456651E-002 | 2.422337249812696E-003 |
| −6.569909029193999E-003 | 9.780230912060471E-003 | −1.215334421265815E-002 | 8.21525148181775E-004 |
| −2.543307395855730E-003 | −1.191491393082353E-001 | 1.070997987748563E-002 | −5.153327657662000E-004 |
| 8.001874012051711E-003 | −6.226688012834663E-002 | 1.087676639535953%-002 | −5.739375461292618E-004 |
| 4.549103547838218E-003 | 1.955957938423135E-001 | −7.216534818457747E-003 | −1.750595981443146E-004 |
| −9.457345733680010E-003 | 3.487257625348548E-001 | −9.457345733680010E-003 | |

This interpolative filtering is performed digitally, to avoid filtering in the analog domain when operating at the lowest rate, which would require a complex, or sharp transition, analog filter. Without such an analog filter, the images would appear at the output. The analog filter would have to have variable cutoff to accomodate changes in the sampling rate, which is not an acceptable solution.

Figure 53C:
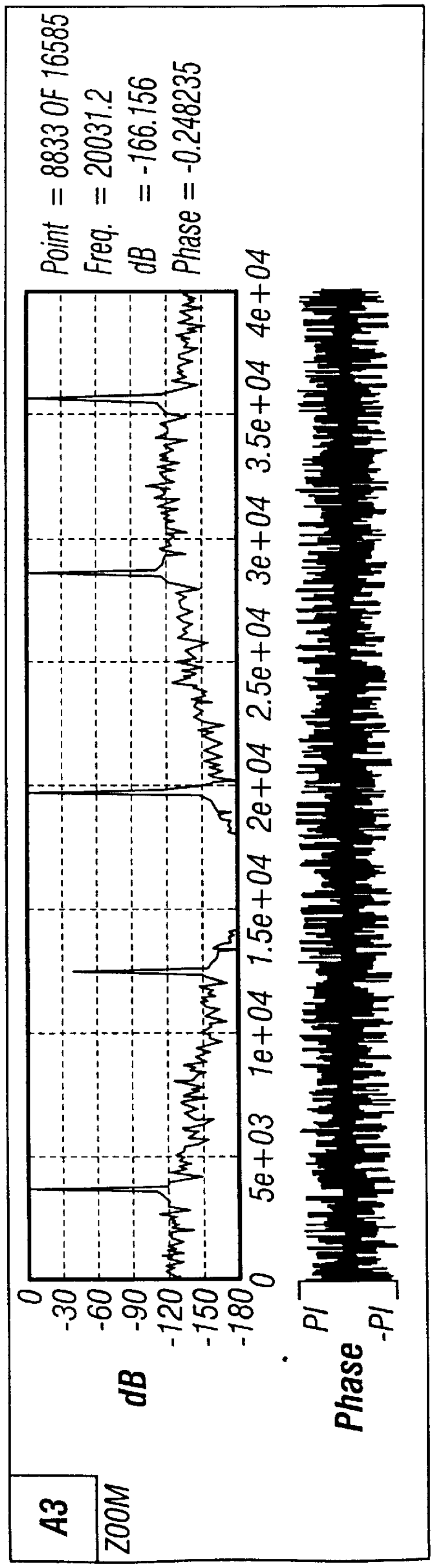

The second interpolation stage, performed by Interp. 2 block 814, changes the sampling rate to $f_s''=4f_s$. A sinc$^5$ filter is used in this stage, which provides approximately 30 dB of image attenuation. The spectrum of the output of the second interpolator stage 814 is shown in FIG. 53*c.*

Figure 53D:
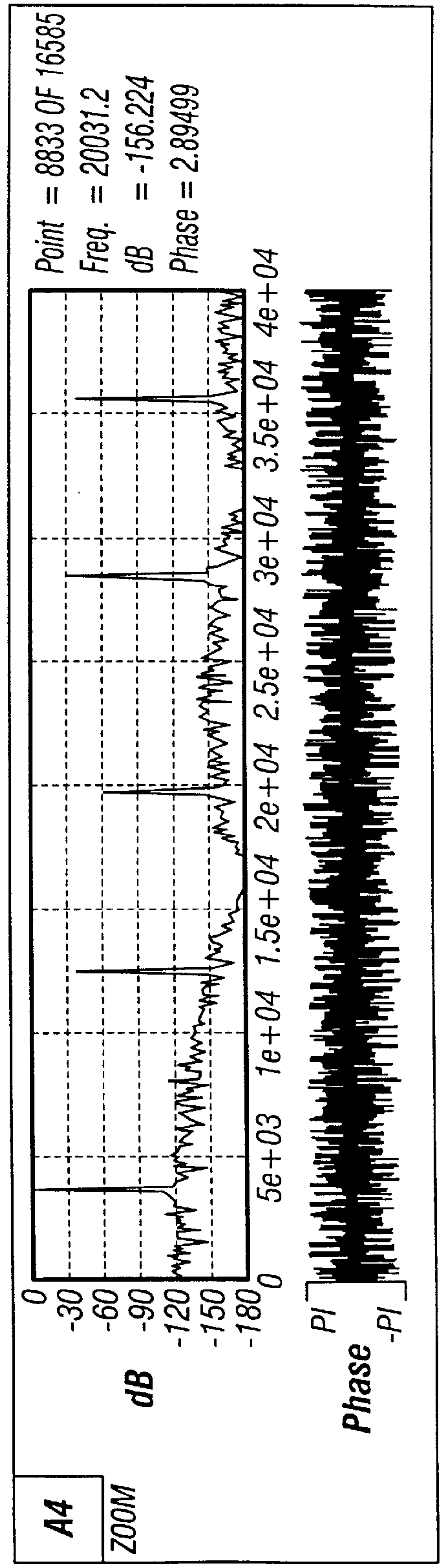

The third interpolation stage, Interp. 3 block 816, changes the sampling rate further, by a factor of 16, to $f_s''=64\ f_s$. A sinc$^2$ interpolator, with a differential delay of two, is used. This interpolator serves the following purposes: it attenuates the images around $4f_s$ enough for the images to not exceed the noise levels introduced by the next block, i.e., noise shaper 802, and it also introduces a zero at 2 $f_s$, which together with interpolator stage 2 814, provides enough attenuation for images around 2 $f_s$. The spectrum for the output of the third stage 816 is shown in FIG. 53*d.*

Figure 53E:
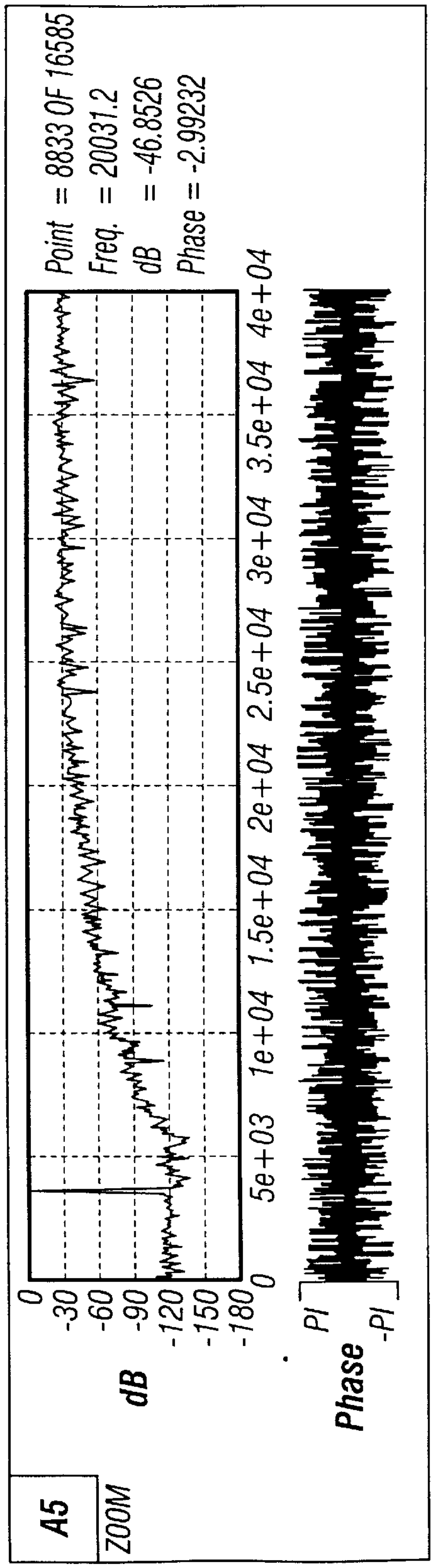

The final block in the front end of playback DAC, and the last stage of the interpolation filter, is a fifth order noise shaper 802 (FIG. 52). Noise shaper 802 converts the up-sampled multi-bit output 840 from the third interpolator stage 816 to a 1-bit signal 842. It shapes the noise according to a Chebyshev (equiripple) high-pass transfer function. The spectrum for the noise shaper 802 output appears in FIG. 53*e*. The operation of noise shaper block 802 is described herein.

Figure 53F:
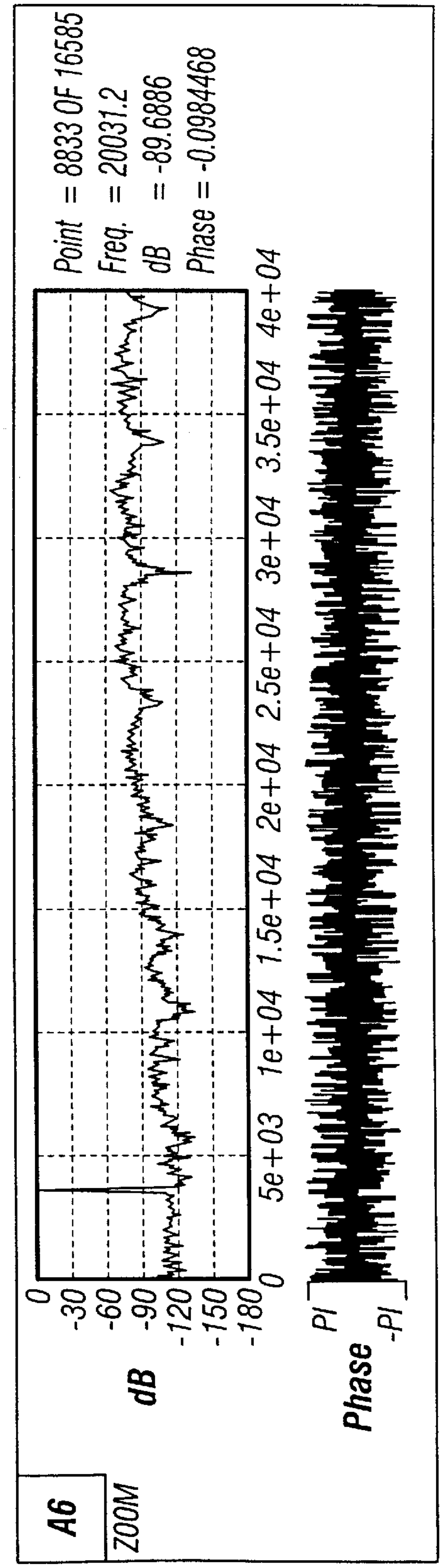
Figure 54:
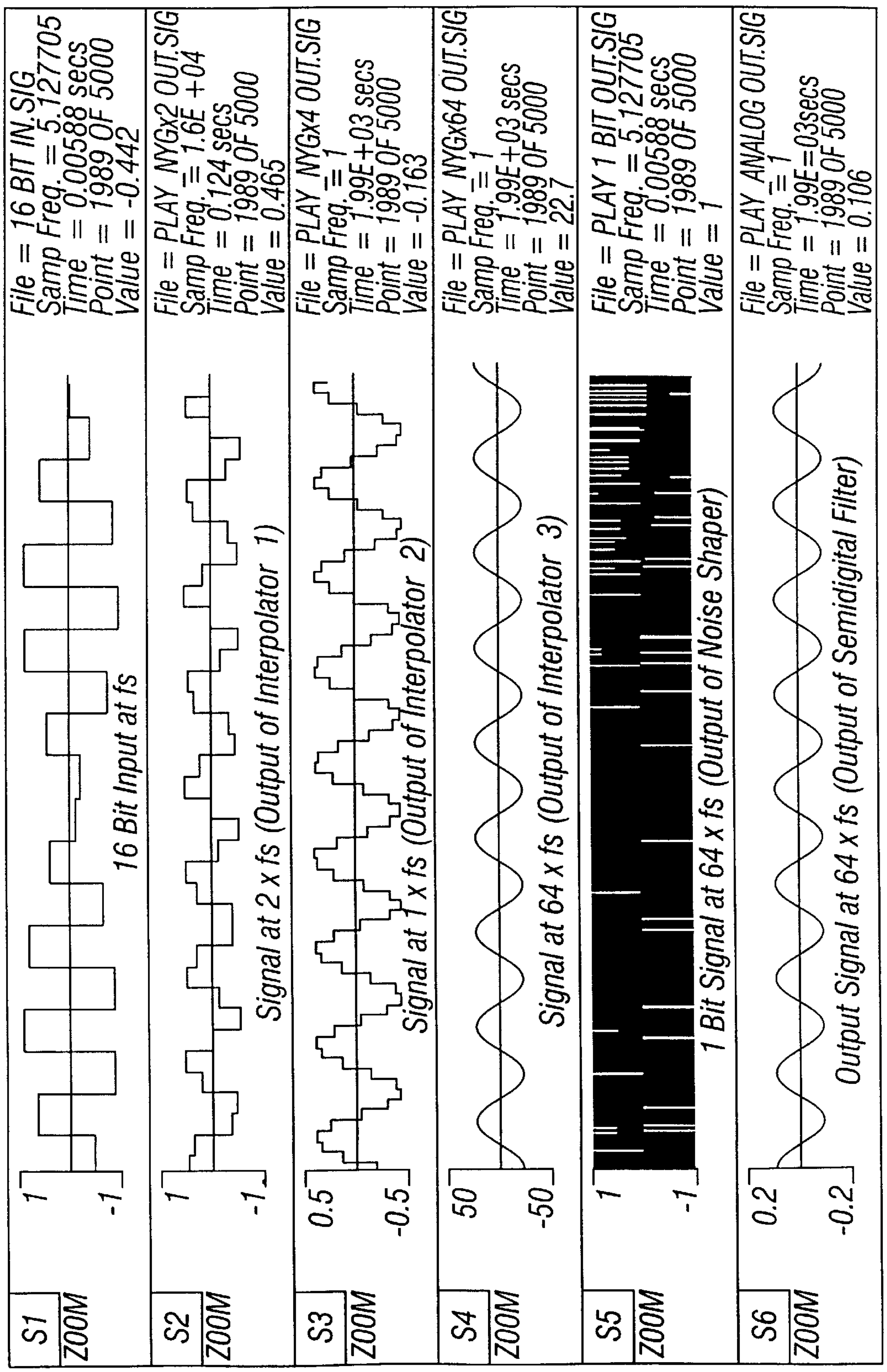
FIG. 54 shows six graphs representing outputs and frequency response of various stages of the DAC block.

The 1-bit signal from noise shaper 802 is then filtered with a semi-digital FIR filter 804 (FIG. 51). Semi-digital FIR filter 804 compensates for the attenuation caused by noise shaper 802, and also achieves a relatively flat noise floor extending to about 20 KHz when $f_s$=8 KHz. Noise shaper 802 has less than unity gain. The spectrum of the semi-digital FIR filter 804 analog output signal is shown in FIG. 53*f*. Time domain examples of a digital signal being processed by interpolator 800, noise shaper 802 and semi-digital FIR filter 804 are given in FIG. 54.

B. The Interpolator Processing Blocks (810, 812, 814 and 816)

A more detailed discussion of the processing blocks of the interpolator 800 follows.

1. Interpolator 1

Interp.1 stage, blocks 810, 812, is a symmetric (linear phase) FIR filter with 2N−1 taps (N distinct coefficients), with N equal to 40 in the preferred embodiment. The interpolation factor in this block is two. It is designed to have an attenuation of about 100 dB or more in the stopband, and approximately ±0.1 dB or less ripple in the passband. The passband response also compensates for the rolloff introduced by the sinc$^5$ Interp. 2 stage 814, sinc$^2$ Interp. 3 stage 816 and the semi-digital FIR filter 804 used in the playback DAC 514 D/A conversion process, as well as the gain variation introduced by the noise shaper 802.

The FIR filter in this Interp. 1 stage 810, 812 includes passband compensation achieved by combining into one function all the frequency variations introduced by subsequent stages.

Referring to FIG. 52, when used as interpolator, the FIR filter acts on the input sequence of a digital values, 16-bit input signal 806, whereby every other data sample is equal to zero (for interpolation by 2). This means one odd output sample signal 832 is computed using only odd coefficients in Interp. 1 phase 2 block 812, and the next even output sample signal 834 is computed using only even coefficients in Interp. 1 phase 1 block 810, but on the same set of 16-bit input signals 806. This leads to a polyphase (in this case, 2-phase) implementation shown as Interp. 1 810 and 812 in FIG. 52, in which two sub-filters execute in parallel, and the filter outputs 832 and 834 are interleaved by known methods to create the Interp. 1 signal output 836 which is then provided to Interp. 2 block 814.

In the time domain, the even and odd output signals 834, 832 from the two phases of Interp. 1 810, 812 are:

$$y_1(n) = \sum_{k=0}^{\frac{N-1}{2}} h_{2k} x(n-k)$$

for even output signal 834, phase 1 (even coefficients), and for odd output signal 832, phase 2 (odd coefficients).

$$y_2(n) = \sum_{k=0}^{\frac{N-1}{2}-1} h_{2k+1} x(n-k)$$

All delays are at the input sampling rate.

The Interp. 1 blocks 810, 812 filter has phase linearity, which means the impulse response is symmetric with respect to the midpoint, with the symmetry condition given as:

$$h_k = h_{N-1-k} \quad k=0, \ldots N-1 \ (N \text{ odd})$$

Figure 55:
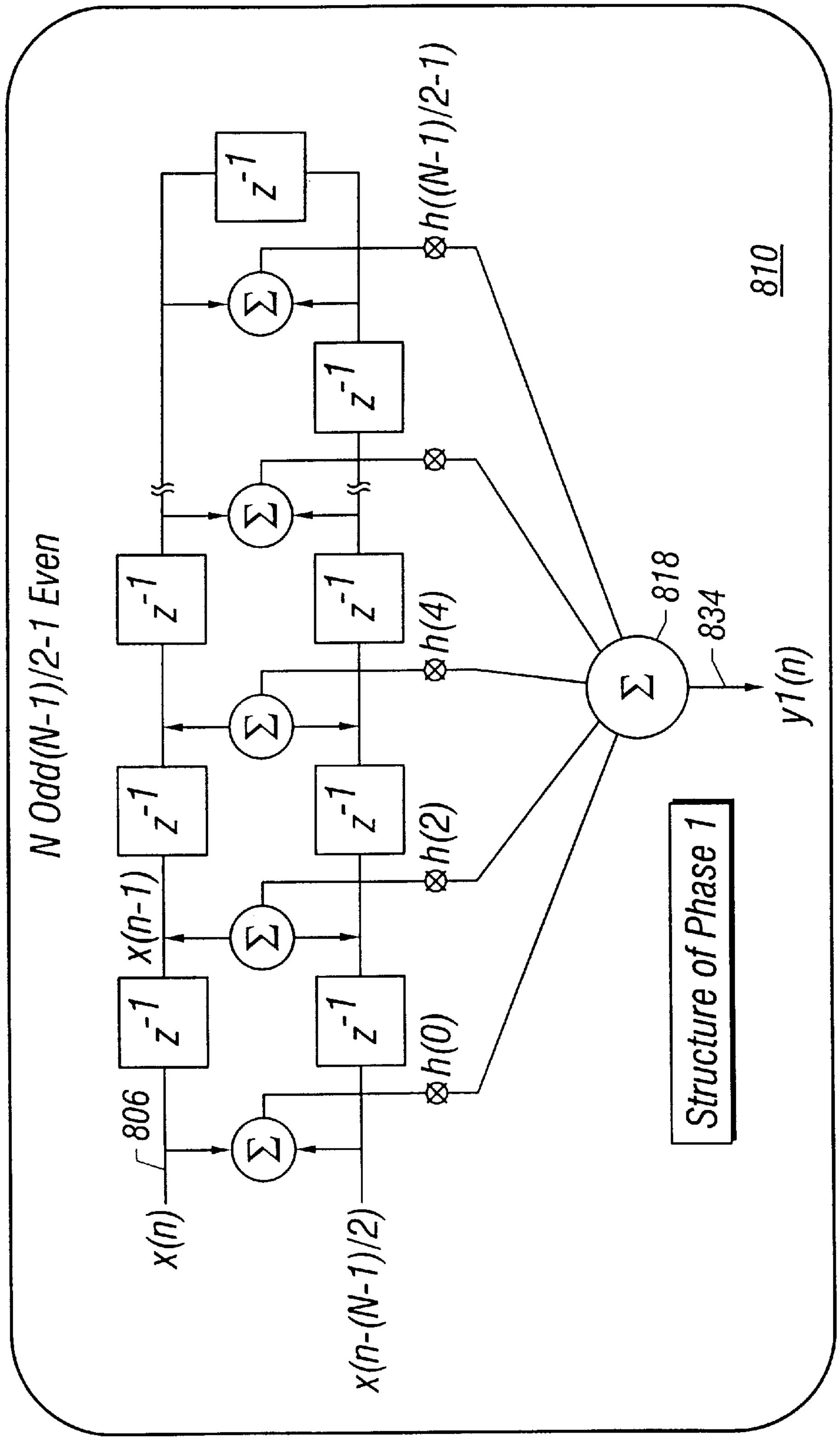
FIG. 55 is a schematic representation of the Interp.1 block, phase 1 of FIG. 52.
Figure 56:
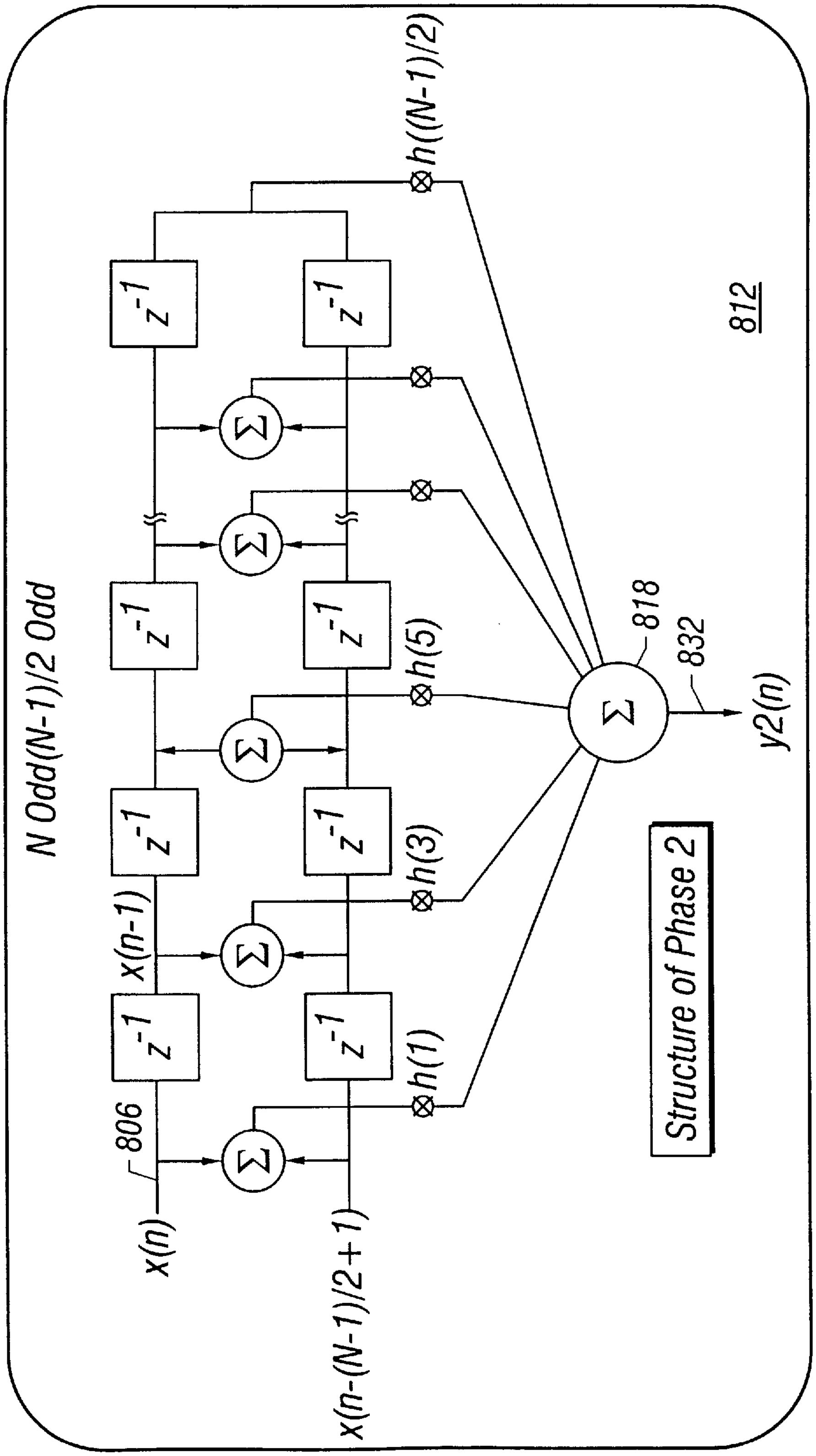
FIG. 56 is a schematic representation of the Interp.1 block, phase 2 of FIG. 52.

This is reflected in the structure of the filters 810 and 812, shown in FIGS. 55 and 56, respectively.

Typically, the impulse response contains coefficients which are very small. For large stopband attenuations, these coefficients are very important. To preserve the precision, the coefficients are scaled so the magnitude of each is between one-half and one. Then, in the summation circuit 818 (FIGS. 55, 56), the partial products associated with the smallest coefficients are added first, scaled, and then added to the products associated with the next higher-valued coefficient, and so on. This means the sums cannot be performed in an arbitrary order (e.g., in the same order as the taps are updated), unless the word width is further increased to preserve the precision.

2. Interpolator 2

The second interpolator stage 814, Interp. 2, is a $\text{sinc}^5$ interpolator filter. The interpolation factor in this block is two. Due to the attenuation that will be provided by the semi-digital filter 804, a high attenuation around $2\times f_s$, is not needed, and a relatively simple structure is used. The transfer function of the filter for Interp. 2 stage 814 is:

$$H_2(Z) = \left(\frac{1}{2}\frac{1-z^{-2}}{1-z^{-1}}\right) = \frac{1}{32}(1+z^{-1})^5$$

expanding to, $$H_2(z) = \frac{1}{32}(1 + 5z^{-1} + 10z^{-2} + 10z^{-3} + 5z^{-4} + z^{-5})$$

Thus, the Interp. 2 filter 814 has only integer coefficients. The passband rolloff has to be compensated in Interp. 1 blocks 810, 812.

Since the Interp. 2 filter 814 interpolates by two, it operates on a sequence in which every other sample is zero, as illustrated below:

| 1 | 5 | 10 | 10 | 5 | 1 |
|---|---|---|---|---|---|
| $x_N$ | 0 | $x_{n-1}$ | 0 | $x_{n-2}$ | 0 |
| 0 | $x_n$ | 0 | $x_{n-1}$ | 0 | $x_{n-2}$ |

Figure 57:
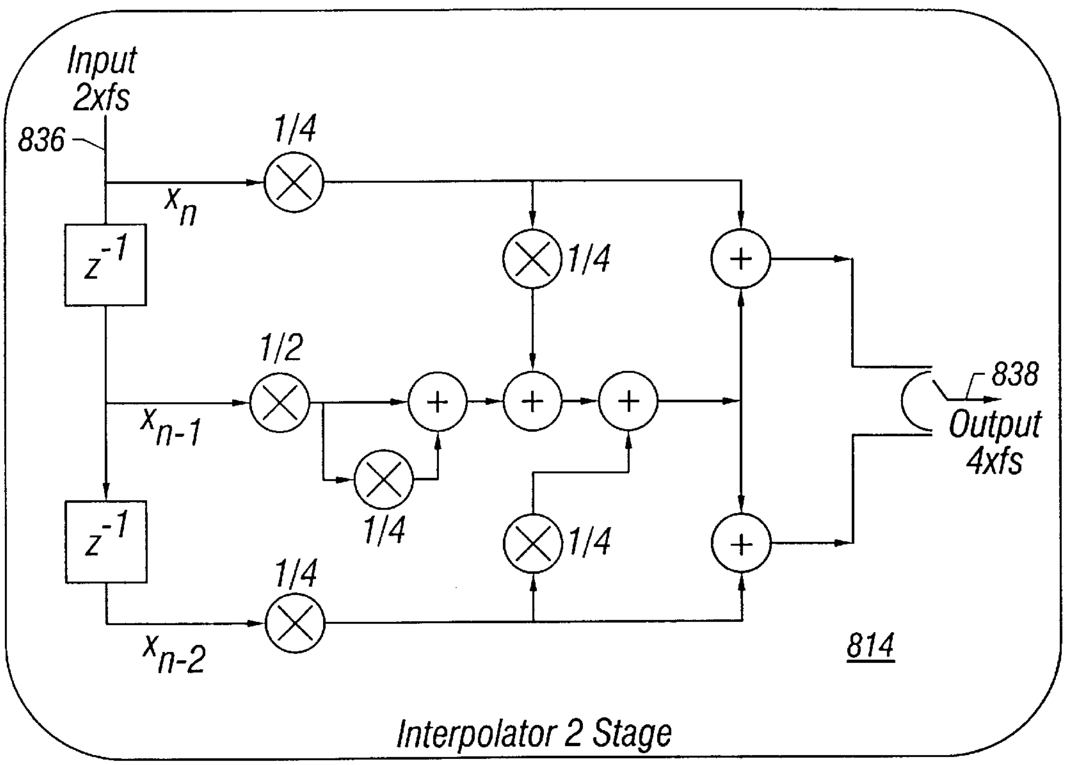
FIG. 57 is a schematic representation of the Interp.2 block of FIG. 52.

This leads to a two-phase implementation as shown in FIG. 57, similar to Interp. 1 810, 812 blocks, where:

$$H_2a(z) = \frac{1 + 10z^{-1} + 5z^{-2}}{32} = \frac{1 + 10z^{-1} + z^{-2}}{32} + \frac{4z^{-2}}{32}$$

$$H_2b(z) = \frac{5 + 10z^{-1} + z^{-2}}{32} = \frac{1 + 10z^{-1} + z^{-2}}{32} + \frac{4}{32}$$

Figure 58:
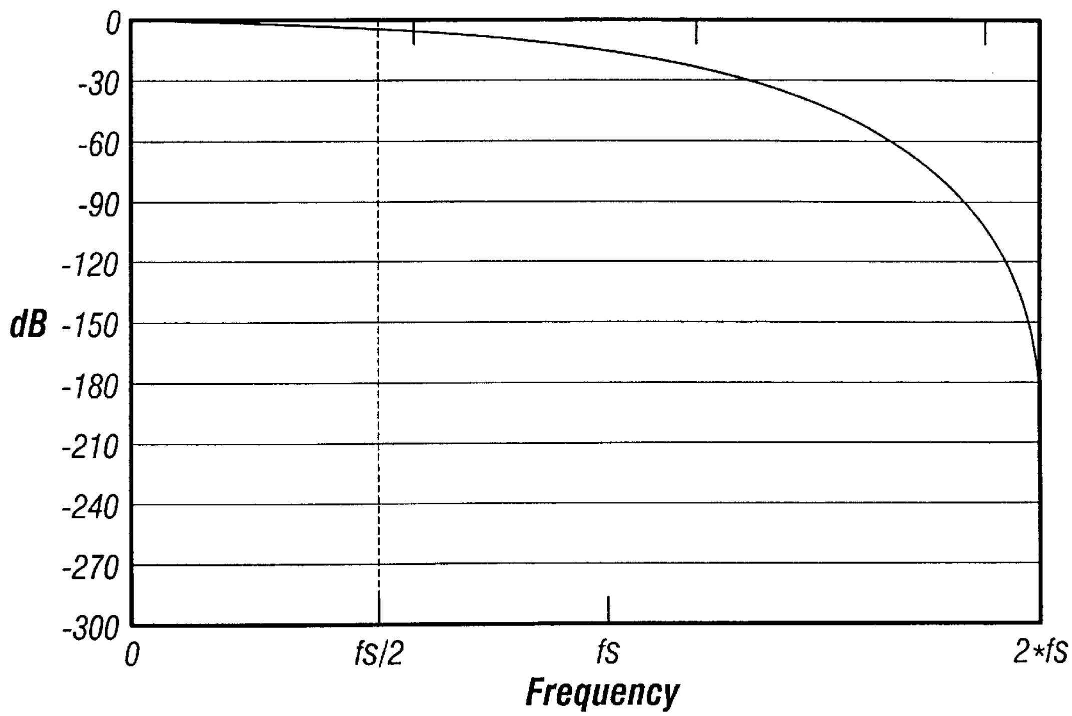
FIG. 58 is a graph of the frequency response of the Interp.2 block of FIG. 52.
Figure 59:
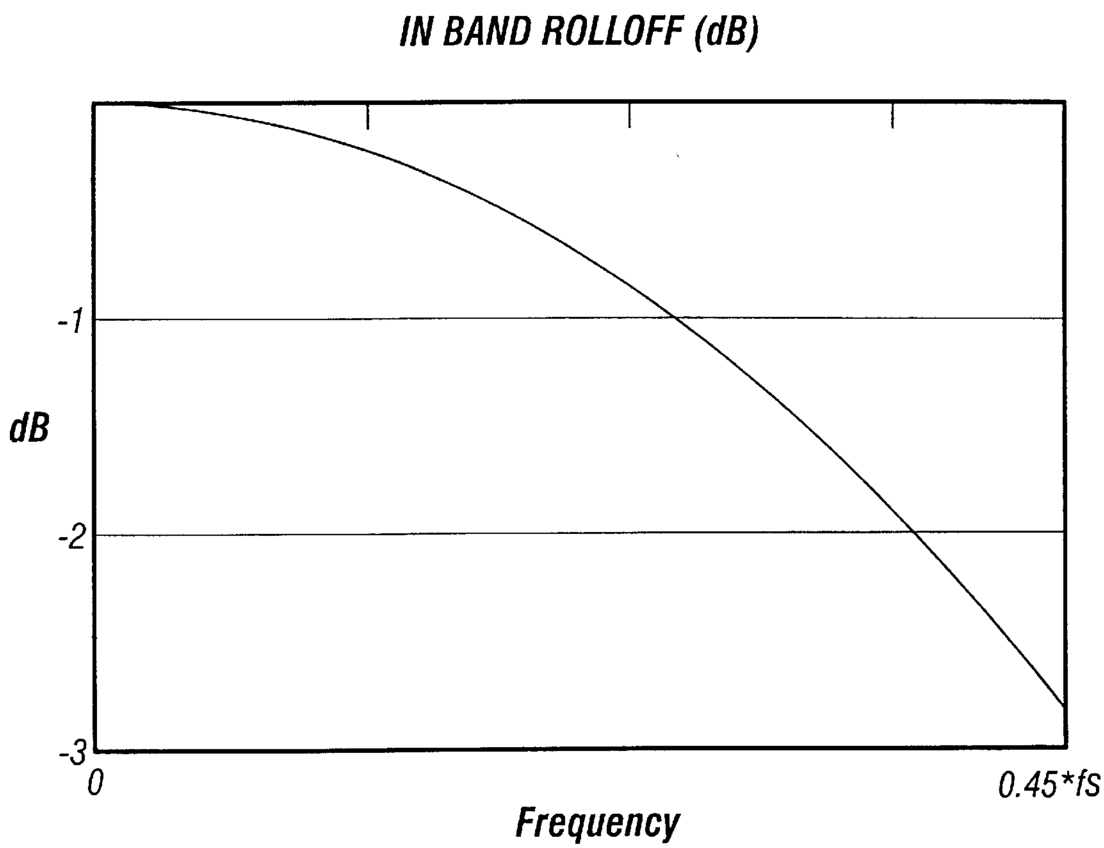
FIG. 59 is a graph representing the in-band rolloff of the Interp.2 block of FIG. 52.

In $H_2a$ and $H_2b$, the delays occur at the input sampling rate $f_s$. The common term in the transfer functions in both phases of Interp. 2 filter 814 results in some hardware savings. FIG. 57 shows an embodiment of the Interp. 2 814 filter. A scaling factor of 2 has been applied throughout. The frequency response, normalized to DC, is shown in FIGS. 58 and 59.

3. Interpolator 3.

The transfer function of Interp. 3 block 816 is:

$$H_3(z) = \left[\frac{1-z^{-32}}{1-z^{-1}}\right]^2$$

Figure 60:
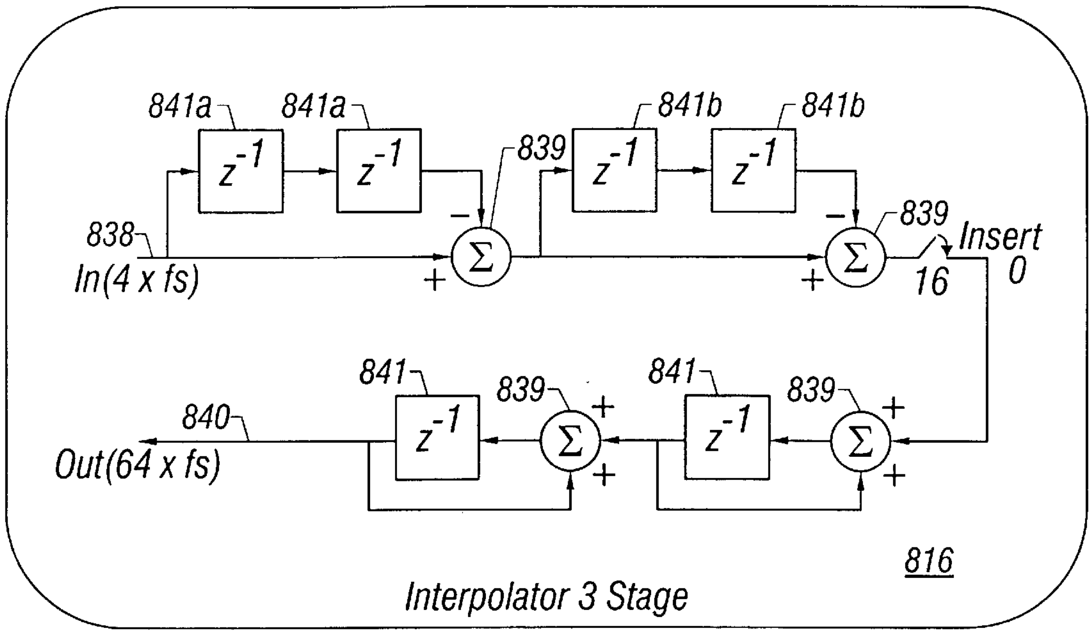
FIG. 60 is a schematic representation of an embodiment of the Interp.3 block of FIG. 52.

The interpolation factor in this block is 16. The differential delay is 2. The order is 2. One embodiment of the implementation of the transfer function is given in FIG. 60. The differentiators 839 run at a lower rate, while the integrators 841 run at a higher rate.

The differentiators 841 having 2 delays can be factored into a differentiator with one delay and a 2-sample accumulator, where:

$$1 - z^{-2} = \underset{\text{2-sample accumulator}}{(1 + z^{-1})} \cdot \underset{\text{simple differentiator}}{(1 - z^{-1})}$$

Figure 61:
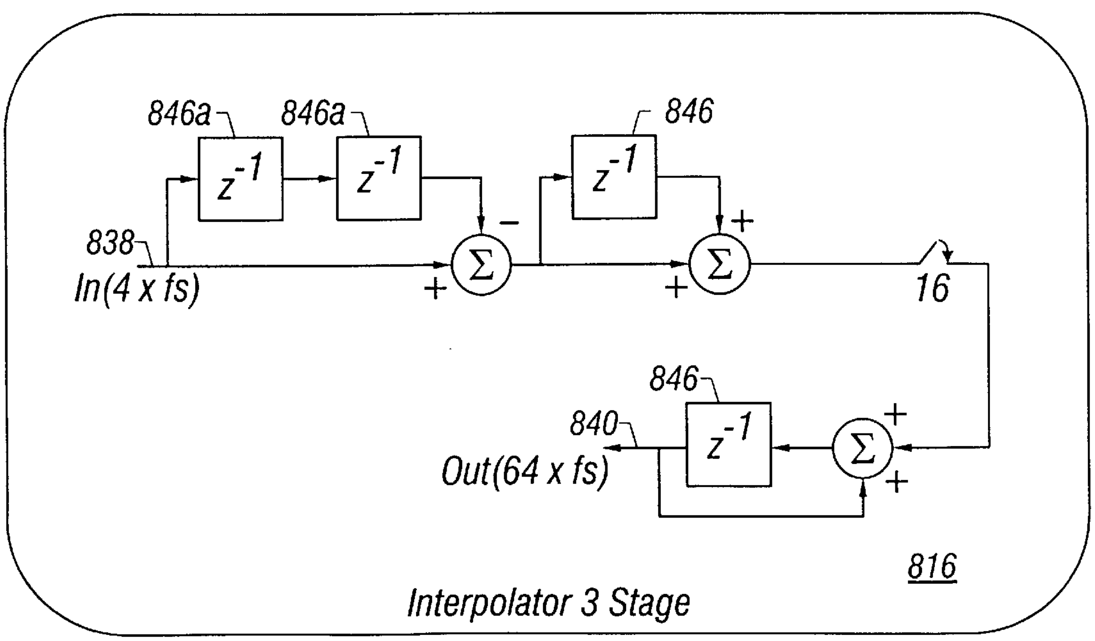
FIG. 61 is a schematic representation of another embodiment of the Interp.3 block of FIG. 52.
Figure 62A:
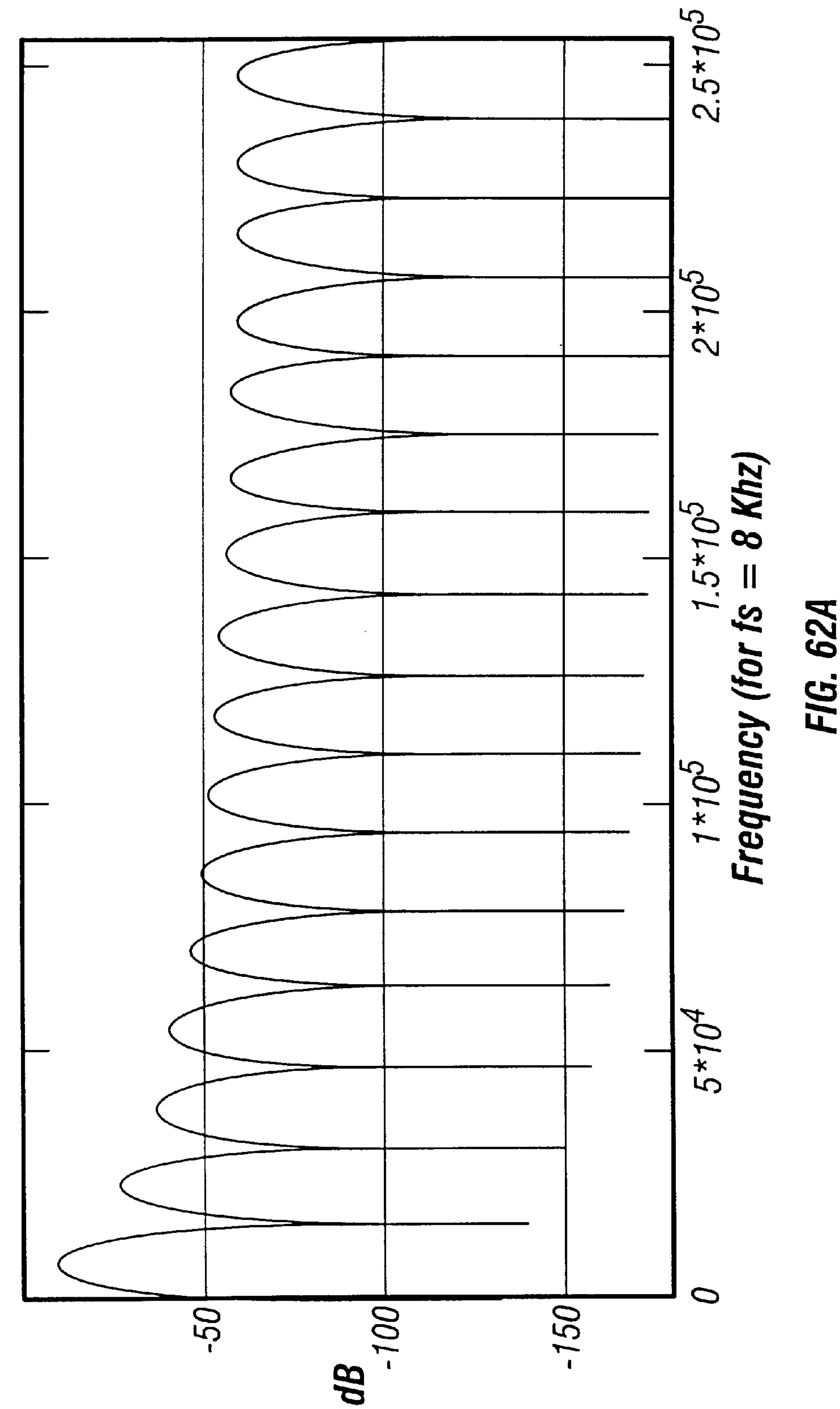
FIG. 62*a* is a graph of the frequency response of the Interp.3 block of FIG. 52.
Figure 62B:
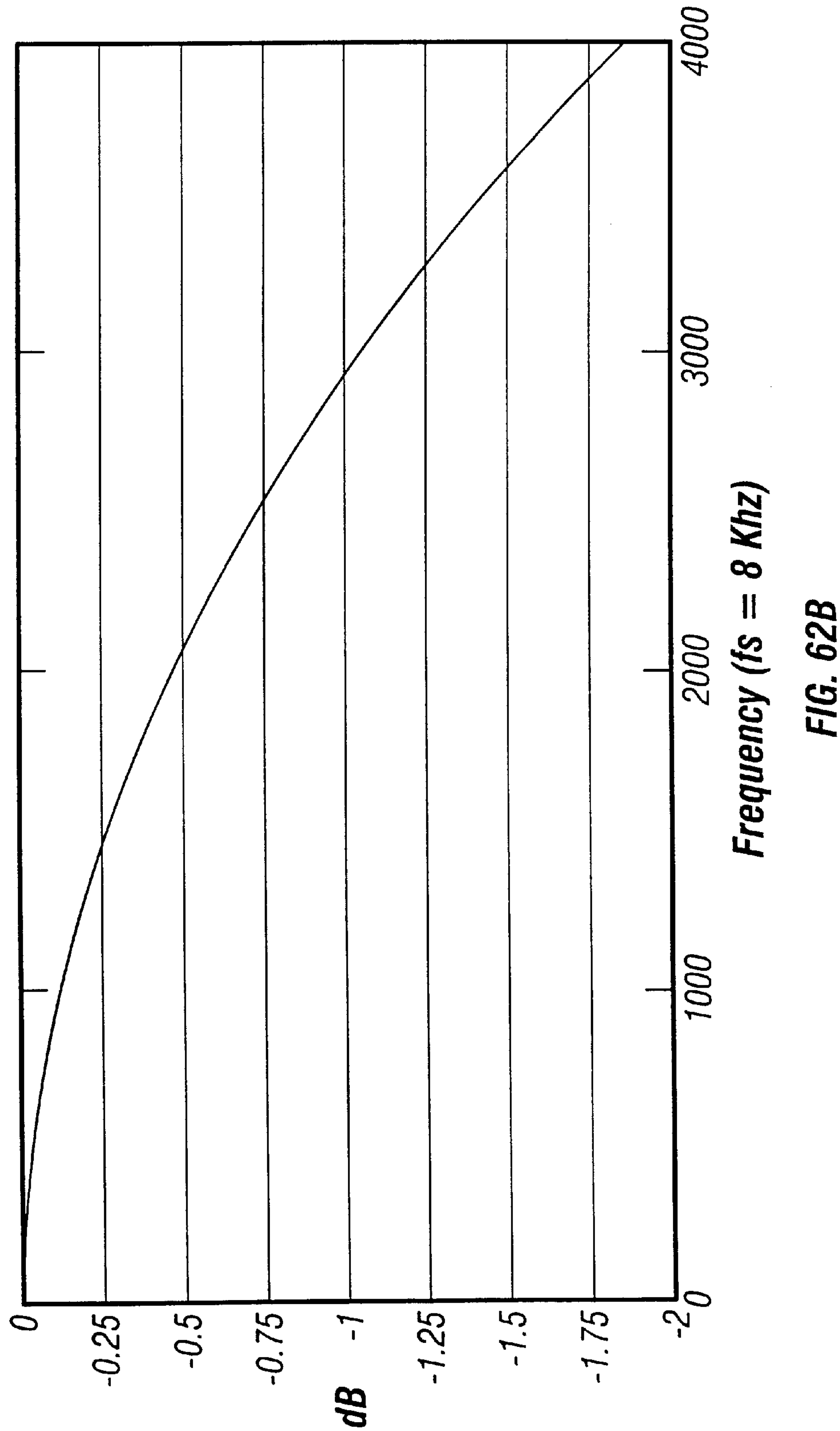
FIG. 62*b* is a graph of the passband rolloff of the Interp.3 block of FIG. 52.

Another embodiment for Interp. 3 block 816 is shown in FIG. 61. Each signal sample is used 16 times by the integrator 846, which runs at the highest rate. A zero is introduced a 4 $f_s$. The double delay blocks 841A,B in FIG. 60 and 846A in FIG. 61 operate to introduce an additional zero at 2 $f_s$, which together with interpolator 2 $\text{sinc}^5$ filter 814, provides enough image attenuation and is more economical than using a $\text{sinc}^6$ filter for interpolator 2 filter 814. The frequency response of interpolator 3 filter 816, normalized to DC, is shown in FIGS. 62*a* and 62*b*.

C. Noise Shaper

Figure 63A:
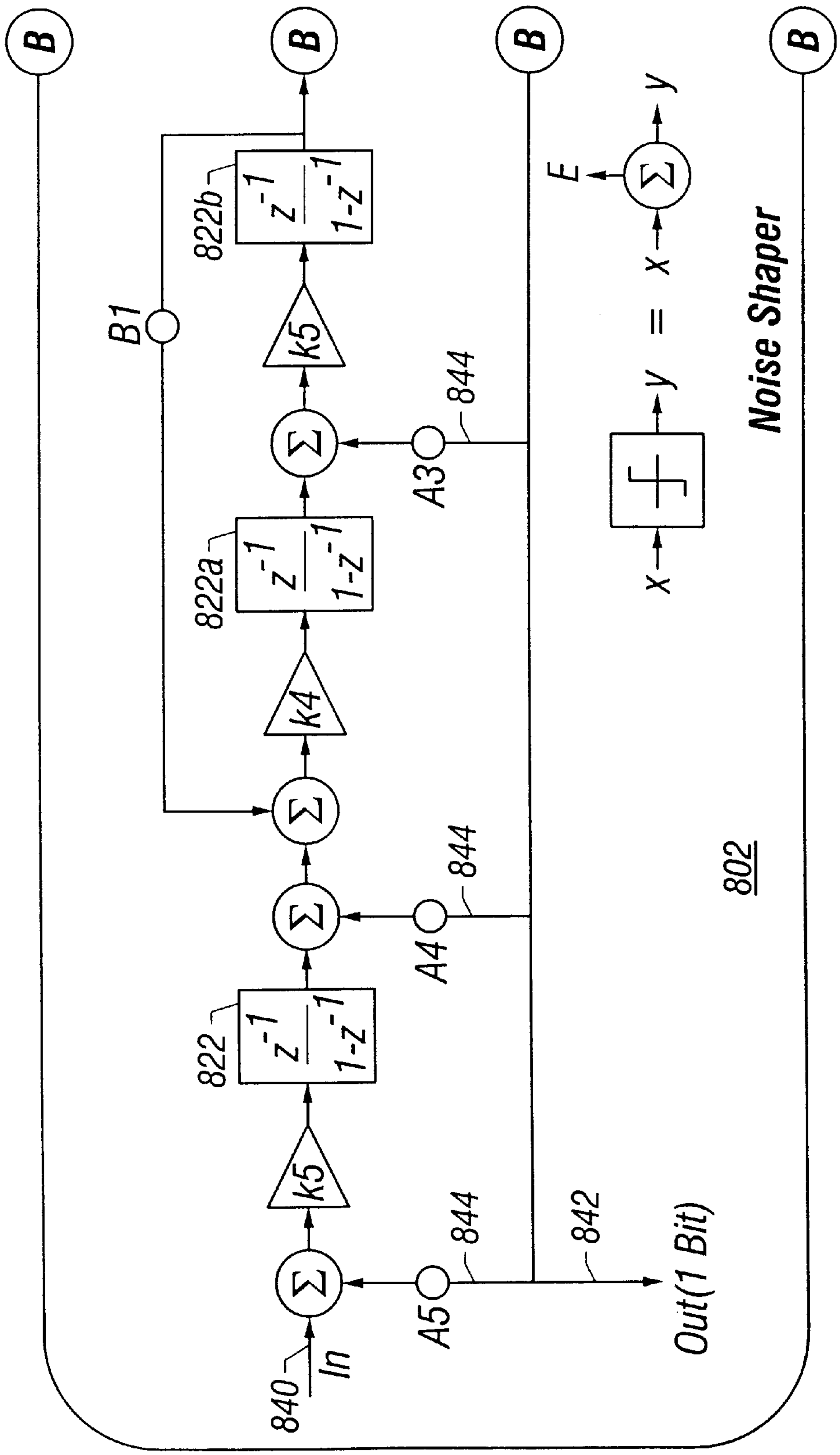
FIGS. 63*a* and 63*b*, generally referred to herein as FIG. 63, illustrate is a schematic representation of the noise shaper block of FIG. 52.
Figure 63B:
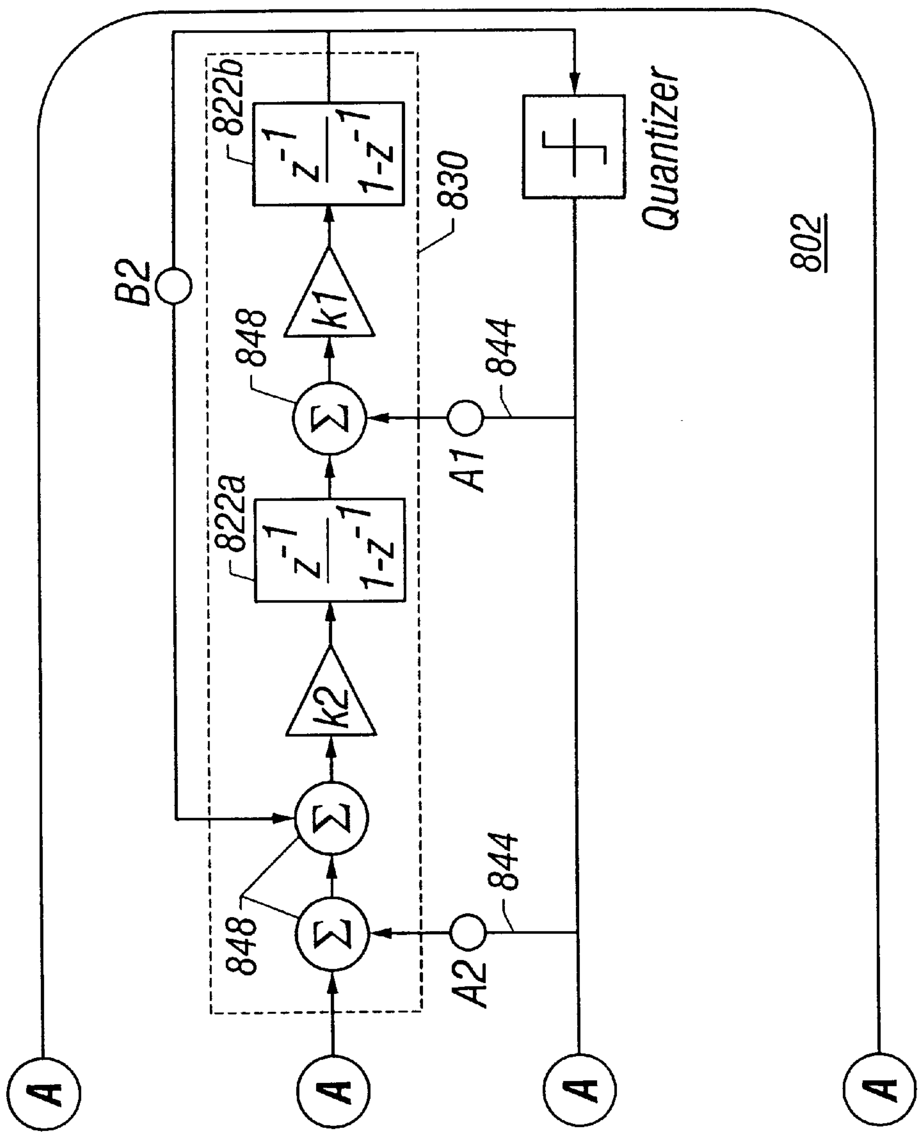

The final stage of the interpolator, noise shaper block 802 (FIGS. 51, 52), takes the multi-bit signal output from the third interpolator stage, interpolator 3 block 816 (FIG. 52), and converts it to a 1-bit signal while shaping the quantization noise according to a high-pass function. The block diagram implementation for the shaper 802, which is a preferably fifth order shaper, is shown in FIG. 63. The 1-bit output signal 842 is also input to integrators 822. Integrator 822 inputs must have suitable scaling factors, k1–5, to make the loop stable for a predetermined range of input amplitudes, as determined by the remainder of the digital path shown in FIG. 63. The simple additive noise model shown in FIG. 63 is used to represent the quantizer.

Two transfer functions are defined for this circuit: a signal Transfer Function (STF) Y/X, where X is the digital audio input signal 840 (FIG. 52), and a noise Transfer Function (NTF) Y/E, where E is the quantization noise (modeled as additive, white, uniformly distributed noise). Once the NTF is fixed, the STF is also determined. Since the system is not a FIR filter, the response is no longer strictly phase-linear. The phase variation in the passband, however, is very small, on the order of about 0.05 degrees, and the magnitude variation can easily be compensated in Interp. 1 810, 812 block.

Figure 64:
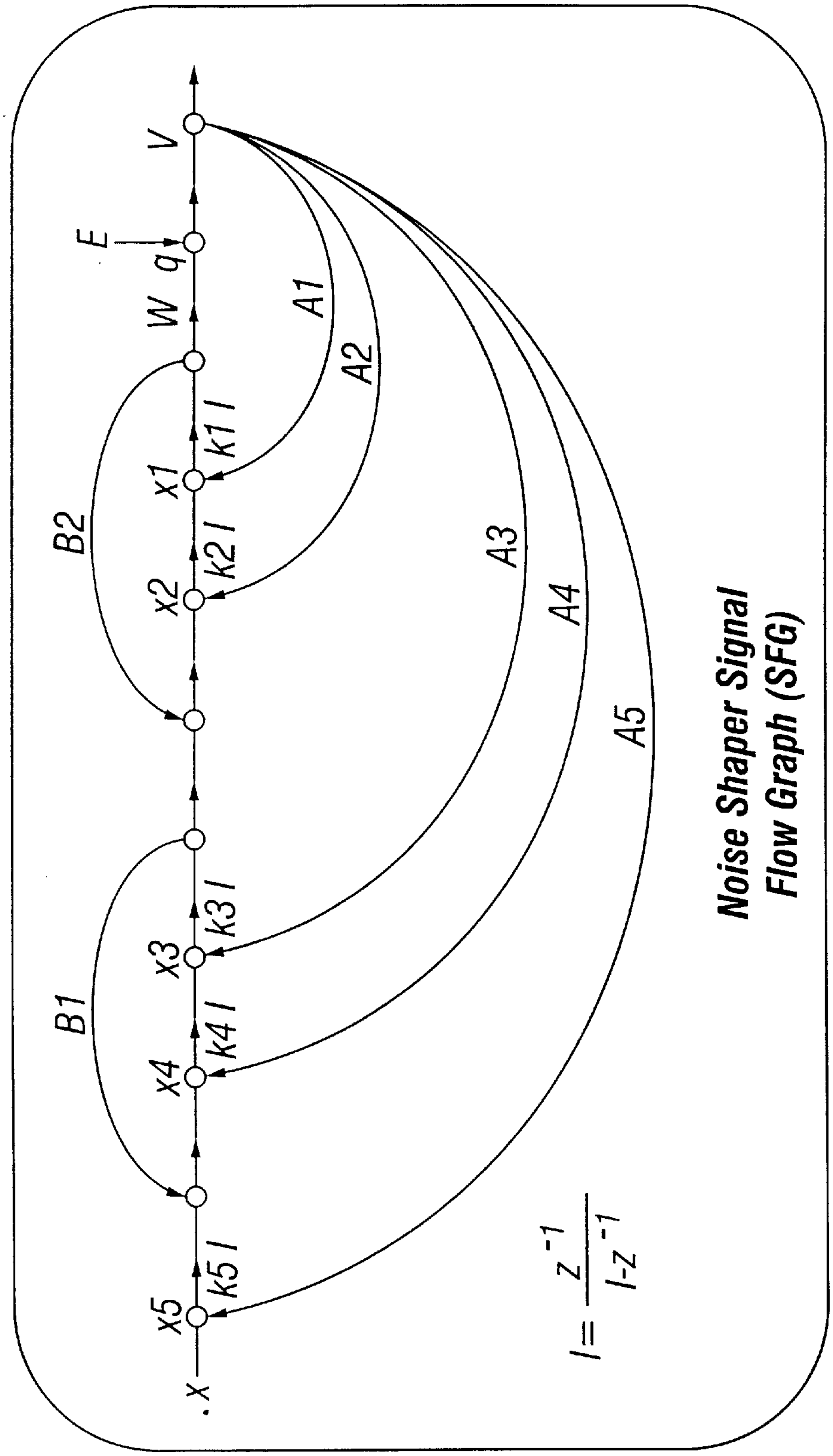
FIG. 64 is a signal flow graph (SFG) of the noise shaper block in FIG. 52.

A signal flow graph (SFG) for noise shaper block 802 is shown in FIG. 64. The transfer functions are developed as follows:

Forward Path Gains

The cumulative gains of all possible direct paths from input to output:

For X $T_1=\kappa_1\kappa_2\kappa_3\kappa_4\kappa_5\cdot I^5$

For E $T_1=1$

Loop Gains

The gains of all closed loops.

$G_1=A_1k_1I=A_1K_1\cdot I$ $G_2=A_2\ k_1k_2I^2=A_2K_2\cdot I^2$ $G_3=A_3k_1k_2k_3I^3=A_3K_3\cdot I^3$ $G_4=A_4k_1k_2k_3k_4I^4=A_4K_4\cdot I^4$ $G_5=A_5k_1k_2k_3k_4k_5I^5=A_5K_5\cdot I^5$ $$L_1 = I^2\cdot B_1k_3k_4 = B_1\left(\frac{K_4}{K_2}\right)\cdot I^2$$

$L_2=I^2\cdot B_2k_1k_2=B_2K_2\cdot I^2$

Non-Touching Loops

The products of the gains of sets of loops without any common nodes are calculated. First, pairs of non-touching loops have to be identified. Then, triplets are found, then sets of 4, etc. In the preferred embodiment, only pairs of non-touching loops exist.

$L_1, G_1$ $L_1, G_2$ $L_1, L_2$

Determinant

This is defined in terms of the loop gains as Δ=1−Σloop gains+Σgains of pairs of NTL−Σgains of triplets of NTL+. . .

NTL=non-touching loops

In the preferred embodiment, there are no triplets of non-touching loops, so $$\Delta = 1-\sum_{i=1}^{5}G_i-\sum_{i=1}^{2}L_i+L_1(G_1+G_2)+L_1L_2$$

Sub-Determinants $\Delta_{\underline{k}}=\Delta$ setting to zero gains of loops touching forward path k For X All loops are touched by T1, so $\Delta_1=1$ For E $\Delta_1=\Delta$ for $T_1=1-L_1-L_2+L_1L_2$ The transfer functions can then be constructed for X and E using Mason's rule, where $$TF=\frac{1}{\Delta}\sum_k T_k\Delta_k$$

The transfer functions have the form:

$$\begin{aligned}H_E(z)\equiv\frac{Y(z)}{E(z)} &= \frac{1}{D}\left\{(1-z^{-1})^5-\left(B_1\frac{K_4}{K_2}+B_2K_2\right)z^{-2}(1-z^{-1})^3+\right.\\ &\qquad\left.(B_1B_2K_4)z^{-4}(1-z^{-1})\right\}\\ &= \frac{1}{D}\left\{(1-z^{-1})^5-2C_1z^{-2}(1-z^{-1})^3+\right.\\ &\qquad\left.C_2z^{-4}(1-z^{-1})\right\}\end{aligned}$$

for noise, and $$H_x(z)\equiv H_{NS5}(z)=\frac{Y(z)}{X(z)}=\frac{1}{D}$$

for the signal, where $$D=(1-z^{-1})^5+\sum_{k=1}^{5}W_k\cdot z^{-k}(1-z^{-1})^{5-k}$$

Where, referring to FIG. 63, $$W_1=-A_1K_1$$

$$W_2=A_2K_2-B_1\left(\frac{K_4}{K_2}\right)-B_2K_2$$

$$W_3=-A_3K_3+A_1B_1\left(\frac{K_1K_4}{K_2}\right)$$

$$W_4=-A_4K_4+A_2B_1K_4+B_1B_2K_4$$

$$W_5=-A_5K_5$$

The coefficients are chosen to match a Chebyshev function, which yields equiripple quantization noise in the passband and a flat stopband. The values for Ai and the Bi are obtained from the Ci and Wi in the above equations by matching the noise TF to the desired shaping function.

Preferably, a function is chosen for the NTF which has zeros equally spaced inside the noise stopband (i.e., the signal band), and a flat high-frequency response. For the preferred embodiment, the stopband edge, the stopband attenuation and the filter order must be determined. Since the stopband attenuation is preferably at least 90 dB and the stopband edge is about 6 KHz for an input sampling rate of 8 KHz, or equivalently, about 36 KHz at the maximum sampling rate of 48 KHz, the filter order preferred is five. That is, the noise stop band for noise shaper 802 extends to at least 0.70 $f_s$, and preferably to about 0.75 $f_s$ which is about 0.25 $f_s$ past the signal band. This allows the design requirements for the semi-digital filter to be less stringent.

First, the continuous time zeros and poles are obtained, where the zeros are given by:

$$sz_m: j\cdot\omega_r\cdot\cos\left[(2\cdot m+1)\frac{\pi}{2\cdot N}\right]$$

and the poles by:

$$sp_m: j\cdot\omega_r\cdot\left[\cosh\left(\frac{a\sinh(\epsilon 1)}{N}\right)\cdot\cos\left[(2\cdot m+1)\frac{\pi}{2\cdot n}\right]+ j\cdot\sinh\left(\frac{a\sinh(\epsilon 1)}{N}\right)\cdot\sin\left[(2\cdot m+1)\frac{\pi}{2\cdot n}\right]\right]$$

where N=5, m ranges from 0 to 4, $\omega_r$=stopband edge=2 $\pi$0.36000, and $\epsilon$1 is related to the attenuation G given in dB by:

$$\epsilon 1: \sqrt{10^{-\frac{G}{10}}-1}$$

Figure 65:
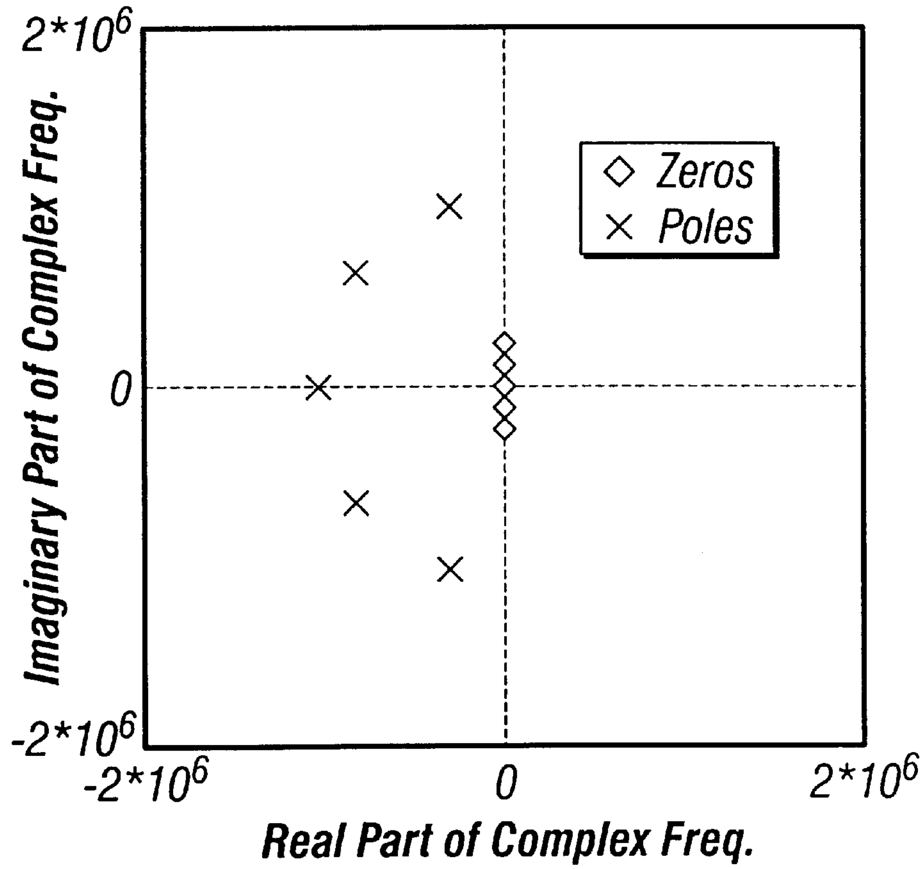
FIG. 65 is a plot of the poles and zeros in the s plane for the noise shaper block of FIG. 52.
Figure 66:
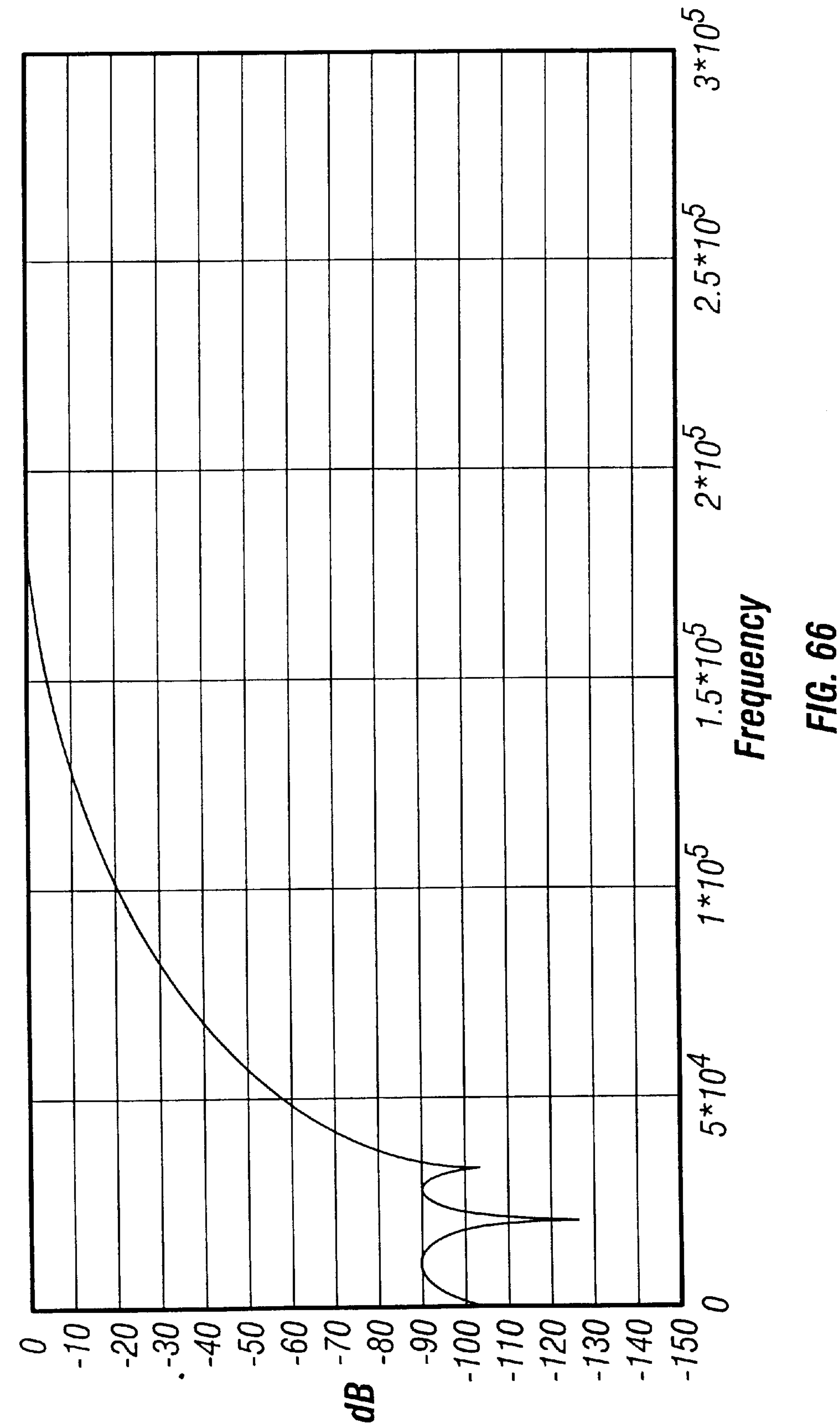
FIG. 66 is a plot of the transfer function magnitude of the noise shaper block of FIG. 52.

The pole-zero diagram in the s-plane is shown in FIG. 65. A plot of the frequency response out to 300 KHz is shown in FIG. 66. Next, the discrete zeros and poles are obtained using the bilinear transformation:

$$zz_k: \frac{1+\frac{T}{2}\cdot sz_k}{\left(1-\frac{T}{2}\cdot sz_k\right)}$$

$$zp_k: \frac{1+\frac{T}{2}\cdot sp_k}{\left(1-\frac{T}{2}\cdot sp_k\right)}$$

$$K=0,\ \ldots 4$$

where $T=1/f_s$, and $f_s$=64×48 KHz=3.072 MHz. This is the highest sampling rate at which the noise shaper 802 will operate, and corresponds to an oversampling factor of 64 times the highest sampling rate for the input signal. It should be understood, however, that the noise shaper will be operated at other (lower) sampling rates.

Solving these equations yields:

$$zz=\begin{bmatrix}0.9975109-j0.06994157\\0.99906389-j0.04325901\\1\\0.99906839+j0.04325901\\0.9975109+j0.06994157\end{bmatrix}$$

-continued $$zp=\begin{bmatrix}0.8584977-j0.2857872\\0.749702598-j0.154122604\\0.715349592\\0.749702596+j0.154122604\\0.8584977+j0.2857872\end{bmatrix}$$

Figure 67:
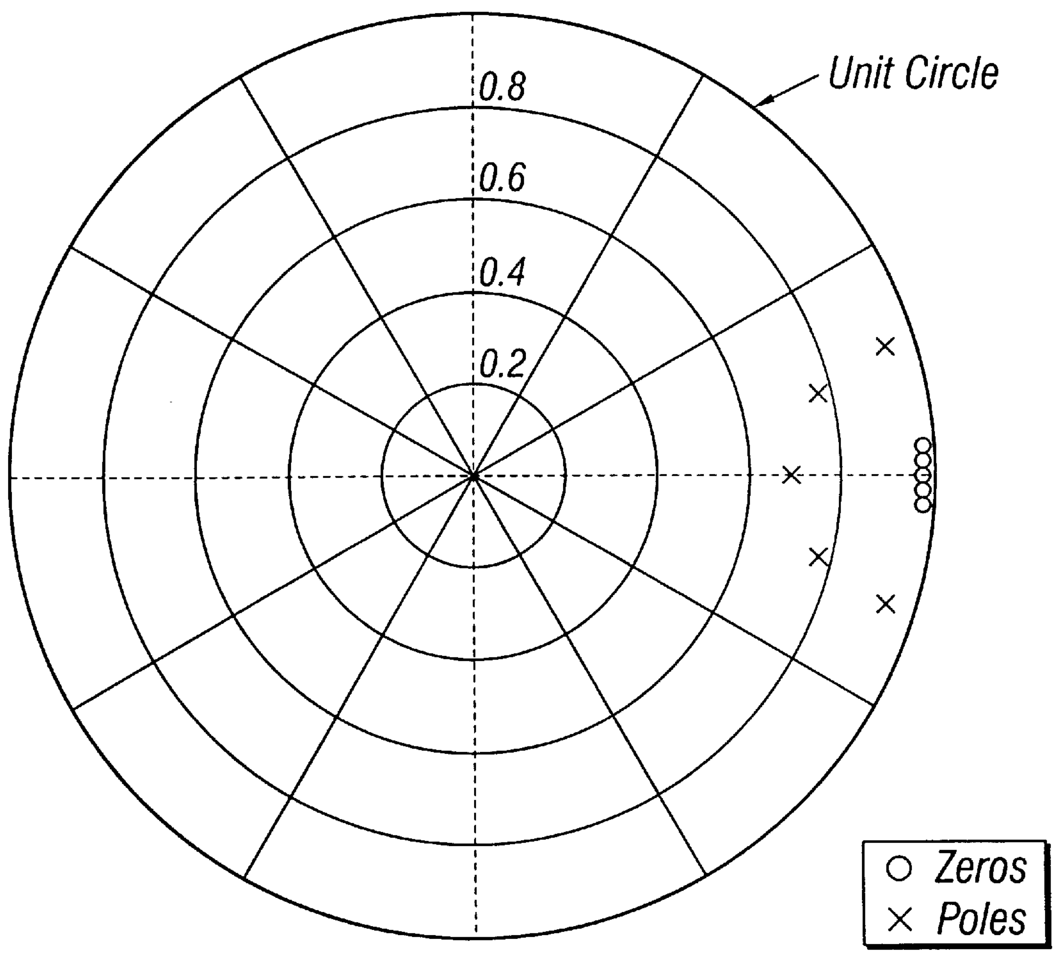
FIG. 67 is a plot of the poles and zeros in the z plane of the noise shaper block of FIG. 52.

FIG. 67 gives the pole-zero diagram in the z-plane for noise shaper 802.

$$K:=\frac{\left[\sum_{k=0}^{N-1}(-1-zz_k)\right]}{\left[\sum_{k=0}^{N-1}(-1-zp_k)\right]};\quad K=1.707272441$$

Figure 68:
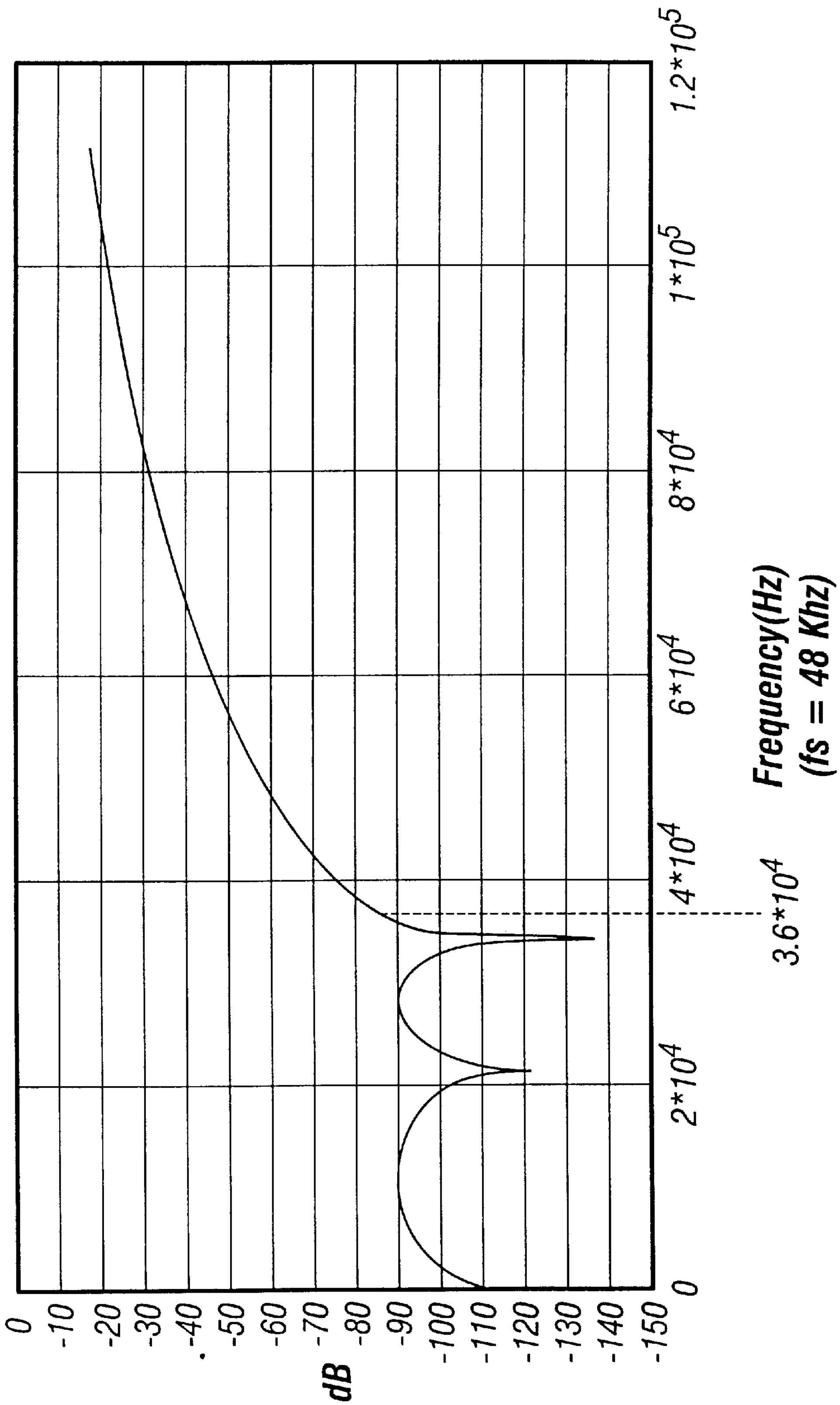
FIG. 68 is a graph of the transfer function of the noise shaper filter of FIG. 52.

K is the gain of the NTF at $f=f_s/2$ (or z=−1) and is an important parameter for stability. The preferred frequency response of the discrete filter for noise shaper 802 is shown in FIG. 68.

The numerator in the transfer function of the selected structure must be matched to the discrete filter. The nature of the zeros that can be realized with it are found by equating the numerator of the noise NTF to zero, producing:

$$(z-1)\cdot[(z-1)^4-2C_1(z-1)^2+C_2]=0$$

One root of this equation is z1=1; the others are obtained from $$(z-1)^4-2C_1(z-1)^2+C_2=0$$

C1, C2 are not independent because they are related to B1, B2 as specified by the NTF equation, previously described. The solution yields the other 4 roots as follows:

$$Z_{2,3}=1\pm\sqrt{B_1\frac{K_4}{K_2}}\qquad z_{4,5}=1\pm\sqrt{B_2K_2}$$

The structure shown in FIGS. 63 and 64 allows one zero at DC (z=1) and two pairs of complex zeros, both of which have real parts equal to 1. This means they cannot be on the unit circle. However, if their angles are small enough, they will still provide enough attenuation. To actually be able to have zeros on the unit circle, more feedback loops (i.e., more coefficients) must be used.

Figure 69:
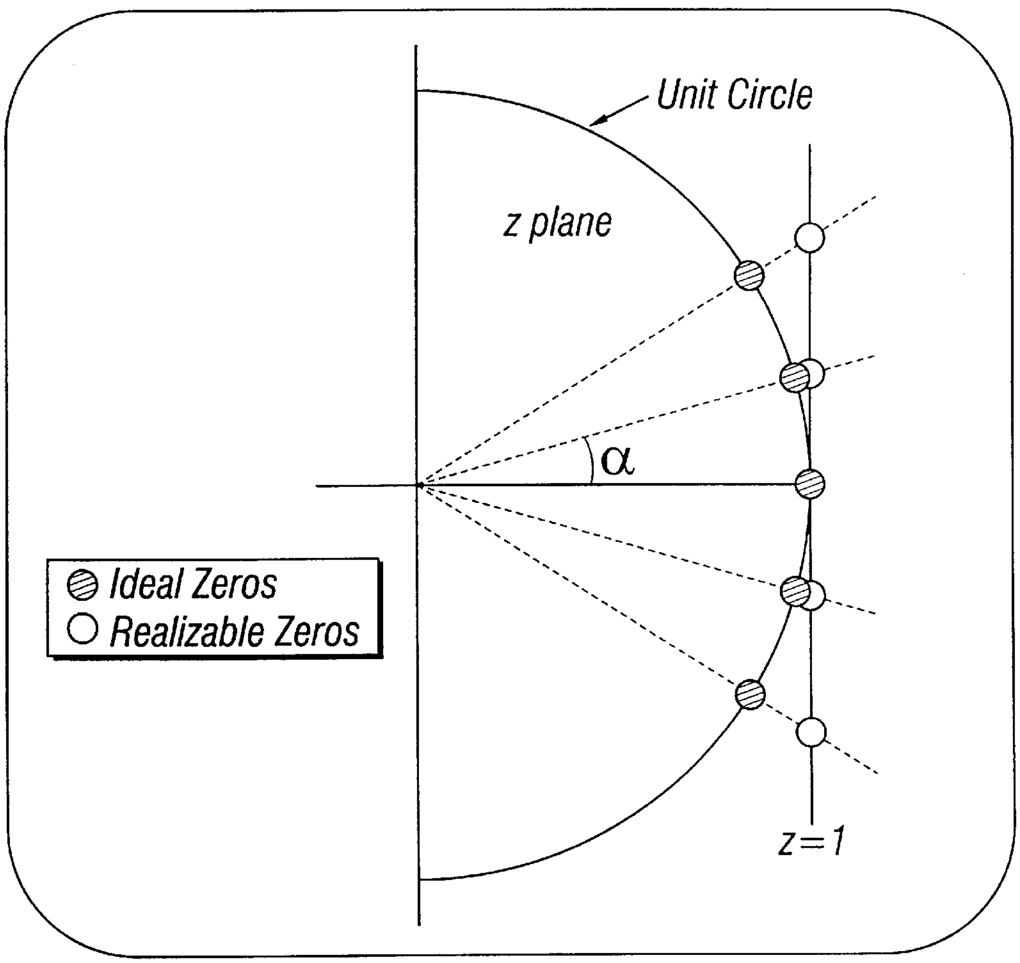
FIG. 69 is a plot of the ideal and realizable zeros of the noise filter block of FIG. 52.

B1, B2 are selected so that preferably the zeros have the same angles as those required by the ideal transfer function. This is shown in FIG. 69, where the angles are exaggerated.

B1, B2 are then selected to be negative, in which case the angle, α, of the respective zero is:

$$\alpha_{2,3}=\tan^{-1}\left(\sqrt{B_1\frac{K_4}{K_2}}\right)$$

$$\alpha_{4,5}=\tan^{-1}\left(\sqrt{B_2K_2}\right)$$

The values of B1, B2 also depend on the values of K2 and K4. In general, the scaling coefficients k, shown in FIG. 63 as $k_1$–$k_5$, should be adjusted so noise shaper 802 is stable for the desired range of amplitudes for the input signals. Preferably, this is accomplished with the following criteria in mind:

The scaling coefficients, k, are equal for the 2nd and 4th integrators 822*a* (FIG. 63) and also for the third and fifth integrators 822*b*. This permits re-utilization of one hardware block 830 containing two integrators 822 and associated adders 848 without having to change scaling coefficients, k. Hardware block 830 is enclosed inside the dotted line in FIG. 63.

The scaling coefficients, k, are only negative powers of two, so only hardwired shifts are used, without multiplication.

The scaling coefficients, k, equalize the signal range at the integrator 822 outputs so the required word width is uniform throughout the structure.

The scaling coefficients, k, set the stability range to be compatible with the desired input signal levels.

The scaling coefficients obtained for an input signal range of ±0.25 dB preferably, are:

$k_1=0.25$ $k_2=0.5$ $k_3=0.25$ $k_4=0.5$ $k_5=0.125$

The feedback coefficient values B1 and B2, for positioning the zeros, are obtained using these scaling factors and preferably are:

B1=−0.039326867 (quantized to 1/32(1+1/4)=0.0390625)

B2=−0.0149988 (quantized to 1/64(1−1/32)=0.01513671875)

The coefficients for denominator D in the NTF equation, $H_E(z)$, above, are obtained by matching the terms in equal powers of z in the equation:

$$D=(1-z^{-1})^5+\sum_{k=1}^{5}W_k\cdot z^{-k}\cdot(1-z^{-1})^{5-K}$$

with the denominator D of the discrete filter to obtain the Wi values, shown above, and then, working through the equations given, together with the values of B1 and B2. In this embodiment, for FIG. 63, a unique solution exists. The preferred feedback coefficients $A_1$–$A_5$, for positioning the poles, are:

$A_1=-4.273$ $A_2=-4.3682518$ $A_3=-5.2473373413$ $A_4=-1.7628879547$ $A_5=-1.28061104$

These feedback coefficients can be quantized to 10 bits, before the STF begins to be affected inside the signal band, where:

$A_1=-4.265625$ $A_2=-4.359375$ $A_3=-5.234375$ $A_4=-1.75$ $A_5=-1.265625$

Figure 70:
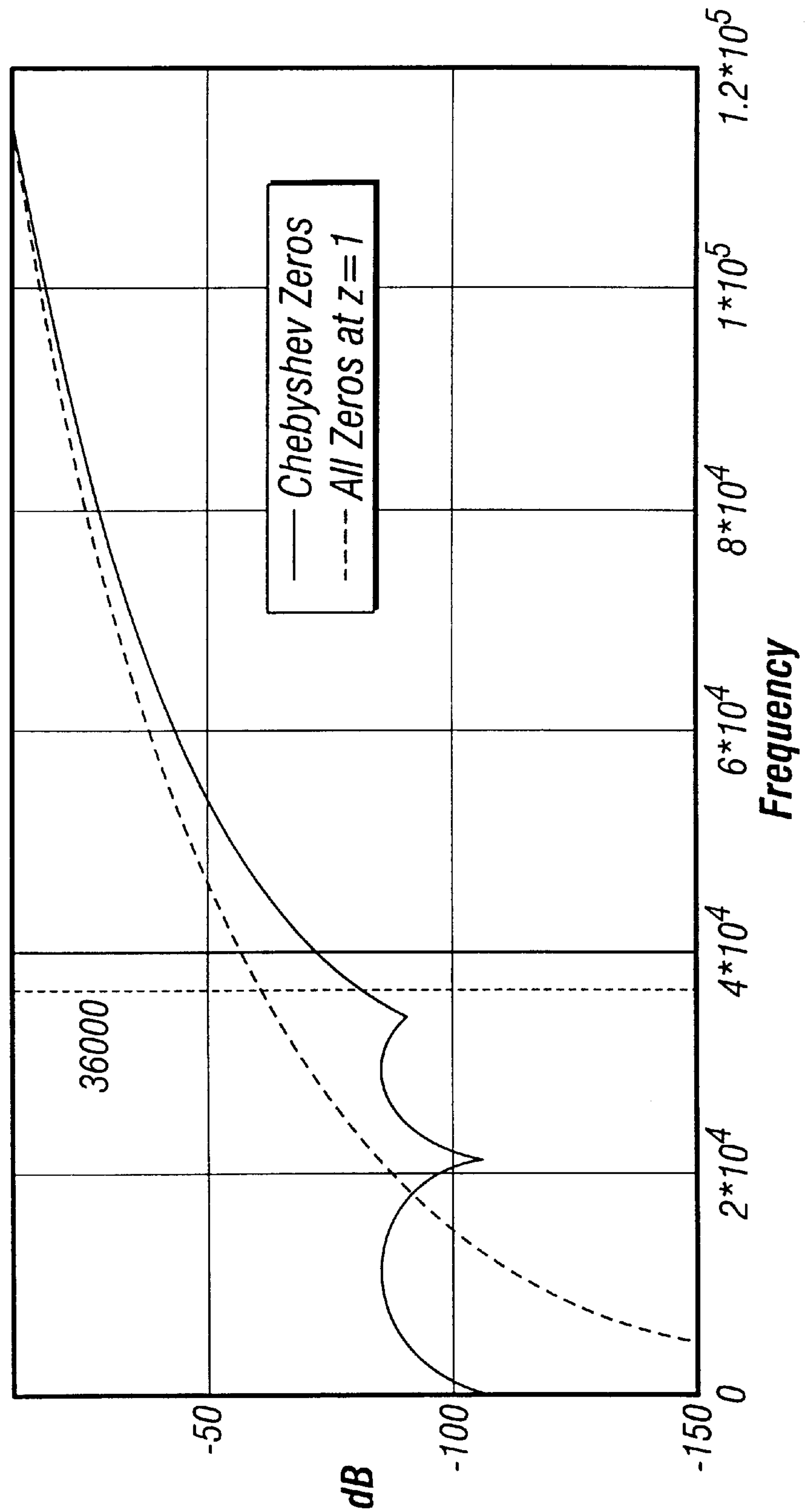
FIG. 70 is a plot comparing two embodiments of noise transfer functions for the noise shaper block of FIG. 52.

The actual NTF magnitude is compared in FIG. 70 with the magnitude of a NTF obtained placing all the zeros at DC (z=1). It can be seen that the noise power in the signal band is about 16.3 dB less in the selected structure, using Chebyshev zeros, than it is in the simpler one with all zeros at DC.

1. Signal Transfer Function (STF) For Noise Shaper

Figure 71:
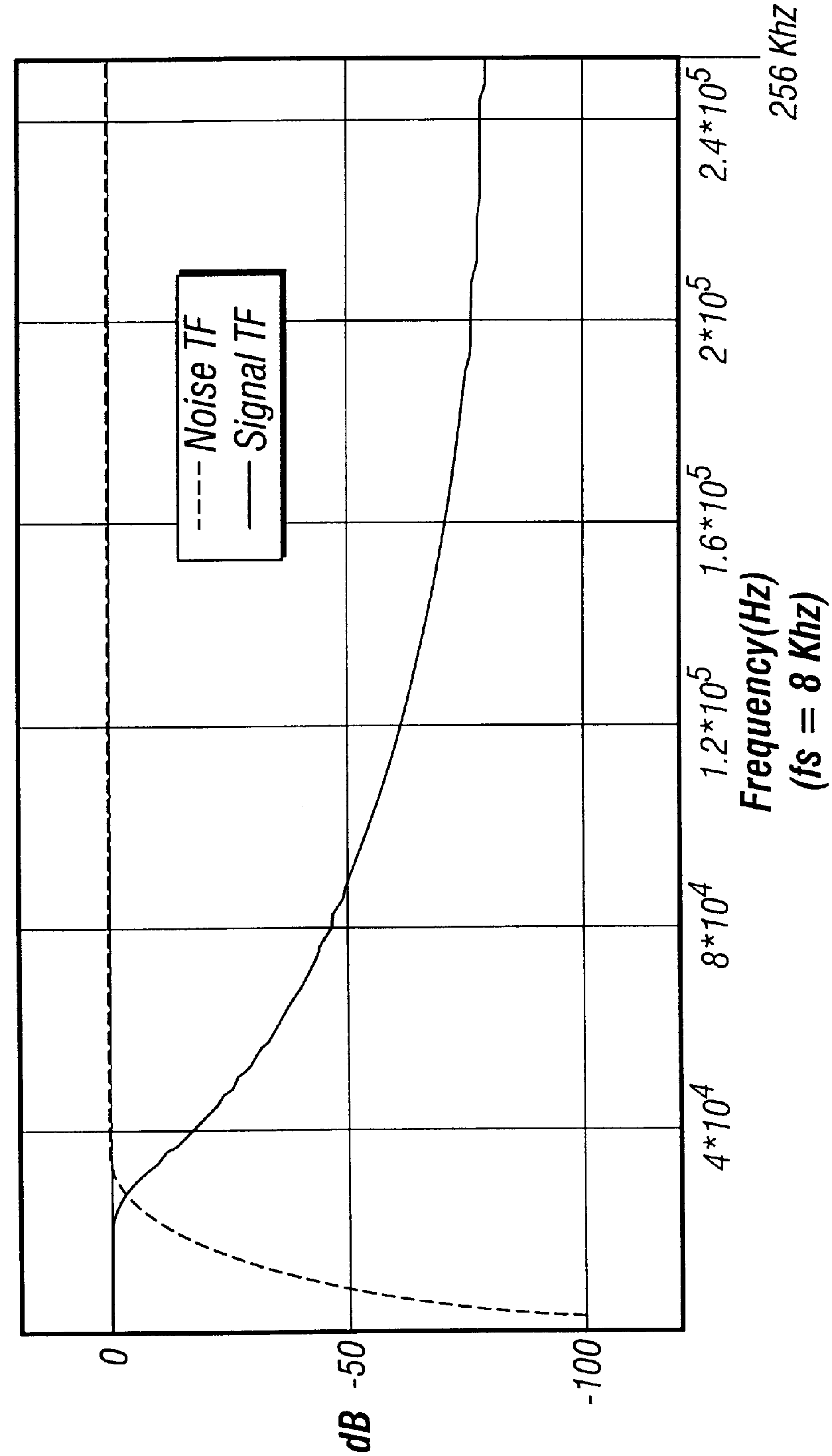
FIG. 71 is a plot of the noise and signal transfer functions of the noise shaper block of FIG. 52.
Figure 72:
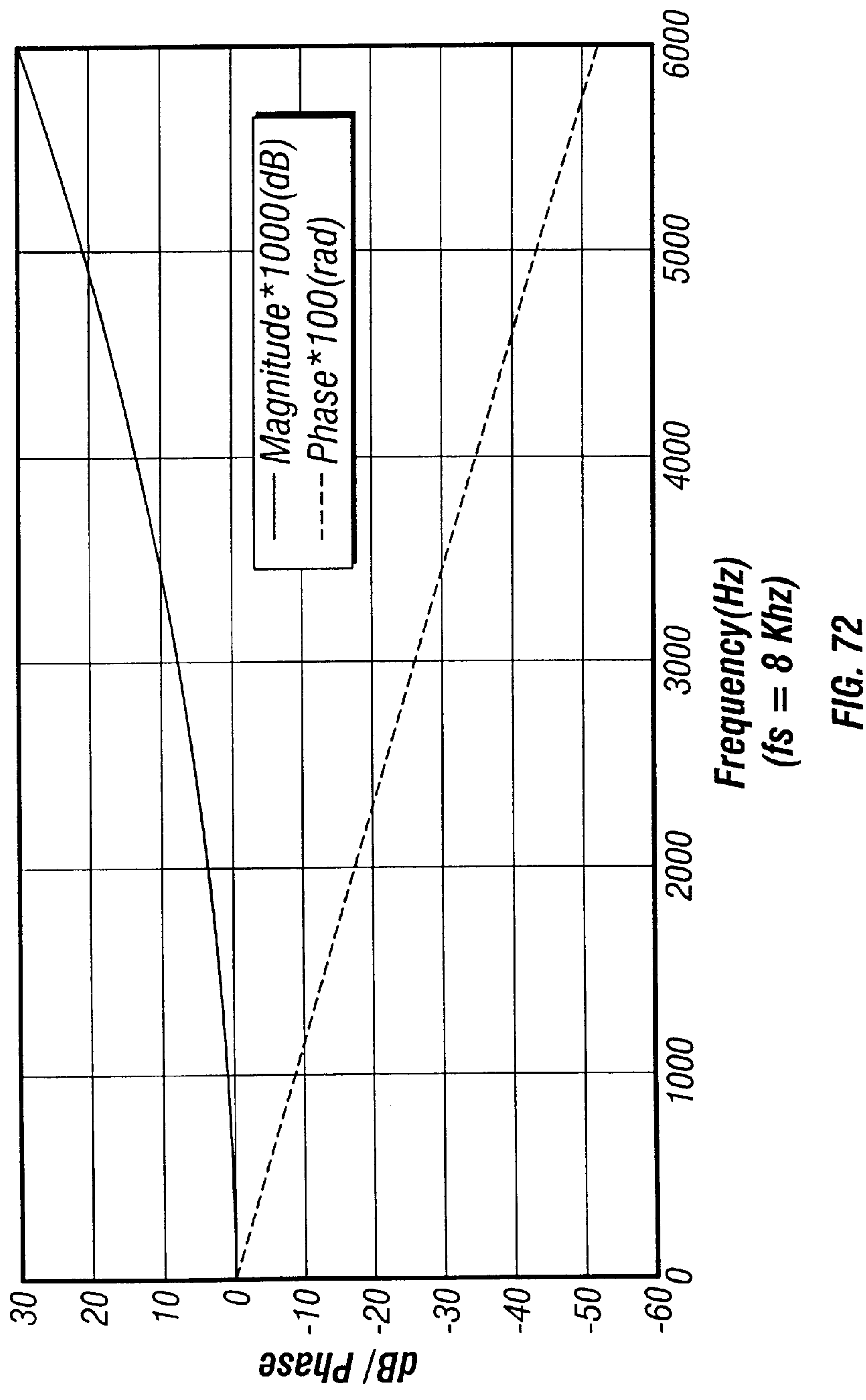
FIG. 72 is a plot of the signal transfer function magnitude in phase and passband of the noise shaper block of FIG. 52.
Figure 73:
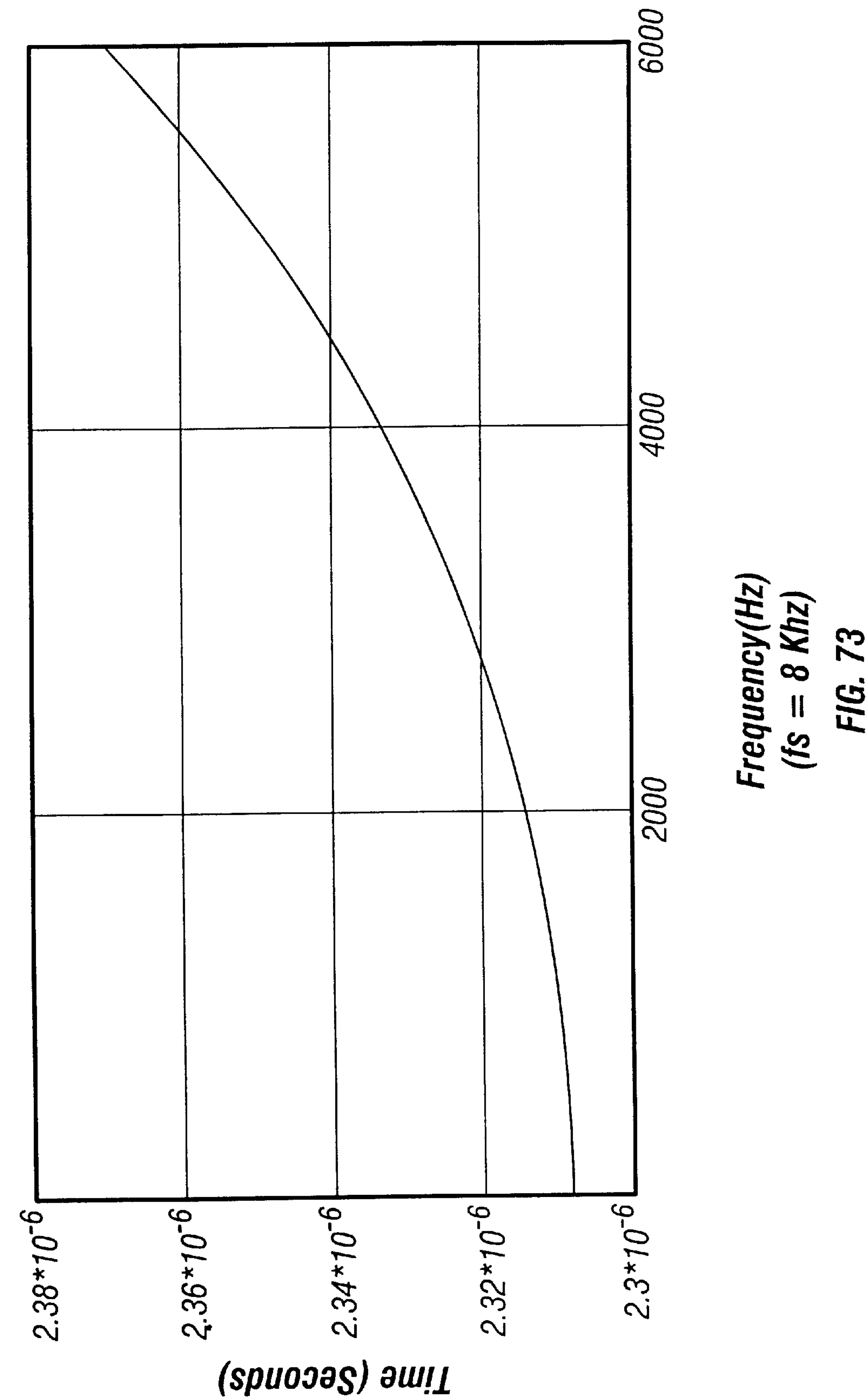
FIG. 73 is a graph of the group delay (sec.) of the noise shaper block of FIG. 52.

Once the feedback coefficients, A; B; shown in FIG. 63 have been determined, the STF for noise shaper 802 is fixed. If the oversampling ratio is large enough, the STF will have little effect inside the signal band. Otherwise, the poles can be tweaked to some extent, but this is not desirable, because stability may be compromised. A better embodiment is to compensate for any distortion in the first interpolation filter Interp. 1 blocks 810, 812. The magnitude of the STF and the NTF is shown in FIG. 71 over the entire frequency range. The preferred STF response in the passband appears in more detail in FIG. 72. The group delay inside the passband is shown in FIG. 73.

The passband tilt is significant enough to violate the preferred ±0.1 dB ripple requirement for the entire playback path, and must be compensated. With regard to group delay distortion, however, it is still acceptable.

The difference between maximum and minimum group delay values is about 21.95 ns. The phase deviation from linear at 3.6 KHz with $f_s$=8 KHz is equal to:

$$\begin{aligned}\Delta\Phi&=360^\circ\frac{\left(\frac{\partial\theta}{\partial\omega}\Big|_{\omega=0}\cdot\omega_b-[\theta(\omega_b)-\theta(0)]\right)}{2\pi}\\&=360\frac{^\circ(-gd[0]\cdot\omega_b-\theta(\omega_b))}{2\pi}\\&\approx0.06^\circ\end{aligned}$$

2. Noise Transfer Function (NTF) for Noise Shaper

The linearized analysis employed to obtain the transfer functions discussed above cannot predict the effects of signal level on stability when the quantizer is overloaded and the additive noise model fails. However, it is known that stability is directly related to the maximum value of NTF. A value close to 2 is the limit of stable operation. In the preferred embodiment, the maximum value for the NTF is obtained for $f=f_s/2$ (z=−1), where the parameters of the NTF are interrelated:

For a fixed stopband width, higher noise attenuations result in higher values of noise gain K at $f=f_s/2$.

For a fixed noise attenuation, higher stopband widths also result in higher values of noise gain.

Figure 74:
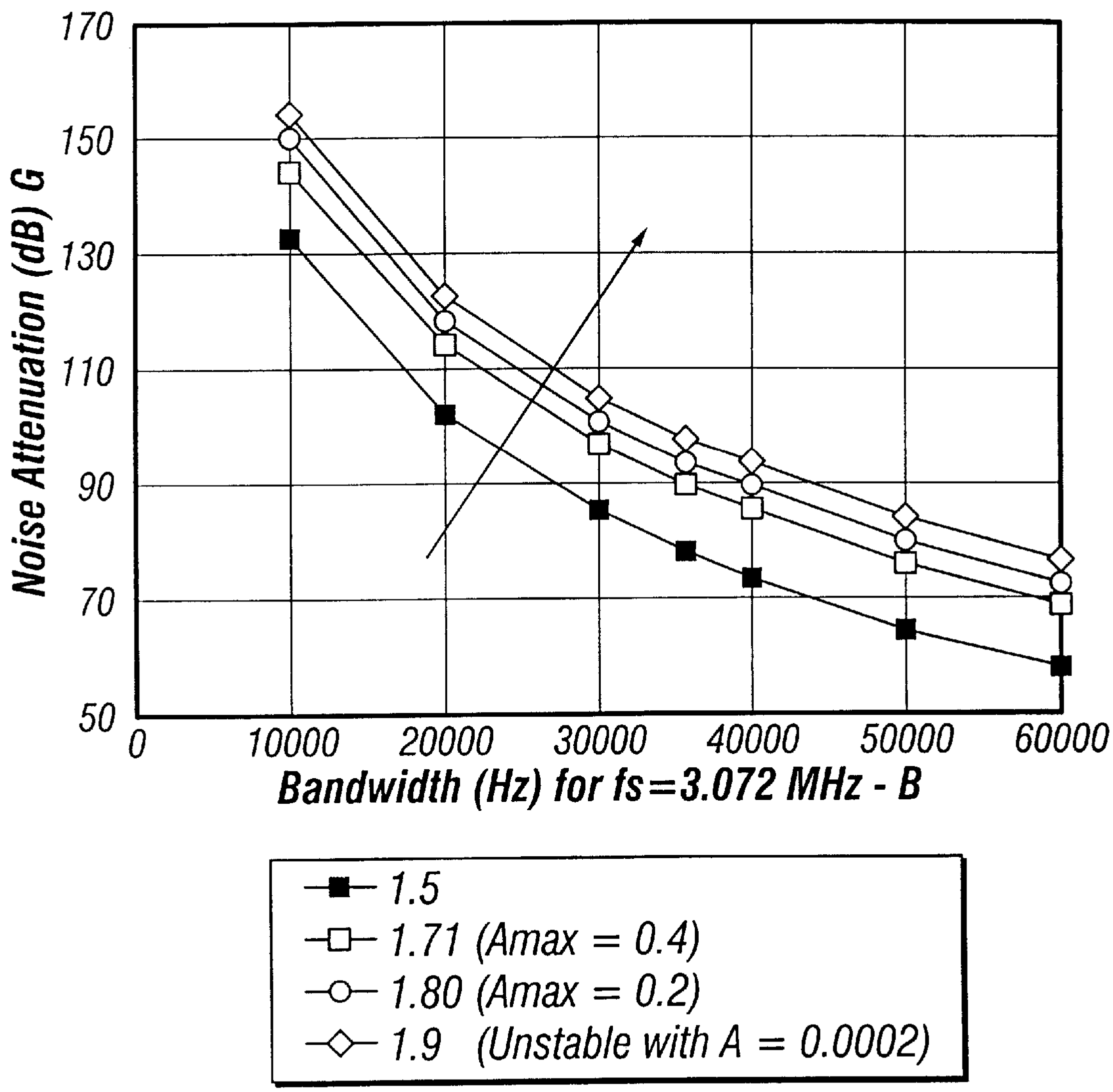
FIG. 74 is a graph of the constant attenuation/gain contours of various embodiments of the noise shaper block of FIG. 52.

A fixed value of noise gain K at $f_s/2$ can be obtained for any value of noise attenuation G provided the bandwidth is correct, or vice versa. A plot of constant noise gain contours is shown in FIG. 74.

In the preferred embodiment, a noise gain of 1.7 is used which results in stability and near maximum input amplitude, $A_{max}$. A noise gain, K=1.85 and higher appears to be unstable. This indicates that the transition from stability (K=1.7) to instability (K=1.85) is rather abrupt. The maximum input amplitude, $A_{max}$, that the circuit can tolerate before going unstable is directly related to the noise gain value. For example, all loop configurations that followed the contour for K=1.8 have a value of $A_{max}$=0.2, while those that fall on the K=1.71 contour have a value $A_{max}$=0.4. The arrow in FIG. 74 shows the direction from stability to instability in the G-B space. $A_{max}$ does not increase indefinitely as K decreases. It actually peaks around K=1.71. This is determined in part by the values of the integrator gains (FIG. 75).

Figure 75:
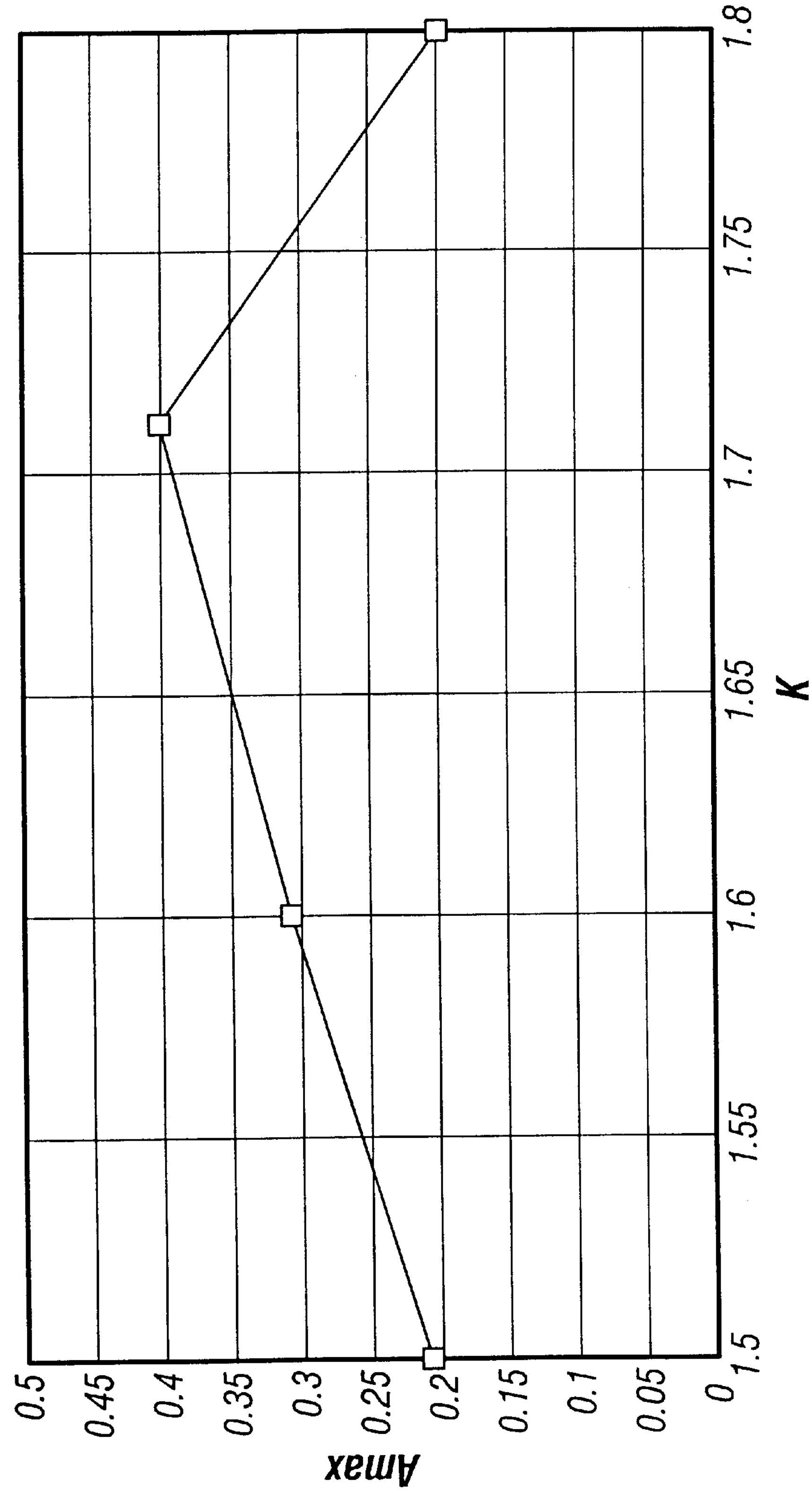
FIG. 75 plots $A_{max}$ versus noise gain k for an embodiment of the noise shaper block of FIG. 52.
Figure 76:
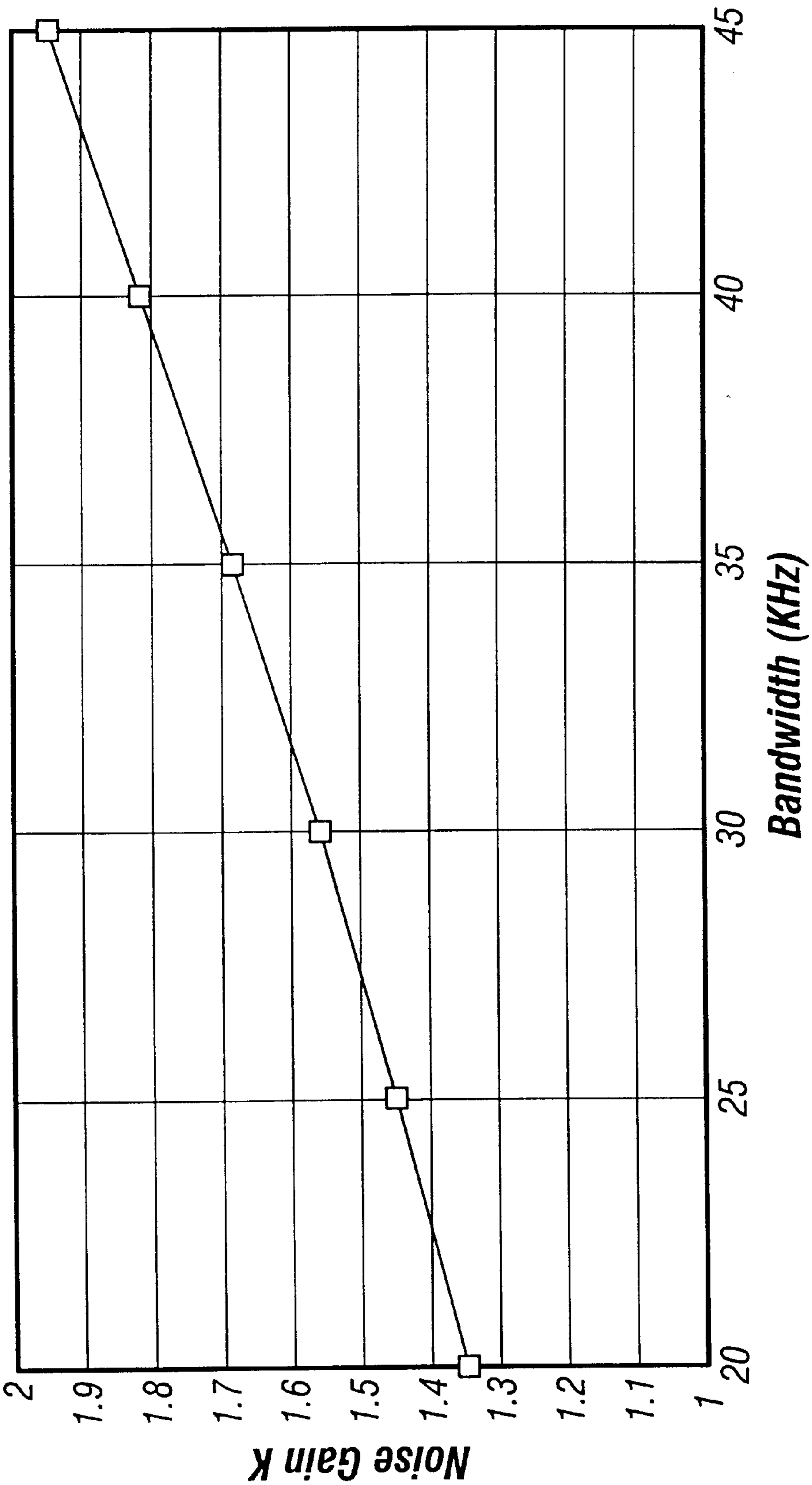
FIG. 76 is a graph of an embodiment of the noise gain k versus band width for g=−90 dB of the noise shaper block of FIG. 52.

If the bandwidth remains constant and the noise attenuation G is varied, $A_{max}$ vs. K is shown in FIG. 75 for a bandwidth of 20 KHz. If the noise attenuation G remains constant and the bandwidth varies, a plot as in FIG. 76 results. This was obtained for G=90 dB. The stability limit of K=1.8 is reached with about 40 KHz bandwidth.

For a bandwidth at about 36 KHz, the noise gain value K, is about 1.707 which also coincides with the peak $A_{max}$=0.4. To ensure stable operation, the maximum amplitude into the loop is preferably kept at about 0.25.

D. Playback Semi-Digital Filter (SDF)

Figure 77:
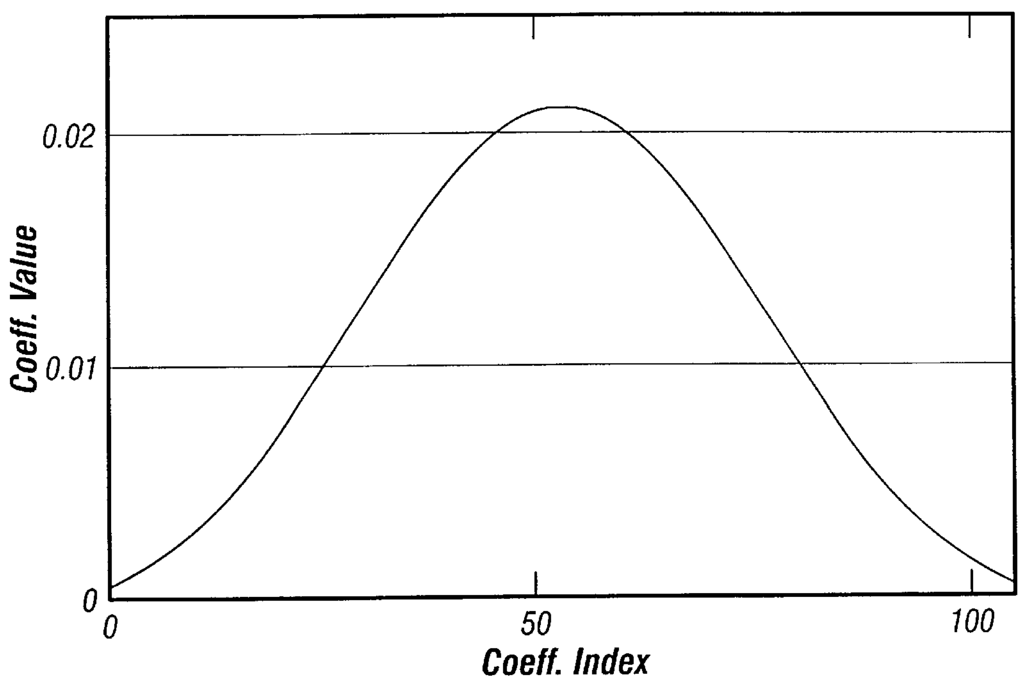
FIG. 77 is a graph showing the impulse response of the D/A FIR filter.
Figure 78:
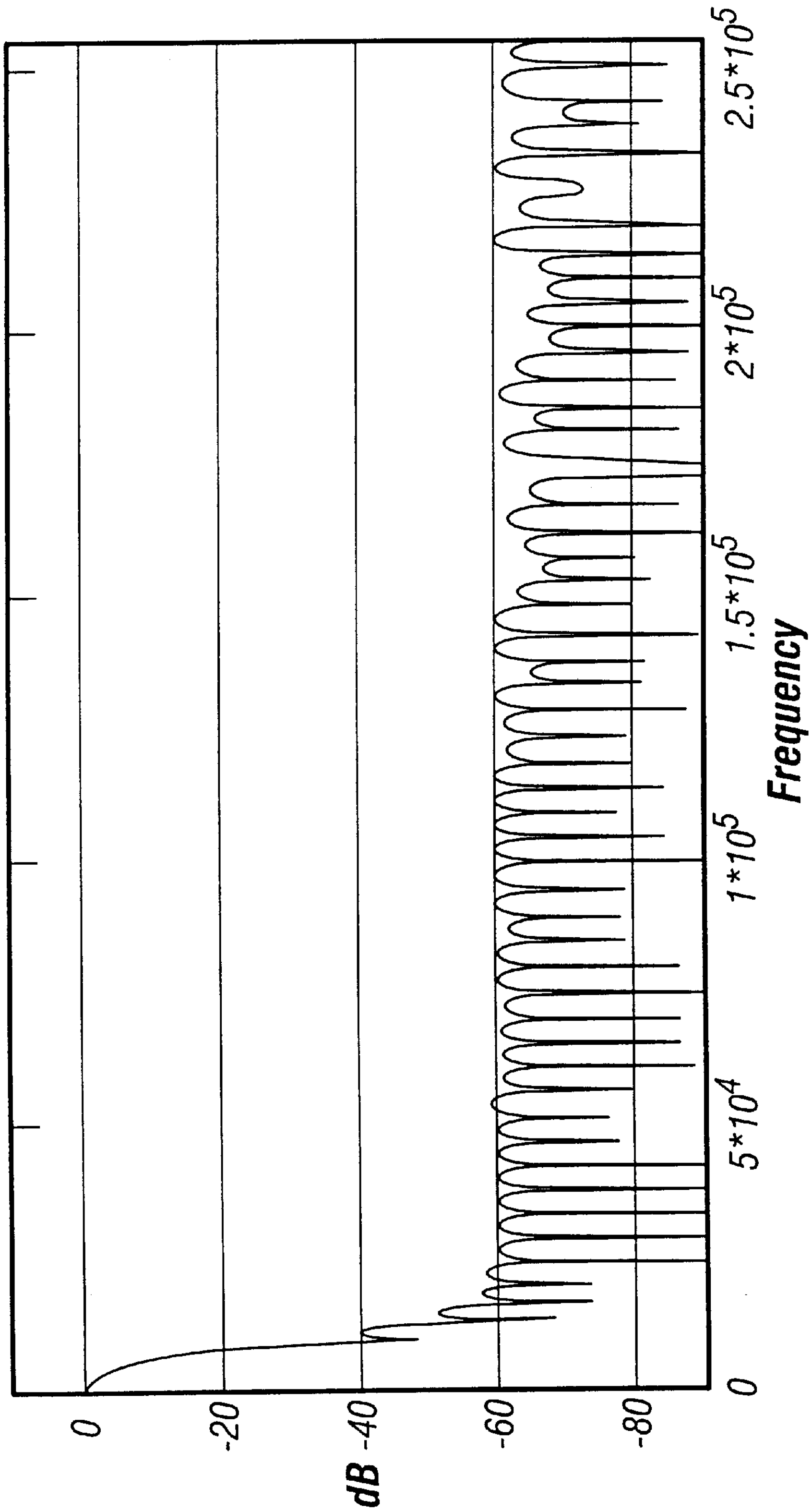
FIG. 78 is a graph showing the frequency response of the D/A FIR filter.

The semi-digital FIR filter 804, the last stage of CODEC playback DAC 514, filters the 1-bit signal 842 at 64 times the frequency of the sample rate for the 16-bit input signal 806 which is input to the Interpolator filter block 800 (FIG. 51), and converts the 1-bit signal 842 to an analog signal output signal 808. Semi-digital FIR filter 804 coefficients are preferably positive and preferably have a ratio of maximum value to minimum value of less than 40. FIG. 77 shows the impulse response and FIG. 78 shows the frequency response of this semi-digital filter 804. Semi-digital FIR filter 804 performs the functions of: 1) converting the 1-bit digital signal to an analog signal; and 2) filtering out high frequency noise created by noise shaper 802. Semi-digital FIR filter 804 combines the D/A converter function with the analog low pass filter function in such a way that the high frequency noise is removed without adding substantial distortion at lower frequencies.

Figure 37:
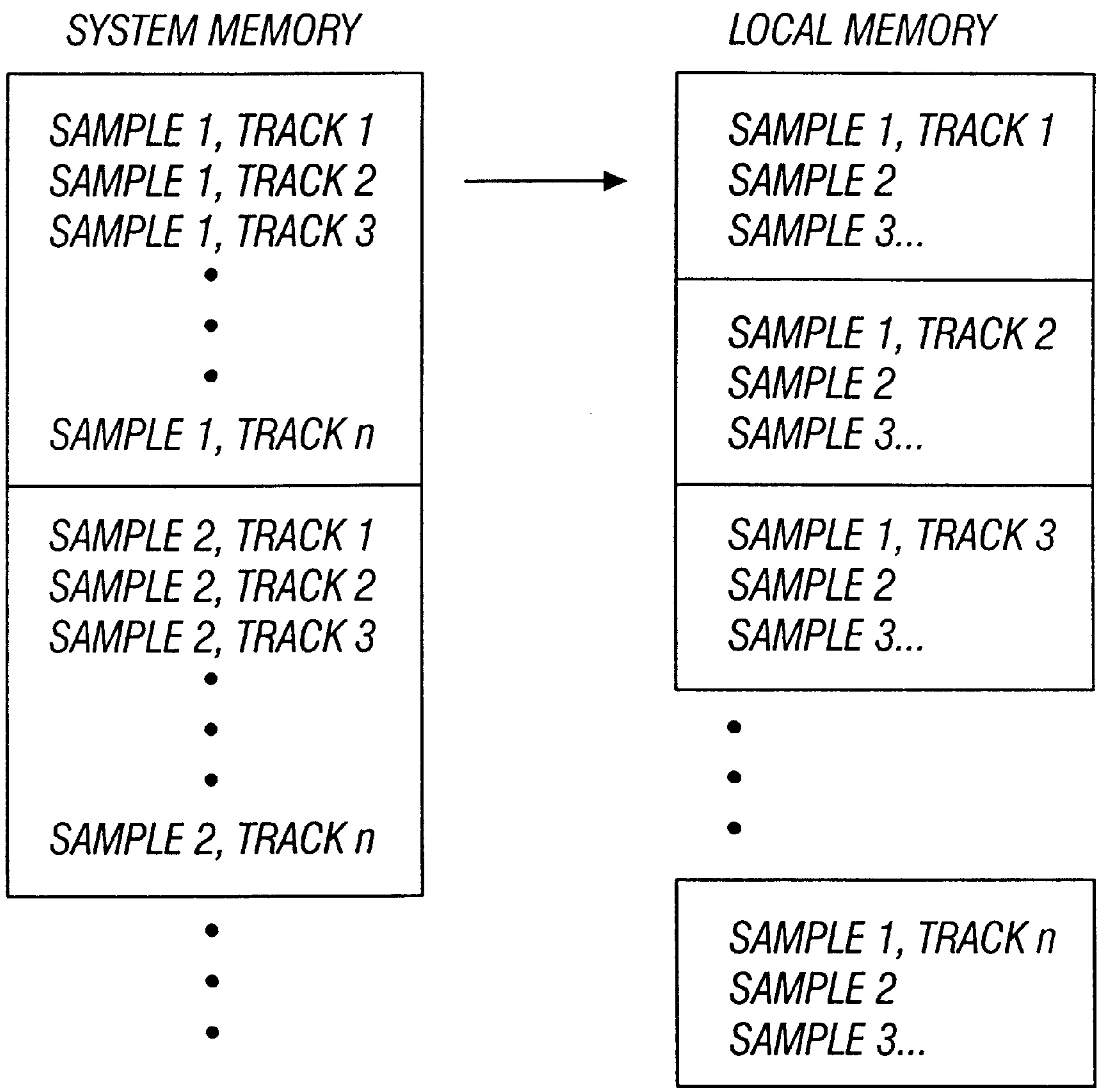
FIG. 37 is a diagram illustrating the relationship between data stored in system memory and interleaved in local memory via the circuit C.
Figure 79:
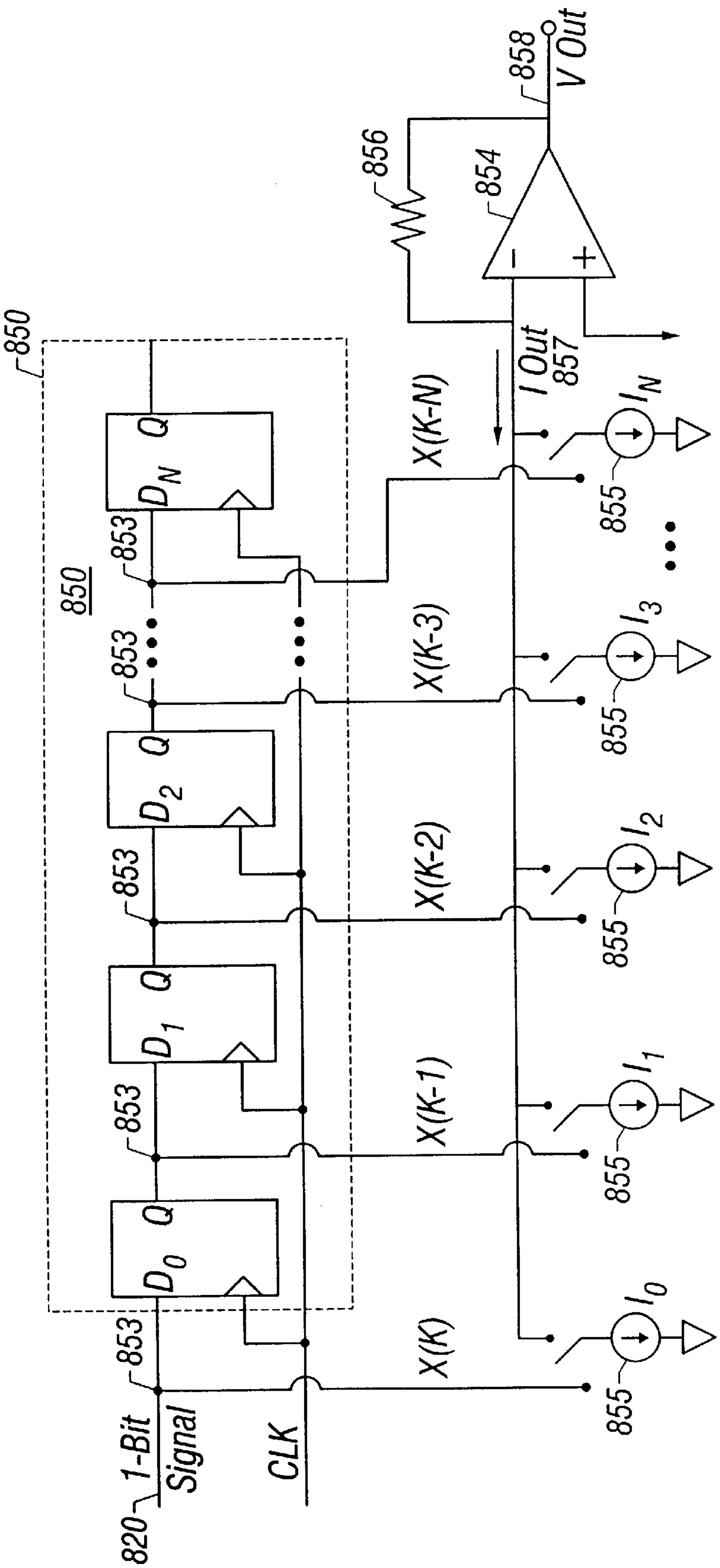
FIG. 79 schematically illustrates one embodiment of the D/A conversion circuit of the present invention.

Semi-digital FIR filter 804 includes a shift register 850 (FIGS. 79, 37). Data taps 853 are present at the input to each successive flip-flop 852 in shift register 850. The logic state of each data tap 853 is used to control the switching of a current sink 855 which is connected to the respective data tap 853. The value of the respective current sink 855 represents a coefficient used to produce the desired impulse response for the filter. All current sinks 855 are summed together and converted to a voltage by means of an op amp 854 and resistor 856.

Shift register 850, which preferably is a 107 bit long shift register, forms a digital delay line whereby each flip flop 852 represents one unit of delay. Thus, if the input to shift register 850 is termed x(k), then the first data tap 853 would be termed x(k−1) since it has the same value as x(k) does, but is delayed by a single clock period. Likewise the next data tap 853 would be termed x(k−2) and so on. As mentioned before, each data tap 853 controls an individual current sink 855. Thus, the total current, IOUT 857, is equal to the scaled sum of each of the current sources 855. This can be represented with the following equation:

$$IOUT(k)=I0^*(k)+I1^*x(k-1)+I2^*x(k-2)+ \ldots +IN^*x(k-N)$$

The op amp 854 and resistor 856 convert the current IOUT 857 into a voltage output signal, VOUT 858. This can be represented by the following equation:

$$VOUT=(K)=R^*I0^*x(k)+R^*I1^*x(k-1)+R^*I2^*x(k-2)+ \ldots +R^*IN^*x(k-N)$$

The coefficients for semi-digital FIR filter 804 are determined by values of each of the individual currents. The value of each of the coefficients represented by the current sinks 855 is not a function of the 1-bit signal 842, which helps maintain the linearity of the structure.

Figure 80:
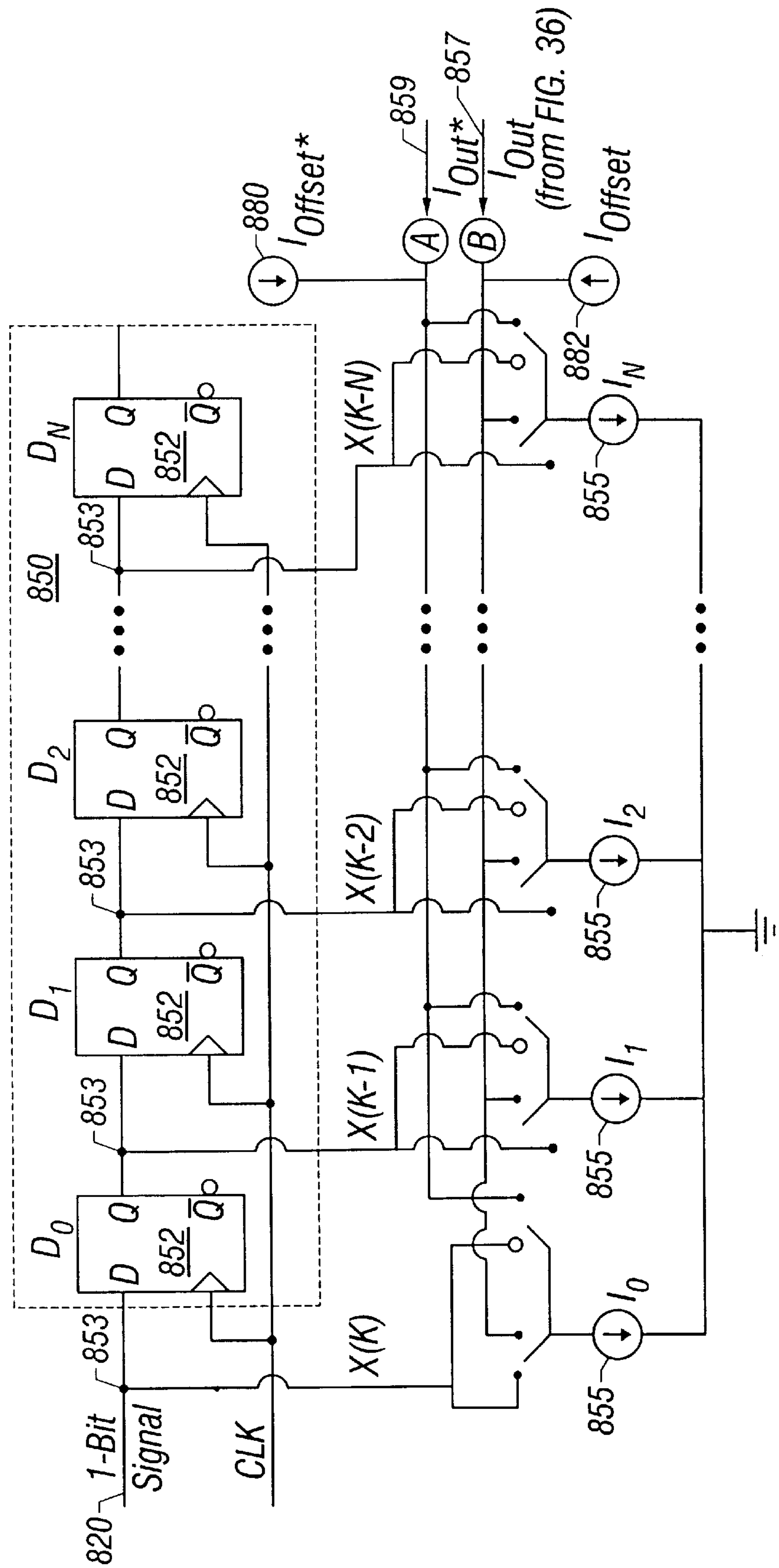
FIGS. 80 and 81 schematically illustrate another embodiment showing the differential D/A conversion circuit of the present invention.
Figure 81:
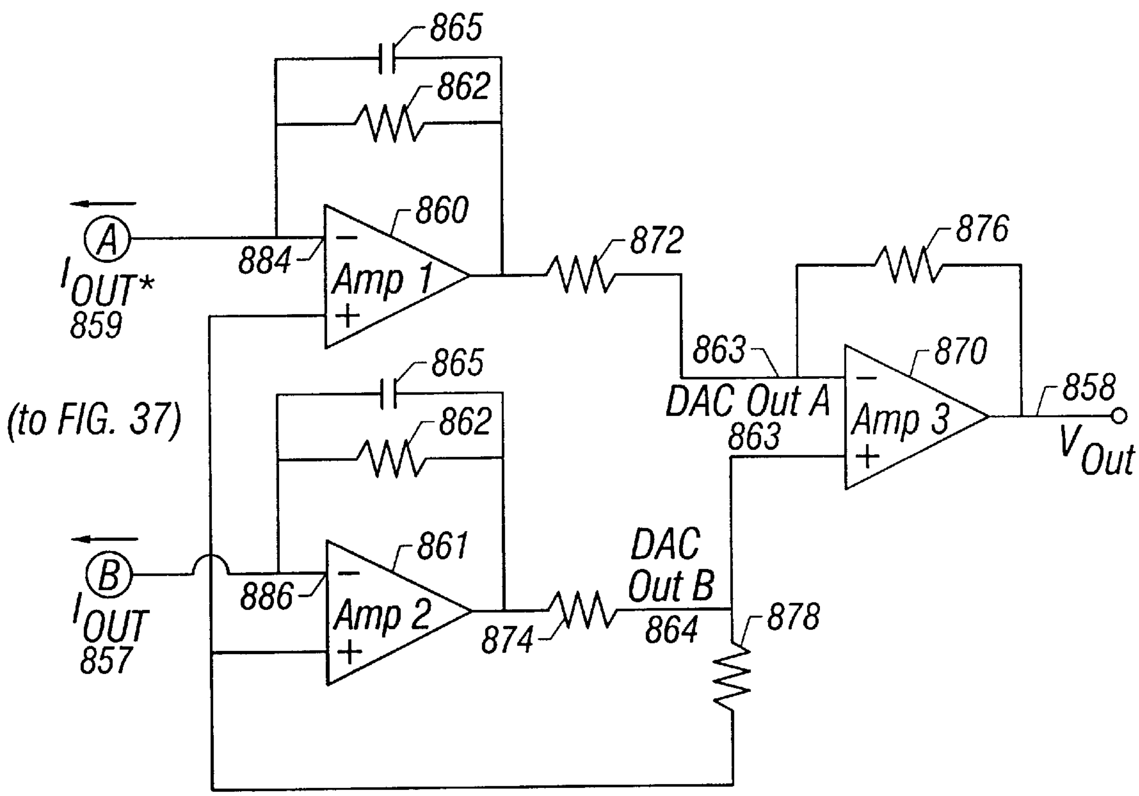

In another embodiment shown in FIGS. 80 and 81, two differential currents, IOUT 857 and IOUT* 859, are used. The 1-bit signal 842 output from noise shaper 802 can take on only 2 values: logic 1 and logic 0. For each bit in the shift register 850, if a logic 1 exists, the current sink 855 associated with the bit is connected to the IOUT line. If a logic 0 exists, the current sink 855 associated the bit is connected to the IOUT* line. The following is an example of a semi-digital filter having two taps. In this example there are four possibilities, as shown in table C14.

TABLE C14

| x(k) | x(k − 1) | IOUT | IOUT* |
|---|---|---|---|
| 0 | 0 | 0 | I0 + I1 |
| 0 | 1 | I1 | I0 |
| 1 | 0 | I0 | I1 |
| 1 | 1 | I0 + I1 | 0 |

There are two things to note about the table C14. First, since there are only current sinks available and since the data taps can only take on the values of 0 or 1, currents IOUT 857 and IOUT* 859 can only take on positive values, or zero. Thus, semi-digital FIR filter 804 has a built-in DC offset which must be removed. In the preceding example, IOUT 857 and IOUT* 859 take on values from 0 to I0+I1. Thus an inherent DC offset exists in IOUT 857 and IOUT* 859 which in this two bit example has a value of (I0+I1)/2. This DC offset in this example can be effectively removed by subtracting a fixed amount of current (I0+I1)/2, from the IOUT 857 and IOUT* 859 lines. Once this DC offset is removed, the net effective IOUT 857 and IOUT* 859 currents are as described in table C15.

TABLE C15

| x(k) | x(k − 1) | IOUT | IOUT* |
|---|---|---|---|
| 0 | 0 | −(I0 + I1)/2 | (I0 + I1)/2 |
| 0 | 1 | (I1 − I0)/2 | −(I1 − I0)/2 |
| 1 | 0 | −(I1 − I0)/2 | (I1 − I0)/2 |
| 1 | 1 | (I0 + I1)/2 | −(I0 + I1)/2 |

Referring to FIGS. 80 and 81, two offset current sources, 880 and 882 are used to achieve reduction of the inherent DC offset. Current source IOFFSET* 880 is connected to the current summing node 884 of amp1 860. Current source IOFFSET 882 is connected to the current summing node 886 of amp2 861. The value of current sources IOFFSET* 880 and IOFFSET 882 is (I0+I1+ . . . +IN)/2.

For each shift register data tap combination, IOUT* 859 has the same magnitude and opposite sign as IOUT 857. As a differential structure, even ordered distortion product terms and common mode noise are reduced. The differential currents are then converted to voltages by a pair of op amps, op amp1 860 and op amp2 861, each with resistive feedback 862 and capacitor 865 as shown in FIG. 81, which results in voltage signals DACOUTA 863 and DACOUTB 864. High frequencies are removed by capacitor 865 which is in parallel with each of the resistors 862 associated with ampl 860 and amp2 861. The differential voltage DACOUTA-DACOUTB is converted to a single ended voltage output signal VOUT 858 by a conventional differential-to-single-ended converter circuit which includes resistors 872, 874, 876 and 878 and op amp3 870. The positive input to op amp3 870 is connected through resistor 878 to a reference voltage, VREF, which is preferably ground, but may be a mid-range voltage between VCC and ground.

E. Architecture for the CODEC Record ADC

The CODEC record ADC 516 (FIG. 82) functions to preserve a high signal to distortion ratio (STD) compatible with CD quality (higher than 90 dB) audio while reducing the sampling rate of the incoming analog signal from a value of 64×$f_s$, to $f_s$, where $f_s$ is the output sampling rate. The record ADC 516 performs a decimation on the oversampled audio signal such that decimation filter block 902 down-samples the 64×over-sampled signal by 64. The decimation process, explained below, is performed in three stages within decimation filter block 902, by factors of 16, 2 and 2, respectively, to minimize decimation circuit complexity.

Figure 82:
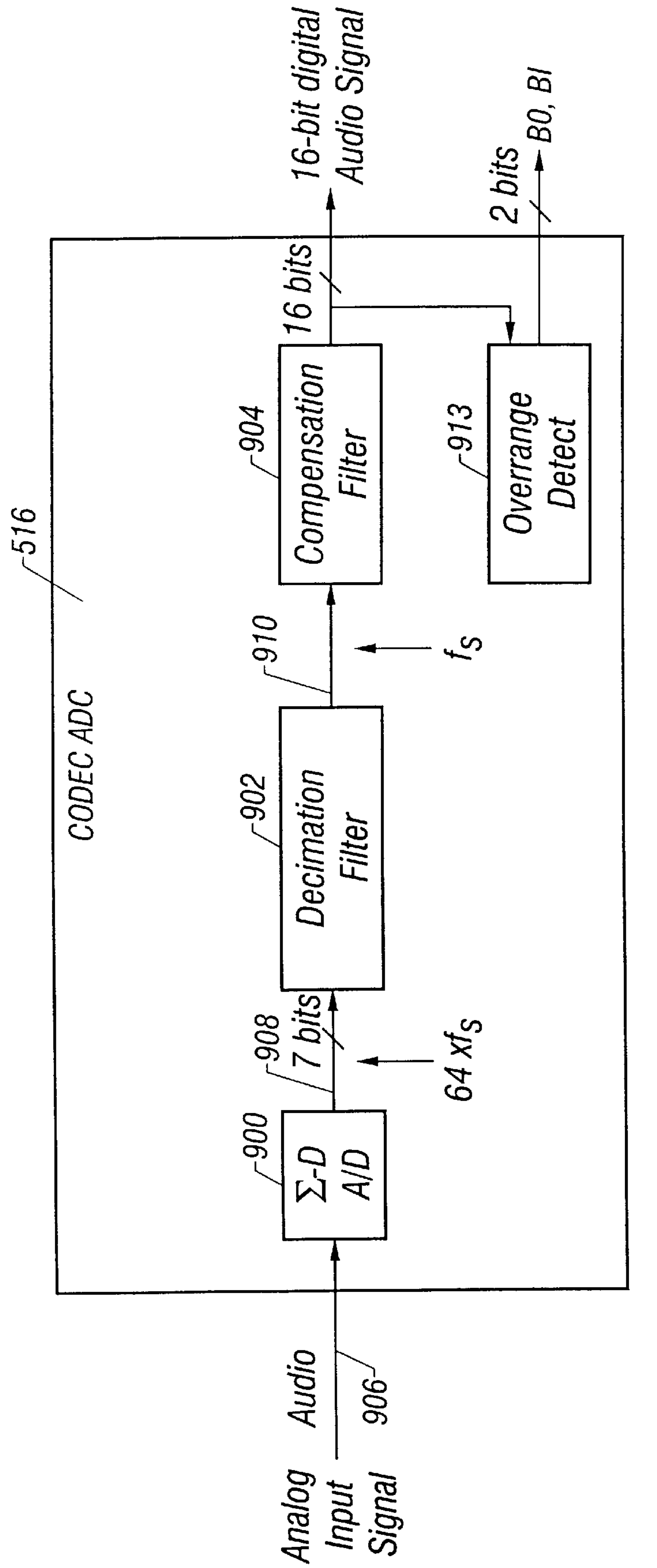
FIG. 82 is a block diagram of the CODEC ADC of the present invention.
Figure 83:
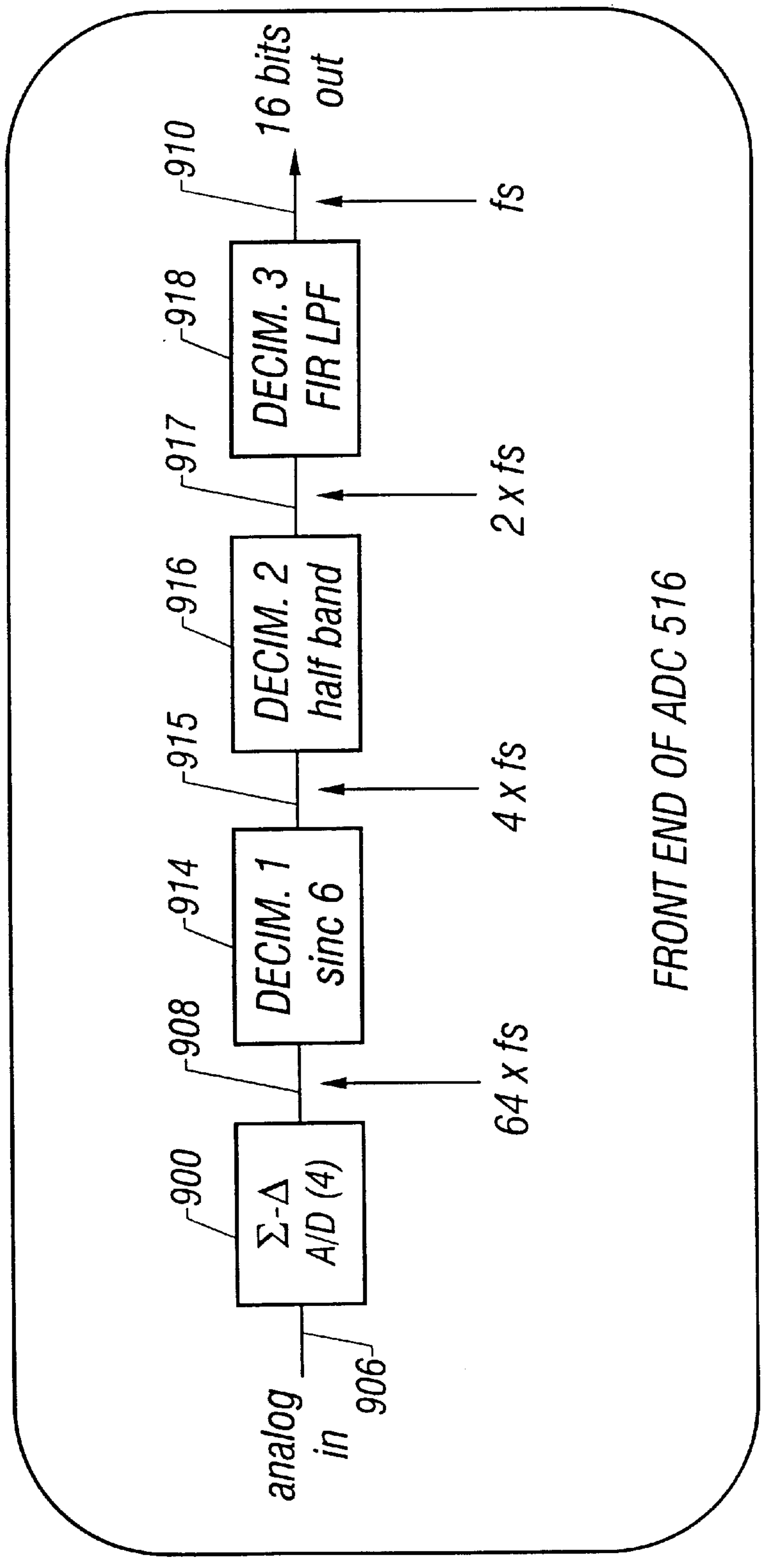
FIG. 83 is a block diagram of the front end of the CODEC ADC.

Referring to FIGS. 82 and 83, the record ADC 516 receives as input an analog audio signal 906, which is converted by a fourth order Σ-Δ A/D 900 into a 7-bit signal 908 at a sampling rate of $64\times f_s$ (64×oversampling). The decimation filter block 902 receives this 7-bit input signal 908 and produces a 16-bit output signal 910 at a sampling rate $f_s$.

The spectrum of the sampled analog input signal 906 contains components of frequencies up to $f_s/2$ and their images centered about integer multiples of $64\times f_s$, where the input signal 908 is assumed to be band-limited (high frequencies filtered out) by an anti-aliasing filter of adequate attenuation located in the record path before the Σ-Δ A/D 900 (not shown). The anti-aliasing filter may be user installed or may be in Mixer 606, or elsewhere prior to the Σ-Δ A/D 900.

Figure 84:
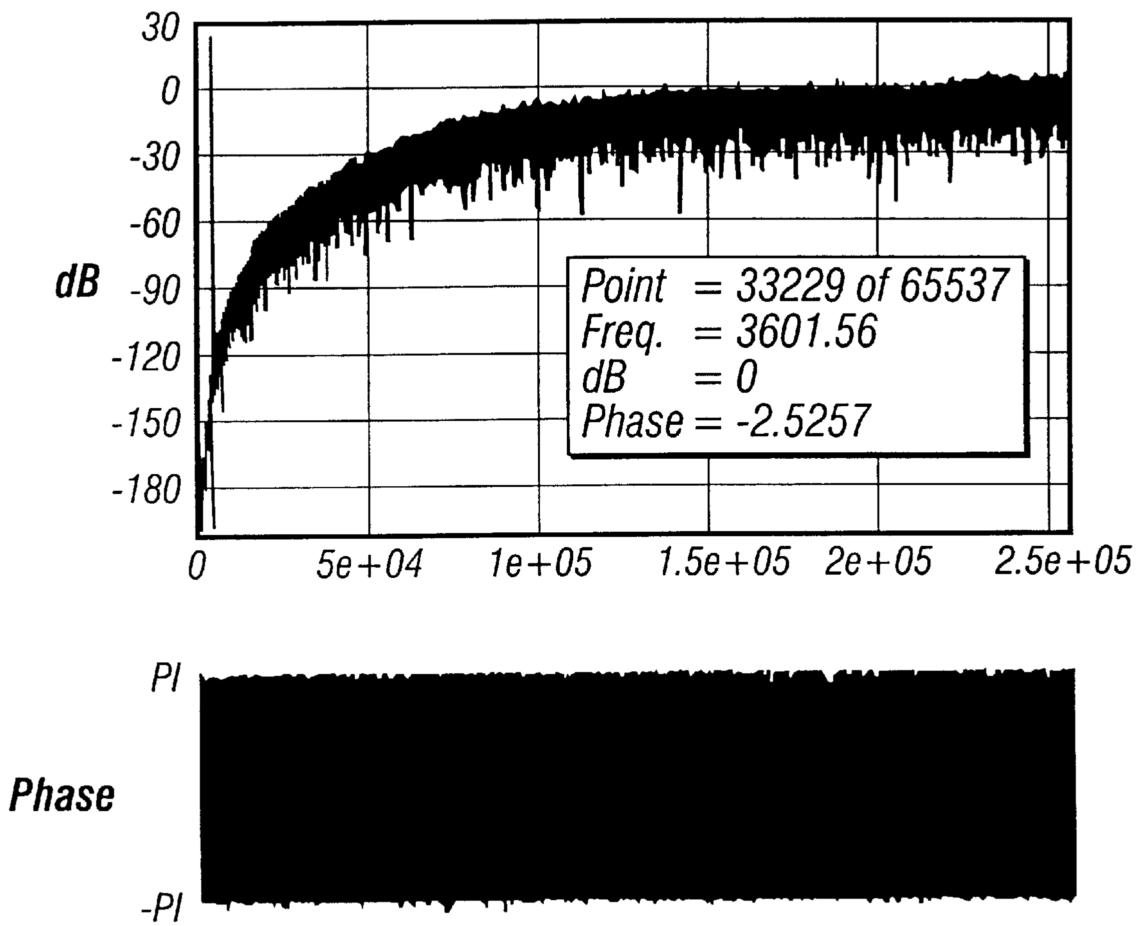
FIG. 84 is a graph illustrating the sigma-delta modulator output spectrum-range and phase for the ADC of the present invention.
Figure 85:
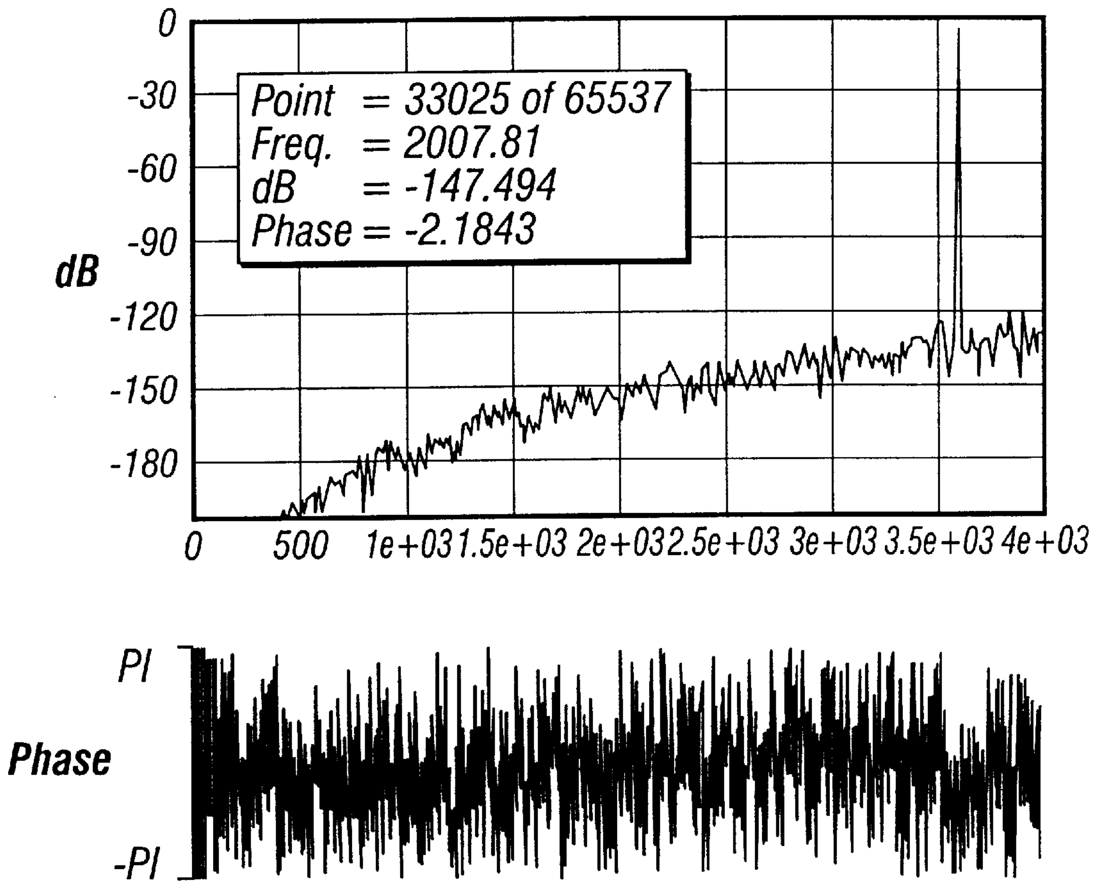
FIG. 85 is a graph illustrating the sigma-delta modulator output spectrum, in detail.
Figure 86:
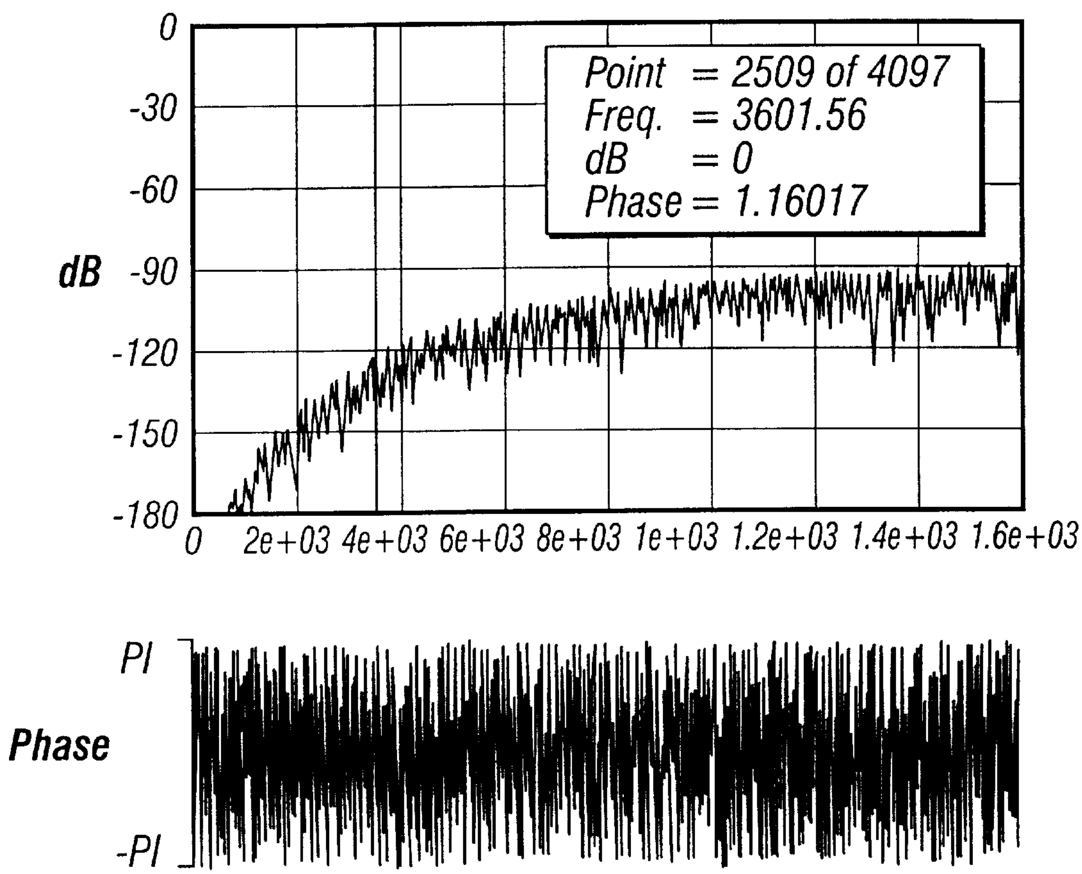
FIG. 86 is a graph illustrating the output spectrum of the sinc6 Decim.1 filter output.

The record ADC 516 output spectrum is shown in FIG. 84 out to $64\times f_s/2$, and a detail of the passband (in this case, 4 KHz) appears in FIG. 85. To carry out the first decimation in Decim.1 914 to $f_s'=4\times f_s$ (a decimation factor of 16), a $\text{sinc}^6$ filter is employed. The spectrum of the output of Decim. 1 914 is shown in FIG. 86.

Figure 87:
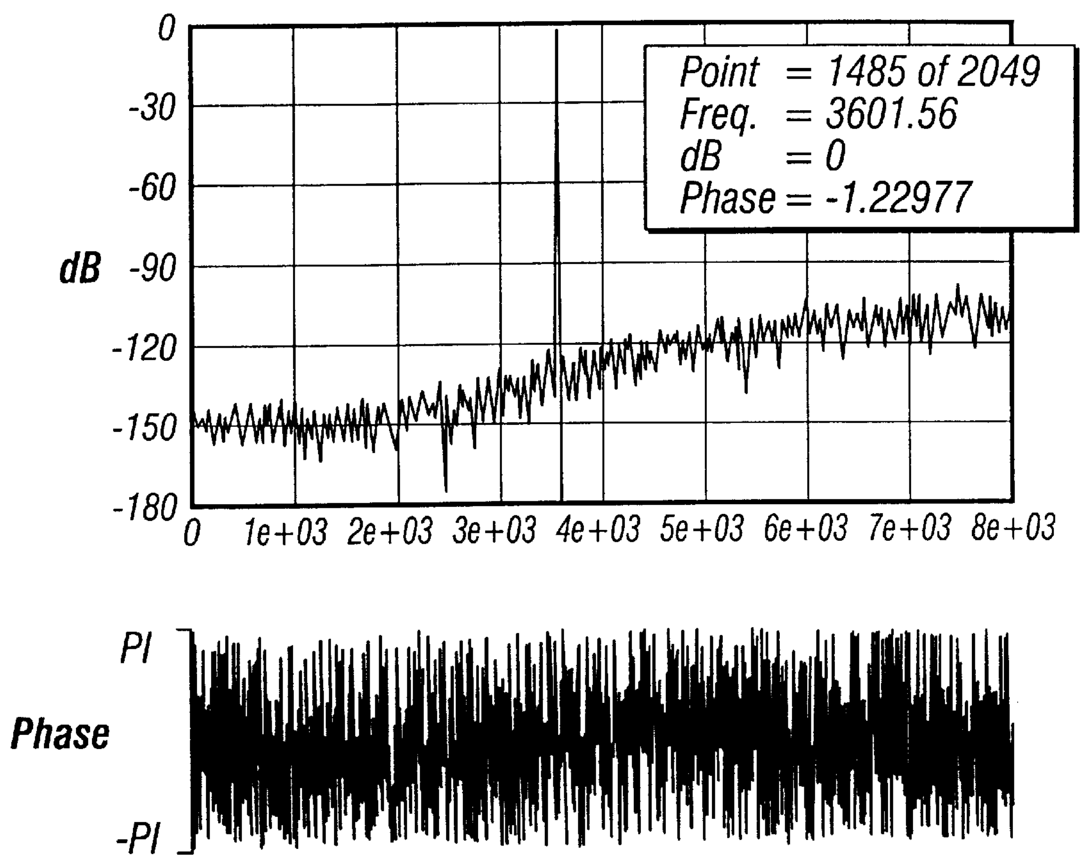
FIG. 87 is a graph illustrating the output spectrum of the half-band Decim.2 filter output.
Figure 88:
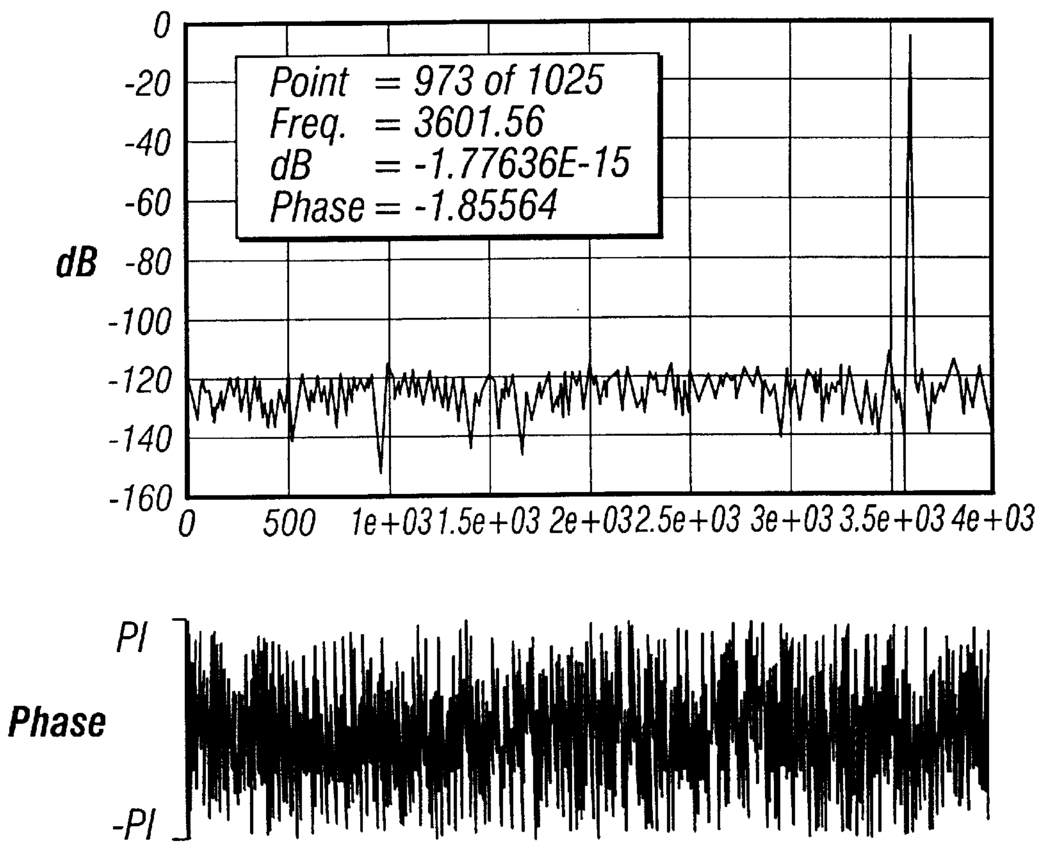
FIG. 88 is a graph illustrating the output spectrum of the 16-bit Decim.3 filter output.

The next decimation stage, Decim.2 916, changes the sampling rate from $f_s'=4f_s$, to $f_s''=\frac{1}{2}f_s'=2f_s$. A half-band filter is used, with stopband attenuation of about 100 dB. The spectrum of the output is shown in FIG. 87.

The last decimation stage Decim.3 918, is a linear phase filter which changes the sampling rate by a factor of 2, to $f_s''=f_s$. This stage consists of an equiripple FIR filter, with a passband extending to about 0.45 $f_s$ and a stopband beginning at about 0.55 $f_s$. The stopband attenuation of the Decim.3 filter 918 is greater than or equal to about 100 dB, and the passband ripple is less than ±0.1 dB. This guarantees that aliasing will not occur at frequencies lower than 0.45 $f_s$.

F. Additional Description of the Processing Blocks

1. Decim.1 Stage

Figure 89:
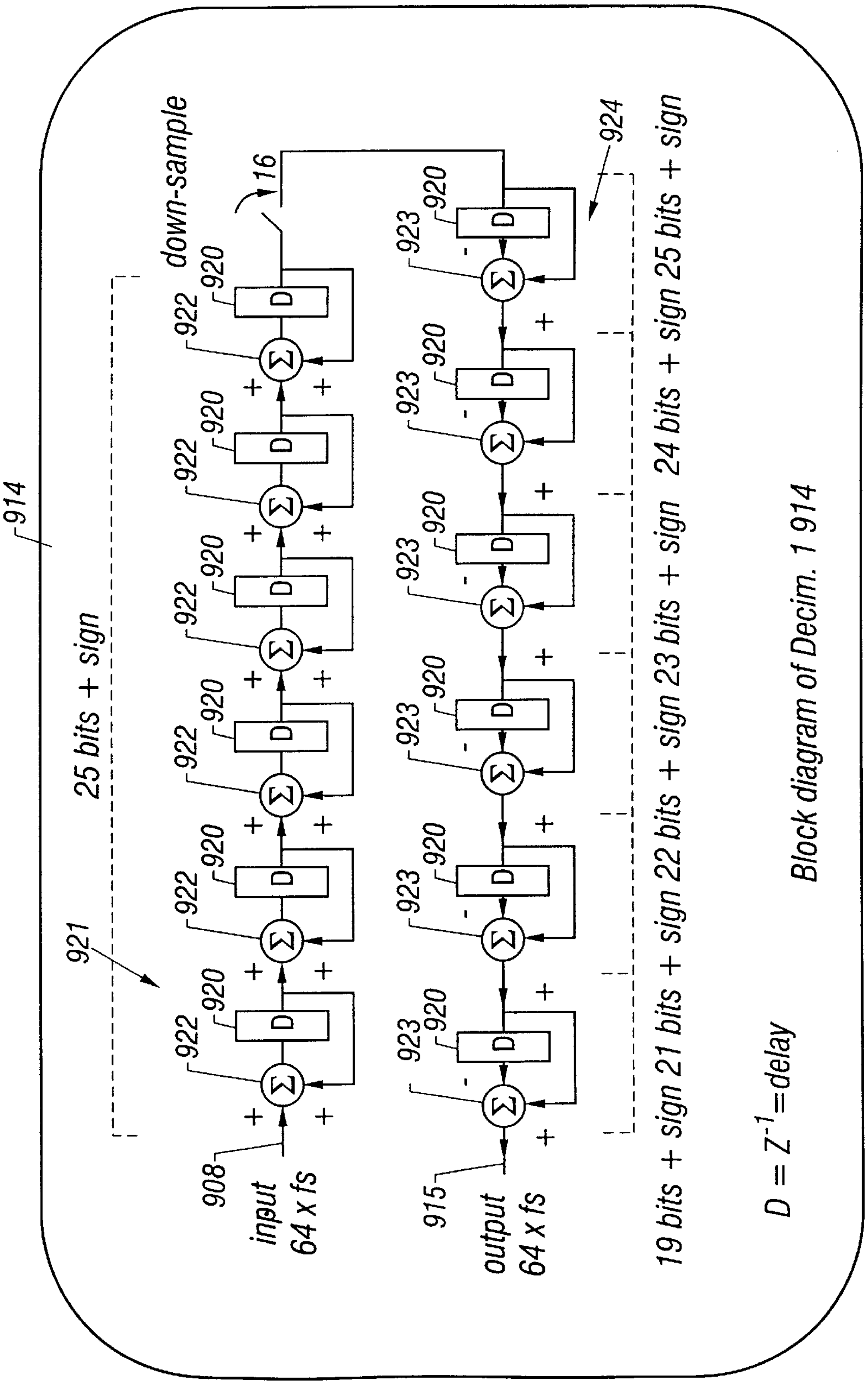
FIG. 89 is a block diagram of the Decim.1 filter.

This decimator is a $\text{sinc}^6$ integrator-comb filter, implemented as shown in FIG. 89.

$$H_1(z)=\left[\frac{1(1-z^{16})}{16(1-z^{-1})}\right]^6$$

Figure 90:
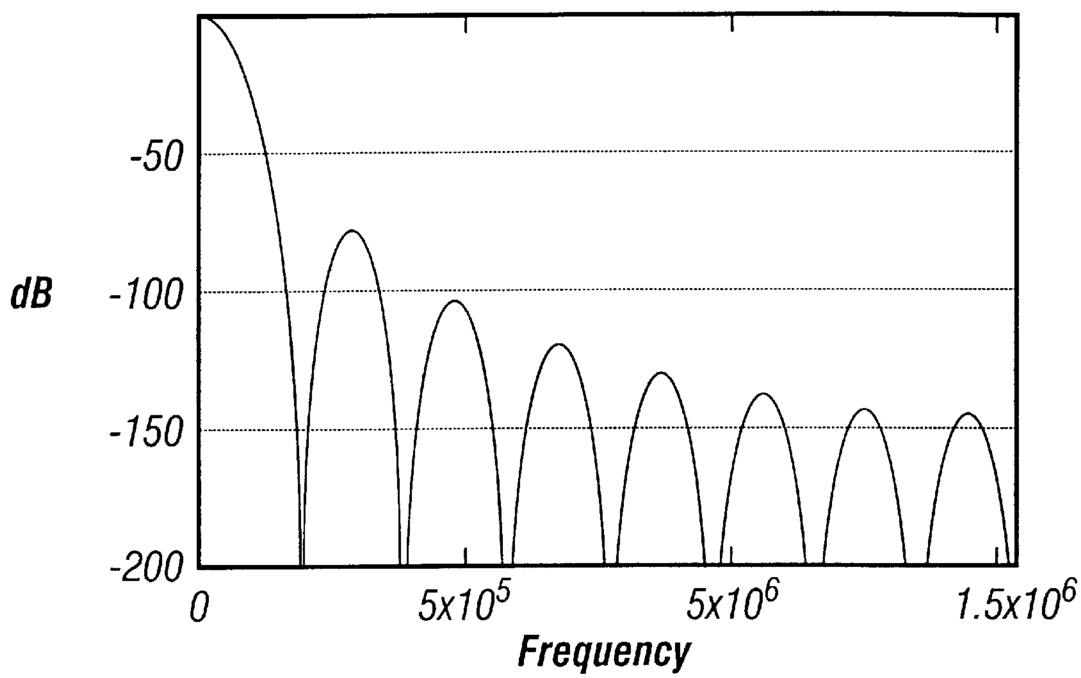
FIG. 90 graphically illustrates the frequency response of the Decim.1 filter.

The frequency response is shown in FIG. 90.

Figure 91:
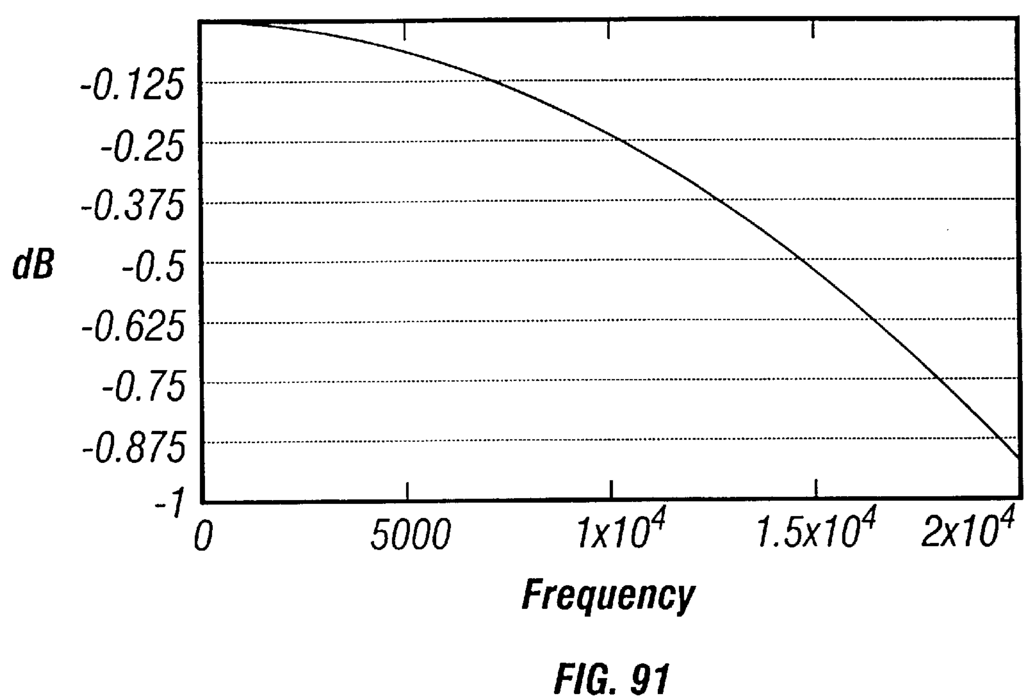
FIG. 91 graphically illustrates a detailed frequency response of the Decim.1 filter.

The response is not flat in the passband. A detail of the rolloff is shown in FIG. 91.

2. Decim.2 Stage

The second decimator, Decim.2 916, is a half-band linear phase FIR filter. This filter has a stopband of equal size as the passband, and equal ripple in the passband and the stopband. Since the stopband ripple is very low to obtain an attenuation of about 100 dB or more, the filter is essentially flat in the passband. A special property of this filter is that every other coefficient in its impulse response is equal to zero, except the middle coefficient, which is equal to 1.

When configured as a decimate by two filter, Decim.2 916 can be embodied in two basic forms. The first is a modified "direct" form, which results in the structure shown in FIG. 92. The second is a transposed form obtained reversing the signal flow graph of the first, and is shown in FIG. 93. Referring to FIG. 93, C1–C5 are the coefficients and the coefficient for xnm1 is equal to one. Each multiplier 925 multiplies the same input signal sample by a respective filter coefficient C1–C5. Delay blocks 926 and summing nodes 927, 928 are connected as shown in FIG. 93. The output of each multiplier 925 for coefficients C2–C5 is provided to a summing node 927 and to a summing node 928. The output of multiplier 925 for coefficient C1 is provided to a delay block 926 and to a summing node 928, as shown.

Figure 92:
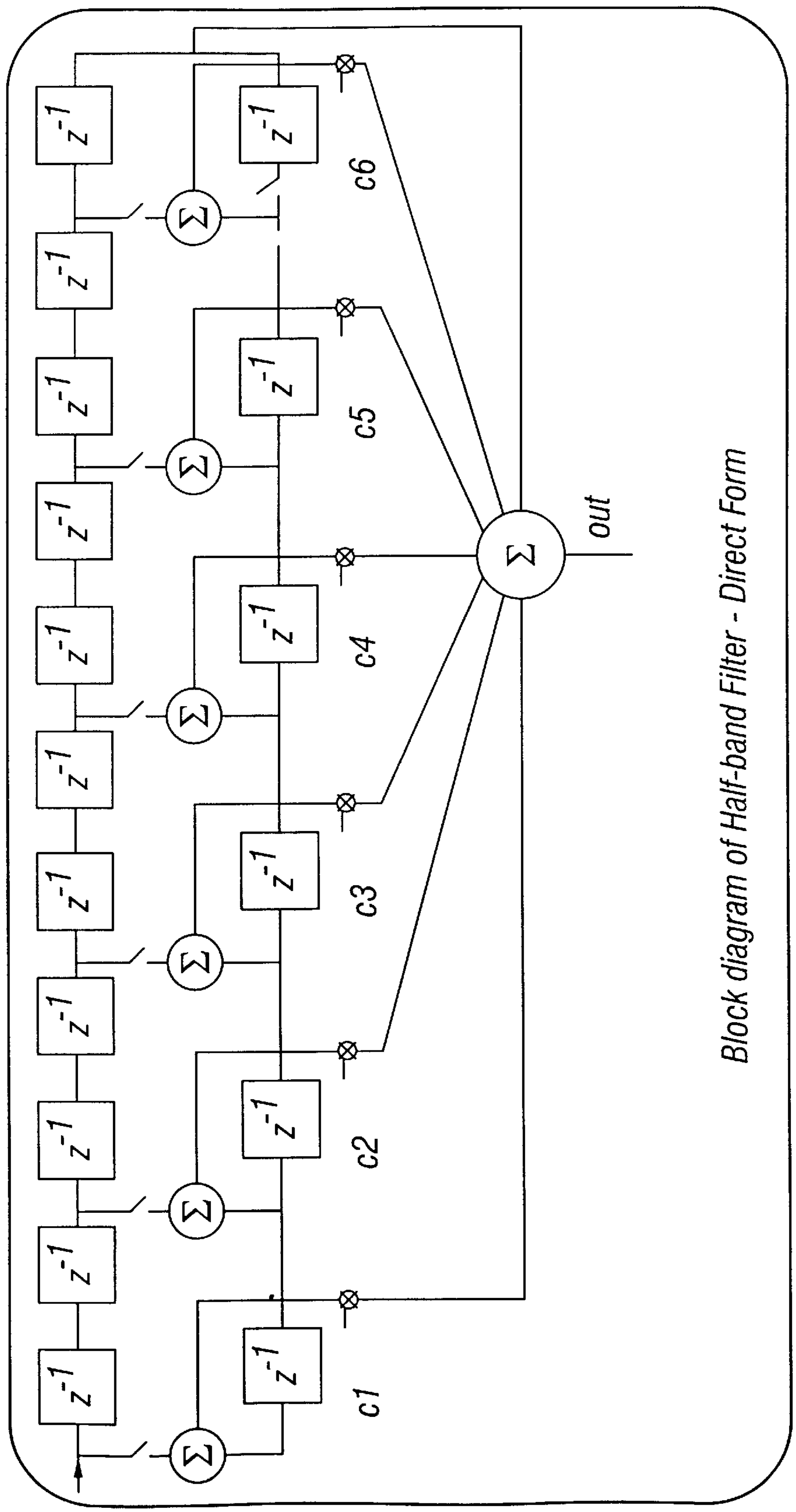
FIG. 92 is a block diagram of the half-band Decim.2 filter-direct form.
Figure 93:
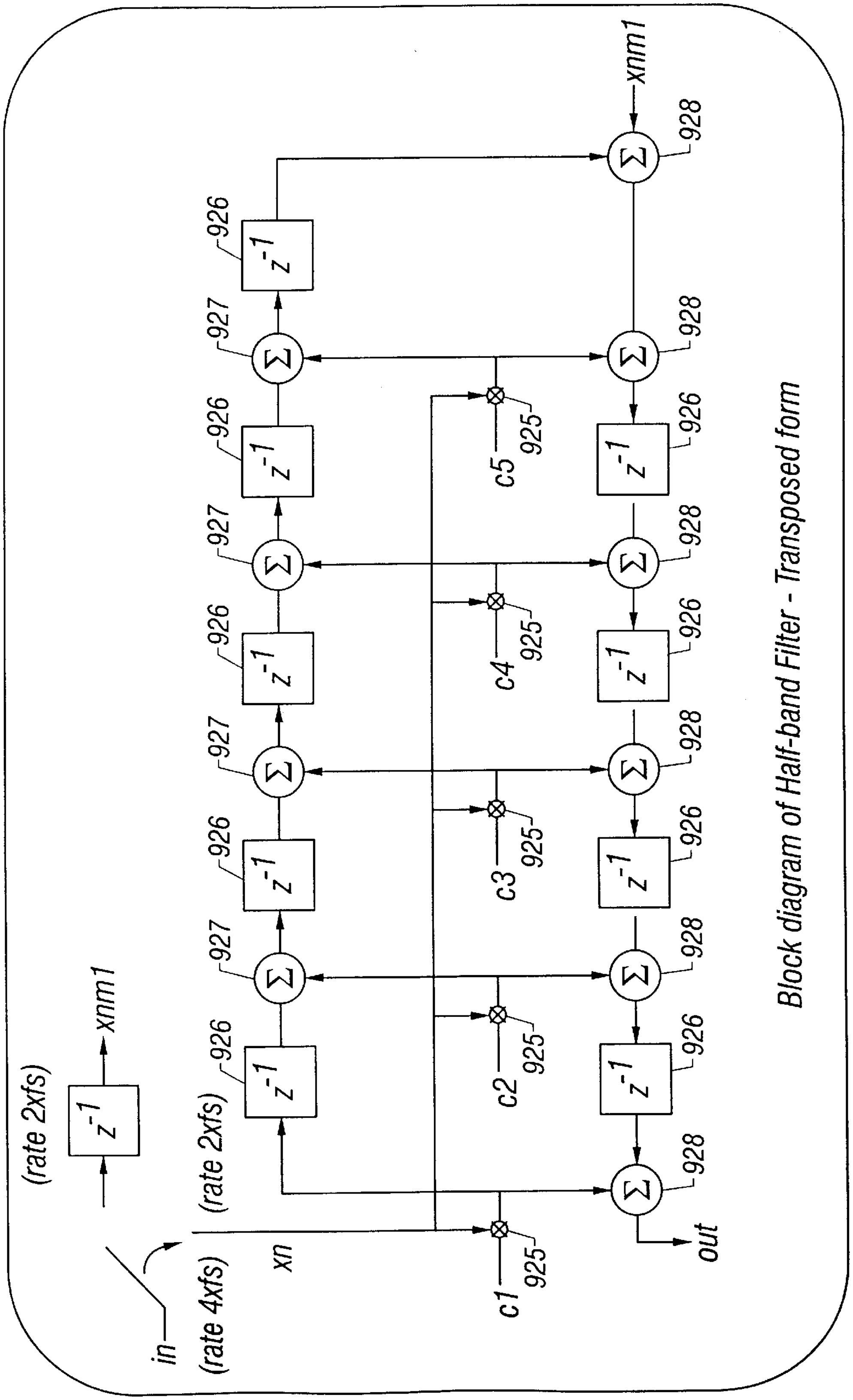
FIG. 93 is a block diagram of the half-band Decim.2 filter-transposed form.

The transposed structure in FIG. 93 has several advantages over the direct one of FIG. 92, whereby:

A minimum number of delays

All processing performed at the lower rate

Figure 94:
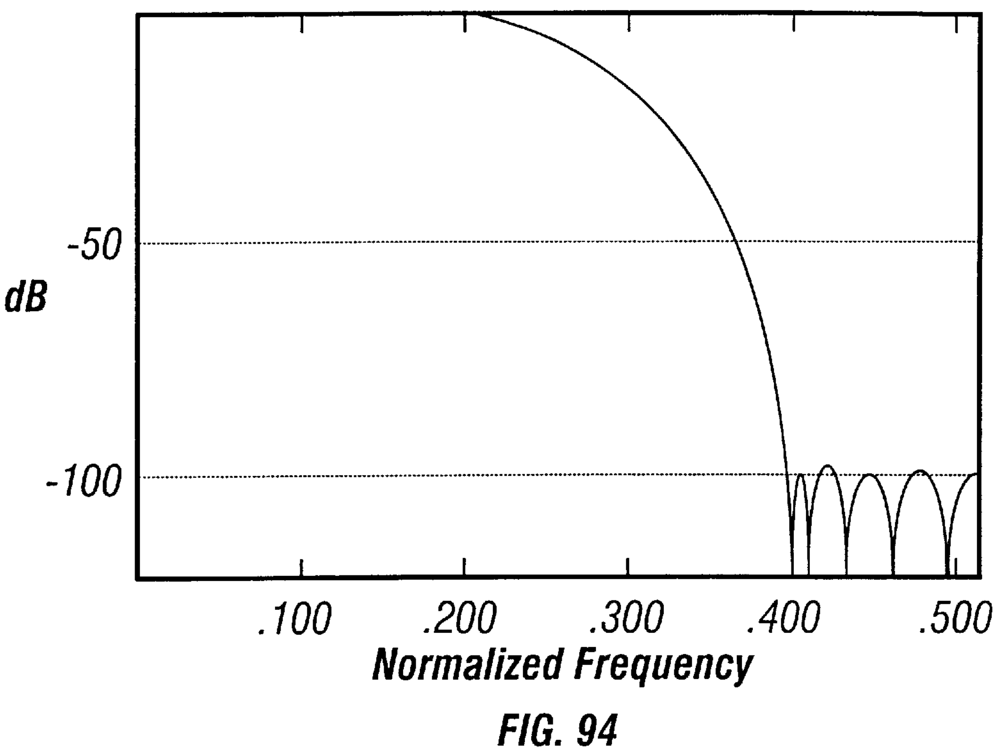
FIG. 94 graphically illustrates the frequency response of the Decim.2 filter.
Figure 95:
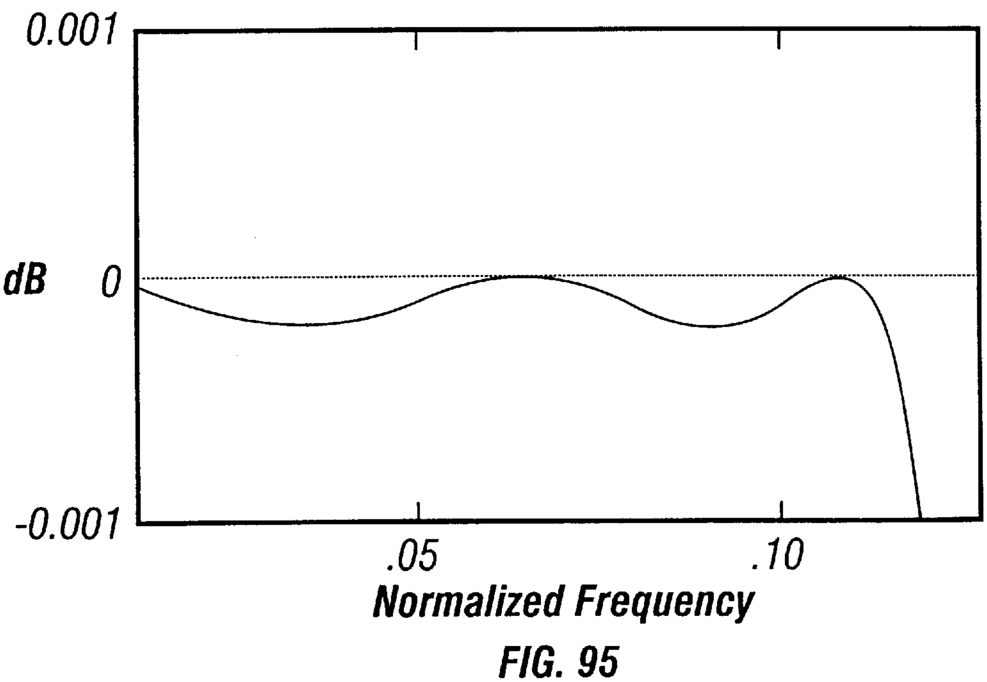
FIG. 95 is a detailed frequency response graph of the Decim.2 filter.

The frequency response performed by the Decim.2 916 filter is shown in FIGS. 94 and 95. Coefficients for Decim.2 filter 916 are as follows:

| | | | |
|---|---|---|---|
| 0.0016956329345703125 | −0.1517887115478515625 | 0.6137218475341796875 | −0.0121631622314453125 |
| −0.0121631622314453125 | 0.6137218475341796875 | −0.1517887115478515625 | 0.0016956329345703125 |
| 0.04854583740234375 | 1. | 0.048545S3740234375 | |

The registers 920 shown in FIG. 89 all have the same MSB weight, which depends on the word length of the input signal 908, the decimation factor (16) and the order of the decimator (6). This embodiment is chosen so Decim. 1 914 can correctly represent all possible input signal levels at the output signal 915, where saturation will be performed to a value approximating the full scale analog input. Truncation of LSB's can be performed using known methods. The bit lengths shown preserve about 120 dB STD. If the registers 920 are implemented as a RAM, not shown, then all will have the same length.

Each integrator 921 includes a summing node 922 and a delay block 920. The integrators 921 operate at the high rate $64\times f_s$. Each differentiator 924 includes a difference node 923 and a delay block 920. The differentiators 924 operate at the lower rate of $4\times f_s$, operating on one out of every 16 samples generated by the integrators 921. The transfer function performed by this block is:

3. Decim.3 Stage

Figure 97:
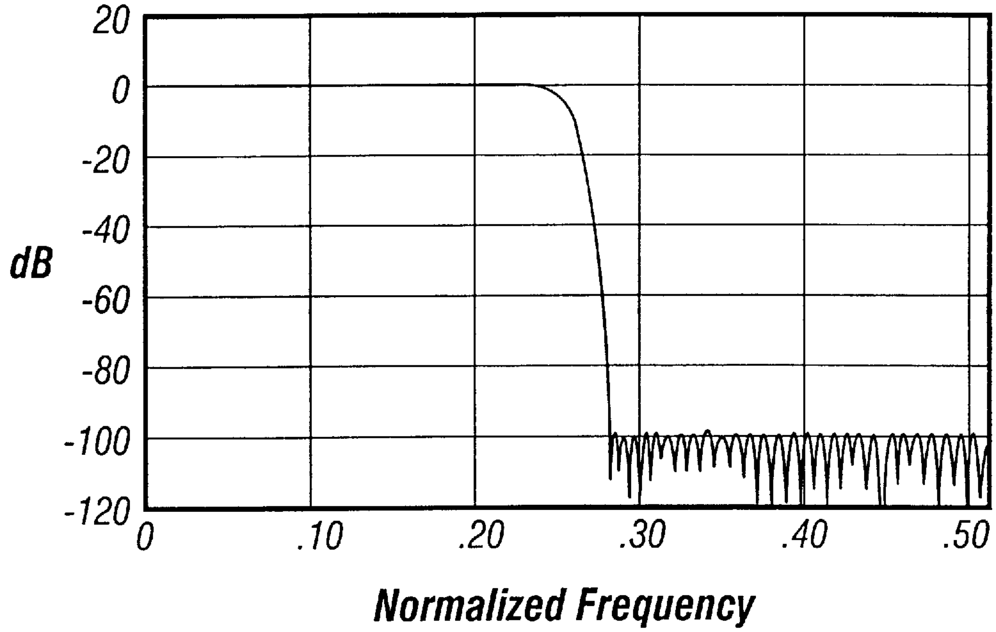
FIG. 97 graphically illustrates the frequency response of the Decim.3 filter.
Figure 98:
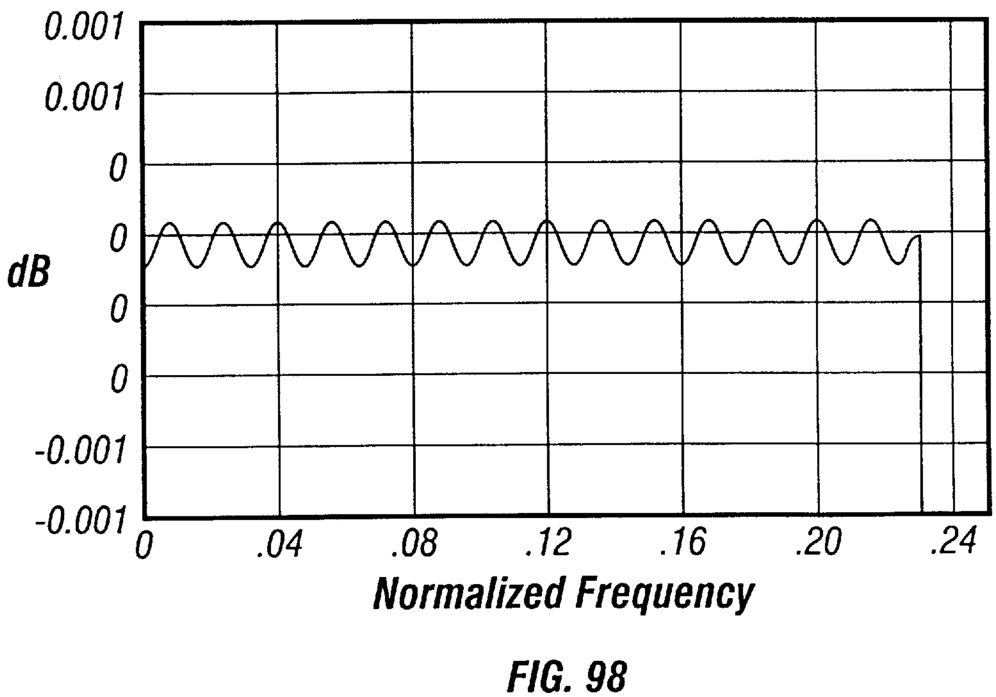
FIG. 98 graphically illustrates, in detail, the frequency response of the Decim.3 filter.

This decimator, Decim.3 916, is a symmetric (linear phase) FIR filter. It is designed to have an attenuation of about 100 dB in the stopband, and a ±0.1 dB or less ripple in the passband. It is designed as a flat passband response half-band filter followed by a compensation filter. The frequency response of the half-band Decim.3 filter 918 is shown in FIGS. 97 and 98. When used as decimator, the Decim.3 filter 918 computes one sample for every two samples of input. Referring to FIG. 93, the transposed half-band structure is employed, since the entire filter operates at the lower sampling rate including the data tap updates.

The Decim.3 filter 918 has a linear phase characteristic which ensures the impulse response is symmetric, where the symmetry condition is:

$$h_k=h_{N-1-k}\ k=0, \ldots N-1\ (N \text{ odd})$$

with $h_k$ being the filter coefficients. Preferably, N is odd, but N may be even with a different symmetry condition.

The symmetry condition with N odd is reflected in the structure of the Decim.3 filter 918, similar to that shown in FIG. 93. With this structure it is not possible to use block-floating point methods, as can be done with the direct form shown in FIG. 92.

The first 30 coefficients for Decim. 3 918 are listed. The response of the half-band filter is obtained by using the coefficients listed in Table C17 and after inserting zeros in between each coefficient listed in Table C17, similar to the format shown in Table C17, making the center coefficient equal to one.

TABLE C17

| 30 = no. of coefficients | | |
|---|---|---|
| −0.0000286102294921875 | −0.00216233349609375 | −0.0215911865234375 |
| 0.000049591064453125 | 0.0028553009033203125 | 0.026386260986328125 |
| −0.0000934600830078125 | −0.0037174224853515625 | −0.0323505401611328125 |
| 0.00016021728515625 | 0.0047740936279296875 | 0.039966583251953125 |
| −0.0002574920654296875 | −0.006061553955078125 | −0.0500602722167968750 |
| 0.0003948211669921875 | 0.00761795043945125 | 0.0642070770263671875 |
| −0.000585556030734375 | −0.009490966796875 | −0.0857810974121096375 |
| 0.00083923339843750 | 0.0117378234863281250 | 0.1235866546630859375 |
| −0.0011749267578125 | 0.0144329071644921875 | −0.209945678710937500 |
| 0.0016098022460937500 | 0.0176715850830078125 | 0.6358623504638671875 |

4. Compensation Filter

A Nyquist rate FIR compensator filter 904 (FIG. 53) is connected to the output of Decim.3 918 and is utilized to compensate for the rolloff introduced by the $\mathrm{sinc}^6$ decimator filter, Decim.1 914, to give a flat response, and to provide gain compensation. FIR filter 904 includes a series of multipliers 930, denoted M1–4, which multiply the compensation input signal 910, which is the signal output from Decim.3 filter 918 (FIG. 83), by a compensator filter coefficient C1–4, respectively. The product of each respective multiplier 930, P1–4, is input to a summing node 934.

Figure 96:
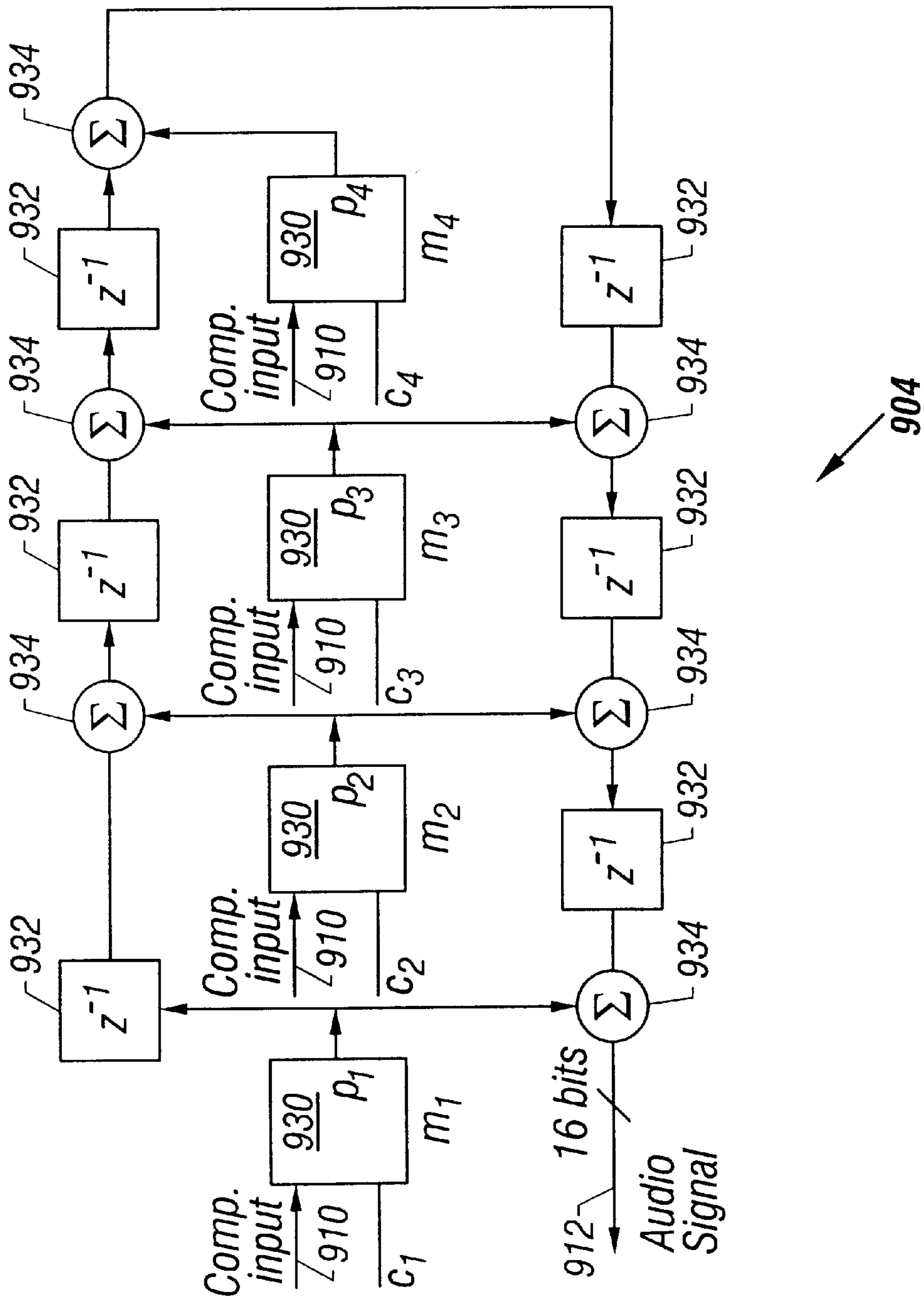
FIG. 96 is a block diagram of the compensation filter of the CODEC D/A conversion circuitry.

The compensator audio output signal 912 (FIG. 96) is provided to format conversion block 536 (FIG. 44) and to overrange detect circuit 913 (FIG. 82) as a 16-bit signed digital audio signal. Overrange detect circuit 913 detects where the amplitude of compensator output signal 912 is with respect to full scale and sets output bits B0 and B1. These bits are utilized by the user, using known methods, to adjust the gain of the audio signal being detected. The appropriate attenuation/gain control circuit in Mixer 606 (FIG. 45*a*) can be programmed to increase or decrease the signal amplitude, as needed.

Figure 99:
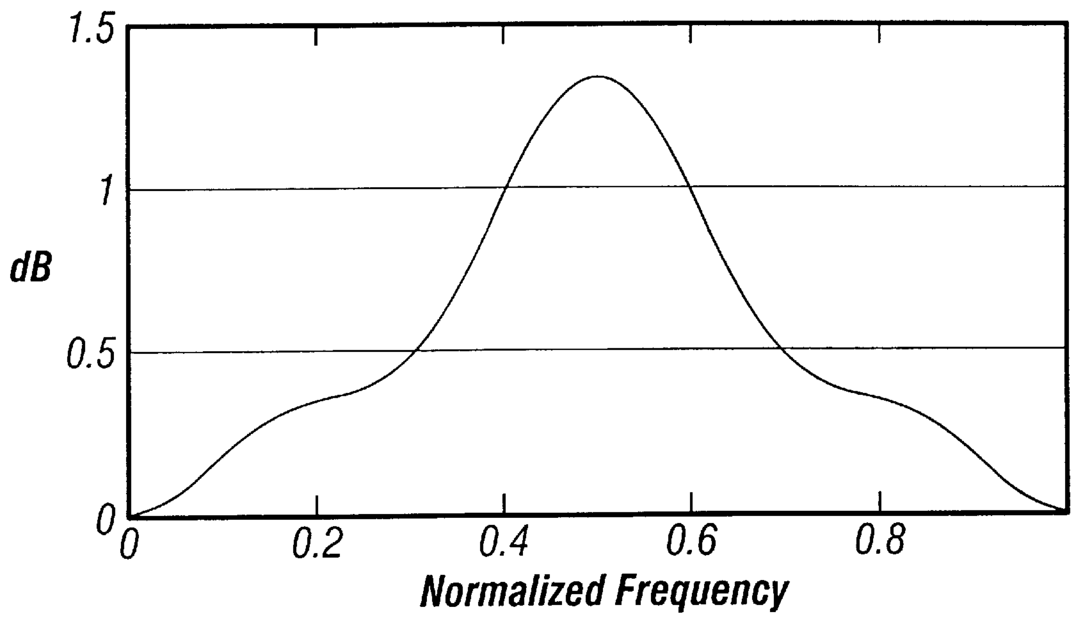
FIG. 99 graphically illustrates the compensator circuit frequency response (un-compensated)
Figure 100:
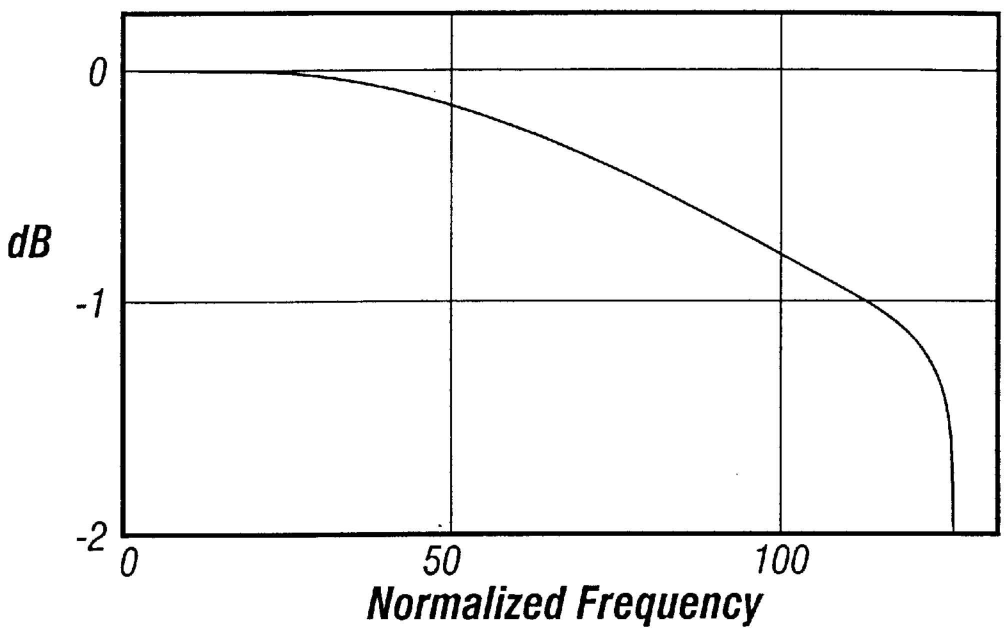
FIG. 100 graphically illustrates the total frequency response of the compensator circuitry in passband (un-compensated)
Figure 101:
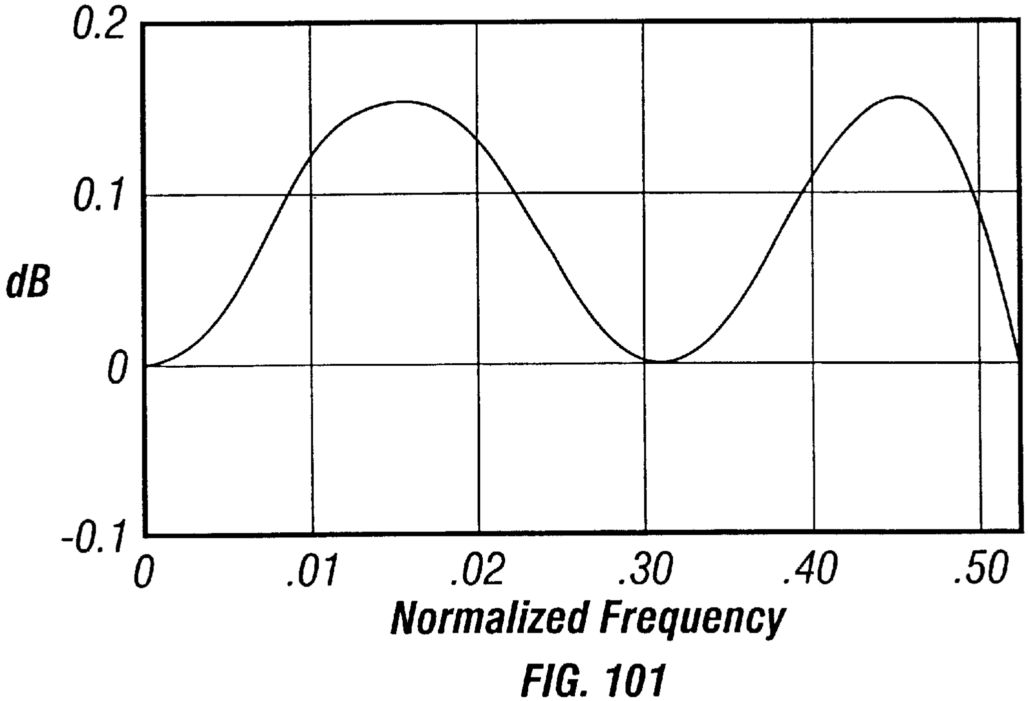
FIG. 101 graphically illustrates the total frequency response of the compensator in passband (compensated)

The compensation filter 904 operates at the Nyquist rate and is also linear phase, with only 7 data taps, which means 4 coefficients are needed. The frequency response for the decimator after compensation filter 904 is shown in FIG. 99. The total frequency response for the decimator in the passband is shown in FIG. 100 (before compensation) and in FIG. 101 (after compensation).

Compensation filter 914 performs the following transfer function:

$$H_s\left(e\frac{j\pi[freq]}{32}\right)=\left[\frac{1}{16}\frac{\sin(8\omega)}{\sin\left(\frac{\omega}{2}\right)}\right]\Bigg|\,\omega=\frac{\pi[freq]}{32}=\left[\frac{1}{16}\frac{\sin\left(\frac{\pi[freq]}{4}\right)}{\sin\left(\frac{\pi[freq]}{64}\right)}\right]^6$$

where "freq." is the normalized frequency.

The impulse response coefficients for compensation filter 914 are as follows:

TABLE 18C

| |
|---|
| −7.693934583022969 E-003 |
| 9.565316495127612 E-003 |
| −3.365866138777326 E-002 |
| 1.054232901311562 |

V. Synthesizer Module

A. General Overview of Synthesizer Module

This subsection provides a general overview of the synthesizer module. Subsequent subsections discuss in more detail the various aspects of the synthesizer module introduced in this subsection.

The synthesizer module is a wavetable synthesizer which can generate up to 32 high-quality audio digital signals or voices, including up to eight delay-based effects. The synthesizer module can also add tremolo and vibrato effects to any voice. This synthesizer module provides several improvements to prior art wavetable synthesizers and also provides enhanced capabilities heretofore unavailable.

Figure 102:
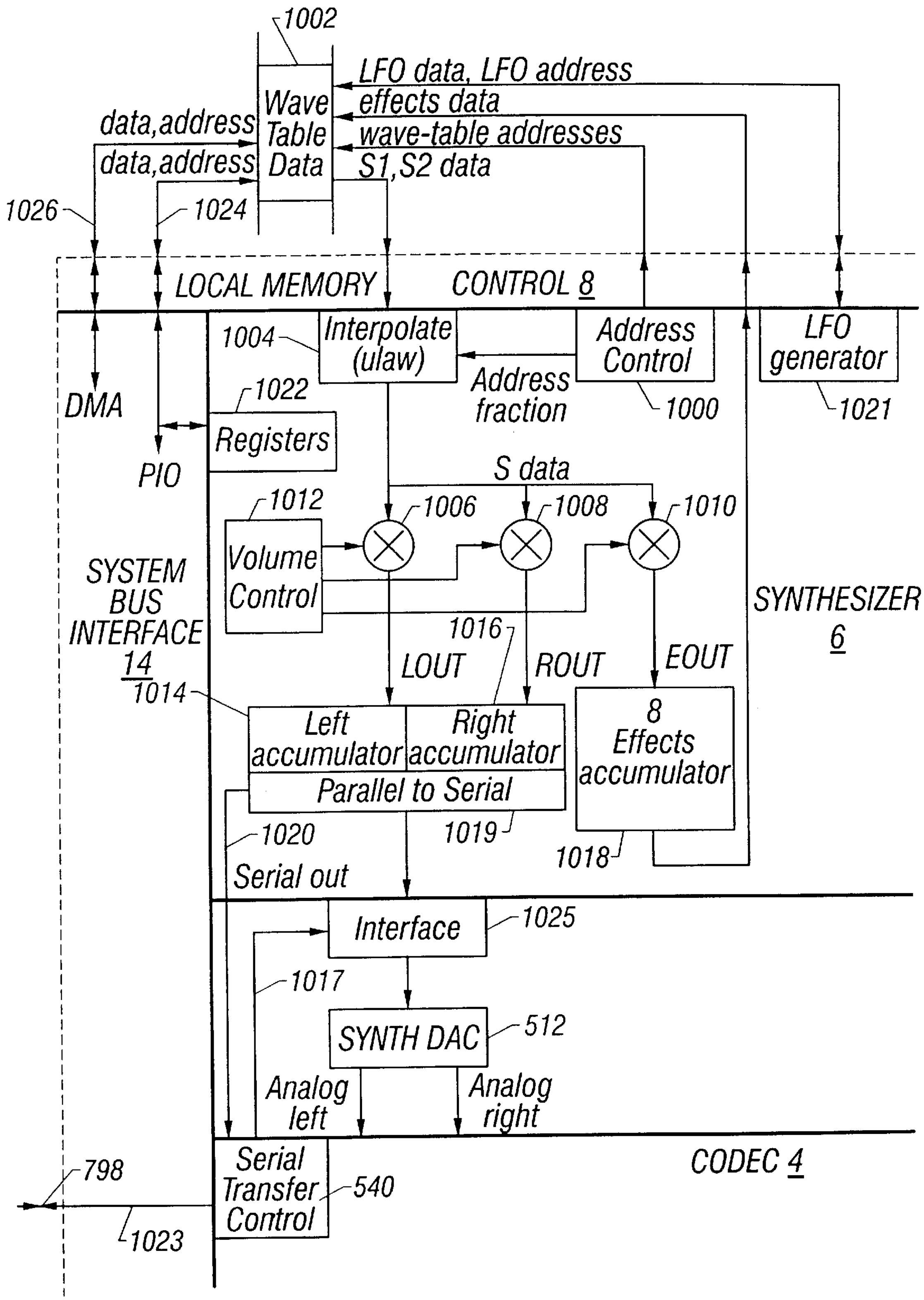
FIG. 102 is a block diagram of the synthesizer module of the present invention.

FIG. 102 illustrates the synthesizer module's interfaces to the local memory control module 8, the system bus interface 14 of the system control module 2, the CODEC module 4, and synthesizer DAC 512. It also shows the internal signal flow of logic contained within the synthesizer module 6.

During each frame, which is a period of approximately 22.7 microseconds, the synthesizer module 6 produces one left and one right digital output. In each frame there are 32 slots, in which a data sample (S) of each of a possible 32 voices is individually processed through the signal paths shown in FIG. 102.

For each voice processed during a frame, an address generator 1000 generates an address of the next data sample (S) to be read from wavetable data 1002. The wavetable address for data sample S contains an integer and a fractional portion. The integer portion is the address for data sample, S1, and is incremented by 1 to address data sample, S2. The fractional portion indicates the distance from S1 towards S2 for interpolating the data sample, S. Based on this address, interpolation logic 1004 causes the two data samples, S1 and S2, to be read from wavetable data 1002. The wavetable data is stored in local dynamic random access memory (DRAM) and/or read only memory (ROM). From this data, the interpolation logic 1004 derives data sample, S. This interpolation process is discussed in more detail below. Wavetable data can be $\mu$-Law compressed. In the case of $\mu$-Law compression, S1 and S2 will be expanded before interpolation under the control of the synthesizer module's signal path, discussed below.

After each data sample S is generated, a volume generator 1012 causes the data sample to be multiplied by three volume components that add envelope, low frequency oscillator (LFO) variation, right offset, left offset and effects volume. The left and right offsets provide stereo field positioning, the effects volume is used when generating an echo effect, and LFO variation in the volume adds tremolo to the voice. An LFO generator 1021 generates the LFO variation. As is discussed in more detail below, LFO generator 1021 is also used to generate LFO variation in the wavetable addressing rate to add vibrato to a voice. LOUT 1006, ROUT 1008, and EOUT 1010 are the outputs resulting from data sample S being multiplied by the three volume components.

LOUT 1006 and ROUT 1008 connect to left and right accumulators 1014 and 1016. If effects processing is occurring, EOUT 1010 sums into one of eight effects accumulators 1018. After all the voices in a frame are processed, the left 16-bit wide and right 16-bit wide (32-bit wide total) accumulator data is converted from a parallel format to a serial format by convertor 1019.

After conversion to a serial format, the left accumulator data and the right accumulator data can be output serially to synthesizer DAC interface circuitry 1025. Synthesizer DAC interface circuitry 1025 interfaces synthesizer DAC 512 to the synthesizer module 6. The interface circuitry comprises: (i) clock divider circuitry and control logic which controls the clock divider (not shown); (ii) clock generation circuitry for clocking synthesizer DAC 512 operations (not shown); and (iii) a serial to parallel convertor (not shown). See also FIG. 118. The clock divider circuitry is described in U.S. patent application Ser. No. 08/333,410, by David Suggs, entitled "Hazard-Free Divider Circuit," which was filed concurrently herewith and is incorporated herein by reference.

The serial to parallel convertor in the interface circuitry 1025 converts the accumulator data to parallel format and sends this parallel data to the synthesizer DAC 512 for conversion into analog signals. Synthesizer DAC 512 preferably comprises the same circuitry as CODEC playback DAC 514. The output of synthesizer DAC 512 is provided as an analog left input to left synth DAC MUX 694 (and as an analog right input to right synth DAC MUX, not shown) in the analog mixer 606 (FIG. 45*a*) of the CODEC module 4. The resulting analog signals may then be applied to an audio amplifier and speaker for playing the generated sound. See section IV. CODEC MODULE for more details.

Each of the effects accumulators 1018 can accumulate any, all, or none of the effects data generated during a frame. The data stored in the effects accumulators is written back as wavetable data to be read at a later time period. The effects accumulators 1018 store values for longer than one voice processing time allowing signal flow from one voice to another voice.

The left 16-bit wide and right 16-bit wide accumulator data can also be output, in serial format, through serial output line 1020 to the serial transfer control block 540 in CODEC module 4. The accumulator data can be output through the serial transfer control block 540 on line 1023 to an external serial port 798. See IV. CODEC MODULE for more details. Test equipment, an external DAC, or a digital signal processor can be connected to external serial port 798. Serial data may also be input through external serial port 798, sent on line 1047 to the synthesizer DAC interface circuitry 1025, converted into parallel format by the serial to parallel convertor in the interface circuitry, and then sent to synthesizer DAC 512.

The synthesizer registers 1022 contain programmed parameters governing the processing of each voice. These various registers are referred to throughout this section on the synthesizer module, but these registers are discussed in more detail below in section V. N. Registers. The voice parameters are programmed into the registers 1022 through register data bus 1024 by a programmed input/output (PIO) operation.

Figure 103:
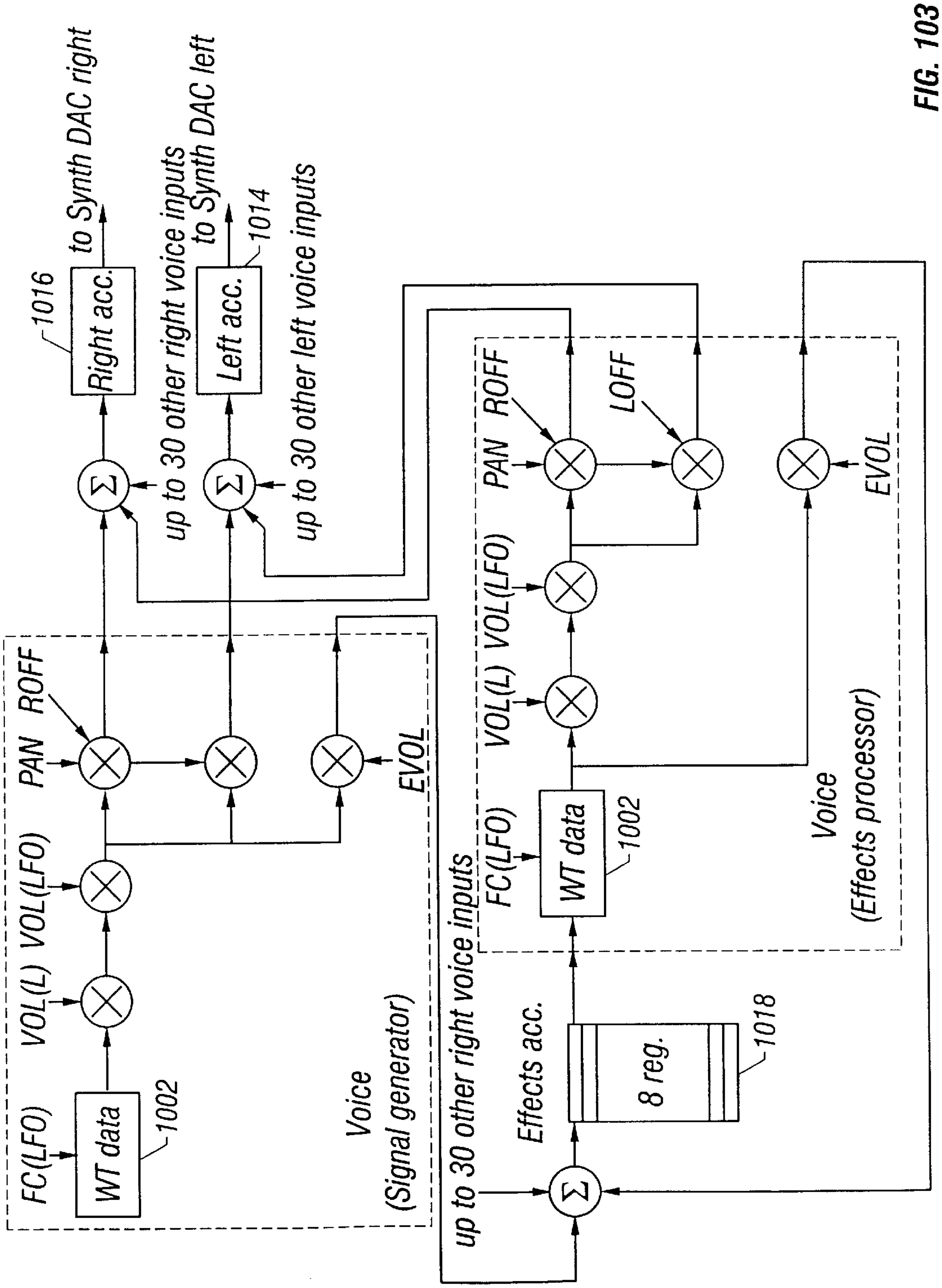
FIG. 103 illustrates signal flow in the synthesizer module of the present invention.
Figure 104A:
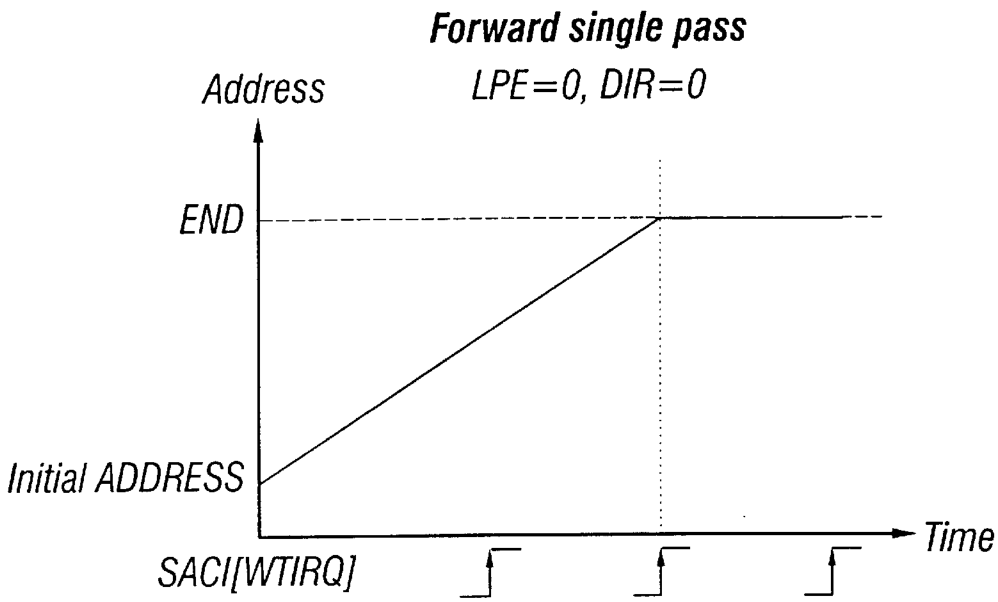
FIGS. 104*a*–104*f* are graphs illustrating addressing control options in the synthesizer module of the present invention.
Figure 104B:
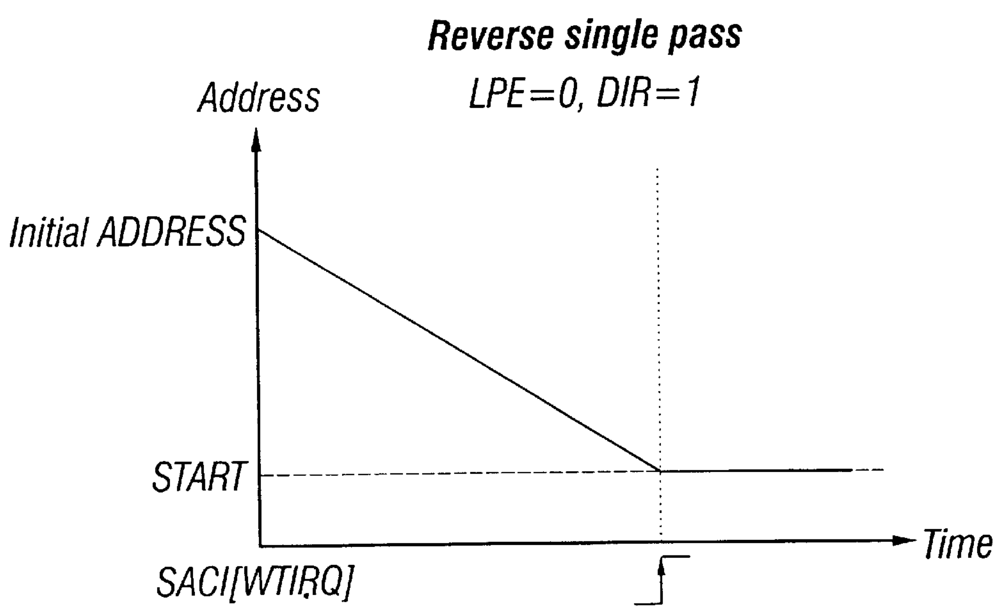
Figure 104C:
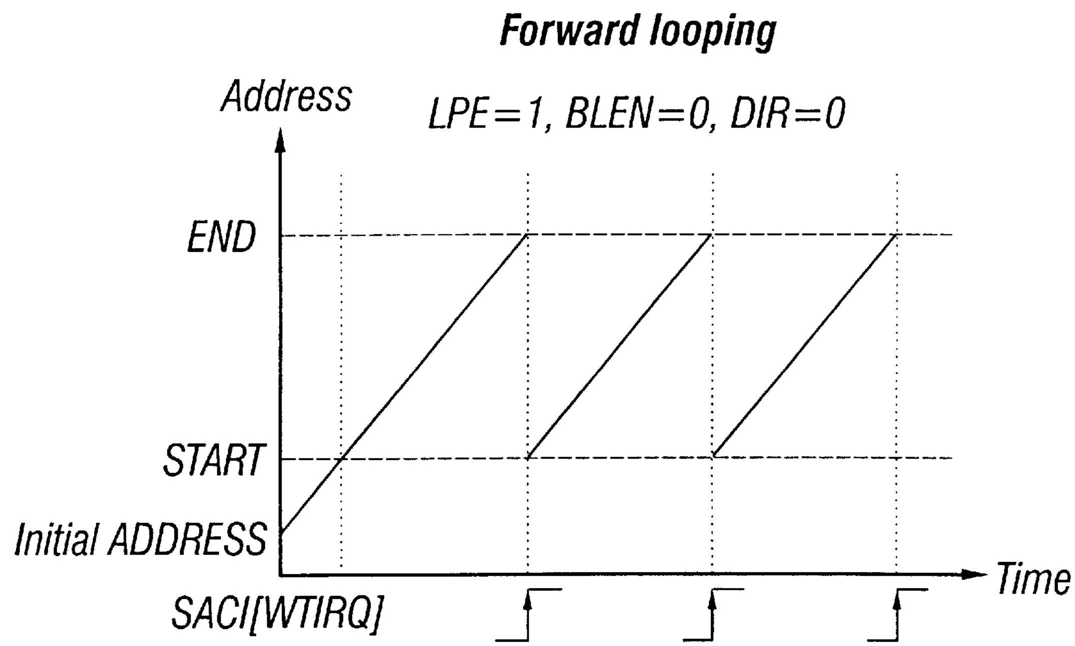
Figure 104D:
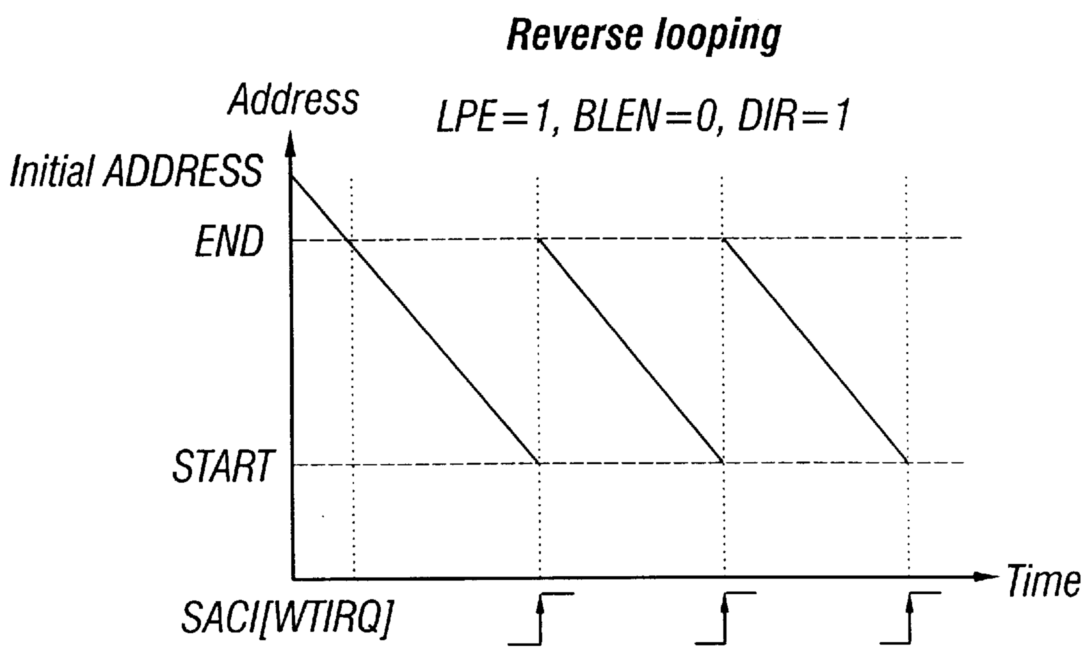
Figure 104E:
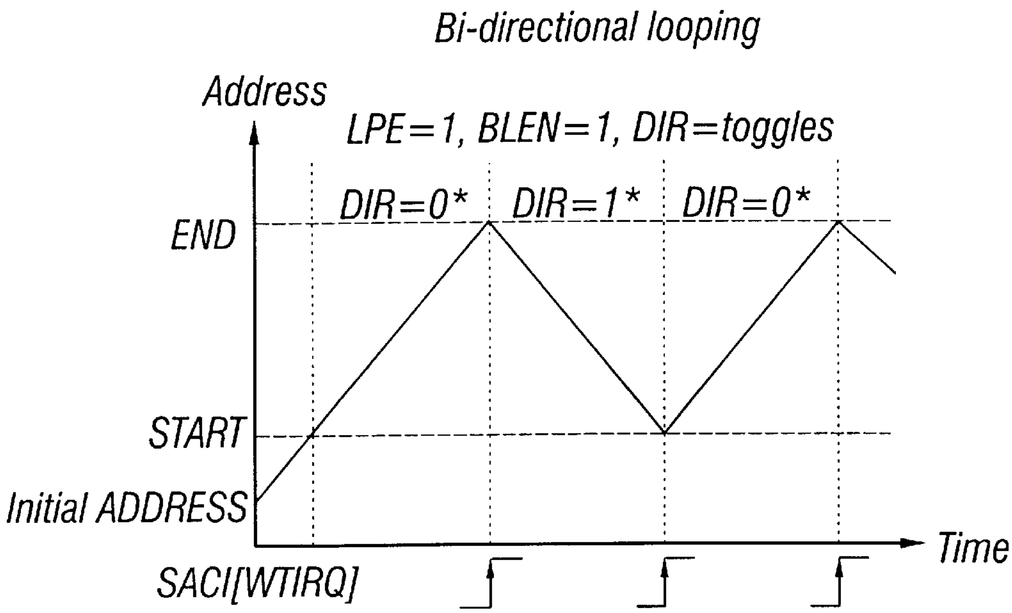
Figure 104F:
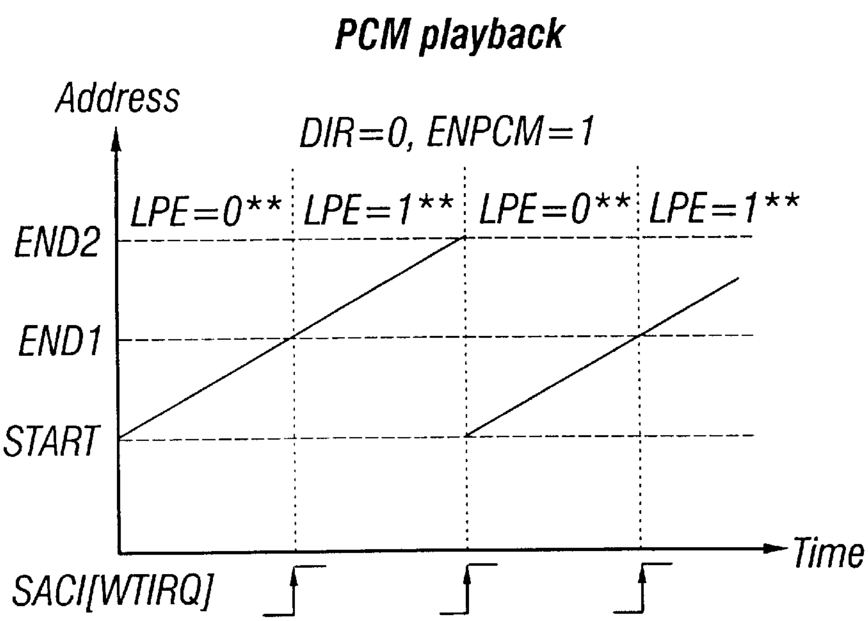
Figure 105A:
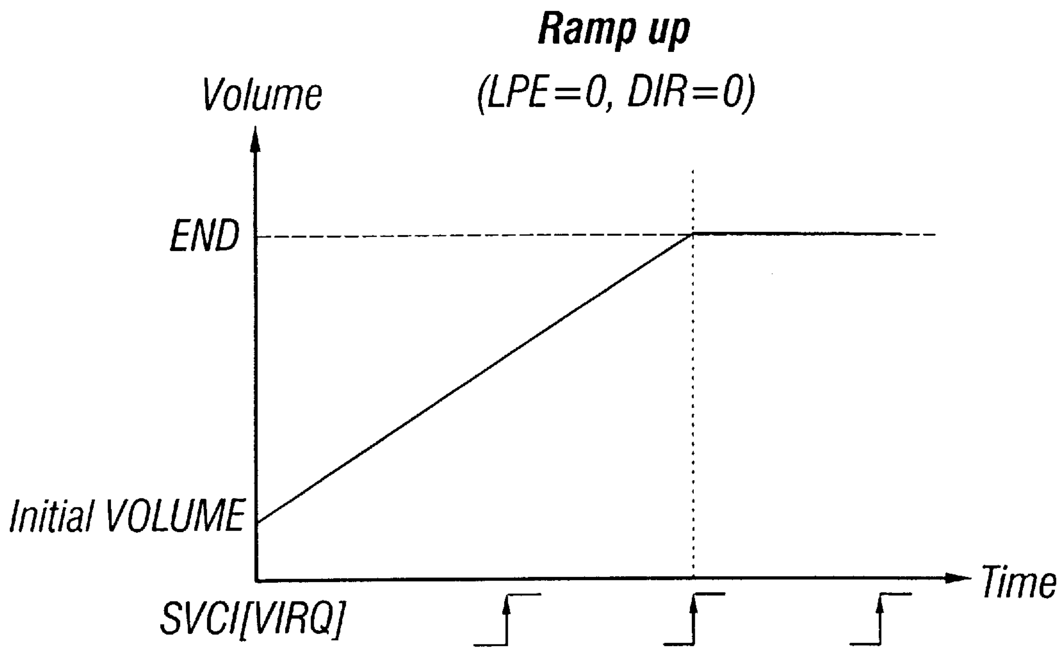
FIGS. 105*a*–105*e* are graphs illustrating volume control options in the synthesizer module of the present invention.
Figure 105B:
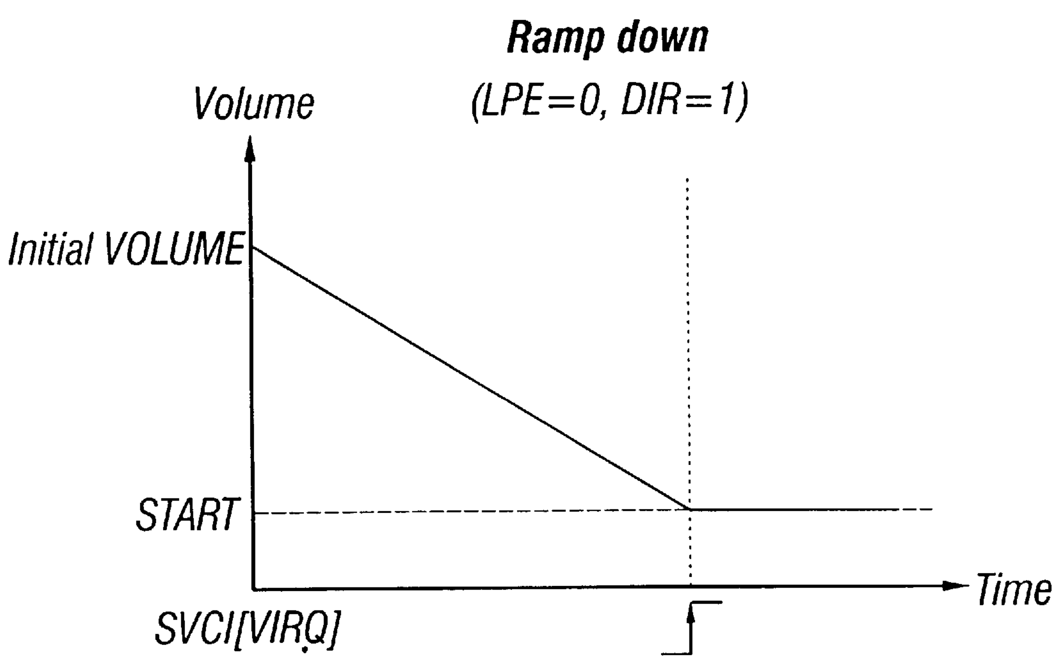
Figure 105C:
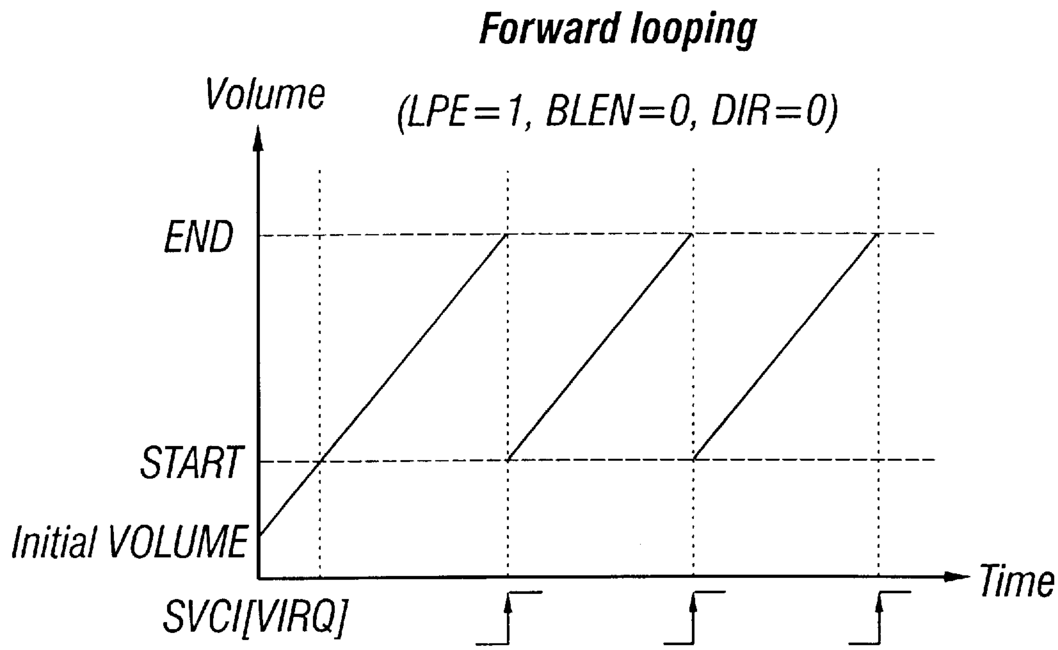
Figure 105D:
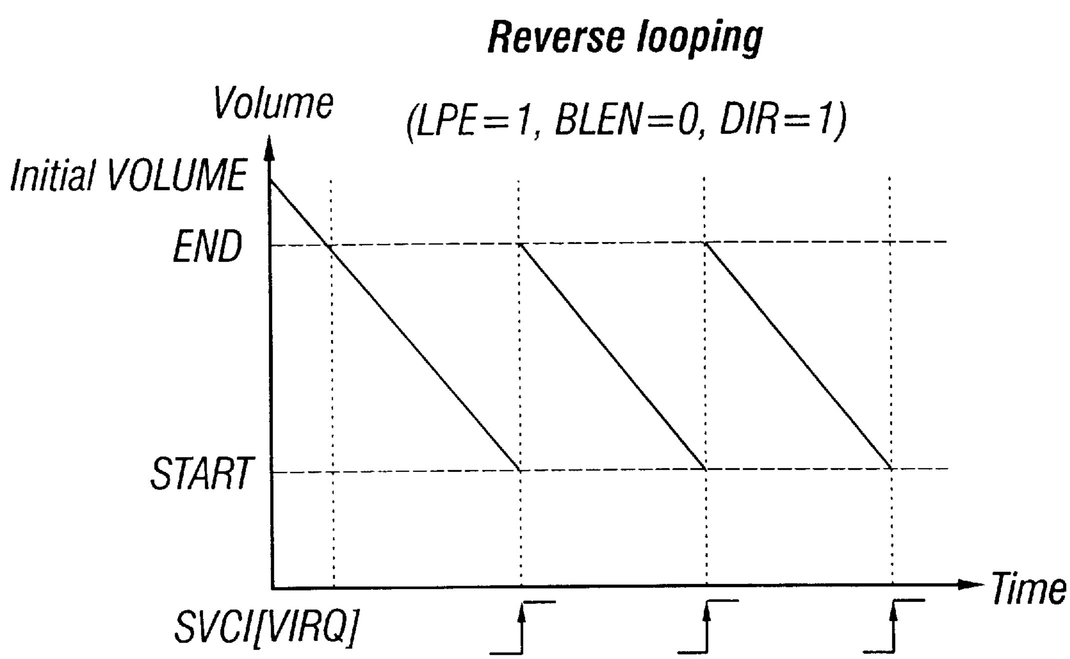
Figure 105E:
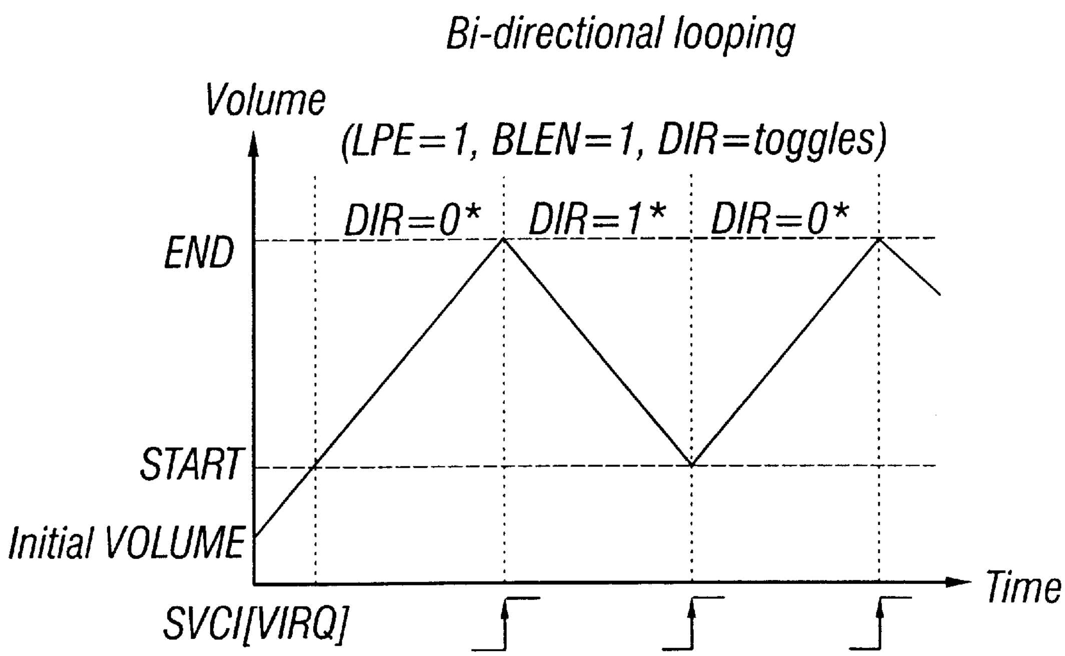

FIG. 103 illustrates signal flow during voice generation and effects processing. When bit EPE of register SMSI is set to zero (SMSI[EPE]=0), the synthesizer module 6 acts as a signal generator and either generates a tone or plays back recorded data from wavetable data 1002 contained in local ROM or DRAM. Wavetable data is written into the local DRAM through a system direct memory access (DMA) transfer through DMA bus 1026. Local memory is discussed in more detail in section VI. LOCAL MEMORY CONTROL MODULE. The addressing rate of the wavetable data 1002 controls the pitch or frequency of the generated voice's output signal. Address generator 1000 controls this addressing rate, but this rate is also dependent on any LFO variation. In FIG. 103, the reference FC(LFO) signifies frequency control (i.e., the wavetable addressing rate which affects a voices' pitch or frequency) which is dependent on any LFO variation. LFO variations add vibrato to a voice.

After the wavetable data 1002 is addressed and a data sample, S, is interpolated, the data sample is passed through three volume multiplying paths, as illustrated in FIG. 103. As a data sample passes through any of the three volume multiplying paths, it is multiplied by three individual volume components.

The first volume component is VOL(L). (L) indicates that this volume component can be looped and ramped under register control. The second volume component, VOL (LFO), adds volume LFO variations. LFO variations in volume add a tremolo to a tone. As illustrated, after the VOL(L) and VOL(LFO) components are multiplied, the voice's signal path splits three ways into each of the three volume multiplying paths. The top two paths generate stereo right and left data outputs for the voice.

The stereo positioning of a voice can be controlled in one of two ways: (i) a single pan value can be programmed, placing the signal in one of sixteen pan positions from left to right; or (ii) separate left and right offset values, ROFF and LOFF, can be programmed to place the voice anywhere in the stereo field. ROFF and LOFF can also be used to affect the total volume output. Right and left volume outputs for this voice are then summed with all other voices' right and left outputs generated during the same frame. The accumulated right and left outputs for the frame are then output to the Synthesizer DAC 512 in CODEC module 4.

EVOL (effects volume) controls the third signal path's volume. This third signal path is for effects processing. Effects data can go to any, all, or none of the effects accumulators 1018. Each of the eight effects accumulators 1018 will sum all voice outputs assigned to it.

When bit EPE of register SMSI is set to one, the synthesizer module 6 acts as an effects processor. During this effects processing mode, the synthesizer module 6 generates delay-based effects such as echo, reverb, chorus and flange to voices. When a voice is designated for effects processing, its data is stored in one of the eight effects accumulators 1018, and then the synthesizer module 6 writes the data to wavetable data 1002. The current write address for this data is set in the Synthesizer Effects Address register. The current read address, as for all voices to be generated, is the value in the Synthesizer Address register. The difference between write and read addresses provides a delay for echo and reverb effects. The write address will always increment by one. The read address will increment by an average of one, but can have variations in time added by an LFO. These LFO variations create chorus and flange effects.

After delayed data is read, the data is multiplied by the volume components in the left and right path and this determines how much of the delayed data is heard and the stereo position of the output. The voices' signal path through EVOL to the effects accumulators 1018, is selected by setting bit AEP in register SMSI. When SMSI[AEP] is not set, synthesizer module 6 is in the voice generating mode, and the interpolated data sample S does not travel through the effects processing path before being output to the synthesizer DAC 512.

After the synthesizer module 6 writes the data samples from one of the effects accumulators 1018 to wavetable data 1002 and then later reads one of these data samples, if SMSI[AEP] is set, the data sample may then be fed back to the effects accumulators 1018. When a data sample is fed back to the effects accumulators 1018, its volume may be attenuated only by EVOL. If the data sample is fed back to the same accumulator, EVOL can be used to provide decay in the data sample's volume to create an echo effect.

B. Voice Generation

When its in an enhanced mode (controlled by bit ENH in the Synthesizer Global Mode register), the synthesizer module 6 can generate any number of voices up to 32 at a constant 44.1 KHz sample rate. Bit DAV of register SMSI controls whether or not a particular voice will be processed. A particular voice will not be processed when bit DAV is set to one. When a voice is not processed, the synthesizer module 6 will not update any of its register values and will not request memory cycles from the local memory control module 8. Unused voices are not processed in order to save power and free up memory cycles for other local memory control memory operations.

When not in enhanced mode, a 44.1 KHz sample rate will only be maintained for up to 14 active voices. If a 15th voice is added, approximately 1.6 microseconds will be added to the sample period resulting in a sample rate of 41.2 KHz. See section VI. LOCAL MEMORY CONTROL MODULE for further explanation of frame expansion. This same process continues as each voice is added, up to a maximum of 32 voices at a sample rate of 19.4 KHz. The following equation can be used to determine the sample rate when voice generation is not in the enhanced mode:

$$\text{Sample period}\sim\text{AV. } 1.6\ \mu\text{sec}$$

where AV is equal to the number of active voices, as controlled by the Synthesizer Active Voices register. AV can range in value from 14 to 32. When the sample rate changes, all voice frequency control values must be adjusted to maintain the true pitch of a tone. Slower sample rates also degrade the audio quality. However, the option to have this mode enables synthesizer module 6 to be backwards compatible with Ultrasound's wavetable synthesizer. See U.S. patent application Ser. No. 072,838, entitled "Wave Table Synthesizer," by Travers, et al., which is incorporated herein by reference.

C. Address Control

Voice generation starts with the address generator 1000 addressing the wavetable data 1002 at the location programmed in the Synthesizer Address registers. Computation of the next value stored in the Synthesizer Address registers is controlled by four-bits: ENPCM (enable pulse code modulated), LEN (loop enable), BLEN (bi-directional loop enable) and DIR (direction). ENPCM is stored in the Synthesizer Volume Control register. LEN, BLEN and DIR are stored in the Synthesizer Address Control register. Essentially, the setting of one or a combination of these bits determines if the synthesizer module will address through a block of wavetable data and then stop, if the synthesizer module will loop through a block of data, and if the synthesizer module will address through the data in a forward or reverse direction. FIGS. 104*a*–104*f* illustrate six addressing control options: (i) forward single pass; (ii) reverse single pass; (iii) forward looping; (iv) reverse looping; (v) bi-directional looping; and (vi) PCM play back. As illustrated, an interrupt, if enabled, is generated each time an address boundary is crossed. Address boundaries are held in the Synthesizer Address Start and End registers.

ENPCM in the Synthesizer Volume Control register can be used to play back an arbitrarily long piece of digitally recorded sound using a small, fixed amount of memory. ENPCM allows the address control logic to cause an interrupt at an address boundary, but to continue moving the address in the same direction unaffected by the address boundary.

The standard way to play back digitally recorded sound with synthesizer module 6 is as follows:

1. Using DMA or PIO, store the first block of recorded data in local memory from address START to END1.
2. Set START and END1 as address boundaries with ENPCM=1, LEN=0, BLEN=0 and DIR=0 and start processing the voice.
3. Using DMA or PIO, store the next block of recorded data in local memory from address END1 to END2.
4. When the voice causes an interrupt for crossing END1, change the address boundary from END1 to END2 and set LEN=1.
5. Using DMA or PIO, store the next block of recorded data in local memory from address START to END1.
6. When the voice causes an interrupt for crossing END2, change the address boundary from END2 to END1 and set LEN=0.
7. Repeat steps 3 through 6 until the recorded data has completed playing.

The above steps can be repeated for the playback of multiple digital sounds using synthesizer module 6 as a digital mixer.

The address generator 1000 also controls the write address for effects processing. When a voice is programmed for effects processing, the write address will loop between the same START and END address boundaries as the read address. The current write address will be held in the Synthesizer Effects Address register. The effective mode of looping for write addressing will be LEN=1, BLEN=0 and DIR=0 with FC=1. The mode of looping for read addressing must be set to LEN=1, BLEN=0, ENPCM=1 and DIR=0 with FC=1. The difference between the current write address held in the Synthesizer Effects Address register and the current read address held in the Synthesizer Address register will set the amount of delay of the effect. The distance between the START and END address boundaries will set the maximum delay available.

FC(LFO) controls the rate the Synthesizer Address register is incremented or decremented. FC(LFO) is made up of the components FC and FLFO. FC is a value programmed into the Synthesizer Frequency Control register. FLFO is a value which is modified by an LFO and this value is stored in the Synthesizer Frequency LFO register. FLFO will be added to FC before the address calculations are done. FLFO is a signed value, and if FLFO is negative, the pitch of the voice will decrease, while if FLFO is positive, the pitch of the voice will increase.

The table below shows how all combinations of wavetable addressing, and the internal flag BC (boundary crossed), affect the next wavetable address. BC becomes a one when (END−(ADD+FC(LFO))) is negative and DIR=0 or when ((ADD−FC(LFO))−START) is negative and DIR=1. The condition BC=1 generates an interrupt if enabled by the wavetable interrupt request (IRQ) enable in the Synthesizer Address Control register. The Next ADD column indicates the equations used to compute the next address using ADD, FC(LFO), START and END. ADD is the value contained in the Synthesizer Address registers. START and END are the address boundaries for address looping contained in the Synthesizer Start Address registers and the Synthesizer End Address registers.

| ENPCM | LEN | BLEN | DIR | BC | Next ADD |
|---|---|---|---|---|---|
| X | X | X | 0 | 0 | ADD + FC(LFO) |
| X | X | X | 1 | 0 | ADD − FC(LFO) |
| 0 | 0 | X | X | 1 | ADD |
| X | 1 | 0 | 0 | 1 | START − (END − (ADD + FC(LFO))) |
| X | 1 | 0 | 1 | 1 | END + ((ADD − FC(LFO)) − START) |
| X | 1 | 1 | 0 | 1 | END + (END − (ADD + FC(LFO))) |
| X | 1 | 1 | 1 | 1 | START − ((ADD − FC(LFO)) − START) |
| 1 | 0 | X | 0 | X | ADD + FC(LFO) |
| 1 | 0 | X | 1 | X | ADD − FC(LFO) |

Discontinuities in a voice's signal can be caused when bit ENH of register SGMI equals zero, LEN=1 and BLEN=0, if the data at the END and START addresses is not the same. The discontinuity occurs because there is no way to interpolate between data addressed by the END address and data addressed by the START address. The combination of SGMI[ENH]=1, SACI[LEN]=1, SACI[BLEN]=0, SACI[DIR]=0 and SVCI[ENPCM]=1 enables the Synthesizer module to interpolate between END and START addressed data. This novel mode of interpolation is used during digital audio playback and effects processing. With this novel mode of interpolation, the interrupt normally generated when the END address is crossed will not be generated until the END addressed data is no longer needed for interpolation.

When SMSI[ROM]=0, the synthesizer module 6 can use 8-bit wide DRAM to obtain both 8-bit and 16-bit data samples. For voices that use 8-bit data, all the addresses in the address registers represent real address space. Real address space refers to contiguous DRAM address space. For voices that use 16-bit data, a translation is done from the addresses in the address registers to the real address space. The translation allows the synthesizer module 6 to generate addresses for 8-bit and 16-bit data in the same way, and for the local memory control module 8 to use DRAM fast page mode to access two 8-bit values to provide a 16-bit sample. Address translation is explained in section VI. LOCAL MEMORY CONTROL MODULE.

When SMSI[ROM]=1, the synthesizer module 6 can also use 16-bit wide ROM to obtain both 8-bit and 16-bit data samples. For voices that use 8-bit data, the least significant bit (LSB) of the address is kept internally to determine which byte of the 16-bit wide ROM word will be used. If the LSB=0, the lower byte of the word is used as sample data, and if the LSB=1, the upper byte of the word is used. For voices comprising 16-bit data, the address generator 1000 directly addresses the ROM.

D. $\mu$-LAW Expansion

To save local memory space, wavetable data can be $\mu$-Law compressed. The synthesizer module 6 expands 8-bit $\mu$-Law data to 16-bit linear data before the data is interpolated. The ULAW bit in the Synthesizer Mode Select register is set to one to expand the $\mu$-Law data. $\mu$-Law expansion is controlled by the synthesizer signal path, discussed below. The algorithm used to convert the $\mu$-Law data to 16-bit linear data is specified by the IMA Compatibility Project. See IMA Compatibility Project, Proposal for Standardized Audio Interchange Formats, Version 2.12 (Apr. 24, 1992), which is incorporated herein by reference.

E. Interpolation

During voice generation, interpolation logic 1004 in the synthesizer module signal path (discussed below) fetches sample S1 from wavetable data 1002 at the address specified by the integer portion of the Synthesizer Address registers. The integer portion is then incremented by one and sample S2 is fetched from wavetable data 1002. The interpolation logic 1004 uses samples S1 and S2, along with the fraction portion of the Synthesizer Address registers (ADDfr), to obtain the interpolated sample, S. The following equation is used to derive S.

$$S = S1 + (S2 - S1)\cdot\frac{ADDfr}{1024}$$

The interpolation process is a 10-bit interpolation. The 1024 divisor is needed to correctly multiply by a 10-bit fractional number. Thus, between samples S1 and S2, a possible 1023 additional data samples may be interpolated.

F. Volume Control

Under the control of volume controller 1012 and the synthesizer module signal path (discussed below), three volume multiplying signal paths are used to add envelope, LFO variation, right offset, left offset and effects volume to each voice. See FIGS. 102 and 103. The three paths are left, right, and effects. In each path, three volume components are multiplied to each voice. After the three components are calculated, they are summed and used to control the volume of the three signal paths. The three volume equations for each of the three signal paths are set forth below. The equations' terms are defined below.

(1) Volume Left=VOL(L)+VOL(LFO)−LOFF (2) Volume Right=VOL(L)+VOL(LFO)−ROFF (3) Volume Effects=VOL(L)+VOL(LFO)−EVOL, when SMSI[AEP]=0

Note: Volume Effects=EVOL when SMSI[AEP]=1. In other words, when the synthesizer module 6 is in the alternate effects path mode (SMSI[AEP]=1), the volume of a data sample may only be adjusted by EVOL before it is output. See V. I. Effects Volume EVOL.

The exact equation for volume multiplication is:

$$O = S\cdot 2^{(V/256)-16}$$

where O is the output data, V is the value of volume and S is the interpolated data sample value. An increment of one to V causes about 0.0235 dB of change in output O. This equation is difficult to implement directly in digital logic because of the exponential term, but a piece wise linear approximation is relatively easy to implement. The sum of each volume is a 12-bit value. The 12-bit values are split into 2 bit-fields, V[11:8] and V[7:0]. The V[11:8] and V[7:0] bit-fields are used to provide the following volume multiplication approximation:

$$O = S \cdot \left( \frac{256 + V[7:0]}{2^{24 - V[11:8]}} \right)$$

This equation is used three times to get a right voice output, a left voice output, and an effects output. The error introduced by the approximation, for $0 \leqq V \leqq 4095$, ranges from 0 dB to 0.52 dB with an average of 0.34 dB. Differences in power of less than one dB are not perceptible to the human ear, so there is no perceived error if the output power is implemented by the approximation. After all the volume components are generated, they are summed for each multipling signal path volume.

The VOL(L) component of volume can be forward, reverse, or bi-directionally looped between volume boundaries, or just ramped up or down to volume boundaries. The VOL(L) component is intended to add the envelope to a voice. Computation of the next value stored in the Synthesizer Volume Level register is controlled by three bits: LEN (loop enable), BLEN (bi-directional loop enable) and DIR (direction). LEN, BLEN and DIR are stored in the Synthesizer Volume Control register. FIGS. 105*a*–105*e* illustrate five volume control options. If enabled, an interrupt will be generated each time a volume boundary is crossed. See FIGS. 105*a*–105*e*. Volume boundaries are held in the Synthesizer Volume Start and End registers.

The table below illustrates how all combinations of volume control, along with the UVOL (update volume) and internal flag BC (boundary crossed), affect the equation for the next volume level of VOL(L). UVOL is an internal flag that controls the rate at which VOL(L) will be modified. Volume rate bits in the Synthesizer Volume Rate register set the rate of VOL(L) modification. UVOL will remain a zero until the voice has been processed the number of times set by the volume rate bits. When UVOL becomes a one, VOL(L) increments under the control of LEN, BLEN and DIR. BC becomes a one whenever a volume boundary is crossed. BC will generate an interrupt if enabled by Volume IRQ enable in the Synthesizer Volume Control register. The "Next VOL(L)" column indicates the equations used to compute the next volume level of VOL(L) using VOL(L), VINC (volume increment), START and END. VINC is held in the Synthesizer Volume rate register. START and END are the volume boundaries for volume looping contained in the Synthesizer Start Volume register and the Synthesizer End Volume register, respectively.

| UVOL | LEN | BLEN | DIR | BC | Next VOL(L) |
|---|---|---|---|---|---|
| 0 | X | X | X | X | VOL(L) |
| 1 | X | X | 0 | 0 | VOL(L) + VINC |
| 1 | X | X | 1 | 0 | VOL(L) − VINC |
| 1 | 0 | X | X | 1 | VOL(L) |
| 1 | 1 | 0 | 0 | 1 | START − (END − (VOL(L) + VINC)) |
| 1 | 1 | 0 | 1 | 1 | END + ((VOL(L) − VINC) − START) |
| 1 | 1 | 1 | 0 | 1 | END + (END − (VOL(L) + VINC)) |
| 1 | 1 | 1 | 1 | 1 | START − ((VOL(L) − VINC) − START) |

In the bit definition section of the Synthesizer Volume Rate register discussed below, the effect of volume rate bits on volume increment is defined, but for the purpose of programming the registers, the following equation best explains the rate of volume change:

$$\text{Rate of Volume change} \equiv \pm \frac{I[5:0]}{2^{3 \cdot R[1:0]}} \cdot 0.023544100\,\text{dB/sec}$$

In this equation, I[5:0] and R[1:0] are fields in the SVRI register. The change in volume caused by an increase of one in VOL(L) is 0.0235 dB. The base rate for updating VOL(L) is 44100 Hz. This implementation differs from that used by the Ultrasound wavetable synthesizer, but the calculation is compatible.

The present invention's method of volume increment (decrement) has the advantage of eliminating zipper noise for slower rate bit values. The Ultrasound wavetable synthesizer might generate zipper noise when it is incrementing the volume of a generated voice at a slow rate and the value of the volume increment is large. When R[1:0]=1, 2, or 3, volume generator 1012 of the present invention divides the increment value (I[5:0]) by eight, by shifting right I[5:0] of register SVRI. This bit shifting leaves only three bit positions for I[5:0] which can be used to set volume incrementing thereby making it impossible to get an increment step greater than seven at slower rates of volume increment. Of course, the present invention can be easily modified to provide for different maximum increment steps at slower rates of volume increment. The three bits shifted out of I[5:0] are added to bit positions F[2:0] of register SVLI. The data in bit positions F[2:0] of register SVLI contain additional data that is used to represent the value of looping volume, VOL(L), with higher resolution. See section V. N. Registers.

G. LFO Volume VOL(LFO)

An LFO generator 1021 generates LFO variation (VOL (LFO)) which can be used to continuously modify a voice's volume. Continuously modifying a voice's volume creates a tremolo effect. The value of VOL(LFO) is in the Synthesizer Volume LFO register. VOL(LFO) is the final result of LFO calculations performed by LFO generator 1021. LFO generator 1021 and the LFO operations are discussed in more detail below.

H. Volume Offset/Pan ROFF, LOFF

Volume generator 1012 controls stereo positioning of a generated voice in two ways: (i) a voice can be placed in one of sixteen pan positions; or (ii) left and right offsets can be programmed to place the voice anywhere in the stereo field. OFFEN in the Synthesizer Mode Select register controls the two different modes of stereo positioning. The table below illustrates the sixteen pan positions and the corresponding left and right offsets. It should be noted that both methods of stereo positioning can be used to place a voice in one of sixteen evenly spaced stereo positions. The values set forth in the table were derived so as to keep total power constant in all pan positions.

| Synth Pan register value | Left offset value | Left attenuation (dB) | Right offset value | Right attenuation (dB) |
|---|---|---|---|---|
| 0 | 0 | 0 | 4095 | −∞ |
| 1 | 13 | −0.31 | 500 | −11.76 |
| 2 | 26 | −0.61 | 372 | −8.75 |
| 3 | 41 | −0.96 | 297 | −6.98 |
| 4 | 57 | −1.34 | 244 | −5.74 |
| 5 | 75 | −1.76 | 203 | −4.77 |
| 6 | 94 | −2.21 | 169 | −3.97 |
| 7 | 116 | −2.73 | 141 | −3.32 |
| 8 | 141 | −3.32 | 116 | −2.73 |
| 9 | 169 | −3.97 | 94 | −2.21 |
| 10 | 203 | −4.77 | 75 | −1.76 |
| 11 | 244 | −5.74 | 57 | −1.34 |
| 12 | 297 | −6.98 | 41 | −0.96 |
| 13 | 372 | −8.75 | 26 | −0.61 |
| 14 | 500 | −11.76 | 13 | −0.31 |
| 15 | 4095 | −∞ | 0 | 0 |

The equations below determine left and right offsets in order to give finer positions of Pan with constant total power. The equations are implemented by system software.

$$Left\ Offset = 128 \cdot \log_2\left(\frac{PanMax - Pan}{PanMax}\right)$$

$$Right\ Offset = 128 \cdot \log_2\left(\frac{Pan}{PanMax}\right)$$

The following equation determines the attenuation resulting from a calculated offset:

$$Attenuation = 20 \log_{10}\left(2^{\frac{offset}{256}}\right) \text{ dB}$$

PanMax+1 is the total number of pan positions desired. Pan is the stereo position desired between zero and PanMax.

Controlling the offsets allows the user to directly and very accurately control the stereo position. It also allows the user to turn off left and right volume outputs or control the overall volume output with a volume control which is separate from all the other volume components. Programming the left or right offset to all ones turns off the respective output since once the volume sum becomes negative, the volume multiplier will be set to maximum attenuation for that path. The user can control the overall volume of a voice by considering left and right offsets to be made up of two components. One component controls stereo position and is unique to the left or the right offsets and the other component is common to the left and right offsets and controls the overall volume of a voice. The user combines the two components in system software and programs the Synthesizer Offset registers to control both the overall volume and the stereo position.

When bit OFFEN of register SMSI=1, two registers are used to control the value of each offset. Registers SROI and SLOI contain the current values of the left offset (LOFF) and the right offset (ROFF). Registers SROFI and SLOFI contain the final values of SROI and SLOI. The current values in SROI and SLOI are incremented or decremented by one LSB per sample frame until they reach the final values contained in registers SROFI and SLOFI. This allows a smooth offset change with only one write. A smooth offset change prevents the occurrance of zipper noise. An instantaneous offset change can be made by writing the same value to both the current value register and the final value register. When bit OFFEN=0, the incrementing or decrementing of the current values is disabled. This mode is used for compatibility with the Ultrasound wavetable synthesizer.

I. Effects Volume EVOL

EVOL affects the output volume of the effects signal path. As illustrated in FIG. 103, the signal path for effects is different from the signal path for voice generation. Bit [AEP] of register SMSI controls this difference. In the case of voice generation, SMSI[AEP] is zero and the effects path split comes after VOL(L) and VOL(LFO). It is important to place the effects path split after VOL(L) and VOL(LFO) because VOL(L) and VOL(LFO) add the envelope and any tremolo to the voice. Effects processing should operate on the entire voice including envelope and any tremolo. EVOL is a subtraction and therefore provides volume attenuation.

In the case of effects processing, SMSI[AEP] is one and the effects path splits after interpolation. In this mode, after the effects delay is created, EVOL can be used to adjust the signal's volume before it is fed back to the effects accumulators 1018. EVOL will not be summed with any other volume component, but will act alone to control the effects path volume.

Two registers are used to control the value EVOL. Register SEVI contains the current value of EVOL. SEVFI contains the final value of SEVI. The current value in register SEVI is incremented or decremented by one LSB per sample frame until it reaches the final value contained in register SEVFI. This allows a smooth change with only one write. A smooth change prevents the occurrance of zipper noise. An instantaneous change can be made by writing the same value to both the SEVI register and SEVFI register.

J. Voice Accumulation

After generating the left and right outputs for a data sample of a voice, accumulation logic in the synthesizer module 6 sums the left and right outputs with any other left and right outputs already generated during the same frame. See FIG. 118. The left and right outputs are accumulated in left and right accumulators 1014 and 1016. The synthesizer module 6 continues this process until it has summed all the outputs of voices processed during the frame. The sums in the left and right accumulators 1014 and 1016 are then sent to the Synthesizer DAC 512 in the CODEC module 4 to be converted into analog right and left outputs, and for possible mixing functions. See section IV. CODEC MODULE. Voice accumulation logic guarantees that when the sum exceeds a maximum value it will clip instead of rolling over and changing sign.

K. Effects Accumulation

During delay-based effects processing, a voice can be directed to any, all or none of the eight effects accumulators 1018. The Synthesizer Effects Output Accumulator Select register controls this process. During effects processing, one of the eight effects accumulators 1018 is linked to a voice. The table below illustrates which effects accumulators are linked to which effects voices and how to direct a voice's effects path to an effects accumulator. For example, if voice 12 is programmed to do effects processing, it will be linked to effects accumulator 4. Any voice can direct its effects path to be processed by voice 12 by setting its Synth Effects Output Accumulator Select register to 10 hex. This directs its effects path to effects accumulator 4.

| Effects Accumulator | Effects Voice | | | |
|---|---|---|---|---|
| 0 | 0 | 8 | 16 | 24 |
| 1 | 1 | 9 | 17 | 25 |
| 2 | 2 | 10 | 18 | 26 |
| 3 | 3 | 11 | 19 | 27 |
| 4 | 4 | 12 | 20 | 28 |
| 5 | 5 | 13 | 21 | 29 |
| 6 | 6 | 14 | 22 | 30 |
| 7 | 7 | 15 | 23 | 31 |

If more than one voice is to have the same delay-based effect, each of these voices can be summed together into one of the eight effects accumulators 1018. For example, if several of the voices are piano notes, they can be summed together into the first effects accumulator so that a chorus effect can be generated to the sum. Furthermore, if two other voices are flute notes, they can be summed together in the second effects accumulator so that a reverb effect can be generated to this sum.

During a frame, the local memory control module 8 permits up to eight accesses to wavetable DRAM for effects processing. Thus, in this embodiment a maximum of eight delay-based effects may be generated during a frame. As discussed above, several of the voices may be summed together into one of the eight accumulators 1018 and one of the eight possible effects may be generated for these voices summed together.

One skilled in the art will readily appreciate that, alternatively, after any of the accumulators 1018 has finished accumulating data from a voice or multiple voices, a voice can be used to write the accumulated data from the accumulator to local memory and to then clear the accumulator. Once an accumulator is cleared, it can be reused for accumulating data from another voice or multiple voices. Thus, the fact that there are eight accumulators does not necessarily limit the number of delay-based effects available during a frame to eight. The limit on the number of delay-based effects available during a frame is based on the number of accesses to local memory permitted in a given time frame.

As discussed, during a frame up to 32 voices and up to eight effects can be generated. However, since the frame is a set time period with 32 slots, there is a trade-off between the number of voices generated and the effects generated. For example, if the maximum eight effects are generated during a frame, up to 24 voices may also be generated during a frame. This trade-off between voices and effects generated should not cause unreasonable constraints on high quality sound generation.

L. Low Frequency Oscillators (LFOs)

When SGMI[GLFOE]=1, all LFOs are enabled. Two triangular-wave LFOs are assigned to each of the 32 possible voices. One LFO is dedicated to vibrato (frequency modulation) and the other to tremolo (amplitude modulation). All parameters for the LFO generator's 1021 operations are first written to local memory by system software. Then during operation, the parameters are read and written by the LFO generator 1021. It is possible to ramp the depth of each LFO from its present value to any value within the depth range. The following is a summary of each LFO'scapabilities:

| | |
|---|---|
| Number of LFOs per voice: | 2 (one for tremolo and one for vibrato) |
| Total number of LFOs: | 64 |
| Looai DRAM needed: | 1 Kb total for 64 LFOs |
| Register array space needed: | 64 bytes (2 LFOs × 32 voices × 1 byte per LFO) |
| LFO update rate: | 689 Hz. |
| LFO frequency range: | 21.5 Hz. to 95 seconds |
| Vibrato Maximum Depth (FC = 1): | 12.4 percent or 215 cents (more than two half-steps) |
| Vibrato Resolution (FC = 1 ): | 0.098 percent or 1.69 cents |
| Tremolo Maximum Depth: | 12 dB |
| Tremolo Resolution: | .094 dB |
| LFO ramp update rate: | 86.13 Hz. |
| Ramp range (for maximum depth): | 0.37 to 95 seconds |

Various parameters for each LFO are programmed and stored in local memory at the following address:

| A[23:10] | A[9:5] | A[4] | A[3:0] |
|---|---|---|---|
| BASE ADDRESS REGISTER (SLFOBI) | VOICE | V/T | DATA SEL |

The base address is a 14-bit programmable register, SLFOBI. VOICE is the voice number associated with the two LFOs. V/T selects between the LFOs; vibrato is high and tremolo is low. DATA SEL is decoded as follows:

| bits 3 2 1 0 | Name | Synth Access | Description |
|---|---|---|---|
| 0 0 0 x | CONTROL | read | 11-bit LFO frequency and control bits |
| 0 0 1 0 | DEPTHFINAL | read | 8-bit final depth value, |
| 0 0 1 1 | DEPTHIN | read | 8-bit depth addition (ramp rate) |
| 0 1 x x | | | not used |
| 1 0 0 x | TWAVE[0] | read-write | 16-bit LFO current waveform value |
| 1 0 1 x | DEPTH[0] | read-write | 13-bit LFO depth (must write bits 15:13 = 0) |
| 1 1 0 x | TWAVE[1] | read-write | 16-bit LFO current waveform value |
| 1 1 1 x | DEPTH[1] | read-write | 13-bit LFO depth (must write bits 15:13 = 0) |

There are two values for DEPTH and TWAVE per LFO. Which values an LFO uses is controlled by the WS bit in the CONTROL word. This feature allows the LFOs to be modified during their operation. For example, while an LFO is using TWAVE[0] and DEPTH[0], a fixed copy of TWAVE [1] and DEPTH[1] can be modified without concern for the LFO overwriting the new programmed value. After the modified value is written, the WS bit in the CONTROL word can be changed to switch to the modified value.

The CONTROL bytes contain the following data:

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| LEN | WS | SH | INV | x | TWAVEINC[10:0] | | | | | | | | | | |

| | |
|---|---|
| LEN | LFO Enable: If this is high, then the LFO is enabled. If it is low, then no further accesses will take place to process the LFO. |
| WS | Wave Select: Selects between TWAVE[0] and DEPTH[0], or TWAVE[1] and DEPTH[1]. |
| SH | Shift: Shifts the waveform up and to the right so that it starts at 0 and rises to 7FFFh. |
| INV | Invert: Flips the waveform about the x axis. |
| TWAVEINC[10:0] | LFO Frequency: This specifies the frequency of the LFO. The values range from 21.5 Hz for 7FFh, to 95 seconds for 001h. The equation for LFO frequency is: |

$$F_{LFO}(\mathrm{Hz}) = \frac{44100}{64^{2^{16}}} \cdot \mathrm{TWAVEINC} \cong 0.010514 \cdot \mathrm{TWAVEINC}.$$

Frames, LFO Frames, and Ramp Frames

One LFO is updated every frame. Every 64 frames is called an LFO frame (the time required to update all the LFOs). The current position for the depth of one LFO is updated every 8 frames. The depth for all the LFOs is updated every 8 LFO frames or every 512 (64×8) frames. Eight LFO frames make-up a ramp frame.

Processing each LFO usually requires four accesses to local memory. However, during ramp-update cycles, an LFO requires 6 accesses. Normally the first three accesses read CONTROL, DEPTH, and TWAVE; the fourth access writes back TWAVE after the new value has been calculated. During ramp update cycles, another read cycle is required to obtain DEPTHFINAL and DEPTHINC, and another write cycle is used to store the new value of DEPTH.

Ramping

Once every ramp frame, DEPTH is compared to DEPTHFINAL·32. If they are equal, no ramping occurs. If DEPTH is smaller, the sum DEPTH+DEPTHINC is calculated; otherwise, DEPTH is larger, and the difference DEPTH−DEPTHINC is calculated. If the sum/difference is greater/less than DEPTHFINAL·32, then the new value written to DEPTH is DEPTHFINAL·32; otherwise, the value written is the sum/difference. The time needed for the ramp is:

$$Ramp\ time = \frac{DEPTHFINAL \cdot 32 - DEPTH}{DEPTHINC \cdot 86.13}\ \mathrm{sec}$$

LFO Math

The creation of the final LFO value, which modifies either the frequency or the volume and is stored in the registers SFLFOI or SVLFOI, follows these steps:

| Step | Instructions | Result |
|---|---|---|
| | For SH = 0 | |
| 1. | Obtain current position, TWAVE, from DRAM. | TWAVE |
| 2. | Add TWAVEINC to TWAVE. Write the result back to local DRAM. | TWAVE + TWAVE IN |
| 3. | TWAVE[15]⊕INV is the sign bit. Invert TWAVE[13:0] bits if TWAVE[14] = 1 or not if TWAVE[14] = 0. | the LFO waveform |
| 4. | Multiply the 14-bit magnitude of the LFO wavefonn by DEPTH; combine the seven MSBs of the result with the LFO waveform's sign bit to create the two's complement final LFO. | the final LFO |
| 5. | Move the final LFO to the appropriate position in the register array. | |
| | For SH = 1 | |
| 1. | Obtain current position, TWAVE, from DRAM. | TWAVE |
| 2. | Add TWAVEINC to TWAVE. Write the result back to local DRAM. | TWAVE + TWAVEI NC |
| 3. | INV is the sign bit. Invert TWAVE[14:0] bits if TWAVE[15] = 1 or not if TWAVE[15] = 0 to create the LFO waveform magnitude. | the LFO waveform |
| 4. | Multiply the 15-bit magnitude of the LFO wavefore by DEPTH; combine the seven MSBs of the result with the LFO waveform's sign bit to create the two's complement final LFO. | the final LFO |

-continued

| Step | Instructions | Result |
| --- | --- | --- |
| 5. | Move the final LFO to the appropriate position in the register array. | |

Figure 106A:
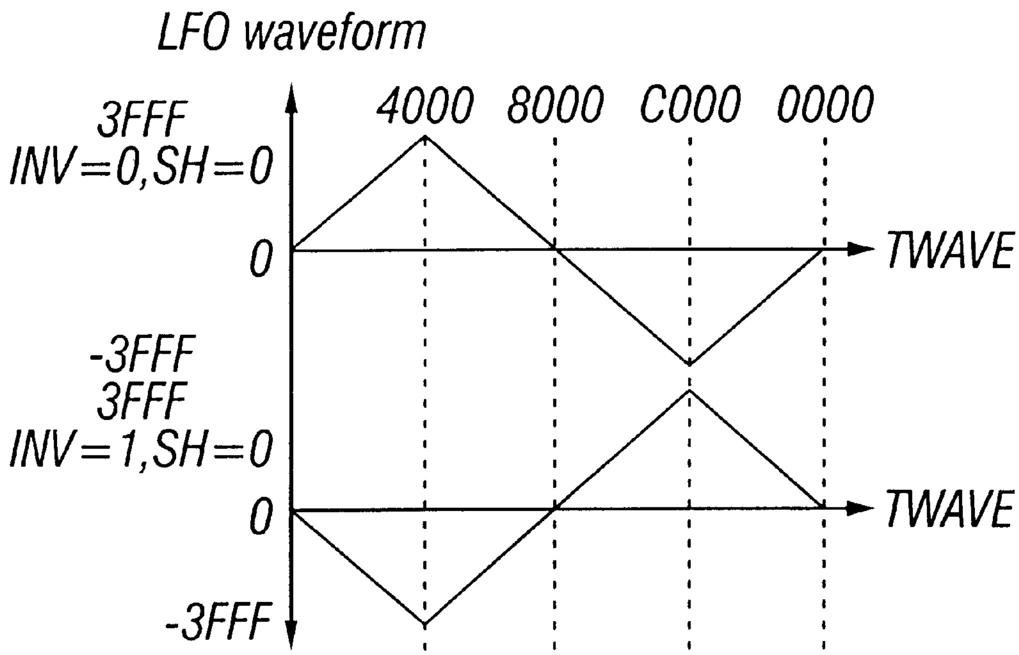
FIGS. 106*a* and 106*b* are graphs of low frequency oscillator waveforms available for the synthesizer module of the present invention.
Figure 106B:
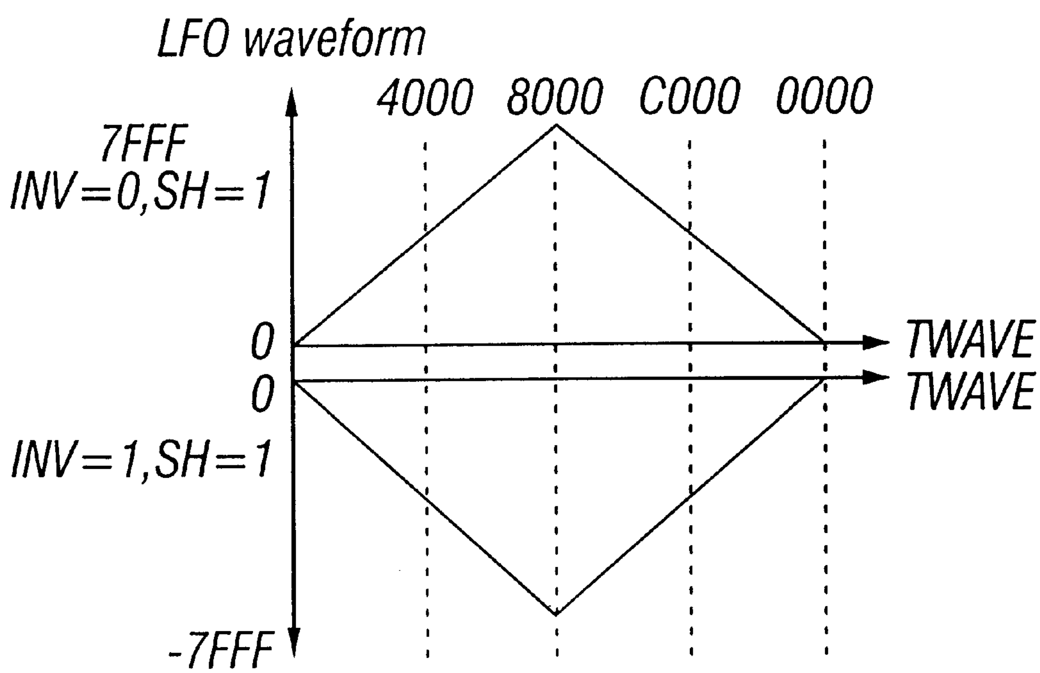

TWAVEINC is added to the TWAVE every LFO frame. The magnitude of the LFO waveform is multiplied by the depth to become the final LFO. FIGS. 106*a* and 106*b* are graphs of the four waveforms available. Waveform selection is controlled by programming INV and SH bits in the LFO's CONTROL bytes.

The final LFO is an 8-bit twos-complement value. The synthesizer register array stores the LFO amplitude/variation value used to modify the frequency and volume of a voice. This value is added to FC, for vibrato, and volume, for tremolo, as follows:

FC: Vibrato

| Integer [5:0] | F9 | F8 | F7 | F6 | F5 | F4 | F3 | F2 | F1 | F0 |
| --- | --- | --- | --- | --- | --- | --- | --- | --- | --- | --- |
| sign extension of final LFO | | | | Magnitude of final LFO | | | | | | |

Volume: Tremolo

| V11 | V10 | V9 | V8 | V7 | V6 | V5 | V4 | V3 | V2 | V1 | V0 |
| --- | --- | --- | --- | --- | --- | --- | --- | --- | --- | --- | --- |
| Sign extension | | | Magnitude of final LFO | | | | | | | 0 | 0 |

If the final LFO is positive, then the sign extension is all zeros; if the final LFO is negative, then the sign extension is all ones. This provides a maximum vibrato depth of 12.4 percent (if FC is 1) and tremolo depth of 12 dB.

Each LFO will add and then subtract the same LFO amplitude/variation to a voice's frequency and volume over a set period of time. Thus, at the end of this set period of time, the voice's frequency and volume is the same as if LFO amplitude/variation was never added.

One skilled in the art will readily appreciate that low frequency waves other than low frequency triangular waves may be suitable for providing LFO variation to the frequency and amplitude of the generated voices. For example, it may be suitable to designate one of the possible 32 generated voices as a wave used solely to provide LFO variation, provided it is a low frequency wave.

M. Interrupt Handling

Synthesizer module 6 can generate address and volume boundary interrupts for each active voice being processed. Address and volume interrupts are handled the same in terms of reporting and clearing. There are three levels of reporting for these two types of interrupts. When a boundary is crossed during voice processing, depending on the boundary, either voice specific register bit WTIRQ of register SACI or voice specific register bit VIRQ of register SVCI will indicate the type of interrupt, and either global register bit WTIRQ# or VIRQ# of register SVII will be set. Register SVII also contains the number of the voice that caused the interrupt. Bits WTIRQ# and VIRQ# are mirrored in bits LOOIRQ and VOLIRQ of register UISR in system control module 2. An interrupt service routine can read register UISR to determine the source of the interrupt. Then, when such an interrupt service routine writes a value of 8Fh to register IGIDXR (located in system control module 2) to index register SVII, this serves as acknowledgement that the interrupt has been serviced, and the contents of SVII will be latched and and the process of clearing all three levels of reporting can begin. UISR[LOOIRQ,VOLIRO] bits are cleared shortly after a write to IGIDXR with a value of 8Fh. When the voice that caused the interrupt is next processed, SACI[WTIRQ] and SVCI[VIRQ] will be cleared and all three levels of reporting are cleared.

Multiple voice interrupts can be stacked in particular registers in synthesizer module 6. If a voice reaches a boundary during processing and register SVII already contains an active interrupt, either voice specific register bit WTIRQ or VIRQ of register SVCI holds the new interrupt until the active interrupt has been cleared from register SVII. Register SVII is updated with the new interrupt during the new interrupting voice's processing.

SVII[WTIRQ#,VIRQ#] and the number of the voice that caused an interrupt can also be observed by reading register SVIRI. Reading register SVIRI does not clear any stored interrupt reporting bits. Thus, an interrupt service routine can check the interrupt reporting bits and change the boundary condition which caused the interrupt before clearing the interrupt reporting bits. If only SVII is read, it is possible to obtain multiple interrupts reported for the same boundary condition.

N. Registers

Unless specifically noted, all RES (reserve) bits in the synthesizer module registers 1022 must be written with zeros. Reads of RES bits return indeterminate values. A read-modify-write operation of RES bits can write back the read value.

1. Direct Registers

Synthesizer Voice Select Register (SVSR)

The Synthesizer Voice Select register is used to select voice-specific indirect registers to read or write data. The Synthesizer Voice Select register can be written with 0 through 31 (0h to 1Fh) to select one of 32 voices to program. Also, bit AI can be set to 1 to allow register IGIDXR to auto-increment with every write to I8DP or I16DP. AI will be held to 0 when SGMI[ENH]=0

Address: P3XR+2h read/write

Default: 00h

| 7 | 6 | 5 | 4 | 3 | 2 | 1 | 0 |
| --- | --- | --- | --- | --- | --- | --- | --- |
| AI | RES | | VS[4:0] | | | | |

2. Indirect Registers

There are two types of indirect registers within synthesizer module 6: global and voice-specific. Global registers affect the operation of all voices, and voice-specific registers affect the operation of only one voice. Access to global registers is identical to access to other indirect registers. To gain access to voice-specific registers, a voice number must also be specified by writing to the Synth Voice Select register (SVSR). A read of a voice specific register is triggered by writing a read address to IGIDXR. A write to a voice's specific register is triggered by writing to the General 16-bit or 8-bit I/O data ports, I16DP and I8DP, after IGIDXR and SVSR have been written. Also, to ease the number of accesses needed to program a voice, SVSR[AI] can be set to one to allow the value in register IGIDXR to auto-increment with every write to I8DP or I16DP. These features lead to several different ways of accessing voices specific registers as set forth in the following table.

| Standard access for writes and reads | Row access for writes and reads | Column access for writes | Auto incre-ment access for writes |
|---|---|---|---|
| wrSVSR | wr SVSR | wr SVSR | wr SVSR |
| wr IGIDXR | wr IGIDXR | wr IGIDXR | wr IGIDXR |
| wr-rd I(16-8)DP | wr-rd I(16-8)DP | wr I(16-8)DP | wr I(16-8)DP |
| | wr IGIDXR | wr SVSR | wr I(16-8)DP |
| | wr-rd I(16-8)DP | wr I(16-8)DP | wr I(16-8)DP |
| | wr IGIDXR | wr SVSR | wr I(16-8)DP |
| | wr-rd I(16-8)DP | wr I(16-8)DP | wr I(16-8)DP |
| | wr IGIDXR | wr SVSR | wr I(16-8)DP |
| | wr-rd I(16-8)DP | wr I(16-8)DP | wr I(16-8)DP |

Voice-specific register values within synthesizer module 6 are contained in a dual-port RAM called the register array 1032. One side of the register array is accessible from the system bus interface 14 of system control module 2 for voice programming, and the other side is accessible by the synthesizer module's core blocks 1000, 1012, 1028 and 1032. See section V. O. Synthesizer Module Architecture.

As a voice is generated, the synthesizer module core blocks read the voice's programmed values from the register array. By the end of a voice's generation, the core blocks write back the self-modifying register values to the register array 1032. The system bus interface 14 reads of the register array must wait until the core blocks are not reading or writing to the register array. To speed the read access of the register array, the read indexes of the synthesizer module's indirect registers are different from the write indexes. This allows the read data to be pre-fetched. In the case of fast bus accesses, the IOCHRDY pin is used during the read of the data byte registers to hold system bus interface 14 until the register array 1032 can respond.

In the case of a system bus interface 14 to the register array, the write must wait until: (i) the synthesizer module s core blocks are not reading or writing any voice; and (ii) the voice which is being modified by the write is not being processed by the synthesizer module 6. The second condition insures that data written by system bus interface 14 to a self-modifying register is not changed by the core blocks' writes to the register array 1032 at the end of the voice's processing.

System bus interface 14 writes to the register array 1032 are buffered. The IOCHRDY pin is also used to hold the system bus interface 14 if the register array 1032 has not taken the buffered data before the next system bus interface write to the Index or Synthesizer Voice Select registers.

The present invention is designed such that it avoids the undesirable method in the prior art of having the system interface write data twice to a self-modifying register to avoid having that data overwritten. In comparison to this method in the prior art, the present invention is believed to be more reliable at ensuring that the data is written and at reducing the period of time that the synthesizer is reading or writing to particular self-modifying registers.

Special attention must be taken when writing to an active voice's registers. If the synthesizer module core blocks read the register array 1032 between writes of pairs of voice-specific registers, an unwanted action may be taken by the generators. Voice specific registers having pairs of registers include: Synthesizer Address Start, Synthesizer Address End, Synthesizer Address, Synthesizer Effects Address, and Synthesizer Offset.

Synthesizer registers are initialized by PCARST#. See III. System Control Module for more discussion of PCARST#. The global registers are initialized when PCARST# is active and the register array that contains the voice-specific registers is initialized following the inactive edge of PCARST# with a 128 clock sequence. During the clock sequence, every four 16 MHz clocks, a write from the synthesizer module core blocks side of the register array 1032 will initialize every voice specific register bit of a particular voice.

URSTI[RGF1]=0 also initializes the registers SVII, SVIRI, SGMI and SLFOBI. In general, URSTI[RGF1]=0 stops all synthesizer module 6 operations. URSTI[RGF1] must equal one in order for the synthesizer module 6 to operate and to read and write registers within the synthesizer module. The synthesizer module registers are initialized to values compatible with the Ultrasound wavetable synthesizer after PCARST# has been inactive for. 128 16 MHz clocks. At this point, URSTI[RGF1] will reset Ultrasound compatible functions just as occurs in the Ultrasound wavetable synthesizer. SGMI[ENH] has been set to one and new registers and new register bits have been accessed, only another PCARST# or an initialization routine which writes registers to their default conditions can return the synthesizer module 6 to a compatible state. This condition exists because URSTI[RGF1]=0 does not initialize the voice specific registers in the register array.

3. Global Registers a. Synthesizer Active Voices Register (SAVI)

The Synthesizer Active Voices register is only needed to remain compatible with Ultrasound's wavetable synthesizer. In an enhanced mode, controlled by setting ENH in the Synthesizer Global Mode register to one, the Synthesizer Active Voices register's outputs do not affect operation. When ENH=0, this register is used to control which voices will produce an output and affect the output sample rate. The number of active voices can range from 14 to 32. With 14 active voices, the output sample rate is 44.1 KHz or a sample period of approximately 22.7 microseconds. Each additional voice above 14 adds approximately 1.6 microseconds to the sample period. When ENH=0, the frequency control values must be adjusted to compensate for the slower output sample rates when more than 14 voices are active. The programmed value equals the number of active voices minus 1. The programmed values of this register can range from 13 (CDh) to 31 (DFh).

Address: P3XR+5h read/write; index IGIDXR=0Eh write or IGIDXR=8Eh read
Default: CDh

| 7 | 6 | 5 | 4 | 3 | 2 | 1 | 0 |
|---|---|---|---|---|---|---|---|
| RES | | | AV[4:0] | | | | |

| | |
|---|---|
| RES | Reserved bits: When read bit 7 = 1, 6 = 1 and 5 = 0. |
| AV[4:0] | Active Voices: These bits indicate the number of active voices. |

b. Synthesizer Voices IRQ Register (SVII)

The Synthesizer Voices IRQ register indicates which voice needs interrupt service and what type of interrupt service is needed. Indexing this register with register IGIDXR=8Fh clears the IRQ bits in the voice-specific Synthesizer Volume Control and/or Synthesizer Address Control registers which caused the interrupt and also clears VOLIRQ and LOOIRQ in the IRQ Status register.

Address: P3XR+5h read; index IGIDXR=8Fh read
Default: E0h

| 7 | 6 | 5 | 4 | 3 | 2 | 1 | 0 |
|---|---|---|---|---|---|---|---|
| WTIRQ# | VIRQ# | RES | V[4:0] | | | | |

| | |
|---|---|
| WTIRQ# | WaveTable IRQ: When this bit is a 0, the voice indicated by V[4:0] has crossed an address boundary and has caused an interrupt. |
| VIRQ# | Volume IRQ: When this bit is a 0, the voice indicated by V[4:0] has crossed a volume boundary and has caused an interrupt. |
| RES | Reserved bit: Will read a 1. |
| V[4:0] | Voice number: These bits indicate which voice needs interrupt service. |

All bits except RES bits are self-modifying.

c. Synth Voices IRQ Read Register (SVIRI)

The synthesizer voices IRQ read register contains the same bits as the SVII register but can be read without clearing any internally stored interrupt conditions.

Address: P3XR+5h read; index IGIDXR=9Fh read
Default: E0h

| 7 | 6 | 5 | 4 | 3 | 2 | 1 | 0 |
|---|---|---|---|---|---|---|---|
| WTIRQ# | VIRQ# | RES | V[4:0] | | | | |

| | |
|---|---|
| WTIRQ# | WaveTable IRQ: When this bit is a 0, the voice indicated by V[4:0] has crossed an address boundary and has caused an interrupt. |
| VIRQ# | Volume IRQ: When this bit is a 0, the voice indicated by V[4:0] has crossed a volume boundary and has caused an interrupt. |
| RES | Reserved bit: Will read a 1. |
| V[4:0] | Voice number: These bits indicate which voice needs interrupt service. |

All bits except RES bits are self-modifying.

d. Synthesizer Global Mode Register (SGMI)

The Synthesizer Global Mode register controls modes of operation that affect all voices.

Address: P3XR+5h read/write; index IGIDXR=19h write or IGIDXR=99h read
Default: 00h

| 7 | 6 | 5 | 4 | 3 | 2 | 1 | 0 |
|---|---|---|---|---|---|---|---|
| RES | | | | RAMTEST | NOWVTBL | GLFOE | ENH |

| | |
|---|---|
| RAMTEST | Ram Test: Setting to a 1 allows AF[0] of the Synth Address registers to be written and read in bit position 15 of SAHI. |
| NOWVTBL | No wave-table: When set to 1, the synthesizer will not use wave-table data but instead will use the integer LSB bit of the synth address registers to interpolate between a maximum positive 16-bit value (LSB = 0) and a maximum negative 16-bit value (LSB = 1). |
| GLFOE | Global LFO enable: Setting to a 1 will enable all LFOs to operate. |
| ENH | Enhanced mode: Enable enhanced features added to the Ultrasound's wavetable synthesizer with a 1. |

e. Synthesizer LFO Base Address Register (SLFOBI)

The Synthesizer LFO Base Address register holds the base address for the locations of voice LFO parameters.

Address: P3XR+(4-5)h read/write; index IGIDXR=1Ah write or IGIDXR=9Ah read
Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| RES | | A[23:10] | | | | | | | | | | | | | |

| | |
|---|---|
| A[23:10] | LFO Base Address: Base address for the locations of voice LFO parameters. |

4. Voice-Specific Registers a. Synthesizer Upper Address Register (SUAI)

The Synthesizer Upper Address register contains the upper bits of the wavetable address for a voice. The upper address bits of the wavetable address are added to the Synthesizer Address Start, Synthesizer Address End and the Synthesizer Address for each voice. The upper address bits fix a voice in one of four 4 megabyte memory spaces. With the upper address bits a total of 16 megabytes of memory can be accessed by synthesizer module 6. When SGMI [ENH]=0, SUAI is held to the default value.

Address: P3XR+5h read/write; index IGIDXR=10h write or IGIDXR=90h read; voice index SVSR=(00h through 1Fh)
Default: 00h

| 7 | 6 | 5 | 4 | 3 | 2 | 1 | 0 |
|---|---|---|---|---|---|---|---|
| RE | | | | | | AI[23:22] | |

| | |
|---|---|
| AI[23:22] | Upper Address bits |

b. Synthesizer Address State Registers

The Synthesizer Address Start registers' integer portion specifies a boundary address when a voice is moving through wavetable data 1022. The Synthesizer Address Start registers' value is less than the Synthesizer Address End registers' value. AI[21:20] have been added to allow a voice to access 4 megabytes of wavetable memory. When SGMI [ENH]=0, AI[21:20] will be held to a 0.

(i) Synthesizer Address State High Register (SASHI)

Address: P3XR+(4-5)h read/write; index IGIDXR=02h write or IGIDXR=82h read; voice index SVSR=(00h through 1Fh)
Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| RES | AI[21:7] | | | | | | | | | | | | | | |

(ii) Synthesizer Address Start Low Register (SASLI)

Address: P3XR+(4-5)h read/write; index IGIDXR=03h write or IGIDXR=83h read; voice index SVSR=(00h through 1Fh)
Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| AI[6:0] | | | | | | | AF[3:0] | | | | RES | | | | |

| | |
|---|---|
| AI[21:20] | Start Address: Extended integer portion of Start Address added to access 4 megabytes. |
| AI[19:0] | Start Address: Integer portion of Start Address |
| AF[3:0] | Start Address: These four bits represent the upper bits of a 10-bit fractional portion that is fully represented in the Synthesizer Frequency Control register. |

c. Synthesizer Address End Registers

The Synthesizer Address End registers' integer portion specifies a boundary address in wavetable data 1002. The Synthesizer Address End registers' value is greater than the Synthesizer Address Start registers' value. AI[21:20] have been added to allow a voice to access 4 megabytes of wavetable memory. When SGMI[ENH]=0, AI[21:20] will be held to a 0.

(i) Synthesizer Address End High Register (SAEHI)

Address: P3XR+(4-5)h read/write; index IGIDXR=04h write or IGIDXR=84h read; voice index SVSR=(00h through 1Fh)
Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| RES | AI[21:7] | | | | | | | | | | | | | | |

(ii) Synthesizer Address End Low Register (SAELI)

Address: P3XR+(4-5)h read/write; index IGIDXR=05h write or IGIDXR=85h read; voice index SVSR=(00h through 1Fh)
Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| AI[6:0] | | | | | | | AF[3:0] | | | | RES | | | | |

-continued

| | |
|---|---|
| AI[21:20] | End Address: Extended integer portion of End Address added to access 4 megabytes. |
| AI[19:0] | End Address: Integer portion of End Address |
| AF[3:0] | End Address: These four bits represent the upper bits of a 10-bit fractional portion that is fully represented in the Synthesizer Frequency Control register. |

d. Synthesizer Address Registers

The Synthesizer Address registers' integer portion is the current location in the wavetable data 1002 from which the synthesizer module 6 is fetching sample data. The fractional portion is used to interpolate between the sample in the location addressed by AI[21:0] and the sample in the location addressed by AI[21:0]+1. This register is self modifying and changes values as a voice moves through wavetable memory. AI[21:20] have been added to allow a voice to access 4 megabytes of wavetable memory. When SGMI [ENH]=0, AI[21:20] will be held to a 0. An additional address fraction bit, AF[0] is used in interpolation but is not normally accessible for programming. A reset and a write to SALI clears AF[0]. AF[0] can be accessed through bit 15 of SAHI if RAMTEST=1 in the Synth Global Mode register.

(i) Synthesizer Address High Register (SAHI)

Address: P3XR+(4-5)h read/write; index IGIDXR=Ah write or IGIDXR=8Ah read; voice index SVSR=(00h through 1Fh)
Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| RES | AI[21:7] | | | | | | | | | | | | | | |

(ii) Synthesizer Address Low Register (SALI)

Address: P3XR+(4-5)h read/write; index IGIDXR=Bh write or IGIDXR=8Bh read; voice index SVSR=(00h through 1Fh)
Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| AI[6:0] | | | | | | | AF[9:1] | | | | | | | | |

| | |
|---|---|
| AI[21:20] | Address: Extended integer portion of Address added to access 4 megabytes. |
| AI[19:0] | Address: Integer portion of the Address. |
| AF[9:1] | Address: Fractional bits used during interpolation. |

All bits except the RES bit are self-modifying.

e. Synthesizer Effects Address Registers

During effects processing, the Synthesizer Effects Address registers indicate the current address where data is being written in wavetable data 1002. The data written is from the effects accumulators 1018. The effects address is integer only, because the data is being written. Local DRAM serves as wavetable data 1002.

(i) Synthesizer Effects Address High Register (SEAHI)

Address: P3XR+(4-5)h read/write; index IGIDXR=11h write or IGIDXR=91h read; voice index SVSR=(00h through 1Fh)

Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| RES | AI[21:7] | | | | | | | | | | | | | | |

(ii) Synthesizer Effects Address Low Register (SEALI)

Address: P3XR+(4-5)h read/write; index IGIDXR=12h write or IGIDXR=92h read; voice index SVSR=(00h through 1Fh)

Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| A[6:0] | | | | | | | RES | | | | | | | | |

A[21:0] Effects Address f. Synthesizer Frequency Control Register (SFCI)

The Synthesizer Frequency Control register controls the rate at which address generator 1000 moves through wavetable addresses. This sets the pitch of the generated voices. The default value of decimal 1.0 represents the Synthesizer Frequency Control register value that will play back the wavetable data 1002 at the same rate as it was recorded. F0 has been added in order to increase the fractional frequency resolution to 10-bits. F0 will be held to a 0 when SGMI [ENH]=0.

Address: P3XR+(4-5)h read/write; index IGIDXR=01h write or IGIDXR=81h read; voice index SVSR=(00h through 1Fh)

Default: 0400h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| I[5:0] | | | | | | F[9:0] | | | | | | | | | |

| | |
|---|---|
| I[5:0] | Frequency control: Integer portion of Frequency control |
| F[9:1] | Frequency control: Fractional portion of Frequency control |
| F0 | Frequency control: Fractional portion of Frequency control added to increase resolution to 10-bits. |

g. Synthesizer Frequency LFO Register (SFLFOI)

The Synthesizer Frequency LFO register contains the value generated by the LFO generator 1021 which is used to modify the frequency of a voice. When SGMI[ENH]=0, SFLFOI is held to the default value.

Address: P3XR+5h read/write; index IGIDXR=17h write or IGIDXR=97h read; voice index SVSR=(00h through 1Fh)

Default: 00h

| 7 | 6 | 5 | 4 | 3 | 2 | 1 | 0 |
|---|---|---|---|---|---|---|---|
| FLFO[7:0] | | | | | | | |

FLFO[7:0] LFO frequency value

All bits are self-modifying.

h. Synthesizer Address Control Register (SACI)

The Synthesizer Address Control register controls how the synthesizer module will address the wavetable data 1002, and the data width of wavetable data.

Address: P3XR+5h read/write; index IGIDXR=00h write or IGIDXR=80h read; voice index SVSR=(00h through 1Fh)

Default: 01h

| 7 | 6 | 5 | 4 | 3 | 2 | 1 | 0 |
|---|---|---|---|---|---|---|---|
| * WTIRQ | *DIR | WTIEN | BLEN | LEN | DW | STP1 | *STP0 |

| | |
|---|---|
| WTIRQ | Wavetable IRQ: When this bit is a 1, WTIEN has been set and the wavetable address has crossed a boundary set by the start or end address. This bit is cleared when the voice's interrupt condition has been loaded into the Synthesizer Voices IRQ register and a value of 8F has been written to the General Index register. This bit can also be written with either a 0, to clear an interrupt, or a 1, to cause an interrupt. |
| DIR | Direction: This bit sets the direction that the wavetable will be addressed. If DIR = 0, the address will increase towards the boundary set by the Address End registers. If DIR = 1, the address will decrease towards the boundary set by the Address Start registers. This bit is modified by address generator 1000 when bi-directional looping is enabled, BLEN = 1. |
| WTIEN | Wavetable IRQ enable: If WTIEN = 1, the WTIRQ bit will be set when an address boundary is crossed. When WTIEN = 0, WTIRQ will be cleared and cannot be set. |
| BLEN | Bi-directional Loop enable: When BLEN = 1, the wavetable address will change directions at both the start and end addresses. When BLEN = 0, the wavetable address will continue to loop in the same direction when end points are crossed. BLEN is do not care when LEN = 0. |
| LEN | Loop enable: When LEN = 1, the wavetable address will loop between address boundaries controlled by BLEN and DIR. When LEN = 0, the wavetable address will move to the boundary of the block of memory indicated by the start and end addresses or beyond if ENPCM in the Synthesizer Volume Control register is set. |
| DW | Data width: This sets whether the wavetable data 1002 will be addressed as 16-bit data or 8-bit data. If DW = 1, 16-bit data is accessed from wavetable data. If DW = 0, 8-bit data is accessed from wavetable data. |
| STP1 | Stop 1: Writing a 1 to this bit will stop voice generation activity. Both STP1 and STP0 must be 0 for voice processing to operate. |
| STP0 | Stop 0: This bit is modified by the address generator 1000. If a voice is set to stop at a boundary, STP0 will be set to a 1 when the boundary is crossed. It can also be written to 1 to stop a voice. When read, it represents the status of a voice. Both STP1 and STP0 must be 0 for a voice to operate. |

*indicates self-modifying bits.

i. Synthesizer Volume Start Register (SVSI)

The Synthesizer Volume Start register contains the low point of a volume ramp.

Address: P3XR+5h read/write; index IGIDXR=07h write or IGIDXR=87h read; voice index SVSR=(00h through 1Fh)

Default: 00h

| 7 | 6 | 5 | 4 | 3 | 2 | 1 | 0 |
|---|---|---|---|---|---|---|---|
| V[7:0] | | | | | | | |

V[7:0] Volume Start value j. Synthesizer Volume End (SVEI)

The Synthesizer Volume End register contains the high point of a volume ramp.

Address: P3XR+5h read/write; index IGIDXR=08h write or IGIDXR=88h read; voice index SVSR=(00h through 1Fh)
Default: 00h

| 7 | 6 | 5 | 4 | 3 | 2 | 1 | 0 |
|---|---|---|---|---|---|---|---|
| V[7:0] | | | | | | | |

V[7:0] Volume End value k. Synthesizer Volume Level Register (SVLI)

The Synthesizer Volume register contains the current value of the looping component of volume. Volume has three fractional bits (F[2:0]) that are used for more resolution when choosing a slow rate of increment. These three bits do not affect the volume multiply until an increment causes them to rollover into the LSB of V[11:0].

Address: P3XR+(4-5)h read/write; index IGIDXR=09h write or IGIDXR=89h read; voice index SVSR=(00h through 1Fh)
Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| V[11:0] | | | | | | | | | | | | F[2:0] | | | RES |

V[11:0] Current looping volume value.
F[2:0] Fractional volume value.

All bits except RES bits are self-modifying.

1. Synthesizer Volume Rate Register (SVRI)

The Synthesizer Volume Rate register controls the rate at which the looping volume for a voice is incremented and the amount of the increment.

Address: P3XR+5h read/write; index IGIDXR=06h write or IGIDXR=86h read; voice index SVSR=(00h through 1Fh)
Default: 00h

| 7 | 6 | 5 | 4 | 3 | 2 | 1 | 0 |
|---|---|---|---|---|---|---|---|
| R[1:0] | | I[5:0] | | | | | |

-continued

| | |
|---|---|
| R[1:0] | Volume rate bits: These bits control the rate at which the increment adds to the volume and the division of the increment value. |
| | R[1:0] = 0 add increment value every frame |
| | = 1 add (increment value)/8 every frame |
| | = 2 add (increment value)/8 every 8th frame |
| | = 3 add (increment value)/8 every 64th frame |
| I[5:0] | Volume Increment bits: There bits control the amount of increment. |

m. Synthesizer Volume Control Register (SVCI)

The Synthesizer Volume control register controls how the looping component of a voice's volume will move from volume start to volume end. This register also contains ENPCM that controls wavetable addressing to allow a voice to continuously play blocks of pulse code modulated (PCM) data. VIRQ, DIR and STP0 are self modifying bits.

Address: P3XR+5h read/write; index IGIDXR=0Dh write or IGIDXR=8Dh read; voice index SVSR=(00h through 1Fh)
Default: 01h

| 7 | 6 | 5 | 4 | 3 | 2 | 1 | 0 |
|---|---|---|---|---|---|---|---|
| *VIRQ | *DIR | VIEN | BLEN | LEN | ENPCM | STP1 | *STP0 |

| | |
|---|---|
| VIRQ | Volume IRQ: When this bit is set to a 1, VIEN has been set and the volume has crossed a boundary point set by the start or end volume. This bit is cleared when the voice's interrupt condition has been loaded into the Synthesizer Voices IRQ register and a value of 8F has been written to the General Index register. This bit can also be written with 0, to clear an interrupt, or 1, to cause an interrupt. |
| DIR | Direction: This bit controls whether the volume will increase or decrease. This bit is 0 for increasing volume and 1 for decreasing volume. This bit will be modified by volume generator 1012 when bi-directional looping is enabled, BLEN = 1. |
| VIEN | Volume IRQ enable: If VIEN = 1, the VIRQ will be set when a volume boundary is crossed. When VIRQEN = 0, VIRQ will be cleared and cannot be set. |
| BLEN | Bi-directional Loop enable: When BLEN = 1, the volume will change directions at both the start and end volumes. When BLEN = 0, the volume will continue to loop in the same direction when end points are crossed. BLEN is a do not care when LEN = 0. |
| LEN | Loop enable: When LEN = 1, the volume will loop between end points controlled by BLEN and DIR. When LEN = 0, the volume will move to a volume boundary and hold the volume constant. |
| ENPCM | Enable PCM operation: When this bit is set to a 1, the wavetable address will continue past a wavetable address boundary. This allows for continuous play of PCM data. When ENPCM = 1, LEN = 1 in the Synth Address Control register, and ENH = 1 in the Synth Global Mode register, a new mode of interpolation is enabled. This new mode allows interpolation between data addressed by the Synth Address Start registers and data addressed by the Synth Address End registers. |
| STP1 | Stop 1: Writing this bit to a 1 will stop the change in the looping component of volume. Both STP1 and STP0 must be 0 to allow the looping component of volume to change. |
| STP0 | Stop 0: This bit is modified by the volume looping logic. If volume is set to stop at a boundary, STP0 will be set to a 1 when the boundary is crossed. It can also be written to stop volume looping. When read, it shows the status of volume looping. Both STP1 and STP0 must be 0 for a voice to operate. |

*indicates self-modifying bits.

n. Synthesizer Volume LFO Register (SVLFOI)

The Synthesizer Volume LFO register contains a value generated by the LFO generator 1021 used to modify the volume of a voice.

Address: P3XR+5h read/write; index IGIDXR=18h write or IGIDXR=98h read; voice index SVSR=(00h through 1Fh)
Default: 00h

| 7 | 6 | 5 | 4 | 3 | 2 | 1 | 0 |
|---|---|---|---|---|---|---|---|
| VLFO[7:0] | | | | | | | |
| VLFO[7:0] Volume LFO value. | | | | | | | |

All the bits are self-modifying.

o. Synthesizer Offset Registers

The Synthesizer Offset registers control the placement of a generated voice in the stereo field. The Synthesizer Offset registers have two modes of operation depending on OFFEN in the Synthesizer Mode Select register. When OFFEN is 0, SROI[11:8] are used to control both right and left offsets. In this mode, sixteen positions of pan are available. A decimal value of 0 will place the voice full left and a value of 15 will place the voice full right. This mode is compatible with Ultrasound's wavetable synthesizer. When OFFEN is 1, SROI[15:4] and SLOI[15:4] contain the current right and left offset values that separately affect the right and left channel outputs of a voice. The final values for the right and left offsets are contained in the SROFI and SLOFI registers. During a voice's processing, the values RO[11:0] and LO[11:0] are incremented or decremented by one LSB closer to the values ROF[11:0] and LOF[11:0]. The Synthesizer Left Offset register will only affect operation when OFFEN is set.

(i) Synthesizer Right Offset Register (SROI)

Address: P3XR+(4-5)h read/write; index IGIDXR=0Ch write or IGIDXR=8Ch read; voice index SVSR=(00h through 1Fh)
Default: 0700h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| RO[11:0] | | | | | | | | | | | | RES | | | |
| RO[11:0] Right offset current value. | | | | | | | | | | | | | | | |

All bits except RES bits are self-modifying.

(ii) Synthesizer Right Offset Final Value Register (SROFI)

Address: P3XR+(4-5)h read/write; index IGIDXR=1Bh write or IGIDXR=9Bh read; voice index SVSR=(00h through 1Fh).

Default: 0700h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| RO[11:0] | | | | | | | | | | | | RES | | | |
| RO[11:0] Right offset current value. | | | | | | | | | | | | | | | |

All bits except RES bits are self-modifying.

(iii) Synthesizer Left Offset Register (SLOI)

Address: P3XR+(4-5)h read/write; index IGIDXR=13h write or IGIDXR=93h read; voice index SVSR=(00h through 1Fh)
Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| LO[11:0] | | | | | | | | | | | | RES | | | |
| LO[11:0] Left offset current value. | | | | | | | | | | | | | | | |

All bits except RES bits are self-modifying.

(iv) Synthesizer Left Offset Final Value Register (SLOFI)

Address: P3XR+(4-5)h read/write; index IGIDXR=1Ch write or IGIDXR=9Ch read; voice index SVSR=(00h through 1Fh)
Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| LOF[11:0] | | | | | | | | | | | | RES | | | |
| LO[11:0] Left offset current value. | | | | | | | | | | | | | | | |

p. Synthesizer Effects Volume Register (SEVI)

The Synthesizer Effects Volume register contains the current value of volume that controls the effects of a voice. During a voice's processing, the value EV[11:0] is incremented or decremented by one LSB closer to the value EVF[11:0] contained in SEVFI.

Address: P3XR+(4-5)h read/write; index IGIDXR=16h write or IGIDXR=96h read; voice index SVSR=(00h through 1Fh)
Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| EV[11:0] | | | | | | | | | | | | RES | | | |
| EV[11:0] Special Effects Volume current value. | | | | | | | | | | | | | | | |

All bits except RES bits are self-modifying.

q. Synthesizer Effects Volume Final Value Register (SEVFI)

This synthesizer effects volume final value register controls the final value of SEVI.

Address: P3XR+(4-5)H read/write; index IGIDXR=1Dh write or IGIDXR=9Dh read; voice index SVSR=(00h through 1Fh)
Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| EVF[11:0] | | | | | | | | | | | | RES | | | |
| EVF[11:0] Special Effects Volume final value. | | | | | | | | | | | | | | | |

r. Synthesizer Effects Output Accumulator Select Register (SEASI)

The Synthesizer Effects Output Accumulator Select register controls which of the effects accumulators 1018 will receive the effects output. Any, all, or none of the effects accumulators can be chosen. There are 8 effects accumulators numbered 0 to 7. When SGMI[ENH]=0, SEASI is held to the default value.

Address: P3XR+5h read/write; index IGIDXR=14h write or IGIDXR=94h read; voice index SVSR=(00h through 1Fh)
Default: 00h

| 7 | 6 | 5 | 4 | 3 | 2 | 1 | 0 |
|---|---|---|---|---|---|---|---|
| ACC[7:0] | | | | | | | |

ACC[7:0] Accumulator selects s. Synthesizer Mode Select Register (SMSI)

The Synthesizer Mode Select register controls the enabling of various features within a voice. It also controls whether a voice will go through voice generation processing, effects processing, or no processing. Programming a voice for no processing results in no accesses to the wavetable data 1002 when that voice would be processed, allowing more accesses to the local memory for other functions. When SGMI[ENH]=0, SMSI is held to the default value.

Address: P3XR+5h read/write; index IGIDXR=15h write or IGIDXR=95h read; voice index SVSR=(00h through 1Fh)
Default: 02h

| 7 | 6 | 5 | 4 | 3 | 2 | 1 | 0 |
|---|---|---|---|---|---|---|---|
| ROM | ULAW | OFFEN | AEP | RES | | DAV | EPE |

ROM ROM: Enable a voice's data to come from external ROM with a 1.

ULAW $\mu$-Law: Enable a voice's input data to be in $\mu$Law with a 1. When ULAW is 1, SACI[DW] must also be set to 0 in order to get 8 bit samples from local memory.

OFFEN Offset Enable: Enable the Synthesizer Offset registers to separately control the left and right volume of the voice with a 1.

AEP Alternate Effects path: Enable alternate signal path for a voice with a 1.

DAV Deactivate Voice: When DAV is set to 1, a particular voice will not be processed.

EPE Effects processor enable: When EPE is set to 0, the synthesizer module will act as a signal generator. When EPE is set to 1, the synthesizer module will act as an effects processor. During effects processing, SACI[DW] must be set to 1 in order to do 16 bit accesses of local memory.

O. Synthesizer Module Architecture

This subsection describes the architecture of the following core blocks of synthesizer module 6: address generator 1000 (FIG. 107); volume generator 1012 (FIG. 109); signal path 1028 (FIG. 116); and accumulation logic 1030 (FIG. 118). The synthesizer module also includes a synthesizer register array 1032 (see FIG. 111) and LFO generator 1021 (FIG. 115), a clocking controller (not shown), and a start generator (not shown).

1. Address Generator

Figure 107A:
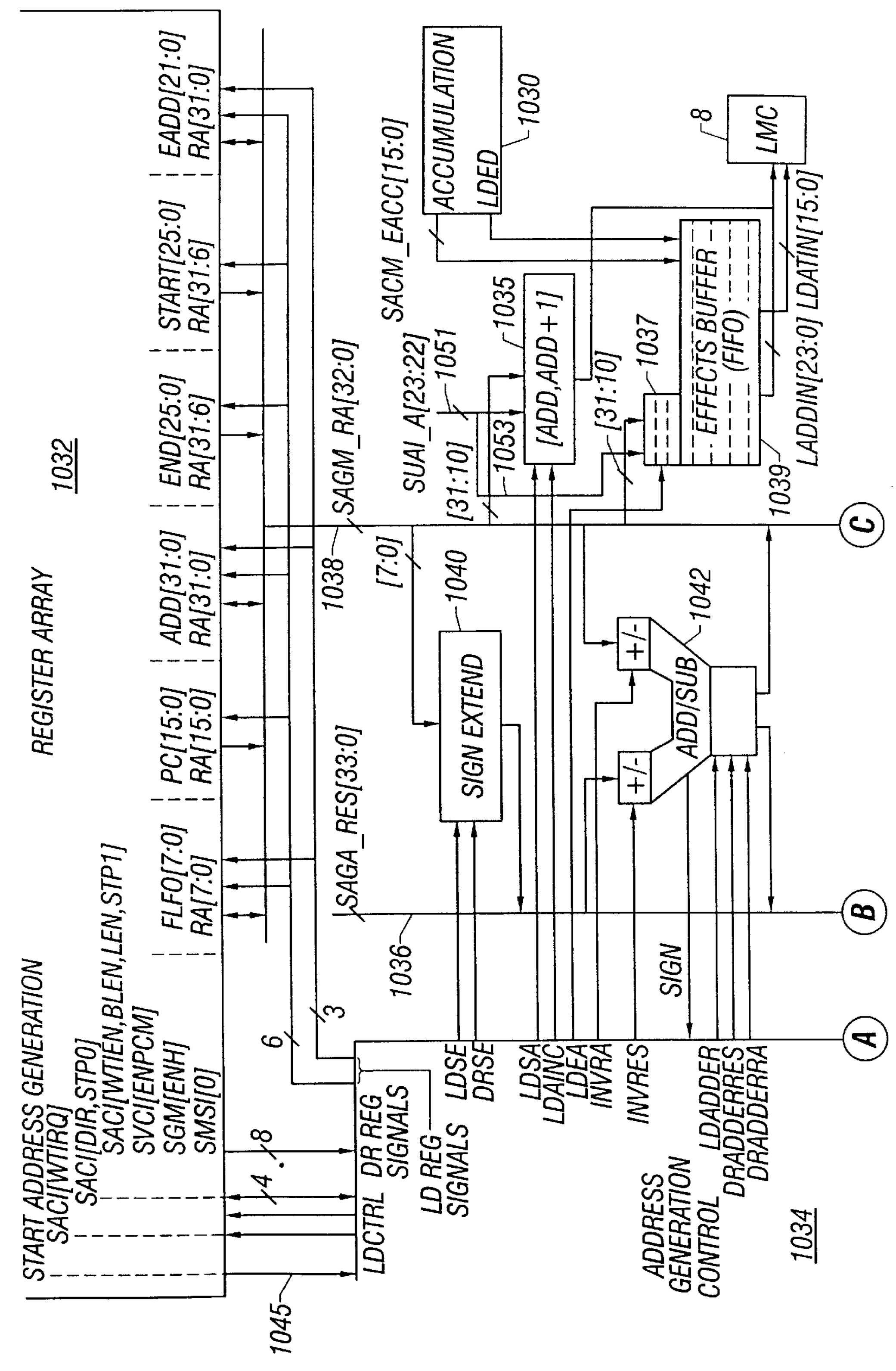
FIGS. 107*a*, 107*b* and 107*c*, generally referred to herein as FIG. 107, illustrate is an architectural diagram of an address controller of the synthesizer module of the present invention.
Figure 107B:
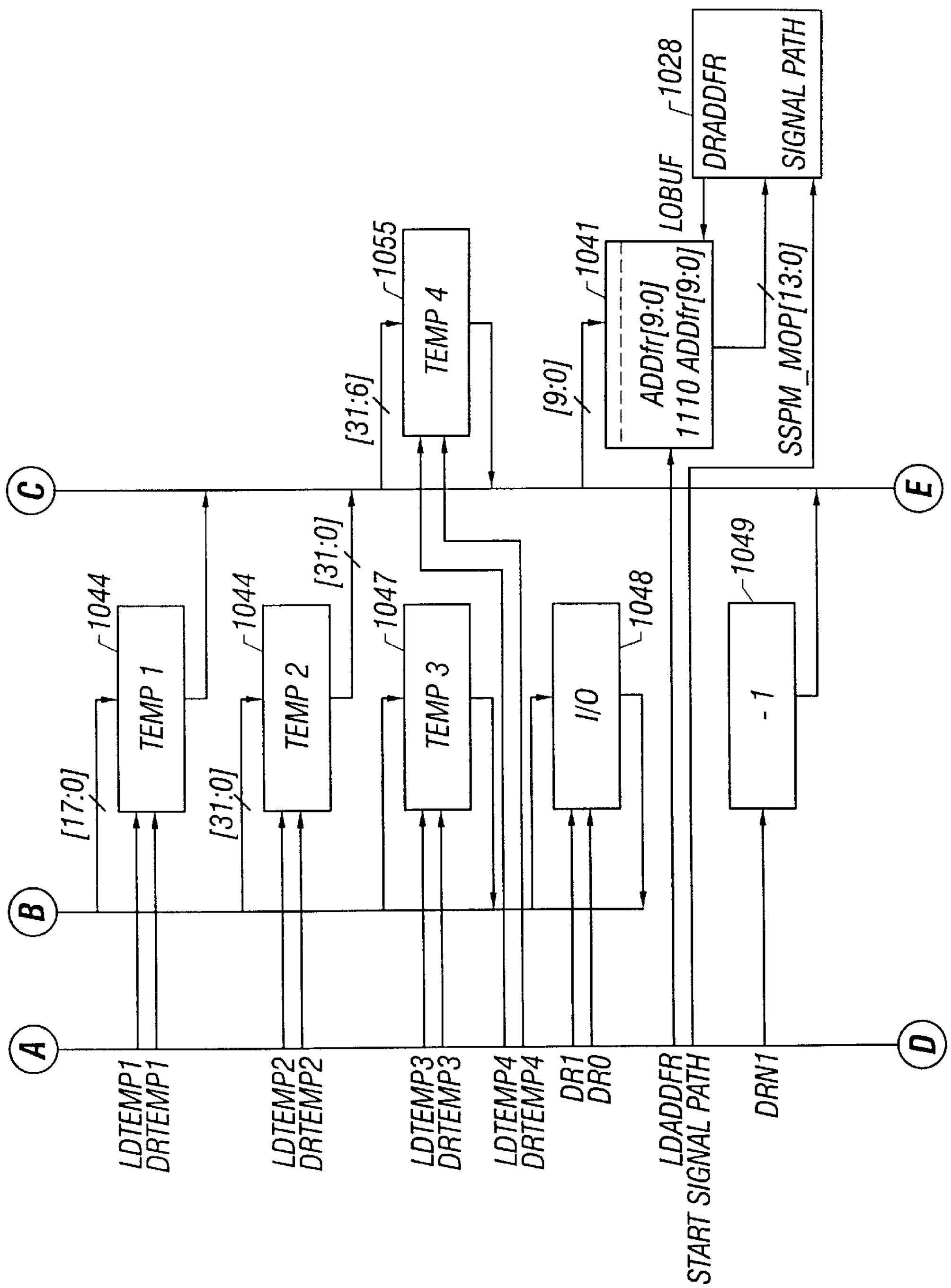
Figure 107C:
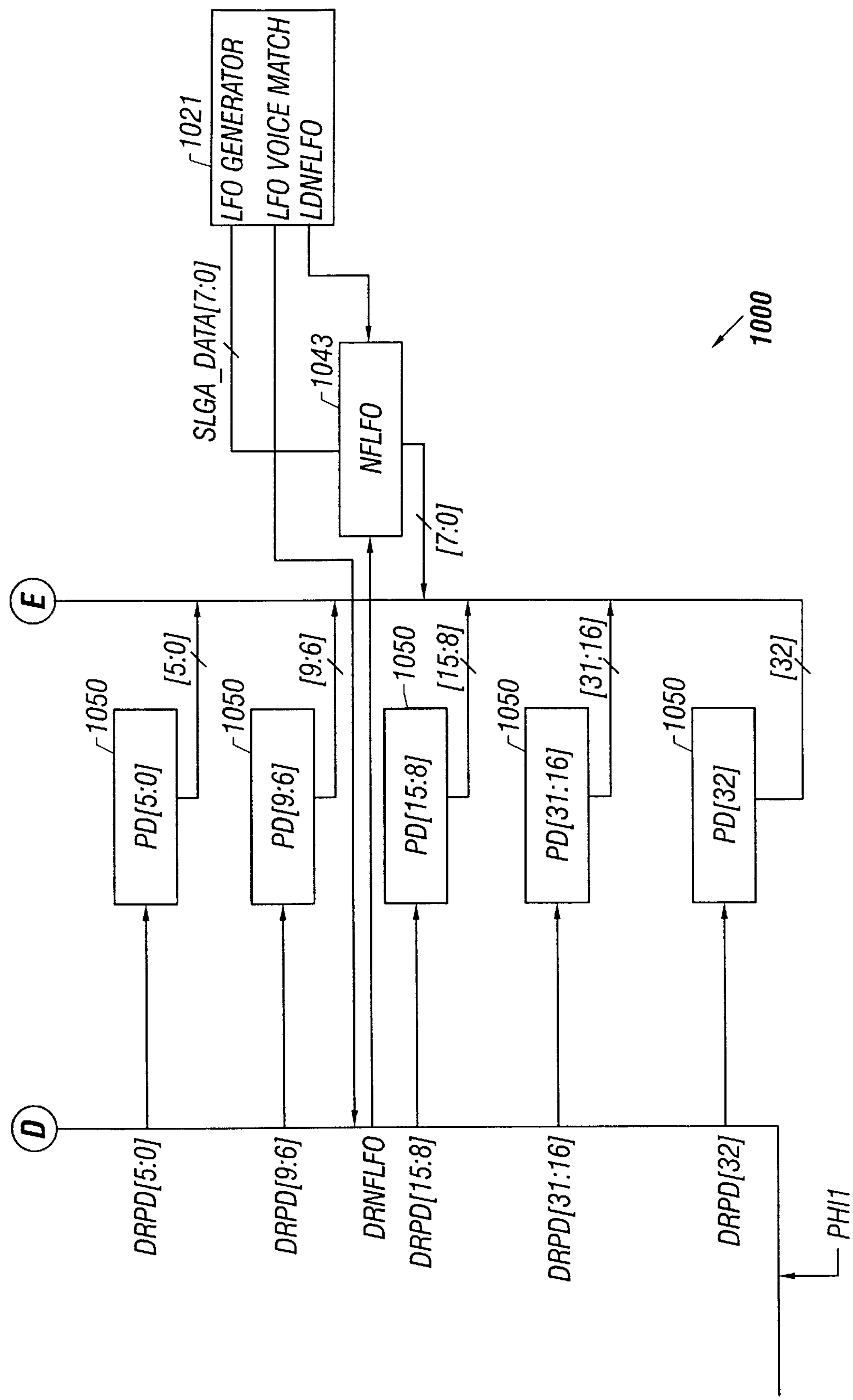

FIG. 107 illustrates address generator 1000 and its connections to synthesizer register array 1032, accumulation logic 1030, local memory control module 8, LFO generator 1021, and signal path 1028. The local memory control module 8 is discussed in section VI. LOCAL MEMORY CONTROL MODULE. Address generator 1000 includes: an address generation controller 1034; a result bus 1036; a register array bus 1038; sign extend logic 1040; an adder/subtracter 1042; temporary registers 1044, 1047, and 1055; number generators 1048 and 1049; pull down transistors 1050; loadable address incrementor 1035; effects address and data FIFO buffers 1037 and 1039; address fraction buffer 1041; LFO variation register 1043; a clocking line PHI1; and a start address generation line 1045.

As illustrated, sign extend logic 1040, adder/subtracter 1042, and temporary registers 1044 are connected to both the result bus 1036 and the register array bus 1038, as well as to the address generation controller 1034. Temporary register 1047 and number generator 1048 are connected to the result bus 1036 and address generation controller 1034, while pull down transistors 1050, number generator 1049, and temporary register 1055 are connected to the register array bus 1038 and the address generation controller 1034. Loadable address incrementor 1035, effects address and data buffers 1037 and 1039, address fraction buffer 1041, and LFO variation register 1043 are also connected to the register array bus 1038 and the address generation controller 1034.

Loadable address incrementor 1034 is also connected to synthesizer register SUAI, through line 1051, and local memory control block 8. Effects address buffer 1037 is connected to register SUAI, through line 1053, as well as to effects address and data buffer 1039. Effects address and data 1039 is connected to a register in accumulation logic 1030, to accumulation logic control line LDED, and to the local memory control block 8 through control lines LADDIN and LDATB.

Address fraction buffer 1041 also has connections to a register and control lines DRADDFR and LDBUF of signal path 1028. The address generation controller 1034 is directly connected to signal path 1028 through the Start Signal Path control line. LFO variation register 1043 has additional connections to a register and control line LDNFLFO of LFO generator 1021. LFO generator control line LFO Voice Match connects to the address generation controller 1034.

Through various control lines, discussed below, address generation controller 1034 controls all of the circuit elements of address generator 1000 connected to it. Through the Start Signal Path and LFO Voice Match control lines, address generation controller 1034 is directly connected to the signal path 1028 and LFO generator 1021 logic elements outside of the address generator 1000. The function of these other control lines is also discussed below.

Address generation controller 1034 is connected to the following synthesizer registers in register array 1032: SACI, SVCI, SGMI, SMSI, Synth Address Start Registers, Synth Address End Registers, Synth Address Registers, Synth Effects Address Registers, SFCI and SFLFOI. The following bits of some of these synthesizer registers are connected to address generation controller 1034 through load control lines (LDCTRL): SACI[WTIEN, BLEN, LEN, STP1], SVCI[ENPCM], SGMI[ENH], and SMSI[1,0]. These bits set the address generation controller's mode of address generation. On the other hand, the following bits of some of these registers can be modified by address generation controller 1034, through the LDCTRL lines, to set an interrupt condition, set the direction of wavetable addressing, and stop voice generation when a boundary is crossed: SACI [WTIRQ], and SACI[DIR,STP0].

The following of these synthesizer registers store specific parameters of address generation:

| | |
|---|---|
| Synth Address START Registers | Store START address information |
| Synth Address END Registers | Store END address information |
| Synth Address Registers | Store current address (ADD) |
| Synth Effects Address Registers | For effects processing, store current wavetable write address |
| SFCI | Stores FC information |
| SFLFOI | Stores FLFO information |

The address parameters stored in these registers are driven to the register array bus 1038 by load and drive register signals lines (DR REG SIGNALS, LD REG SIGNALS).

Sign extend logic 1040 is used to sign extend a signed binary number so that it can be added or subtracted to another signed binary number of different bit-size. The LDSE control line controls the loading of a signed number into sign extend logic 1040 from register array bus 1038. The DRSE line drives the sign extended number to the result bus 1036.

Adder/subtracter 1042 adds or subtracts a binary number on the register array bus 1038 with a binary number on the result bus 1036. When enabled, the INVRES and INVRA control lines cause the data loaded into adder/subtracter 1042 from the result bus 1036 and register array bus 1038 to become negative. These control lines cannot be enabled at the same time. The LDADDER line latches the result of the addition/substraction from adder/subtracter 1042, and the DRADDERRES line will drive the result to the result bus 1036 while the DRADDERRA line drives the result to the register array bus 1038. The SIGN line provides address generation controller 1034 the sign of the result. SIGN=1 is a negative result, while SIGN=0 is a positive result. As reflected on the timing diagrams in FIGS. 108*a* and 108*b*, discussed below, the value on the SIGN line indicates certain conditions.

The temporary registers 1044 and 1047 are used to temporarily store data used in address generation operations. Data is loaded from the result bus 1036 to registers 1044 by the LDTEMP1 and LDTEMP2 lines, and is driven from these registers to the result bus by the DRTEMP1 and DRTEMP2 lines. Data is loaded from the result bus 1036 to register 1047 by the LDTEMP3 line, and is driven from this register to the result bus by the DRTEMP3 line.

When activated by the DR1 line, number generator 1048 drives a one to the result bus 1036, while when activated by the DRO line, a zero is driven to the result bus 1036. On the other hand, number generator 1049 drives a negative one to the register array bus 1038 when activated by the DRN1 control line.

Pull down transistors 1050 are used to drive zeros to particular bit locations in the 32-bit wide register array bus 1038. When data driven on the register array bus 1038 is not 32-bits wide, zeros are driven to the bit locations not containing data. The pull down transistors 1050 are selectively activated by the DRPD[5:0], DRPD[9:6], DRPD [15:8], DRPD[31:16] and DRPD[32] lines.

The PHI1 line supplies a clocking signal from the clocking controller (not shown) to the address generation controller 1034 for clocking its address generation operations. The start address generation line 1045 contains a start pulse from the register array 1032. This start pulse controls the start of the address generation controller 1034 operations. A start generator (not shown) generates the start pulse and sends it to the register array. A time period later the register array sends a pulse for starting the address generation controller 1034 and volume generation controller 1056 operations. See FIG. 109. Address generation controller 1034 then controls the start of the signal path's 1028 operations through the Start Signal Path control line. Next, the signal path 1028 controls the start of the accumulation logic 1034 through the Start Accumulation control line (see FIG. 116). In this manner, the sequence of all operations of synthesizer module 6 are goverened.

Loadable address incrementor 1035 is loaded with address S1 from register array bus 1038, when activated by control line LDSA, and increments this address by one to obtain address S2 when activated by control line LDAINC. Addresses S1 and S2 are loaded into the local memory control block 8, by the LADDIN control line, for fetching data samples S1 and S2 from local memory. Line 1051 connects loadable address incrementor 1035 to the upper two address bits contained in register SUAI to increase the address field of S1 and S2 by two bits. By increasing the address field by two bits, the address generator 1000 can address a total of 16 megabytes of memory instead of 4 megabytes.

Effects address buffer 1037 is a FIFO buffer which can store up to three effects addresses. An effects address is loaded from register array 1038 into the top of buffer 1037 when control line LDEA is activated. Line 1053 connects buffer 1037 to the upper two bits of register SUAI to increase the address field of the effects addresses by two bits.

Effects address and data buffer 1039 is also a FIFO buffer and stores up to five sets of an effects address and its associated effects data. Effects addresses are loaded into the top of the effects address and data buffer 1039 from the bottom of effects address buffer 1037, when the effects data associated with each effects address loaded in the effects address and data buffer 1039 is loaded from a register in the accumulation logic 1030 into the top of the buffer. Accumulation logic control line LDED controls the loading of the data. The effects addresses in effects data buffer 1039 are transferred from the bottom of this buffer into the local memory control block 8 when control line LADDIN is activated, while the effects data is transferred from the bottom of this buffer into the local memory control block when control line LDATIN is activated. The local memory control block 8 stores the effects data into local memory at the effects address.

The effects address and data buffers 1037 and 1039 permit eight delay-based effects to be generated consecutively. See U.S. Pat. Nos. 4,805,139 and 5,095,462 by Norris, which are incorporated herein by reference, for disclosure of suitable effects address and data buffers.

An LFO variation value generated by LFO generator 1021 is transferred from a register in the LFO generator (see FIG.

115) to register 1043 when LFO generator control line LDNFLFO is activated. Data indicating which voice the LFO variation value is associated with is loaded into address generation controller 1034 by the LFO Voice Match control line. The DRNFLFO line drives the LFO variation value from register 1043 onto the register array bus 1038. The value is stored in register SFLFOI. The address generator 1000 uses the LFO variation value for adding vibrato to a voice.

The LDADDFR line controls the loading of the ADDfr value (data used during interpolation), stored in the SYNTH Address Registers, from the register array bus 1038 to buffer 1041. Signal path 1028 control line DRADDFR drives this value to the signal path. See also FIG. 117. Buffer 1041 can store up to two ADDfr values. When a particular voice is inactive, buffer 1041 will only store one ADDfr value. The LDBUF control line from signal path 1028 pushes this one value to the bottom of the buffer 1041 so that it can be driven to the signal path when the DRADDFR control line is activated.

FIGS. 108*a* and 108*b* are timing diagrams for different modes of address generation operation. FIG. 108*b* is the timing diagram for the boundary mirror mode which occurs when bit ENH of register SGMI, bit ENPCM of register SVCI, and bit LPE of register SACI are all set to one, and bits BLEN and DIR of register SACI are set to zero. FIG. 108*a* is the timing diagram for all other modes of address generation. These timing diagrams set forth the operations performed by the address generator 1000 during each clock cycle, of its set of twelve clock cycles, in a particular mode. These timing diagrams are arranged in columns to indicate for each of the twelve clock cycles (i) what data is on the result and register array buses; (ii) what, if any, arithmetic operations are being performed on the data; (iii) what other operations are being performed; and (iv) the equation for which the arithmetic operation is being performed. The "equation" and "comments" columns reflect the general operations performed by the address generator 1000 in connection with address generation. The "18s" and "34s" in the operations column indicate if the bit width of the result of the operation is an 18-bit or 34-bit signed number.

2. Volume Generator

Figure 109A:
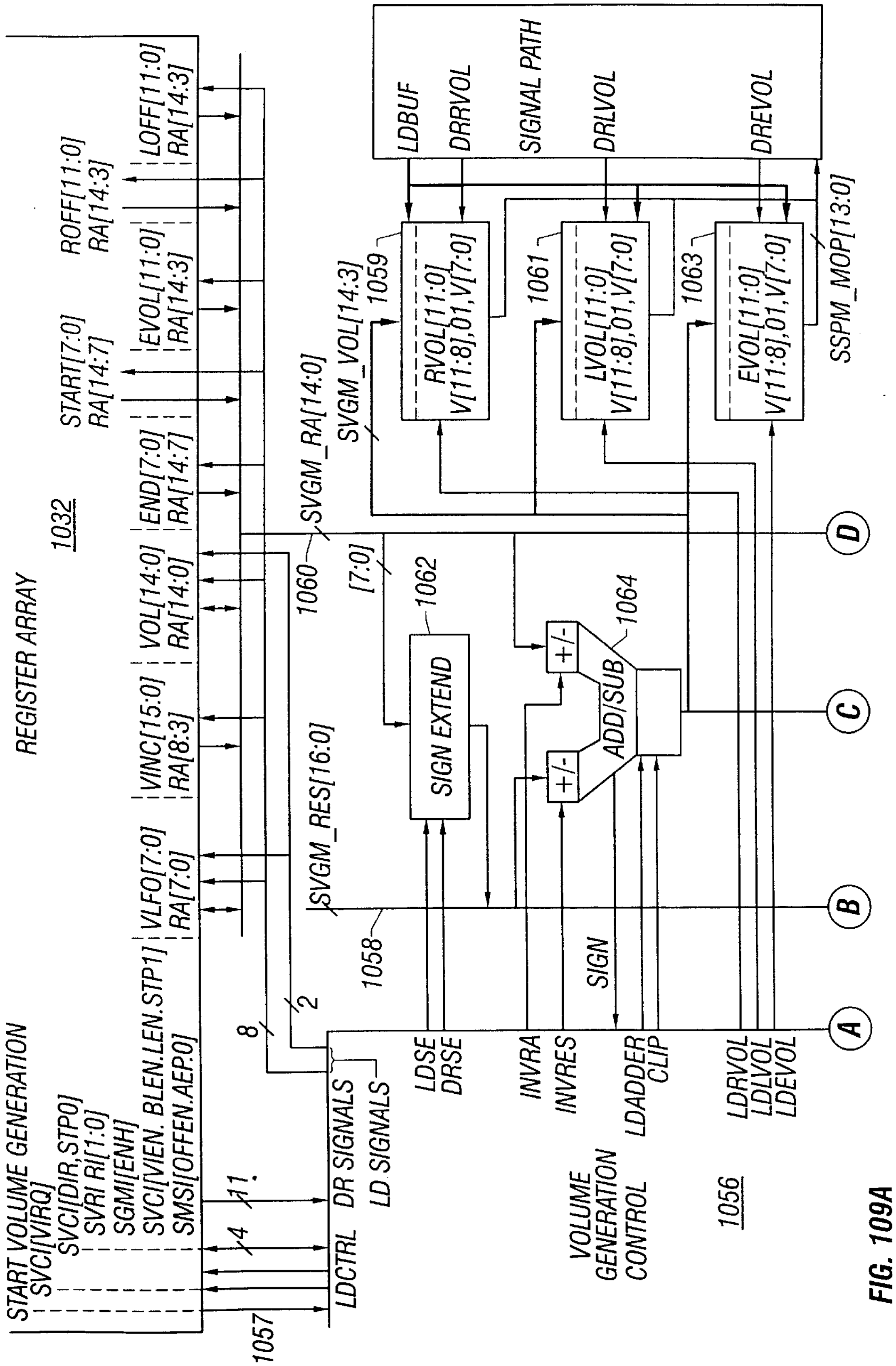
FIGS. 109*a*, 109*b* and 109*c*, generally referred to herein as FIG. 109, illustrate is an architectural diagram of a volume controller of the synthesizer module of the present invention.
Figure 109B:
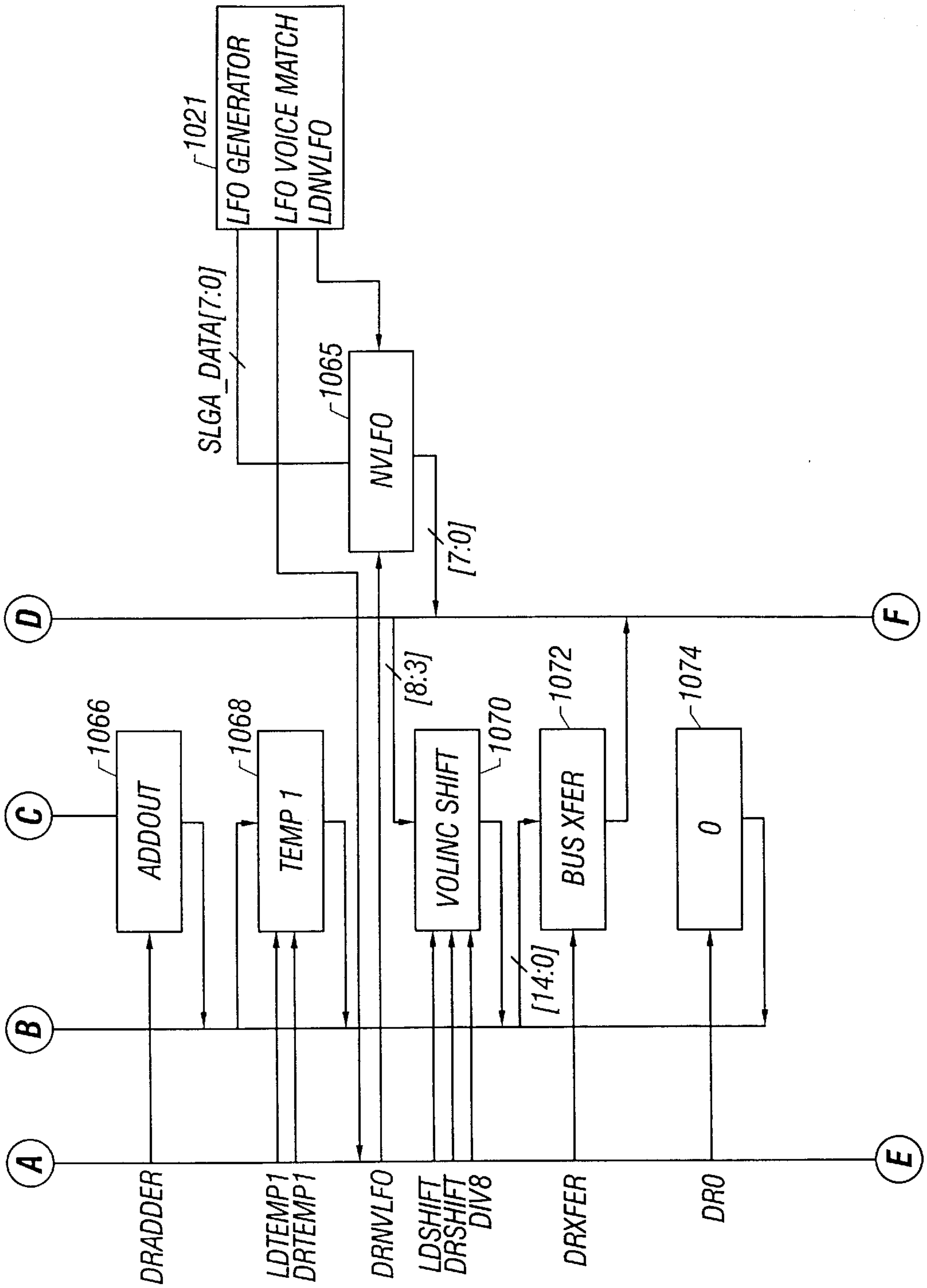
Figure 109C:
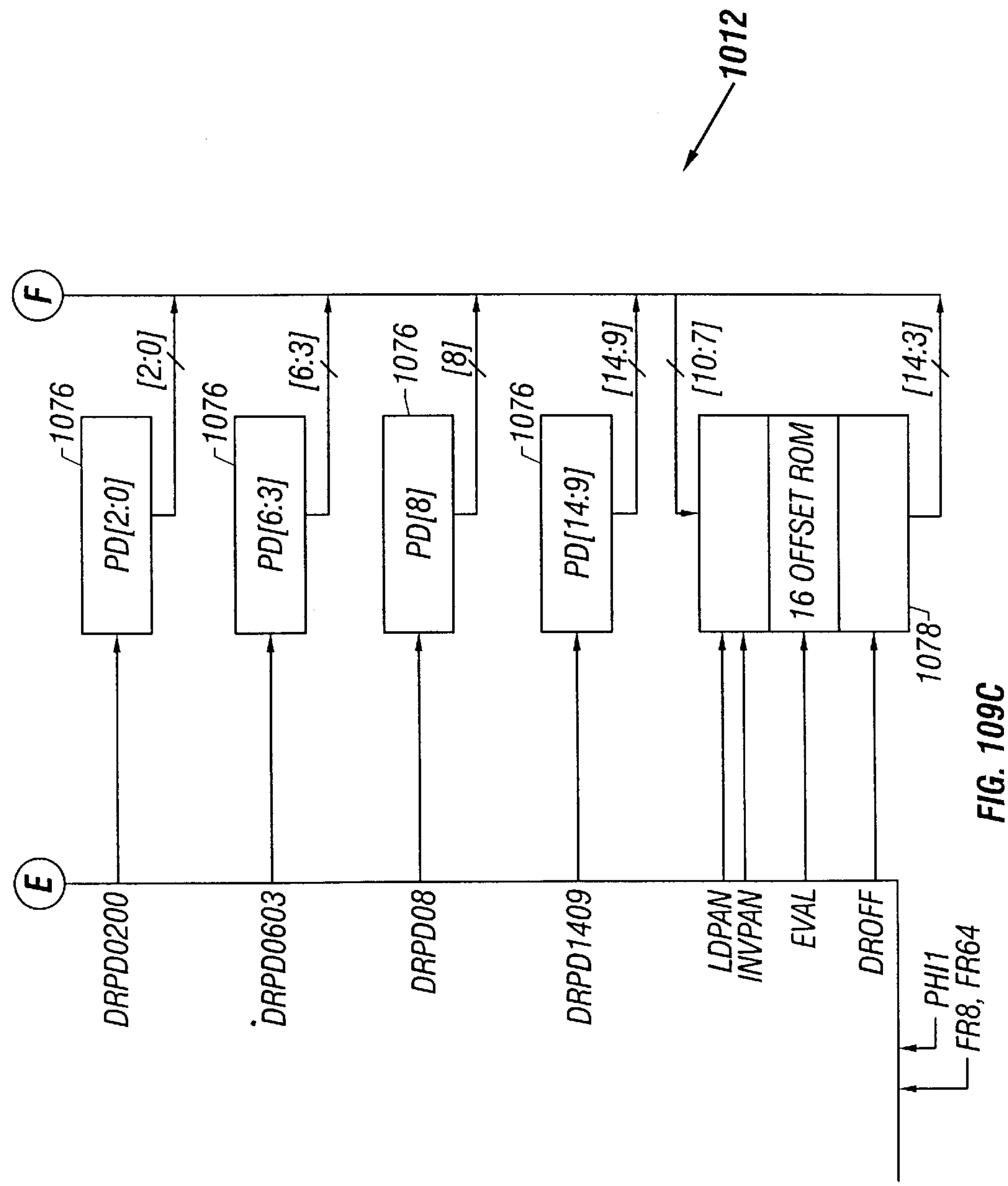

FIG. 109 illustrates volume generator 1012, and its connections to synthesizer register array 1032, LFO generator 1021, and signal path 1028. Volume generator 1012 includes: a volume generation controller 1056; a result bus 1058; a register array bus 1060; sign extend logic 1062; an adder/subtracter 1064; bus driver logic 1066; a temporary register 1068; shift logic 1070; bus transfer logic 1072; a number generator 1074; pull down transistors 1076; a ROM 1078; right, left, and effects volume buffers 1059, 1061, and 1063; LFO variation register 1065; clocking lines PHI1 and FR8, FR64; and a start volume generation line 1057.

As illustrated, sign extend logic 1062, adder/subtracter 1064, shift logic 1070, and bus transfer logic 1072 are connected to both the result bus 1058 and the register array bus 1060, as well as to the volume generation controller 1056. Temporary register 1068 and number generator 1074 are connected to the result bus 1058 and volume generation controller 1056, while pull down transistors 1076 and ROM 1078 are connected to register array bus 1060 and the volume generation controller. Shift logic 1070 is connected to result bus 1058 and right, left and effects volume buffers 1059, 1061, and 1063, as well as to volume generation controller 1056.

The LFO variation register 1065 is connected to the register array bus 1060 and to the volume generation controller 1056. The LFO variation register 1065 is also connected to a register and the LDNVLFO control line of LFO generator 1021. See FIG. 115. LFO generator control line LFO Voice Match connects to the volume generation controller 1056.

Besides being connected to bus driver logic 1066, right, left and effects buffers 1059, 1061 and 1063 are connected to multiplier 1102 of signal path 1028 (see FIG. 116), signal path control lines LDBUF, DRRVOL, DRLVOL, and DREVOL, and volume generation controller control lines LDRVOL, LDLVOL, and LDEVOL. Right volume buffer 1059 stores up to two right volume values, left volume buffer 1061 stores up to two left volume values, and effects volume buffer 1063 stores up to two effects volume values.

Through the various control lines, volume generation controller 1056 controls all of the circuit elements of volume generator 1012 connected to it. The function of these control lines is discussed below.

Volume generation controller 1056 is connected to the following synthesizer registers in register array 1032: SVCI, SVRI, SGMI, SMSI, SVSI, SVEI, SVRI, SVLFOI, SROI, SLOI, SEVI. The following bits of some of these synthesizer registers are connected to volume generation controller 1056 through load control lines (LDCTRL): SVRI [1:0], SGMI [ENH], SVCI [VIEN, BLEN, LEN, STP1], and SMSI [OFFEN, AEP, 0]. These bits set the volume generation controller's mode of volume generation. On the other hand, the following bits of some of these registers can be modified by volume generation controller 1056, through the LDCTRL lines, to set an interrupt condition, set the direction of the volume (increasing or decreasing), stop volume generation when a boundary is crossed, or stop volume looping: SVCI [VIRQ] and SVCI[DIR, STP0].

The following of these synthesizer registers store specific parameters of volume generation:

| | |
|---|---|
| SVSI | Stores volume START information |
| SVEI | Stores volume END information |
| SVLI | Stores volume level (VOL) information |
| SVRI | Stores volume rate (VINC) information |
| SVLFOI | Stores volume LFO value (VLFO) information |
| SLOI | Stores left offset (LOFF) information |
| SROI | Stores right offset (ROFF) information |
| SEVI | Stores effects volume (EVOL) information |

The volume parameters stored in these registers are driven to the register array bus 1060 by load and drive register signals lines (DR SIGNALS, LD SIGNALS).

Sign extend logic 1062 is used to sign extend a signed binary number so that it can be added or subtracted to another signed binary number of different bit-size. The LDSE control line controls the loading of a signed number into sign extend logic 1062 from register array bus 1060. The DRSE line drives the sign extended number to the result bus 1058.

Adder/subtracter 1064 adds or subtracts a binary number on the register array bus 1060 with a binary number on the result bus 1058. When enabled, INVRA and INVRES control lines respectively cause the data loaded into adder/subtracter 1064 from the register array bus 1060 and result bus 1058 to become negative. These control lines cannot be enabled at the same time. The LDADDER line latches the result of the addition/subtraction from adder/subtracter. The DRADDER line drives the result from bus driver logic 1066 on to the result bus 1058. The SIGN line provides volume generation controller 1056 the sign of the result. SIGN=1 is a negative result, while SIGN=0 is a positive result. As reflected on the timing diagram in FIG. 110, discussed below, the value on the SIGN line indicates certain conditions. The CLIP line controls the clipping of the volume value when it reaches a maximum value and a minimum value. If bit 16 of the result of the addition/subtraction is a one, then the result is less than the minimum permitted value and a zero is output from adder/subtracter 1064. If bit 15 of the result of the addition/subtraction is a one and bit 16 is a zero, then the result is more than the maximum value permitted and the binary equivalent of 32,767 is output from adder/subtracter 1064. If bits 15 and 16 are zero, then the result of the addition/subtraction is between the minimum and maximum, and the result is output from adder/subtracter 1064. The clipping of the volume value when it reaches zero ensures that result does not become negative.

The right, left and effects volumes are loaded into right, left and effects buffers 1059, 1061, and 1063, respectively, after their calculation, by control lines LDRVOL, LDLVOL, and LDEVOL. When a particular voice is inactive, buffers 1059, 1061, and 1063 will only store one value each. The LDBUF control line from signal path 1028 pushes the one value in each of the buffers 1059, 1061, and 1063 to the bottom of the buffers so that they can be driven to the signal path when signal path control lines DRRVOL, DRLVOL, and DREVOL are activated.

The temporary register 1068 is used to temporarily store data used in volume generation applications. Data is loaded from the result bus 1058 to register 1068 by the LDTEMP1 line, and is driven from the register to the result bus by the DRTEMP1 line.

Shift logic 1070 shifts data loaded into it three bits right, thereby in effect dividing the data by eight. Shift logic 1070 is used to prevent volume increment steps greater than seven at slower rates of volume increment. The LDSHFT and DRSHFT lines respectively load and drive data to and from shift logic 1070. The DIV8 line enables the bit shifting.

When enabled, bus transfer logic 1072 transfers data from the result bus 1058 to the register array bus 1060. This bus transfer is enabled by the DRXFER line.

When activated by the DRO line, number generator 1074 drives a zero to the result bus 1058.

Pull down transistors 1076 serve the same purpose as pull down transistors 1050 in the address generator 1000. Pull down transistors 1076 are selectively activated by the DRPD0200, DRPD0603, DRPD08, and DRPD1409 lines.

Dynamic ROM 1078 stores left offset and right offset values for placing a voice in one of sixteen evenly spaced stereo positions. The LDPAN line loads into ROM 1078 4-bits of data from SROI [11:8] which represent the desired pan position. The DROFF line drives 2×12-bits of data, representing a left offset or right offset value, from ROM 1078 to the register array bus 1060. The INVPAN line controls whether ROM 1078 outputs a left offset value or a right offset value. The EVAL control line evaluates the ROM with the present data inputs.

As LFO variation value generated by LFO generator 1021 is transferred from a register in the LFO generator (see FIG. 115) to register 1065 when LFO generator control line LDNVLFO is activated. Data indicating which voice the LFO variation value is associated with is loaded into volume generation controller 1056 by the LFO Voice Match control line. The DRNVLFO line drives the LFO variation value from register 1065 onto register array bus 1060. This value is stored in register SVLFOI. The volume generator 1012 uses the LFO variation value for adding tremolo to a voice. The PHI1 line supplies a clocking signal from the clocking controller (not shown) to the volume generation controller 1056 for clocking its volume generation operations. The FR8, FR64 lines also supply clocking signals from the clocking controller to the volume generation controller 1056, but these clocking signals provide the timing specifically for incrementing the volume every 8 frames and every 64 frames. The start volume generation line 1057 controls the start of the volume generation controller 1056 operations.

FIG. 110 is a timing diagram which sets forth the operations performed by the volume generator 1012 during each clock cycle of its set twelve clock cycles. FIG. 110 is arranged in columns to indicate for each of the twelve clock cycles: (i) what data is on the result and register array buses; (ii) what, if any, arithmetic operations are being performed; (iii) what other operations are being performed; and (iv) the equations for which the arithmetic operations are being performed. The "equation" and "comments" columns reflect the general operations performed by the volume generator 1012 in connection with volume generation. The "17s" and 15u" in the operations column indicate whether the result of the operation is a 17-bit signed number or a 15-bit unsigned number.

3. Register Array

Figure 111:
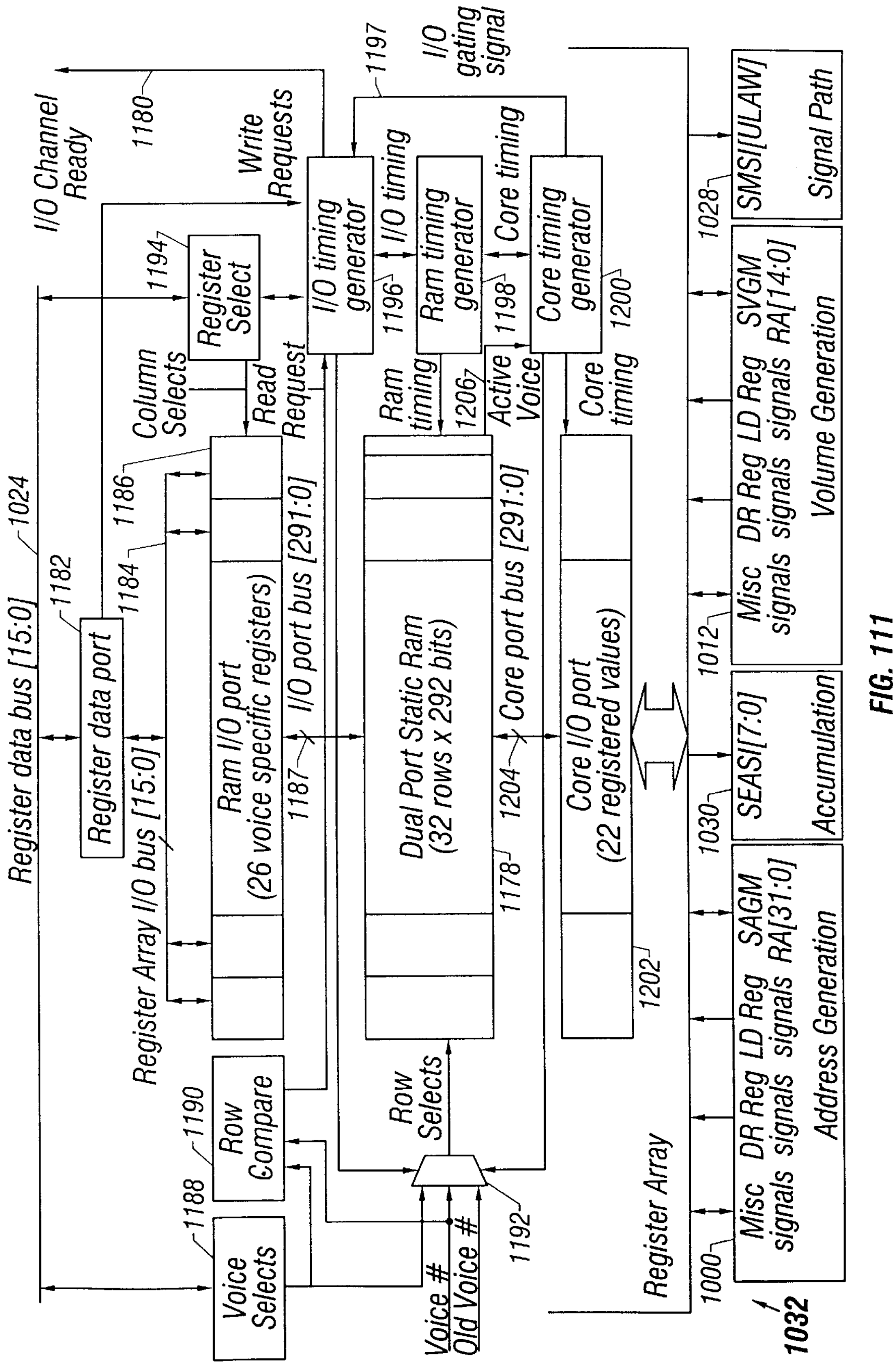
FIG. 111 is an architectural drawing of the register array of the synthesizer module of the present invention.

FIG. 111 illustrates the architecture for register array 1032 and its connections to register data bus 1024, I/O channel ready 1180, address generator 1000, volume generator 1012, accumulation logic 1030, and signal path 1028. Register array 1032 includes: a dual port static RAM 1178; register data port 1182; register array I/O bus 1184; RAM I/O port 1186; I/O port bus 1187; voice select register 1188; row compare circuitry 1190; row select circuitry 1192; register select register 1194; I/O read write timing generator 1196; dual port RAM timing generator 1198; synthesizer core read/write timing generator 1200; core I/O port 1202; and core port bus 1204.

In order to process a voice, the four synthesizer core blocks, address generator 1000, accumulation logic 1030, volume generator 1012, and signal path 1028 need voice specific parameters programmed by the system microprocessor. At the beginning of processing of a voice, the full length of the dual port static RAM 1178 is read. The results of the read will be held during voice processing in read buffers in the core I/O port 1202. The core blocks 1000, 1030, 1012, and 1028 will access the read values during various stages of processing. Also, during stages of processing, the core blocks will place values in core I/O port 1202 write buffers. After voice processing is completed, the write buffer's data will be written back into the dual port static RAM 1178. The complete cycle from read to write takes longer than a voice's processing so RAM cycles for voices overlap. This means that the write buffers in the core I/O port 1202 contain values from the previous voice while the read buffers contain data for an upcoming voice.

A core read/write timing generator 1200 generates the overlapping timing needed to update the four synthesizer core blocks 1000, 1030, 1012, and 1028. It drives the dual port RAM timing generator 1198 that directly drives the dual port static RAM 1178. The row select circuitry 1192 uses the voice number as input for the read and the old voice number as input for the write.

During sound generation, the parameters of a voice need to be modified or examined to allow the system microprocessor to generate sounds. The system microprocessor can read and write the dual port RAM 1178 over the register data bus 1024. From the register I/O side, the dual port RAM 1178 is organized as 32 voices (rows) of 26 voice specific registers. To access one of the 26 voice specific registers for a voice, the system microprocessor first writes to the voice select register 1188. This selects one of the 32 voice register rows. Then the system microprocessor will write to the register select register 1194. This selects one of the 26 voice specific registers to access. Lastly, the data is read from or written to a 16 bit register data port register 1182. Register select register 1194 includes a counter which enables it to auto-increment. When SVSR[AI] is set to one, register select register 1194 automatically increments the current value in the register whenever data is written to register data port register 1182. RAM I/O port 1186 serves as an interface between the system microprocessor and dual port RAM 1178. Register data is latched in RAM I/O port 1186 for system reads of dual port RAM 1178 but not for writes to the dual port RAM.

In order not to disturb the operation of the four synthesizer core blocks 1000, 1030, 1012, and 1028, the system microprocessor's access time must fit into the idle time of the dual port RAM 1178. Also to keep a write from the system microprocessor from being over-written by synthesizer core writes which occur after voice processing, the system microprocessor writes to a voice must wait until after that voice's write has occurred. They cannot occur between the read of the voice and the write of the voice. The first criteria is met by gating the I/O read/write timing generator 1196 with an I/O gating signal 1197 from the core read/write timing generator 1200. This ensures that the system microprocessor accesses occur during idle time of the dual port RAM 1178. To keep the system microprocessor's writes from being over-written, the voice select register's output and the voice number are compared by row compare circuitry 1190. If they are equal, then the I/O read/write timing generator's 1196 outputs are gated. To force the system microprocessor to wait for access, the I/O channel ready signal on line 1180 is used. I/O channel ready is an ISA specification signal used in all PC systems to lengthen the I/O cycles of a system microprocessor.

In order to speed up the I/O cycles of the dual port RAM 1178, writes are buffered. This means that the system microprocessor can write once to the dual port RAM 1178 and the data will be held in the 16 bit register data port 1182 waiting for access to the dual port RAM. If a second write is attempted, then the I/O channel ready signal on line 1180 will be used to lengthen the I/O cycle. The write to the 16 bit register data port 1182 triggers the eventual write to the dual port RAM 1178. To quicken the read I/O.cycle, different register select values are used for writes than for reads. This allows a write to the register select register 1194 to trigger a read cycle. I/O channel ready is only used if the dual port RAM 1178 can not get the data to the 16 bit register data port 1182 before the system microprocessor reads the 16 bit register data port.

During a read of a register contained within the dual port RAM 1178, only the sense amplifiers associated with that register column are enabled. The rest of the columns in the dual port RAM 1178 go through a normal read cycle but will not get evaluated by a sense amplifier. This will save some power and possibly will result in less noise for the analog portions of the PC audio integrated circuit. During a write to a register contained within the dual port RAM 1178, only the column associated with the register is driven. Once again, the rest of the columns go through a normal read cycle. This allows only the column selected to be modified.

At start up, the values in the dual port RAM 1178 must be initialized. This is accomplished by going through all 32 voice selects while forcing the initial values on all columns from the core I/O port 1202.

When a voice is inactive, processing for that voice does not occur. This saves power and simplifies programming. If the bit which determines whether a particular voice is active is contained within the register array, the dual port RAM needs to be read to determine if that voice is active. To save the power used to read the dual port RAM, in the present invention the bit which determines if a voice is active is placed at the edge of the dual port RAM on line 1206. Each of the edge RAM cells of dual port RAM 1178 have an additional output which can be examined on line 1206, at the beginning of a voice cycle, to determine if a voice is active and if the dual port RAM should be read.

Figure 112:
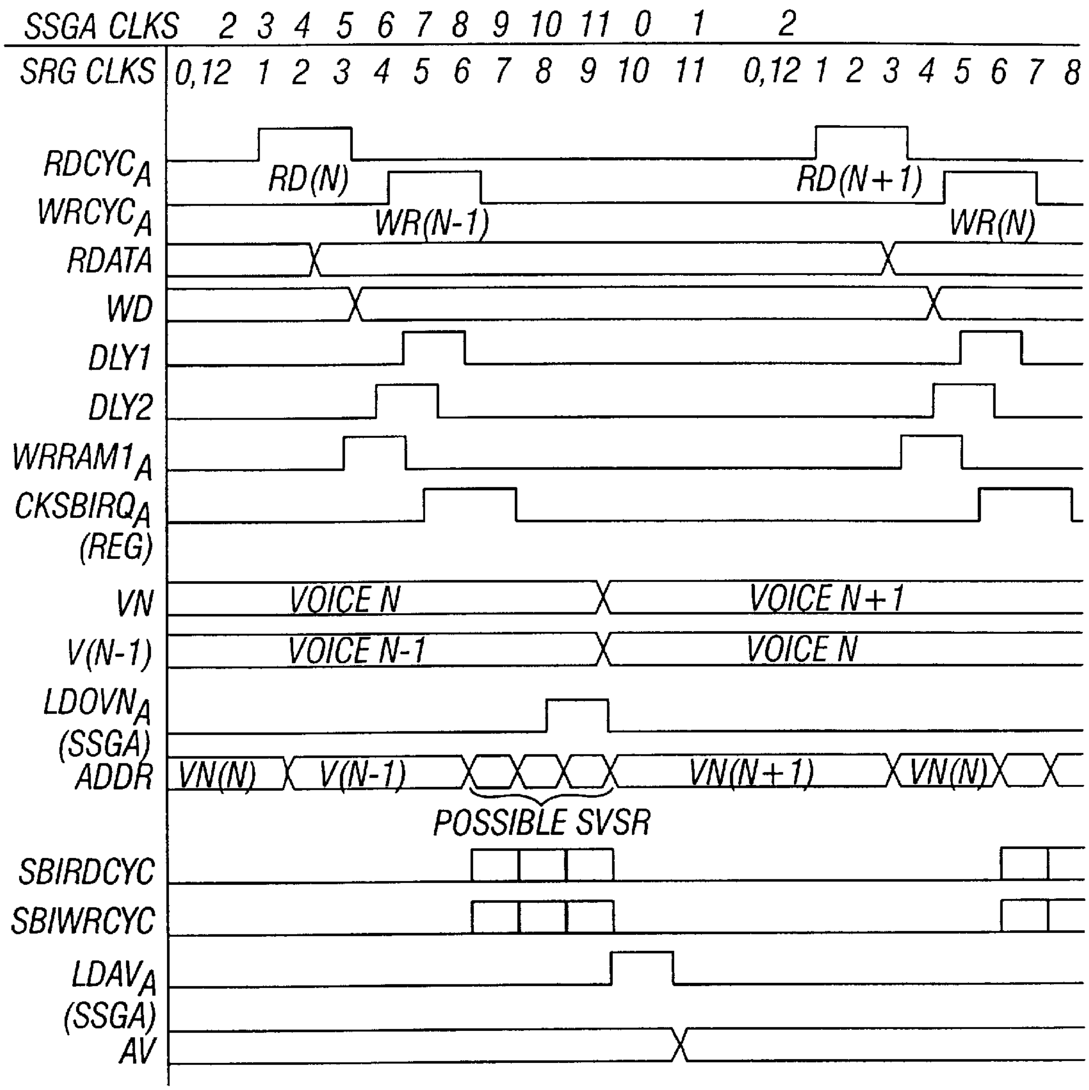

FIG. 112 illustrates a timing chart for the register array 1032 operations. The operations/signals referenced in the left column of FIG. 112 are as follows:

| | |
|---|---|
| SSGA CLKS | Start generator clocking. |
| SRG CLKS | State machine clock status 0–11 (12 clocks per voice). |
| RD CYC | Read cycle of dual port RAM from the synthesizer core. |
| WR CYC | Write cycle of dual port RAM. RD(N) denotes a read for present voice. WR(N-1) denotes a write for previous voice from the synthesizer core. |
| RDATA | Read data output from dual port RAM. |
| WD | Write data input to dual port RAM. |
| DLY1, DLY2 | Used to delay signals to match proper timing of associated logic. |
| WRRAM1 | Write buffer timing. |
| CKSBIRQ | Gating signal (check for system bus interface request). |
| VN | Voice number. |
| VN(N-1) | Old voice number. |
| LDOVN | Load old voice number. |
| ADDR | Row selects address bus. |

-continued

| | |
|---|---|
| SBIROCYC, SBIWRCYC | System bus interface write and read cycle. |
| LOAV | Load active voice. |
| AV | Active voice bus. |

As is illustrated in FIG. 113, core I/O port 1202 contains an incrementor 1208 and comparator 1210 connected to current value registers 1212 and final value registers 1214 in the dual port static RAM 1178, by paths 1216, 1218 and 1220 which are included in the core port bus (not shown). The synthesizer core blocks are also connected to the dual port RAM 1178 through path 1220. This architecture is used to control the incrementing/decrementing of the overall volume.

The current value in registers 1212 is the value that the volume generator will use to add volume to the synthesizer module's output. The final value in registers 1214 is the value the current value will be equal to after incrementing or decrementing over several sample frames.

In a first mode of operation, the current value is incremented or decremented by incrementor 1208 closer to the final value. In this mode, the system microprocessor will write the final value to the final value register 1214. When a voice is processed, the current value and the final value will be compared by comparator 1210 to determine if the current value is less than, greater than, or equal to the final value. The current value from register 1212 is loaded into incrementor 1208 by path 1218, into comparator 1210 by path 1220, and sent to the synthesizer core blocks also by path 1220. The final value from registers 1214 is loaded into comparator 1210 by path 1222.

The current value loaded into incrementor 1208 is incremented or decremented by one, or remains the same, depending on the comparison of the current value and final value made by comparator 1210. If the current value is less than the final value, the incrementor receives a one from comparator 1210 on control lines 1226 and 1224, and increments the current value by one. If the current value is greater than the final value, incrementor receives a zero on control line 1226 and a one on control line 1224, and decrements the current value by one. If the current value is the same as the final value, incrementor 1208 receives a zero on control line 1224 and does not increment or decrement the current value.

At the end of a voice's processing, the current value as updated by incrementor 1208 is written back, through path 1216, into the current value registers 1212 of dual port RAM 1178. The next time this voice is processed, the comparison will again by made and the current value will be moved one more increment or decrement closer to the final value.

In a second mode of operation, the current value needs to be changed immediately. This can be accomplished by writing the same value to both the current and the final value registers 1212 and 1214.

A third mode is needed for compatibility with Ultrasound's wavetable synthesizer so that the Ultrasound's PAN value held in the SROI register will not increment. In this mode, bit OFFEN of register SMSI will be used to disable the increment and decrement of the current value.

The current value registers are SROI, LROI and SEVI, while the final value registers are SROFI, SLGFI and SEVFI.

FIG. 114*a* is a logic diagram which illustrates the preferred layout of comparator 1210. FIG. 114*b* is a timing chart associated with the logic diagram of FIG. 114*a*. The comparator 1210 compares the current and final value to determine if one value is greater than, less than or equal to the other value. Comparator 1210 is a static type comparator.

Comparator 1210 first compares the MSB of the current and final values, V1 and V2, and then, if necessary to determine if the values are equal or if one value is greater than or less than the other value, continues to compare each bit position until the LSB is compared. The comparison of the MSB position is in the left stage (or cell) 1228 of the circuit illustrated in FIG. 114*a*, while the comparison of the MSB-1 position is in the middle stage 1230 of the illustrated circuit and the comparison of the LSB position is in the right stage 1232 of the illustrated circuit. Since the current and final values being compared are twelve-bits, comparator 1210 requires twelve comparison stages (or cells), but only three stages (or cells) are illustrated in FIG. 114*a* for simplicity purposes.

Starting with the MSB, the current and final values, V1 and V2, are compared to determined the most significant difference. The bit values for each bit position of the current and final values, V1 and V2, are input on lines 1236 and 1234, respectively, in each stage. The signal DIFF, on line 1238, is a one when a difference between the input bits occurs. DIFF equal to one will break the carry chain by turning off a CMOS transfer gate 1240 and pulling down the output with a single NMOS transistor 1242. The carry chain is formed by the CMOS transfer gates 1240 that allow voltage VCC (i.e., a value of one) to flow from left to right. The carry chain determines the most significant difference by detecting how far the one at the input to the carry chain has propagated.

Each bit comparison stage has a NAND gate 1244 that has as its input the carry input for its cell (signal DIFF). EVAL is a timing signal that does not go high until the carry chain has settled. When EVAL goes high, a CMOS transfer gate 1246 in the stage with the most significant difference will drive a one onto line 1248, if the bit comparison has determined that V1 is less than V2, or a zero if V1 is greater than V2. If V1 and V2 are equal, the carry chain will propagate a one through its entire length.

The signal at the end of the carry chain, on line 1250, is ANDed with EVAL, by NAND gate 1252, to generate the signal on line EQ. Signal NEQ, the compliment to the signal on line EQ, is an input to NAND gates 1254 and 1256. NAND gate 1254 also has as its inputs the EVAL timing signal and the signal on line 1248. NAND gate 1256 also has as its inputs the EVAL timing signal and the output from NAND gate 1254. NAND gates 1254 and 1256 respectively output the signals on lines LT and GT. Signal NEQ keeps the NAND gates 1254 and 1256 from burning power when V2 and V1 are equal. When V1 and V2 are equal, line 1248 floats. LT equals a one when V1 is less than V2, GT equals a one when V1 is greater than V2, and EQ equals a one when V1 and V2 are equal.

Comparator 1210 is an improvement over prior art comparators which use adders. Since comparator 1210 does not use adders, it is smaller and uses less power than comparators that use adders. Comparator 1210 also makes determinations about the values being compared that are believed to be unattainable in one-circuit static type comparators. Comparator 1210 determines if the values are less than or greater than one another or are equal. It is believed that prior art static type comparators can only determine in one circuit either: (i) if the values are equal; or (ii) if one value is greater than the other value, or one value is less than or equal to the other value.

4. LFO Generator

FIG. 115 illustrates the architecture for LFO generator 1021 and its connections LDATOUT and LDATIN to the local memory control module. LFO generator 1021 includes: LFO generator controller 1148; data buffer 1150; registers 1152, 1154 and 1156; number generator 1158; adder 1160; comparator 1162; and register 1166. LFO generator controller 1048 is connected to each of these circuit elements by various control lines. The function of these control lines is discussed below.

As illustrated, data lines LDATOUT and LDATIN from the local memory control module are connected to data buffer 1150. Data buffer 1150 also has connections to registers 1152, 1154 and 1156, as well as to accumulator 1164. Registers 1152, 1154 and 1156 are connected to data buffer 1150 and to adder 1160. Number generator 1158 is connected to adder 1160. Adder 1160 is connected to comparator 1162, register 1166, and to accumulator 1164 by paths 1168 and 1174. Comparator 1162 is connected to adder 1160. Accumulator 1164 is connected to adder 1160 by paths 1174 and 1168, to register 1166 by path 1170, and to data buffer 1150 by path 1172. Register 1166 is connected to accumulator 1164 by path 1170.

As discussed above, various parameters for each LFO are stored in local memory. These parameters are loaded into data buffer 1150 from local memory on line LDATOUT. The local memory control module (not shown) controls the loading of the data into data buffer 1150 by control line LLFORD_L. Data in data buffer 1150 is written to local memory by control line LLFOWR_L. The local memory control module controls the driving of data from data buffer 1150 onto line LDATIN by control line LLFOWR_L. Bits 14 and 15 from data buffer 1150 determine the quadrant of the LFO waveform and are sent to LFO generator controller 1148.

Data from data buffer 1150 is loaded into registers 1152 and 1154 by respective control lines LDCTRL and LDMC, and data is driven from these registers to adder 1160 by respective control lines DRCTRL and DRMC. Data from data buffer 1150 is loaded into register 1156 by control line LDMP. Data in register 1156 may be shifted right by simultaneously activating the DRMP and SHFTMP control lines. All the bits in register 1156 are driven to adder 1160 when control line DRMP is activated, while the 8 MSBs are driven when control line DRMPHI is activated and the 8 LSBs are driven when control line DRMPLO is activated.

Number generator 1158 drives a zero to adder 1160 when control line DRZEROB is enabled.

Adder 1160 adds a binary number from its A input with a binary number on its B input. The INVA control line will cause the A input to become negative while the INVB line will cause the B input to become negative. These control lines cannot be enabled at the same time. When control line ZEROA is enabled, the A input is zero. The A input is either a zero or the value from path 1168. The B input is the value on path 1176.

The output of adder 1160 can be sent to comparator 1162 and to accumulator 1164. The output data is loaded into the comparator 1162 when control line LDCMP is activated. Comparator 1162 determines whether the output value is negative or positive, and depending on this determination, sends a signal to LFO generator controller 1148 on the SLGM_ZERO or SLGM_NEG line. Accumulator 1164 is loaded with the adder 1160 output data when control line LDACC is enabled. The data is shifted right by accumulator 1164 when control lines LDACC and SHFTACC are simultaneously activated.

The data in accumulator 1164 can be sent along path 1172 to data buffer 1150. Control line LLRORD_L controls the loading of this data into data buffer 1150. The data from accumulator 1164 can also be sent to register 1166. Control line LDOFF controls the loading of this data in register 1166. Register 1166 also contains data on lines SSGA_LN and SSGA_LT from the start generator which respectively indicate the LFO number being processed and whether the data is destined for the volume generator 1012 or the address generator 1000.

The data in register 1166 travels on line SLGM_DATA and is either loaded into register 1043 of address generator 1000 (see FIG. 107) or register 1065 of volume generator 1012 (see FIG. 109). Register 1166 sends data on lines SLGM_LNUM and SLGM_LTYPE to LFO generator controller 1148 which respectively indicate the number of the LFO being processed and whether the register data is destined for the volume generator 1012 or address generator 1000. Control lines LDNFLFO and LDNVLFO control whether the data is loaded into register 1043 or 1065. The LFO Voice Match control line indicates to the address generator 1000 (see FIG. 107) and the volume generator 1012 (see FIG. 109) the number of the voice associated with the LFO being processed.

The PH1 line supplies a clocking signal from the clocking controller (not shown) to the LFO generation controller 1148 for clocking its operations. The SSGA_FSYNC line supplies a start pulse to start the LFO generation controller 1148 operations. The signal on line SGMI_GLFOE comes from register SGMI and indicates whether all the LFOs are enabled.

5. Signal Path

FIG. 116 illustrates signal path 1028 and its connections to local memory control module 8, volume generator 1012, address generator 1000, and accumulation logic 1030. Signal path 1028 includes: signal path controller 1080; A and B buses 1082 and 1084; number generator 1088; adder/subtracter 1090; S, S1, and latch registers 1092, 1096, and 1098; data buffer 1104; shift logic 1094; bus transfer logic 1100; multiplier and operand buses 1086 and 1087; multiplier 1102; temporary register 1112; and ROUT, LOUT, and EOUT registers 1114, 1116, and 1118.

As illustrated, in the top half of FIG. 116: number generator 1088 is connected to adder/subtracter 1090 and B bus 1084; adder/subtractor 1090 is connected to number generator 1088, A and B buses 1082 and 1084, and shift logic 1094; S register 1092 has connections to A bus 1082 and a connection to shift logic 1094; shift logic 1094 is connected to adder/subtracter 1090, S register 1092, latch register 1098 and S1 register 1096; S1 register 1096 is connected to shift logic 1094 and B bus 1084; latch register 1098 is connected to shift logic 1094, S1 register 1096 and A bus 1082; and data buffer 1104 is connected to A bus 1082 and local memory control module 8. Number generator 1088; adder/subtracter 1090; S, S1, and latch registers 1092, 1096, and 1098; data buffer 1040; and shift logic 1094 are also connected to signal path controller 1084 through various control lines discussed below.

As illustrated in the bottom half of FIG. 116: multiplier 1102 is connected to multiplier bus 1086, volume generator 1012 and address generator 1000; temporary register 1112 is connected to the multiplier bus 1086; and the ROUT, LOUT, and EOUT registers 1114, 1116 and 1118 are connected to the multiplier bus 1086 and accumulation logic 1030. In addition, the ROUT, LOUT, and EOUT registers are connected together at line 1106. The multiplier 1102 and registers 1112, 1114, 1116 and 1118 are also connected to signal path controller 1080 through various control lines discussed below.

Through various control lines, discussed below, signal path controller 1080 controls all the circuit elements of signal path 1028 connected to it. Through various other control lines, signal path controller 1080 is also connected to circuit elements outside of signal path 1028. The function of these control lines is also discussed below.

Bus transfer logic 1110 transfers data from the A bus to the multiplier bus and vice versa. Transfers up to the A bus are enabled by the DRXFERUP control line, while transfers down to the multiplier bus are enabled by the DRXFERDN control line.

The PHI1 line supplies a clocking signal from the clocking controller (not shown) to the signal path controller 1028 for clocking its signal path operations. The Start Signal Path line from Address Generator 1000 controls the start of the signal path controller 1028 operations. The Start Accumulation line controls the start of the accumulation logic 1030 operations.

The SMSI [ULAW] line is connected to bit ULAW of register SMSI. The setting of this bit controls whether signal path 1028 expands 8-bit $\mu$-Law data to 16-bit linear data before the data is interpolated.

Depending on whether control line DR0 or DR33 is activated, number generator 1088 drives a binary zero or a thirty-three to adder/subtracter 1090.

Adder/subtracter 1090 adds or subtracts a binary number on the A bus 1082 with either a binary number on the B bus 1084 or a binary thirty-three or zero from number generator 1088. The INVA and INVB control lines respectively cause data loaded into adder/subtracter 1090 from A bus 1082 and B bus 1084 to become negative. These control lines cannot be enabled at the same time. The output of adder/subtracter is stored in shift logic 1094.

S register 1092 temporarily stores data. Line LDS loads data from A bus 1082 into the S register, while line DRULAW drives the data to the A bus on line 1108 and to shift logic 1094 on line YYY.

Shift logic 1094 shifts data stored in it. The lines SHYYY and SH2 respectively determine whether the data is shifted by: (i) the three-bit binary number on line YYY; or (ii) two-bits, for multiplying the data by four.

S1 register 1096 temporarily stores data from shift logic 1094. Line LDS1 loads data from shift logic 1094 into the S1 register, and DRS1 line drives data from the S1 register to the B bus 1084.

Latch register 1098 also temporarily stores data. Line LDADDLAT loads data from shift logic 1094 into the latch register, and DRADDLAT line drives data from the latch register to the A bus 1082.

Control line DRDATA drives wavetable data from data buffer 1104 to the A bus 1082. This wavetable data is data the address generator 1000 addressed, and is loaded from the local memory control module 8 into data buffer 1104 by control line LDATOUT.

Multiplier 1102 multiplies data on the multiplier bus 1086 with data from volume generator 1012 or address generator 1000. The LDMULT line loads the data into the multiplier 1102, and the DRMULT line drives the result of the multiplication to the multiplier bus 1086. The volume generator data comes from the right, left and effects volume buffers 1059, 1061 and 1063, while the address generator data comes from the address fraction buffer 1041. The control lines DRRVOL, DRLVOL, DREVOL, and DRADDFR control which buffer's data is driven to multiplier 1102. The LDBUF control line is connected to buffer 1041 in address generator 1000, and buffers 1059, 1061, and 1063 in volume generator 1012, and ensures that data in these buffers is available to be driven to the signal path.

Temporary register 1112 temporarily stores data. The LDTEMP1 line loads data from multiplier bus 1086 into this register, while the DRTEMP1 line drives data from this register to the multiplier bus.

Registers ROUT 1114, LOUT 1116, and EOUT 1118 also temporarily store data. Data is loaded from the multiplier bus 1086 into these registers by the respective control lines LDROUT, LDLOUT and LDEOUT. As discussed below, data is driven from these registers to accumulation logic 1030 by control lines DRROUT, DRLOUT, and DREOUT. See also FIG. 118.

FIG. 117 is a timing diagram which sets forth the operations performed by the signal path 1028 during each clock cycle of its set twelve clock cycles. FIG. 117 is arranged in columns to indicate for each of the twelve clock cycles: (i) what data is on the multiplier, A, and B buses; (ii) what buffer (address fraction, right, left or effects volume) the multiplier's data is coming from; (iii) what, if any, arithmetic operations are being performed on the data; (iv) what other operations are being performed; and (v) the equation(s) for which the arithmetic operations are being performed. The "MULT equation" and "ADD/SUB equation" columns reflect the general operations performed by signal path 1028.

6. Accumulation Logic

FIG. 118 illustrates accumulation logic 1030 and its connections to address generator 1000, signal path 1028, and synthesizer DAC 512. Accumulation logic 1030 includes: accumulation controller 1120, number generator 1122, adder/subtracter 1126, and accumulation registers 1124.

As illustrated: number generator 1122 is connected to adder/subtracter 1126 by path 1132 and is connected to accumulation controller 1120 by control line DRO; signal path 1028 is connected to adder/subtracter 1126 by path 1134; adder/subtracter 1126 is connected to number generator 1122 by path 1132, to signal path 1028 by path 1134, and to accumulation registers 1124 by paths 1136 and 1138; and accumulation registers 1124 are connected to adder/subtracter 1126 by paths 1136 and 1138, to address generator 1000 by path 1128, to synthesizer DAC 512 by path 1130. Accumulation registers 1124 are connected to accumulation controller 1120 by the following control lines:

LDSHFT
DREACC7
DREACC6
DREACC5
DREACC4
DREACC3
DREACC2
DREACC1
DREACC0

Though its control lines, discussed in more detail below, accumulation controller 1120 controls all the circuit elements of accumulation logic 1030 connected to it. Through other control lines, accumulation controller 1120 is also connected to signal path 1028, register SEASI and address generator 1000. The function of these other control lines is also discussed below.

When enabled by the DRO control line, number generator 1122 drives a zero on path 1132 to adder/subtracter 1126.

Data from the ROUT, LOUT, and EOUT registers 1114, 1116, and 1118 in signal path 1028 is driven on signal path 1134 to adder/subtracter 1126. Control lines DRROUT, DRLOUT, and DREOUT determine which of these registers drives its data to adder/subtracter 1126.

Adder/subtracter 1126 adds data from paths 1132 or 1134 with the data on path 1138. The result of this addition is sent from adder/subtracter 1126 to accumulation registers 1124 on path 1136. When the sums exceed a maximum value, adder/subtracter 1126 clips the data instead of rolling over and changing sign.

Accumulation registers 1124 comprise ten 16-bit registers. Two of these registers accumulate the left and right output data. The remaining eight registers accumulate effects data. Enabling the LDSHFT control line causes two steps to occur: (i) data from path 1136 is loaded into the top register of accumulation registers 1124; and (ii) after this data is loaded, this data and the preexisting data in the other registers is shifted to the register below it, or in the case of the bottom register, the register is shifted to the top register. For example, if prior to shifting, the data is arranged as illustrated in FIG. 118, after shifting the data is arranged as follows:

| | |
|---|---|
| top register → | R. ACC. |
| | E. ACC. 7 |
| | E. ACC. 6 |
| | E. ACC. 5 |
| | E. ACC. 4 |
| | E. ACC. 3 |
| | E. ACC. 2 |
| | E. ACC. 1 |
| | E. ACC. 0 |
| bottom register → | L. ACC. |

Thus, the accumulation registers together serve as a 16-bit wide shift register. The data shifting ensures that the proper data is accumulated together and that the data is stored in the correct location.

For delay-based effects processing, when control line LDED is activated, data is transported on path 1128 from one of the top eight accumulations registers to effects data buffer 1039 in address generator 1000. As discussed above, eventually the effects data is sent, under the control of the local memory control module 8, to the wavetable, where it is written at an address generated by address generator 1000.

Under the control of the start generator and control line DRACC, the synthesizer module left and right output data is output in parallel format from accumulator registers 1124 on path 1130 to parallel to serial convertor 1019. The data is then sent serially to serial transfer control block 540, or serial to parallel convertor 1144 of the interface circuitry 1025. Serial to parallel convertor 1144 sends the data in parallel format to synthesizer DAC 512. The start generator (not shown) initiates the output of this data by sending a signal on the DRACC control line after all the possible number of voices in a frame are processed.

The lower three bits of the number of the voice being processed are sent on line 1142 to accumulation controller 1120. The accumulator controller 1120 uses these three bits to control which of the accumulation registers 1124 data should be written into.

Bits [7:0] of register SEASI are connected to accumulation controller 1120 by control line 1140. Based on the setting of these bits, accumulation controller 1120 controls which of the accumulation registers 1124 will receive particular effects data.

The PHI1 line supplies a clocking signal from the clocking controller (not shown) to accumulation controller 1120 for clocking its accumulation operations. The signal on the Start Accumulation line, from signal path 1028, controls the start of the accumulation controller 1120 operations.

FIG. 119 is a timing diagram which sets forth the operations performed by the accumulation logic 1030 during each clock cycle of its set twelve clock cycles. FIG. 119 is arranged in columns to indicate for each of the twelve clock cycles: (i) what data is being operated on; (ii) what arithmetic operations are being performed on the data; and (iii) the equation for which the arithmetic operations are being performed. The "equation" and "comments" columns reflect the general operations performed by accumulation logic 1030.

FIG. 120 is a timing diagram which sets forth the overall timing of the operations of the blocks in the synthesizer module, and the local memory control module. The timing diagram reflects, by column, the timing of the following synthesizer module blocks: start generator ("SSG"); register array ("SRG"); address generator ("SAG"); volume generator ("SVG"); signal path ("SSP"); and accumulation logic ("SAC"). The timing of the local memory control module ("LMC") is set forth in the last column.

The timing diagram illustrates the timing of the operations of the various blocks and the local memory control module starting from when the synthesizer module begins its operations at power-up, after reset, or after suspend. The operations in columns SRG and SSP marked with an asterisk (*) do not occur after reset or power up. In column SAC, the timing and operations have a different starting point depending on whether the synthesizer module is in the power-up/reset mode, indicated by line A, versus a restart after the suspend mode or a continuous operation mode, indicated by line B. The timing diagram reflects the timing for the synthesizer module's processing of a few voices. One skilled in the art will readily appreciate from FIG. 120 the timing that occurs for the processing of all voices.

The number after some of the operations in the timing diagram indicate which voice number is being processed. For example, "ADDfr(in)31" in column SSP indicates the address fractional value for voice 31. The notations "(in)" or "(out)" indicate whether the data is being transferred in or out of the particular block. For example, "ADDfr(in)31" indicates that the address fractional value for voice 31 is being transferred into the signal path.

In column SSG, "FSYNC" sets whether the synthesizer will operate in the enhanced mode or the frame expansion mode. "LFSYNC" indicates that the mode is set by the local memory control module. "AV" indicates whether a particular voice is active. "VN" indicates that the processing for a particular voice number has been completed.

In column SRG, there are two cycles to read ("RD") data from the register array for a particular voice and two cycles to write ("WR") data to the register array.

One skilled in the art will readily appreciate the operations set forth in columns SAG, SVG, SSP, SAC and LMC from the synthesizer module architecture drawings and timing diagrams discussed above and the discussion below in section VI. LOCAL MEMORY CONTROL MODULE.

The wavetable synthesizer of the present invention is described above as a module formed on a monolithic PC audio integrated circuit also containing a system control module, a CODEC module, a local memory control module, and a MIDI and game port module. However, alternatively, the wavetable synthesizer can be formed on a monolithic integrated circuit together with just a system control module, synthesizer DAC, and a local memory control module. In another alternative embodiment, the wavetable synthesizer can be formed on a monolithic circuit together with just a system control module and a local memory control module. The resulting alternative monolithic integrated circuits can be used in various applications. For example, either of these integrated circuits can be incorporated on an add-in card with other integrated circuits which support its operation, such as a commercially available CODEC, memory and/or DAC, to form a sound card used in a personal computer.

VI. Local Memory Control Module

Referring now to FIG. 1, the circuit C includes a local memory control module 8. Throughout this specification local memory control module 8 may be referred to as LMC 8. LMC 8 includes a LMC bus interface 250 and a collection of registers, latches and logic circuits schematically illustrated as block 252 in FIG. 1. LMC 8 transfers data between off-chip local memory devices and the synthesizer module 6, the system bus interface 14 and the CODEC module 4. Referring now to FIG. 6, local memory devices may include DRAM circuits 110, ROM circuits 86 and a serial EEPROM 78 to support the ISA Plug-n-Play specification.

A. Major Functional Blocks

Figure 29:
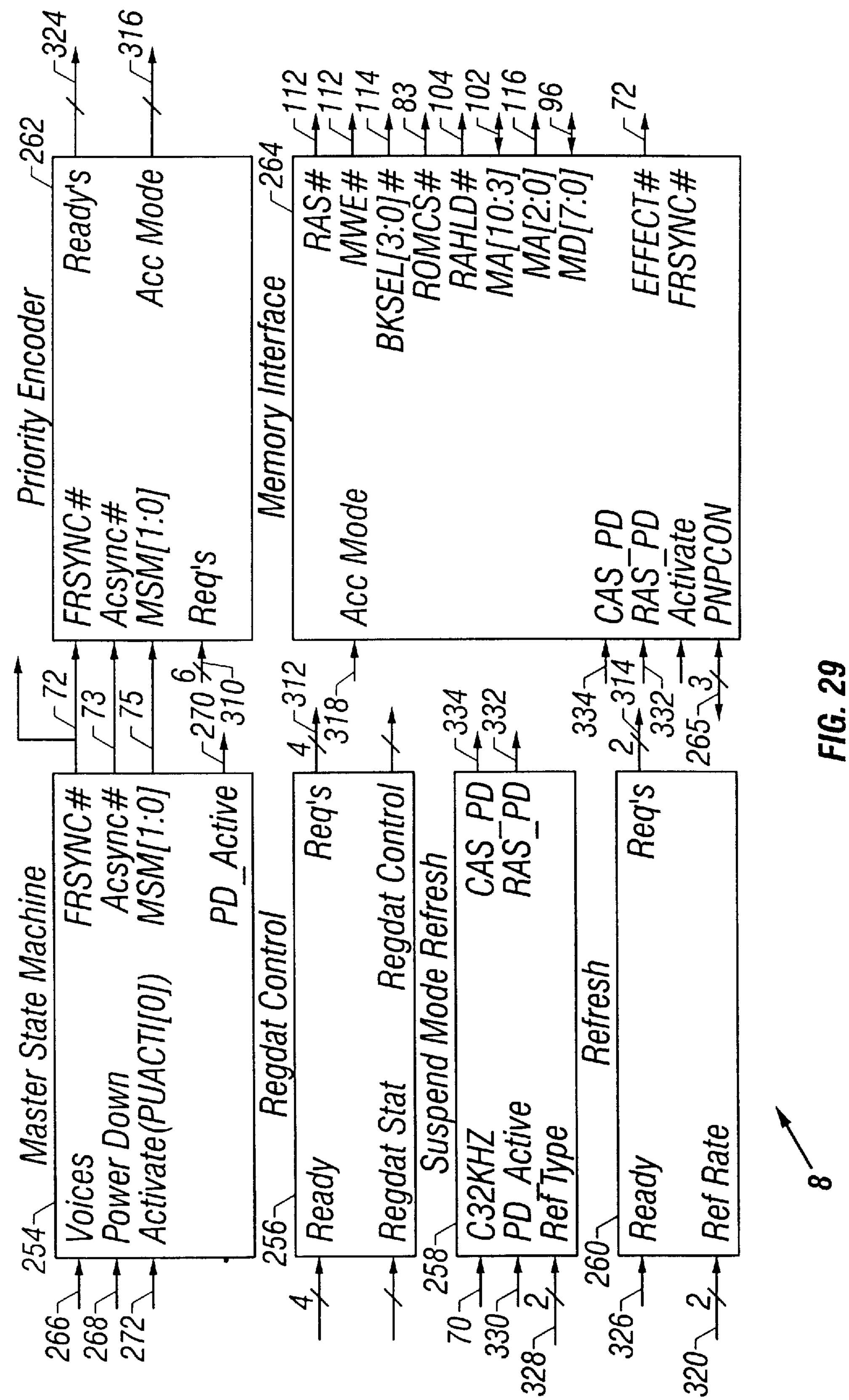
FIG. 29 is a block diagram schematically illustrating the basic modules which comprise the local memory control module of the circuit C.

Referring now to FIG. 29, LMC 8 includes a master state machine 254, a register data bus control block 256, suspend mode refresh block 258, a refresh request block 260, a priority encoder block 262 and a memory interface block 264. In addition to these functional blocks, LMC 8 includes a plurality of registers as described below.

Master state machine 254 and priority encoder 262 determine which of the possible sources of memory cycles will be granted access and pass the decision to memory interface block 264 to generate the cycle. Plug-n-Play logic is also included within LMC 8 to provide interfacing with serial EEPROM 78 for Plug-n-Play accesses. Control of Plug-n-Play compatibility EEPROM 78 is carried out over PNP CON Pins 265 (FIG. 29) which correspond to PNPCS 76 and MD[2:0] 80 in FIG. 6.

Master state machine 254 receives input signals relating to voice generation via input 266. Voice input 266 includes the register value SAVI (see register description in synthesizer description) which specifies the number of voices being processed. Power Down input 268 is any one of several power down signals generated internally to effect shut-down in general or by module, or to enter suspend mode. These modes are described in detail in the system control module description. Specifically, power down input 268 includes I2LSUSRQ which is active when bit PWRL (power to local memory) transitions from high to low, disabling the 16.9 MHz clock to the local memory control, and I2LSUSPIP (suspend-in-progress) which is active following I2LSUSRQ (see FIG. 26) or in response to a circuit wide suspend # pin input which causes ISUSPRQ# to go active immediately (FIG. 27). ISUSPRQ# is logically ORed into I2LSUSPIP. System shut-down mode is entered by clearing PPWRI[6:1] with a single write which causes I2LSUSRQ to be active, followed by I2LSUSPIP as described above.

A circuit activate signal provided on input 272 (FIG. 29) is generated in response to the status of PUACTI[0]. PUACT1[0] is an audio function activation bit (see system control register description) which, when low, disables decoding of all audio-function address spaces, interrupts and DMA channels.

Output 72 is the FRSYNC# signal generated at the beginning of each frame of voice processing which is passed to priority encoder 262 and output via terminal 72 on a multiplexed basis as described in the system control module description above. ACSYNC# output signal 73 is a one pulse synchronization signal to mark the start of each 4 clock cycle memory access as described below. Output 75 provides 2-bit MSM[1:0] one-of-four memory cycle type signal from state machine 254 to priority encoder 262.

1. The Master State Machine

The master state machine 254 counts out frames which constitute the amount of time for each 44.1 KHz. sample.

Each frame consists of 32 subframes, the time needed to process each voice. Each subframe includes three 4-clock accesses to local memory. There are four kinds of accesses possible: SYNTH, EVEN, ODD, and WAIT; each access-type represents a different method of prioritizing the memory cycle requests, as described in the priority encoder section below. The master state machine 254 generates MSM[1:0] which specifies the current access-type. The order in which the access-types are generated is as follows:

| SUBFRAME 0 | | | SUBFRAME 1 | | | SUBFRAME 2 | | | SUBFRAME 31 | | |
|---|---|---|---|---|---|---|---|---|---|---|---|
| SYNTH | SYNTH | EVEN | SYNTH | SYNTH | ODD | SYNTH | SYNTH | EVEN | SYNTH | SYNTH | ODD |

Figure 30:
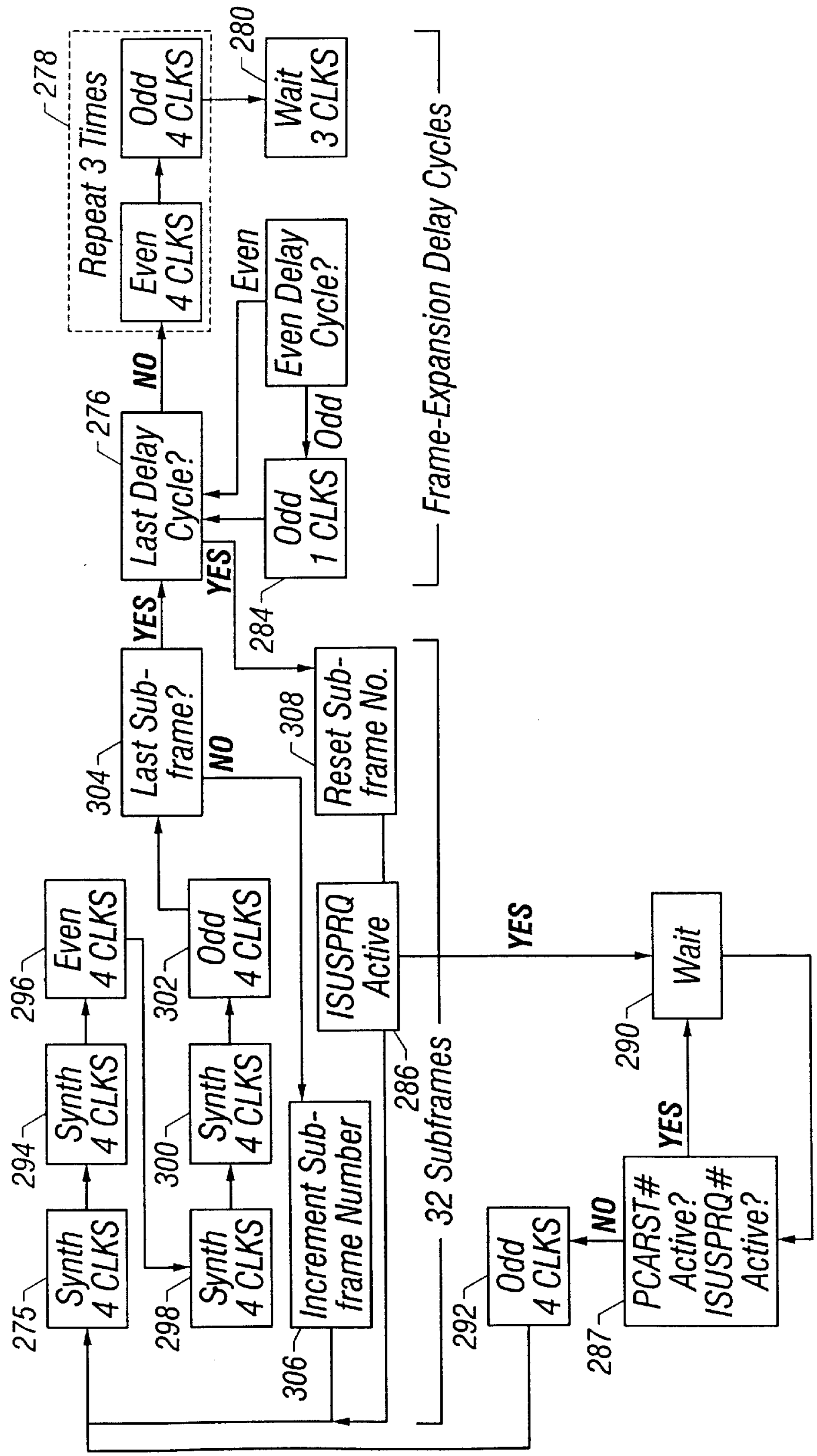
FIG. 30 is a block diagram schematically illustrating the master state machine associated with the local memory control module of the circuit C.

FIG. 30 is a state diagram showing the modes of MSM[1:0].

The master state machine passes MSM[1:0] to the priority encoder to determine which of the possible cycle types will be executed (e.g. synth patch access, codec, DMA, I/O cycle, refresh, etc.).

a. Initialization

Referring now to FIG. 30, while PCARST# is active at state 287, MSM[1:0]=WAIT at state 290. After PCARST# becomes inactive, before the circuit C is activated via PUACTI[0], MSM[1:0]=SYNTH at state 292 to allow refreshes to DRAM 110. After activation, the master state machine 254 starts the first SYNTH access for subframe 0 at state 275 and continues from that point. State machine 254 transitions through eight clocks of synthesizer access type, (states 275, 294), followed by four even (state 296), eight synthesizer (states 298–300), and four odd clocks (state 302) for each subframe. This pattern is repeated via states 304 and 306 until all thirty-two subframes are completed.

b. Frame-Expansion Mode

This mode is included for Gravis Forte Ultrasound GF-1 compatibility. Frame-expansion mode is enabled by setting SGMI[ENH], as described in the synthesizer module description above. In this mode, a time delay of about 1.6197 microseconds times [SAVI minus 14] is added at the end of each frame. SAVI is the programmable register that specifies the number of active voices. The number of delay cycles is SAVI minus 14. The delay is approximated by alternating wait-counts of 27 clock cycles for the first delay cycle, and then 28 for the next. Referring to FIG. 30, frame expansion mode is entered at state 276 if a value for a delay cycle has been set, as determined by SAVI minus 14. State 278 provides four even, then four odd clocks in three successive iterations. These twenty-four clocks are then followed by a three clock wait at state 280 and a return to state 276 for even numbered delay cycles and an additional wait clock at state 284 for odd numbered delay cycles. Once all the delay cycles are complete at state 276, the subframe number is reset at state 308, and the process begins again unless ISUSPRQ# is active at state 286.

C. FRSYNC#, EFFECT# and ACSYNC#

Referring now to FIG. 29, master state machine 254 generates a 1-clock pulse over FRSYNC# at the beginning of each new frame and a 1-clock pulse over ACSYNC# to signal the start of each 4-clock cycle access time. EFFECT# is timed as appropriate, becoming active during memory cycles for effects write (4-clock cycles) and for read accesses (8-clock cycles).

d. Suspend and Shut-Down Modes

When ISUSPRQ# from the system control module becomes active, master state machine 254 completes the current frame and then enters WAIT mode at states 286 and 290 (FIG. 30). The LMC 8 does not leave any memory control signals in a state which will interfere with the suspend-mode refresh cycles.

Figure 31:
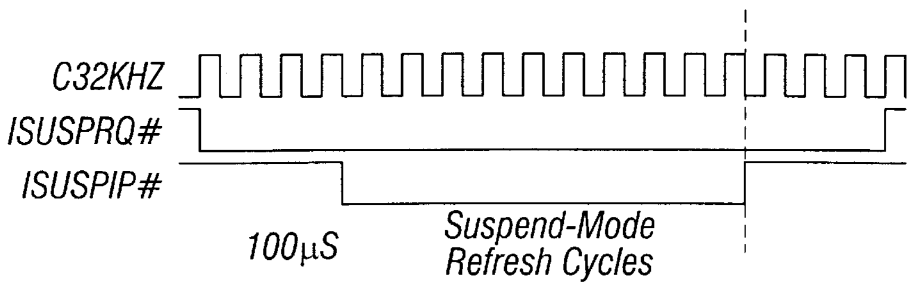
FIG. 31 is a timing diagram illustrating the relationship of suspend mode control signals and a 32 KHz clock signal utilized by the circuit C.

Referring now to FIG. 31, when suspend mode in progress signal ISUSPIP# becomes active, suspend-mode refresh cycles are executed off the 32 KHz. clock. Once ISUSPIP# becomes inactive, the current suspend-mode refresh cycle is ended on the next edge of the 32 KHz. clock such that all RAS# and CAS# are inactive. After ISUSPRQ becomes inactive, the master state machine resumes with the next frame. Suspend-mode refresh cycles also occur when the circuit C is in shut-down mode as defined in the system control module description.

2. The Priority Encoder

Referring now to FIG. 29, the priority encoder 262 receives requests for memory cycles via input 310 and outputs 312 and 314 from register data bus control 256 and refresh control 260 respectively. Based on the state of MSM[1:0], priority encoder 262 determines which cycle will be granted. Here is how the requests are prioritized:

| PRIORITY | SYNTH | EVEN | ODD | WAIT |
|---|---|---|---|---|
| 1 | Synth patch access | Effects access | Synth LFO access | no action required |
| 2 | Refresh request | CODEC play FIFO | DMA cycle | |
| 3 | DMA cycle | CODEC rec FIFO | SBI I/O cycle | |
| 4 | SBI I/O cycle | Refresh request | CODEC play FIFO | |
| 5 | CODEC play FIFO | DMA cycle | CODEC rec FIFO | |
| 6 | CODEC rec FIFO | SBI I/O cycle | Refresh request | |

There is a constraint that DMA or SBI I/O cycles be allowed at least once every other ODD cycle. Therefore it is not legal for the synthesizer module to assert the LFO access request two ODD cycles in a row. A local memory access mode output signal is provided at output 316, and input 318 to memory interface 264 to generate the specified cycle.

3. The Refresh Request Block

The refresh request module 260 asserts RSHRQ# (refresh request) to the priority encoder 262 via output 314 when a DRAM refresh is needed. The interval between refreshes is set by the LMC Configuration Register (LMCFI) to be every 15, 62, or 125 microseconds. This value is input to refresh request module 260 via two-bit input 320. This block also contains a 3-bit counter called the refresh request counter (RSHRQCT[2:0]), which is initialized to 0. Whenever a refresh interval has elapsed RSHRQCT[2:0] is incremented and whenever a refresh cycle to DRAM is executed, RSHRQCT[2:0] is decremented. Execution of a refresh cycle is communicated from encoder 262 to refresh request module 260 via a ready signal provided at output 324 and input 326. If the counter is between 1 and 7, RSHRQ# is active. RSHRQCT[2:0] is preset to 7 during suspend mode (ISUSPIP# active).

4. Suspend Mode Refresh

Figure 32:
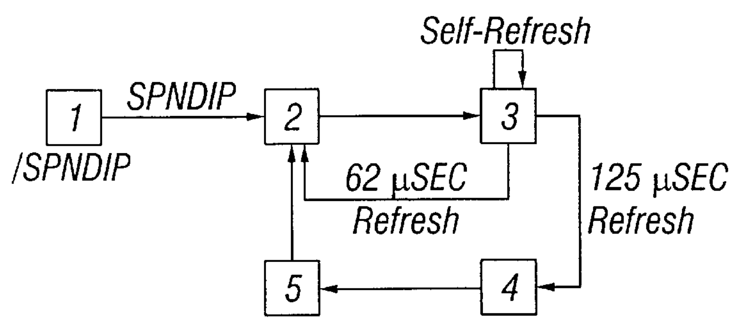
FIG. 32 is a state diagram schematically illustrating refresh cycles utilized by the circuit C during suspend mode operation.
Figure 33:
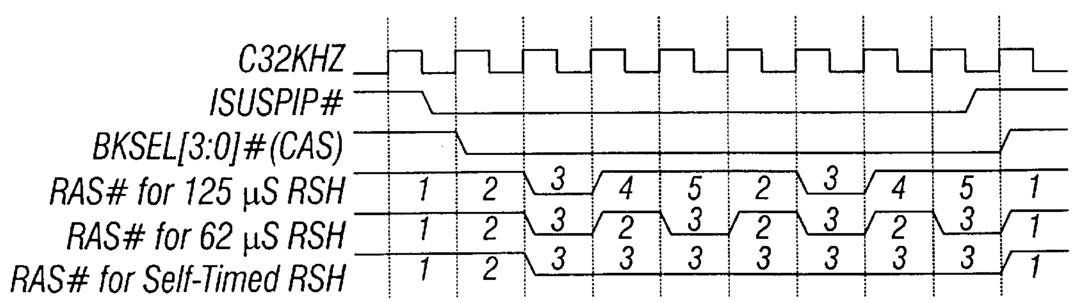
FIG. 33 is a timing diagram for suspend mode refresh cycles.

A power-down condition generates an input to suspend mode refresh block 258 at input 330. After ISUSPIP# from system control module 2 becomes active, the 32 KHz clock supplied by the C32KHZ pin 70 (FIG. 6) is used to operate suspend-mode refresh. The Local Memory Control Register (LMCI) provided via input 328 selects the refresh type to be 62 or 125 microseconds or to use the DRAM self-refresh mode. All DRAM banks are refreshed simultaneously. Suspend mode RAS and CAS outputs 332 and 334 are provided to Memory interface 264 which generates the cycle. FIG. 32 is a state diagram which schematically illustrates the refresh cycles. FIG. 33 is a timing diagram for suspend mode refresh cycles.

The C32KHZ clock signal must continue to oscillate after SUSPEND# becomes inactive to insure that the suspend-mode state machine will finish properly, without the possibility of glitching on RAS and CAS.

5. The Register-Data Bus Control Block

Referring now to FIG. 29, register data control block 256 is a schematic illustration of the collection of local memory registers which are readable and writable via the system bus and necessary logic to provide status information and control of the system bus/register data bus interface. Details of the registers and control functions are provided elsewhere in this specification.

6. Plug-n-Play Interface

After PCARST# becomes inactive, before the circuit C is activated by PUACTI[0], the LMC logic is in Plug-n-Play (PNP) mode. In this mode MD[2:1] are outputs to the serial EEPROM 78 (MD[2] for SK; MD[1] for DI) from the system control module and MD[0] is an input from the serial EEPROM (DO) passed back to the system control module 2.

ROM is being accessed. The following table shows how local memory addresses written to various registers (A[23:0]) are translated before becoming real addresses out of the circuit C. Several address registers in the circuit C are shifted per the table (e.g., all synthesizer address registers); others use real addresses. For synthesizer patch accesses, the access width is determined by SACI[2]; for DMA accesses, the width is determined by the DMA request-acknowledge number (8-bit for channels 0, 1 and 3; 16-bit for channels 5, 6 and 7).

| SGMI [ENH] | Access Width | SUAI, SASHI, SASLI, SAHI, SALI, SAEHI, SAELI, SEAHI, SEALI, LDSALI, LDSAHI, | LDIBI, LMRFAI, LMPFAI, LMALI, LMAHI, SLFOBI, |
|---|---|---|---|
| 0 | 8-bit | RLA[23:0]=(0,0,0,0,A[19:0]) | RLA[23:0]=A[23:0] |
| 0 | 16-bit | RLA[23:0]=(0,0,0,0,A[19:18], (A[16:0]*2)) | RLA[23:0]=A[23:0] |
| 1 | 8-bit | RLA[23:0]=A[23:0] | RLA[23:0]=A[23:0] |
| 1 | 16-bit | RLA[23:0]=(A[22:0]*2) | RLA[23:0]=A[23:0] |

16-bit accesses always assume an even byte alignment whereby RLA[0] low specifies the LSBs and RLA[0] high specifies the MSBs.

DRAM

There are several possible configurations of the four banks of DRAM 110 supported by the circuit C, specified by register LMCFI. Each DRAM bank is 8 bits wide. It is possible to use 16-bit DRAMs by treating the two halves of the data bus as two banks (e.g., BKSEL0# would drive the CAS line associated with bits[7:0] and BKSEL1# would drive bits[15:8]). The number of rows and column address lines must be symmetrical.

The following table shows how real addresses (RLA [21:0]) are multiplexed over row and column (MA[10:0]):

| | | | | | | | | | | | |
|---|---|---|---|---|---|---|---|---|---|---|---|
| Column | RLA21 | RLA19 | RLA17 | RLA7 | RLA6 | RLA5 | RLA4 | RLA3 | RLA2 | RLA1 | RLA0 |
| Row | RLA20 | RLA18 | RLA16 | RLA15 | RLA14 | RLA13 | RLA12 | RLA11 | RLA10 | RLA9 | RLA8 |

These attributes are described in the system control module section and in FIG. 18.

7. Memory Interface

Referring now to FIG. 29, memory interface bus 264 supports up to four banks of DRAM 110, four banks of EPROM 86, and the PNP serial EEPROM 78 (FIG. 6). As described above, BKSEL[3:0] are multiplexed and used to select the bank for both RAM and ROM. RAS#, ROMCS#, and PNPCS are used to select between the memory types.

| Pin | DRAM Pin | ROM Pin |
|---|---|---|
| BKSEL[0]# | Bank 0 CAS# | Bank 0 OE# |
| BKSEL[1]# | Bank 1 CAS# | Bank 1 OE# |
| BKSEL[2]# | Bank 2 CAS# | Bank 2 OE# |
| BKSEL[3]# | Bank 3 CAS# | Bank 3 OE# |

Local Memory Addresses

The addresses that are used to access DRAM and ROM are all based on byte addresses or real addresses (RLA [23:0]) that range linearly from zero to the end of memory. These 24 bits are referenced in FIG. 6 in part as either MA[10:0], or RA[21:11], depending on whether DRAM or In those systems which include enough DRAM space to require 24-bit addressing, the two most significant bits of DRAM real address RLA[23.22] are encoded and transferred out of circuit C via BKSEL[3:0].

Eight-Bit DRAM Access

Figure 34A:
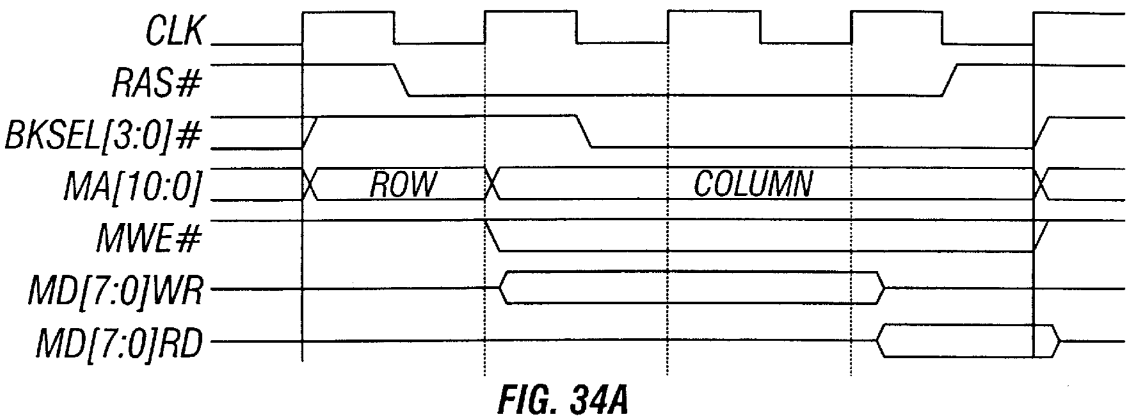
FIG. 34*a* is a timing diagram for 8-bit DRAM accesses.

FIG. 34*a* is a timing diagram for 8-bit DRAM accesses. CLK in this timing diagram, and the ones below, is the 16.9344 MHz clock.

Sixteen-Bit DRAM Access

Figure 34B:
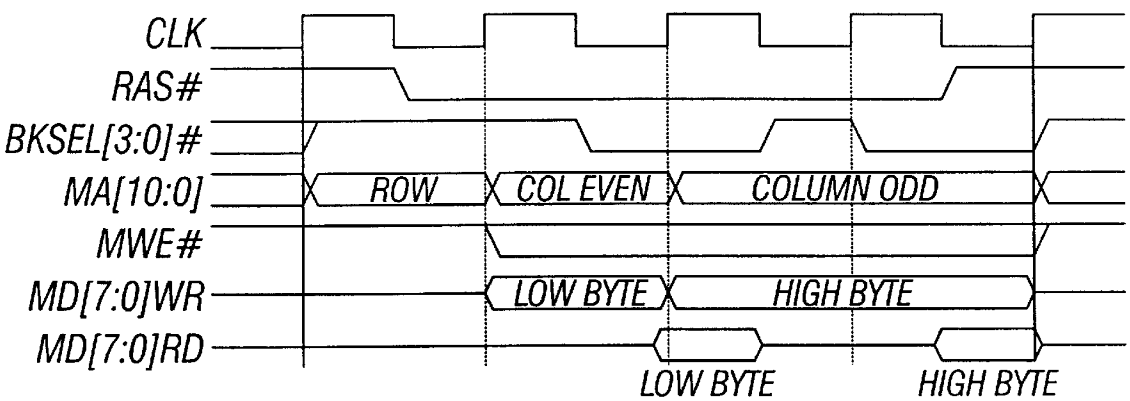
FIG. 34*b* is a timing diagram for 16-bit DRAM accesses.

FIG. 34*b* is a timing diagram for 16-bit DRAM accesses. Sixteen-bit data accesses utilize fast page mode.

DRAM Refresh

Figure 34C:
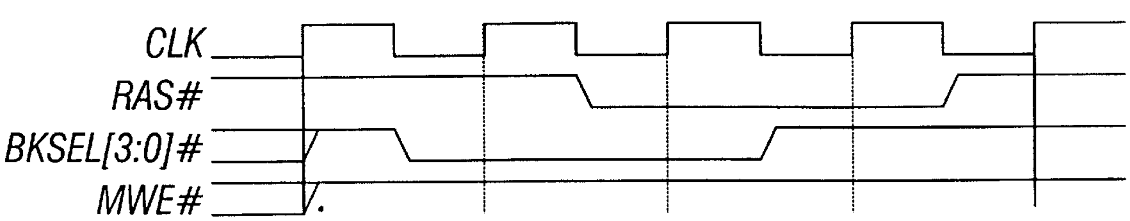
FIG. 34*c* is a timing diagram for DRAM refresh cycles.

FIG. 34*c* is a timing diagram for DRAM refresh cycles. DRAM refresh cycles utilize the CAS-before-RAS method. When not suspended or in shut down mode, refresh rates of 15, 62, 125 microseconds are supported (LMCFI).

ROM

Each of the four 16-bit-wide banks of ROM 86, if present, must be the same size. The ROM size is specified in the LMCFI register. The values range from 128K×16 (256 kilobytes per bank) to 2M×16 (4 megabytes per bank). To implement ROM, 16-bits of external latches 108 must be supplied. The latches, ROMs and circuit C are to be connected as follows:

| Circuit C | Latch | Circuit C/Latch | ROM Pin |
|---|---|---|---|
| MD[7:0] | latchIN[15:8] | MD[7:0] | D[7:0] |
| MA[10:3] | latchIN[7:0] | MA[10:3] | D[15:8] |
| RAHLD# | latch enable | RA[21:20] | A[20:19] |
| | | MA[0] | A[18] |
| | | latchOUT[15:0] | A[17:2] |
| | | MA[2:1] | A[1:0] |

Figure 35:
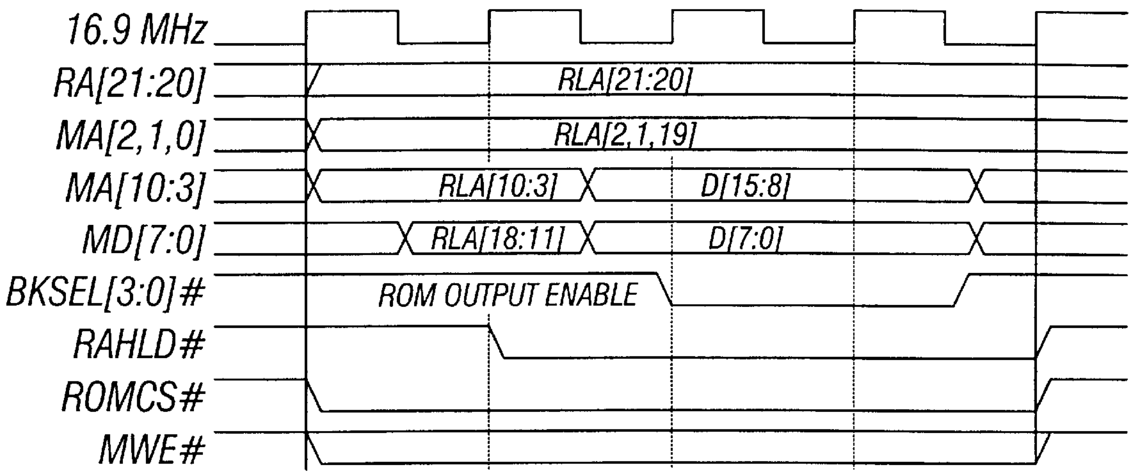
FIG. 35 is a timing diagram illustrating how real addresses are provided from the circuit C to external memory devices.

As described more fully above, ROM accesses multiplex the use of the address and data buses so that 16 bits can be brought in at a time. If there is an I/O write to ROM space, then the MWE# signal will become active during the cycle. The timing diagram in FIG. 35 shows how the real addresses (RA[23:0]) are provided from the circuit C. Note that RA[1] enters A[0] of the ROMs, and so fourth, due to the fact that the ROM banks are assumed to be 16 bits wide.

8. Local Memory Record/Play FIFOs

The local memory record and play FIFOs (LMRF and LMPF) are FIFOs that are stored in local DRAM 110. These FIFO registers are discussed in the CODEC description. The LMPF is used to automatically transfer data from DRAM 110 to the CODEC playback FIFO 532 (FIG. 1). The LMRF is used to automatically transfer data from the CODEC record FIFO 538 to local DRAM 110.

Figure 36:
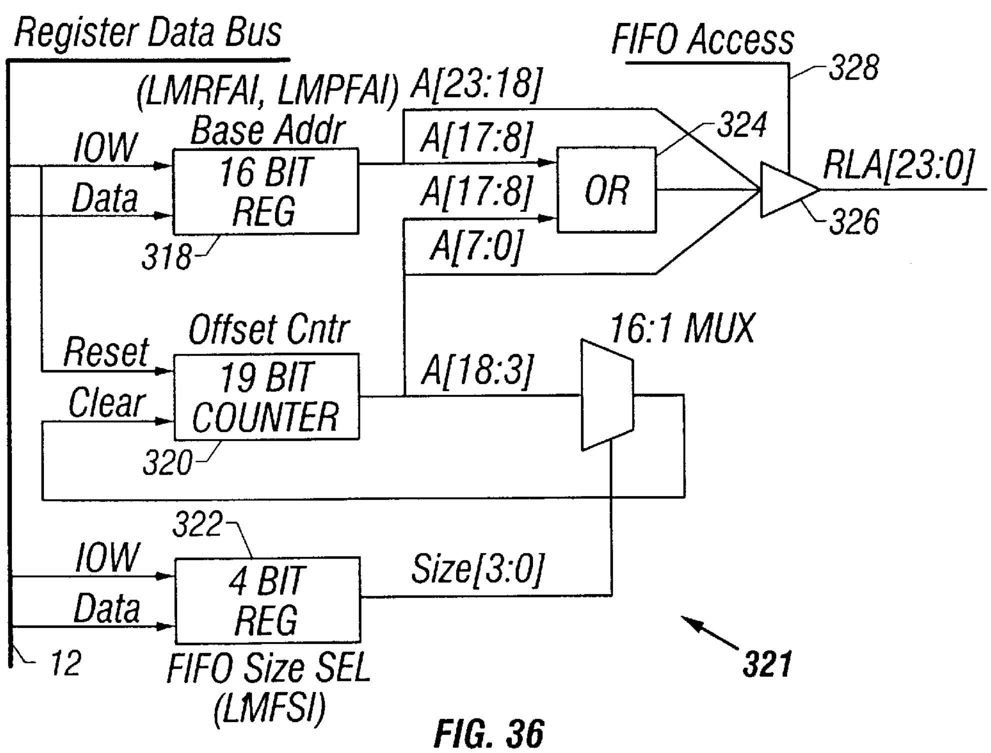
FIG. 36 is a schematic block diagram of a control circuit for local memory record and playback FIFOs.

Referring now to FIG. 36, local memory record and playback FIFOs are each implemented in a FIFO control circuit 321, which includes a programmable base-address counter 318, a 19-bit offset counter 320, and a programmable FIFO size select register 322. The FIFO size is controlled by selecting the bit from the offset counter that causes the offset address to reset back to zero. The FIFO sizes range from 8 bytes to 256K bytes.

The output of offset counter 320 is ORed at gate 324 with the base address output from register 318 to generate the real address for each access to DRAM 110. Register 318 is provided with local memory record and playback FIFO addresses from the LMRFAI and LMPFAI registers described below. Each byte that is transferred between DRAM 110 and the CODEC 4 causes the offset counter 320 to increment. The host CPU writes the LMPF data to DRAM 110 and reads the LMRF data from DRAM 110 via normal I/O accesses. See the description of the LMBDR and LMSBAI registers below. Local memory FIFO accesses are controlled by controlled driver circuit 326 which provides the real address bits out of the circuit C in response to a FIFO access signal provided at input 328. Data transfer and control signals are provided to the local memory FIFO control circuit 321 via register data bus 12.

CODEC Sample Counters

Each sample that is transferred from the CODEC record FIFO 538 to the LMRF causes the CODEC record sample counter to decrement. Each sample that is transferred from the LMPF to the CODEC playback FIFO 532 causes the CODEC playback sample counter to decrement. The point at which the data is transferred from-to the CODEC FIFOs and the sample counter decremented is described in detail in the CODEC portion of this specification.

9. DMA Data Transfers

There are two kinds of DMA transfers possible between system and local memory. GF-1 compatible DMA is specified by LDMACI, for control, and LDSALI and LDSAHI for the DMA address. Interleaved DMA is specified by LDICI, for control and LDIBI for the base address. If both these types of DMA are attempted simultaneously, the results are unpredicable. The DMA request signal generated by the LMC module 8 goes to the DMA logic described in the system control module to become a DRQ signal out to the ISA bus. Similarly, the DAK# signal from the ISA bus is received by the DMA block and passed to the LMC module 8.

The local memory starting address must be even for all DMA.

TC Interrupts

The TC signal from the ISA bus is latched as soon as it becomes active so that it will stay active through the remainder of DMA acknowledge. That signal, LLATTC, is clocked into a flip-flop with the trailing edge of IOR# or IOW#. This bit, LTCIRQ, is the output that is read back in LDMACI[6]. It is also ANDed with the bit that is written to LDMACI[6], the TC interrupt enable, before being ORed with into the AdLib-Sound Blaster interrupts in the system control module. LTCIRQ is cleared by a read of LDMACI. The occurrence of TC is used to stop DMA transfers by clearing either LDMAC[5] or LDICI[9], depending on the type of DMA that is taking place.

10. Interleaved DMA Data Mode

It is possible to transfer interleaved data from system memory into local DRAM 110, via DMA, such that the tracks are separated in local memory. For this, it is assumed that n tracks of interleaved audio data are stored in system memory, where n is programmable via register LDICI[7:3] to be from 1 to 32. The size of each of the tracks is also programmable via LDICI[2:0], where the number of bytes in each track is 2^ (9+LDICI[2:0]) (ranging from 512 to 64K). The way in which data is transferred varies, based on the DMA channel width and the sample width as illustrated in the table of FIG. 38.

Figure 39A:
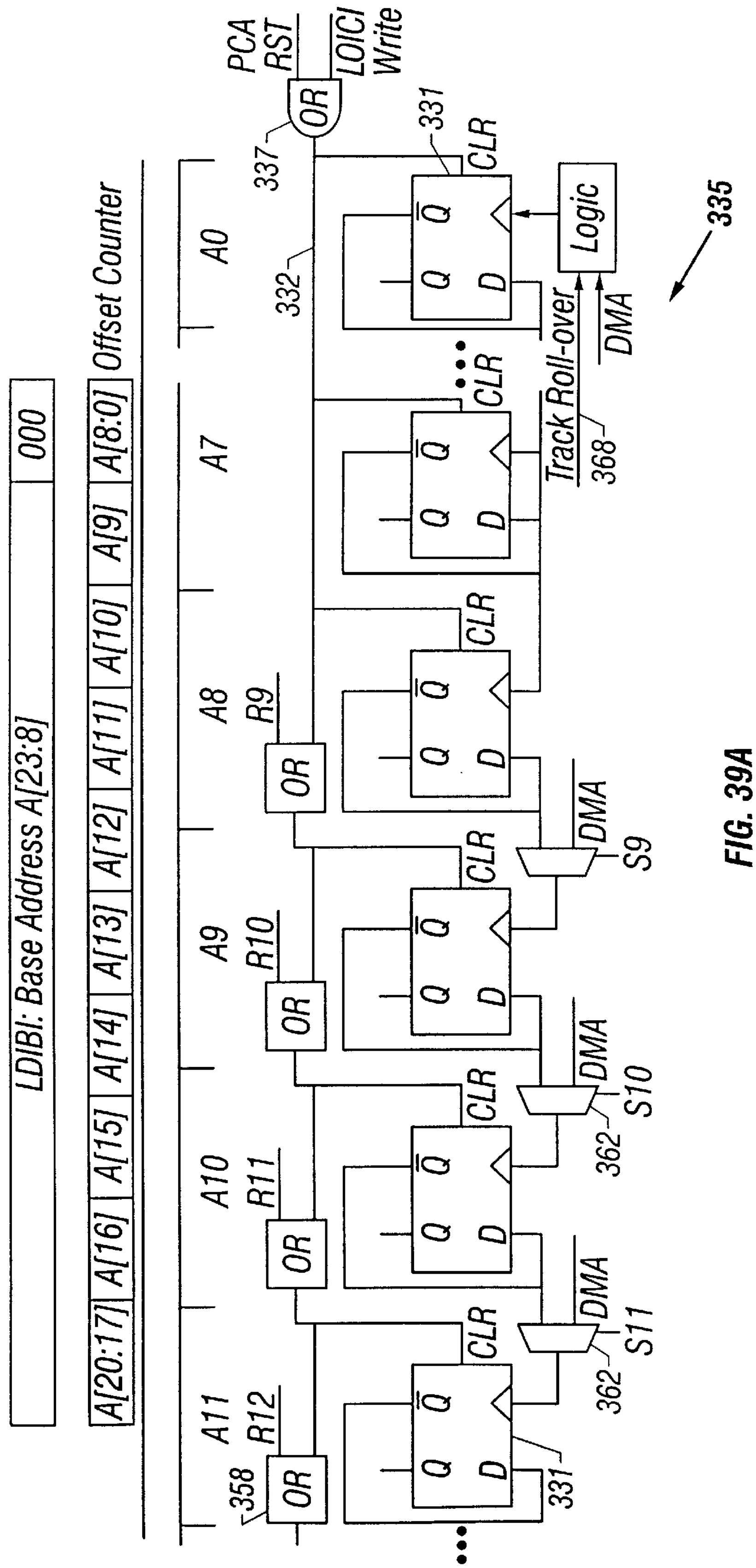
FIGS. 39*a* and 39*b*, generally referred to herein as FIG. 39, illustrate is a schematic block diagram illustrating circuitry for implementing interleaved DMA data from system memory to local memory via the local memory control module of the circuit C.
Figure 39B:
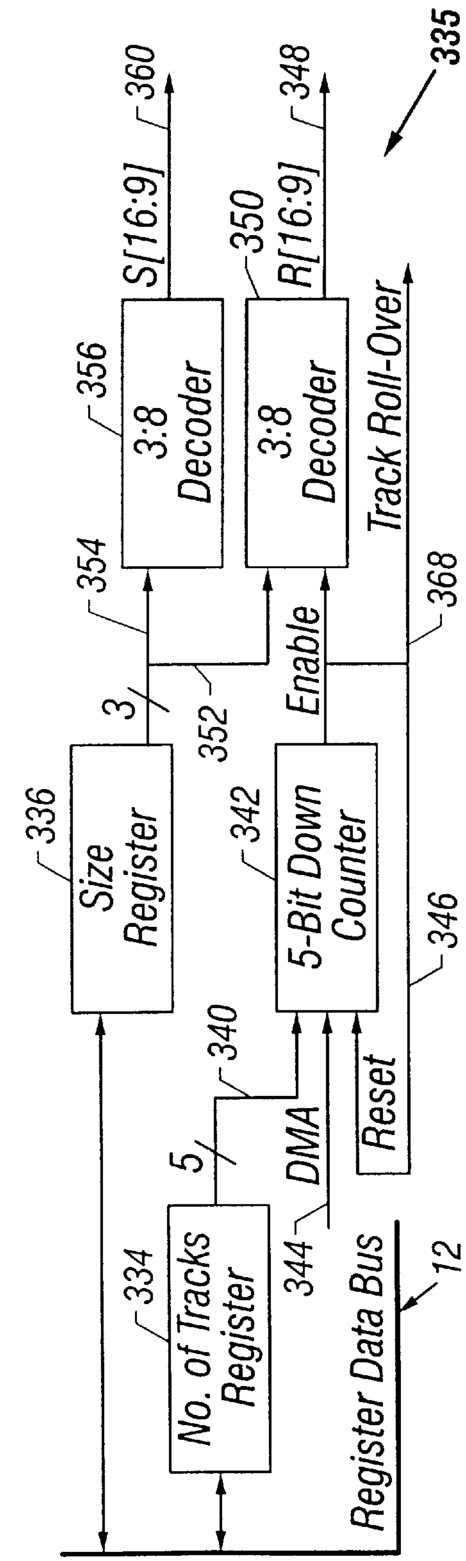

Referring now to FIG. 39, the local memory address for the interleaved DMA function is implemented by ORing the base register and an offset counter 335. The address generated is real; it points to a byte in local DRAM 110.

Still referring to FIG. 39, the offset counter is cleared with each write to LDIBI or upon PCA_RST signal on line 332, via ORGATE 337. The fields of LDIBI control the offset counter as shown in the diagram. LDICI[7:3] specifies the number of tracks of interleaved data, which is schematically illustrated as register 334. Track Size register 336 is controlled by LDICI[2:0]. The MSBs, starting at the bit defined by the size register, LDICI[2:0], are incremented with each sample transferred. After the number of samples specified by the tracks register, LDICI[7:3], have been transferred, the LSBs are incremented via track rollover output 368, and the MSBs are cleared by output 348 of decoder 350. If the tracks register is set to zero, then this DMA function operates like a single track transfer with a roll-over point specified by the size register. The 5-bit down counter in the above diagram that counts the track number is loaded with the number of tracks with each write to LDIBI (it is not loaded by writes to LDICI).

Five-bit track register 334 specifies a number from 0 to 31 which is output on five-bit bus line 340 and provided to down-counter 342. Counter 342 is decremented on each DMA cycle and reset on count zero via inputs 344 and 346, respectively. An enabling output signal from counter 342 to decoder 350 causes the MSB's of counter 335 to be cleared via R[16:9] outputs represented schematically on line 348. The limit on which outputs 348 are cleared is defined by input 352 from track size register 336, which defines the boundary bit between MSBs (track number) and LSBs (track size). The designated R inputs 348, when enabled, are provided to the clear inputs of corresponding flip-flops 331 via ORgates 358.

Similarly, size register 336 provides a three-bit track size signal on line 354 to decoder 356 which, in turn, provides a 3:8 bit decoded output S[16:9] on eight-bit bus 360. The output signal on line 360 increments the LSBs of counter 335 to address the next block of memory corresponding to the next group of tracks. The LSBs of counter 335 are incremented via lines 360 and corresponding multiplexers 362.

B. Local Memory Control PIN Summary

FIG. 7 provides a summary of the external pins and functions for local memory control module 8.

C. Local Memory Control Register Overview

1. LMC Byte Data Register (LMBDR)

Address: P3XR+7 read, write

This is an 8-bit port into local memory that is indexed by the LMALI and LMAHI I/O address counter. If LMCI[0] is set to auto-increment mode, then the I/O address counter will increment by one with each access through this port.

2. DMA Control Register (LDMACI)

Index: P3XR+5 read, write; index IGIDXR=41h

Default: 00h

This register is used to control GF-1 compatible DMA access to local memory.

| 7 | 6 | 5 | 4 | 3 | 2 | 1 | 0 |
|---|---|---|---|---|---|---|---|
| INV | DMATC | DIEN | DIV[1:0] | | WID | DIR | EN |

INV — Invert MSB. This bit high causes the MSB of the DMA data from system memory to local memory to be inverted, If low, the data will pass unchanged. Bit[6] of this register controls whether the SMB is bit[7] or bit[15]. This bit only affects GF-1 compatible DMA, not interleaved DMA.

DMATC — (DMATC for reads; IB15 for writes) DMA Terminal Count. This bit has separate read and write functions. Reading a logical 1 indicates a DMA TC interrupt is active; this read also causes this interrupt bit to clear (the first time this bit is read after the interrupt is set, the value will come back as high; after that it is low).
Invert Bit 15 (IB15). Writing this bit high specifies the data width of the DMA data from system memory to local memory to be 16 bits wide; writing this bit low specifies 8-bit data. This is only used in conjunction with the INV bit of this register.
Note: IB15 can be read via LMCI[6].

DIEN — DMA IRQ enable. This bit high enables the ability for TC to cause an interrupt at the end of a block of system-memory-local-memory DMA; this bit will become active if either LDMACI[0] is active or LDICI[9] is active, but not for CODEC DMA (this bit is ANDed with the output of the flipflop that drives the TC interrupt; the output of this AND gate drives UISR[7]).

DIV[1:0] — DMA rate divider. This controls the rate in which transfers between local memory and system memory (accessed by the internal DRQMEM signal) are allowed. This bit only affects GF-1 compatible DMA, not interleaved DMA.
The times given are measured form the end of DMA acknowledge till the new DMA request is set; however, if the local memory cycle associated with the previous DMA cycle has not yet completed when the time is expired, then the logic waits for that memory cycle to complete before setting the DRQ signal.

| DIV 1 0 | Delay for GF-1 Compatible DMA (controlled by DLMACI) |
|---|---|
| 0 0 | 0.5 to 1.0 microseconds |
| 0 1 | 6 to 7 microseconds |
| 1 0 | 6 to 7 microseconds |
| 1 1 | 13 to 14 microseconds |
| DIV 1 0 | Delay for Interleaved DMA (controlled by LDICI) |
| 0 0 | the DRQ pin becomes active immediately after the write cycle to local memory has completed from the previous DMA cycle. |

-continued

| | |
|---|---|
| 0 1 | 0.5 to 1.5 microseconds |
| 1 0 | 6 to 7 microseconds |
| 1 1 | 13 to 14 microseconds |

WID — DMA width. This read-only bit specifies the data width of the DMA channel for system memory to/from local memory transfers. It is high when UDCI[2:0] is set to DMA request acknowledge signals 5, 6, or 7. It is low for all others.

DIR — Direction. This bit low specifies local-memory DMA transfers to be reads of system memory and writes into local memory. This bit high specifies local-memory DMA transfers to be reads of local memory and writes to system memory. This bit only affects GF-1 compatible DMA, not interleaved DMA.

EN — Enable GF-1 compatible DMA. This bit high causes DMA transfers between the system bus and local memory to occur (this does not affect codec DMA). There is a 0.5 to 1.0 microsecond delay from the time that this bit is set high until the first DMA request is issued. The hardware resets this bit when the TC line is asserted.

3. LMC DMA Start Address Low Register (LDSALI)

Index: P3XR+(4-5) write; index IGIDXR=42h

Default: 0000h

This 16-bit register specifies the lower portion of the GF-1 compatible DMA address counter that points to local memory, A[19:4]. Writes to this register automatically clear A[3:0] of the DMA address counter. See the LMC module's MEMORY INTERFACE section for translations between real addresses and the addresses programmed into the DMA registers based on whether an 8- or 16-bit DMA channel is used.

4. LMC DMA Start Address High Register (LDSAHI)

Index: P3XR+5 read, write; index IGIDXR=50h

Default: 00h

| 7 | 6 | 5 | 4 | 3 | 2 | 1 | 0 |
|---|---|---|---|---|---|---|---|
| A[23:20] | | | | A[3:0] | | | |

This specifies the upper and low portions of the GF-1 compatible DMA address counter that points to local memory 110 via A[23:20] and A[3:0] for DMA cycles. A[3:0] are automatically cleared during writes to LDSALI for compatibility reasons. It is not legal to start DMA transfers from an odd byte address. See the LMC module's MEMORY INTERFACE section for translations between real addresses and the addresses programmed into the DMA registers based on whether an 8- or 16-bit DMA channel is used.

5. LMC Address Low (LMALI)

Index: P3XR+(4-5) write; index IGIDXR=43h

Default: 0000h

This specifies the lower portion of the I/O address counter that points to local memory 110 via, A[15:0] for programmed I/O cycles. The rest of the address is located in LMAHI; The corresponding data ports are LMBDR for byte accesses and LMSBAI for 16-bit accesses. The LSB of this register is ignored for 16-bit accesses; it is not possible to write 16-bit data starting at an odd address. If LMCI[0] is set to auto-increment mode, then the I/O address counter will increment by one with each access through LMBDR and by two with each access through LMSBAI.

6. LMC Address High (LMAHI)

Index: P3XR+5 write; index IGIDXR=44h

Default: 00h

| 7 | 6 | 5 | 4 | 3 | 2 | 1 | 0 |
|---|---|---|---|---|---|---|---|
| A[23:20] | | | | A[19:16] | | | |

This specifies the upper portion of the I/O address counter that points to local memory 110, via A[23:16] for programmed I/O cycles. The rest of the address is located in LMALI; The corresponding data ports are LMBDR for byte accesses and LMSBAI for 16-bit accesses. If LMCI[0] is set to auto-increment mode, then the I/O address counter will increment by one with each access through LMBDR and by two with each access through LMSBAI. If SGMI[ENH] is set to GF-1 compatibility mode, then A[23:20] are reserved.

7. LMC 16Bit Access Register (LMSBAI)

Index: P3XR+(4-5) read, write; index IGIDXR=51h

This is a 16-bit port into local memory 110 that is indexed by the LMALI and LMAHI I/O address counter. If LMCI[0] is set to auto-increment mode, then the I/O address counter will increment by two with each access through this port. The LSB of LMALI is always treated as if it is zero during accesses through this port.

8. LMC Configuration Register (LMCFI)

Index: P3XR+(4-5) read, write; index IGIDXR=52h

Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| RESERVED | | | | SR[1:0] | | NR[1:0] | | RM[3:0] | | | RES | DR[3:0] | | | |

SR[1:0] Suspend mode refresh rate (see table below.)

NR[1:0] Normal mode refresh rate (see table below).

| Bit 1 0 | SR[1:0] - Suspend mode | NR[1:0] - Normal mode |
|---|---|---|
| 0 0 | No refresh | 16 microsecond refresh rate |
| 0 1 | 62 microsecond refresh rate | 62 microsecond refresh rate |
| 1 0 | 125 microsecond refresh rate | 125 microsecond refresh rate |
| 1 1 | Self timed refresh | No refresh |

RM[2:0] ROM configuration. Specifies the size of the four ROM banks 86. (RM[2:0] = 0) for 128K × 16; (RM[2:0] = 1) for 256K × 16; (RM[2:0] = 2) for 512K × 16; (RM[2:0] = 3) for 1M × 16; (RM[2:0] = 4) for 2M × 16; (RM[2:0] = 5–7) are reserved.

DR[3:0] The DRAM configuration (all values are byte quantities):

| DR[3:0] | Bank 3 | Bank 2 | Bank 1 | Bank 0 | Total |
|---|---|---|---|---|---|
| 0 | — | — | — | 256K | 256K |
| 1 | — | — | 256K | 256K | 512K |
| 2 | 256K | 256K | 256K | 256K | 1M |
| 3 | — | — | 1M | 256K | 1.25M |
| 4 | 1M | 1M | 1M | 256K | 3.25M |
| 5 | — | 1M | 256K | 256K | 1.5M |
| 6 | 1M | 1M | 256K | 256K | 2.5M |
| 7 | — | — | — | 1M | 1M |
| 8 | — | — | 1M | 1M | 2M |
| 9 | 1M | 1M | 1M | 1M | 4M |
| 10 | — | — | — | 4M | 4M |
| 11 | — | — | 4M | 4M | 8M |
| 12 | 4M | 4M | 4M | 4M | 16M |

9. LMC Control Register (LMCI)

Index: P3XR+5 read, write; index IGIDXR=53h

Default: 00h

| 7 | 6 | 5 | 4 | 3 | 2 | 1 | 0 |
|---|---|---|---|---|---|---|---|
| RES | IB15 | RESERVED | | | | ROMIO | AI |

IB15 Invert Bit 15. This bit is read only. It provides CPU read access to LDMACI[6]. When high, the data width of the DMA data from system memory to local memory is specified to be 16 bits wide; writing this bit low specifies 8-bit data. This is only used in conjunction with the LDMACI[INV].

ROMIO DRAM/ROM select for I/O cycles. 0 = DRAM; 1 = ROM.

AI Auto Increment. A low on this bit specifies that I/O reads and writes to local memory via LMBDR and LMSBAI will not auto-increment the I/O address counter. A high on this bit causes such accesses to increment the I/O address counter by one for accesses via LMBDR and by two for accesses via LMSBAI.

10. Local MEM REC/Play FIFO Base Address (LMRFAI and LMPFAI)

Index: P3XR+(4-5) read, write; record index IGIDXR=54h, play index IGIDXR=55h

Default: 0000h

These registers specify real (byte-oriented) address bits A[23:8] of the local memory record and play FIFOs' base address. Writes to LMRFAI cause the LMRF-offset counter to reset to 0. Writes to LMPFAI cause the LMPF-offset counter to reset to 0.

11. Local Memory FIFO Size (LMFSI)

Index: P3XR+(4-5) read, write; index IGIDXR=56h

Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| RES | RES | RES | RE | RFSIZE | | | | RES | RES | RES | PE | PFSIZE | | | |

RE LMRF enable. When high, samples from the CODEC record FIO 538 will be transferred into the LMRF.

RFSIZE LMRF size. This specifies the rollover point of the LMRF offset counter 320, i.e., the size of the FIFO. The FIFO size is 2 ^ (RFSIZE + 3); the size can range from 8 bytes to 256K bytes.

PE LMPF enable. When high, samples from the LMPF will be transferred to the CODEC playback FIFO 532.

PFSIZE LMPF size. This specifies the rollover point of the LMPF offset counter 320, i.e., the size of the FIFO. The FIFO size is 2 ^ (PFSIZE + 3); the size can range from 8 bytes to 256K bytes.

12. LMC DMA Interleave Control Register (LDICI)

Index: P3XR+(4-5) read, write; index IGIDXR=57h

Default: 0000h

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| RESERVED | | | | | | IEN | W16 | ITRK[4:0] | | | | | ISIZE[2:0] | | |

IEN Interleaved DMA Enable. This bit high enables interleaved DMA (i.e., interleaved DMA cycles occur while this bit is high). This bit is cleared by the hardware when the terminal -continued

| | |
|---|---|
| | count is reached (after the DMA cycle associated with this function in which the terminal count pin, TC, is active). |
| W16 | Data Width 16-bits. When high, this bit specifies that the interleaved samples are each 16 bits wide. A low specifies 8-bit wide data. |
| ITRK[4:0] | Number of Interleaved Tracks. 00h specifies 1 track, 01h specifies 2 tracks, etc. |
| ISIZE[2:0] | Size of Interleaved Tracks. The size of each track will be 2 ^ (9 + ISIZE) samples. The range is from 512 to 64K bytes (regardless of whether an 8 or 16 bit DMA channel is selected). |

13. LMC DMA Interleave Base Register (LDIBI)
Index: P3XR+(4-5) read, write; index IGIDXR=58h
Default: 0000h This 16-bit register specifies RLA[23:8] which is ORed with the offset controlled by LDICI. This register specifies real addresses, as described by the LMC module's MEMORY INTERFACE section, regardless of the width of the DMA channel.

VII. MIDI and Game Ports Module

A. Game Port Overview

Figure 40:
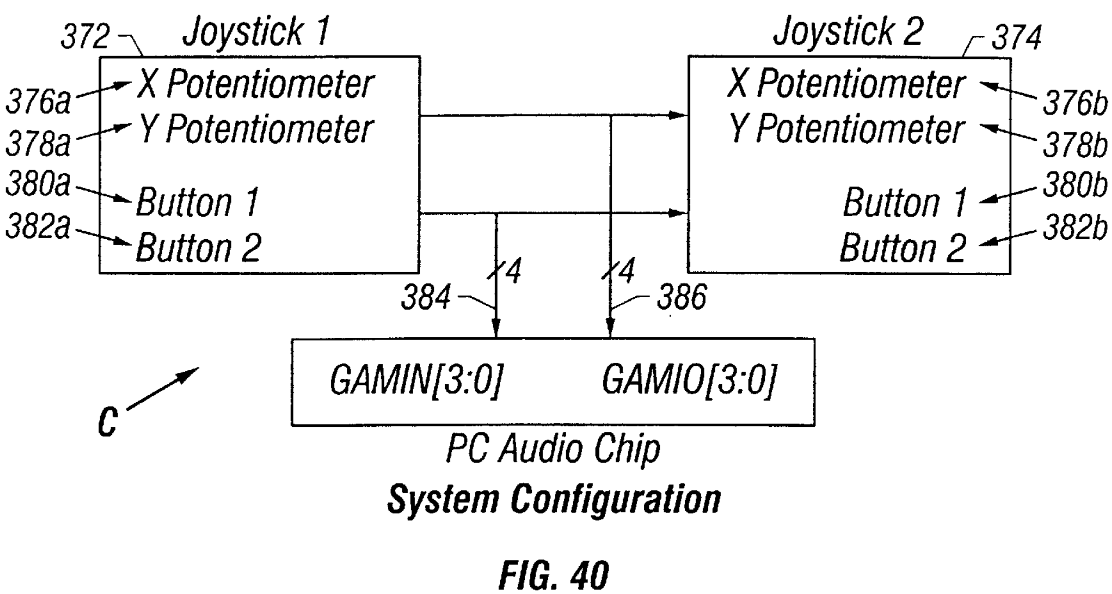
FIG. 40 is a schematic block illustration of the game port interface between external devices and the circuit C.

Referring now to FIGS. 1 and 40, the game port module 10 of the circuit C provides the functions found in standard game ports in PCs. These are typically used to interface to up to two joysticks 372 and 374. Each joystick contains potentiometers 376 and 378 for each of the X and Y directions, respectively, and two function buttons 380 and 382. Input to the circuit C from joysticks 372 and 374 is via four element input lines 384 and 386 to the GAMIN[3:0] and GAMIO[3:0] pin groups. Software uses the game port to determine the X and Y position of each of the joysticks and to determine the state of each of the buttons.

1. The GAMIN Pins

The four GAMIN pins are internally pulled up through a 6K ohms (nominal; + or −2K ohms) resistor and their state is passed back to the system control module via Register GGCR described below and schematically included in block 390 in FIG. 1.

2. The GAMIO Pins

Figure 41A:
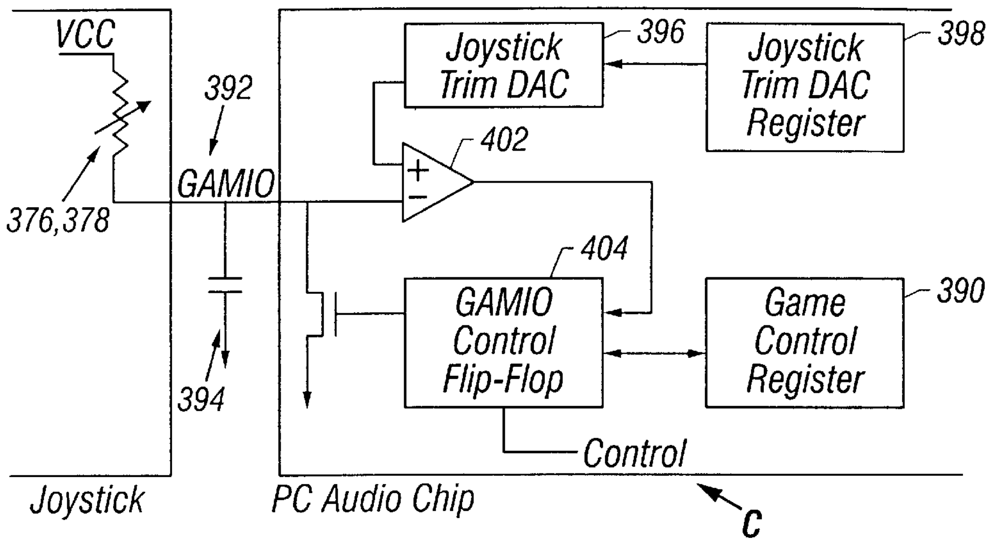

Referring now to FIG. 41*a*, software uses the GAMIO pins to determine the joystick position by: (1) writing to the game port—setting the GAMIO pins 392 to the high-impedance state; and (2) polling the game port to determine the time used to charge the external capacitor 394 through the X and Y potentiometers in the joystick. Time to voltage measurement is made via differential amplifier 402 and flip-flop 404. The threshold voltage for the GAMIO bits is controlled by a DAC 396 called the joystick trim DAC based upon values stored in joystick trim DAC register 398.

The external potentiometers 376, 378 normally ranges from 2.2K to about 100K ohms. The external capacitor 394 is normally 5600 picofarads (pF).

Figure 41B:
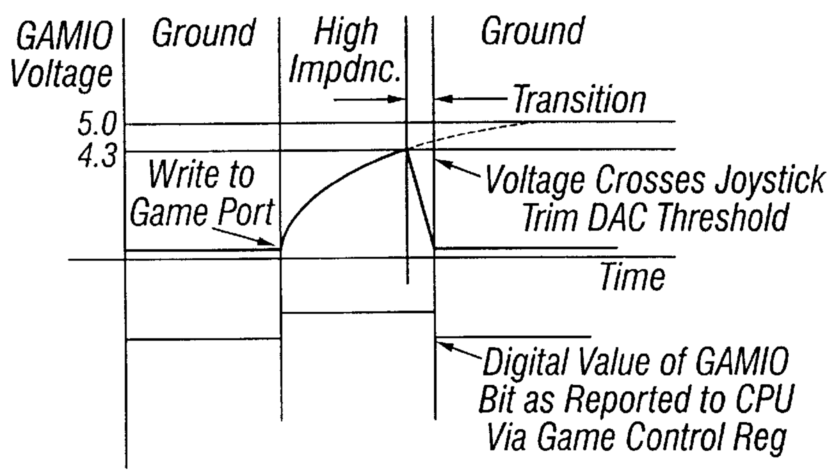

The four GAMIO pins can be in three possible states: ground, high-impedance, and transition-to-ground. These states are illustrated in FIG. 41*b*.

The Ground State

Most of the time, the GAMIO pins are in the ground state; in this state circuit C drives out a logic level 0.

The High-Impedance State

The GAMIO pins transition to the high-impedance state when software writes to the Game Control Register 390. In this state, the pins are internally compared to the voltage level set by the joystick trim DAC via differential amplifier 402. There is digitally-synthesized hysteresis on the output of the comparator 402 to guarantee that glitches are not sent to the control registers that are driven by comparators 402 due to noisy inputs to the comparators.

The Transition-To-Ground State

This state starts, for a GAMIO pin, when that pin's voltage crosses the value of the joystick trim DAC 396. At this point, the GAMIO control flip-flops 404 are cleared and the voltage of the pin is brought down to ground. With a 5600 picofarad load, the current for each pin is limited to no more than 18 mA during this transition (i=C dv/dt). The transition time is no greater than 2 microseconds. At the conclusion of the transition state, the digital value of the GAMIO bit is reported to the host CPU via game control register 390.

Suspend Mode

When in suspend mode (see power consumption modes in the system control module), the GAMIO pins 392 are forced into the high-impedance state so that no current is drawn from the joystick resistors. After exiting suspend mode, the pins will immediately be placed in the transition to ground mode until they reach the ground state to be ready for the next write to the game port.

3. The Joystick Trim DAC

The joystick trim DAC 396 is a 5-bit DAC that ranges linearly. The digital input to the joystick trim DAC 396 is static; it is set by a register, controlled by the SBI 14, called the Joystick Trim DAC Register 398.

Suspend Mode

When in suspend mode, or if the ports module 10 has been disabled by PPWRI (see power consumption modes in the system control module), the conventional resistor ladder that is used in the DAC design is disabled from consuming current.

B. MIDI Port Overview

MIDI (Musical Instrument Digital Interface) is a standard created by the music industry that includes a low-performance local area network (LAN) specification and a description of the data that is passed onto the LAN (this data is geared toward controlling musical instruments such as synthesizers). The MIDI port on the circuit C can receive and transmit serial data at digital levels; external circuitry is required to interface these to the MIDI LAN.

Figure 42:
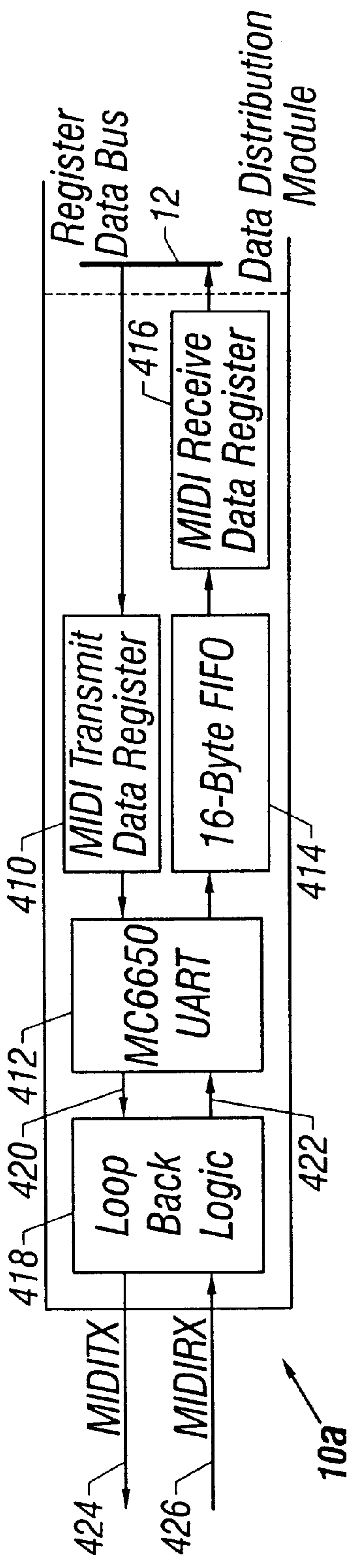
FIG. 42 is a schematic block diagram illustrating the MIDI transmit and receive ports for the circuit C.

Referring now to FIG. 42, the MIDI port 10*a* includes a UART 412 for serial transfers and a receive FIFO 414. One embodiment of a UART/FIFO configuration is described in U.S. Pat. No. 4,949,333 by Gulick, et al., entitled Enhanced Universal Asynchronous Receiver-Transmitter, assigned to the common assignee of the present invention, which is incorporated herein for all purposes. To transmit MIDI data, software writes the to-be-transmitted byte to the MIDI Transmit Data Register 410 (GMTDR). To read MIDI data that was received by UART 412, it reads the MIDI Receive Data Register 416 (GMRDR). There is a 16-byte FIFO 414 between UART 412 and the MIDI Receive Data Register 416

The circuit C can be programmed to generate interrupts to the SBI 14 as a result of either data entering the MIDI Receive Data Register 416 or data finishing the process of being transmitted.

1. The MIDI UART

Figure 43:
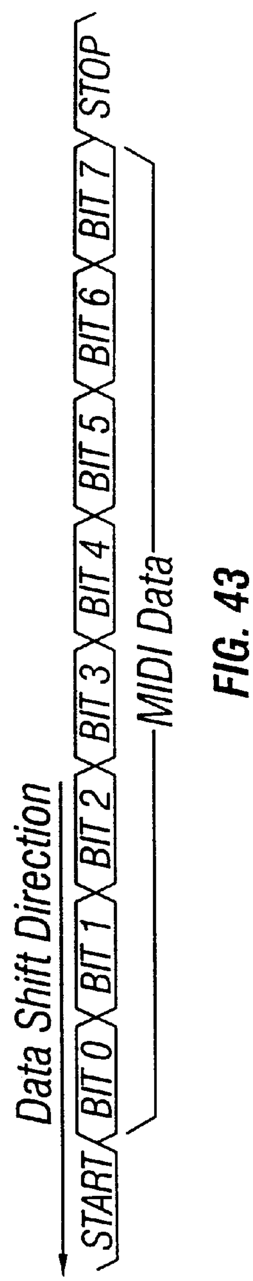
FIG. 43 is a timing diagram illustrating the MIDI data format utilized by the circuit C.

The MIDI interface 10*a* is based on a Motorola MC6850-compatible UART 412 that operates at 31.25KHz ±1%. The format for the data received and transmitted is illustrated in FIG. 43.

UART 412 operates asynchronously. The start bit is a logic 0; the stop bit is a logic 1. No other programmable options are supported.

2. The MIDI Receive FIFO and Register

Referring again to FIG. 42, a 16-byte FIFO 414 interfaces between UART 412 and the MIDI Receive Data Register 416. When the MIDI Receive Data Register 416 contains data, an interrupt is generated (if it is enabled). Interrupt generation is discussed in the system control module portion above. When register 416 is read by software, the interrupt is cleared. If more MIDI data is received before this byte is read, the new data is placed in FIFO 414. If, after the MIDI Receive Data Register 416 is read, FIFO 414 contains more data, the next byte is transferred from FIFO 414 to register 416 and another interrupt is generated. Thus, the IRQ pin assigned the MIDI interrupt will transition from high to low when the data is read and then transition from low to high immediately after, as the data is passed from FIFO 414 to register 416. The inclusion of FIFO 414 increases the maximum allowable interrupt latency from about 320 microseconds to 5.44 milliseconds. Data can also be placed directly into the MIDI receive FIFO via software with GMRFAI.

3. MIDI Loop Back Logic

Referring now to FIG. 42, MIDI Port 10*a* includes loop back logic 418 to provide the option to loop the data on MIDITX line 420 directly back into the MIDIRX line 422. This is controlled by a bit in the Mix Control Register (UMCR) described in the system control section above. When in loop-back mode, the MIDITX 424 pin still functions to transmit the looped data to external devices. However, the MIDIRX input 426 is disabled from receiving data.

C. MIDI and Game Ports PIN Summary

| Name | Qty | Type | Description |
|---|---|---|---|
| GAMIN[3:0] | 4 | input | Inputs that can be read from the Game Control Register; normally represent the state of the buttons on the external joysticks. These are internally pulled up. |
| GAMIO[3:0] | 4 | analog | Used to determine the state of external potentiometers located in the joysticks. |
| MIDITX | 1 | output | MIDI transmit, to send data from the MIDI UART. During reset, this pin becomes an input to select a power-up configuration. |
| MIDIRX | 1 | input | MIDI receive, to receive data to the MIDI UART. |

D. MIDI and Game Ports Register Overview

1. Game Control Register (GGCR)

Address: 201h write

A write of any value to this register causes all four of the GAMIO pins 392 to go into the high-impedance state so that the capacitor-charging cycle can begin and the joysticks' X-Y positions can be determined.

Address: 201h read

Default: XXXX 0000 binary

| 7 | 6 | 5 | 4 | 3 | 2 | 1 | 0 |
|---|---|---|---|---|---|---|---|
| GAMIN[3:0] | | | | GAMIO[3:0] | | | |

GAMIN[3:0] These bits reflect the state of the four GAMIN pins 392.

-continued

| | |
|---|---|
| GAMIO[3:0] | These are read as high during the high-impedance and transition-to-ground modes of each of the corresponding GAMIO pins and low at all other times. |

2. Joystick Trim DAC Register (GJTDI)

Address: P3XR+5 read, write; index IGIDXR=4Bh

Default: 1Dh

| 7 | 6 | 5 | 4 | 3 | 2 | 1 | 0 |
|---|---|---|---|---|---|---|---|
| RES | | | TDAC[4:0] | | | | |

TDAC[4:0] Sets the level of the joystick trim DAC 396 as follows:

| | Output at VCC=5.0 volts | Output at VCC=3.3 volts |
|---|---|---|
| JTDR=00h | 0.59 volts +/− 5% | 0.389 volts +/− 5% |
| JTDR=1Fh | 4.52 volts +/− 5% | 2.98 volts +/− 5% |
| Voltage per step | 0.127 volts | 0.0837 volts |

These values vary linearly with VCC.

3. MIDI Control Register (GMCR)

Address: P3XR+0 write, read (if IVERI[RRMD] is active).

Default: 0X0X XXX0 (reset by URSTI[RGF1])

Note: When IVERI[RRMD] is active, this register becomes readable; if IVERI[RRMD] is not active, then reads from this address provide the data in GMSR. IVERI [RRMD]-enabled reads provide one bit each for the MRST and TINT fields; bits[6 and 1] are unknown for these reads; bit[0] is low if the MRST was written with [1.1] (reset MIDI port active); bit[5] is high if TINT was written with [0.1] (IRQ active).

| 7 | 6 | 5 | 4 | 3 | 2 | 1 | 0 |
|---|---|---|---|---|---|---|---|
| RINT | TINT[1:0] | | RESERVED | | | MRST[1:0] | |

| | | | |
|---|---|---|---|
| RINT | Receive Data Interrupt Enable. 0 = Receive Interrupt disabled. 1 = Recieve Interrupt enabled. | | |
| TINT[1:0] | Transmit Interrupt Enable bits: | 0 0 = IRQ disabled<br>0 1 = IRQ enabled | 1 0 = IRQ disabled<br>1 1 = IRQ disabled |

This field is implemented with only one flipflop with combinatorial logic in front to decode the state.

| | | | |
|---|---|---|---|
| MRST[1:0] | MIDI reset. | 0 0 = normal operation<br>0 1 = normal operation | 1 0 = normal operation<br>1 1 = reset MIDI port |

The reset MIDI port command resets all the bits provided in GMSR, the receive FIFO 414, the GMTDR and the MIDI transmit-receive UART 412. It does not reset the GMRDR. This command stays active until another I/O write changes GMCR[1:0] to other than [1,1]. This field is implemented with only one flipflop with combinatorial logic in front to decode the state.

4. MIDI Status Register (GMSR)

Address: P3XR+0 read

Default: 0X00 XX10

Note: When IVERI[RRMD] is active, the data in this register is not accessible.

| 7 | 6 | 5 | 4 | 3 | 2 | 1 | 0 |
|---|---|---|---|---|---|---|---|
| MIRQ | RES | MORERR | MFRERR | RES | RES | TDAT | RDAT |

| | |
|---|---|
| MIRQ | MIDI Interrupt Request. This bit becomes high when one of RDAT, TDAT or MORERR are active. Its equation is: MIRO = GMCR[1]* (RDAT + MORERR) + (GMCR[6:5] == (0, 1) * TDAT; |
| MORERR | MIDI Overrun Error. This bit becomes high when the MIDI receive FIFO 414 fills up and an additional byte of MIDI data has been received. It is cleared by reading GMRDR. |
| MFRERR | MIDO Framing Error. This bit becomes active as a result of reading the stop bit (FIG. 43) as other than a logic level 1. It is cleared by the receipt of a subsequent properly-framed byte of MIDI data. |
| TDAT | MIDI Transmit Data Register (GMTDR) available. This bit is set high when there is no data being transmitted to the MIDITX pin 424 and UART 412 is ready to accept another byte of data. It is cleared to low when a write to the GMTDR initiates a data transfer. During a MIDI port reset (GMCR[1:0] write to (1,1)), this goes low; after the reset it goes back high. |
| RDAT | MIDI Receive Data Register (GMRDR) Full. This bit is set high when there is a valid byte of data in register 416 (GMRDR). This bit is cleared to low when the byte is read out of register 416 (GMRDR). If there is data in the MIDI receive FIFO, then this bit will go high again approximately two microseconds after register 416 (GMRDR) is read. |

5. MIDI Transmit Data Register (GMTDR)

Address: P3XR+1, write

Writing to this register causes the 8-bit value written to be serially transmitted via UART 412 to the MIDITX pin 424 in MIDI data format.

6. MIDI Receive Data Register (GMRDR)

Address: P3XR+1, read

Default: FFh

This register 416 contains the 8-bit value received in MIDI data format from the MIDIRX pin 426, into the UART 412. If there is no data in the MIDI Receive FIFO 414, the value will not change after being read. If there is unread data in MIDI Receive FIFO 414, then next byte in FIFO 414 is transferred to this register after the read cycle.

7. MIDI Receive FIFO Access Register (GMRFAI)

Index: P3XR+5 write; index IGIDXR=5Eh

| 7 | 6 | 5 | 4 | 3 | 2 | 1 | 0 |
|---|---|---|---|---|---|---|---|
| RDAT | | | | | | | |

| | |
|---|---|
| RDAT | Receive Data. Writes to this port place data into the MIDI receive FIFO. It is assumed that no data from the UART is being passed into the FIFO while this command is being executed. Placing this data into the FIFO will cause the MIDI receive data interrupt and status to be updated as if the data had come from the MIDIRX pin. This command requires between 2 and 4 microseconds to complete and holds the ISA bus while it is in progress. |

VIII. Specifications

A. Electrical Specification

| ABSOLUTE MAXIMUM RATINGS | | OPERATING RANGES | |
|---|---|---|---|
| Storage Temperature | −65 C. to +150 C. | Temperature (TA) | 0 C. to +70 C. |
| Ambient Temperature under bias | 0 C. to +70 C. | Supply Voltages (AVCC, DVCC) | 5 V ± 0.25 V or 3.3 V ± 0.3 V |
| Supply Voltage to AVss or DVss (AVCC, DVCC) | −3 V to +6.0 V | Voltage range for inputs: | VSS − 0.5 V ≦ Vin ≦ VCC + 0.5 V |

| PIN GROUPS | |
|---|---|
| TTL Group Pins | SD[15:0], SA[11:0], SBHE#, DRQ[7:5,3,1:0], DAK[7:5,3,1:0]#, TC, IRQ[15,12,11,7,5,3,2], IOCHK#, IOR#, IOW#, IOCS16#, IOCHRDY, AEN, CD_IRQ, CD_DRQ, CD_DAK#, CD_CS#, RESET, PNPCS |
| CMOS Group Pins | SUSPEND#, C32KHZ, GPOUT[1:0], MA[10:0], MD[7:0], BKSEL[3:0]#, ROMCS#, RAHLD#, RA[21:20], MWE#, RAS#, GAMIN[3:0] |
| Analog Group Pins | MIC[L,R], AUX1[L,R], AUX2[L,R], LINEIN[L,R], LINEOUT[L,R], MONOIN MONOOUT, IREF, CFILT, AREF, GAMIO[3:0] |
| Crystal Group Pins | XTAL1I, XTAL1O, XTAL2I, XTAL2O |

DC CHARACTERISTICS, VCC = 5 VOLTS

| Symbol | Description | Min | Max | Units |
|---|---|---|---|---|
| Vtil | TTL Group Input LOW Voltage | | 0.8 | V |
| Vtih | TTL Group Input High Voltage | 2.0 | DVCC + 0.5 | V |
| Vcil | CMOS Input LOW Voltage | | 0.9 | V |
| Vcih | CMOS Input High Voltage | 3.7 | DVCC + 0.5 | V |
| Vol | Output LOW Voltage (see drive table) | | 0.5 | V |
| Voh | Output High Voltage (see drive table | 2.4 | | V |
| Iix | Digital Input Leakage Current | −10 | 10 | μA |
| Ioz | Digital High-Impedance Output Leakage Current | −10 | 10 | μA |

MAXIMUM DRIVE TABLE FOR Vol, Voh SPECIFICATIONS, VCC = 5 VOLTS

| Signals | Load Cap. (pF) | Iol (mA) | Ioh (mA) | Notes |
|---|---|---|---|---|
| SD[15:0], IOCHRDY, IOCS16#, IOCHK# | 240 | 24 | −3 | 1,2 |
| SD[15:0], IOCHRDY, IOCS16#, IOCHK# | 120 | 12 | −3 | 1,2 |
| SD[15:0], IOCHRDY, IOCS16#, IOCHK# | 60 | 3 | −3 | 1,2 |
| DRQ[7:5,3,1:0], IRQ[15,12,11,7,5,3,2] | 120 | 5 | −3 | 2 |
| PNPCS, CD_CS#, CD_DAK#, CD_IRQ, GPOUT[1:0], MIDITX, RAHLD#, EFFECT#, FRSYNC# | 50 | 3 | −3 | 3 |
| MA[10:0], MD[7:0], BKSEL[3:0]#, ROMCS#, RA[21:20], MWE#, RAS# | 120 | 3 | −3 | |

Note 1: The maximum drive capability for these signals is selectable via PSEENI[ISADR].
Note 2: There is no Ioh value for the open collector outputs.
Note 3: EFFECT# and FRSYNC# are multiplexed with the SUSPEND# and C32KHZ inputs. Also, CD_IRQ can be selected as the output ESP-CLK.

DC CHARACTERISTICS, VCC = 3.3 VOLTS

-continued

| Symbol | Description | Min | Max | Units |
|---|---|---|---|---|
| Vil | TTL, CMOS Group Input LOW Voltage | | 0.8 | V |
| Vih | TTL, CMOS Group Input High Voltage | 2.0 | DVCC + 0.5 | V |
| Vol | Output LOW Voltage (see drive table) | | 0.5 | V |
| Voh | Output High Voltage (see drive table) | 2.4 | | V |
| Iix | Digital Input Leakage Current | −10 | 10 | μA |
| Ioz | Digital High-Impedance Output Leakage Current | −10 | 10 | μA |

MAXIMUM DRIVE TABLE FOR Vol, Voh SPECIFICATIONS, VCC = 3.3 VOLTS

| Signals | Load Cap. (pF) | Iol. (mA) | Ioh (mA) | Notes |
|---|---|---|---|---|
| SD[15:0], IOCHRDY, IOCS16#, IOCHK# | 60 | 3 | −3 | 2 |
| DRQ[7:5,3,1:0], IRQ[15,12,11,7,5,3,2] | 60 | 3 | −3 | 2 |
| PNPCS, CD_CS#, CD_DAK#, CD_IRQ, GPOUT[1:0], MIDITX, RAHLD#, EFFECT#, FRSYNC#, | 50 | 3 | −3 | 3 |
| MA[10:0], MD[7:0], BKSEL[3:0]#, ROMCS#, RA[21:20], MWE#, RAS# | 80 | 3 | −3 | |

Note 2: There is no Ioh value for the open collector outputs.
Note 3: EFFECT# and FRSYNC# are multiplexed with the SUSPEND# and C32KHZ inputs. Also, CD_IRQ can be selected as the output ESPCLK.

The foregoing disclosure and description of the invention are illustrative and explanatory thereof, and various changes in the circuit elements, specifications, connections and implementation details as well as operational methods may be made without departing from the spirit of the invention.

What is claimed is:

1. Volume component circuitry for a digital wavetable audio synthesizer, wherein said synthesizer is at least capable of addressing linear wavetable data, comprising:

(a) summing circuitry configured to sum multiple logarithmic volume components;

(b) a first storage device, coupled to said summing circuitry, configured to store a right volume value resulting from the summation of multiple logarithmic volume components by said summing circuitry;

(c) a second storage device, coupled to said summing circuitry, configured to store a left volume value resulting from the summation of multiple logarithmic volume components by said summing circuitry; and (d) multiplication circuitry, coupled to (i) said first and said second storage devices, and (ii) a bus configured to transport said linear wavetable data to said multiplication circuitry, wherein said multiplication circuitry is configured to multiply said linear wavetable data by said right and said left volume values by virtue of being configured to convert said right and said left volume values from a logarithmic representation to a linear representation during said multiplication.

2. The volume component circuitry of claim 1, wherein said right volume value is the sum of a logarithmic envelope volume component, a logarithmic LFO variation volume component, and the negative of a logarithmic right offset volume component, and said left volume value is the sum of a logarithmic envelope volume component, a logarithmic LFO variation volume component, and the negative of a logarithmic left offset volume component.

3. Volume component circuitry for a digital wavetable audio synthesizer, wherein said synthesizer is at least capable of addressing linear wavetable data, comprising:

(a) summing circuitry configured to sum multiple logarithmic volume components;

(b) a first storage device, coupled to said summing circuitry, configured to store a right volume value resulting from the summation of multiple logarithmic volume components by said summing circuitry;

(c) a second storage device, coupled to said summing circuitry, configured to store a left volume value resulting from the summation of multiple logarithmic volume components by said summing circuitry;

(d) a third storage device, coupled to said summing circuitry, configured to store an effects volume value which comprises either an effects volume component or a value resulting from the summation of multiple logarithmic volume components by said summing circuitry; and (e) multiplication circuitry, coupled to (i) said first, said second, and said third storage devices, and (ii) a bus configured to transport said linear wavetable data to said multiplication circuitry, wherein said multiplication circuitry is configured to multiply said linear wavetable data by said right, said left, and said effects volume values by virtue of being configured to convert said right, said left, and said effects volume values from a logarithmic representation to a linear representation during said multiplication.

4. The volume component circuitry of claim 3, wherein said right volume value is the sum of a logarithmic envelope volume component, a logarithmic LFO variation volume component, and the negative of a logarithmic right offset volume component, and said left volume value is the sum of a logarithmic envelope volume component, a logarithmic LFO variation volume component, and the negative of a logarithmic left offset volume component.

5. The volume component circuitry of claim 4, wherein said effects volume value comprises either an effects volume component, or the sum of a logarithmic envelope volume component, a logarithmic LFO variation volume component, and the negative of a logarithmic effects volume component.

6. Volume component circuitry for a digital wavetable audio synthesizer, wherein said synthesizer is at least capable of addressing linear wavetable data, comprising:

(a) means for providing a plurality of logarithmic volume components;

(b) means for providing linear wavetable data; and (c) means for multiplying said linear wavetable data by a sum of a combination of at least two of said plurality of logarithmic volume components, wherein said multiplication circuitry is configured to multiply said linear wavetable data by said sum by virtue of being configured to convert said sum from a logarithmic representation to a linear representation during said multiplication.

7. The volume component circuitry of claim 6, wherein said logarithmic volume components include an envelope volume component, an LFO variation volume component, a right offset volume component, a left offset volume component, and an effects volume component.

* * * * *